US010784204B2

(12) United States Patent
Aygun et al.

(10) Patent No.: US 10,784,204 B2
(45) Date of Patent: Sep. 22, 2020

(54) RLINK—DIE TO DIE CHANNEL INTERCONNECT CONFIGURATIONS TO IMPROVE SIGNALING

(71) Applicant: Intel Corporation, Santa Clara, CA (US)

(72) Inventors: Kemal Aygun, Chandler, AZ (US); Richard J. Dischler, Bolton, MA (US); Jeff C. Morriss, Cornelius, OR (US); Zhiguo Qian, Chandler, AZ (US); Wilfred Gomes, Portland, OR (US); Yu Amos Zhang, Chandler, AZ (US); Ram S. Viswanath, Phoenix, AZ (US); Rajasekaran Swaminathan, Tempe, AZ (US); Sriram Srinivasan, Chandler, AZ (US); Yidnekachew S. Mekonnen, Chandler, AZ (US); Sanka Ganesan, Chandler, AZ (US); Eduard Roytman, Newton Centre, MA (US); Mathew J. Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/305,012

(22) PCT Filed: Jul. 2, 2016

(86) PCT No.: PCT/US2016/040912

§ 371 (c)(1),
(2) Date: Nov. 27, 2018

(87) PCT Pub. No.: WO2018/009171

PCT Pub. Date: Jan. 11, 2018

(65) Prior Publication Data

US 2020/0066641 A1 Feb. 27, 2020

(51) Int. Cl.
*H01L 23/538* (2006.01)
*H01L 23/522* (2006.01)
(Continued)

(52) U.S. Cl.
CPC ...... *H01L 23/5386* (2013.01); *H01L 23/5227* (2013.01); *H01L 23/5286* (2013.01);
(Continued)

(58) Field of Classification Search
CPC ............... H01L 23/5386; H01L 23/485; H01L 23/49541; H01L 23/5221; H01L 23/5286
See application file for complete search history.

(56) References Cited

U.S. PATENT DOCUMENTS 6,529,021 B1 * 3/2003 Yu ..................... G01R 1/07314 324/754.2
7,514,789 B1 * 4/2009 Tao .................. H01L 23/49838 257/659
(Continued)

FOREIGN PATENT DOCUMENTS

KR 10-2015-0086684 7/2015

OTHER PUBLICATIONS

International Search Report and Written Opinion for International Patent Application No. PCT/US2016/040912 dated Apr. 26, 2017, 12 pgs.
(Continued)

*Primary Examiner* — Wael M Fahmy
*Assistant Examiner* — Sarah K Salerno
(74) *Attorney, Agent, or Firm* — Schwabe, Williamson & Wyatt, P.C.

(57) ABSTRACT

Integrated circuit (IC) chip die to die channel interconnect configurations (systems and methods for their manufacture) may improve signaling to and through a single ended bus data signal communication channel by including on-die
(Continued)

induction structures; on-die interconnect features; on-package first level die bump designs and ground webbing structures; on-package high speed horizontal data signal transmission lines; on-package vertical data signal transmission interconnects; and/or on-package electro-optical (EO) connectors in various die to die interconnect configurations for improved signal connections and transmission through a data signal channel extending through one or more semiconductor device package devices, that may include an electro-optical (EO) connector upon which at least one package device may be mounted, and/or be semiconductor device packages in a package-on-package configuration.

22 Claims, 76 Drawing Sheets

(51) Int. Cl.

| | |
|---|---|
| ***H01L 23/528*** | (2006.01) |
| ***H01L 23/60*** | (2006.01) |
| ***H01L 23/00*** | (2006.01) |
| ***H01L 25/065*** | (2006.01) |

(52) U.S. Cl.
CPC .............. *H01L 23/60* (2013.01); *H01L 24/16* (2013.01); *H01L 25/0652* (2013.01); *H01L 2224/16227* (2013.01)

(56) References Cited

U.S. PATENT DOCUMENTS

| | | | | |
|---|---|---|---|---|
| 9,224,722 | B2 | 12/2015 | Lim et al. | |
| 2008/0235857 | A1* | 10/2008 | Tzeng | A47K 13/16 4/234 |
| 2009/0134391 | A1 | 5/2009 | Lin | |
| 2011/0038087 | A1* | 2/2011 | Moronval | H01L 27/0248 361/111 |
| 2013/0168854 | A1 | 7/2013 | Karikalan et al. | |
| 2016/0141234 | A1 | 5/2016 | We et al. | |

OTHER PUBLICATIONS

International Preliminary Report on Patentability for International Patent Application No. PCT/US2016/040912, dated Jan. 17, 2019, 9 pages.

* cited by examiner

RLINK—DIE TO DIE CHANNEL INTERCONNECT CONFIGURATIONS TO IMPROVE SIGNALING

CROSS-REFERENCE TO RELATED APPLICATION

This patent application is a U.S. National Phase Application under 35 U.S.C. § 371 of International Application No. PCT/US2016/040912, filed Jul. 2, 2016, entitled "RLINK—DIE TO DIE CHANNEL INTERCONNECT CONFIGURATIONS TO IMPROVE SIGNALING," which designates the United States of America, the entire disclosure of which is hereby incorporated by reference in its entirety and for all purposes.

BACKGROUND

Field

Embodiments of the invention are related in general, to die to die channel interconnect configurations to improve signaling (e.g., for improved signal connections and transmission) to and through a single ended bus data signal communication channel from one chip; through one or more semiconductor device packages; and to another electronic device or chip.

Description of Related Art

Integrated circuit (IC) chips (e.g., "chips", "dies", "ICs" or "IC chips"), such as microprocessors, coprocessors, graphics processors and other microelectronic devices often use package devices ("packages") to physically and/or electronically attach the IC chip to a circuit board, such as a motherboard (or motherboard interface). The IC chip (e.g., "die") is typically mounted within a microelectronic substrate package or package device that, among other functions, enables electrical connections such as to form a data signal communication channel between the chip and a socket, a motherboard, another chip, or another next-level component (e.g., microelectronic device). Some examples of such package devices are substrate packages, interposers, and printed circuit board (PCB) substrates upon which integrated circuit (IC) chips, next-level components or other package devices may be attached, such as by solder bumps.

There is a need in the field for an inexpensive and high throughput process for manufacturing such chips and packages. In addition, the process could result in a high chip yield, a high package device yield, and an improved data signal communication channel between the chip and one or more package device(s); or between the chip and a next-level component or chip attached to one or more package device(s). In some cases, there is a needed in the field for a chip and one or more package device(s) having better components for providing stable and clean high frequency transmit and receive data signals through a data signal communication channel between its signal transmit or receive circuits, through one or more packages, and to signal receive or transmit circuits of another next-level component or chip attached to the package(s).

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 30A is schematic top view of a computing system, including integrated circuit (IC) chip "on-die" interconnection features for improved signal connections and transmission through semiconductor device packages.

DETAILED DESCRIPTION

Figure 1:
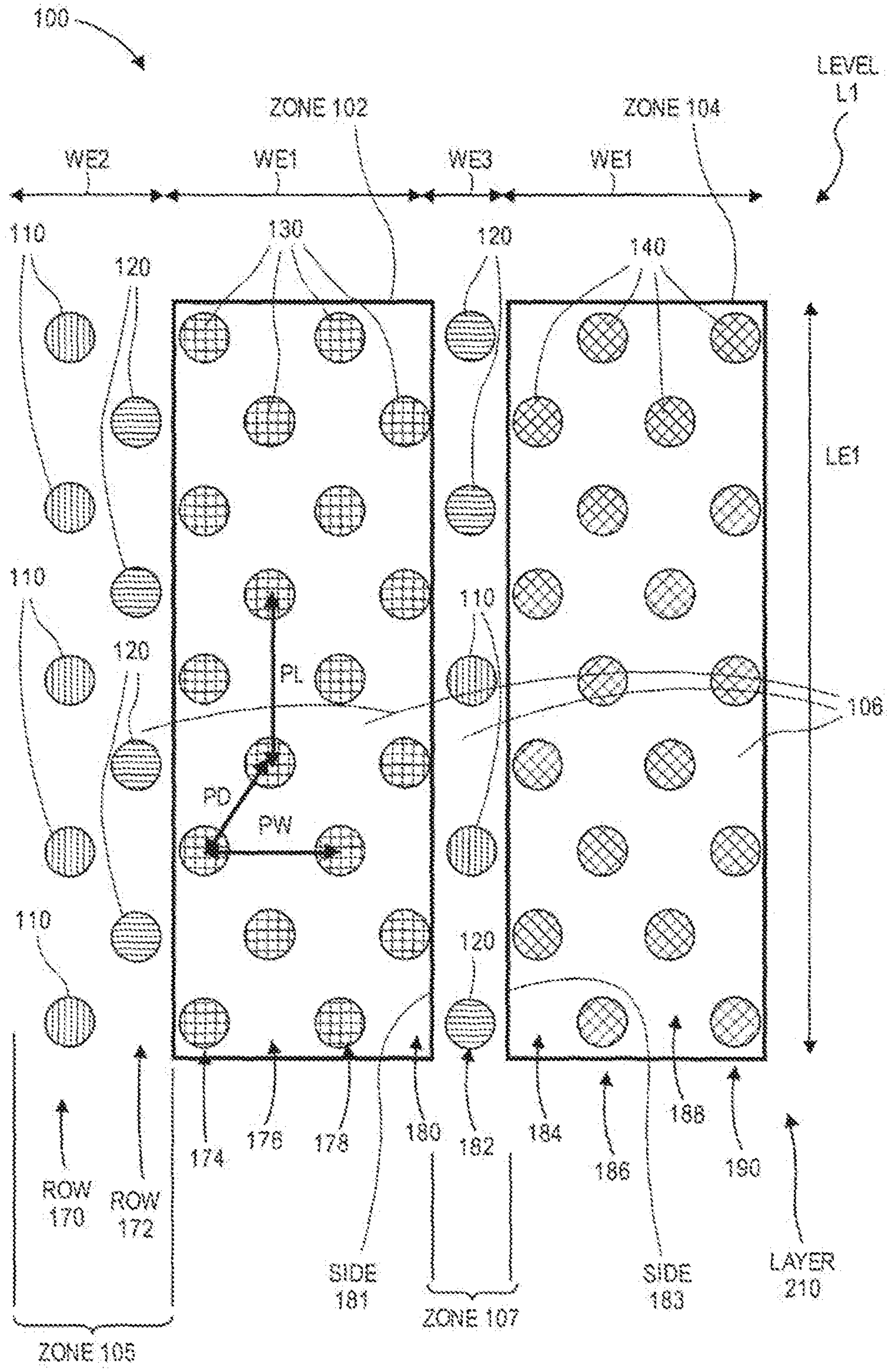
FIG. 1 is a schematic top perspective view of a conductive material ground isolation webbing structure semiconductor device package upon which at least one integrated circuit (IC) chip or "die" may be attached.

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

As integrated circuit (IC) chip or die sizes shrink (e.g., see chip 108 and/or 109) and interconnect densities increase, physical and electrical connections require better components for providing stable and clean high frequency transmit and receive data signals between data signal circuitry (e.g., circuit 172) of a chip and data signal transmission surface contacts (e.g., contact 130) to be attached or attached to a package device (e.g., see package device 110) (or two physically attached package devices) upon which the IC chip is mounted or is communicating the data signals (e.g., see systems 5100, 5200, 5300, 5400 and 5500 of FIGS. 47-52). In some cases, there is a needed for one or two chips; and the package(s) to have better data transmission interconnect features (e.g., components) for providing stable and clean high frequency transmit and receive data signals through a data signal communication channel between data signal transmit or receive circuits of one chip mounted on a package, through one or more packages, and to data signal receive or transmit circuits of another next-level component (e.g., microelectronic device) or chip attached to the package(s). This may include for providing stable and clean data signals (and optionally power and ground signals) through surface contacts (e.g., solder bump contacts) on and electrical connections between (e.g., solder bumps or solder ball grid array (BGA)) the chips and package(s). Some examples of such package devices that may be in the data signal communication channel are one (or two physically attached) of the following: substrate packages, interposers (e.g., silicon interposers), silicon bridges, organic interposers (e.g., or technology thereof), and printed circuit board (PCB) substrates upon or onto which integrated circuit (IC) chips or other package devices may be attached. In some cases, one or more of such package devices is or includes an electro-optical (EO) connector.

In some cases, the data signal communication channel includes connections between the IC chip and a package device upon or to which the IC chip is mounted, such as between the chip bottom surface (e.g., solder bump contacts) and other components of or attached to the package device. The data signal communication channel may include signals transmitted between upper level signal transmit and receive circuitry and contacts or traces of the chip that will be electrically connected through via contacts to contacts on the bottom surface of the chip. In some cases, the data signal communication channel may extend from IC chip mounted on (e.g., having a bottom surface and/or bottom surface signal contacts of a bottom surface physically soldered and attached to a top surface and/or top surface signal contacts of) a microelectronic substrate package, which is also physically and electronically connected to another package, chip or next-level component. Such data signal communication channel may be a channel for signals transmitted from the chip to contacts on the top surfaces of a package that will be electrically connected through via contacts to lower level contacts or traces of one or more the package, and from there to another chip mounted on the package(s).

In some cases, an IC chip may be mounted within a package device, such as for "flip chip" bonding or packaging, such as to form the data signal communication channel. In some cases, the IC chip may be mounted on one package device, which is also physically and electronically connected to another package device or IC chip, so that the package device can provide data signal transfer between IC chip and other package device, or between the two IC chips, such as to form a data signal communication channel. In many cases, a data signal communication channel must route hundreds or even thousands of high frequency data signals between the IC chip(s) and/or other package devices.

According to some embodiments, it is possible for die to die channel interconnect configurations to improve signaling (e.g., improve signal connections and transmission) to and through a single ended bus data signal communication channel from one chip; through one or more semiconductor device packages; and to another electronic device or chip.

Such die to die interconnect configurations may include integrated circuit (IC) chip (1) on-die inductor structures (see FIGS. 45-49) and (2) on-die interconnection features (see FIGS. 30-41) such as (a) lengths of "last silicon metal level (LSML)" data signal "leadway (LDW) routing" traces isolated between LSLM isolation traces to: (b) increase a total length of and tune data signal communication channels extending through a package between two communicating chips and (c) create switched buffer (SB) pairs of data signal channels that use the lengths of isolated data signal LDW traces to switch the locations of the pairs data signal circuitry and surface contacts for packaging connection bumps (e.g., see "on-die interconnection features" of zone 192 (or pattern 900, pattern 1000 or pattern 1100) and/or zone 194 (or pattern 905, pattern 1005 or pattern 1105); as well as package device (3) package device first level die bump designs directly attached to via contacts and conductive contacts extending through lower vertical levels of the package device, and ground webbing structures (see FIGS. 1-6), high speed horizontal data signal transmission lines (see FIGS. 7-19) such as extending through the package device for transmitting data between IC chips or other devices attached to the package device, (5) package device second level vertical data signal transmission interconnects (see FIGS. 20-29) such as extending through vertical levels of a package device, which include conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce crosstalk between the data transfer contacts and vertical "signal" lines or interconnects, and (6) package device electro-optical (EO) connectors (see FIGS. 26A-C and 28) for improved signaling (e.g., improved signal connections and transmission) to and through a single ended bus data signal communication channel from one chip; through one or more semiconductor device packages; and to another electronic device or chip.

Such improved signaling may include or provide higher frequency and more accurate data signal transfer through a data signal communication channel between a bottom interconnect level or surface (e.g., level LV1) of an IC chip mounted on a top interconnect level (e.g., level L1) of the package device and (1) lower levels (e.g., levels Lj-Ll) of the package device, (2) a next-level component of (e.g., another chip mounted on) the package device, or (3) another package device mounted to the top or bottom of the package device (or a next-level component or another chip mounted on the second package device).

Figure 47:
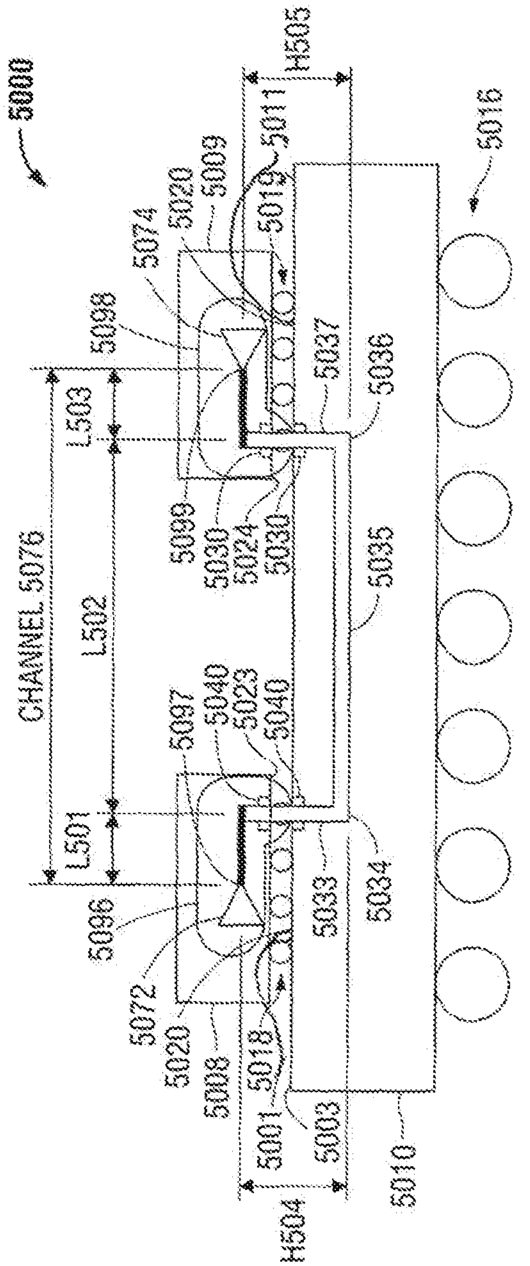
FIG. 47 is schematic cross-sectional side view of a computing system (e.g., computing configuration), including die to die interconnect configurations for improved signal connections and transmission through a data signal channel extending through a semiconductor device package.

According to some embodiments, it is possible for die to die channel interconnect configurations to improve signaling to and through a single ended bus data signal communication channel by including on-die induction structures (see FIGS. 26A-C and 28); on-die interconnect features, (see FIGS. 30-41); on-package first level die bump designs and ground webbing structures (see FIGS. 1-6); on-package high speed horizontal data signal transmission lines, (see FIGS. 7-19); on-package vertical data signal transmission interconnects, (see FIGS. 20-29) and on-package electro-optical (EO) connectors (see FIGS. 26A-C and 28) in various system configuration including (1) die to die interconnect configurations for improved signal connections and transmission through a data signal channel extending through a semiconductor device package (e.g., see FIG. 47); (2) die to die interconnect configurations for improved signal connections and transmission through a data signal channel extending through multiple semiconductor device packages or package devices (e.g., see FIG. 48); (3) die to die interconnect configurations for improved signal connections and transmission through a data signal channel extending through various configurations of multiple semiconductor device packages or package devices that may include an electro-optical (EO) connector 5310 (e.g., see FIG. 50) upon which at least one package device may be mounted (e.g., see FIG. 49): (3) die to die interconnect configurations for improved signal connections and transmission through a data signal channel extending through multiple semiconductor device packages or package devices and through an electro-optical (EO) connector 5310 upon which at least one package device may be mounted (e.g., see FIG. 50); or (4) die to die interconnect configurations for improved signal connections and transmission through a data signal channel extending through two semiconductor device packages in a package-on-package configuration (e.g., see FIG. 51).

In some cases, such a configuration may be described as a "die to die channel interconnect configuration to improve signaling" or a "system having die to die channel interconnect configuration to improve signal connections and transmission through a semiconductor device package channel" (e.g., devices, systems and processes for forming).

In some cases, a "single ended" channel or bus includes is capable of successfully sending a high speed data signal through such a channel without using "differential" bus technology or differential bus pairs of positive and negative polarity versions of the same signals (e.g., on two wires or channels).

FIGS. 1-6 may apply to embodiments of a microprocessor package with first level die bump ground webbing structure. Such embodiments of the invention are related in general, to semiconductor device packaging and, in particular, to substrate packages and printed circuit board (PCB) substrates upon which an integrated circuit (IC) chip may be attached, and methods for their manufacture. Such a substrate package device may have a first level die bump design directly attached to via contacts and conductive contacts extending through lower vertical levels of the package device.

Integrated circuit (IC) chips (e.g., "chips", "dies", "ICs" or "IC chips"), such as microprocessors, coprocessors, graphics processors and other microelectronic devices often use package devices ("packages") to physically and/or electronically attach the IC chip to a circuit board, such as a motherboard (or motherboard interface). The IC chip (e.g., "die") is typically mounted within a microelectronic substrate package that, among other functions, enables electrical connections between the die and a socket, a motherboard, or another next-level component.

There is a need in the field for an inexpensive and high throughput process for manufacturing such packages. In addition, the process could result in a high package yield and a package of high mechanical stability. Also needed in the field, is a package having better components for providing stable and clean power, ground, and high frequency transmit and receive data signals between its top surface and other components of or attached to the package, such as from contacts on the top surfaces that will be electrically connected through via contacts to lower level contacts or traces of the package.

As integrated circuit (IC) chip or die sizes shrink and interconnect densities increase, physical and electrical connections between the IC chip and a package upon or to which the IC chip is mounted require better components for providing stable and clean power, ground, and high frequency transmit and receive data signals between the package top surface and other components of or attached to the package. Such signals may be transmitted between contacts on the top surfaces of the package that will be electrically connected through via contacts to lower level contacts or traces of the package. In some cases, the IC chip may be mounted on (e.g., physically soldered and attached to a top surface of the package) a microelectronic substrate package, which is also physically and electronically connected to the next-level component.

In some cases, the IC chip may be mounted within the package, such as for "flip chip" bonding or packaging. In some cases, the IC chip may be mounted on a microelectronic substrate package, which is also physically and electronically connected to another IC chip, so that the package can provide data signal transfer between two IC chips. Here, in many cases, the package must route hundreds or even thousands of high frequency data signals between two die. Some such packages may be or use a silicon interposer, a silicon bridge, or an organic interposer technology.

According to some embodiments, it is possible for such a package to provide higher frequency and more accurate data signal transfer between an IC chip mounted on a top interconnect level of the package and (1) lower levels of the package, (2) a next-level component mounted on the package, or (3) another IC chip mounted on the package (e.g., mounted on the top level) by including a top interconnect level (e.g., a die-bump field or a first level die bump design) with a ground webbing structure (e.g., "webbing") of conductor material that reduces bump field crosstalk, signal type cluster-to-cluster crosstalk and in-cluster signal type crosstalk. The ground webbing structure may be spread over an area of the top interconnect level of the package and may provide ground isolation conductive material webbing that surrounds data signal contacts of the top interconnect level. The top interconnect level may have upper transmit and receive data signal contacts of the die-bump field or a first level die bump design for soldering to another device; and the ground webbing structure may be attached to (or formed as part of conductor material layer with) upper grounding contacts to reduce bump field crosstalk, signal type cluster-to-cluster crosstalk and in-cluster signal type crosstalk by surrounding each of the upper transmit and receive data signal contacts. In some cases, there may be additional lower levels of the package (below the first level) with additional ground webbing structures, such as in a second interconnect level, and a third interconnect level of the package. Such a package (e.g., with the top interconnect level having the ground webbing structure, and optionally one or more lower levels also having the ground webbing structure) may be described as a first level die bump "ground webbing structure" microprocessor package (e.g., devices, systems and processes for forming).

In some cases, each interconnect level having a ground webbing structure may have an upper (e.g., top or first) interconnect layer with upper (e.g., top or first) level ground contacts, upper level (e.g., top or first) data signal contacts, and a upper (e.g., top or first) level ground webbing structure that is directly connected (e.g., attached to, formed as part of, or electrically coupled to) to the upper level ground contacts and surrounds the upper data signal contacts. The upper contacts may be formed over and connected to via contacts or traces of a lower layer of the same interconnect level. The via contacts of the lower layer may be connected to upper contacts of a second interconnect level (which may also have webbing). In some cases, the upper data signal contacts include upper data transmit signal contacts in a data transmit signal zone (or area from above view), and upper data receive signal contacts in a data receive signal zone. In some cases, upper level power contacts are disposed adjacent to the upper level ground contacts in a power and ground zone that is between the data transmit signal zone and the data receive signal zone. In some cases, the ground webbing structure extends from the upper ground contacts (1) through a first side of the power and ground zone and into the data transmit signal zone and surrounds the upper data transmit signal contacts; and (2) through an opposite side (e.g., opposite from the first side) of the power and ground zone and into the data receive signal zone and surrounds the upper data receive signal contacts.

In some cases, the ground webbing structure package may provide a better component for the physical and electrical connections between the IC chip and a package upon or to which the IC chip is mounted. In some cases, it may increase in the stability and cleanliness of power, ground, and high frequency transmit and receive data signals transmitted between the data signal contacts on the top surfaces of the package and other components of or attached to the package that are electrically connected to the data signal contacts on the top surface through via contacts to lower level contacts or traces of the package. In some cases, it may increase the usable frequency of transmit and receive data signals transmitted between the data signal contacts on the top surfaces of the package and other components of or attached to the package, as compared to a package not having ground webbing (e.g., as compared to a package where the top interconnect layer ground webbing structure does not exist). Such an increased frequency may include data signals having a frequency of between 7 and 25 gigatransfers per second (GT/s). In some cases, GT/s may refer to a number of operations (e.g., transmission of digital data such as the data signal herein) transferring data that occur in each second in some given data transfer channel such as a channel provided by zone 102 or 104; or may refer to a sample rate, i.e. the number of data samples captured per second, each sample normally occurring at the clock edge. 1 GT/s is $10^9$ or one billion transfers per second.

In some cases, the webbing structure package improves crosstalk (e.g., as compared to the same package but without any webbing, such as without webbing on levels L1-L3) from very low frequency transfer such as from 50 mega hertz (MHz) to a GHz transfer level, such as greater than 40 GHz (or up to between 40 and 50 GHz). In some cases, the webbing structure package improves copper density in the package device (e.g., as compared to the same package but without any webbing, such as without webbing on levels L1-L3). In some cases, the webbing structure package enhances the power delivery network for the input/output block (e.g., IO block such as including zone 102 and 104) by improving (e.g., reducing resistance of) the ground impedance (e.g., as compared to the same package but without any webbing, such as without webbing on levels L1-L3), which helps to reduce the IO power network impedance (e.g., lower the resistance of power contacts in zones 105 and 107), such as due to the IO power bumps (e.g., contacts 110 in zone 105 and/or 107) being located inside of the signal bumps (e.g., contacts 130 and 140).

FIG. 1 is a schematic top perspective view of a semiconductor device package upon which at least one integrated circuit (IC) chip or "die" may be attached. FIG. 1 shows package 100 (e.g., a "package device") having a first interconnect level L1 with upper layer 210 having upper (e.g., top or first) layer power contacts 110, upper layer ground isolation contacts 120, upper layer receive data signal contacts 130 and upper layer transmit data signal contacts 140. Level L1 (or upper layer 210) may be considered to "top" layer such as a top, topmost or exposed layer (e.g., a final build-up (BU) layer, BGA, LGA, or die-backend-like layer) to which an IC chip (e.g., such as microprocessor, coprocessor, graphics processor, memory chip, modem chip, or other microelectronic chip devices), a socket, an interposer, a motherboard, or another next-level component will be mounted or directly attached.

In some cases, device 100 may represent a substrate package, an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices).

FIG. 1 shows package 100 having top surface 106, such as a surface of dielectric, upon or in which are formed (e.g., disposed) power contacts 110, grounding contacts 120, receive signal contacts 130 and transmit contacts 140. Power contacts 110 are shown in first row 170 as well as at certain locations along length LE1 in row 182.

Receive signal contacts 130 are shown in zone 102. Zone 102 has width WE1 and length LE1. Ground contacts 120 are shown in second row 172 and at certain locations along length LE1 in seventh row 182. Receive signal contacts 130 are shown in third row 174, fourth row 176, fifth row 178, and sixth row 180 in zone 102. In some cases, zone 102 may be described as a receive or "RX" signal cluster formed in a 4-row deep die-bump pattern.

Transmit signal contacts 140 are shown in zone 104. Zone 104 has width WE1 and length LE1. Transmit signal contacts 140 are shown in sixth row 184, seventh row 186, eighth row 188, and ninth row 190 in zone 104. In some cases, zone 104 may be described as a receive or "TX" signal cluster formed in a 4-row deep die-bump pattern.

Various other appropriate patterns are considered for contacts 120, 130 and 140. It can be appreciated that although zone 102 and 104 are shown with the same width and length, they may have different widths and/or lengths. Each of rows 170-190 may be horizontally (e.g., widthwise) equidistant from each other along the direction of width WE1, and each of the contacts in each row may be vertically (e.g., lengthwise) equidistant from each other along length LEE The exact size of WE1 and LE1 may depend on number of contacts employed within each zone (e.g., number of contacts 130 in zone 102, or the number of contact 140 in zone 104). In some cases, the size of WE1 and LE1 may also depend on the number of zones 102 and 104 on a package device. In some cases, the number of zones 102 and 104 will be where each of those zones is part of a "unicel" or "unit cell" communication area (e.g., including zones 102, 104, 105 and 107) and there are between 2-20 such unicel areas on the surface of the package (and thus between 2-20 of each of zones 102 and 104). In some cases, the size of WE1 and LE1 can be scaled with or depend on the manufacturing or processing pitch (e.g., of the contacts).

The size of WE1 and LE1 may also depend on the technology capability of forming the contacts and package. In some cases, in general, the size of WE1 and LE1 can span from around a hundred to a couple of hundred micrometers (×E-6 meter—"um" or "microns"). In some cases, LE1 is between 80 and 250 um. In some cases it is between 50 and 300 um. In some cases, WE1 is between 70 and 150 um. In some cases it is between 40 and 200 um.

Rows 170 and 172 may be described as a two row wide power and ground isolation zone 105. Zone 102 may be described as a four row wide zone of receive contacts. Zone 104 a four row wide zone of transmit contacts. Row 182 may be described as a one row wide power and ground isolation zone 107 located or formed between zone 102 and zone 104. Zone 107 has side 181 adjacent to or facing zone 102 and opposite side 183 (e.g., opposite from side 181) adjacent to or facing zone 104. In some cases, the location of zone 105 and zone 107 are reversed and the two row power and isolation zone is located between zone 102 and zone 104; and has sides 181 and 183.

Zone 105 has width WE2 and length LE1. Zone 107 has width WE3 and length LE1. The exact size of WE2 and WE3 may depend on number of contacts employed within each zone (e.g., number of contacts in zone 105, and in zone 107). In some cases, the size of WE2 and WE3 may also depend on the number of zones 105 and 107 on a package device. In some cases, the number of zones 105 and 107 will be where each of those zones is part of a "unicel" communication area (e.g., including zones 102, 104, 105 and 107) and there are between 2-20 such unicel areas on the surface of the package (and thus between 2-20 of each of zones 105 and 107). In some cases, the size of WE2 and WE3 can be scaled with or depend on the manufacturing or processing pitch (e.g., of the contacts).

The size of WE2 and WE3 may also depend on the technology capability of forming the contacts and package. In some cases, in general, the size of WE2 and WE3 can span from around tens of microns to more than a hundred um. In some cases, WE2 is between 35 and 75 um. In some cases it is between 20 and 100 um. In some cases, WE3 is between 15 and 30 um. In some cases it is between 8 and 40 um. It can be appreciated that although zone 105 and 107 are shown with widths WE 2 and WE3; and the same length, they may have different widths and/or lengths.

In some cases, zone 107 (or zone 105 when zone 105 is located where zone 107 is shown) may be described as one (e.g., zone 107) or two (e.g., zone 105) rows of ground bumps that isolate the TX cluster (e.g., zone 104) and the RX cluster (e.g., zone 102).

The pitch width (PW) of adjacent contacts is the width distance between the center point of two adjacent contacts. In some cases, pitch PW is approximately 153 micrometers (153×E-6 meter—"um"). In some cases, pitch PW is approximately 160 micrometers. In some cases, it is between 140 and 175 micrometers. The diagonal pitch (PD) of adjacent contacts is the diagonal distance between the center of two adjacent contacts. In some cases, pitch PD is approximately 110 micrometers (110×E-6 meter—"um"). In some cases, pitch PD is approximately 130 micrometers. In some cases, it is between 100 and 140 micrometers (um). In some cases, it is between 60 and 200 micrometers. The pitch length (PL) of two adjacent contacts is the length distance between the center point of two adjacent contacts. In some cases, pitch PL is approximately 158 micrometers. In some cases, pitch PL is approximately 206 micrometers. In some cases, it is between 130 and 240 micrometers (um). In some cases, pitch PD is approximately 110 micrometers, PL is approximately 158 micrometers and PW is approximately 153 micrometers. In some cases, pitch PD is approximately 130 micrometers, PL is approximately 206 micrometers and PW is approximately 160 micrometers. In the cases above, "approximately" may represent a difference of within plus or minus 5 percent of the number stated. In other cases, it may represent a difference of within plus or minus 10 percent of the number stated.

According to embodiments, level L1 may include upper (e.g., top, topmost or or first) layer ground webbing structure 160 (not shown in FIG. 1), such as shown in FIGS. 2-3.

Figure 2A:
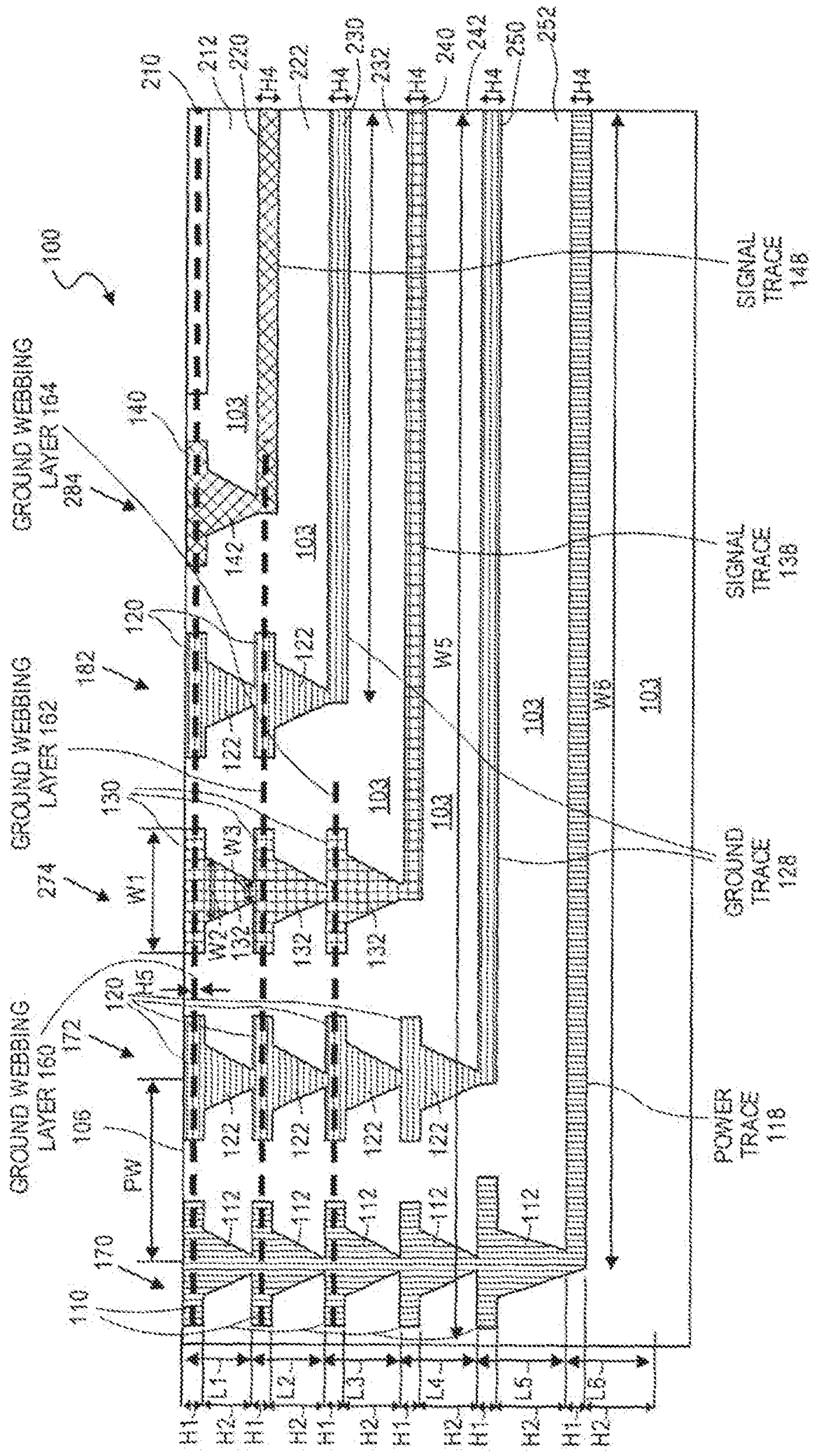
FIG. 2A is a schematic cross-sectional side view of FIG. 1 showing ground webbing structures as dashed " - - - " lines and showing data signal receive and transmit interconnect stacks.
Figure 2B:
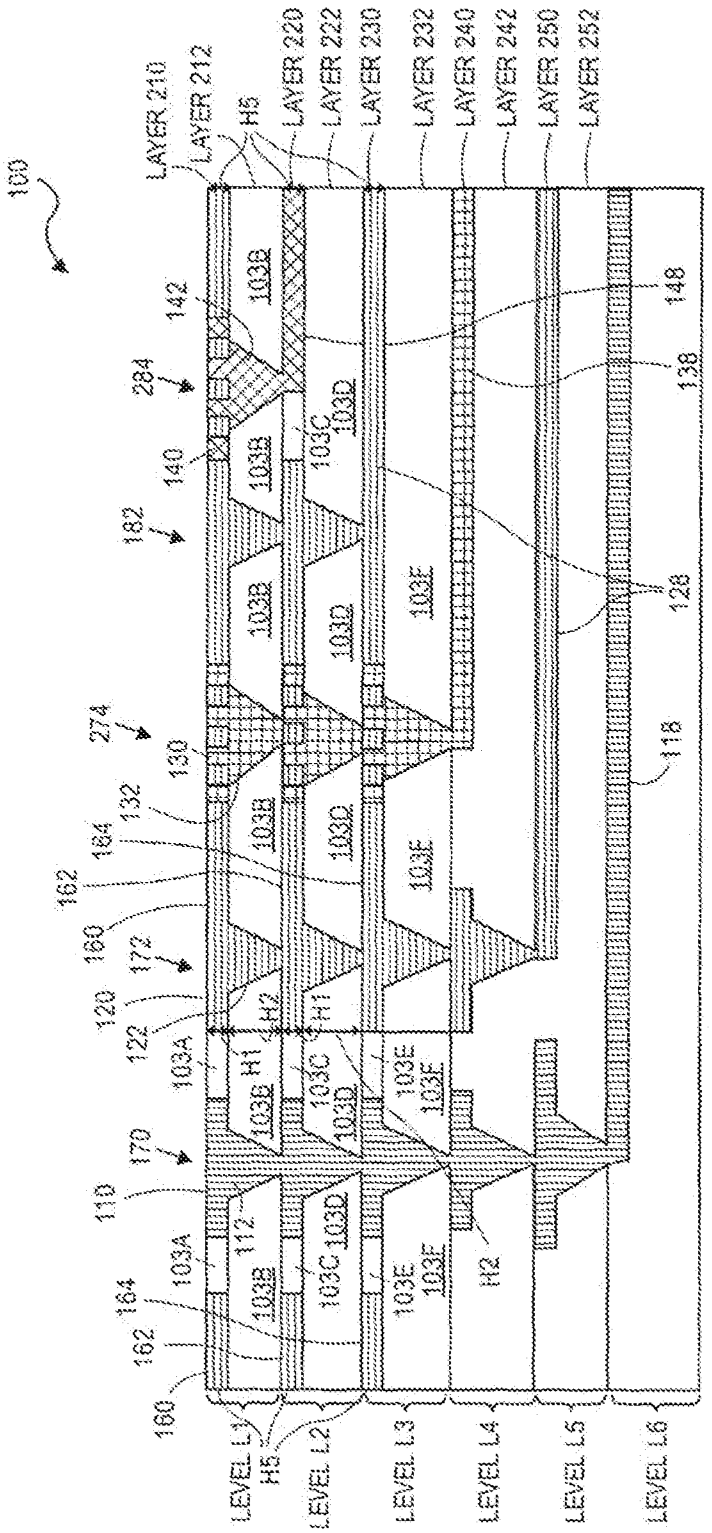
FIG. 2B is a schematic cross-sectional side view of FIG. 1 showing ground webbing structures as solid lines and not showing data signal receive and transmit interconnect stacks.

FIG. 2A is a schematic cross-sectional side view of the package of FIG. 1 showing ground webbing structures 160, 162 and 164 as dashed " - - - " lines and showing data signal receive and transmit interconnect stacks or rows 174 and 184. FIG. 2B is a schematic cross-sectional side view of the package of FIG. 1 showing ground webbing structures 160, 162 and 164 as solid lines and not showing data signal receive and transmit interconnect stacks or rows 174 and 184. FIGS. 2A-B show package 100 top or topmost (e.g., first level) interconnect level L1 is formed over second level interconnect level L2, which is formed over third interconnect level L3, which is formed over fourth interconnect level L4, which is formed over fifth interconnect level L5, which is formed over fifth interconnect level L6. In FIGS. 2A-B, data signal receive interconnect stack 274 may represent the interconnect stack (e.g., upper contacts and via contacts of multiple levels of levels L1-L5) of each of rows 174-180 of FIGS. 1 and 3. In some cases, stack 274 may represent all the interconnect stack of rows 174-180 of FIGS. 1 and 3. Also, in FIGS. 2A-B, data signal transmit interconnect stack 284 may represent the interconnect stack (e.g., upper contacts and via contacts of multiple levels of levels L1-L5) of each of rows 184-190 of FIGS. 1 and 3. In some cases, stack 284 may represent all the interconnect stack of rows 184-190 of FIGS. 1 and 3.

FIG. 2A shows package device 100 having level L1 which is shown with layer 210 having dielectric 103; contacts 110, 120, 130 and 140; and ground webbing 160 which may be directly attached to and electrically coupled to contacts 120 of layer 210. Level L1 is also shown with layer 212 having dielectric 103; and contacts 112, 122, 132 and 142. Level L2 is shown with layer 220 having contacts 110, 120 and 130; ground webbing 162 which may be directly attached to and electrically coupled to contacts 120 of layer 220; and signal trace 148 which may be directly attached to and electrically coupled to contacts 142 of layer 212. Level L2 is also shown with layer 222 having dielectric 103; and contacts 112, 122 and 132. Level L3 is shown with layer 230 having contacts 110, 120 and 130; ground webbing 164 which may be directly attached to and electrically coupled to contacts 120 of layer 230; and ground trace (or plane) 128 which may be directly attached to and electrically coupled to contacts 122 of layer 222. Level L3 is also shown with layer 232 having dielectric 103; and contacts 112, 122 and 132. Level L4 is shown with layer 240 having contacts 110 and 120; and signal trace 138 which may be directly attached to and electrically coupled to contacts 132 of layer 232. Level L4 is also shown with layer 242 having dielectric 103; and contacts 112 and 122. Level L5 is shown with layer 250 having contacts 110; and ground trace (or plane) 128 which may be directly attached to and electrically coupled to contacts 122 of layer 242. Level L5 is also shown with layer 252 having dielectric 103; and contacts 112. Level L6 is shown with a layer having power trace (or plane) 118 which may be directly attached to and electrically coupled to contacts 112 of layer 252. Level L6 may include other structure or various layers not shown, such as described below.

Below level L6, package 100 may include various interconnect layers, packaging layers, conductive features (e.g., electronic devices, interconnects, layers having conductive traces, layers having conductive vias), layers having dielectric material and other layers as known in the industry for a semiconductor device package. In some cases, the package may be cored or coreless. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peel able core panel. The substrate may be a substrate used in an electronic device package or a microprocessor package.

In some cases, any or all of levels L1-L5 may also include such structures noted above for package 100, thought not shown in FIGS. 1-3. In some cases, the contacts and/or traces of levels L1-L5 are electrically connected to (e.g., physically attached to or formed onto) the conductive structures noted above for package 100.

Row 170 is shown having power interconnect levels L1-L5. In some embodiments, row 170 has fewer or more interconnect levels than L1-L5. Each of levels L1-L5 may have at least one power interconnect stack with a power upper contact 110 (e.g., of an upper of the level such as layer 210 of level L1) formed over or onto a power via contact 112 (e.g., of a lower layer of the level such as layer 212 of level L1) such that the two contacts are directly attached (e.g., touching) and electrically coupled to each other. Each layers power via contact 112 (e.g., of the lower layer of the level) may be formed over or onto an power upper contact 110 of the level below (e.g., of an upper layer of the level below such as layer 220 of level L2), such that the two contacts are directly attached (e.g., touching) and electrically coupled to each other. Each power upper contact 110 may have width, or diameter W1 and height H1. Each power via contact 112 may have top width W2, bottom width W3, and height H2. These widths and height may be the same for each power upper contact and power via contact of interconnect levels L1-L5. Power via contact 112 of level L5 (e.g., of the lowest power via level of an interconnect stack) is formed over or onto power signal trace 118 such that the via contact is directly attached (e.g., touching) and electrically coupled to power signal trace 118. Trace 118 has height H4 and width W6. It can be appreciated that power contacts 110 and 112; and trace 118 may have width and/or heigh less than or greater than those mentioned above.

Zones 102, 104, 105 and 107 (and levels L1-L5) may have features having standard package pitch as known for a semiconductor die package, chip package; or for another device (e.g., interface, PCB, or interposer) typically connecting a die (e.g., IC, chip, processor, or central processing unit) to a socket, a motherboard, or another next-level component.

In some cases, height H1 may be approximately 15 micrometers (15×E-6 meter—"um") and width W1 is between 75 and 85 um. In some cases, height H1 is between 10 and 20 micrometers (um). In some cases, it is between 5 and 30 micrometers. In some cases, width W1 is between 70 and 90 micrometers (um). In some cases, it is between 60 and 110 micrometers. It can be appreciated that height H1 may be an appropriate height of a conductive material contacts formed on a top layer of or within a package device, that is less than or greater than those mentioned above.

In some cases, H2 is approximately 25 micrometers, width W2 is between 65 and 75 um, and width W3 is between 30 and 50 um. In some cases, height H2 is between 20 and 30 micrometers (um). In some cases, it is between 10 and 40 micrometers. It can be appreciated that height H1 may be an appropriate height of a conductive material via contact within a package device, that is less than or greater than those mentioned above. In some cases, width W2 is between 60 and 85 micrometers (um). In some cases, it is between 50 and 90 micrometers. In some cases, width W3 is between 20 and 50 micrometers (um). In some cases, it is between 10 and 60 micrometers.

In some cases, height H4 may be approximately 15 micrometers (15×E-6 meter—"um") and width W6 is between 1 millimeter (mm) and 20 mm. In some cases, height H4 is between 10 and 20 micrometers (um). In some cases, it is between 5 and 30 micrometers. It can be appreciated that height H4 may be an appropriate height of a conductive material grounding plane or webbing within a package device for reducing cross talk and for isoating signal contacts, that is less than or greater than those mentioned above. In some cases, width W6 can span an entire width of a die or chip.

Row 172 is shown having ground isolation interconnect levels L1-L4. In some embodiments, row 172 has fewer or more interconnect levels than L1-L4. Each of levels L1-L4 may have at least one ground isolation interconnect stack with an ground isolation upper contact 120 (e.g., of an upper of the level such as layer 210 of level L1) formed over or onto a ground isolation via contact 122 (e.g., of a lower layer of the level such as layer 212 of level L1) such that the two contacts are directly attached (e.g., touching) and electrically coupled to each other. Each layers ground isolation via contact 122 (e.g., of the lower layer of the level) may be formed over or onto a ground isolation upper contact 120 of the level below (e.g., of an upper layer of the level below such as layer 220 of level L2), such that the two contacts are directly attached (e.g., touching) and electrically coupled to each other. Each ground isolation upper contact 120 may have width, or diameter W1 and height H1. Each ground isolation via contact 122 may have top width W2, bottom width W3, and height H2. These widths and height may be the same for each ground isolation upper contact and ground isolation via contact of interconnect levels L1-L4. Ground isolation via contact 122 of level L4 (e.g., of the lowest ground isolation via level of an interconnect stack) is formed over or onto ground isolation signal trace 128 such that the via contact is directly attached (e.g., touching) and electrically coupled to ground isolation signal trace 128. Trace 128 has height H4 and may have a width such as width W6. It can be appreciated that ground isolation contacts 120 and 122; and trace 128 may have width and/or heigh less than or greater than those mentioned above.

Row 174 is shown having receive data signal interconnect levels L1-L3. In some embodiments, row 174 has fewer or more interconnect levels than L1-L3. Each of levels L1-L3 may have at least one receive data signal interconnect stack with an receive data signal upper contact 130 (e.g., of an upper of the level such as layer 210 of level L1) formed over or onto a receive data signal via contact 132 (e.g., of a lower layer of the level such as layer 212 of level L1) such that the two contacts are directly attached (e.g., touching) and electrically coupled to each other. Each layers receive data signal via contact 132 (e.g., of the lower layer of the level) may be formed over or onto a receive data signal upper contact 130 of the level below (e.g., of an upper layer of the level below such as layer 220 of level L2), such that the two contacts are directly attached (e.g., touching) and electrically coupled to each other. Each receive data signal upper contact 130 may have width, or diameter W1 and height H1. Each receive data signal via contact 132 may have top width W2, bottom width W3, and height H2. These widths and height may be the same for each receive data signal upper contact and receive data signal via contact of interconnect levels L1-L3. Receive data signal via contact 132 of level L3 (e.g., of the lowest receive data signal via level of an interconnect stack) is formed over or onto receive data signal trace 138 such that the via contact is directly attached (e.g., touching) and electrically coupled to receive data signal trace 138. Trace 138 has height H4 and may have a width such as width W6. It can be appreciated that receive data signal contacts 130 and 132; and trace 138 may have width and/or heigh less than or greater than those mentioned above.

FIGS. 2A-B show only stack 274 of rows 174-180. However, it can be appreciated that stack 274 can represent any one of rows 174-180. In some cases, stack 274 of FIGS. 2A-B is an example of all the rows 174-180 of FIGS. 1 and 3.

Row 182 is shown having ground isolation interconnect levels L1-L2. In some embodiments, row 182 has fewer or more interconnect levels than L1-L2. In some embodiments, row 182 has power interconnect stacks in levels L1-L2 as well as ground isolation interconnect stacks in levels L1-L2. Each of levels L1-L2 may have at least one ground isolation interconnect stack with an ground isolation upper contact 120 formed over or onto a ground isolation via contact 122, which is formed over or onto an ground isolation upper contact 120 of the layer below, as noted for row 172. These may be formed as noted for row 172. Ground isolation via contact 122 of level L2 (e.g., of the lowest ground isolation via level of an interconnect stack) is formed over or onto ground isolation signal trace 128 as noted for row 172. It can be appreciated that ground isolation contacts 120 and 122; and trace 128 of row 182 may have width and/or height as noted for row 172.

Row 184 is shown having transmit data signal interconnect level L1. In some embodiments, row 184 has more interconnect levels than L1. Level L1 may have at least one transmit data signal interconnect stack with an transmit data signal upper contact 140 (e.g., of an upper of the level such as layer 210 of level L1) formed over or onto a transmit data signal via contact 142 (e.g., of a lower layer of the level such as layer 212 of level L1) such that the two contacts are directly attached (e.g., touching) and electrically coupled to each other. Each layers transmit data signal via contact 142 (e.g., of the lower layer of the level) may be formed over or onto a transmit data signal upper contact 140 of the level below (e.g., of an upper layer of the level below such as layer 220 of level L2), such that the two contacts are directly attached (e.g., touching) and electrically coupled to each other. Each transmit data signal upper contact 140 may have width, or diameter W1 and height H1. Each transmit data signal via contact 142 may have top width W2, bottom width W3, and height H2. These widths and height may be the same for each transmit data signal upper contact and transmit data signal via contact of any other transmit data signal layers exist in row 184. Transmit data signal via contact 142 of level L1 (e.g., of the lowest transmit data signal via level of an interconnect stack) is formed over or onto transmit data signal trace 148 such that the via contact is directly attached (e.g., touching) and electrically coupled to transmit data signal trace 148. Trace 148 has height H4 and may have a width such as width W6. It can be appreciated that transmit data signal contacts 140 and 142; and trace 148 may have width and/or height less than or greater than those mentioned above.

FIGS. 2A-B show only stack 284 of rows 184-190. However, it can be appreciated that stack 284 can represent any one of rows 184-190. In some cases, stack 284 and FIGS. 2A-B is an example of all the rows 184-190 of FIGS. 1 and 3.

FIGS. 2A-B show pitch width PW between rows 170 and 172. It can be appreciated that the same pitch width may apply to each of adjacent rows of rows 172-190.

FIG. 2B shows dielectric portions 103*a* in layer 210 between any of (e.g., occupying space not occupied by) upper contacts 110, 120, 130, 140, traces, and webbing 160 of layer 210. It also shows dielectric portions 103*b* in layer 212 between any of via contacts 112, 122, 132, 142 and traces of layer 212. It also shows dielectric portions 103*c* in layer 220 between any of upper contacts 110, 120, 130, 140, traces, and webbing 162 of layer 220. It also shows dielectric portions 103*d* in layer 222 between any of via contacts 112, 122, 132, 142 and traces of layer 222. It also shows dielectric portions 103*e* in layer 230 between any of upper contacts 110, 120, 130, 140, traces, and webbing 164 of layer 230. It also shows dielectric portions 103*f* in layer 232 between any of via contacts 112, 122, 132, 142 and traces of layer 232. Dielectrics 103*a*, 103*b*, 103*c*, 103*d*, 103*e*, and 103*f* may be a dielectric as described for dielectric 103.

According to some embobiments, contacts 110, 120, 130 and 140; traces; dielectric layers or portions; and webbing 160 of level L1 may be described as “first level” power contacts 110, ground isolation contacts 120, data signal receive contacts 130 and data signal transmit contacts 140; traces; dielectric layers or portions; and webbing, respectively. For example, contact 120 of level L1 may be described as a “first level ground contact”. Also, according to some embodiments, via contacts 112, 122, 132 and 142; traces; dielectric layers or portions; and webbing 162 of level L2 may be described as “second level” power via contacts 112, ground isolation via contacts 122, data signal receive via contacts 132 and data signal transmit via contacts 142; traces; dielectric layers or portions; and webbing, respectively. For example, via contact 122 of level L1 may be described as a "first level ground via contact". In some cases, these descriptions also repeat for level L2 (e.g., "second level . . . contacts"), level L3 ("third level . . . contacts"), level L4 (e.g., "fourth level . . . contacts"), and level L5 ("fifth level . . . contacts").

Figure 3A:
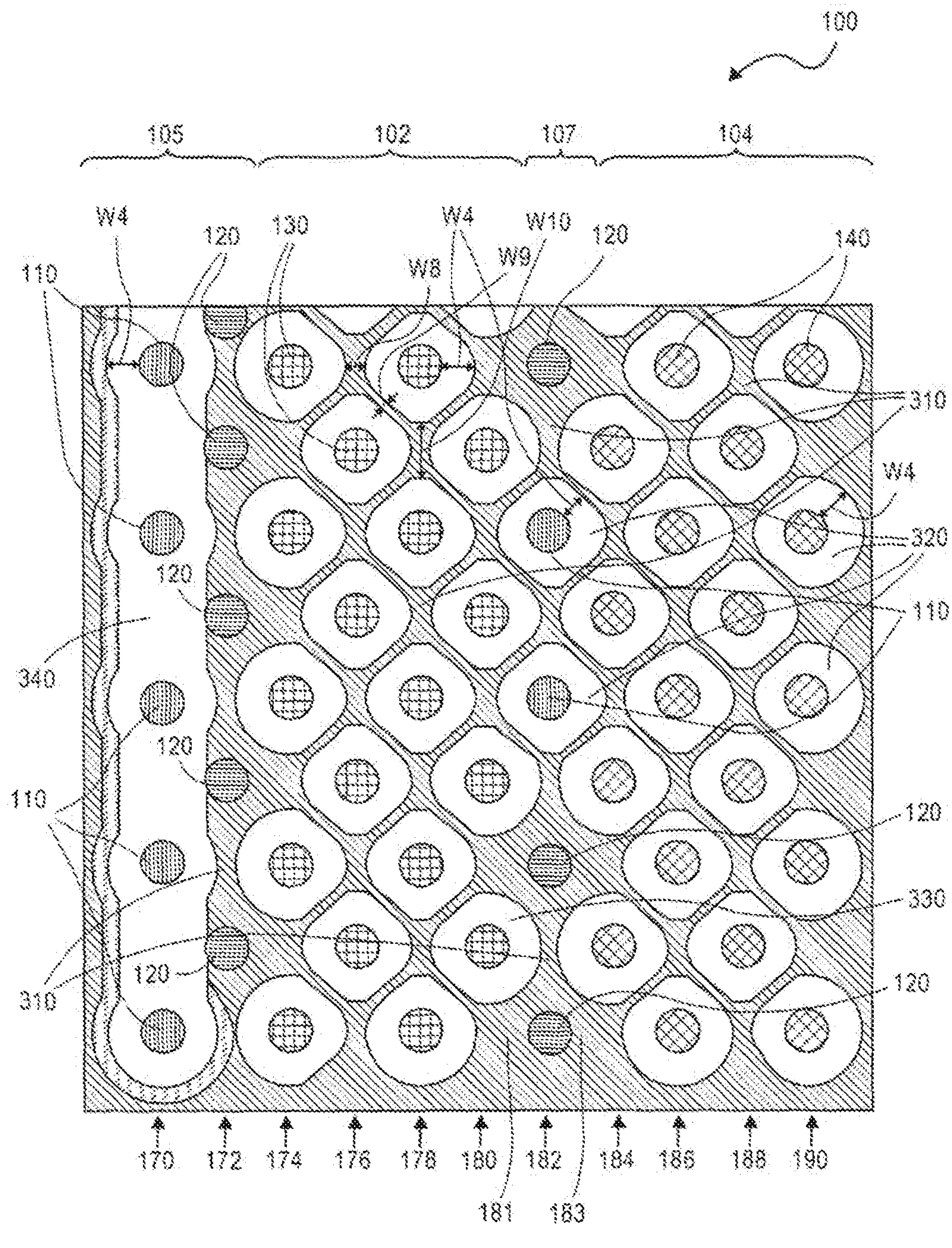
FIG. 3A is a schematic cross-sectional top view of the package of FIG. 1 showing top or upper layer contacts of a top interconnect level; and shading representing one or more layers of ground webbing structure of the package.

FIG. 3A is a schematic cross-sectional top view of the package of FIG. 1 showing top or upper layer contacts of a top or typical interconnect level; and shading representing one typical layer of ground webbing structure of the package. FIG. 3A shows package 100 having zone 102 with contacts 130 in rows 174-180. It shows zone 104 having contacts 140 in rows 184-190. It shows zone 105 having contacts 110 in row 170 and contacts 120 in row 172. It shows zone 107 having contacts 110 and 120 in row 182.

FIG. 3A shows shading 310 representing ground webbing structure 310 that may represent all or a portion of structures 160, 162 or 164 at levels L1, L2 or L3. FIG. 3A shows webbing structure 310 such as a layer of solid conductor material extending between any or all of (e.g., occupying space not occupied by) width W4 of dielectric portions 103*a* surrounding upper contacts 110, 130, 140, traces, and ties (e.g., in layer 210).

In some cases, ground webbing structures 160, 162, and 164 may be described as conductive ground webbing structures in die-bump fields or zones 102, 104, 105 and 107 to reduce bump field crosstalk, cluster-to-cluster crosstalk and in-cluster crosstalk of zones 102, 104, 105 and 107. This is described further below.

Row 170 shows locations 340 such as areas between contacts 110 and surrounding ground webbing structure 310 where no webbing exists. Examples of locations 340 are indicated by no shading color. For example, the brightest areas of FIG. 3A, around contacts 110 of row 170, do not have any ground webbing structure for a distance of W4 around each contact which is between the edge of a contact and the inner edge of all of the webbing structure 310. Here, webbing 310 surrounds contacts 110 in row 170 at a distance of width W4 (e.g., are width W4 away from the edges of contacts 110). In some cases, width W4 is approximately 12 micrometers. In some cases, it is between 10 and 20 micrometers (um). In some cases, it is between 8 and 30 micrometers. In some cases, it is between 12 and 50 micrometers.

Rows 172 and 182 show areas in rows 172 and 182 that have structure 310, such as where one of webbings 160, 162 or 164 exist. Examples of structure 310 are indicated by the shading.

Also, row 182 shows locations 320 such as an area between contacts 110 and surrounding ground webbing structure 310 or where no webbing exists. Examples of locations 320 are indicated by no shading color. For example, the brightest areas of FIG. 3A, around contacts 110 of row 182, do not have any ground webbing structure for a distance of W4 around each contact which is between the edge of a contact and the inner edge of all of the webbing structure 310. Here, webbing 310 surrounds contacts 110 in row 182 at a distance of width W4 (e.g., are width W4 away from the edges of contacts 110).

Zone 102 (e.g., rows 174-180) shows structure 310, such as where one of webbings 160, 162 or 164 exist. Examples of structure 310 are indicated by the shading. Zone 102 (e.g., rows 174-180) also show locations 330 such as an area between contacts 130 and surrounding ground webbing structure where no webbing exists. Examples of locations 330 are indicated by no shading color. For example, the brightest areas of FIG. 3A, around contacts 130 of rows 174-180, do not have any ground webbing structure for a distance of W4 around each contact which is between the edge of a contact and the inner edge of all of the webbing structure 310. Here, webbing 310 surrounds contacts 130 in rows 174-180 at a distance of width W4 (e.g., are width W4 away from the edges of contacts 130).

Zone 104 (e.g., rows 184-190) shows structure 310, such as where one of webbings 160, 162 or 164 exist. Zone 104 (e.g., rows 184-190) also shows locations 320 such as an area between contacts 140 and surrounding ground webbing structure where no webbing exists. Examples of locations 320 are indicated by no shading color. For example, the brightest areas of FIG. 3A, around contacts 140 of rows 184-190, do not have any ground webbing structure for a distance of W4 around each contact which is between the edge of a contact and the inner edge of all of the webbing structure 310. Here, webbing 310 surrounds contacts 140 in rows 184-190 at a distance of width W4 (e.g., are width W4 away from the edges of contacts 140).

FIG. 3A also shows width W8 of webbing structure 310 between side by side, adjacent contacts. W8 may represent a width of solid conductor material or webbing of webbing 310 (e.g., representing the same for webbing 160, 162 or 164) that is disposed between two side by side, adjacent contacts from a top perspective view (e.g., along pitch width PW), and that surrounds the contacts by distance W4. In some cases, width W8 is approximately 12 micrometers. In some cases, it is between 10 and 20 micrometers (um). In some cases, it is between 8 and 30 micrometers. In some cases, it is between 12 and 50 micrometers. Width W8 may exist for webbing 160, 162 and 164.

Next, FIG. 3A shows width W9 of webbing structure 310 between diagonally adjacent contacts. W9 may represent a width of solid conductor material or webbing of webbing 310 (e.g., representing the same for webbing 160, 162 or 164) that is disposed between two diagonally adjacent contacts (e.g., along diagonal pitch PD), and that surrounds the contacts by distance W4. In some cases, width W9 is approximately 12 micrometers. In some cases, it is between 10 and 20 micrometers (um). In some cases, it is between 8 and 30 micrometers. In some cases, it is between 12 and 50 micrometers. Width W9 may exist for webbing 160, 162 and 164.

Also, FIG. 3A shows width W10 of webbing structure 310 between upper and lower, adjacent contacts. W10 may represent a width of solid conductor material or webbing of webbing 310 (e.g., representing the same for webbing 160, 162 or 164) that is disposed between two upper and lower, adjacent contacts (e.g., along length pitch PL), and that surrounds the contacts by distance W4. In some cases, width W10 is approximately 75 micrometers. In some cases, it is between 60 and 90 micrometers (um). In some cases, it is between 50 and 110 micrometers. In some cases, it is between 40 and 130 micrometers. Width W10 may exist for webbing 160, 162 and 164.

FIGS. 2A-B show embodiments of ground webbing structures 160, 162, and 164 at levels L1, L2, and L3. FIG. 3A show embodiments of ground webbing structures 310 which may represent any or all of structures 160, 162, and 164 at levels L1, L2, and L3. FIGS. 2A-B show ground webbing layer 160 that may be formed along, or under top surface 106. Ground webbing 160 has height H5 and width W5. In some cases height H5 is equal to height H1. Ground webbing 160 may be an upper (e.g., top or first) layer of conductive material that is formed as part of, touching, and electrically coupled to upper ground contacts 120 of upper layer 210 of level L1. In some cases, webbing 160 is an upper layer of conductive material that is formed during the same deposition or plating used to form upper contacts 120 of level L1. In some cases, webbing 160 contacts many or most of the upper contacts 120 of level L1. In some cases, webbing 160 contacts all of upper contacts 120 of level L1. Webbing structure 160 may be a layer of solid conductor material extending between all of (e.g., occupying space not occupied by) width W4 of dielectric portions 103*a* surrounding upper contacts 110, 130, 140, and any traces of layer 210.

In some cases, height H5 may be approximately 15 micrometers (15×E-6 meter—"um") and width W5 is between 1 millimeter (mm) and 20 mm. In some cases, height H5 is between 10 and 20 micrometers (um). In some cases, it is between 5 and 30 micrometers. In some cases, width W5 can span an entire width of a die or chip.

For example, ground isolation webbing structure 160 is shown by the dashed lines (e.g., " . . . ") in upper layer 210 of level L1 of FIG. 2A; by the shaded height H5 in FIG. 2B; and by shading of webbing structure 310 in FIG. 3A. Structure 160 is an upper (e.g., top, topmost or or first) level L1 (or layer 210) ground webbing structure. In some cases, webbing structure 160 is formed (e.g., disposed) having top surfaces that are part of or horizontally planar with surface 106, such as by being formed with or as part of layer 210 having conductor (1) that includes contacts 110, 120, 130 and 140 of level L1; and (2) between which dielectric 103 of layer 210 exists (having top surface 106). In some cases, webbing structure 160 is formed (e.g., disposed) above top surface 106, such as where the layer of conductor is formed on or over a layer of dielectric or other material. In some cases, webbing structure 160 is formed (e.g., disposed) under top surface 106, such as when a further layer of dielectric, solder resist, or other material is formed on level L1, over webbing 160.

FIGS. 2A-B show ground webbing layer 162 formed along an upper surface of dielectric upon which upper contacts of level L2 are formed. Ground webbing 162 has height H5 and width W5. Ground webbing 162 may be an upper (e.g., top or first) layer of conductive material that is formed as part of, touching, and electrically coupled to upper ground contacts 120 of upper layer 220 of level L2. In some cases, webbing 162 is an upper layer of conductive material that is formed during the same deposition or plating used to form upper contacts 120 of level L2. In some cases, webbing 162 contacts many or most of the upper contacts 120 of level L2. In some cases, webbing 160 contacts all of upper contacts 120 of level L2. Webbing structure 162 may be a layer of solid conductor material extending between all of (e.g., occupying space not occupied by) width W4 of dielectric portions 103*a* surrounding any of upper contacts 110, 130, 140, and traces 148 of layer 220.

For example, ground isolation webbing structure 162 is shown by the dashed lines (e.g., " - - - ") in upper layer 220 of level L2 of FIG. 2A; by the shaded height H5 in FIG. 2B; and by shading of webbing structure 310 in FIG. 3A. Structure 162 is a second or secondmost level L2 (or layer 220) ground webbing structure. In some cases, webbing structure 162 is formed (e.g., disposed) having top surfaces that are part of or horizontally planar with a top surface of level L2, such as by being formed with or as part of layer 220 having conductor (1) that includes upper contacts 110, 120, 130 and trace 148 of level L2; and (2) between which dielectric 103 of layer 220 exists. In some cases, webbing structure 162 is formed (e.g., disposed) under top surface 106, by height H2, such as due to having level L1 formed over webbing 162.

FIGS. 2A-B show ground webbing layer 164 formed along an upper surface of dielectric upon which upper contacts of level L3 are formed. Ground webbing 164 has height H5 and width W5. Ground webbing 164 may be an upper (e.g., top or first) layer of conductive material that is formed as part of, touching, and electrically coupled to upper ground contacts 120 of upper layer 230 of level L3. In some cases, webbing 164 is an upper layer of conductive material that is formed during the same deposition or plating used to form upper contacts 120 of level L3. In some cases, webbing 164 contacts many or most of the upper contacts 120 of level L3. In some cases, webbing 164 contacts all of upper contacts 120 of level L3. Webbing structure 164 may be a layer of solid conductor material extending between all of (e.g., occupying space not occupied by) width W4 of dielectric portions 103*a* surrounding any of upper contacts 110, 130, 140, and traces 128 of layer 230.

For example, ground isolation webbing structure 164 is shown by the dashed lines (e.g., " - - - ") in upper layer 230 of level L3 of FIG. 2A; by the shaded height H5 in FIG. 2B; and by shading of webbing structure 310 in FIG. 3A. Structure 164 is a third or thirdmost level L3 (or layer 230) ground webbing structure. In some cases, webbing structure 164 is formed (e.g., disposed) having top surfaces that are part of or horizontally planar with a top surface of level L3, such as by being formed with or as part of layer 230 having conductor (1) that includes upper contacts 110, 120, 130 and trace 128 of level L3; and (2) between which dielectric 103 of layer 230 exists. In some cases, webbing structure 164 is formed (e.g., disposed) under top surface 106, by height (2×H2 plus 2×H1), such as due to having levels L1 and L2 formed over webbing 164.

Figure 3B:
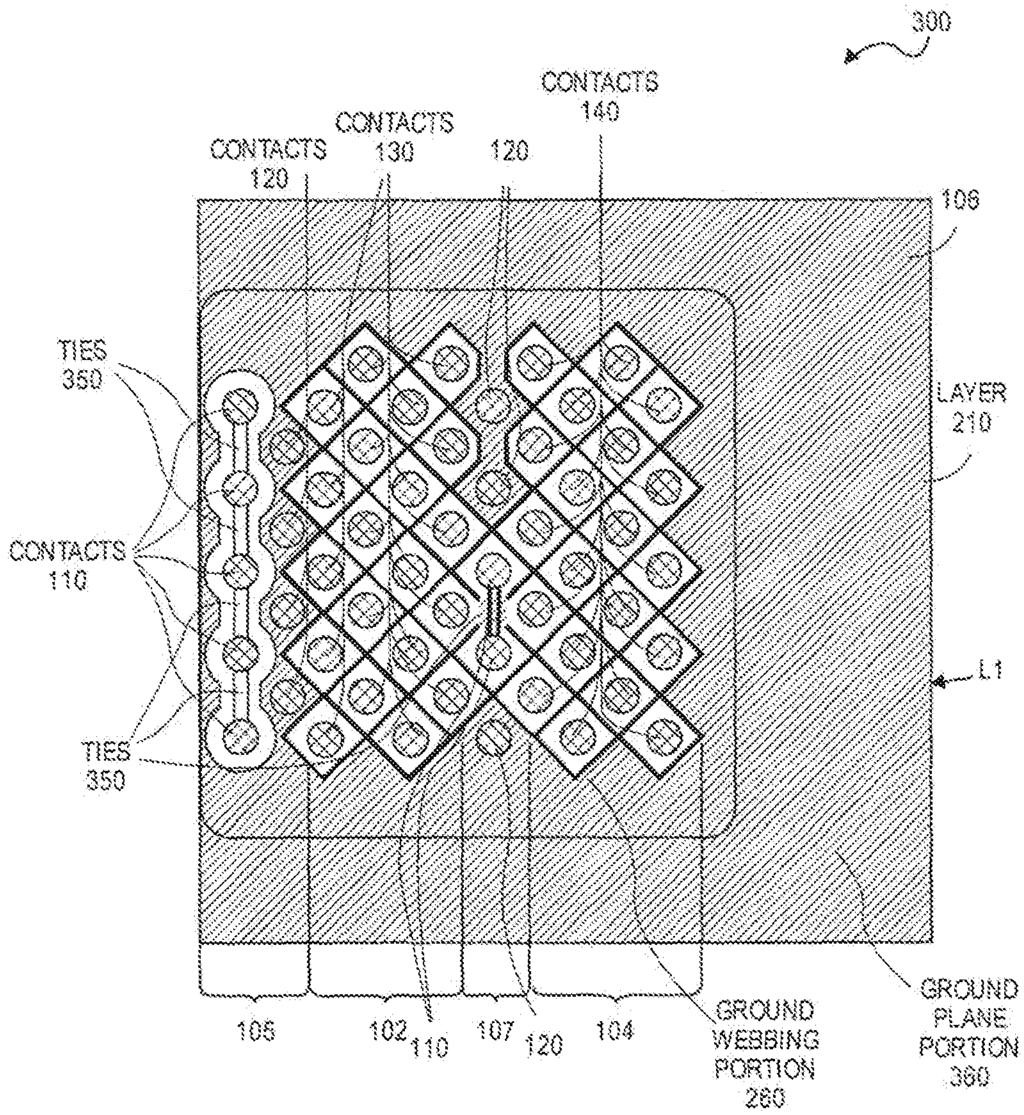
FIG. 3B is a schematic cross-sectional top view of a ground webbing structure package showing top or upper layer ground webbing structure portion 260 of a top interconnect level of the package.

FIG. 3B is a schematic cross-sectional top view of a ground webbing structure package showing top or upper layer ground webbing structure portion 260 of a top interconnect level of the package. In some cases, package 300 is package 100, such as by having zones 102, 104, 105 and 107 at levels L1-L6. In some cases it is a package similar to package 100 except that the ground webbing structures 160, 162 and 164 are described as ground webbing portions 260, 262 and 264, respectively. In some cases it is a package similar to package 100 except that the ground webbing structures 160, 162 and 164 are described as the combination of ground webbing portion 260 and plane 360; ground webbing portion 262 and plane 362; and ground webbing portion 264 and plane 364, respectively.

FIG. 3B may be a top perspective view of layer 210 of device 300. It shows layer 210 having power contacts 110, ground contacts 120, received signal contacts 130, transmit signal contacts 140, ground webbing portion 260, and ground plane portion 360. FIG. 3B also shows layer 210 having zone 102 with contacts 130 in rows 174-180. It shows zone 104 having contacts 140 in rows 184-190. It shows zone 105 having contacts 110 in row 170 and contacts 120 in row 172. It shows zone 107 having contacts 110 and 120 in row 182. It shows layer 210 having ground webbing portion 260 directly attached to and electrically coupled to contacts 120 of layer 210. It shows layer 210 having ground plane portion 360 directly attached to (e.g., formed with) and electrically coupled to webbing portion 260. In some cases, contacts 110 of layer 210 in zones 105 and 107 are tied together in layer 210 by power signal ties 350 (e.g., conductor material, such as metal or copper, ties directly attached to and extending between adjacent ones of contacts 110) as shown. Webbing portion 260 may be a layer of solid conductor material extending between all of (e.g., occupying space not occupied by) a width of dielectric material surrounding upper contacts 110, 130, 140, and any ties of layer 210. Plane portion 360 may be a layer of solid conductor material extending around and physically attached to (e.g., formed with or as part of) portion 260.

In some cases, portion 260 may be the same as webbing 160 (e.g., the same device, formed the same way and having the same function and capabilities as webbing 160). In some cases, the combination of portion 260 and portion 360 may be the same as webbing 160. In some cases, the descriptions for webbing 160 describe portion 260; and portion 360 is a ground plane that has inner edges formed with, extending from, directly attached to, and electrically coupled to (e.g., with zero resistance) the outer edges of portion 260. In FIG. 3B, portion 260 may exist in all of zones 102, 104, 105 and 107. In some cases, portion 260 may cover an area equal to at least width (WE2+2WE1+WE3)×length LE1.

FIG. 3B shows all of the openings in webbing portion 260 of zone 102 having contacts 130. However, it can be appreciated that fewer than all, such as half (or one third or two thirds) of all of the openings in webbing portion 260 of zone 102 may have contacts 130. Also, it can be appreciated that in some embodiments, webbing portion 260 may only extends across half of zone 102 (e.g., across only half of width WE1 of zone 102) and in this case only half of all of the openings shown in webbing portion 260 of zone 102 have contacts 130 (not shown, but accomplished by removing half of width WE1 of webbing portion 260 and contacts 130 with ground plane portion 360 in zone 102).

FIG. 3B also shows all of the openings in webbing portion 260 of zone 104 having contacts 140. However, it can be appreciated that fewer than all, such as half (or one third or two thirds) of all of the openings in webbing portion 260 of zone 104 may have contacts 140. Also, it can be appreciated that in some embodiments, webbing portion 260 may only extends across half of zone 104 (e.g., across only half of width WE1 of zone 104) and in this case only half of all of the openings shown in webbing portion 260 of zone 104 have contacts 140 (not shown, but accomplished by removing half of width WE1 of webbing portion 260 and contacts 140 with ground plane portion 360 in zone 104).

Figure 3C:
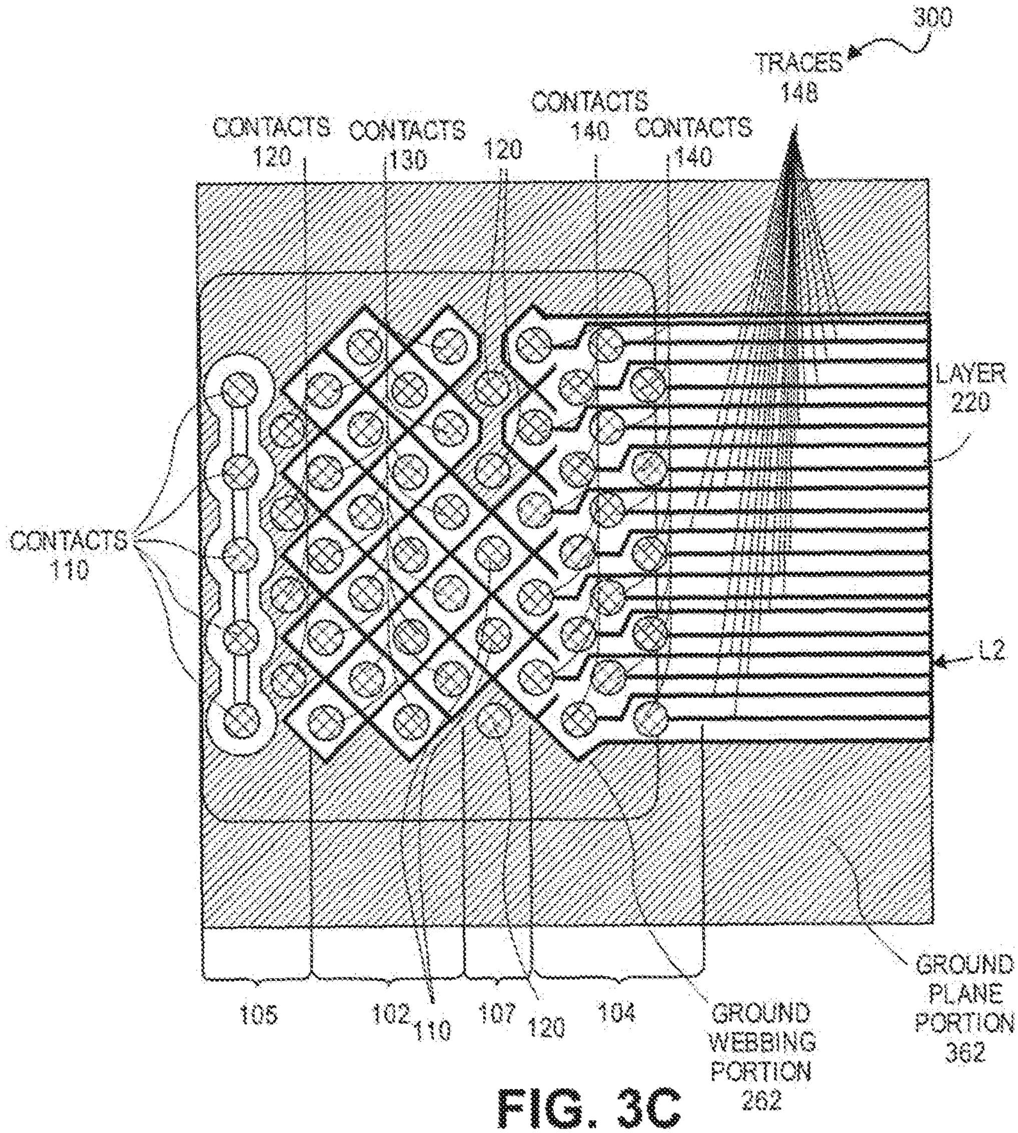
FIG. 3C is a schematic cross-sectional top view of a ground webbing structure package showing top layer or upper layer ground webbing structure portion 262 of a second interconnect level of the package.

FIG. 3C is a schematic cross-sectional top view of a ground webbing structure package showing top layer or upper layer ground webbing structure portion 262 of a second interconnect level of the package. FIG. 3C may be a top perspective view of layer 220 of device 300. In some cases, layer 210 of FIG. 3B is formed upon or onto layer 212 (e.g., see FIGS. 2A-B) which is formed upon or onto layer 220 of FIG. 3C. FIG. 3C shows layer 220 having power contacts 110, ground contacts 120, received signal contacts 130, transmit signal contacts 140, ground webbing portion 262, ground plane portion 362, and signal traces 148 which may be directly attached to and electrically coupled to contacts 140 of layer 220. Webbing portion 262 may be a layer of solid conductor material extending between all of (e.g., occupying space not occupied by) a width of dielectric material surrounding upper contacts 110, 130 and any traces and ties of layer 220. Plane portion 362 may be a layer of solid conductor material extending around and physically attached to (e.g., formed with or as part of) portion 262.

FIG. 3C also shows layer 220 having zone 102 with contacts 130 in rows 174-180. It shows zone 104 having contacts 140 in rows 184-190. It shows zone 105 having contacts 110 in row 170 and contacts 120 in row 172. It shows zone 107 having contacts 110 and 120 in row 182. It shows layer 220 having ground webbing portion 262 directly attached to and electrically coupled to contacts 120 of layer 220. It shows layer 220 having ground plane portion 362 directly attached to (e.g., formed with) and electrically coupled to webbing portion 262. In some cases, contacts 110 of layer 220 in zone 105 (and optionally zone 107, now shown but removing portion 262 from between those two contacts 110 such as shown in FIG. 3B) are tied together in layer 220 by power signal ties (e.g., conductor material, such as metal, ties directly attached to and extending between adjacent ones of contacts 110) as shown.

In some cases, portion 262 may be the same as webbing 162 (e.g., the same device, formed the same way and having the same function and capabilities as webbing 162). In some cases, the combination of portion 262 and portion 362 may be the same as webbing 162. In some cases, the descriptions for webbing 162 describe portion 262; and portion 362 is a ground plane that has inner edges formed with, extending from, directly attached to, and electrically coupled to (e.g., with zero resistance) the outer edges of portion 262. In FIG. 3C, portion 262 may exist in all of zones 102, 105 and 107 (but not in zone 104). In some cases, portion 262 may cover an area equal to at least width (WE2+WE1+WE3)×length LE1.

FIG. 3C shows all of the openings in webbing portion 262 of zone 102 having contacts 130. However, it can be appreciated that fewer than all, such as half (or one third or two thirds) of all of the openings in webbing portion 262 of zone 102 may have contacts 130. Also, it can be appreciated that in some embodiments, webbing portion 262 may only extends across half of zone 102 (e.g., across only half of width WE1 of zone 102) and in this case only half of all of the openings shown in webbing portion 262 of zone 102 have contacts 130 (not shown, but accomplished by removing half of width WE1 of webbing portion 262 and contacts 130 with ground plane portion 362 in zone 102).

FIG. 3C shows all of zone 104 having contacts 140. However, it can be appreciated that fewer than all, such as half (or one third or two thirds) of all of zone 104 may have contacts 140. Also, it can be appreciated that in some embodiments, zone 104 only extends across half of shown zone 104 (e.g., across only half of width WE1 of zone 104) and in this case only half of all of shown zone 104 has contacts 140 (not shown, but accomplished by replacing half of width WE1 of contacts 140 with ground plane portion 362 in zone 104).

Figure 3D:
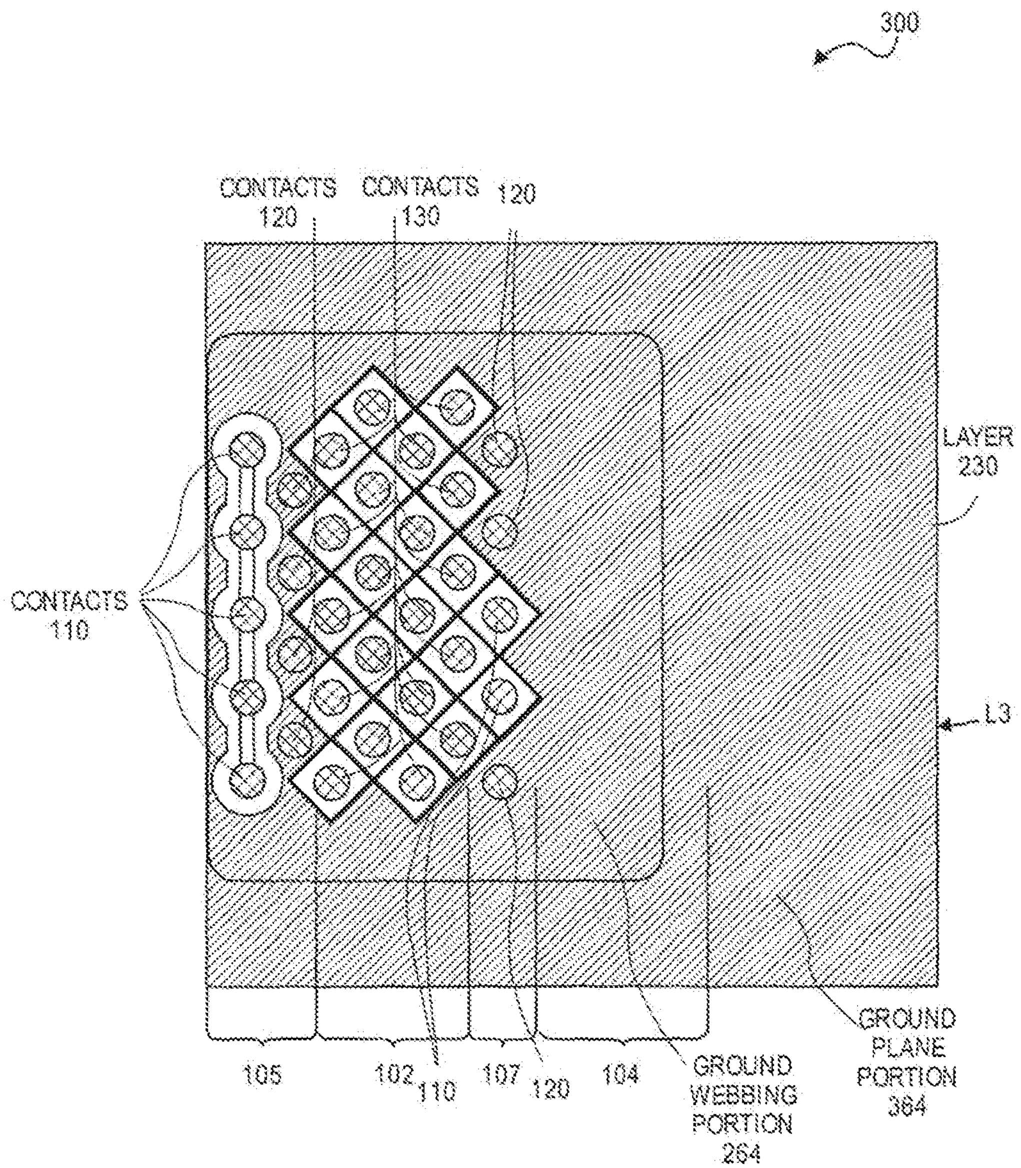
FIG. 3E is a schematic cross-sectional top view of a ground webbing structure package showing top layer or upper layer ground webbing structure portion 266 of a fourth interconnect level of the package.
FIG. 3F is a schematic cross-sectional top view of a ground webbing structure package showing top layer or upper layer ground plane portion 368 of a fifth interconnect level of the package.
FIG. 3G is a schematic cross-sectional top view of a ground webbing structure package showing top layer or upper layer power traces (or plane) layer of a sixth interconnect level of the package.

FIG. 3D is a schematic cross-sectional top view of a ground webbing structure package showing top layer or upper layer ground webbing structure portion 264 of a third interconnect level of the package. FIG. 3D may be a top perspective view of layer 230 of device 300. In some cases, layer 220 of FIG. 3C is formed upon or onto layer 222 (e.g., see FIGS. 2A-B) which is formed upon or onto layer 230 of FIG. 3D. FIG. 3D shows layer 230 having power contacts 110, ground contacts 120, transmit signal contacts 140, ground webbing portion 264, and ground plane portion 364. Webbing portion 264 may be a layer of solid conductor material extending between all of (e.g., occupying space not occupied by) a width of dielectric material surrounding upper contacts 110, 130, and any ties of layer 230. Plane portion 364 may be a layer of solid conductor material extending around and physically attached to (e.g., formed with or as part of) portion 264.

FIG. 3D also shows layer 230 having zone 102 with contacts 130 in rows 174-180. It shows zone 104 having ground plane portion 364 in rows 184-190. It shows zone 105 having contacts 110 in row 170 and contacts 120 in row 172. It shows zone 107 having contacts 110 and 120 in row 182. It shows layer 230 having ground webbing portion 264 directly attached to and electrically coupled to contacts 120 of layer 230. It shows layer 230 having ground plane portion 364 directly attached to (e.g., formed with) and electrically coupled to webbing portion 264. In some cases, contacts 110 of layer 230 in zone 105 (and optionally zone 107, now shown but removing portion 264 from between those two contacts 110 such as shown in FIG. 3B) are tied together in layer 230 by power signal ties (e.g., conductor material, such as metal, ties directly attached to and extending between adjacent ones of contacts 110) as shown.

In some cases, portion 264 may be the same as webbing 164 (e.g., the same device, formed the same way and having the same function and capabilities as webbing 164). In some cases, the combination of portion 264 and portion 364 may be the same as webbing 164. In some cases, the descriptions for webbing 164 describe portion 264; and portion 364 is a ground plane that has inner edges formed with, extending from, directly attached to, and electrically coupled to (e.g., with zero resistance) the outer edges of portion 264. In FIG. 3D, portion 264 may exist only in of zones 102, 105 and 107 (e.g., but not in zone 104 where ground plane portion 364 exists). In some cases, portion 264 may cover an area equal to at least width (WE2+WE1+WE3)×length LE1.

FIG. 3D shows all of the openings in webbing portion 264 of zone 102 having contacts 130. However, it can be appreciated that fewer than all, such as half (or one third or two thirds) of all of the openings in webbing portion 264 of zone 102 may have contacts 130. Also, it can be appreciated that in some embodiments, webbing portion 264 may only extends across half of zone 102 (e.g., across only half of width WE1 of zone 102) and in this case only half of all of the openings shown in webbing portion 264 of zone 102 have contacts 130 (not shown, but accomplished by removing half of width WE1 of webbing portion 264 and contacts 130 with ground plane portion 364 in zone 102).

Figure 3E:
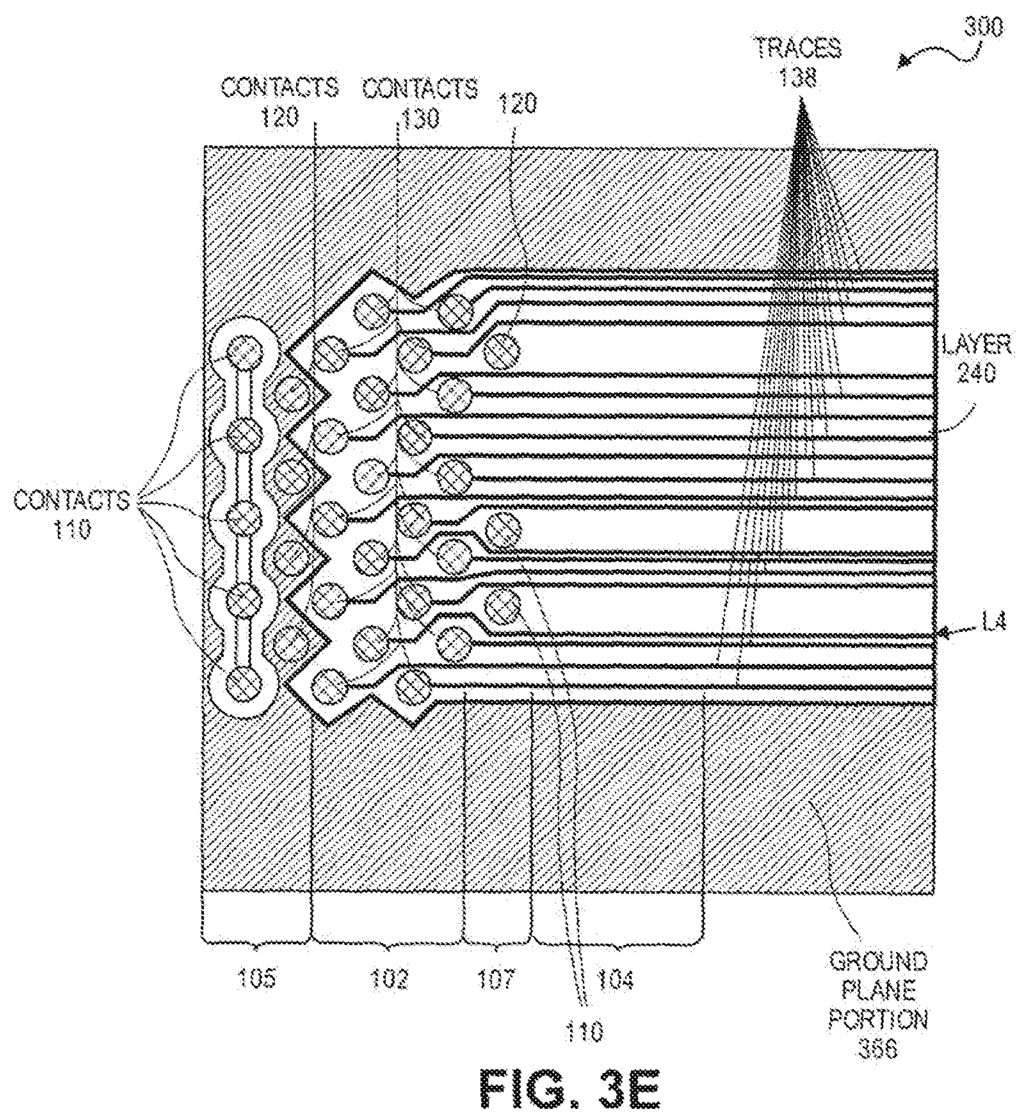

FIG. 3E is a schematic cross-sectional top view of a ground webbing structure package showing top layer or upper layer ground plane portion 366 of a fourth interconnect level of the package. FIG. 3E may be a top perspective view of layer 240 of device 300. In some cases, layer 230 of FIG. 3D is formed upon or onto layer 232 (e.g., see FIGS. 2A-B) which is formed upon or onto layer 240 of FIG. 3E. FIG. 3E shows layer 240 having power contacts 110, ground contacts 120, received signal contacts 130, ground plane portion 366, and signal traces 138 which may be directly attached to and electrically coupled to contacts 130 of layer 240. Plane portion 366 may be a layer of solid conductor material extending around and physically surrounding a width of dielectric material surrounding upper contacts 110, 130, and any ties and traces of layer 240.

FIG. 3E also shows layer 240 having zone 102 with contacts 130 in rows 174-180. It shows zone 104 having signal traces 138 in rows 184-190. It shows zone 105 having contacts 110 in row 170 and contacts 120 in row 172. It shows zone 107 having contacts 110 and 120 in row 182. It shows layer 240 having portion 366 directly attached to and electrically coupled to contacts 120 of layer 240. In some cases, contacts 110 of layer 240 in zone 105 (but not zone 107) are tied together in layer 240 by power signal ties (e.g., conductor material, such as metal, ties directly attached to and extending between adjacent ones of contacts 110) as shown. In some cases, portion 366 is a ground plane that has inner edges formed with, extending from, directly attached to, and electrically coupled to (e.g., with zero resistance) the outer edges of contacts 120 of zone 102. In FIG. 3E, portion 366 may exist in all of zone 105.

FIG. 3E shows all of zone 102 having contacts 130. However, it can be appreciated that fewer than all, such as half (or one third or two thirds) of all of zone 102 may have contacts 130. Also, it can be appreciated that in some embodiments, zone 102 only extends across half of shown zone 102 (e.g., across only half of width WE1 of zone 102) and in this case only half of all of shown zone 102 has contacts 130 (not shown, but accomplished by replacing half of width WE1 of contacts 130 with ground plane portion 366 in zone 102).

Figure 3F:
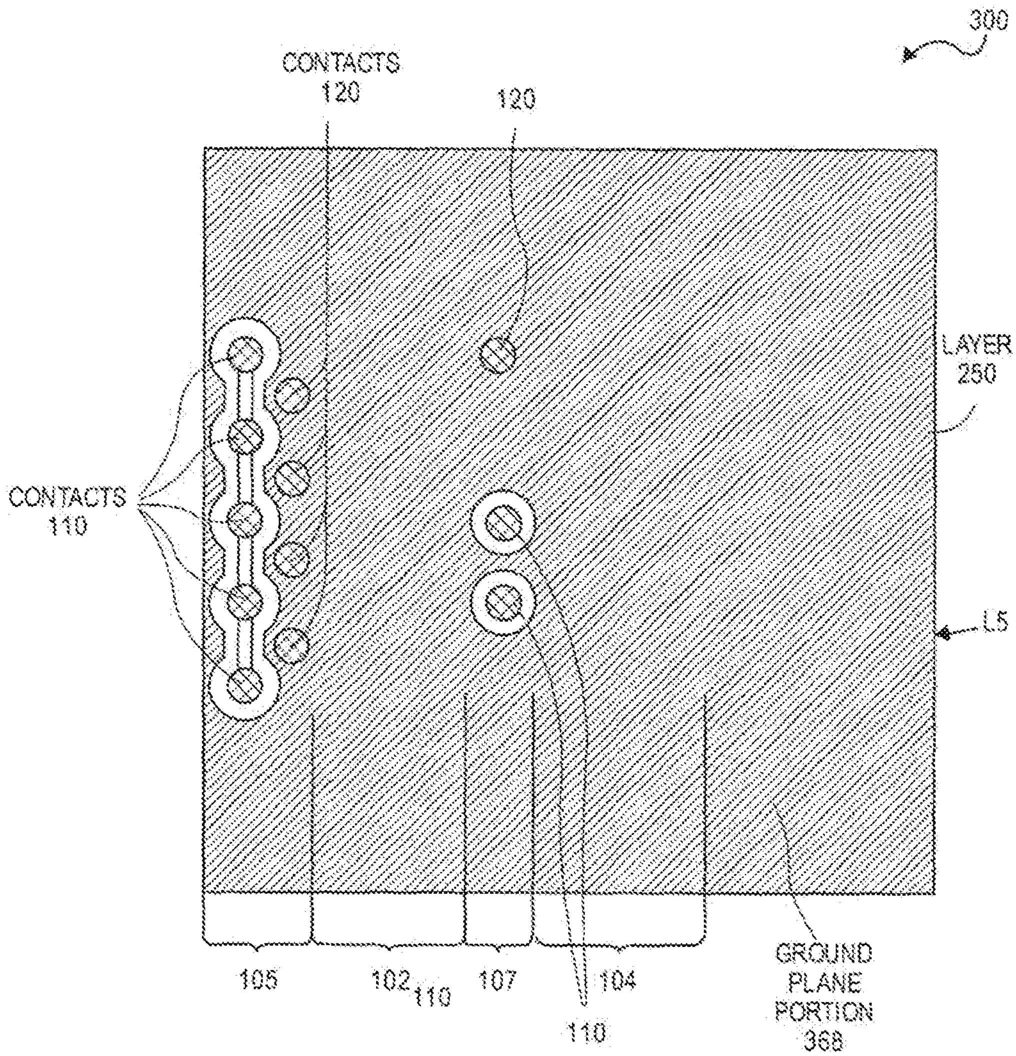

FIG. 3F is a schematic cross-sectional top view of a ground webbing structure package showing top layer or upper layer ground plane portion 368 of a fifth interconnect level of the package. FIG. 3F may be a top perspective view of layer 250 of device 300. In some cases, layer 240 of FIG. 3E is formed upon or onto layer 242 (e.g., see FIGS. 2A-B) which is formed upon or onto layer 250 of FIG. 3F. FIG. 3F shows layer 250 having power contacts 110, ground contacts 120 and ground plane portion 368. Plane portion 368 may be a layer of solid conductor material extending around and physically surrounding a width of dielectric material surrounding upper contacts 110 and any ties and traces of layer 250.

FIG. 3F also shows layer 250 having zone 102 with ground plane portion 368 in rows 174-180. It shows zone 104 having ground plane portion 368 in rows 184-190. It shows zone 105 having contacts 110 in row 170 and contacts 120 in row 172. It shows zone 107 having contacts 110 and 120 in row 182. It shows layer 250 having ground plane portion 368 directly attached to (e.g., formed with) and electrically coupled to contacts 120. In some cases, contacts 110 of layer 250 are tied together in layer 250 in zone 105 (and optionally zone 107, now shown but removing portion 368 from between those two contacts 110 such as shown in FIG. 3B) by power signal ties (e.g., conductor material, such as metal, ties directly attached to and extending between adjacent ones of contacts 110) as shown.

In some cases, portion 368 is a ground plane that has inner edges formed with, extending from, directly attached to, and electrically coupled to (e.g., with zero resistance) the outer edges of contacts 120. In some cases, portion 368 represents the ground traces 128 of level L5 as shown in FIGS. 1-2B.

Figure 3G:
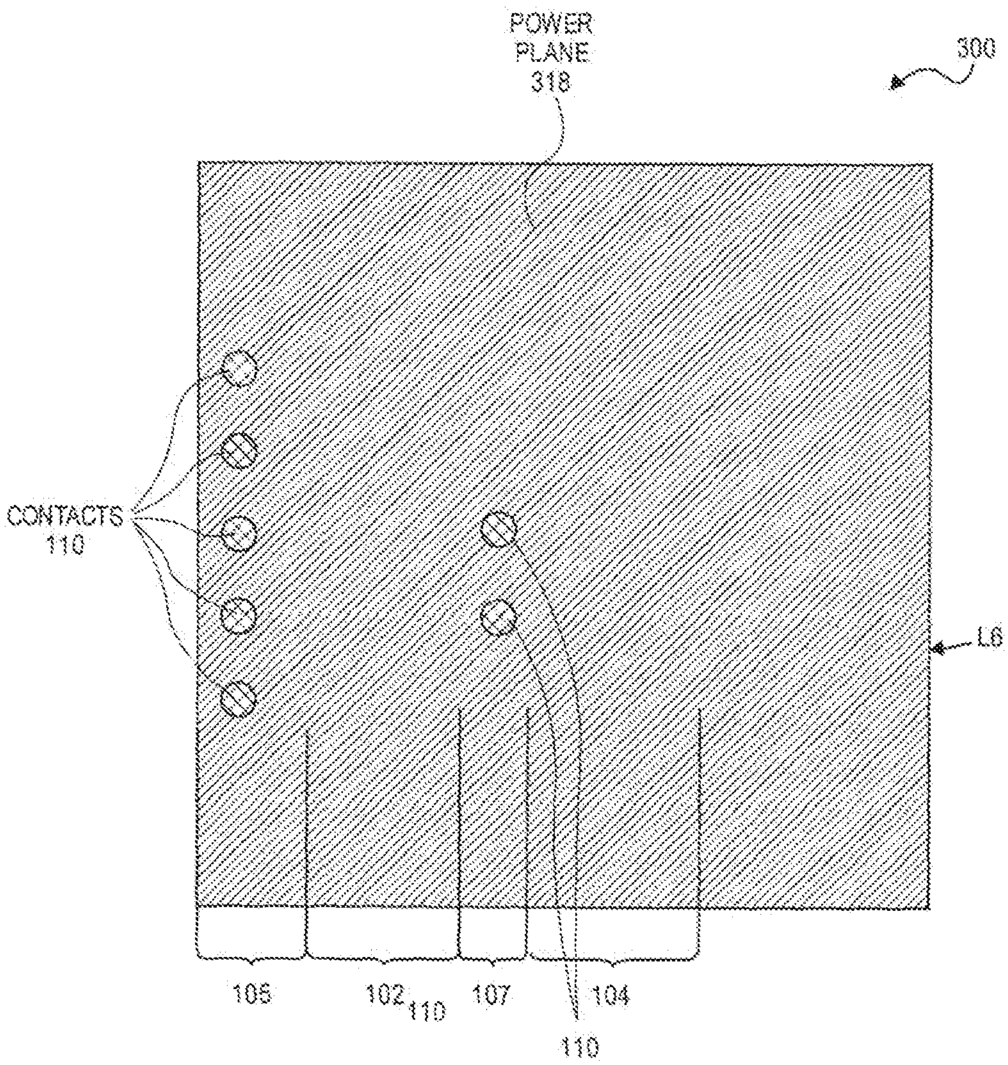

FIG. 3G is a schematic cross-sectional top view of a ground webbing structure package showing top layer or upper layer power plane layer of a sixth interconnect level of the package.

FIG. 3G may be a top perspective view of a layer having power plane 318 which may be directly attached to and electrically coupled to contacts 110 of that layer. In some cases, layer 250 of FIG. 3F is formed upon or onto layer 252 (e.g., see FIGS. 2A-B) which is formed upon or onto the layer of FIG. 3G. FIG. 3F shows a layer having power contacts 110 of the tied together in that layer by power plane 318 (e.g., conductor material (such as a metal) plane or layer directly attached to and extending between adjacent ones of contacts 110 as shown. Plane 318 may be a layer of solid conductor material extending around and physically attached to (e.g., formed with) upper contacts 130 and any ties and traces of that layer.

FIG. 3G also shows a layer having zone 102 with power plane 318 in rows 170-190. It shows power plane 318 directly attached to (e.g., formed with) and electrically coupled to contacts 110. In some cases, plane 318 is a power plane that has inner edges formed with, extending from, directly attached to, and electrically coupled to (e.g., with zero resistance) the outer edges of contacts 110. In some cases, power plane 318 represents power traces 118 of level L6 as shown in FIGS. 1-2B.

Webbing structures 160, 162 and 164 are each electronically coupled to (e.g., touching, formed with, or directly attached to) ground contacts 120 of rows 172 and 182 of levels L1, L2 and L3, respectively. They also each surround the data signal contacts (e.g., any existing contacts 130 and 140 by distance W4) of levels L1, L2 and L3, respectively. It may also surround the power contacts 110 of levels L1, L2 and L3, respectively. The power contacts may be disposed adjacent to the ground contacts 120 in a power and ground zone (e.g., 105 or 107) that is between the data transmit signal zone 104 and the data receive signal zone 102 of levels L1, L2 and L3. In some cases, webbing structures 160, 162 and 164 each extend from the ground contacts 120 of levels L1, L2 and L3, respectively (1) through a first side 183 of the power and ground zone (e.g., zone 105 or 107) and into the data transmit signal zone 104 and surrounds the data transmit signal contacts 140 of levels L1, L2 and L3, respectively; and (2) through an opposite side 181 (e.g., opposite from the first side) of the power and ground zone and into the data receive signal zone 102 and surrounds the data receive signal contacts 130 of levels L1, L2 and L3, respectively. In some cases, ground webbing structures 160, 162 and 164 each extend along the same planar surface as the upper contacts (e.g., contacts 110, 120, 130 and 140) of levels L1, L2 and L3, respectively.

In some cases, contacts 110, 112 and traces 118 are used to transmit or provide power signals to an IC chip or other device attached to contacts 110 of Level L1. In some cases they are used to provide an alternating current (AC) or a direct current (DC) power signal (e.g., Vdd). In some cases the signal has a voltage of between 0.5 and 2.0 volts. In some cases it is a different voltage level.

In some cases, contacts 120, 122 and traces 128 are used to transmit or provide grounding (e.g., isolation) signals to an IC chip or other device attached to contacts 120 of Level L1. In some cases they are used to provide a zero voltage direct current (DC) grounding signal (e.g., GND). In some cases the signal has a voltage of between 0.0 and 0.2 volts. In some cases it is a different but grounding voltage level.

In some cases, contacts 130, 132 and traces 138 are used to transmit or provide a receive data signal from an IC chip or other device attached to contacts 130 of Level L1. In some cases they are used to provide an alternating current (AC) or high frequency (HF) receive data signal (e.g., RX). In some cases the signal has a frequency of between 7 and 25 GT/s; and a voltage of between 0.5 and 2.0 volts. In some cases the signal has a frequency of between 6 and 15 GT. In some cases the signal has a voltage of between 0.4 and 5.0 volts. In some cases it is a different frequency and/or voltage level.

In some cases, contacts 140, 142 and traces 148 are used to transmit or provide a transmit data signal to an IC chip or other device attached to contacts 140 of Level L1. In some cases they are used to provide an alternating current (AC) or high frequency (HF) transmit data signal (e.g., TRX). In some cases the signal has a frequency of between 7 and 25 GT/s; and a voltage of between 0.5 and 2.0 volts. In some cases the signal has a frequency of between 6 and 15 GT. In some cases the signal has a voltage of between 0.4 and 5.0 volts. In some cases it is a different frequency and/or voltage level.

Webbing structures 160, 162 and 164 may each provide a ground isolation webbing structure across all of zones 102, 104, 105 and 107 of levels L1, L2 and L3, respectively, that reduces "die bump field" crosstalk between all adjacent ones of contacts 110, 120, 130 and/or 140 surrounded by webbings 160, 162 and 164 of levels L1, L2 and L3, respectively. They may also each provide a ground isolation webbing structure between each of zones 102, 104, 105 and 107 of levels L1, L2 and L3, respectively, that reduces "cluster to cluster" crosstalk between all adjacent ones of zones 102, 104, 105 and 107 surrounded by webbings 160, 162 and 164 of levels L1, L2 and L3, respectively.

They may also each provide a ground isolation webbing structure within each of zones 102, 104, 105 and 107 of levels L1, L2 and L3, respectively, that reduces "in-cluster" crosstalk between all adjacent ones of contacts 110, 120, 130 or 140 in each of one 102, 104, 105 or 107 surrounded by webbings 160, 162 and 164 of levels L1, L2 and L3, respectively.

For example, by being layers of conductive material electrically connected to the ground contacts 120, ground isolation webbings 160, 162 and 164 may provide electrically grounded layers having openings through which contacts 110, 130, and 140 exist or are disposed. In some cases, webbings 160, 162 and 164 absorb, or shield electromagnetic crosstalk signals produced by one contact, from reaching an adjacent contact of levels L1, L2 and L3, respectively, due to the amount of grounded conductive material, and location of the conductive grounded material adjacent to (e.g., surrounding at a distance of W4) the power contacts 110, receive contacts 130, and transmit contacts 140 of levels L1, L2 and L3, respectively.

In some cases, any of ground isolation webbings 160, 162 or 164 reduce electrical crosstalk caused by undesired capacitive, inductive, or conductive coupling of a first signal received or transmitted through one of contacts 110, 130, and 140 effecting or being mirrored in a second signal received or transmitted through another, different one of contacts 110, 130, and 140 on the same level of levels L1-L5. In some cases, they reduce such electrical crosstalk of a first signal received or transmitted through one of contacts 130, and 140 effecting or being mirrored in a second signal received or transmitted through another, different one of contacts 130, and 140 on the same level of levels L1-L5. In some cases, they reduce such electrical crosstalk of such a first signal effecting or being mirrored in such a second signal on a different level of levels L1-L5, such as effecting or being mirrored in a second signal of an adjacent level (e.g., level L1 and L3 are adjacent to level L2). In some cases, each (or all) of ground isolation webbings 160, 162 and 164 reduce such electrical crosstalk from such a first signal effecting or being mirrored in such a second signal. In some cases, any or each of ground isolation webbings 160, 162 and 164 also reduce such electrical crosstalk from such a first signal received or transmitted through one of contacts 112, 132, and 142 effecting or being mirrored in such a second signal received or transmitted through another, different one of contacts 112, 132, and 142 on the same or different level of levels L1-L5 as noted above for contacts 110, 130, and 140.

Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one contact of contacts 130, 132, 140 or 142 (or trace 138 or 148) in levels L1-L5 as noted above induces current in a second data signal in one contact of contacts 130, 132, 140 or 142 (or trace 138 or 148) in levels L1-L5. The first and second signals may be flowing in contacts or traces running parallel to each other, as in a transformer.

In some embodiments, any or each of ground isolation webbings 160, 162 or 164 reduce electrical crosstalk as noted above (1) without increasing the distance or spacing between the contacts (or traces) noted above, (2) without increasing the distance or spacing between the any of Levels L1-L5, (3) without re-ordering any of the contacts (or traces) noted above or Levels L1-L5. In some cases, this is due to using any or each of ground isolation webbings 160, 162 or 164 as shielding between any of the contacts (or traces) noted above or Levels L1-L5.

In some embodiments, level L4 will not have any ground webbing. In some embodiments, level L5 will include a solid ground plane or layer (e.g., such as replacing trace 128). In some embodiments, level L6, below level L5 will be a solid planar ground layer (e.g., electrically coupled to grounding interconnects of rows 172 and/or 182). In some embodiments, level L2 or L3 will only have ground webbing 162 and 164 in zone 102 or 104. In some embodiments, level L2 or L3 will have no ground webbing 162 and 164 (e.g., only webbing 160 exists). In some embodiments, only level L1 and L3 will have ground webbing 160 and 164. In some embodiments, they will only have it in zones 102 and 103.

In some cases, a solder resist layer is formed over level L1. Such a resist may be a height (e.g., thickness) of solid non-conductive solder resist material. Such material may be or include an epoxy, an ink, a resin material, a dry resist material, a fiber base material, a glass fiber base material, a cyanate resin and/or a prepolymer thereof; an epoxy resin, a phenoxy resin, an imidazole compound, an arylalkylene type epoxy resin or the like as known for such a solder resist. In some cases it is an epoxy or a resin.

The resist may be a blanket layer that is masked and etched to form openings where solder can be formed on and attached to the upper contacts (e.g., contacts 110, 120, 130 and 140), or where contacts of anther device (e.g., a chip) can be soldered to the upper contacts. Alternatively, the resist may be a layer that is formed on a mask, and the mask then removed to form the openings. In some cases, the resist may be a material (e.g., epoxy) liquid that is silkscreened through or sprayed onto a pattern (e.g., mask) formed on the package; and the mask then removed (e.g., dissolved or burned) to form the openings. In some cases, the resist may be a liquid photoimageable solder mask (LPSM) ink or a dry film photoimageable solder mask (DFSM) blanket layer sprayed onto the package; and then masked and exposed to a pattern and developed to form the openings. In some cases, the resist goes through a thermal cure of some type after the openings (e.g., pattern) are defined. In some cases the resist is laser scribed to form the openings. In some cases, the resist may be formed by a process known to form such a resist of a package.

In some embodiments, features of level L1-L5 (e.g., contacts, via contacts and ground webbing) may have a pitch (e.g., such as defined as PW, PL, PD; and/or as an average of the height of contacts or layers) that is determined by a standard package design rule (DR) or chip package as known. In some cases, that pitch is a line spacing (e.g., the actual value of the line widths and spaces between lines on the layers) or design rules (DR) of a feature (e.g., conductive contact, or trace) that is between 9 and 12 micrometers. In some cases, that pitch allows for "flip chip" bonding (e.g., using solder in solder resist openings over level L1) also known as controlled collapse chip connection (C4) bump scaling such as for interconnecting semiconductor devices, such as IC chips and microelectromechanical systems (MEMS), to external circuitry with solder bumps that have been deposited onto the chip pads. In some cases, that pitch is a bump pitch of (e.g., using solder in the openings) between 130 micrometers and 200 micrometers.

Upper contacts 110 and via contacts 112 (e.g., of layers 210-252) may be height H1 (e.g., a thickness) and H2 (e.g., a thickness) respectively; and trace 118 may be height H4 (e.g., a thickness) of solid conductive material. Also, the other upper contacts (e.g., contacts 120, 130 and 140) may be height H1; the other via contacts (e.g., contacts 122, 132 and 142) may be height H4; and the other traces (e.g., traces 128, 138 and 148) may be height H4 of solid conductive material.

In some cases, webbings 160, 162 and 164 (e.g., of layers 210, 220 and 230) are also height H5 (e.g., a thickness) of solid conductive material. The conductive material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper.

In some cases, the contacts, traces and webbing may be formed as a blanket layer of conductor material (e.g., a pure conductive material) that is masked and etched to form openings where dielectric material will be deposited, grown or formed (and leave portions of the conductor material where the contacts, traces and webbing are now formed). Alternatively, the conductor material may be a layer that is formed in openings existing through a patterned mask, and the mask then removed (e.g., dissolved or burned) to form the contacts, traces and webbing. Such forming of the contacts, traces and webbing may include or be depositing the conductor material such as by chemical vapor deposition (CVD) or by atomic layer deposition (ALD); or growing the conductor material such as an electrolytic layer of metal or conductor grown from a seed layer of electroless metal or conductor to form the contacts, traces and webbing.

In some cases, the contacts and traces may be formed by a process known to form such contacts and traces of a package or chip package device. In some cases, the webbings may be formed by a process known to form contacts and traces of a package or chip package device.

Layers of dielectric 103 (e.g., layers 103*a*-103*f*; and/or of layers 210-252) may each be a height H1 for an upper layer and height H2 for a lower layer of each level L1-L5 (e.g., H1 plus H2 per each level) of solid non-conductive material. The dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride.

In some cases, the dielectric may be a blanket layer of dielectric material (e.g., a non-conductive insulator material) that is masked and etched to form openings where the contacts, traces and webbing are deposited, grown or formed. Alternatively, the dielectric may be a layer that is formed on a patterned mask, and the mask then removed (e.g., dissolved or burned) to form openings where the contacts, traces and webbing are deposited, grown or formed. Such forming of the dielectric layer, or portions may include or be depositing the dielectric material such as by chemical vapor deposition (CVD) or by atomic layer deposition (ALD); or growing the dielectric material such as from or on a lower surface of a dielectric material (e.g., that may be the same type of material or a different type of dielectric material) to form the layer or portions. In some cases, the dielectric layer, portions of dielectric structure, or openings in dielectric layer may be formed by a process known to form such dielectric of a package or chip package device.

In some cases, the mask used may be a material formed on a surface (e.g., of a layer); and then having a pattern of the mask removed (e.g., dissolved, developed or burned) to form the openings where the conductor material (or dielectric) are to be formed. In some cases, the mask may be patterned using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form the openings. Depending on the mask type, the exposed or unexposed areas are removed. In some cases, the mask goes through a thermal cure of some type after the openings (e.g., pattern) are defined. In some cases, the mask may be formed by a process known to form such a mask of a chip package, or device formed using a chip package POR.

Figure 4:
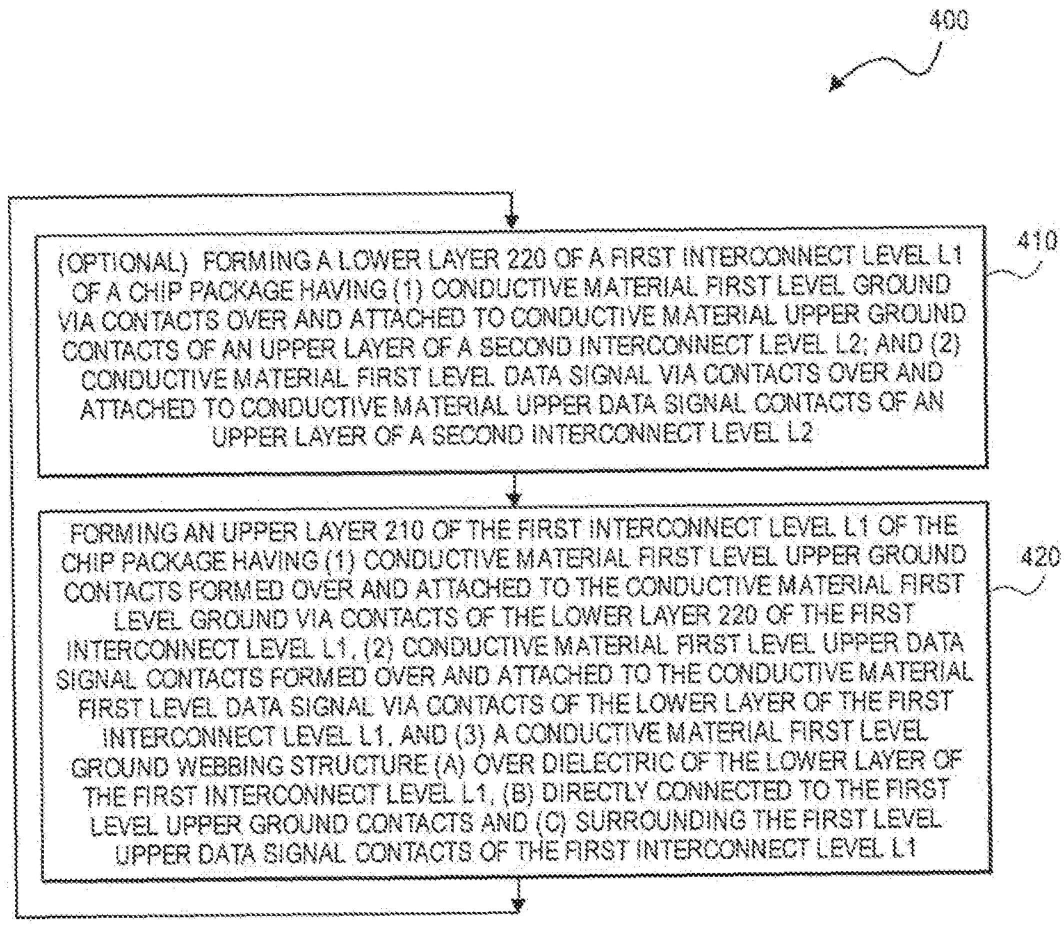
FIG. 4 is a flow chart illustrating a process for forming a ground webbing structure package, according to embodiments described herein.

FIG. 4 is a flow chart illustrating a process for forming a conductive material ground webbing structure package, according to embodiments described herein. FIG. 4 shows process 400 which may be a process for forming embodiments described herein of package 100 of any of FIGS. 1-3 and 5. In some cases, process 400 is a process for forming a ground webbing structure package that includes a first interconnect level with an upper (e.g., top or first) interconnect layer with upper level ground contacts, upper level data signal contacts, and a upper level ground webbing structure that is directly connected (e.g., attached to, formed as part of, or electrically coupled to) to the upper level ground contacts and surrounds the upper data signal contacts.

Process 400 begins at optional block 410 at which a lower layer of a first interconnect level of a chip package is formed, having first level ground via contacts over and attached to upper ground contacts of a second interconnect level, and first level data signal via contacts over and attached to upper data signal contacts of the second interconnect levels of the chip package.

Block 410 may include forming lower layer 212 of a first interconnect level L1 of a chip package 100 having (1) conductive material first level ground via contacts 122 attached to conductive material upper ground contacts 120 of an upper layer 220 of a second interconnect level L2; and (2) conductive material first level data signal via contacts 132 and 142 attached to conductive material upper data signal contacts 130 and 140 of an upper layer 220 of a second interconnect level L2.

Block 410 may include forming via contacts 112, 122, 132, 142 and/or traces of a lower layer 121, 222, 232, 242 or 252 of any interconnect level of levels L1-L5, respectively, as described herein. It may also include forming dielectric 103*b* of a lower layer 121, 222, 232, 242 or 252 of any interconnect level of levels L1-L5, respectively, as described herein.

In some cases, block 410 may include forming contacts and traces as described herein, such as to form via contacts 112, 122, 132, and/or 142. In some cases, block 410 may include forming dielectric as described herein, such as to form dielectric portions 103*b*.

In some cases, block 410 may include (e.g., prior to block 420) forming lower layer 212 of first interconnect level L1 having first level ground via contacts 122 and first level data signal via contacts 132 and 142 of level L1; where the first level ground via contacts 122 attach first level upper ground contacts 120 of level L1 to second level upper ground contacts 120 of level L2; the first level upper data signal via contacts 132 and 142 attach the first level upper data signal contacts 130 and 140 to second level upper data signal contacts 130 and 140 of second interconnection level L2 disposed below level L1; and level L2 has second level ground webbing structure 162 directly connected to the second level upper ground contacts 120 and surrounding the second level upper data signal contacts 130 and 140 of level L2.

After block 410, block 420 is performed. Block 420 may include or be forming an upper layer of the first interconnect level of the chip package having (1) conductive material first level upper ground contacts formed over and attached to the conductive material first level ground via contacts of the lower layer of the first interconnect level, (2) conductive material first level upper data signal contacts formed over and attached to the conductive material first level data signal via contacts of the lower layer of the first interconnect level, and (3) a conductive material first level ground webbing structure (a) over dielectric of the lower layer of the first interconnect level, (b) directly connected to the first level upper ground contacts and (c) surrounding the first level upper data signal contacts of the first interconnect level.

In some cases, the ground webbing may be formed directly onto, as part of, or touching the outer edges of the upper ground contacts of the first interconnect level L1. In some cases the ground webbing is physically attached to and electrically coupled by conductor material to the upper ground contacts.

Block 420 may include forming upper layer 210 of the first interconnect level L1 of the chip package 100, layer 210 having (1) conductive material first level upper ground contacts 120 formed over and attached to the conductive material first level ground via contacts 122 of the lower layer 220 of the first interconnect level L1, (2) conductive material first level upper data signal contacts 130 and 140 formed over and attached to the conductive material first level data signal via contacts 132 and 142 of the lower layer 220 of the first interconnect level L1, and (3) a conductive material first level ground webbing structure 160: (a) over dielectric 103*b* of the lower layer 220 of the first interconnect level L1, (b) directly connected to the first level upper ground contacts 120 and (c) surrounding the first level upper data signal contacts 130 and 140 of the first interconnect level L1.

Block 420 may include forming upper contacts 110, 120, 130, 140 and/or traces of an upper layer 120, 220, 230, 240 or 250 of any interconnect level of levels L1-L5, respectively, as described herein. It may also include forming dielectric 103*a* of an upper layer 120, 220, 230, 240 or 250 of any interconnect level of levels L1-L5, respectively, as described herein.

In some cases, block 420 may include forming contacts and traces as described herein, such as to form upper contacts 110, 120, 130, and/or 140. In some cases, block 420 may include forming dielectric as described herein, such as to form dielectric portions 103*a*.

In some cases, block 420 may include forming a conductive material ground webbing structure package 100 by forming upper layer 210 of a first interconnect level L1 having conductive material first level upper ground contacts 120, conductive material first level upper data signal contacts 130 and 140, and conductive material first level ground webbing structure webbing 160, where the first level ground webbing structure 160 is directly connected to the first level ground contacts 120 and surrounds the first level data signal contacts 130 and 140.

A first example embodiments of block 420 may include (e.g., prior to forming the upper layer 210 of the first interconnect level), forming a mask (e.g., DFR, not shown) over a top surface of a lower layer 212 of the first interconnect level L1, the mask having (1) first openings over ground via contacts 122 of the lower layer 212 and in which to form the first level upper ground contacts 120 of Level L1, (2) second openings over data signal via contacts 132 and 142 of the lower layer 212 and in which to form the first level upper data signal contacts 130 and 140 of Level L1, and (3) third openings over dielectric 103*b* of the lower layer 212 and in which to form the first level ground webbing structure 160. In this case, the first openings may be horizontally open to and in communication with the third openings. Some of these cases may include electroless plating of a seed layer of the conductor material, prior to forming the masks layer.

In this case, block 420 may then include simultaneously forming conductive material (e.g., plating on the exposed seed layer of the openings) to form the first level upper ground contacts 120 in the first openings, the first level upper data signal contacts 130 and 140 in the second openings, and the first level ground webbing structure 160 in the third openings of Level L1.

In some of these cases, simultaneously forming the conductive material may include forming that conductive material of the contacts 120, 130 and 140; and webbing 160 during the same process, deposition or growth of that conductive material in the first, second and third openings. In some cases, simultaneously forming the conductive material includes electrolytic plating of conductor material in the first, second and third openings (e.g., on the electroless plating of seed layer).

In some cases of these, after simultaneously forming the conductive material, the mask is removed from between the first level upper ground contacts 120, the first level upper data signal contacts 130 and 140, and the first level ground webbing structure 160. This removal may also include removing the seed layer from between the openings. Then dielectric material 103*a* (e.g., $SiO_2$ or $SiN_3$) is deposited where the mask was removed from between the first level upper ground contacts, the first level upper data signal contacts, and the first level ground webbing structure. In some cases, forming the mask includes forming a blanket layer of mask material and etching the blanket layer to form the first, second and third openings.

A second example of embodiments of block 420 may include (e.g., prior to forming the upper layer 210 of the first interconnect level), forming a blanket layer of dielectric material (e.g., blanket of dielectric 103*a* prior to etching) over a top surface of a lower layer 212 of the first interconnect level L1. Then forming a mask over a top surface of the blanket layer of dielectric material, the mask having (1) first openings over ground via contacts 122 of the lower layer 212 and in which to form the first level upper ground contacts 120 of Level L1, (2) second openings over data signal via contacts 132 and 142 of the lower layer 212 and in which to form the first level upper data signal contacts 130 and 140 of Level L1, and (3) third openings over dielectric 103*b* of the lower layer 212 and in which to form the first level ground webbing structure 160. In this case, the first openings may be horizontally open to and in communication with the third openings. Block 420 may then include etching away portions of the blanket layer of dielectric material in the first, second and third openings (e.g., and to the top surface of the lower layer 212). Block 420 may then include simultaneously forming (e.g., plating) conductive material to form the first level upper ground contacts 120 in the first openings, the first level upper data signal contacts 130 and 140 in the second openings, and the first level ground webbing structure 160 in the third openings of Level L1.

In some of these cases, simultaneously forming the conductive material may include forming that conductive material of the contacts 120, 130 and 140; and webbing 160 during the same process, deposition or growth of that conductive material in the first, second and third openings. In some cases, simultaneously forming the conductive material includes electroless plating of a seed layer, and then electrolytic plating of conductor material in the first, second and third openings.

In some of these cases, after simultaneously forming the conductive material in the second example embodiments of block 420, the mask is removed from above the dielectric layer 103*a* between the first level upper ground contacts 120, the first level upper data signal contacts 130 and 140, and the first level ground webbing structure 160. This leaves dielectric material 103*a* (e.g., $SiO_2$ or $SiN_3$) between the first level upper ground contacts 120, the first level upper data signal contacts 130 and 140, and the first level ground webbing structure 160.

In some cases, deposition or growing of conductor material in blocks 410 and 420 may be by chemical vapor deposition (CVD) or by atomic layer deposition (ALD). In some cases, deposition or growing of dielectric material in block 410 and 420 may be by chemical vapor deposition (CVD) or by atomic layer deposition (ALD). It can be appreciated that the descriptions herein for blocks 410 and 420 may also include polishing (e.g., chemical mechanical polishing) or planarizing surfaces as needed to perform the descriptions herein of blocks 410 and 420.

It can be appreciated that the descriptions herein for blocks 410 and 420 may be repeated to form additional levels similar to level L1. Such descriptions may include forming additional levels similar to level L1, below level L1 (e.g., to form level L2, etc.); or above level L1 (e.g., to form a new top level L1 such that level L2 is now level L2).

In some cases, only block 420 of process 400 is performed (e.g., to form layer 210). In other cases, only blocks 410-420 of process 400 are performed (e.g., to form layers 210-212). In some cases, block 420 of process 400 may be performed, then block 410, then block 420 repeated for another level (e.g., to form layers 210-232). In some cases, blocks 410 and 420 of process 400 are repeated once (e.g., to form layers 210-222), twice (e.g., to form layers 210-232), thrice (e.g., to form layers 210-242), or four times (e.g., to form layers 210-252).

In some cases, any or all of height H1-H5 may be between 3 and 5 percent less than or greater than that described herein. In some cases, they may be between 5 and 10 percent less than or greater than that described herein.

In some cases, any or all of widths W1-W6 may represent a circular diameter, or the maximum width (maximum distance from one edge to another farthest edge from above) of an oval, a rectangle, a square, a triangle, a rhombus, a trapezoid, or a polygon.

Figure 5:
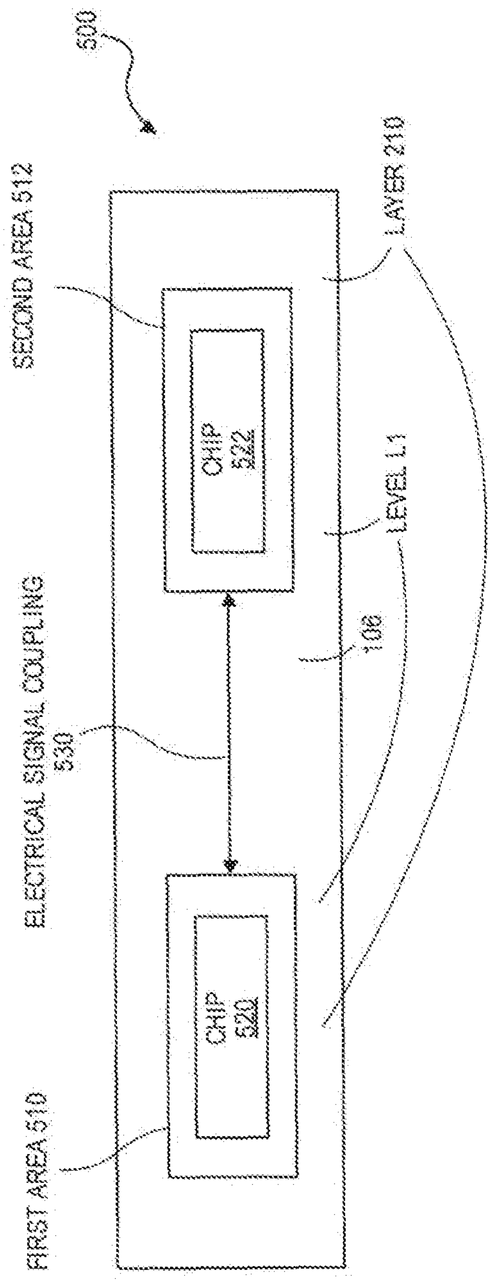
FIG. 5 is a schematic top perspective view of a conductive material ground isolation webbing structure semiconductor device package upon which two integrated circuit (IC) chip or "die" are attached.

In some cases, embodiments of (e.g., packages, systems and processes for forming) a conductive material ground webbing structure package, such as described for FIGS. 1-4, provide quicker and more accurate data signal transfer between the two IC's attached to a package by including a top interconnect layer with a ground webbing structure (e.g., "webbing") of conductor material that reduces bump field crosstalk, signal type cluster-to-cluster crosstalk and in-cluster signal type crosstalk (e.g., see FIG. 5). The ground webbing structure (e.g., of the top interconnect level, and optionally of other levels) may be formed connected to upper grounding contacts to reduce bump field crosstalk, signal type cluster-to-cluster crosstalk and in-cluster signal type crosstalk by surrounding each of the upper transmit and receive data signal contacts.

In some cases, embodiments of processes for forming a conductive material ground webbing structure package, or embodiments of a conductive material ground webbing structure package provide a package having better components for providing stable and clean power (e.g., from contacts 110), ground (e.g., from contacts 120), and high frequency transmit (e.g., from contacts 130) and receive (e.g., from contacts 140) data signals between its top surface 106 (or layer 210) and (1) other components attached to the package, such as at other contacts on the top surface of the package where similar ground webbing structure(s) exist, or (2) other components of lower levels of the package that will be electrically connected to the contacts through via contacts or traces of the package. The components may be better due to the addition of the conductive material ground webbing structure which reduces crosstalk between the data transfer contacts.

In some cases, embodiments of processes for forming a conductive material ground webbing structure package, or embodiments of a conductive material ground webbing structure package provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIG. 5). In some cases, embodiments of such processes and devices provide the demanded lower cost high frequency data transfer interconnects solution that is needed across the above segments. These benefits may be due to the addition of the conductive material ground webbing structure which reduces crosstalk between the data transfer contacts.

In some cases, embodiments of processes for forming a conductive material ground webbing structure package or embodiments of a conductive material ground webbing structure package provide ultra-high frequency data transfer interconnect in a standard package, such as a flip-chip x grid array (FCxGA), where 'x' can be ball, pin, or land, or a flip-chip chip scale package (FCCSP, etc.) due to the addition of the conductive material ground webbing structure which reduce crosstalk between the data transfer contacts.

In addition to this, such processes and devices can provide for direct and local power, ground and data signal delivery to both chips. In some cases, embodiments of such processes and devices provide communication between two IC chips or board ICs including memory, modem, graphics, and other functionality, directly attached to each other (e.g., see FIG. 5). These processes and devices provide increased input/output (IO) frequency data transfer at lower cost. These provisions and increases may be due to the addition of the conductive material ground webbing structure which reduces crosstalk between the data transfer contacts.

FIG. 5 is a schematic top perspective view of a conductive material ground isolation webbing structure semiconductor device package upon which two integrated circuit (IC) chip or "die" are attached. FIG. 5 shows isolation webbing structure package 500 having first area 510 upon which IC chip 520 is mounted; second area 512 upon which second IC chip 522 is mounted; and electrical signal coupling 530 electrically coupling signals of area 510 to signals of area 512. Area 510 may include descriptions herein for package 100, such as by including zones 102, 104, 105 and 107 (and interconnect levels and stacks thereof). Area 512 may also include descriptions herein for package 100, such as by including zones 102, 104, 105 and 107 (and interconnect levels and stacks thereof). In some cases, package 500 represents package 100 of any of FIGS. 1-4, having two areas with the structures shown in those figures.

Coupling 530 may include contacts, interconnects, traces, circuitry, and other features known for transmitting signals between area 510 and 512. For example, coupling 530 may include electronics data signal traces for communicating signals from receive contacts 130 of zone 510 to transmit contact 540 of zone 512. Coupling 530 may also include electronics data signal traces for communicating signals from receive contacts 130 of zone 512 to transmit contact 540 of zone 510. Coupling 530 may also include ground traces or planes for providing ground signals to contacts 120 of areas 510 and 512. Coupling 530 may also include power traces or planes for providing power signals to contacts 110 of areas 510 and 512. Area 510 may include ground webbing 160, and optionally 162, and optionally 164, as described herein. Area 512 may include ground webbing 160, and optionally 162, and optionally 164, as described herein.

FIG. 5 may describe a cases where one IC chip 520 is mounted in area 510 on top surface 106 (having level L1) of microelectronic substrate package 500, while package 500 is also physically and electronically connected to another IC chip 522 in area 512 on top surface 106 (having level L1), so that package 500 can provide data signal transfer between the two IC chips. Package 500 (e.g., coupling 530) may route hundreds or even thousands of high frequency data signals between chips 520 and 522 (e.g., between data signal contacts of those chips). Package 500 may be similar to package 100, and may have two areas 510 and 512, each with ground webbing (e.g., such as webbing 160) upon which or under which chips 520 and 522 are mounted, respectively. Package 500 (e.g., each of areas 510 and 512) may be formed of materials, have levels L1-L5, have ground webbings, have similar electrical characteristics, and have similar functional capabilities, and may be formed using a process (e.g., see FIG. 4) as described for forming package 100.

In some cases, embodiments of (e.g., packages, systems and processes for forming) a conductive material ground webbing structure package 500, provides quicker and more accurate data signal transfer between the two IC chips 520 and 522 attached to the package by including a top interconnect layer 210 with a ground webbing structure 160 (e.g., see FIGS. 1-3) of conductor material in each of areas 510 and 512 that reduces bump field crosstalk, signal type cluster-to-cluster crosstalk and in-cluster signal type crosstalk in each of areas 510 and 512. Ground webbing structures 160 (e.g., of the top interconnect level L1, and optionally webbings 162 and 164 of levels L2-L3) may be formed connected to upper grounding contacts 120 in each of areas 510 and 512, to reduce bump field crosstalk, signal type cluster-to-cluster crosstalk and in-cluster signal type crosstalk by surrounding each of the upper transmit and receive data signal contacts in each of areas 510 and 512 (e.g., see FIGS. 1-3). In some cases, webbing structures 160 at areas 510 and 512 reduce bump field crosstalk, signal type cluster-to-cluster crosstalk and in-cluster signal type crosstalk as described for package 100.

In some cases, chip 520 and 522 may each be an IC chip type as described for attaching to package 100, such as a microprocessor, coprocessor, graphics processor, memory chip, modem chip, a next-level component, or other microelectronic chip device. In some cases, they are different IC chip types. In some cases, they are the same IC chip type. In some cases, they are both a microprocessor, coprocessor, or graphics processor. In some cases, one is a memory chip and the other is a microprocessor, coprocessor, or graphics processor.

Electrical coupling 530 may include circuitry between area 510 first interconnect level L1 and area 512 first interconnect level L1 to communicate data signals between the chip 520 and chip 522. In some cases, electrical coupling 530, area 510 ground webbing structure (e.g., webbing 160 and optionally webbing 162 and optionally webbing 164 at area 510) and area 512 ground webbing structure (e.g., webbing 160 and optionally webbing 162 and optionally webbing 164 at area 510) are electrially connected to comminicate data signals between the chip 520 and chip 522 at a frequency of between 7 and 25 GT/s. In some cases, they are connected to communicate from very low frequency transfer such as from 50 mega hertz (MHz) to a GHz transfer level, such as greater than 40 GHz (or up to between 40 and 50 GHz).

Some embodiments of package 500 exclude chips 520 and 522. Here, package 500 includes a first set of zones 102, 104, (105 and 107) of area 510, are connected or electrically coupled (e.g., through coupling 530) to a second set of corresponding zones 102, 104, (105 and 107) of area 512 through traces 138, 148, (118 and 128) respectively (e.g., see FIGS. 2A-B). The first set of zones 102 and 104 of area 510 may be connected or electrically coupled to a second set of corresponding zones 104 and 102 of area 512 respectively so that the transmit signal zone 102 of the first set as shown is connected to the receive signal zone 104 of the second set, and vice versa. In this case, the first set of zones of area 510 may be configured to be connectable to a chip (e.g., chip 520 at level L1) and the second set of zones of area 512 may be configured to be connectable to a chip (e.g., chip 522 at level L1) so that the first and second IC chips or devices can exchange data (e.g., using transmit data signals and receive data signals as noted above) using zones 102 and 104 of package 500. This provides a benefit of reduced cross talk as noted herein during such data exchange due to or based on use ground webbings 160, 162 and 164. In this case, package 500 may operate to link the first and second IC chips.

In some certain embodiments, descriptions herein for "each" or "each of" of a feature, such as in "each of rows 170-190", "each of the contacts", "each zone", "each of zones 102 and 104", "each of zones 105 and 107", "each of levels L1-L5"; the like for rows 170-190; the like for the contacts (e.g., contacts 120, 130 or 140); the like for zones 102, 104, 105 or 107; or the like for levels L1, L2, L3, L4 and L5 may be for most of those features or for less than all of those feature in that row, zone or level. In some cases they may refer to between 80 and 90 percent of those features existing in that row, zone or level.

Figure 6:
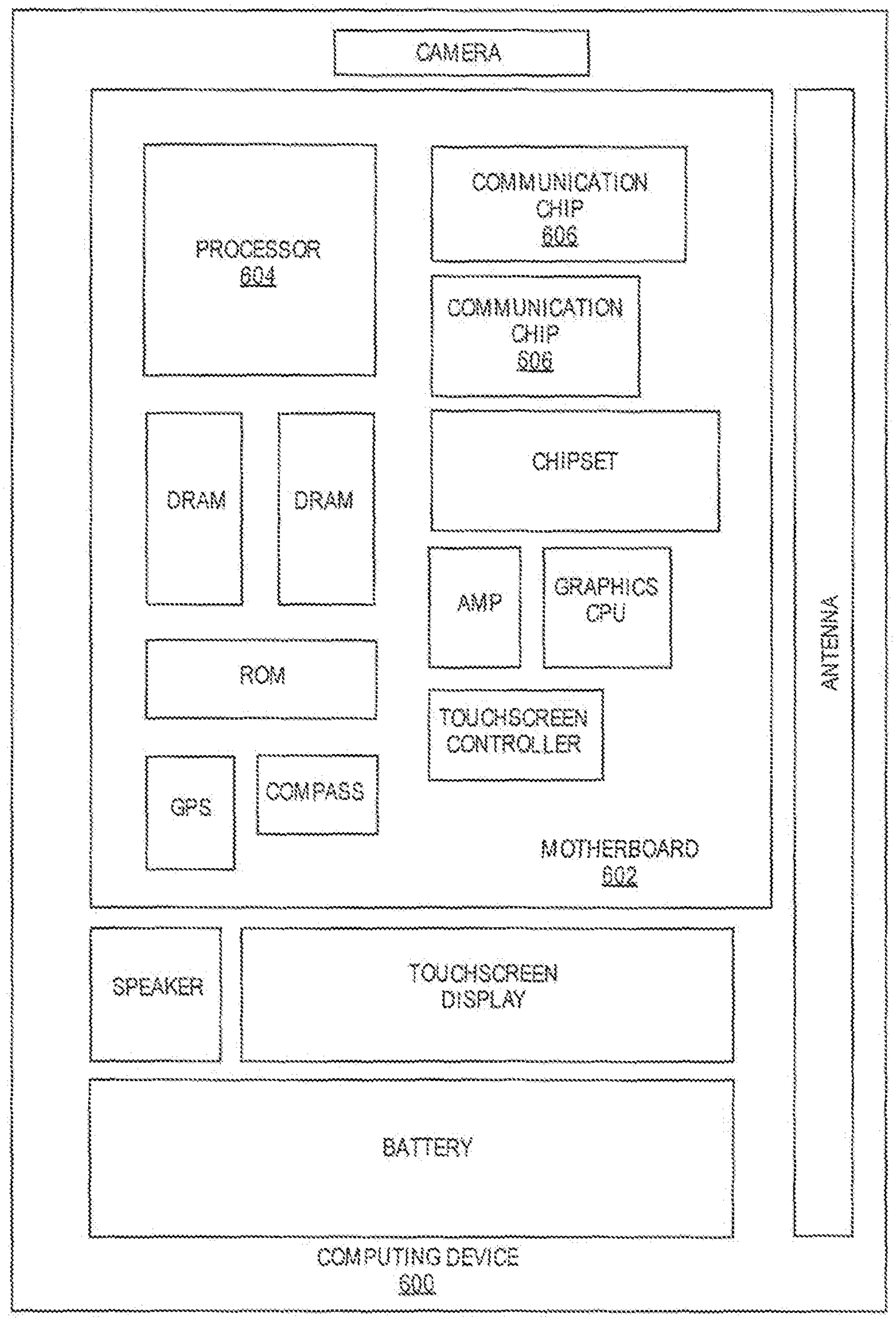
FIG. 6 illustrates a computing device in accordance with one implementation.

FIG. 6 illustrates a computing device in accordance with one implementation. FIG. 6 illustrates computing device 600 in accordance with one implementation. Computing device 600 houses board 602. Board 602 may include a number of components, including but not limited to processor 604 and at least one communication chip 606. Processor 604 is physically and electrically coupled to board 602. In some implementations at least one communication chip 606 is also physically and electrically coupled to board 602. In further implementations, communication chip 606 is part of processor 604.

Depending on its applications, computing device 600 may include other components that may or may not be physically and electrically coupled to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, first communication chip 606 may be dedicated to shorter range wireless communications such as Wi-Fi and Bluetooth and second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the integrated circuit die of the processor includes one or more devices, such as transistors or metal interconnects. In some embodiments, the package of the integrated circuit die or processor 604 includes embodiments of processes for forming a "ground webbing structure package" or embodiments of a "ground webbing structure package" as described herein. The term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, the integrated circuit die of the communication chip includes one or more devices, such as transistors or metal interconnects. In some embodiments, the package of the integrated circuit die or chip 606 includes embodiments of processes for forming a "ground webbing structure package" or embodiments of a "ground webbing structure package" as described herein.

In further implementations, another component housed within computing device 600 may contain an integrated circuit die that includes one or more devices, such as transistors or metal interconnects. In some embodiments, the package of the other integrated circuit die or chip includes embodiments of processes for forming a "ground webbing structure package" or embodiments of a "ground webbing structure package" as described herein.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although the descriptions above show only webbing structures 160, 162 and 164, at levels L1, L2 and L3, those descriptions can apply to fewer, more or different webbing structures. Embodiments of fewer such structures may be where only one or two of structures 160, 162 and 164 exist. Embodiments of more of such structures may be where additional webbing structures (in addition to structures 160, 162 and 164) similar to one of structures 160, 162 and 164 exist at a different level such as level L5 and/or level L4. Embodiments of different of such structures may be such as where structure 164 exists on Level L4 instead of level L3; or where structure 164 exists on Level L5 instead of level L3.

Also, although the descriptions above show only zones 102, 104, 105 and 107 of package 100 (e.g., having webbing structures 160, 162 and 164, at levels L1, L2 and L3), those descriptions can apply to more or different number of zones 102, 104, 105 and 107. Embodiments of different of such zones 102, 104, 105 and 107 may be such as where any one or two of zones 102, 104, or 105 does not exist.

Embodiments of more of such zones may be where a first set of zones 102, 104, (105 and 107) as shown, are connected or electrically coupled to a second set of corresponding zones 102, 104, (105 and 107), such as through traces 138, 148, (118 and 128) respectively (e.g., see FIG. 5). In this case, the first set of zones 102 and 104 may be connected or electrically coupled to a second set of corresponding zones 104 and 102 respectively so that the transmit signal zone 102 of the first set as shown is connected to the receive signal zone 104 of the second set, and vice versa. In this case, the first set of zones may be connected to a first IC chip or device (e.g., at level L1) and the second set of zones may be connected to a second, different IC chip or device (e.g., at level L1) so that the first and second IC chips or devices can exchange data (e.g., using transmit data signals and receive data signals as noted above) using zones 102 and 104 of package 100. This provides a benefit of reduced cross talk as noted herein during such data exchange due to or based on use ground webbings 160, 162 and 164. In this case, package 100 may operate to link the first and second IC chips.

FIGS. 7-19 may apply to embodiments of a ground plane vertical isolation of, ground line coaxial isolation of, and impedance tuning of horizontal data signal transmission lines routed through package devices. Such embodiments of the invention are related in general, to semiconductor device packaging and, in particular, to substrate packages, interposers, and printed circuit board (PCB) substrates upon which integrated circuit (IC) chips or other package devices may be attached, and methods for their manufacture. Such a substrate package device may have high speed horizontal data signal transmission lines extending through the package device for transmitting data between IC chips or other devices attached to the package device.

Integrated circuit (IC) chips (e.g., "chips", "dies", "ICs" or "IC chips"), such as microprocessors, coprocessors, graphics processors and other microelectronic devices often use semiconductor package devices ("packages") to physically and/or electronically attach the IC chip to a circuit board, such as a motherboard (or motherboard interface). The IC chip (e.g., "die") is typically mounted within a microelectronic substrate package that, among other functions, enables electrical connections between the die and a socket, a motherboard, or another next-level component. Some examples of such package devices are substrate packages, interposers, and printed circuit board (PCB) substrates upon which integrated circuit (IC) chips or other package devices may be attached.

There is a need in the field for an inexpensive and high throughput process for manufacturing such package devices. In addition, the process could result in a high package device yield and a package device of high mechanical stability. Also needed in the field, is a package device having better components for providing stable and clean power, ground, and high frequency transmit and receive data signals between its top surface and other components of or attached to the package device, such as from between different horizontal locations of horizontal data signal transmission lines in a level of the package device.

As integrated circuit (IC) chip or die sizes shrink and interconnect densities increase, physical and electrical connections require better components for providing stable and clean power high frequency transmit and receive data signals between different horizontal locations of, or a length of, horizontal data signal transmission lines in a level of package devices upon which the IC chip is mounted or is communicating the data signals. Some examples of such package devices are substrate packages, interposers, and printed circuit board (PCB) substrates upon which integrated circuit (IC) chips or other package devices may be attached. Such data signals may be received from or transmitted to contacts on the top or bottom surfaces of the package device that will be electrically connected through via contacts to the horizontal data signal transmission lines of the package device.

In some cases, an IC chip may be mounted within the package device, such as for "flip chip" bonding or packaging. In some cases, the IC chip may be mounted on the package device, which is also physically and electronically connected to another IC chip, so that the package device can provide data signal transfer between two IC chips. Here, in many cases, the package device must route hundreds or even thousands of high frequency data signals between two die. Some such package devices may be or use a silicon interposer, a silicon bridge, or an organic interposer technology.

According to some embodiments, it is possible for such a package device to provide higher frequency and more accurate data signal transfer between different horizontal locations of (or a length of) horizontal data signal transmission lines in one or more vertical levels of package devices upon which the IC chip is mounted or is communicating the data signals by having (or being manufactured by a process that forms): (1) ground isolation planes between, (2) ground isolation lines "coaxially" surrounding, or (3) such ground planes between and such ground isolation lines surrounding horizontal data signal transmission lines (e.g., conductor material or metal signal traces) that are horizontally routed through the package device. The (1) ground isolation planes between, and/or (2) ground isolation lines surrounding the horizontal data signal transmission lines may electrically shield the data signals transmitted in signal lines, thus reducing signal crosstalk between and increasing electrical isolation of the data signal transmission lines. In addition, the electrically shielded horizontal data signal transmission lines may be tuned using eye diagrams to select signal line widths and ground isolation line widths that provide optimal data transmission performance.

In some cases, the horizontal ground isolation planes are between different vertical levels of different types (e.g., "TX" or "RX") of data transmit (e.g., "TX") signal and data receive (e.g., "RX") signal transmission lines. In this case, the ground isolation planes may reduce crosstalk (and optionally may increase electrical isolation) between different adjacent vertical levels of the different types of TX and RX transmission lines, such as by reducing cross talk caused by a RX signal line on a vertically adjacent TX signal line (e.g., above or below the RX signal line); or vice versa. In some cases, there may be two or three adjacent vertical levels of the same type of TX and RX transmission lines between two horizontal isolation planes that are at different vertical heights in the package.

In some cases, the ground isolation lines surround (e.g., to the left, right, above and below; such as to form a "coaxial" type shielding) horizontal data RX or TX signal transmission lines in different vertical levels of data transmit signal (e.g., "TX") and data signal receive (e.g., "RX") transmission lines. Such "coaxial" type shielding or "surrounding" may be where a ground isolation lines are located horizontally adjacent (e.g., to the left and right) and vertically adjacent (e.g., above and below) the (or each) data signal transmission line. In some cases, the isolation lines surrounding the transmission lines may increase horizontal and vertical electrical isolation (and optionally may reduce crosstalk) of each of the surrounded (e.g., horizontally and vertically adjacent ones of) TX and RX transmission lines. This may include increasing isolation of a RX (or TX) signal line with respect to a horizontally or vertically adjacent RX (or TX) signal line. In some cases, the isolation lines surrounding the transmission lines may reduce vertical crosstalk (and optionally may increase isolation) of each of the surrounded (e.g., vertically adjacent ones of) TX and RX transmission lines, such as by reducing crosstalk between a RX signal line and a vertically adjacent TX signal line of a different level. In some cases, the isolation lines surrounding the transmission lines are used at dense interconnect regions, such as to form a "coaxial" routing design around each of the transmission lines to reduce crosstalk (and optionally may increase electrical isolation) between different vertically and horizontally adjacent data signal transmission lines. In these cases, there may be two or three vertically adjacent levels of one type of the TX and RX transmission lines, each transmission line being surrounded.

In some cases, such a package device is described as a package device having conductor material ground isolation planes between, and/or ground isolation lines ("coaxially") surrounding, horizontal data signal transmission lines horizontally routed through the package device (or through an interposer). Some embodiments of such a package device may be described as (e.g., devices, systems and processes for forming) a conductor material ground isolation "coaxial" surrounded and/or ground isolated plane isolated horizontal data signal transmission lines; a "ground isolated transmission line package device"; or a ground isolated horizontal data signal transmission line microprocessor package device.

Such a ground isolated transmission line package device having (1) ground isolation planes between and/or (2) ground isolation lines surrounding the horizontal data signal transmission lines may electrically shield the data signals transmitted in horizontally and/or vertically adjacent signal lines, thus reducing signal crosstalk between and increasing electrical isolation of the adjacent horizontal data signal transmission lines. In addition, such a package may have the electrically shielded horizontal data signal transmission lines tuned using test signals and eye diagrams to select signal line widths and ground isolation line widths that provide optimal data transmission performance of the signal lines (e.g., channel). In some cases, use of such a package increases the stability and cleanliness of high frequency transmit and receive data signals transmitted between different horizontal locations of horizontal data signal transmission lines in a level of the package device. In some cases, it may increase the usable frequency of transmit and receive data signals transmitted between the different horizontal locations of horizontal data signal transmission lines in a level of the package device, as compared to a package device not having ground isolated transmission line (e.g., as compared to a package device where the transmission lines do not have ground isolation planes between, or ground isolation lines ("coaxially") surrounding, horizontal data signal transmission lines). In some cases, such an increased speed (e.g., frequency) may include data signals between 7 and 25 gigatransfers per second (GT/s). In some cases, GT/s may refer to a number of operations (e.g., transmission of digital data such as the data signal herein) transferring data that occur in each second in some given data transfer channel such as a channel provided by signal lines 738 or 748; or may refer to a sample rate, i.e. the number of data samples captured per second, each sample normally occurring at the clock edge. 1 GT/s is $10^9$ or one billion transfers per second.

In some cases, the ground isolated transmission line package device reduces (e.g., improves or mitigates) crosstalk (e.g., as compared to the same package but without any ground isolated transmission lines, such as without (1) ground isolation planes between and/or (2) ground isolation lines surrounding the horizontal data signal transmission lines may reduce crosstalk between and increase isolation of horizontally and vertically adjacent ones of the horizontal data signal transmission lines on levels of the device (e.g., see levels Lj-Ll of FIGS. 7-10, or levels Lm-Lq of FIGS. 11-14, or levels Lm-Ly of FIGS. 15-19) from very low frequency transfer such as from 50 megatransfers per second (MT/s) to a greater than 40 GT/s (or up to between 40 and 50 GT/s). In some cases, the ground isolated transmission line package device improves copper density in the package device (e.g., as compared to the same package but without any ground isolated transmission lines). In some cases, the ground isolated transmission line package device enhances the power delivery network for the input/output block (e.g., IO block such as including planes 760, 762 and 764; and lines 1160, 1162, 1164 and 1166) by improving (e.g., reducing resistance of) the ground impedance (e.g., as compared to the same package but without any ground isolated transmission lines), which helps to reduce the IO power network impedance (e.g., lower the resistance of power contacts).

In some cases, a ground isolated horizontal data signal transmission line package device has ground isolation planes separating horizontal data signal receive and transmit layers or levels (e.g., interconnect levels). Each level may have an upper layer of non-conductive (e.g., dielectric) material; a middle layer having conductor material (e.g., pure conductor or metal) data signal lines (e.g., traces) between non-conductive (e.g., dielectric) material portions; a lower layer of non-conductive (e.g., dielectric) material; and a lowest level ground isolation plane of conductor material (e.g., pure conductor or metal). The ground isolation planes between the horizontal data signal receive and transmit layers or levels (e.g., interconnect levels) may reduce crosstalk between (e.g., between TX signal lines and RX signal lines) and increase isolation of the horizontal data signal transmission lines of different horizontally adjacent levels or layers of the device package. This embodiment of a ground isolated horizontal data signal transmission line package device may be described as a ground isolation "plane" separated data signal package device (e.g., see device 750).

Figure 7:
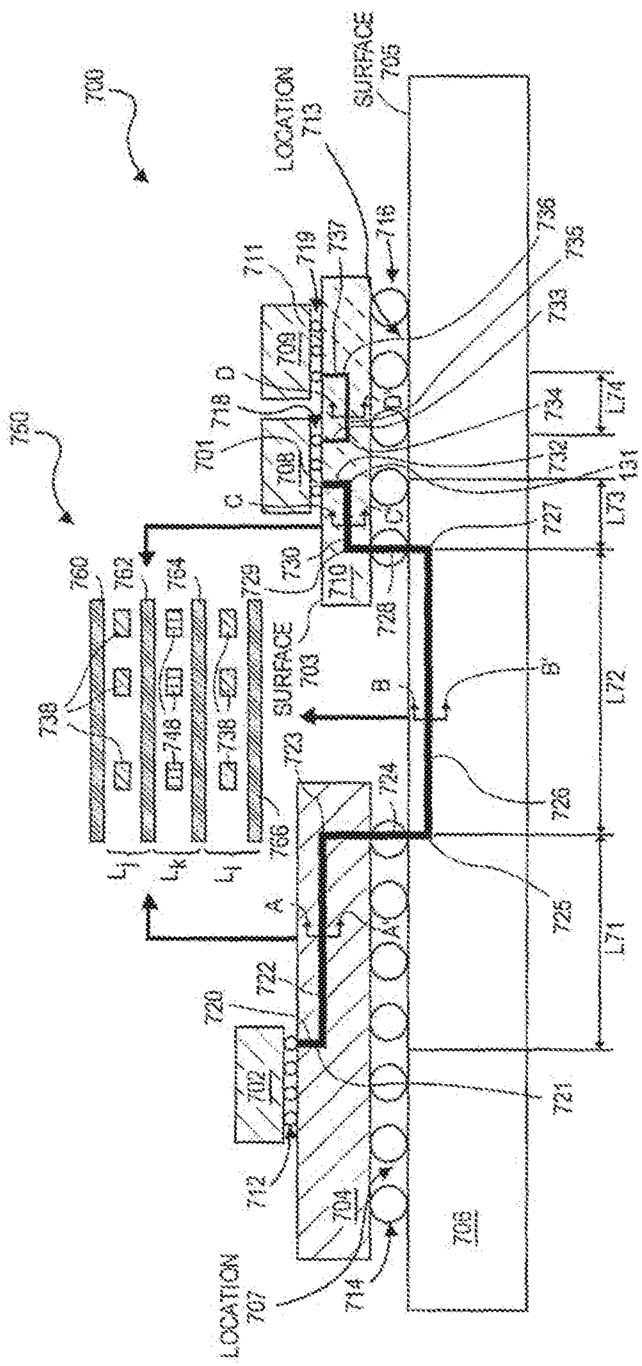
FIG. 7 is schematic cross-sectional side and length views of a computing system, including ground isolated horizontal data signal transmission line package devices.

FIG. 7 is schematic cross-sectional side and length views of a computing system, including ground isolated horizontal data signal transmission line package devices. FIG. 7 shows a schematic cross-sectional side view of computing system 700 (e.g., a system routing signals from a computer processor or chip such as chip 702 to another device such as chip 708 or 709), including ground isolated horizontal data signal transmission line package devices, such as patch 704, interposer 706 and package 710. In some cases, system 700 has CPU chip 702 mounted on patch 704, which is mounted on interposer 706 at first location 707. It also shows chip 708 mounted on package 710 at first location 701; and chip 709 mounted on chip 710 at second location 711. Package 710 is mounted on interposer 706 at second location 713. For example, a bottom surface of chip 702 is mounted on top surface 705 of patch 704 using solder bumps or bump grid array (BGA) 712. A bottom surface of patch 704 is mounted on top surface 705 of interposer 706 at first location 707 using solder bumps or BGA 714. Also, a bottom surface of chip 708 is mounted on top surface 703 of package 710 at first location 701 using solder bumps or BGA 718. A bottom surface of chip 709 is mounted on surface 703 of package 710 at location 711 using solder bumps or BGA 719. A bottom surface of package 710 is mounted on surface 705 of interposer 706 at second location 713 using solder bumps or BGA 716.

In some cases, device 704, 706 or 710 may represent a substrate package, an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices).

FIG. 7 also shows vertical data signal transmission lines 720 (e.g., data signal RX 738 and TX 748 transmission lines or traces) originating in chip 702 and extending vertically downward through bumps 712 and into vertical levels of patch 704. In some case, lines 720 may originate at (e.g., include signal contacts on) the bottom surface of chip 702, extend downward through bumps 712 (e.g., include some of bumps 712), extend downward through (e.g., include signal contacts on) a top surface of patch 704, and extend downward to levels Lj-Ll of patch 704 at first horizontal location 721 of patch 704 (e.g., include vertical signal lines within vertical levels Ltop-L1 of patch 704, such as where level Ltop is the topmost or uppermost level of patch 704 and has an exposed top surface; and level L1 is below level Ltop).

FIG. 7 also shows patch horizontal data signal transmission lines 722 (e.g., data signal RX 738 and TX 748 transmission lines or traces) originating at first horizontal location 721 in levels Lj-Ll of patch 704 and extend horizontally through level Lj-Ll along length L71 of levels Lj-Ll to second horizontal location 723 in levels Lj-Ll of patch 704. Length L71 may be between 5 and 15 millimeters (mm). In some cases it is between 8 and 13 mm. It can be appreciated that length L71 may be an appropriate line or trace length within a package device, that is less than or greater than those mentioned above.

Next, FIG. 7 shows vertical data signal transmission lines 724 (e.g., data signal RX 738 and TX 748 transmission lines or traces) originating in patch 704 and extending vertically downward through bumps 714 and into vertical levels of interposer 706. In some case, lines 724 may originate at (e.g., from horizontal data signal transmission lines in) levels Lj-Ll at second horizontal location 723 of patch 704, extend downward through bumps 714 (e.g., include signal contacts on the bottom surface of patch 704 and some of bumps 714 at location 707), extend downward through (e.g., include signal contacts on) top surface 705 of interposer 706, and extend downward to levels Lj-Ll of interposer 706 at first horizontal location 725 of interposer 706 (e.g., include vertical signal lines within vertical levels Ltop-L1 of interposer 706, such as where level Ltop is the topmost or uppermost level of interposer 706 and has an exposed top surface; and level L1 is below level Ltop).

FIG. 7 also shows interposer horizontal data signal transmission lines 726 (e.g., data signal RX 738 and TX 748 transmission lines or traces) originating at first horizontal location 725 in levels Lj-Ll of interposer 706 and extend horizontally through levels Lj-Ll along length L72 of levels Lj-Ll to second horizontal location 727 in levels Lj-Ll of interposer 706. Length L72 may be between 10 and 40 mm. In some cases it is between 15 and 30 mm. In some cases it is between 15 and 22 mm. It can be appreciated that length L72 may be an appropriate line or trace length within a package device, that is less than or greater than those mentioned above.

Next, FIG. 7 shows vertical data signal transmission lines 128 (e.g., data signal RX 738 and TX 748 transmission lines or traces) originating in interposer 706 and extending vertically upward through bumps 716 and into vertical levels of package 710. In some case, lines 724 may originate at (e.g., from horizontal data signal transmission lines in) levels Lj-Ll at second horizontal location 727 of interposer 706, extend upward through bumps 716 (e.g., include signal contacts on top surface 705 of interposer 706 and some of bumps 716 at location 713), extend upward through (e.g., include signal contacts on) a bottom surface of package 710, and extend upward to levels Lj-Ll of package 710 at first horizontal location 729 of package 710 (e.g., include vertical signal lines within vertical levels Llast-L1 of package 710, such as where level Llast is the lowest or bottommost level of package 710 and has an exposed bottom surface; and level L1 is above level Llast).

FIG. 7 also shows package device horizontal data signal transmission lines 730 (e.g., data signal RX 738 and TX 748 transmission lines or traces) originating at first horizontal location 729 in levels Lj-Ll of package 710 and extend horizontally through levels Lj-Ll along length L73 of levels Lj-Ll to second horizontal location 731 in levels Lj-Ll of package 710. Length L73 may be between 5 and 15 mm. In some cases it is between 10 and 15 mm. It can be appreciated that length L73 may be an appropriate line or trace length within a package device, that is less than or greater than those mentioned above.

Next, FIG. 7 shows vertical data signal transmission lines 732 (e.g., data signal RX 738 and TX 748 transmission lines or traces) originating in package 710 and extending vertically upward through bumps 718 and into chip 708. In some case, lines 732 may originate at (e.g., from horizontal data signal transmission lines in) levels Lj-Ll at second horizontal location 731 of package 710, extend upward through bumps 718 (e.g., include signal contacts on top surface 703 of package 710 and some of bumps 718 at location 701), extend upward through (e.g., include signal contacts on) a bottom surface of chip 708, and extend upward to and terminate at (e.g., include signal contacts on) a bottom surface of chip 708.

In some cases the data signal transmission signals transmitted and received (or existing) on the data signal transmission lines of lines 720, 722, 724, 128, 730 and 732 originate at (e.g., are generated or are provided by) chip 702 and chip 708. In some cases, these data signal transmission signals may be generated by active circuits, transistors, transmitter circuitry or other components of or attached to chip 702 and 708.

FIG. 7 also show vertical data signal transmission lines 733 (e.g., data signal RX 738 and TX 748 transmission lines or traces) originating in chip 708 and extending vertically downward through bumps 718 and into vertical levels of package 710. In some cases, lines 733 may originate at (e.g., include signal contacts on) the bottom surface of chip 708, extend downward through bumps 718 (e.g., include some of bumps 718), extend downward through (e.g., include signal contacts on) a top surface of package 710, and extend downward to levels Lj-Ll of package 710 at first horizontal location 734 of package 710 (e.g., include vertical signal lines within vertical levels Ltop-L1 of package 710, such as where level Ltop is the topmost or uppermost level of package 710 and has an exposed top surface; and level L1 is below level Ltop).

FIG. 7 also shows package device horizontal data signal transmission lines 735 (e.g., data signal RX 738 and TX 748 transmission lines or traces) originating at third horizontal location 734 in levels Lj-Ll of package 710 and extend horizontally through levels Lj-Ll along length L74 of levels Lj-Ll to second horizontal location 736 in levels Lj-Ll of package 710. Length L74 may be between 0.5 and 25 mm. In some cases it is between 1.0 and 15 mm. In some cases it is between 2 and 10 mm. It can be appreciated that length L71 may be an appropriate line or trace length within a package device, that is less than or greater than those mentioned above.

Next, FIG. 7 shows vertical data signal transmission lines 737 (e.g., data signal RX 738 and TX 748 transmission lines or traces) originating in package 710 and extending vertically upward through bumps 719 and into chip 709. In some case, lines 737 may originate at (e.g., from horizontal data signal transmission lines in) levels Lj-Ll at fourth horizontal location 736 of package 710, extend upward through bumps 719 (e.g., include signal contacts on top surface 703 of package 710 and some of bumps 719 at location 711), extend upward through (e.g., include signal contacts on) a bottom surface of chip 709, and extend upward to and terminate at (e.g., include signal contacts on) a bottom surface of chip 709.

In some cases the data signal transmission signals transmitted and received (or existing) on the data signal transmission lines of lines 733, 735 and 737 originate at (e.g., are generated or are provided by) chip 708 and chip 709. In some cases, these data signal transmission signals may be generated by active circuits, transistors, transmitter circuitry or other components of or attached to chip 708 and 709.

In some cases the data signal transmission signals of lines 720, 722, 724, 726, 128, 730, 732, 733, 735 and/or 737 are or include data signal transmission signals to an IC chip (e.g., chip 702, 708 or 709), patch 704, interposer 706, package 710, or another device attached to thereto. In some cases the data signal transmission signals of lines 720, 722, 724, 726, 128, 730, 732, 733, 735 and/or 737 are or include data signal transmission signals from or generated by a chip 702, 708 and/or 709; or another device attached to thereto.

In some cases the data signal transmission signals described herein are high frequency (HF) data signals (e.g., RX and TX data signals). In some cases, the signals have a speed of between 4 and 10 gigatransfers per second (GT/s). In some cases, the signals have a speed of between 6 and 8 gigatransfers per second. In some cases, the signals have a speed of between 4 and 5 Gigabits per second. In some cases, the signals have a speed of up to 10 Gigabits per second. In some cases, the signals have a speed of between 4 and 12 Giga-Transfers per second.

In some cases the signals have a speed between 7 and 25 GT/s; and a voltage of between 0.5 and 2.0 volts. In some cases the signal has a speed between 6 and 15 GT/s. In some cases the signal has a voltage of between 0.4 and 5.0 volts. In some cases it is between 0.5 and 2.0 volts. In some cases it is a different speed and/or voltage level that is appropriate for receiving or transmitting data signals through or within a package device. In some cases, they are in a range between a very low speed transfer rate such as from 50 MT/s to greater than 40 GT/s (or up to between 40 and 50 GT/s).

In some cases, lines 720, 722 and 724 also include power and ground signal lines or traces (e.g., in addition to high frequency data signals receive and transmit lines 738 and 748). These power and ground lines are not shown. In some cases, they extend horizontally from location 721 to location 723 within levels Lj-Ll of patch 704. In some cases they extend horizontally from location 721 to location 723 within other levels of patch 704.

In some cases, lines 724, 726 and 128 also include power and ground signal lines or traces (e.g., in addition to high frequency data signals receive and transmit lines 738 and 748). These power and ground lines are not shown. In some cases, they extend horizontally from location 725 to location 727 within levels Lj-Ll of interposer 706. In some cases they extend horizontally from location 725 to location 727 within other levels of interposer 706. In some cases the power and ground signals transmitted and received (or existing) on the power and ground signal lines of lines 720, 722, 724 and 726 originate at or are provided by patch 704 or interposer 706. In some cases, these power and ground signals may be generated by power and ground circuits, transistors or other components of or attached to patch 704 or interposer 706.

In some cases, lines 128, 730 and 732 also include power and ground signal lines or traces (e.g., in addition to high frequency data signals receive and transmit lines 738 and 748). These power and ground lines are not shown. In some cases, they extend horizontally from location 729 to location 731 within levels Lj-Ll of package 710. In some cases they extend horizontally from location 729 to location 731 within other levels of package 710. In some cases the power and ground signals transmitted and received (or existing) on the power and ground signal lines of lines 128, 730 and 732 originate at or are provided by package 710 or interposer 706. In some cases, these power and ground signals may be generated by power and ground circuits, transistors or other components of or attached to package 710 or interposer 706.

In some cases, lines 733, 735 and 737 also include power and ground signal lines or traces (e.g., in addition to high frequency data signals receive and transmit lines 738 and 748). These power and ground lines are not shown. In some cases, they extend horizontally from location 734 to location 736 within levels Lj-Ll of package 710. In some cases they extend horizontally from location 734 to location 736 within other levels of package 710. In some cases the power and ground signals transmitted and received (or existing) on the power and ground signal lines of lines 733, 735 and 737 originate at or are provided by package 710 or interposer

706. In some cases, these power and ground signals may be generated by power and ground circuits, transistors or other components of or attached to package 710 or interposer 706

In some cases the power signal of lines 720, 722, 724, 726, 128, 730, 732, 733, 735 and/or 737 is or includes power signals to an IC chip (e.g., chip 702 or 708), patch 704, interposer 706, package 710, or another device attached to thereto. In some cases this power signal is an alternating current (AC) or a direct current (DC) power signal (e.g., Vdd). In some cases the power signal has a voltage of between 0.4 and 7.0 volts. In some cases it is between 0.5 and 5.0 volts. In some cases it is a different voltage level that is appropriate for providing one or more electrical power signals through or within a package device or IC chip.

In some cases the ground signal of lines 720, 722, 724, 726, 128, 730, 732, 733, 735 and/or 737 is or includes ground signals to an IC chip (e.g., chip 702 or 708), patch 704, interposer 706, package 710, or another device attached to thereto. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

FIG. 7 also shows a schematic cross-sectional length view of a ground isolated horizontal data signal transmission line package device. In this case, the package device is ground isolation plane separated data signal package device 750. Device 750 may be a "package device" representing any of patch 704, interposer 706 or package 710. It can be appreciated that device 750 may represent another package device having horizontal data transmission lines.

In some cases, package device 750 represents horizontal data signal transmission lines 722 of patch 704 (e.g., between location 721 and location 723) in a cross section perspective through perspective A-A', such a cross section perpendicular to length (e.g., looking at a cross sectional view of the plane of height and width, and down direction L71). In some cases, package device 750 represents horizontal data signal transmission lines 726 of interposer 706 (e.g., between location 725 and location 727) in a cross section perspective through perspective B-B', such a cross section perpendicular to length (e.g., looking down direction L72). In some cases, package device 750 represents horizontal data signal transmission lines 730 of package 710 (e.g., between location 729 and location 731) in a cross section perspective through perspective C-C', such a cross section perpendicular to length (e.g., looking down direction L73). In some cases, package device 750 represents horizontal data signal transmission lines 735 of package 710 (e.g., between location 734 and location 736) in a cross section perspective through perspective D-D', such a cross section perpendicular to length (e.g., looking down direction L74).

In some cases, package device 750 represents all of horizontal data signal transmission lines 722, 726, 730 and 735. In some cases it represents any three of lines 722, 726, 730 and 735. In some cases it represents any two of lines 722, 726, 730 and 735. In some cases it represents only one of lines 722, 726, 730 and 735.

In some cases, package device 750 has package device ground isolation plane 760 separating package device horizontal data signal receive transmission lines 738 (e.g., data signal RX 738) of level Lj from adjacent (e.g., here "adjacent" describing vertically adjacent, such as by being in a level above or below level Lj) horizontal data signal transmit transmission lines (e.g., data signal TX or RX lines) of a level or layer of the package device that is above level Lj. Plane 760 may exist in any of patch 704 (e.g., extending as a continuous conductor material plane separating signal lines of level Lj from a layer above level Lj between locations 721 and 723); interposer 706 (e.g., extending as a continuous conductor material plane separating signal lines of level Lj from a layer above level Lj between locations 725 and 727); and/or package 710 (e.g., extending as a continuous conductor material plane separating signal lines of level Lj from a layer above level Lj between locations 729 and 731, and/or locations 734 and 736).

In some cases, package device 750 has package device ground isolation plane 762 separating package device horizontal data signal receive transmission lines 738 (e.g., data signal RX 738) of level Lj from adjacent horizontal data signal transmit transmission lines 748 (e.g., data signal TX 748) of level Lk of the package device that is below level Lj. Plane 762 may exist in any of patch 704 (e.g., extending as a continuous conductor material plane separating signal lines of level Lj from level Lk between locations 721 and 723); interposer 706 (e.g., extending as a continuous conductor material plane separating signal lines of level Lj from level Lk between locations 725 and 727); and/or package 710 (e.g., extending as a continuous conductor material plane separating signal lines of level Lj from level Lk between locations 729 and 731, and/or locations 734 and 736).

In some cases, package device 750 also has package device ground isolation plane 764 separating package device horizontal data signal transmit transmission lines 748 (e.g., data signal TX 748) of level Lk from adjacent horizontal data signal transmit receive lines 738 (e.g., data signal RX 738) of level L1 of the package device that is below level Lk. Plane 764 may exist in any of patch 704 (e.g., extending as a continuous conductor material plane separating signal lines of level Lk from level L1 between locations 721 and 723); interposer 706 (e.g., extending as a continuous conductor material plane separating signal lines of level Lk from level L1 between locations 725 and 727); and/or package 710 (e.g., extending as a continuous conductor material plane separating signal lines of level Lk from level L1 between locations 729 and 731, and/or locations 734 and 736).

In some cases, package device 750 has package device ground isolation plane 766 separating package device horizontal data signal receive transmission lines 738 (e.g., data signal RX 738) of level L1 from adjacent horizontal data signal transmit transmission lines (e.g., data signal TX or RX lines) of a level or layer of the package device that is below level L1. Plane 766 may exist in any of patch 704 (e.g., extending as a continuous conductor material plane separating signal lines of level L1 from a layer below level L1 between locations 721 and 723); interposer 706 (e.g., extending as a continuous conductor material plane separating signal lines of level L1 from a layer below level L1 between locations 725 and 727); and/or package 710 (e.g., extending as a continuous conductor material plane separating signal lines of level L1 from a layer below level L1 between locations 729 and 731, and/or locations 734 and 736).

Figure 8A:
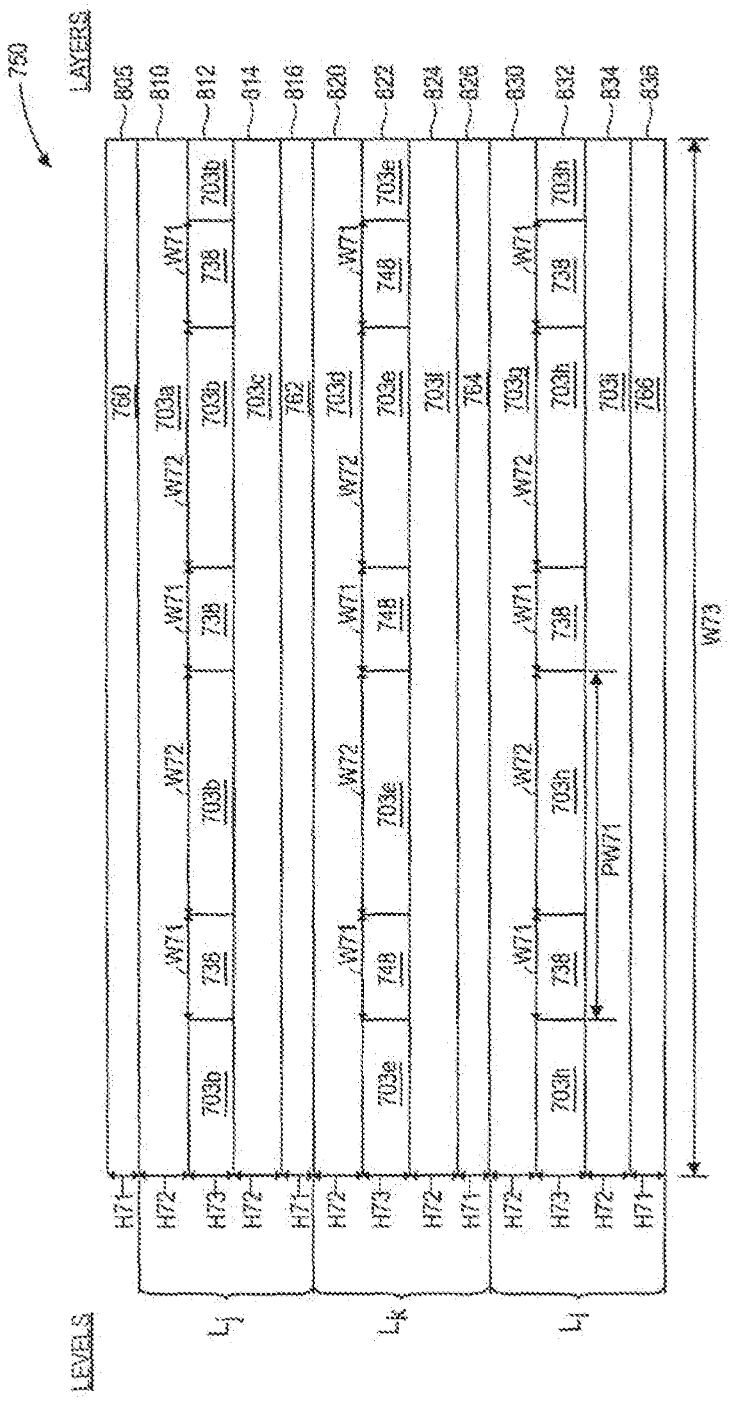
FIG. 8A is an exploded schematic cross-sectional length view of a ground isolated horizontal data signal transmission line package device of FIG. 7 showing ground isolation planes separating horizontal data signal receive and transmit layers or levels.

FIG. 8A is an exploded schematic cross-sectional length view of a ground isolated horizontal data signal transmission line package device of FIG. 7 showing ground isolation planes separating horizontal data signal receive and transmit layers or levels. FIG. 8A shows an exploded schematic cross-sectional length view of ground isolation plane separated data signal package device 750, such as a "package device" representing any of patch 704 (e.g., a view through perspective A-A'), interposer 706 (e.g., a view through perspective B-B') or package 710 (e.g., a view through perspective C-C' or D-D"). Package device 750 is shown having interconnect level Lj formed over or onto (e.g., touching) Level Lk which is formed over or onto Level L1. Each level may have an upper layer of non-conductive (e.g., dielectric) material; a middle layer having conductor material (e.g., pure conductor or metal) data signal lines (e.g., traces) between non-conductive (e.g., dielectric) material portions; a lower layer of non-conductive (e.g., dielectric) material; and a lowest level ground isolation plane of conductor material (e.g., pure conductor or metal).

More specifically, FIG. 8A shows package device 750 having layer 805 that includes (e.g., along with other materials that are beyond the edge of width W73) or is (e.g., within width W73) package device conductor material (e.g., pure conductor or metal) ground isolation plane 760 separating upper layer 810 of package device dielectric material (and package device horizontal data signal receive transmission lines 738 (e.g., data signal RX 738)) of level Lj from package device non-conductor material (and vertically adjacent horizontal data signal transmit transmission lines (e.g., data signal TX or RX lines)) of a level or layer of the package device that is above plane 760.

Plane 760 may be directly physically connected to (e.g., formed in contact with), electrically coupled to, or directly attached to (e.g., touching) ground contacts or via contacts in the same layer 805 or level as plane 760. In some cases the ground plane 760 is or includes ground signals from patch 704, interposer 706, package 710, or another device attached to thereto. In some cases, a ground signal transmitted (or existing on) ground plane 760 originates at or is provided by patch 704, interposer 706 or package 710. In some cases, the ground signal may be generated by ground circuits, transistors or other components of or attached (e.g., such as from a motherboard or power supply electrically connected) to patch 704, interposer 706 or package 710. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

Layer 805 (e.g., plane 760) may be formed onto (e.g., touching) or over layer 810 of level Lj. Layer 805 has height H71 and width W73. In some cases, height H71 may be approximately 15 micrometers (15×E-6 meter—"um") and width W73 is between 1 millimeter (mm) and 10 mm. In some cases, height H71 is between 10 and 20 micrometers (um). In some cases, it is between 5 and 30 micrometers. It can be appreciated that height H71 may be an appropriate height of a conductive material grounding plane within a package device for reducing cross talk and for isolating signal traces, that is less than or greater than those mentioned above.

In some cases, width W73 is between 1 millimeter (mm) and 20 mm. In some cases, it is between 100 micrometers and 2 mm. It can be appreciated that width W73 may be an appropriate width of a (e.g., single, set or layer of) horizontal data signal receive or transmit lines within a package device, that is less than or greater than those mentioned above. In some cases, width W73 can span from 1 percent to 100 percent of an entire width of a device package. In some cases, it can span from 20 percent to 90 percent of an entire width of a device package.

In some cases, the exact size of width W73 may depend on number of signal lines employed within each level (e.g., number of lines 738 or 748 in levels Lj-Ll). In some cases, the size of width W73 may also depend on the number of signal lines employed within the package device. In some cases, the size of width W73 can be scaled with or depend on the manufacturing or processing pitch (e.g., of the signal lines, such as shown as pitch PW1). The size of width W73 may also depend on the technology capability of forming the signal lines and package. In some cases, in general, the size of width W73 can span from around a hundred to a couple of hundred micrometers (x E-6 meter—"um" or "microns"). In some cases, it is between 80 and 250 um. In some cases it is between 50 and 300 um.

Level Lj is shown having upper layer 810 formed over or onto (e.g., touching) middle layer 812 which is formed over or onto lower layer 814 which is formed over or onto lowest layer 816.

Next, FIG. 8A shows upper layer 810 of level Lj that includes (e.g., along with other materials that are beyond the edge of width W73) or is (e.g., within width W73) package device non-conductive material plane 703*a* separating layer 805 from middle layer 812 of level Lj. Layer 810 (e.g., plane 703*a*) may be formed onto (e.g., touching) or over middle layer 812 of level Lj. Layer 810 has height H72 and width W73.

In some cases, height H72 is approximately 25 micrometers. In some cases, height H72 is between 20 and 30 micrometers (um). In some cases, it is between 10 and 40 micrometers. In some cases, height H72 is the same as height H71 noted above. It can be appreciated that height H72 may be an appropriate height of a dielectric material layer between the signal lines and grounding plane within a package device, that is less than or greater than those mentioned above.

Now, FIG. 8A shows middle layer 812 of level Lj that includes (e.g., along with other materials that are beyond the edge of width W73) or is (e.g., within width W73) package device conductor material (e.g., pure conductor or metal) horizontal data signal receive transmission lines 738 (e.g., a first type of data signal lines or traces, such as RX data signal lines) disposed (e.g., located) between package device non-conductive (e.g., dielectric) material portions 703*b*. Layer 812 separates upper layer 810 from lower layer 814 of level Lj. Layer 812 (e.g., lines 738 and portions 703*b*) may be formed onto (e.g., touching) or over lower layer 814 of level Lj. Layer 812 has height H73 and width W73.

Horizontal data signal receive transmission lines 738 are shown having height H73 and width W71 (a width between horizontally adjacent portions 703*b*). Non-conductive material portions 703*b* are shown having height H73 and width W72 (a width between horizontally adjacent lines 738).

In some cases, height H73 may be approximately 15 micrometers (15×E-6 meter —"um"). In some cases, height H73 is between 10 and 20 micrometers (um). In some cases, it is between 5 and 30 micrometers. It can be appreciated that height H73 may be an appropriate height of a signal line layer (or data signal receive or transmit line) within a package device, that is less than or greater than those mentioned above. In some cases, height H73 is the same as height H71.

In some cases, width W71 is between 3 and 100 micrometers (um). In some cases, it is between 5 and 75 micrometers. In some cases, it is between 15 and 35 micrometers. It can be appreciated that width W71 may be an appropriate width of a data signal receive or transmit line within a package device, that is less than or greater than those mentioned above.

In some cases, width W72 is approximately 158 micrometers. In some cases, it is between 10 and 300 micrometers (um). In some cases, it is between 25 and 200 micrometers. In some cases, it is between 30 and 100 micrometers. It can be appreciated that width W72 may be an appropriate width of a non-conductive material between horizontally adjacent data signal receive or transmit lines within a package device, that is less than or greater than those mentioned above. In some cases, the size of width of the manufacturing or processing pitch between same edges (or centers of width W71) of horizontally adjacent data signal lines of device 750 is pitch PW1. PW1 may be equal to the sum of widths W71+W72. In some cases, pitch PW1 is approximately 206 micrometers.

In some cases, the aggregate (e.g., addition) of each pair of values for width W71/width W72 (e.g., spacing between signal lines) (e.g., value A of width W71 plus value B of width W72; or value O of width W71 plus value P of width W72, etc.) represents the same sum or constant (e.g., such as pitch width PW1). In some cases, the sum is between 100 and 200 um. In some cases, it is between 720 and 150 um. In some cases it is between 730 and 140 um. In some cases, pair values may be values between (1) width W71 between 60 and 80 um, and width W72 between 55 and 75 um; and (2) width W71 between 25 and 45 um, and width W72 between 90 and 110 um. In some cases, pair values may be width W71/width W72 of 70/65 um, 65/70 um, 60/75 um, 55/80 um, 50/85 um, 45/90 um, 40/95 um, or 35/100 um.

Next, FIG. 8A shows lower layer 814 of level Lj that includes (e.g., along with other materials that are beyond the edge of width W73) or is (e.g., within width W73) package device non-conductive material plane 703*c* separating middle layer 812 from lowest layer 816 of level Lj. Layer 814 (e.g., plane 703*c*) may be formed onto (e.g., touching) or over lowest layer 816 of level Lj. Layer 814 has height H72 and width W73.

Then, FIG. 8A shows lowest layer 816 of level Lj that includes (e.g., along with other materials that are beyond the edge of width W73) or is (e.g., within width W73) package device conductor material (e.g., pure conductor or metal) ground isolation plane 762 separating lower layer 814 of level Lj from upper layer 820 of vertically adjacent level Lk which is below level Lj. Layer 816 (e.g., plane 762) may vertically separate package device horizontal data signal receive transmission lines 738 (e.g., a first type of data signal lines or traces, such as RX data signal lines disposed between package device non-conductive material portions 703*b*) of level Lj (e.g., layer 812) from package device horizontal data signal transmit transmission lines 748 (e.g., a second type of data signal lines or traces, such as TX data signal lines disposed between package device non-conductive material portions 703*e*) of vertically adjacent level Lk (e.g., layer 822) that is below level Lj.

Plane 762 may be directly physically connected to (e.g., formed in contact with), electrically coupled to, or directly attached to (e.g., touching) ground contacts or via contacts in the same layer 816 or level as plane 762. In some cases the ground plane 762 is or includes ground signals from patch 704, interposer 706, package 710, or another device attached to thereto. In some cases, a ground signal transmitted (or existing on) ground plane 762 originates at or is provided by patch 704, interposer 706 or package 710. In some cases, the ground signal may be generated by ground circuits, transistors or other components of or attached (e.g., such as from a motherboard or power supply electrically connected) to patch 704, interposer 706 or package 710. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

Layer 816 (e.g., plane 762) may be formed onto (e.g., touching) or over layer 820 of level Lk. Layer 816 has height H71 and width W73 (e.g., as noted above for plane 760).

Level Lk is shown having upper layer 820 formed over or onto (e.g., touching) middle layer 822 which is formed over or onto lower layer 824 which is formed over or onto lowest layer 826.

Next, FIG. 8A shows upper layer 820 of level Lk that includes (e.g., along with other materials that are beyond the edge of width W73) or is (e.g., within width W73) package device non-conductive material plane 703*d* separating layer 816 from middle layer 822 of level Lk. Layer 820 (e.g., plane 703*d*) may be formed onto (e.g., touching) or over middle layer 822 of level Lk. Layer 820 has height H72 and width W73.

Now, FIG. 8A shows middle layer 822 of level Lk that includes (e.g., along with other materials that are beyond the edge of width W73) or is (e.g., within width W73) package device conductor material (e.g., pure conductor or metal) horizontal data signal transmit transmission lines 748 (e.g., a second type of data signal lines or traces, such as TX data signal lines) disposed between package device non-conductive (e.g., dielectric) material portions 703*e*. Layer 822 separates upper layer 820 from lower layer 824 of level Lk. Layer 822 (e.g., lines 748 and portions 703*e*) may be formed onto (e.g., touching) or over lower layer 824 of level Lk. Layer 822 has height H73 and width W73.

Horizontal data signal transmit transmission lines 748 are shown having height H73 and width W71 (a width between horizontally adjacent portions 703*e*). Non-conductive material portions 703*e* are shown having height H73 and width W72 (a width between horizontally adjacent lines 748).

Next, FIG. 8A shows lower layer 824 of level Lk that includes (e.g., along with other materials that are beyond the edge of width W73) or is (e.g., within width W73) package device non-conductive material plane 703*f* separating middle layer 822 from lowest layer 826 of level Lk. Layer 824 (e.g., plane 703*f*) may be formed onto (e.g., touching) or over lowest layer 826 of level Lk. Layer 824 has height H72 and width W73.

Then, FIG. 8A shows lowest layer 826 of level Lk that includes (e.g., along with other materials that are beyond the edge of width W73) or is (e.g., within width W73) package device conductor material (e.g., pure conductor or metal) ground isolation plane 764 vertically separating lower layer 824 of level Lk from upper layer 830 of vertically adjacent level L1 which is below level Lk. Layer 826 (e.g., plane 764) may vertically separate package device horizontal data signal transmit transmission lines 748 (e.g., a second type of data signal lines or traces, such as TX data signal lines disposed between package device non-conductive material portions 703*f*) of level Lk (e.g., layer 822) from package device horizontal data signal receive transmission lines 738 (e.g., a first type of data signal lines or traces, such as RX data signal lines disposed between package device non-conductive material portions 703*h*) of vertically adjacent level L1 (e.g., layer 832) that is below level Lk.

Plane 764 may be directly physically connected to (e.g., formed in contact with), electrically coupled to, or directly attached to (e.g., touching) ground contacts or via contacts in the same layer 826 or level as plane 764. In some cases the ground plane 764 is or includes ground signals from patch 704, interposer 706, package 710, or another device attached to thereto, as described for plane 762. In some cases this ground signal is a zero voltage direct current (DC) grounding signal (e.g., GND) or has a voltage, as described for plane 762.

Layer 826 (e.g., plane 764) may be formed onto (e.g., touching) or over layer 830 of level L1. Layer 826 has height H71 and width W73 (e.g., as noted above for plane 760).

Level Lk is shown having upper layer 820 formed over or onto (e.g., touching) middle layer 822 which is formed over or onto lower layer 824 which is formed over or onto lowest layer 826.

Next, FIG. 8A shows upper layer 830 of level L1 that includes (e.g., along with other materials that are beyond the edge of width W73) or is (e.g., within width W73) package device non-conductive material plane 703*g* separating layer 826 from middle layer 832 of level L1. Layer 830 (e.g., plane 703*g*) may be formed onto (e.g., touching) or over middle layer 832 of level L1. Layer 830 has height H72 and width W73.

Now, FIG. 8A shows middle layer 832 of level L1 that includes (e.g., along with other materials that are beyond the edge of width W73) or is (e.g., within width W73) package device conductor material (e.g., pure conductor or metal) horizontal data signal receive transmission lines 738 (e.g., a first type of data signal lines or traces, such as RX data signal lines) disposed between package device non-conductive (e.g., dielectric) material portions 703*h*. Layer 832 separates upper layer 830 from lower layer 834 of level L1. Layer 832 (e.g., lines 738 and portions 703*h*) may be formed onto (e.g., touching) or over lower layer 834 of level L1. Layer 832 has height H73 and width W73.

Horizontal data signal receive transmission lines 738 are shown having height H73 and width W71 (a width between horizontally adjacent portions 703*h*). Non-conductive material portions 703*h* are shown having height H73 and width W72 (a width between horizontally adjacent lines 738).

Next, FIG. 8A shows lower layer 834 of level L1 that includes (e.g., along with other materials that are beyond the edge of width W73) or is (e.g., within width W73) package device non-conductive material plane 703*i* separating middle layer 832 from lowest layer 836 of level L1. Layer 834 (e.g., plane 703*i*) may be formed onto (e.g., touching) or over lowest layer 836 of level L1. Layer 834 has height H72 and width W73.

Then, FIG. 8A shows lowest layer 836 of level L1 that includes (e.g., along with other materials that are beyond the edge of width W73) or is (e.g., within width W73) package device conductor material (e.g., pure conductor or metal) ground isolation plane 766 vertically separating lower layer 834 of level L1 from an upper layer of an vertically adjacent lower level of device package 750 which is below level L1. Layer 836 (e.g., plane 766) may vertically separate package device horizontal data signal receive transmission lines 738 (e.g., a first type of data signal lines or traces, such as RX data signal lines disposed between package device non-conductive material portions 703*h*) of level L1 (e.g., layer 832) from package device horizontal data signal transmit transmission lines 748 (e.g., a second type of data signal lines or traces, such as RX data signal lines disposed between package device non-conductive material portions) of a vertically adjacent lower level of device package 750 that is below level L1.

Plane 766 may be directly physically connected to (e.g., formed in contact with), electrically coupled to, or directly attached to (e.g., touching) ground contacts or via contacts in the same layer 836 or level as plane 766. In some cases the ground plane 766 is or includes ground signals from patch 704, interposer 706, package 710, or another device attached to thereto, as described for plane 762. In some cases this ground signal is a zero voltage direct current (DC) grounding signal (e.g., GND) or has a voltage, as described for plane 762.

Layer 836 (e.g., plane 766) may be formed onto (e.g., touching) or over an upper layer of a vertically adjacent level of device package 750 that is below level L1. Layer 836 has height H71 and width W73 (e.g., as noted above for plane 760).

Figure 8B:
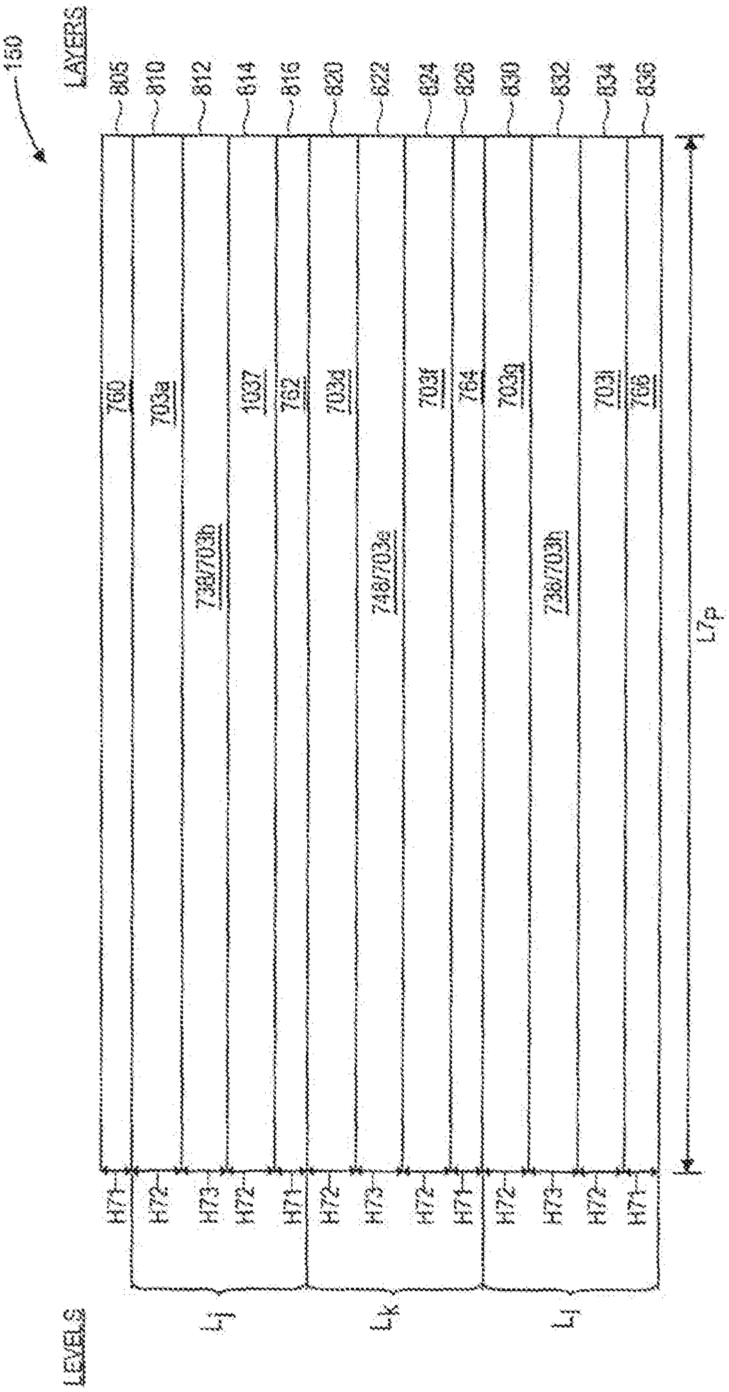
FIG. 8B is an exploded schematic cross-sectional side view of a ground isolated horizontal data signal transmission line package device of FIGS. 7 and 8A showing ground isolation planes separating horizontal data signal receive and transmit layers or levels.

FIG. 8B is an exploded schematic cross-sectional side view of a ground isolated horizontal data signal transmission line package device of FIGS. 7 and 8A showing ground isolation planes separating horizontal data signal receive and transmit layers or levels. FIG. 8B shows an exploded schematic cross-sectional side view of ground isolation plane separated data signal package device 750 of FIGS. 7 and 8A such as a "package device" representing any of patch 704 (e.g., along length L71), interposer 706 (e.g., along length L72) or package 710 (e.g., along length L73 and/or L74). Package device 750 is shown having interconnect levels Lj, Lk and L1 (e.g., see FIG. 8A).

More specifically, FIG. 8B shows package device 750 having layers 805-836 along length L7*p*. Length L7*p* may represent any of lengths L71, L72, L73 or L74.

In some cases, length L7*p* is between 1 millimeter (mm) and 60 mm. In some cases, length L7*p* is between 100 micrometers and 2 mm. In some cases, length L7*p* is between 10 and 14 mm. In some cases, length L7*p* is between 7 and 20 mm. In some cases, length L7*p* is between 5 and 30 mm. In some cases, length L7*p* is between 40 and 50 mm. It can be appreciated that length L7*p* may be an appropriate length of a (e.g., single, set or layer of) horizontal data signal receive or transmit lines within a package device, that is less than or greater than those mentioned above. In some cases, length L7*p* can span from 10 percent to an entire length of a device package.

It can be appreciated that length L7*p* may represent a length that is not a straight line but that curves one or more times between two horizontal locations that horizontal data signal transmission lines are routed between (e.g., horizontal locations 721 and 723) in a level of package device 750. In some cases, length L7*p* will be different for different ones of the data signal transmit lines (RX and/or TX), such as depending on the routing of the lines between the two horizontal locations of that level. In some cases the two horizontal locations that horizontal data signal transmission lines are routed between (e.g., horizontal locations 721 and 723) in a level of package device 750 will be different for different ones of the horizontal data signal transmit lines (RX and/or TX) depending on the routing of the ends of the lines, such as for connection of the lines to signal contacts or via contacts of that level or another level of the package device.

FIG. 8B shows layer 805 that may include (e.g., along with other materials that are beyond the edge of length L7*p*) or is (e.g., within length L7*p*) ground isolation plane 760 vertically separating upper layer 810 of level Lj from a lowest layer of vertically adjacent level of device package 750 which is above level Lj. Layer 810 may include (e.g., along with other materials that are beyond the edge of length L7*p*) or is (e.g., within length L7*p*) package device non-conductive material plane 703*a* separating layer 805 from middle layer 812 of level Lj. Layer 812 is shown including (e.g., along with other materials that are beyond the edge of length L7*p*) or being (e.g., within length L7*p*) package device conductor material (e.g., pure conductor or metal) horizontal data signal receive transmission lines 738 (e.g., a first type of data signal lines or traces, such as RX data signal lines) disposed between package device non-conductive (e.g., dielectric) material portions 703*b*. For example, layer 812 is shown having "738/703*b*" which may represent lines 738 and/or portions 703*b* extending along length L7*p*. Layer 814 may include (e.g., along with other materials that are beyond the edge of length L7*p*) or be (e.g., within length L7*p*) package device non-conductive material plane 703*c* separating middle layer 812 from lowest layer 816 of level Lj. Layer 816 may include (e.g., along with other materials that are beyond the edge of length L7*p*) or be (e.g., within length L7*p*) package device conductor material (e.g., pure conductor or metal) ground isolation plane 762 vertically separating lower layer 814 of level Lj from upper layer 820 of vertically adjacent level Lk which is below level Lj.

FIG. 8B shows layer 820 that may include (e.g., along with other materials that are beyond the edge of length L7*p*) or be (e.g., within length L7*p*) package device non-conductive material plane 703*d* separating layer 816 from middle layer 822 of level Lk. Layer 822 may include (e.g., along with other materials that are beyond the edge of length L7*p*) or be (e.g., within length L7*p*) package device conductor material (e.g., pure conductor or metal) horizontal data signal transmit transmission lines 748 (e.g., a second type of data signal lines or traces, such as TX data signal lines) disposed between package device non-conductive (e.g., dielectric) material portions 703*e*. Layer 824 may include (e.g., along with other materials that are beyond the edge of length L7*p*) or be (e.g., within length L7*p*) package device non-conductive material plane 703*f* separating middle layer 822 from lowest layer 826 of level Lk. Layer 826 may include (e.g., along with other materials that are beyond the edge of length L7*p*) or be (e.g., within length L7*p*) package device conductor material (e.g., pure conductor or metal) ground isolation plane 764 vertically separating lower layer 824 of level Lk from upper layer 830 of vertically adjacent level L1 which is below level Lk.

FIG. 8B shows layer 830 that may include (e.g., along with other materials that are beyond the edge of length L7*p*) or be (e.g., within length L7*p*) package device non-conductive material plane 703*g* separating layer 826 from middle layer 832 of level L1. Layer 832 may include (e.g., along with other materials that are beyond the edge of length L7*p*) or be (e.g., within length L7*p*) package device conductor material (e.g., pure conductor or metal) horizontal data signal receive transmission lines 743 (e.g., a first type of data signal lines or traces, such as RX data signal lines) disposed between package device non-conductive (e.g., dielectric) material portions 703*h*. Layer 834 may include (e.g., along with other materials that are beyond the edge of length L7*p*) or be (e.g., within length L7*p*) package device non-conductive material plane 703*i* separating middle layer 832 from lowest layer 836 of level L1. Layer 836 may include (e.g., along with other materials that are beyond the edge of length L7*p*) or be (e.g., within length L7*p*) package device conductor material (e.g., pure conductor or metal) ground isolation plane 766 vertically separating lower layer 834 of level L1 from an upper layer of vertically adjacent level of device package 750 which is below level L1.

Figure 9A:
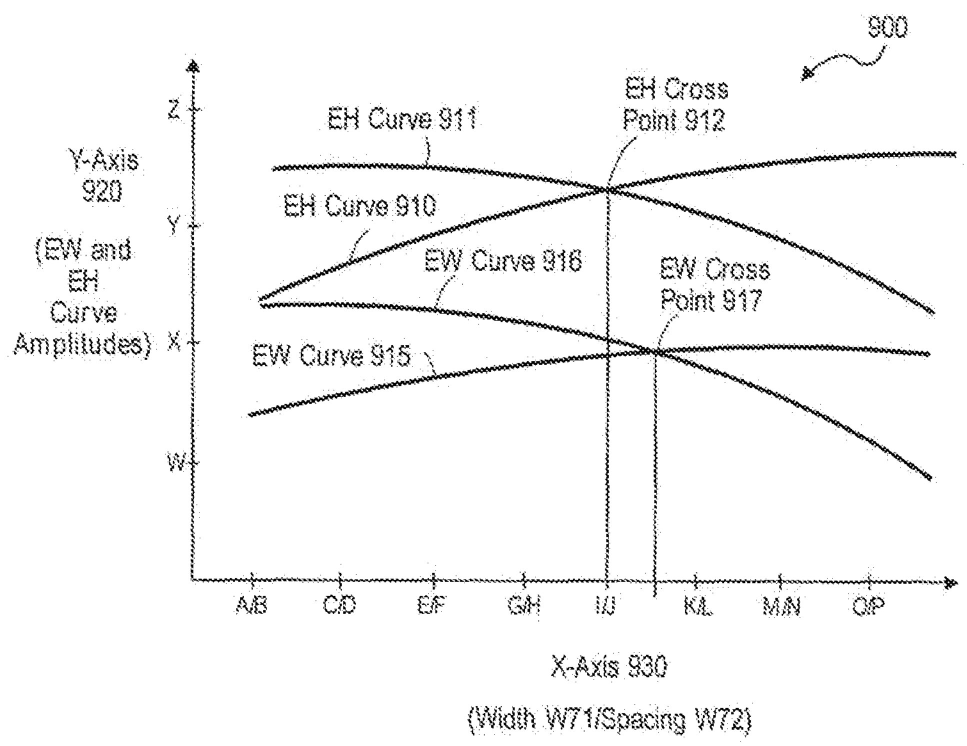
FIG. 9A shows a plot of eye height (EH) curves and eye width (EW) curves of an eye diagram produced by testing one of horizontal data signal transmission signal lines for a range of horizontal data signal transmission line width and spacing between horizontally adjacent signal lines.
Figure 9B:
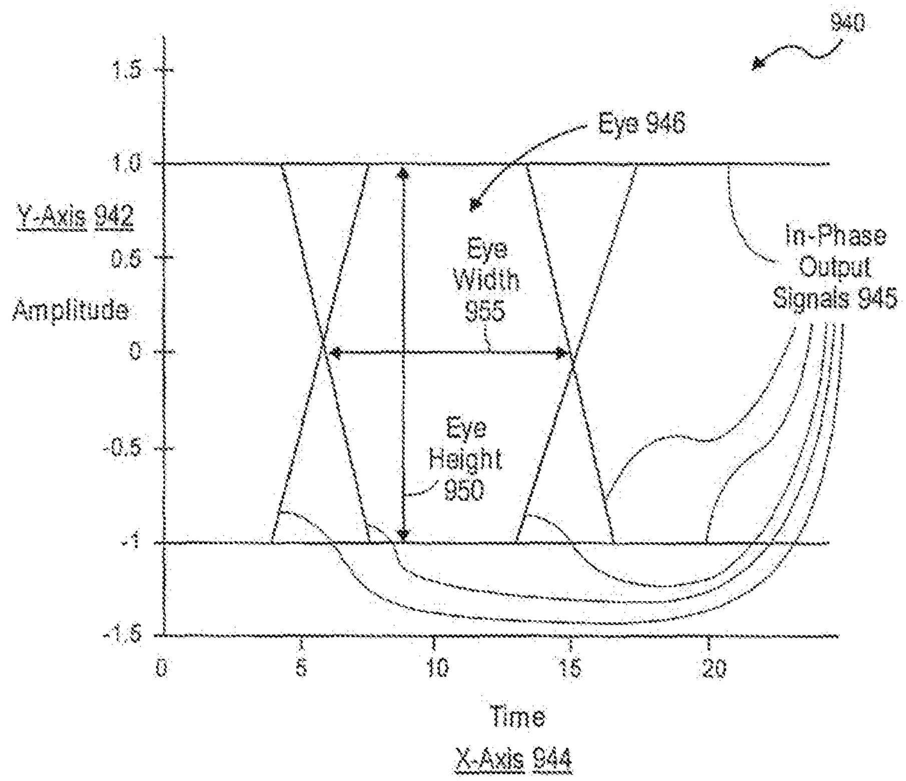
FIG. 9B shows an example of an eye-diagram for providing eye-height curves and eye-width curves of FIG. 9A.

FIG. 9A shows a plot of eye height (EH) curves and eye width (EW) curves of an eye diagram produced by testing one of horizontal data signal transmission signal lines for a range of horizontal data signal transmission line width and spacing between horizontally adjacent signal lines. FIG. 9B shows an example of an eye-diagram for providing eye-height curves and eye-width curves of FIG. 9A. In some cases, the horizontal signal lines 738 and 748 of device 750 are impedance tuned (e.g., see FIG. 9A) to minimize impedance discontinuity and crosstalk between vertically adjacent and horizontally adjacent ones of signal lines 738 or 748 (e.g., a channel) of device 750. This may include performing such tuning to determine or identify a selected target width W71 (and optionally height H73) of one of signal lines 738 or 748 (e.g., given other set or known heights and widths such as noted below) that provides a the best channel performance as showed as the lowest amplitude cross point of eye height (EH) or eye width (EW) curves (e.g., see FIG. 9A) of an eye diagram (e.g., see FIG. 9B) produced by testing one of signal lines 738 or 748. The EH and EW curves (e.g., curves 910-911 and 915-916) may be output signal measure (or computer modeled) at a location of the data signal line 738 or 748 when (e.g., as a result of running) one or more input test data signals are sent through length L7*p* of the data signal line. This testing may include sending simultaneous test signals, such as step up (e.g., __|‾ ) and down (e.g., ‾|__ ) signals, through one type of line (e.g., RX lines 738 or TX lines 748), one level of lines (e.g., layer 812, 822 or 832), or all lines 738 or 748 of device 750 having a given length L7*p*. This may include performing such tuning to determine or identify isolated horizontal data signal transmission line widths W71 and spacing W72 that are single line impedance tuned (e.g., see FIG. 9A) in the routing segment of device 750 along the channel of signal lines 738 and 748 along length L7*p*.

Impedance tuning of the line may be based on or include as factors: horizontal data signal transmission line width W71, height H73, length L7*p*; width W72 between the line and a horizontally adjacent horizontal data signal transmission line of device 750; and height H72 between the line and a vertically adjacent grounding plane of device 750. In some cases, once the length L7*p*, width W72, height H72 and height H73 are known (e.g., predetermined or previously selected based on a specific design of a package device 750), then tuning is performed (e.g., computer simulation, actual "beta" device testing, or other laboratory testing) to determine or identify a range of width W71 that provides the best channel performance as showed as the lowest amplitude cross point of eye height (EH) or eye width (EW) curves of an eye diagram produced by testing one of signal lines 738 or 748.

For example, FIG. 9A shows a plot of eye height (EH) curves 910 and 911; and eye width (EW) curves 915 and 916 of an eye diagram (e.g., see FIG. 9B) produced by testing one of horizontal data signal transmission signal lines 738 or 748 for a range of horizontal data signal transmission line width W71 and spacing W72 between horizontally adjacent signal lines 738 or 748. The testing may include measuring or modeling an output signal in response to an input signals such as step up (e.g., __|‾ ) and down (e.g., ‾|__ ) signals as noted above for FIG. 9A. EH curve 910 may be the EH curve for a first design or use of device 750 that is independent of (e.g., not based on or does not consider) the above noted factors (e.g., horizontal data signal transmission line width W71, height H73, length L7*p*; width W72 between the line and a horizontally adjacent horizontal data signal transmission line of device 750; and height H72 between the line and a vertically adjacent grounding plane of device 750). EH curve 911 may be the EH curve for a second, different design or use of device 750 that is independent of the above noted factors. EW curve 915 may be the EW curve for the first design or use of device 750 that is independent of the above noted factors. EW curve 916 may be the EW curve for the second, different design or use of device 750 that is independent of the above noted factors.

In some cases, such a design or use may include where the different curves represent different manufacture variation combinations, such as where a low impedance package (e.g., package 710) is connected to high impedance interposer (e.g., interposer 706). In some cases, such a design or use may include where the different curves represent different corner combinations, or possible component variation combinations. In some cases, such a design or use may include where the different curves represent different designs or uses to tune the impedance to maximize the channel performance. In some cases, FIG. 9A shows EH and EW curves from various channels combining possible package and interposer manufacturing corners, (max/typical/min impedance corners from manufacturing variations). In some cases, for example, max Z patch+min Z interposer+max Z package, where Z denotes impedance. In some cases, the common or intersection area below the EH or EW curvers shows the channel EH/EW solution space. In some cases, the optimized impedance value is tied to the the cross point of EH or EW curves which provides the max EH/EW enveloping all the possible channel manufacture variations.

FIG. 9B shows an example of an eye-diagram 942 for providing eye-height curves 910 and 911; and eye width (EW) curves 915 and 916 of FIG. 9A. FIG. 9B shows diagram 940 having vertical y-axis 942 indicating the amplitude of the output signal measured when the test signal is applied to the data signal line. X-axis 944 is a time scale mapping the an in-phase version of output data signals 945 measured when the output signals are time synchronized to be in phase such that the step up and step down test signals would normally form a rectangle or square, but form the central hexagon shaped "eye" 946. Eye 946 has y-axis eye-height 950 and x-axis eye-width 955. Thus, EH curves 910-911 may be examples of eye-height 950 for different designs, and different signal line width W71 and spacing W72 for device 1150. Thus, EW curves 915-916 may be examples of eye-width 955 for different designs, and different signal line width W71 and spacing W72 for device 1150.

It can be appreciated that an eye diagram (e.g., as shown in FIG. 9B) can be a common indicator of the quality of signals in high-speed digital transmissions (e.g., along data lines 738 and 748). An oscilloscope can be used to generate an eye diagram by overlaying sweeps of different segments of a long data stream driven by a master clock. The triggering edge may be positive or negative, but the displayed pulse that appears after a delay period may go either way; there is no way of knowing beforehand the value of an arbitrary bit. Therefore, when many such transitions have been overlaid, positive and negative pulses are superimposed on each other (e.g., as shown by signals 945 in FIG. 9B). Overlaying many bits produces an eye diagram, so called because the resulting image looks like the opening of an eye (e.g., as shown by eye 946 in FIG. 9B).

In an ideal world, eye diagrams (e.g., as shown by signals 945 in FIG. 9B) would look like rectangular boxes. In reality, communications are imperfect, so the transitions do not line perfectly on top of each other, and an eye-shaped pattern results (e.g., as shown by eye 946 in FIG. 9B). On an oscilloscope, the shape of an eye diagram will depend upon various types of triggering signals (e.g., input test signals), such as clock triggers, divided clock triggers, and pattern triggers. Differences in timing and amplitude from bit to bit cause the eye opening to shrink.

Also, for data links operating at gigahertz transmission speeds (e.g., device 750), variables that can affect the integrity of signals (e.g., the shape, EW and EH of the eye) can include: (e.g., data signal transmission lines 738 and 748) transmission-line effects; impedance mismatches; signal routing; termination schemes; grounding schemes; interference from other signal lines, connectors, and cables; and when signals on adjacent pairs of signal lines toggle, crosstalk among those signals on those lines can interfere with other signals on those lines (e.g., on lines 738 and 748).

In some cases, curves 910-911 and 915-916 are for a selected (e.g., predetermined, desired, constant or certain) length L7*p* of the horizontal data signal transmission line (e.g., RX line 738 or TX line 748) of ground isolation plane separated data signal package device 750. In some cases, curves 910-911 and 915-916 are also for a selected signal line height H73 and spacing H72 between the signal line and a vertically adjacent ground plane or other signal line.

In some other cases, tuning includes knowing length L7*p*, width W72 and height H72, then tuning to determine or identify a range of width W71 and height H73 that provides a predetermined or target impedance for the line.

More specifically, FIG. 9A shows graph 900 plotting the amplitude of tuning curves 910-911 and 915-916 along vertical Y-axis 920 for different pairs of width W71 of a signal line (e.g., RX line 738 or TX line 748) and spacing W72 between horizontally adjacent one of the signal lines (e.g., RX or TX lines 738 or 748) along horizontal X-axis 930. Although FIG. 9A shows the amplitude of curves 910-911 and 915-916 on the same graph 900, it can be appreciated that they may be on different graphs having different amplitude scaled Y-axis but the same X-axis 930 (e.g., the curves are all shown vertically scaled on graph 900 (e.g., moved up or down axis 920) to compare the cross points for the curves). Curves 910-911 and 915-916 may be output signal measure (or computer modeled) at a location of the data signal line when (e.g., as a result of running) the one or more test data signals are sent through length L7*p* of the data signal line (e.g., RX line 738 or TX line 748).

Graph 900 shows cross point 912 of EH curves 910 and 911. I can be appreciated that curves 910 and 911 represent more than two curves, but that those curves have a lowest Y-axis cross point at point 912. Graph 900 shows cross point 917 of EW curves 915 and 916. I can be appreciated that curves 915 and 916 represent more than two curves, but that those curves have a lowest Y-axis cross point at point 917.

FIG. 9A shows EW and EH curve amplitudes along vertical axis 920 having values W, X, Y and Z, such as representing different amplitudes for curves 910-911 or 915-916 (e.g., curves 915-916 or 910-911 may be scaled, respectively, to fit onto the same graph or plot). In some cases, for curves 910-911 values W, X, Y and Z, represent different linearly increasing EH signal amplitude values (e.g., voltage amplitudes of EH derived from a test signal) such as 0.1, 0.15, 0.2 and 0.25 volts. In some cases, for curves 915-916 values W, X, Y and Z, represent different linearly increasing EW signal time values (e.g., time values of EW derived from a test signal) such as 3.0, 3.5, 4.0 and 4.5 E-11 seconds.

FIG. 9A shows pairs of width W71/spacing W72 along horizontal axis 930 having pair values A/B, C/D, E/F, G/H, I/J, K/L, M/N and O/P. In some cases, the aggregate (e.g., addition) of each pair of values (e.g., value A plus value B; or value O plus value P, etc.) represents the same sum or constant (e.g., such as pitch width PW1). In some cases, the sum is between 100 and 200 um. In some cases, it is between 720 and 150 um. In some cases it is between 730 and 140 um. In some cases, pair values A/B represent width W71 between 60 and 80 um, and spacing W72 between 55 and 75 um; pair values O/P represent width W71 between 25 and 45 um, and spacing W72 between 90 and 110 um; and the other pairs are at linear intervals between values A/B and values O/P. In some cases, pair values A/B represent width/spacing of 70/65 um, pair values C/D represent width/spacing of 65/70 um, pair values E/F represent width/spacing of 60/75 um, pair values G/H represent width/spacing of 55/80 um, pair values I/J represent width/spacing of 50/85 um, pair values K/L represent width/spacing of 45/90 um, pair values M/N represent width/spacing of 40/95 um, and pair values O/P represent width/spacing of 35/100 um.

In some cases, Y-axis 920 represents eye-height or eye-width which are the figures of merit to quantify the channel performance of the tested signal line (e.g., RX line 738 or TX line 748); and X-axis 930 is the combination of signal line width W71/line spacing W72 at constant pitch (line width W71+lines spacing W72=constant pitch PW, such as PW1). According to embodiments, the impedance tuning of horizontal signal line 738 or 748 of device 750 includes (or is) selecting (or "tuning") single horizontal routing signal line (e.g., TX and RX line) impedance, such as to select (or "tune" the TX and RX lines to or at) the combination of signal line width W71/line spacing W72 to an optimized point to achieve the best channel performance as showed as the lowest cross point of EH or EW curves (e.g., such as shown in FIG. 9A).

According to embodiments, the impedance tuning of horizontal signal line 738 or 748 of device 750 includes various possible selections of one or a range of locations on X-Axis 930 selected based on or as a result of a calculation using EH and EW cross point 912 and/or point 917. It can be appreciated that such tuning may include selecting or identifying one or a range of width/spacing W71/W2 along axis 930 for one or both of signal lines 738 and 748, based on or as a result of a calculation using cross point 912 and/or point 917.

In some cases, such impedance tuning includes or is selecting the lowest amplitude cross point 912 of eye height (EH) curves 910-912 or of eye width (EW) curves 915-916 of an eye diagram produced by testing one of signal lines 738 or 748. Here, for example, as shown in FIG. 9A, X-axis 930 location I/J which is under point 912; or a location at midpoint between I/J and K/L which is under point 912 may be chosen for width W71 and spacing W72 for one or both of signal lines 738 and 748. In some cases, one of those locations may be used for both of signal lines 738 and 748. In some cases, a range of width W71 and spacing W72 around either of those locations (e.g., a W71 and W72 tolerance, such as 5 or 10 percent around either location) may be used for both of signal lines 738 and 748. In some cases, a range of width W71 and spacing W72 between those locations (e.g., a W71 and W72 tolerance within that range or any location within that range) may be used for both of signal lines 738 and 748.

According to some embodiments, the impedance tuning includes or is selecting the lowest amplitude cross point 912 and point 917 produced by testing one of signal lines 738 or 748. Here, for example, as shown in FIG. 9A, an X-axis 930 location between (e.g., midpoint between, and average of, or another statistical calculation between) I/J which is under point 912 and a midpoint between I/J and K/L which is under point 912 may be chosen for width W71 and spacing W72 for one or both of signal lines 738 and 748. In some cases, the location between may be used for both of signal lines 738 and 748. In some cases, a range of width W71 and spacing W72 around the location between (e.g., a W71 and W72 tolerance, such as 5 or 10 percent around either location) may be used for both of signal lines 738 and 748. It can be appreciated that various other appropriate locations may be selected based on cross points 912 and 917.

It can be appreciated that such tuning as noted above may be for or represent tuning of a single one of, all of a level of, or all of lines 738 or 748 of device 750. It can be appreciated that such tuning as noted above may be represent by curves different than the convex curves 910-911 and 915-916 shown in FIG. 9A, such as where the selected width W71/ spacing W72 along axis 930 is selected to be at the highest point of the different curve along the vertical axis 920.

In some cases, this impedance tuning provides (e.g., by determining or identifying a range of or selected target width W71 and spacing W72 for both of signal lines 738 and 748): (1) the best channel performance for lines 738 and 748 (e.g., having length L7*p*; width W71; width W72 between the line and a horizontally adjacent horizontal data signal transmission line of device 750; and height H72 between the line and a vertically adjacent grounding plane of device 750), (2) electrical isolation of horizontal data signal transmission lines (e.g., signal lines 738 and 748) that are single line impedance tuned in the routing segment of device 750 along the channel (e.g., signal lines 738 or 748 along length L7*p*), and (3) minimized impedance discontinuity and crosstalk between vertically adjacent and horizontally adjacent ones of signal lines 738 or 748 of device 750.

In some cases, the tuning above includes separately tuning lines 738 and 748 of interposer 706, patch 704 and package 710. In some cases, it includes separately tuning lines 738 and 748 of interposer 706 and patch 704 or package 710. In some cases, the tuning above includes tuning lines 738 and 748 of interposer 706 are tuned, but the signal lines of patch 704 and package 710 are not. In some cases, the width W71 and spacing W72 of lines 738 and 748 of interposer 706 are determined by tuning as noted above; and the width W71 and spacing W72 of patch 704 and package 710 are determined based on other factors, or design parameters that do not include the tuning noted above.

Figure 10:
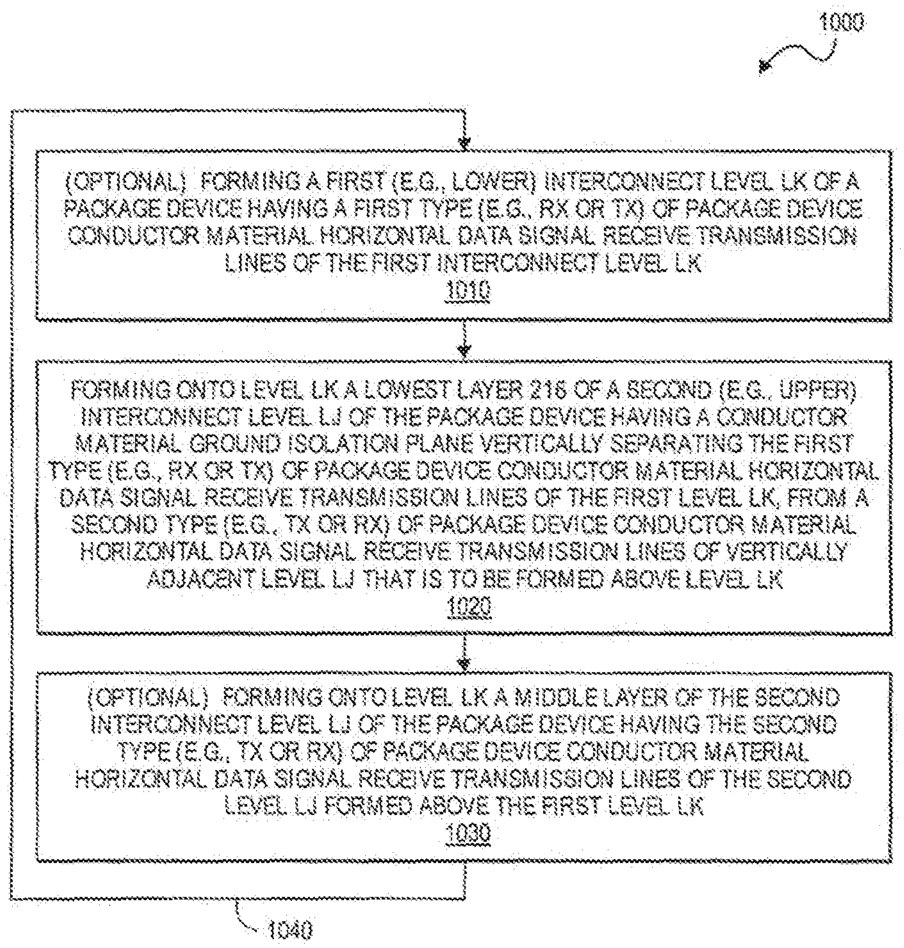
FIG. 10 is a flow chart illustrating a process for forming a ground isolated horizontal data signal transmission line package device, according to embodiments described herein.

FIG. 10 is a flow chart illustrating a process for forming a ground isolated horizontal data signal transmission line package device, according to embodiments described herein. FIG. 10 shows process 1000 which may be a process for forming embodiments described herein of package 750 of any of FIGS. 1-3. It may also be a process for forming certain levels or layers of FIGS. 5-12 as noted further below. In some cases, process 1000 is a process for forming a ground isolated horizontal data signal transmission line package device that has ground isolation planes separating horizontal data signal receive and transmit layers or levels (e.g., interconnect levels). Each level may have an upper layer of non-conductive (e.g., dielectric) material; a middle layer having conductor material (e.g., pure conductor or metal) data signal lines (e.g., traces) between non-conductive (e.g., dielectric) material portions; a lower layer of non-conductive (e.g., dielectric) material; and a lowest level ground isolation plane of conductor material (e.g., pure conductor or metal).

Process 1000 begins at optional block 1010 at which a first (e.g., lower) interconnect level Lk of a package device is formed, having a first type (e.g., RX or TX) of package device conductor material horizontal data signal transmission lines (e.g., a first type of data signal lines or traces, such as RX or TX data signal lines disposed between package device non-conductive material portions) of the first interconnect level Lk.

In some cases, block 1010 may only include forming middle layer 822 of level Lk with first type of data TX signal 748 lines disposed horizontally between dielectric material portions 703*e*; and forming upper layer 820 of or having dielectric material onto layer 822. In some cases, block 1010 includes first forming lowest layer 826, then layer forming lower layer 824 onto layer 826, then forming middle layer 822 (e.g., as noted above) onto layer 824 (and then forming upper layer 820 onto layer 822 as noted above).

A first example embodiment of block 1010 may include (e.g., prior to forming the upper layer 820), forming a mask (e.g., dry film resist (DFR), not shown) over a top surface of a lower layer 824 (e.g., of ajinomoto build up films (ABF)), the mask having (1) first openings over layer 824 in which to form the first type of data TX signal 748 lines of layer 822. In some cases, the first openings may be horizontally open to and in communication with different, second openings in the mask over layer 824 in which data TX signal contacts or data TX signal via contacts will be formed. Some of these cases may include electroless plating of a seed layer of the conductor material over layer 824, prior to forming the masks layer. In this case, block 1010 may then include simultaneously forming conductive material (e.g., plating on the exposed seed layer of the openings) to form the data TX signal 748 lines of layer 822 in the first openings (and optionally the data TX signal or data TX signal via contacts in the second openings of layer 822).

In some of these cases, simultaneously forming the conductive material may include forming that conductive material of all of data TX signal 748 lines of layer 822 (and optionally all of the data TX signal or data TX signal via contacts in the second openings of layer 822) during the same process, plating, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask (e.g., DFR) is removed. This removal may also include removing the seed layer from between the openings. Then dielectric material 703*e* (e.g., ajinomoto build up films (ABF)) may be deposited where the mask was removed. In some cases, forming the mask includes forming a blanket layer of mask material and etching the blanket layer to form the first (and optionally second) openings.

Next, at block 7020 a lowest layer of a second (e.g., upper) level Lj of the package device is formed over or onto (e.g., touching) level Lk; level Lj having a conductor material (e.g., pure conductor or metal) ground isolation plane vertically separating the first type (e.g., RX or TX) of package device conductor material horizontal data signal transmission lines of the first level Lk, from a second type (e.g., TX or RX; the opposite of the first type RX or TX, respectively) of package device conductor material horizontal data signal transmission lines (e.g., a second type of data signal lines or traces, such as TX or RX data signal lines disposed between package device non-conductive material portions) of vertically adjacent level Lj that is to be formed above level Lk.

In some cases, block 7020 may only include forming lowest layer 816 of level Lj having a conductor material ground isolation plane 762 onto upper layer 820 of level Lk; and forming middle layer 812 of level Lj with second type of data RX signal 738 lines disposed horizontally between dielectric material portions 703*b*. In some cases, block 7020 includes first forming lowest layer 816 onto layer 820 (e.g., as noted above), then forming lower layer 814 onto layer 816, then forming middle layer 812 (e.g., as noted above) onto layer 814; and then forming upper layer 810 of or having dielectric material onto layer 812.

A first example embodiment of block 1020 may include (e.g., prior to forming the middle layer 812), forming a mask (e.g., DFR, not shown) over a top surface of upper layer 820 (e.g., of ajinomoto build up film (ABF)) of level Lk, the mask having (1) a first opening over layer 820 in which to form isolation plane 762 of layer 816. In some cases, the first opening may be horizontally open to and in communication with different, second openings in the mask over layer 820 in which ground contacts or ground vial contacts will be formed. Some of these cases may include electroless plating of a seed layer of the conductor material over layer 820, prior to forming the masks layer.

In this case, block 1020 may then include simultaneously forming conductive material (e.g., plating on the exposed seed layer of the openings) to form the isolation plane 762 of layer 816 in the first openings (and optionally the ground contacts or ground vial contacts in the second openings of layer 816).

In some of these cases, simultaneously forming the conductive material may include forming that conductive material of all of isolation plane 762 of layer 816 (and optionally all of the ground contacts or ground vial contacts in the second openings of layer 816) during the same process, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask (e.g., DFR) is removed. This removal may also include removing the seed layer from between the openings. Then dielectric material (e.g., ajinomoto build up film (ABF)) may be deposited where the mask was removed. In some cases, forming the mask includes forming a blanket layer of mask material and etching the blanket layer to form the first (and optionally second) openings.

Next, at optional block 1030 a layer of the second interconnect level Lj of the package device is formed over or onto (e.g., touching) level Lk; level Lj having the second type (e.g., TX or RX; the opposite of the first type RX or TX, respectively) of package device conductor material horizontal data signal transmission lines (e.g., a second type of data signal lines or traces, such as TX or RX data signal lines disposed between package device non-conductive material portions) of level Lj formed above level Lk.

In some cases, block 1030 may only include forming middle layer 812 of level LJ with second type of data TX signal 748 lines disposed horizontally between dielectric material portions 703*b*; and forming upper layer 810 of or having dielectric material onto layer 812. In some cases, block 1030 includes first forming lowest layer 816, then layer forming lower layer 814 onto layer 816, then forming middle layer 812 (e.g., as noted above) onto layer 814 (and then forming upper layer 810 onto layer 812 as noted above).

A first example embodiment of block 1030 may include (e.g., prior to forming the upper layer 810), forming a mask (e.g., DFR, not shown) over a top surface of a lower layer 814 (e.g., of ajinomoto build up film (ABF)), the mask having (1) first openings over layer 814 in which to form the second type of data RX signal 738 lines of layer 812. In some cases, the first openings may be horizontally open to and in communication with different, second openings in the mask over layer 814 in which data RX signal contacts or data RX signal via contacts will be formed. Some of these cases may include electroless plating of a seed layer of the conductor material over layer 814, prior to forming the masks layer. In this case, block 1030 may then include simultaneously forming conductive material (e.g., plating on the exposed seed layer of the openings) to form the data RX signal 738 lines of layer 812 in the first openings (and optionally the data RX signal or data RX signal via contacts in the second openings of layer 812).

In some of these cases, simultaneously forming the conductive material may include forming that conductive material of all of data RX signal 738 lines of layer 812 (and optionally all of the data RX signal or data RX signal via contacts in the second openings of layer 812) during the same process, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask (e.g., DFR) is removed. This removal may also include removing the seed layer from between the openings. Then dielectric material 703*b* (e.g., of ajinomoto build up film (ABF)) may be deposited where the mask was removed. In some cases, forming the mask includes forming a blanket layer of mask material and etching the blanket layer to form the first (and optionally second) openings.

In some cases, deposition or growing of conductor material in blocks 1010, 1020 and 1030 may be by processes for forming package devices as noted further below. In some cases, deposition or growing of dielectric material in blocks 1010, 1020 and 1030 may be by processes for forming package devices as noted further below. It can be appreciated that the descriptions herein for blocks 1010, 1020 and 1030 may also include metal hot-press of ABF; pre-cure of ABF; CO2 or UV-YAG laser of ABF; drying of Cu seed layer; and/or flash etching and annealing of to full cure ABF as needed to perform the descriptions herein of blocks 1010, 1020 and 1030.

Next, at return arrow 1040, process 1000 may continue by returning to a second performance of optional block 1010 at which another "first" (e.g., lower) interconnect level of a package device is formed, having a first type (e.g., RX or TX) of package device conductor material horizontal data signal transmission lines. Then, process 1000 may proceed with a second performance of block 1020, and a second performance of optional block 1030. Process 1000 may continue this way until a predetermined or sufficient number of levels or return processes are completed to form a desired package device 750. In some cases, it may repeat 3 to 10 times.

Next, in a first example case of process 1000, block 1010 may only include forming layer 822 as described herein; block 1020 may only include forming layer 816 as described herein; and block 1030 may only include forming layer 812 as described herein. In a second example case, block 1010 may include forming layers 820, 822 and 824 as described herein; block 1020 may include forming layer 816 as described herein; and block 1030 may include forming layers 810, 812 and 814 as described herein.

In a third example case, block 1010 may include forming layer 832 as described herein; block 1020 may include forming layer 826 as described herein; and block 1030 may include forming layer 822 as described herein. In a fourth example case, block 1010 may include forming layers 830, 832 and 834 as described herein; block 1020 may include forming layer 826 as described herein; and block 1030 may include forming layers 820, 822 and 824 as described herein.

Some cases may include the first and third example cases above (e.g., the third followed by the first example case). Some cases may include the second and fourth example cases above (e.g., the fourth followed by the second example case).

It can be appreciated that although FIGS. 7-10 show and corresponding descriptions describe embodiments for level Lj having RX signal lines, level Lk having TX signal lines and level L1 having RX signal lines, the figures and descriptions also apply to embodiments where there are two layers of RX signals between planes 760 and 762; two layers of TX signals between planes 762 and 764; and two layers of RX signals between planes 764 and 766; etc.

For example, an embodiment of a process similar to process 1000 of FIG. 10 may include performing block 1010 twice before proceeding to block 1020, thus forming first (e.g., lower) interconnect level Lk of a package device having two layers of the first type (e.g., RX or TX) of package device conductor material horizontal data signal transmission lines (e.g., a first type of data signal lines or traces, such as RX or TX data signal lines disposed between package device non-conductive material portions) of the first interconnect level Lk. Then performing block 1020 to form the ground plane. Then performing block 1030 twice after block 1020, thus forming second (e.g., upper) interconnect level Lj of a package device having two layers of the second type (e.g., TX or RX; the opposite of the first type RX or TX, respectively) of package device conductor material horizontal data signal transmission lines (e.g., a first type of data signal lines or traces, such as TX or RX data signal lines disposed between package device non-conductive material portions) of the second interconnect level Lj.

In some cases, another embodiment of a process similar to process 1000 of FIG. 10 may include performing block 1010 three or four times; performing block 1020; then performing lock 1030 three or four times (e.g., the same number of times as block 1010).

Some cases, the above two embodiments of a process similar to process 1000 of FIG. 10 may include may include the first and third example cases of process 1000 above (e.g., the third followed by the first example case). Some cases may include the second and fourth example cases above (e.g., the fourth followed by the second example case).

It can be appreciated that although FIGS. 7-10 show and corresponding descriptions describe embodiments for level Lj having RX signal lines, level Lk having TX signal lines and level L1 having RX signal lines, the figures and descriptions also apply to embodiments where the order can be reversed such as for embodiments where level Lj has TX signal lines, level Lk has RX signal lines and level L1 has TX signal lines.

It can be appreciated that although FIGS. 7-10 show and corresponding descriptions describe embodiments for levels having RX signal lines and TX signal lines, the figures and descriptions also apply to embodiments where other types of information, clock, timing, alternating current (AC) or data signals can be on those signal lines.

In some cases, ground planes 760-766 are each electronically coupled to (e.g., touching, formed with, or directly attached to) ground contacts of device 750, such as ground contacts disposed in the same layer as each ground plane, respectively. They may also each extend as a flat plane disposed between all of the horizontal TX and RX signal contacts of the levels above and blow each ground plane, respectively. For example, in some cases, ground isolation plane 762 extends as a horizontal flat ground isolation plane of conductive material disposed in a vertical position between all of the horizontal RX signal lines of level Lj (including embodiments where there are 1, 2, 3, or 4 layers of RX signal lines) and all of the horizontal TX signal lines of level Lk (including embodiments where there are 1, 2, 3, or 4 layers of RX signal lines); and/or plane 764 extends as a horizontal flat ground isolation plane of conductive material disposed in a vertical position between all of the horizontal TX signal lines of level Lk (including embodiments where there are 1, 2, 3, or 4 layers of RX signal lines) and all of the horizontal RX signal lines of level L1 (including embodiments where there are 1, 2, 3, or 4 layers of RX signal lines).

In some cases, ground planes of package device 750 (e.g., planes 760-766) may each be a ground isolation plane or planar structure across a layer vertically between each horizontal data signal transmission line (e.g., RX or TX) of a one level and all data signal transmission lines of all levels above (or below) that ground plane (e.g., that one level), thus reducing (e.g., by a factor or 2, 3, 5 or 10 times) "data signal transmission line" crosstalk between each of the horizontal data signal transmission lines of the one level (e.g., an "agressor") and all data signal transmission lines of all levels above (or below) that ground plane (e.g., that one level).

For example, in some cases, ground isolation plane 762 extends as a horizontal flat ground isolation plane of conductive material disposed in a vertical position between all of the horizontal RX signal lines of level Lj (including embodiments where there are 1, 2, 3, or 4 layers of RX signal lines) and each of the horizontal TX signal lines of level Lk (including embodiments where there are 1, 2, 3, or 4 layers of TX signal lines), thus reducing "data signal transmission line" crosstalk produced or created by all of the horizontal RX signal lines of level Lj (e.g., "agressors") from reaching each of the horizontal TX signal lines of level Lk. Also, in some cases, ground isolation plane 764 extends as a horizontal flat ground isolation plane of conductive material disposed in a vertical position between all of the horizontal TX signal lines of level Lk (including embodiments where there are 1, 2, 3, or 4 layers of RX signal lines) and each of the horizontal RX signal lines of level L1 (including embodiments where there are 1, 2, 3, or 4 layers of RX signal lines), thus reducing "data signal transmission line" crosstalk produced or created by all of the horizontal TX signal lines of level Lk (e.g., "agressors") from reaching each of the horizontal RX signal lines of level L1.

For example, by being layers of conductive material electrically grounded (e.g., having a ground signal), each of ground isolation planes 762 and 764 (and optionally 760 and 762) extend as horizontal flat ground isolation planes of conductive material that may absorb, or shield electromagnetic crosstalk signals produced by one data signal transmission line of the vertically adjacent levels above (or below) the plane (e.g., an "agressor"), from reaching each of the data signal transmission line of the one level, due to the amount of grounded conductive material, and location of the conductive grounded material between the two levels. In some cases, each plane absorbing or shielding the electromagnetic crosstalk signals includes reducing electrical crosstalk caused by undesired capacitive, inductive, or conductive coupling of a first data signal type (e.g., RX or TX) received or transmitted through one of the horizontal data signal transmission lines of the vertically adjacent levels (e.g., an "agressor") from reaching (e.g., effecting or being mirrored in) a second data signal type (e.g., TX or RX; the opposite of the first type RX or TX, respectively) received or transmitted through each or any of the horizontal data signal transmission lines of the one level that the ground plane shields (e.g., where the plane is vetically between the vertically adjacent levels and the one level).

Such electrical crosstalk may include interference caused by two data signal types becoming partially superimposed on each other due to electromagnetic (inductive) or electrostatic (capacitive) coupling between the horizontal data signal transmission lines (e.g., conductive material) carrying the signals in vertically adjacent level (e.g., as noted above). Such electrical crosstalk may include where the magnetic field from changing current flow of a first horizontal data signal transmission line (e.g., an "agressor") induces current in a second horizontal data signal transmission line of another vertically adjacent level (e.g., as noted above). In some cases, the cross talk that is reduced is caused or dominated by mutual inductance and capacitance between the two signal lines.

In some embodiments, any or each of ground isolation plane 760, 762, 764 or 766 reduces electrical crosstalk as noted above (1) without increasing the distance or spacing W72 between the horizontal data signal transmission lines, and (2) without re-ordering any horizontal order or sequence of the horizontal data signal transmission lines in a layer or level.

In some cases, a ground isolated horizontal data signal transmission line package device has ground isolation lines surrounding horizontal data signal transmission lines (e.g., conductor material or metal signal traces) that are routed through the package device. The isolation lines may surround (e.g., vertically and horizontally separating) adjacent horizontal data signal receive (RX) and transmit (TX) signal lines of the package device layers or levels (e.g., interconnect levels).

More specifically, each level may have an upper layer of non-conductive (e.g., dielectric) material; and a lower layer having conductor material (e.g., pure conductor or metal) data signal lines (e.g., traces) between (1) horizontally adjacent non-conductive (e.g., dielectric) material portions that are between (2) horizontally adjacent ground isolation lines (e.g., traces) of conductor material (e.g., pure conductor or metal). One non-conductive material portion may be horizontally adjacent, to the outside of each data signal line; and one ground isolation line may be horizontally adjacent, to the outside of each of the non-conductive material portions. In other words, two ground isolation lines horizontally surround two non-conductive material portions that horizontally surround each data signal line. In some cases, the two ground isolation lines are described as horizontally surrounding (e.g., are horizontally to the left and right of) each data signal line.

Each level may also have horizontal (e.g., widthwise) staggered spacing of its lower layer conductor material data signal lines as compared to the ground isolation lines of a vertically adjacent level above it, so that its lower layer conductor material data signal lines are disposed directly below ground isolation lines of the vertically adjacent level above it. Here, the vertically adjacent non-conductive (e.g., dielectric) material upper layer of the level may vertically separate the lower layer conductor material data signal lines of the level from the ground isolation lines of the vertically adjacent level above it. Similarly, each level may also have staggered spacing of its lower layer conductor material data signal lines as compared to the ground isolation lines of a vertically adjacent level below it, so that its lower layer conductor material data signal lines are disposed directly above ground isolation lines of the vertically adjacent level below it. Here, the vertically adjacent non-conductive (e.g., dielectric) material upper layer of the vertically adjacent level below it may vertically separate the lower layer conductor material data signal lines of the level from the ground isolation lines of the vertically adjacent level below it. In other words, two ground isolation lines vertically surround two non-conductive material layers that vertically surround each data signal line. In some cases, the two ground isolation lines are described as vertically surrounding (e.g., are vertically above and below) each data signal line.

The combination of the two ground isolation lines are horizontally surrounding each data signal line; and the two ground isolation lines vertically surrounding each data signal line may be described as four ground isolation lines "coaxially" surrounding each data signal line.

The ground isolation lines horizontally, vertically or coaxially surrounding the horizontal data signal transmission lines may reduce crosstalk between and increase isolation of horizontally and vertically adjacent ones of the horizontal data signal transmission lines. In some cases, the isolation lines reduce crosstalk between vertically adjacent levels (e.g., between TX signal lines and RX signal lines in levels above and below each other), and decrease crosstalk between the horizontal data signal transmission lines that are horizontally adjacent to each other (e.g., in a single vertical level or layer of the device package). This embodiment of a ground isolated horizontal data signal transmission line package device may be described as a ground isolation "coaxial" line separated data signal package device (e.g., see device 1150).

Figure 11:
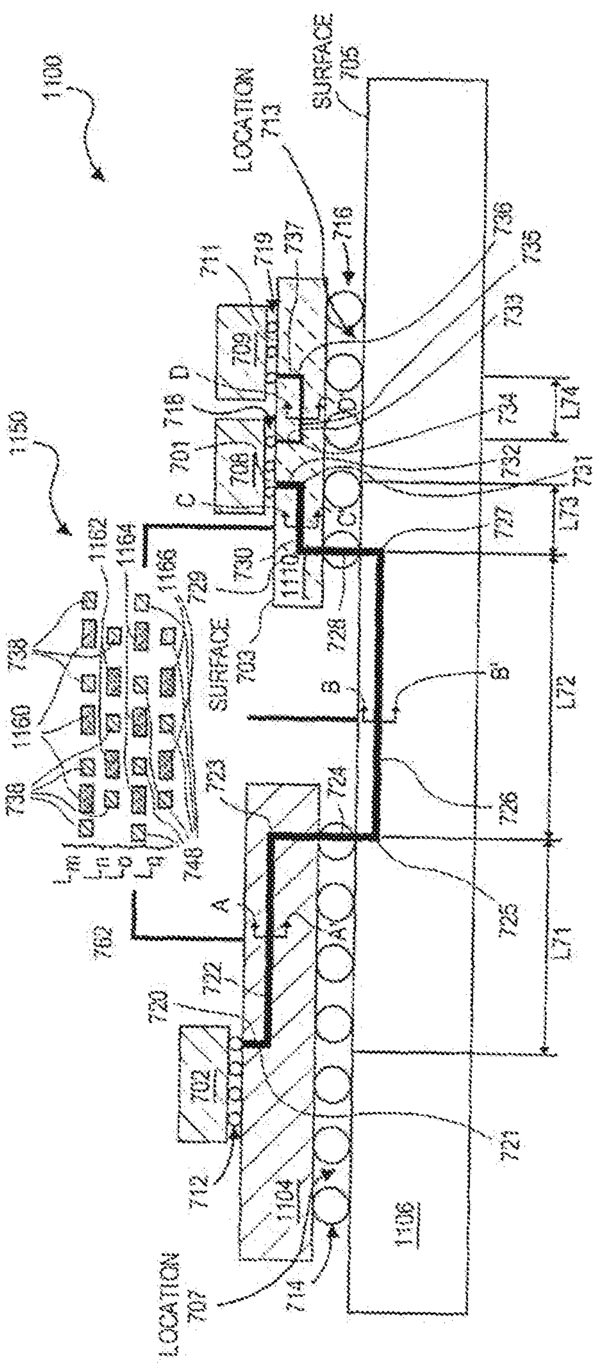
FIG. 11 is schematic cross-sectional side and length views of a computing system, including ground isolated horizontal data signal transmission line package devices.

FIG. 11 is schematic cross-sectional side and length views of a computing system, including ground isolated horizontal data signal transmission line package devices. FIG. 11 shows a schematic cross-sectional side view of computing system 1100, including ground isolated horizontal data signal transmission line package devices, such as patch 1104, interposer 1106 and package 1110. In some cases, system 1100 has CPU chip 702 mounted on patch 1104, which is mounted on interposer 1106 at first location 707. It also shows chip 708 mounted on package 1110 at first location 701; and chip 709 mounted on chip 1110 at second location 711. Package 1110 is mounted on interposer 1106 at second location 713. For example, a bottom surface of chip 702 is mounted on top surface 705 of patch 1104 using solder bumps or bump grid array (BGA) 712. A bottom surface of patch 1104 is mounted on top surface 705 of interposer 1106 at first location 707 using solder bumps or BGA 714. Also, a bottom surface of chip 708 is mounted on top surface 703 of package 1110 at first location 701 using solder bumps or BGA 718. A bottom surface of chip 709 is mounted on surface 703 of package 1110 at location 711 using solder bumps or BGA 719. A bottom surface of package 1110 is mounted on surface 705 of interposer 1106 at second location 713 using solder bumps or BGA 716.

In some cases the only difference between system 1100 and 700 is the difference between patch 1104 and 704; interposer 1106 and 106; and package 1110 and 110. In some cases the only difference between patch 1104 and 704; interposer 1106 and 106; and package 1110 and 110 is that patch 1104, interposer 1106, and package 1110 are or have ground isolation "coaxial" line separated data signal package device 1150 instead of ground isolation plane separated data signal package device 750. In other words, in some cases the only difference between patch 1104 and 704; interposer 1106 and 106; and package 1110 and 110 is that horizontal data signal transmission lines 722, 726, 730 and 735 are or have ground isolation "coaxial" line separated data signal package device 1150 in place of ground isolation plane separated data signal package device 750.

FIG. 11 also show vertical data signal transmission lines 720 originating in chip 702 and extending vertically downward through bumps 712 and into vertical levels of patch 1104, such as downward to levels Lm-Lq of patch 1104 at first horizontal location 721.

FIG. 11 also shows patch horizontal data signal transmission lines 722 originating at first horizontal location 721 in levels Lm-Lq of patch 1104 and extend horizontally through level Lm-Lq along length L71 of levels Lm-Lq to second horizontal location 723 in levels Lm-Lq of patch 1104.

Next, FIG. 11 shows vertical data signal transmission lines 724 originating in patch 1104 and extending vertically downward through bumps 714 and into vertical levels of interposer 1106, such as downward to levels Lm-Lq of interposer 1106 at first horizontal location 725.

FIG. 11 also shows interposer horizontal data signal transmission lines 726 originating at first horizontal location 725 in levels Lm-Lq of interposer 1106 and extend horizontally through levels Lm-Lq along length L72 of levels Lm-Lq to second horizontal location 727 in levels Lm-Lq of interposer 1106.

Next, FIG. 11 shows vertical data signal transmission lines 128 originating in interposer 1106, such as originating at levels Lm-Lq at second horizontal location 727 of interposer 1106 and extending vertically upward to levels Lm-Lq of package 1110 at first horizontal location 729 of package 1110.

FIG. 11 also shows package device horizontal data signal transmission lines 730 originating at first horizontal location 725 in levels Lm-Lq of package 1110 and extend horizontally through levels Lm-Lq along length L73 of levels Lm-Lq to second horizontal location 731 in levels Lm-Lq of package 1110.

Next, FIG. 11 shows vertical data signal transmission lines 732 originating in package 1110, such as originating at levels Lm-Lq at second horizontal location 731 of package 1110 and extending upward to and terminate at a bottom surface of chip 708.

FIG. 11 also show vertical data signal transmission lines 733 originating in chip 708 and extending vertically downward to levels Lm-Lq of package 1110 at first horizontal location 734 of package 1110.

FIG. 11 also shows package device horizontal data signal transmission lines 735 originating at third horizontal location 734 in levels Lm-Lq of package 1110 and extend horizontally through levels Lm-Lq along length L74 of levels Lm-Lq to second horizontal location 736 in levels Lm-Lq of package 1110.

Next, FIG. 11 shows vertical data signal transmission lines 737 originating in package 110, such as originating at levels Lm-Lq at fourth horizontal location 736 of package 1110, and extending upward to and terminate at a bottom surface of chip 709.

In some cases the data signal transmission signals of lines 720, 722, 724, 726, 128, 730, 732, 733, 735 and/or 737 are or include data signal transmission signals to an IC chip (e.g., chip 702, 708 or 709), patch 1104, interposer 1106, package 1110, or another device attached to thereto, such as described for FIG. 1.

In some cases, lines 720, 722 and 724 also include power and ground signal lines or traces, such as described for FIG. 7 (not shown) that also extend horizontally from location 721 to location 723 within levels Lm-Lq, or other levels of patch 1104.

In some cases, lines 724, 726 and 128 also include power and ground signal lines or traces, such as described for FIG. 7 (not shown) that also extend horizontally from location 725 to location 727 within levels Lm-Lq, or other levels of interposer 1106. In some cases the power and ground signals transmitted and received (or existing) on the power and ground signal lines of lines 720, 722, 724 and 726 originate at or are provided by patch 1104 or interposer 1106, or another device attached to thereto, such as described for FIG. 1.

In some cases, lines 128, 730 and 732 also include power and ground signal lines or traces, such as described for FIG. 7 (not shown) that also extend horizontally from location 729 to location 731 within levels Lm-Lq, or other levels of package 1104. In some cases the power and ground signals transmitted and received (or existing) on the power and ground signal lines of lines 128, 730 and 732 originate at or are provided by package 1110 or interposer 1106, or another device attached to thereto, such as described for FIG. 1.

In some cases, lines 733, 735 and 737 also include power and ground signal lines or traces, such as described for FIG. 7 (not shown) that also extend horizontally from location 734 to location 736 within levels Lm-Lq, or other levels of package 1104. In some cases the power and ground signals transmitted and received (or existing) on the power and ground signal lines of lines 733, 735 and 737 originate at or are provided by package 1110 or interposer 1106, or another device attached to thereto, such as described for FIG. 1.

FIG. 11 also shows a schematic cross-sectional length view of a ground isolated horizontal data signal transmission line package device. In this case, the package device is ground isolation "coaxial" line separated data signal package device 1150 (e.g., instead of ground isolation plane separated data signal package device 750 of FIG. 1). Device 1150 may be a "package device" representing any of patch 1104, interposer 1106 or package 1110. It can be appreciated that device 1150 may represent another package device having horizontal data transmission lines.

In some cases, package device 1150 represents horizontal data signal transmission lines 722 of patch 1104 through perspective A-A'; horizontal data signal transmission lines 726 of interposer 1106 through perspective B-B'; horizontal data signal transmission lines 730 of package 1110 through perspective C-C'; or horizontal data signal transmission lines 735 of package 1110 through perspective D-D', such as described for package device 750 and patch 704, interposer 706 or package 710.

In some cases, package device 1150 has package device ground isolation lines 1160 of level Lm vertically separating each of package device horizontal data signal receive transmission lines 738 (e.g., data signal RX 738) of level Ln from each of vertically adjacent (e.g., directly above; or above, parallel to, and having at least part of the width of the two transmission lines overlapping along length L71) horizontal data signal receive or transmit transmission line (e.g., data signal RX or TX lines) of a level or layer of the package device 1150 that is above level Lm. Lines 1160 of level Lm also separate each of the horizontal data signal lines of the level above level Lm from each of vertically adjacent (e.g., directly below; or below, parallel to, and having at least part of the width of the two transmission lines overlapping along length L71) horizontal data signal receive RX transmission lines 738 of level Ln.

In some cases, package device 1150 has package device ground isolation lines 1160 of level Lm horizontally separating each of package device horizontal data signal receive transmission lines 738 (e.g., data signal RX 738) of level Lm from each of horizontally adjacent (e.g., directly beside such as to the left and right; beside, parallel to, and having at least part of the height of the two transmission lines overlapping along height H73) horizontal data signal receive transmission lines 738 (e.g., data signal RX lines) of level Lm of package device 1150.

In some cases, package device 1150 has package device ground isolation lines 1162 of level Ln vertically separating each of package device horizontal data signal transmit transmission lines 748 (e.g., data signal TX 748) of level Lo from each of vertically adjacent (e.g., directly above; or above, parallel to, and having at least part of the width of the two transmission lines overlapping along length L71) horizontal data signal receive transmission line (e.g., data signal RX line) of level Lm of the package device 1150 that is above level Ln. Lines 1162 of level Ln also separate each horizontal data signal RX line 738 of level Lm from each of vertically adjacent (e.g., directly below; or below, parallel to, and having at least part of the width of the two transmission lines overlapping along length L71) horizontal data signal transmit TX transmission line 748 of level Lo below level Lm.

In some cases, package device 1150 has package device ground isolation lines 1162 of level Ln horizontally separating each of package device horizontal data signal receive transmission lines 738 (e.g., data signal RX 738) of level Ln from each of horizontally adjacent (e.g., directly beside such as to the left and right; beside, parallel to, and having at least part of the height of the two transmission lines overlapping along height H73) horizontal data signal receive transmission lines 738 (e.g., data signal RX lines) of level Ln of package device 1150.

In some cases, package device 1150 has package device ground isolation lines 1164 of level Lo vertically separating each of package device horizontal data signal transmit transmission lines 748 (e.g., data signal TX 748) of level Lq from each of vertically adjacent (e.g., directly above; or above, parallel to, and having at least part of the width of the two transmission lines overlapping along length L71) horizontal data signal receive transmission line (e.g., data signal RX line) of level Ln of the package device 1150 that is above level Lo. Lines 1164 of level Lo also separate each horizontal data signal RX line 738 of level Ln from each of vertically adjacent (e.g., directly below; or below, parallel to, and having at least part of the width of the two transmission lines overlapping along length L71) horizontal data signal transmit TX transmission line 748 of level Lq below level Ln.

In some cases, package device 1150 has package device ground isolation lines 1164 of level Lo horizontally separating each of package device horizontal data signal transmit transmission lines 748 (e.g., data signal TX 748) of level Lo from each of horizontally adjacent (e.g., directly beside such as to the left and right; beside, parallel to, and having at least part of the height of the two transmission lines overlapping along height H73) horizontal data signal transmit transmission lines 748 (e.g., data signal TX 748) of level Lo of package device 1150.

In some cases, package device 1150 has package device ground isolation lines 1166 of level Lq vertically separating each of package device horizontal data signal transmit transmission lines 748 (e.g., data signal TX 748) of level Lo from each of vertically adjacent (e.g., directly below; or below, parallel to, and having at least part of the width of the two transmission lines overlapping along length L71) horizontal data signal transmission line (e.g., data signal TX or RX line) of a level of the package device 1150 that is below level Lq. Lines 1166 of level Lq also separate each horizontal data signal (e.g., TX or RX) line of a level of device 1150 that is below level Lq from each of vertically adjacent (e.g., directly above; or above and having at least part of the width of the two transmission lines overlapping along length L71) horizontal data signal transmit TX transmission line 748 of level Lo above level Lq.

In some cases, package device 1150 has package device ground isolation lines 1166 of level Lq horizontally separating each of package device horizontal data signal transmit transmission lines 748 (e.g., data signal TX 748) of level Lq from each of horizontally adjacent (e.g., directly beside such as to the left and right; beside, parallel to, and having at least part of the height of the two transmission lines overlapping along height H73) horizontal data signal transmit transmission lines 748 (e.g., data signal TX 748) of level Lq of package device 1150.

Figure 12A:
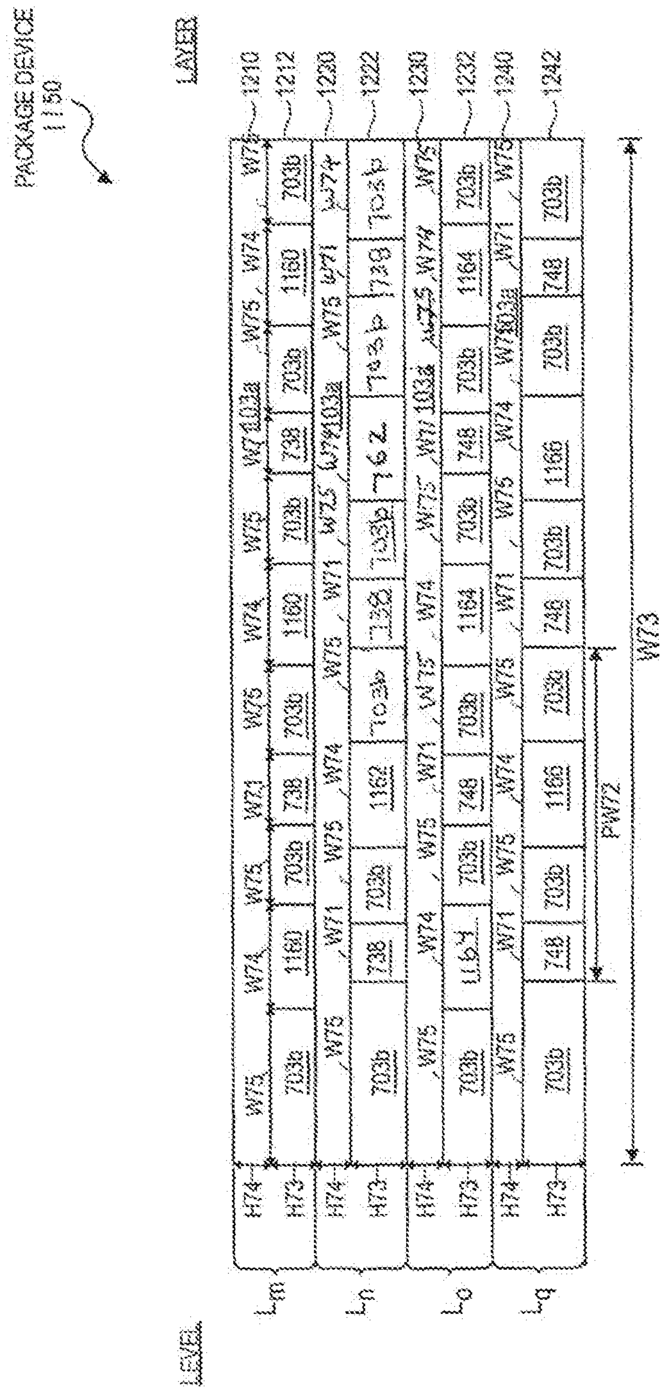
FIG. 12A is an exploded schematic cross-sectional length view of a ground isolated horizontal data signal transmission line package device of FIG. 11 showing ground isolation "coaxial" lines separating horizontal data signal receive and transmit lines.

FIG. 12A is an exploded schematic cross-sectional length view of a ground isolated horizontal data signal transmission line package device of FIG. 11 showing ground isolation “coaxial” lines separating horizontal data signal receive and transmit lines. FIG. 12A shows an exploded schematic cross-sectional length view of ground isolation “coaxial” line separated data signal package device 1150, such as a “package device” representing any of patch 1104 (e.g., a view through perspective A-A'), interposer 1106 (e.g., a view through perspective B-B') or package 1110 (e.g., a view through perspective C-C' or D-D"). Package device 1150 is shown having interconnect level Lm formed over or onto (e.g., touching) Level Ln which is formed over or onto Level Lo which is formed over or onto (e.g., touching) Level Lq. Each level may have an upper layer of non-conductive (e.g., dielectric) material; a middle layer having conductor material (e.g., pure conductor or metal) data signal lines (e.g., traces) that are coaxially surrounded by ground isolation lines (e.g., conductor material or metal signal traces) that are routed through the package device, parallel to the data signal lines. The isolation lines may surround (e.g., vertically and horizontally separate) vertically and horizontally adjacent horizontal data signal receive (RX) and/or transmit (TX) signal lines of the package device levels (e.g., interconnect levels).

More specifically, FIG. 12A shows package device 1150 having Level Lm with upper layer 1210 formed over or onto (e.g., touching) middle layer 1212 which is formed over or onto upper layer 1220 of level Ln.

Upper layer 1210 of level Lm may include (e.g., along with other materials that are beyond the edge of width W73) or be (e.g., within width W73) package device non-conductive material plane 703*a* separating layer 1212 of level Lm from a level or layer above layer 1210. Layer 1210 (e.g., plane 703*a*) may be formed onto (e.g., touching) or over lower layer 1212 of level Lm. Layer 1210 has height H74 and width W73. In some cases, height H74 is between 10 and 30 micrometers (um). In some cases, it is between 18 and 21 micrometers. It can be appreciated that height H74 may be an appropriate height of a dielectric material layer between the signal lines and vertically adjacent grounding isolation lines within a package device, that is less than or greater than those mentioned above.

Now, FIG. 12A shows lower layer 1212 of level Lm that includes (e.g., along with other materials that are beyond the edge of width W73) or is (e.g., within width W73) package device conductor material (e.g., pure conductor or metal) horizontal data signal receive transmission lines 738 (e.g., a first type of data signal lines or traces, such as RX data signal lines) disposed between (1) horizontally adjacent non-conductive (e.g., dielectric) material portions 703*b* that are between (2) horizontally adjacent ground isolation lines 1160 (e.g., traces) of conductor material (e.g., pure conductor or metal) disposed distal to each of lines 738. Layer 1212 separates upper layer 1210 from upper layer 1220 of level Ln. Layer 1212 (e.g., lines 738, portions 703*b*, and lines 1160) may be formed onto (e.g., touching) or over upper layer 1220 of level Ln. Layer 1212 has height H73 and width W73.

Horizontal data signal receive transmission lines 738 are shown having height H73 and width W71 (a width between horizontally adjacent portions 703*b*). Non-conductive material portions 703*b* are shown having height H73 and width W75 (a width between horizontally adjacent lines 738). Horizontal ground isolation lines 1160 are shown having height H73 and width W74 (a width between horizontally adjacent portions 703*b*).

In some cases, width W75 may be between 5 and 50 um. In some cases, width W75 may be between 10 and 40 um. In some cases, width W75 may be between 20 and 35 um. It can be appreciated that width W72 may be an appropriate width of a non-conductive material between a horizontally adjacent data signal receive or transmit line and a horizontal ground isolation line within a package device, that is less than or greater than those mentioned above. In some cases, the size of width of the manufacturing or processing pitch between same edges (or centers of width W71) of horizontally adjacent data signal lines of device 1150 (and device 1550) is pitch PW2. PW2 may be equal to the sum of widths W71+2×W5+W74.

It can be appreciated that in some cases, height H73 may be an appropriate height of a ground isolation line within a package device, that is less than or greater than those mentioned above. In some cases, height H73 is the same as height H71.

In some cases, width W74 is between 30 and 235 um. In some cases, width W74 is between 50 and 150 micrometers (um). In some cases, it is between 80 and 135 micrometers. It can be appreciated that width W74 may be an appropriate width of a ground isolation line within a package device, that is less than or greater than those mentioned above.

Lines 1160 may be directly physically connected to (e.g., formed in contact with), electrically coupled to, or directly attached to (e.g., touching) ground contacts or via contacts in the same layer 1212 or level Lm as lines 1160. In some cases, lines 1160 are or include ground signals from patch 1104, interposer 1106, package 1110, or another device attached to thereto. In some cases, a ground signal transmitted (or existing) on ground lines 1160 originates at or is provided by patch 1104, interposer 1106 or package 1110. In some cases, the ground signal may be generated by ground circuits, transistors or other components of or attached (e.g., such as from a motherboard or power supply electrically connected) to patch 1104, interposer 1106 or package 1110. In some cases this ground signal is a zero voltage direct current (DC) grounding signal (e.g., GND). In some cases the ground signal has a voltage of between 0.0 and 0.2 volts.

In some cases it is a different but grounding voltage level for providing electrical ground signals through (or within) a package device or IC chip.

Layer 1212 may be formed onto (e.g., touching) or over layer 1220 of level Ln. Layer 1220 has height H74 and width W73 (e.g., as noted above for layer 1210).

Level Ln is shown having upper layer 1220 formed over or onto (e.g., touching) lower layer 1222 which is formed over or onto upper layer 1230 of level Lo.

Level Ln may be similar to level Lm except that is has ground isolation lines 1162 instead of lines 1160; and layer 1222 is horizontally offset (e.g., moved) along width W73 from (e.g., with respect to) layer 1212 by a width equal to (½×W4 plus W75 plus ½×W2) or equal to a width that causes each of lines 1162 of layer 1222 to be centered directly under each of lines 738 of layer 1212.

Lines 1162 may be directly physically connected to (e.g., formed in contact with), electrically coupled to, or directly attached to (e.g., touching) ground contacts or via contacts in the same layer 1222 or level Ln as lines 1162. In some cases the ground lines 1162 are or include ground signals from patch 1104, interposer 1106, package 1110, or another device attached to thereto, as described for lines 1160. In some cases this ground signal is a zero voltage direct current (DC) grounding signal (e.g., GND) or has a voltage, as described for lines 1160.

Layer 1222 may be formed onto (e.g., touching) or over layer 1230 of level Lo. Layer 1230 has height H74 and width W73 (e.g., as noted above for layer 1210).

Level Lo is shown having upper layer 1230 formed over or onto (e.g., touching) lower layer 1232 which is formed over or onto upper layer 1240 of level Lq.

Level Lo may be similar to level Lm except that is has ground isolation lines 1164 instead of lines 1160; and has data signal transmit TX lines 748 instead of RX lines 738. Layer 1232 is horizontally offset (e.g., moved) along width W73 from (e.g., with respect to) layer 1222 by a width equal to (½×W4 plus W73 plus ½×W2) or equal to a width that causes each of lines 1164 of layer 1232 to be centered directly under each of lines 738 of layer 1222.

Lines 1164 may be directly physically connected to (e.g., formed in contact with), electrically coupled to, or directly attached to (e.g., touching) ground contacts or via contacts in the same layer 1232 or level Lo as lines 1164. In some cases the ground lines 1164 are or include ground signals from patch 1104, interposer 1106, package 1110, or another device attached to thereto, as described for lines 1160. In some cases this ground signal is a zero voltage direct current (DC) grounding signal (e.g., GND) or has a voltage, as described for lines 1160.

Layer 1232 may be formed onto (e.g., touching) or over layer 1240 of level Lq. Layer 1240 has height H74 and width W73 (e.g., as noted above for layer 1210).

Level Lq is shown having upper layer 1240 formed over or onto (e.g., touching) lower layer 1242 which may be formed over or onto an upper layer of a level below level Lq.

Level Lq may be similar to level Ln except that is has ground isolation lines 1166 instead of lines 1160; and has data signal transmit TX lines 748 instead of RX lines 738. Layer 1242 is horizontally offset (e.g., moved) along width W73 from (e.g., with respect to) layer 1232 by a width equal to (½×W4 plus W73 plus ½×W2) or equal to a width that causes each of lines 1166 of layer 1242 to be centered directly under each of lines 748 of layer 1232.

Lines 1166 may be directly physically connected to (e.g., formed in contact with), electrically coupled to, or directly attached to (e.g., touching) ground contacts or via contacts in the same layer 1242 or level Lq as lines 1166. In some cases the ground lines 1166 are or include ground signals from patch 1104, interposer 1106, package 1110, or another device attached to thereto, as described for lines 1160. In some cases this ground signal is a zero voltage direct current (DC) grounding signal (e.g., GND) or has a voltage, as described for lines 1160.

Figure 12B:
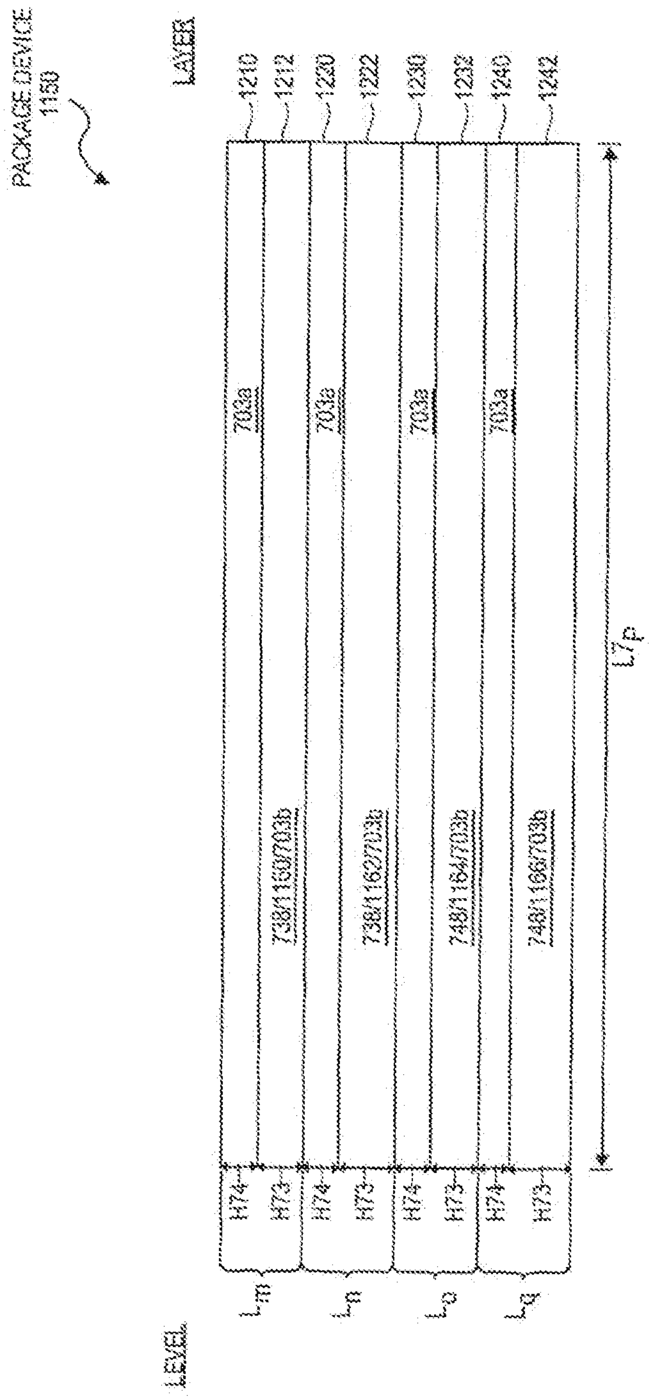
FIG. 12B is an exploded schematic cross-sectional side view of a ground isolated horizontal data signal transmission line package device of FIGS. 11 and 12A showing ground isolation "coaxial" lines separating horizontal data signal receive and transmit lines.

FIG. 12B is an exploded schematic cross-sectional side view of a ground isolated horizontal data signal transmission line package device of FIGS. 11 and 12A showing ground isolation "coaxial" lines separating horizontal data signal receive and transmit lines. FIG. 12B shows an exploded schematic cross-sectional side view of ground isolation "coaxial" line separated data signal package device 1150 of FIGS. 11 and 12A such as a "package device" representing any of patch 1104 (e.g., along length L71), interposer 1106 (e.g., along length L72) or package 1110 (e.g., along length L73 and/or L74). Package device 1150 is shown having interconnect levels Lm, Ln, Lo and Lq (e.g., see FIG. 12A).

More specifically, FIG. 12B shows package device 1150 having levels Lm-Lq and layers 1210-1242 along length L7*p*. Length L7*p* may represent any of lengths L71, L72, L73 or L74. In some cases, levels Lm-Lq and layers 1210-1242 in FIG. 12B may include (e.g., along with other materials that are beyond the edge of length L7*p*) or are (e.g., within length L7*p*) the same as in the descriptions above for levels Lm-Lq and layers 1210-1242 in FIGS. 5 and 6A, respectively.

FIG. 12B shows layer 1212 that may include (e.g., along with other materials that are beyond the edge of length L7*p*) or be (e.g., within length L7*p*) lines 738, lines 1160 and portions 703*b*. For example, layer 1212 is shown having "738/1160/703*b*" which may represent lines 738, lines 1160, and/or portions 703*b* extending along length L7*p*. FIG. 12B shows layer 1222 that may include (e.g., along with other materials that are beyond the edge of length L7*p*) or be (e.g., within length L7*p*) lines 738, lines 1162 and portions 703*b*. FIG. 12B shows layer 1232 that may include (e.g., along with other materials that are beyond the edge of length L7*p*) or be (e.g., within length L7*p*) lines 748, lines 1164 and portions 703*b*. FIG. 12B shows layer 1242 that may include (e.g., along with other materials that are beyond the edge of length L7*p*) or be (e.g., within length L7*p*) lines 748, lines 1166 and portions 703*b*. In some cases, ground isolation lines 1160, 1162, 1164 or 1166 are each electronically coupled to (e.g., touching, formed with, or directly attached to) ground contacts of device 1150, such as ground contacts disposed in the same layer as each ground plane, respectively.

The embodiments of a ground isolated horizontal data signal transmission line package device 1150 may be described as a ground isolation "coaxial" line separated data signal package device 1150. The ground isolation lines 1160, 1162, 1164 or 1166 horizontally, vertically and coaxially surrounding the horizontal data signal transmission lines 738 RX or 748 TX in each of levels Lm-Lq may (1) reduce crosstalk between vertically adjacent ones of the horizontal data signal transmission lines 738 RX or 748 TX of different levels of levels Lm-Lq; and (2) increase electronic isolation of horizontally adjacent ones of the horizontal data signal transmission lines 738 RX or 748 TX in each of same level of levels Lm-Lq.

More specifically, FIGS. 5-6B show that each of levels Lm-Lq may have an upper layer of non-conductive (e.g., dielectric) material 703*a*; and a lower layer having conductor material (e.g., pure conductor or metal) data signal lines (e.g., traces) 738 RX or 748 TX between (1) horizontally adjacent non-conductive (e.g., dielectric) material portions 703*b* that are between (2) horizontally adjacent ground isolation lines 1160, 1162, 1164 or 1166 (e.g., traces) of conductor material (e.g., pure conductor or metal). One non-conductive material portion 703*b* may be horizontally adjacent, to the outside of each data signal 738 RX or 748 TX line (e.g., neighboring, bordering, adjoining, or flanking each data signal line); and one ground isolation line 1160, 1162, 1164 or 1166 may be horizontally adjacent, to the outside of each of the non-conductive material portions 703*b* (e.g., neighboring, bordering, adjoining, or flanking the side of each non-conductive material portion at is disposed away from or distal to the data signal line) in each of levels Lm-Lq. In other words, two ground isolation lines (e.g., two of each of lines 1160, 1162, 1164 or 1166) horizontally surround (e.g., are horizontally to the left and right of) two non-conductive material portions 703*b* that horizontally surround (e.g., are horizontally to the left and right of) each data signal line 738 RX or 748 TX in each of levels Lm-Lq. In some cases, the two ground isolation lines (e.g., two of each of lines 1160, 1162, 1164 or 1166) are described as horizontally surrounding (e.g., are horizontally to the left and right of) each data signal line 738 RX or 748 TX in each of levels Lm-Lq.

In some cases, each date signal RX line of level Ln (e.g., layer 1222) can be said to be horizontally surrounded by two ground isolation lines 1162 of level Ln (e.g., layer 1222). Also, in some cases, each date signal TX line of level Lo (e.g., layer 1232) can be said to be horizontally surrounded by two ground isolation lines 1164 of level Lo (e.g., layer 1232).

In some cases, ground lines of package device 1150 (e.g., lines 1160, 1162, 1164 and 1166) may reduce (e.g., mitigate or decrease) (e.g., by a factor or 2, 3, 5 or 10 times) "data signal transmission line" crosstalk (and optionally may increase electronic isolation by the same factor) between one of the horizontal data signal transmission lines of one level (e.g., an "agressor" of level Lm, Ln, Lo or Lq) and a horizontally adjacent data same type (e.g., RX or TX) signal transmission line of the same level (e.g., that one level Lm, Ln, Lo or Lq).

For example, in some cases, ground isolation lines 1160 of package device 1150 may decrease (e.g., by a factor or 2, 3, 5 or 10 times) "data signal transmission line" horizontal electronic crosstalk (and optionally may increase electronic isolation by the same factor) caused or produced at one RX data signal transmission line 738 of level Lm (e.g., of layer 1212) by two "agressor" horizontal RX data signal transmission lines 738 of the same level Lm (e.g., of layer 1212) that are disposed horizontally adjacent to (e.g., to the left and right of) the one RX data signal line. Such a decrease in crosstalk may represent or mitigate this crosstalk to a minimum acceptable crosstalk value between the horizontally adjacent RX or TX data signal lines. This may occur for each of the horizontal RX data signal lines in level Lm. It can be appreciated that ground isolation lines 1162 can cause the same horizontal electronic crosstalk decrease (and optionally isolation increase) to occur for each of the RX data signal lines in level Ln. In some cases, ground isolation lines 1164 can cause the same horizontal electronic crosstalk decrease (and optionally isolation increase) to occur for each of the TX data signal lines in level Lo. In some cases, ground isolation lines 1166 can cause the same horizontal electronic crosstalk decrease (and optionally isolation increase) to occur for each of the TX data signal lines in level Lq.

Each level of levels Lo-Lq of FIGS. 5-6B may also have staggered horizontal (e.g., lateral) spacing of its lower layer conductor material data signal lines 738 RX or 748 TX as compared to ground isolation lines 1160, 1162, 1164 or 1166 of a vertically adjacent level above it so that its lower layer conductor material data signal lines 738 RX or 748 TX are disposed directly below ground isolation lines 1160, 1162, 1164 or 1166 of the vertically adjacent level above it. Here, the vertically adjacent non-conductive (e.g., dielectric) material layer 703*a* of the upper layer of each level Lo-Lq may separate (e.g., be disposed vertically between) the lower layer conductor material data signal lines 738 RX or 748 TX of the level from the ground isolation lines 1160, 1162, 1164 or 1166 of the vertically adjacent level above it. Similarly, each level Lo-Lq may also have staggered horizontal spacing of its lower layer conductor material data signal lines 738 RX or 748 TX as compared to ground isolation lines 1160, 1162, 1164 or 1166 of a vertically adjacent level below it, so that its lower layer conductor material data signal lines 738 RX or 748 TX are disposed directly above ground isolation lines 1160, 1162, 1164 or 1166 of the vertically adjacent level below it. Here, the vertically adjacent non-conductive (e.g., dielectric) material layer 703*a* of the vertically adjacent level below it may separate (e.g., be disposed vertically between) the lower layer conductor material data signal lines 738 RX or 748 TX of the level from the ground isolation lines 1160, 1162, 1164 or 1166 of the vertically adjacent level below it. In other words, two ground isolation lines (e.g., a pair of 1160 and 1164; or 1162 and 1166) vertically surround (e.g., are vertically to the top and bottom of) two non-conductive material layers 703*a* that vertically surround (e.g., are vertically to the top and bottom of) each data signal line RX or 748 TX. In some cases, the two ground isolation lines (e.g., a pair of 1160 and 1164; or 1162 and 1166) are described as vertically surrounding (e.g., are vertically above and below) each data signal line 738 RX or 748 TX in each of levels Lm-Lq.

In some cases, each date signal RX line of level Ln (e.g., layer 1222) can be said to be vertically surrounded by ground isolation line 1160 of level Lm (e.g., layer 1212) and line 1164 of level Lo (e.g., layer 1232). Also, in some cases, each date signal TX line of level Lo (e.g., layer 1232) can be said to be vertically surrounded by ground isolation line 1162 of level Ln (e.g., layer 1222) and line 1166 of level Lq (e.g., layer 1242).

In some cases, ground lines of package device 1150 (e.g., lines 1160, 1162, 1164 and 1166) may reduce (e.g., mitigate or decrease) (e.g., by a factor or 2, 3, 5 or 10 times) "data signal transmission line" crosstalk (and optionally may increase isolation) between one of the horizontal data signal transmission lines of one level (e.g., an "agressor" of level Lm, Ln, Lo or Lq) and a vertically adjacent data signal transmission line of a level two levels above or below the one transmission line (e.g., two levels above or below the agressor level Lm, Ln, Lo or Lq).

For example, in some cases, each ground isolation line 1162 of package device 1150 may reduce (e.g., by a factor or 2, 3, 5 or 10 times) "data signal transmission line" vertical crosstalk (and optionally may increase isolation) produced or created by an "agressor" horizontal RX data signal transmission line 738 of level Lm (e.g., of layer 1212) from reaching a vertically adjacent TX data signal transmission line of level Lo (e.g., of layer 1232) that is disposed two levels below the "agressor" RX line of level Lm (e.g., of layer 1212), such as due to line 1162 being disposed vertially between the signal transmisstion lines of levels Lm and Lo. This may occur for each of the horizontal TX data signal lines in level Lo, such as where each of ground lines 1162 reduces horizontal crosstalk (and optionally may increase isolation) produced or created by each "agressor" horizontal RX data signal transmission line 738 of level Lm from reaching each vertically adjacent TX data signal transmission line of level Lo that is disposed two levels below the "agressor" RX line of level Lm. It is considered that lines 1162 cause the same reduction in vertical crosstalk caused by the TX lines of level Lo from reaching the a vertically adjacent RX lines of level Lm.

Similarly, in some cases, each ground isolation line 1164 of package device 1150 may reduce (e.g., by a factor or 2, 3, 5 or 10 times) "data signal transmission line" vertical crosstalk (and optionally may increase isolation) produced or created by an "agressor" horizontal TX data signal transmission line 748 of level Lq (e.g., of layer 1242) from reaching a vertically adjacent RX data signal transmission line of level Ln (e.g., of layer 1222) that is disposed two levels above the "agressor" TX line of level Lq (e.g., of layer 1242), such as due to line 1164 being disposed vertically between the signal transmission lines of levels Lq and Ln. This may occur for each of the horizontal RX data signal lines in level Ln, such as where each of ground lines 1164 reduces horizontal crosstalk (and optionally may increase isolation) produced or created by each "agressor" horizontal TX data signal transmission line 748 of level Lq from reaching each vertically adjacent RX data signal transmission line of level Ln that is disposed two levels above the "agressor" TX line of level Lq. It is considered that lines 1164 cause the same reduction in vertical crosstalk caused by the RX lines of level Ln from reaching the a vertically adjacent TX lines of level Lq.

It can be appreciated that ground isolation lines 1160 can cause the same vertical crosstalk reduction (and optionally isolation increase) to occur for each of the RX data signal lines in level Ln as compared to a level 2 levels above level Ln. In some cases, ground isolation lines 1166 can cause the same vertical crosstalk reduction (and optionally isolation increase) to occur for each of the TX data signal lines in level Lo as compared to a level 2 levels below level Lo.

For example, by being lines of conductive material electrically grounded (e.g., having a ground signal), each of ground isolation lines 1160-1166 may absorb, or shield electromagnetic crosstalk signals produced by (or increasing electronic isolation from) one data signal transmission line of the vertically adjacent levels two levels above (or below) the lines, from reaching each of the data signal transmission line of the one level, due to the amount of grounded conductive material, and location of the conductive grounded material between the two levels. This may include reducing electrical crosstalk caused by undesired capacitive, inductive, or conductive coupling of a first data signal type (e.g., RX or TX) received or transmitted through one of the horizontal data signal transmission lines of the vertically adjacent levels (e.g., an "agressor") from reaching (e.g., effecting or being mirrored in) a second data signal type (e.g., TX or RX; the opposite of the first type RX or TX, respectively) received or transmitted through the horizontal data signal transmission lines of the one level that the ground lines shields.

The combination of the two ground isolation lines (e.g., two of each of lines 1160, 1162, 1164 or 1166) horizontally surrounding each data signal line 738 RX or 748 TX in each of levels Lm-Lq; and the two ground isolation lines (e.g., a pair of 1160 and 1164; or 1162 and 1166) vertically surrounding each data signal line 738 RX or 748 TX in each of levels Lm-Lq may be described as four ground isolation lines "coaxially" surrounding each data signal line 738 RX or 748 TX in each of levels Lm-Lq. In some cases, each date signal RX line of level Ln (e.g., layer 1222) can be said to be coaxially surrounded by being (1) horizontally surrounded by two ground isolation lines 1162 of level Ln (e.g., layer 1222), and (2) vertically surrounded by one of ground isolation lines 1160 of level Lm (e.g., layer 1212) and one of lines 1164 of level Lo (e.g., layer 1232). Also, in some cases, each date signal TX line of level Lo (e.g., layer 1232) can be said to be coaxially surrounded by being (1) horizontally surrounded by two ground isolation lines 1164 of level Lo (e.g., layer 1232), and (2) vertically surrounded by one of ground isolation lines 1162 of level Ln (e.g., layer 1222) and one of lines 1166 of level Lq (e.g., layer 1242).

In some cases, the four ground isolation lines "coaxially" surrounding each horizontal data signal line 738 RX or 748 TX in each of levels Lm-Lq provides or causes (1) the two ground isolation lines (e.g., two of each of lines 1160, 1162, 1164 or 1166) horizontally surrounding each data signal line 738 RX or 748 TX in each of levels Lm-Lq to decrease (e.g., by a factor or 2, 3, 5 or 10 times) "data signal transmission line" electronic crosstalk (and optionally may increase electronic isolation) between each of the horizontal data signal transmission lines of one level (e.g., level Lm, Ln, Lo or Lq) and a horizontally adjacent data same type (e.g., RX or TX) signal transmission line of the same level (e.g., that one level Lm, Ln, Lo or Lq); and (2) the two ground isolation lines (e.g., a pair of 1160 and 1164; or 1162 and 1166) vertically surrounding each data signal line 738 RX or 748 TX in each of levels Lm-Lq to decrease (e.g., by a factor or 2, 3, 5 or 10 times) "data signal transmission line" crosstalk (and optionally may increase isolation) between one of the horizontal data signal transmission lines of one level (e.g., an "agressor" of level Lm, Ln, Lo or Lq) and a vertically adjacent data signal transmission line of a level two levels above or below the one transmission line (e.g., two levels above or below the agressor level Lm, Ln, Lo or Lq). In some embodiments, ground isolation lines 1160-1166 reduce electrical crosstalk and increase electrical isolation as noted above without re-ordering any horizontal order or sequence of the horizontal data signal transmission lines in a layer or level.

It is noted that there are four isolation lines surrounding each date signal RX line of level Ln (e.g., layer 1222) in a "diamond" shape but no diagonally adjacent ground isolation line for that RX line. This may be due to diagonal spacing (e.g., by a predetermined, tuning determined, selected or otherwise designed distance) the RX and TX lines of the different levels sufficiently so that crosstalk is reduced enough (and optionally electronic isolation is increased enough) for the data signal lines to operate at the speeds and other characteristics as noted herein.

Figure 13:
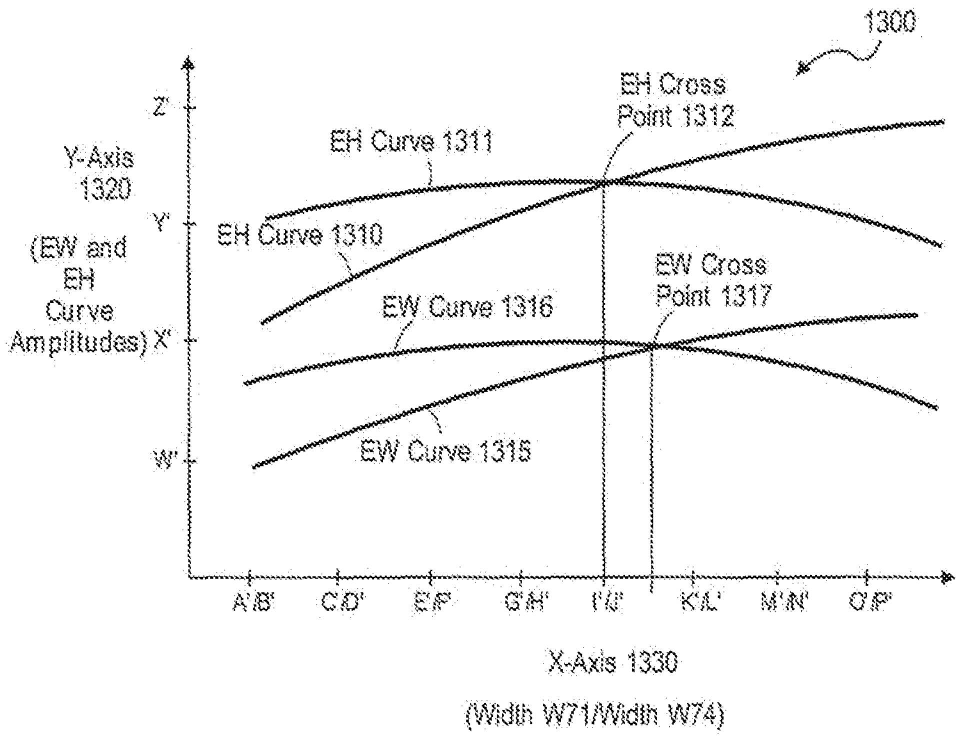
FIG. 13 shows a plot of eye height (EH) curves and eye width (EW) curves of an eye diagram produced by testing one of horizontal data signal transmission signal lines for a range of horizontal data signal transmission line width and ground line width, such as where spacing is constant between horizontally adjacent signal lines and ground lines.

FIG. 13 shows a plot of eye height (EH) curves and eye width (EW) curves of an eye diagram produced by testing one of horizontal data signal transmission signal lines for a range of horizontal data signal transmission line widthand ground line width, such as where spacing is constant between horizontally adjacent signal lines and ground lines. In some cases, the horizontal signal lines 738 and 748; and the ground lines (e.g., 1160, 1162, 1164 and 1166) of device 1150 are impedance tuned (e.g., see FIG. 13) to minimize impedance discontinuity and crosstalk between vertically adjacent and horizontally adjacent ones of signal lines 738 or 748 (e.g., a channel) of device 1150. This may include performing such tuning to determine or identify: (1) a selected target width W71 (and optionally height H73) of one of signal lines 738 or 748 (e.g., given other set or known heights and widths such as noted below); and (2) a selected target width W74 (and optionally height H73) of one of the ground lines (e.g., 1160, 1162, 1164 or 1166) (e.g., given other set or known heights and widths such as noted below) that provides a the best channel performance as showed as the lowest amplitude cross point of eye height (EH) or eye width (EW) curves (e.g., see FIG. 13) of an eye diagram (e.g., see FIG. 9B) produced by testing one of signal lines 738 or 748. The EH and EW curves (e.g., curves 1310-711 and 1315-1316) may be output signal measure (or computer modeled) at a location of the data signal line 738 or 748 when (e.g., as a result of running) one or more input test data signals are sent through length L7*p* of the data signal line such as described for FIGS. 3A-B to determine or identify isolated horizontal data signal transmission line widths W71 and ground line width W74 (optionally, and spacing W75) that are single line impedance tuned (e.g., see FIG. 13) in the routing segment of device 1150 along the channel of signal lines 738 and 748 along length L7*p*.

Impedance tuning of the signal line may be based on or include as factors: horizontal data signal transmission line width W71, height H73, length L7*p*; horizontal ground isolation line width W74, height H73, length L7*p*; width W75 between the isolation lines and horizontally adjacent horizontal data signal transmission lines of device 1150; and height H74 between a signal line and a vertically adjacent grounding line of device 1150. In some cases, once the length L7*p*, width W75, height H74 and height H73 are known (e.g., predetermined or previously selected based on a specific design of a package device 1150), then tuning is performed (e.g., computer simulation, actual "beta" device testing, or other laboratory testing) to determine or identify a ranges of width W71 and W74 that provide the best channel performance as showed as the lowest amplitude cross point of eye height (EH) or eye width (EW) curves of an eye diagram produced by testing one of signal lines 738 or 748.

For example, FIG. 13 shows a plot of eye height (EH) curves 1310 and 1311; and eye width (EW) curves 1315 and 1316 of an eye diagram (e.g., see FIG. 9B) produced by testing one of horizontal data signal transmission signal lines 738 or 748 for a range of horizontal data signal transmission line width W71 and ground line width W74, such as where spacing W72 is constant between horizontally adjacent signal lines (e.g., lines 738 or 748) and ground lines (e.g., lines 1160, 1162, 1164 or 1166). The testing may include measuring or modeling an output signal in response to an input signals such as step up (e.g., _|‾) and down (e.g., ‾|_) signals as noted above for FIG. 9A. EH curve 1310 may be the EH curve for a first design or use of device 1150 that is independent of (e.g., not based on or does not consider) the above noted factors (e.g., horizontal data signal transmission line width W71, ground line width W74, height H73, length L7*p*; width W75 between the signal line and a horizontally adjacent ground lines of device 750; and height H74 between the signal line and a vertically adjacent grounding line of device 750). EH curve 1311 may be the EH curve for a second, different design or use of device 1150 that is independent of the above noted factors. EW curve 1315 may be the EW curve for the first design or use of device 750 that is independent of the above noted factors. EW curve 1316 may be the EW curve for the second, different design or use of device 1150 that is independent of the above noted factors.

In some cases, such a design or use may include where the different curves represent different manufacture variation combinations, such as where a low impedance package (e.g., package 1110) is connected to high impedance interposer (e.g., interposer 1106). In some cases, such a design or use may include where the different curves represent different corner combinations, or possible component variation combinations. In some cases, such a design or use may include where the different curves represent different designs or usees to tune the impedance to maximize the channel performance. In some cases, FIG. 7A shows EH and EW curves from various channels combining possible package and interposer manufacturing corners, (max/typical/min impedance corners from manufacturing variations). In some cases, for example, max Z patch+min Z interposer+max Z package, where Z denotes impedance. In some cases, the common or intersection area below the EH or EW curvers shows the channel EH/EW solution space. In some cases, the optimized impedance value is tied to the the cross point of EH or EW curves which provides the max EH/EW enveloping all the possible channel manufacture variations.

As described for EH curves 910-911 of FIGS. 3A-B, EH curves 1310-1311 may be examples of an eye-height for different designs, and different signal line width W71 and ground line width W74 (e.g., where spacing W72 is constant) for device 1150. Also, as described for EW curves 315-316 of FIGS. 3A-B, EW curves 1315-1316 may be examples of an eye-width for the different designs, and the different signal line width W71 and ground line width W74 (e.g., where spacing W72 is constant) for device 1150.

In some cases, curves 1310-1311 and 1315-1316 are for a selected (e.g., predetermined, desired, constant or certain) length L7*p* of the horizontal data signal transmission line (e.g., RX line 738 or TX line 748) and ground isolation lines of package device 1150. In some cases, curves 1310-1311 and 1315-1316 are also for a selected signal line and ground line height H73 and spacing H74 between the signal line and a vertically adjacent ground line.

In some other cases, tuning includes knowing length L7*p*, width W75 and height H74, then tuning to determine or identify a range of width W71, width W74 and height H73 that provides a predetermined or target impedance for the line.

More specifically, FIG. 13 shows graph 1300 plotting the amplitude of tuning curves 1310-1311 and 1315-1316 along vertical Y-axis 720 for different pairs of width W71 of a signal line (e.g., RX line 738 or TX line 748) and width W74 of ground lines (e.g., where spacing W75 is constant value or distance between horizontally adjacent one of the signal lines (e.g., RX or TX lines 738 or 748) and ground lines (e.g., lines 1160, 1162, 1164 or 1166) along horizontal X-axis 1330. Although FIG. 13 shows the amplitude of curves 1310-1311 and 1315-1316 on the same graph 1300, it can be appreciated that they may be on different graphs having different amplitude scaled Y-axis but the same X-axis 1330 (e.g., the curves are all shown vertically scaled on graph 1300 (e.g., moved up or down axis 720) to compare the cross points for the curves). Curves 1310-1311 and 1315-1316 may be output signal measure (or computer modeled) at a location of the data signal line when (e.g., as a result of running) the one or more test data signals are sent through length L7*p* of the data signal line (e.g., RX line 738 or TX line 748).

Graph 1300 shows cross point 1312 of EH curves 1310 and 1311. I can be appreciated that curves 1310 and 1311 represent more than two curves, but that those curves have a lowest Y-axis cross point at point 1312. Graph 1300 shows cross point 1317 of EW curves 1315 and 1316. I can be appreciated that curves 1315 and 1316 represent more than two curves, but that those curves have a lowest Y-axis cross point at point 1317.

FIG. 13 shows EW and EH curve amplitudes along vertical axis 720 having values W', X', Y' and Z', such as representing different amplitudes for curves 1310-1311 or 1315-1316 (e.g., curves 1315-1316 or 1310-1311 may be scaled, respectively, to fit onto the same graph or plot). In some cases, for curves 1310-1311 values W', X', Y' and Z', represent different linearly increasing EH signal amplitude values (e.g., voltage amplitudes of EH derived from a test signal) such as 0.15, 0.2, 0.25 and 0.3 volts. In some cases, for curves 1315-1316 values W', X', Y' and Z', represent different linearly increasing EW signal time values (e.g., time values of EW derived from a test signal) such as 3.5, 4.0. 4.5 and 5.0 E-11 seconds.

FIG. 13 shows pairs of width W71/width W74 along horizontal axis 1330 having pair values A'/B', C'/D', E'/F', G'/H', K'/L', M'/N' and O'/P'. In some cases, the aggregate (e.g., addition) of each pair of values (e.g., value A' plus value B'; or value O' plus value P', etc.) represents the same sum or a first constant; and that first constant plus two times the spacing width W75 is a second constant (e.g., such as pitch width PW2). In some cases, the signal line width W71 and ground line width W74 vary in an inversely proportional manner to add up to the first constant, such as where if W71 increases by a value (e.g., W71+W'), W74 decreases by that value (e.g., W74-W'), and vice versa. In some cases, the signal line width W71 and ground line width W74 may be described as being inversely proportional. In some cases, (1) the second constant is signal line to signal lined pitch width PW2; and (2) the signal line width W71 and ground line width W74 vary in an inversely proportional manner so that the addition of W71+W74+2×W5=PW2 (e.g., the second constant).

In some cases, PW2 is between 100 and 200 um. In some cases, it is between 720 and 150 um. In some cases it is between 730 and 140 um. In some cases, pair values A'/B' represent width W71 between 60 and 80 um, and width W74 between 55 and 75 um; pair values O'/P' represent width W71 between 25 and 45 um, and width W74 between 90 and 110 um; and the other pairs are at linear intervals between values A'/B' and values O'/P'. In some cases, pair values A'/B' represent width W71/width W74 of 70/65 um, pair values C'/D' represent width W71/width W74 of 65/70 um, pair values E'/F' represent width W71/width W74 of 60/75 um, pair values G'/H' represent width W71/width W74 of 55/80 um, pair values represent width W71/width W74 of 50/85 um, pair values K'/L' represent width W71/width W74 of 45/90 um, pair values M'/N' represent width W71/width W74 of 40/95 um, and pair values O'/P' represent width W71/width W74 of 35/100 um.

In some cases, Y-axis 720 represents eye-height or eye-width which are the figures of merit to quantify the channel performance of the tested signal line (e.g., RX line 738 or TX line 748); and X-axis 1330 is the combination of signal line width W71/width W74 (with constant spacing W75) at constant pitch (line width W71+width W74+2× W5=constant pitch PW, such as PW2). According to embodiments, the impedance tuning of horizontal signal line 738 or 748 of device 1150 includes (or is) selecting (or "tuning") single horizontal routing signal line (e.g., TX and RX line) impedance, such as to select (or "tune" the TX and RX lines to or at) the combination of signal line width W71/width W74 to an optimized point to achieve the best channel performance as showed as the lowest cross point of EH or EW curves (e.g., such as shown in FIG. 13).

According to embodiments, the impedance tuning of horizontal signal line 738 or 748 of device 1150 includes various possible selections of one or a range of locations on X-Axis 1330 selected based on or as a result of a calculation using EH and EW cross point 1312 and/or point 1317. It can be appreciated that such tuning may include selecting or identifying one or a range of width W71/width W74 along axis 1330 for one or both of (1) signal lines 738 and ground line pairs 1160/1162, or (2) signal lines 748 and ground line pairs 1164/1166, based on or as a result of a calculation using cross point 1312 and/or point 1317.

In some cases, such impedance tuning includes or is selecting the lowest amplitude cross point 1312 of eye height (EH) curves 1310-712 or of eye width (EW) curves 1315-1316 of an eye diagram produced by testing one of signal lines 738 or 748. Here, for example, as shown in FIG. 13, X-axis 1330 location I'/J' which is under point 1312; or a location at midpoint between and K'/L' which is under point 1312 may be chosen for width W71 and width W74 for one or both of (1) signal lines 738 and ground line pairs 1160/1162, or (2) signal lines 748 and ground line pairs 1164/1166. In some cases, one of those locations may be used for both of (1) signal lines 738 and ground line pairs 1160/1162, and (2) signal lines 748 and ground line pairs 1164/1166. In some cases, a range of width W71 and width W74 around either of those locations (e.g., a W71 and W74 tolerance, such as 5 or 10 percent around either location) may be used for both of (1) signal lines 738 and ground line pairs 1160/1162, and (2) signal lines 748 and ground line pairs 1164/1166. In some cases, a range of width W71 and width W74 between those locations (e.g., a W71 and W74 tolerance within that range or any location within that range) may be used for both of (1) signal lines 738 and ground line pairs 1160/1162, and (2) signal lines 748 and ground line pairs 1164/1166.

According to some embodiments, the impedance tuning includes or is selecting the lowest amplitude cross point 1312 and point 1317 produced by testing one of signal lines 738 or 748. Here, for example, as shown in FIG. 13, an X-axis 1330 location between (e.g., midpoint between, and average of, or another statistical calculation between) which is under point 1312 and a midpoint between and K'/L' which is under point 1312 may be chosen for width W71 and width W74 for one or both of (1) signal lines 738 and ground line pairs 1160/1162, or (2) signal lines 748 and ground line pairs 1164/1166. In some cases, the location between may be used for both of (1) signal lines 738 and ground line pairs 1160/1162, and (2) signal lines 748 and ground line pairs 1164/1166. In some cases, a range of width W71 and width W74 around the location between (e.g., a W71 and W74 tolerance, such as 5 or 10 percent around either location) may be used for both of (1) signal lines 738 and ground line pairs 1160/1162, and (2) signal lines 748 and ground line pairs 1164/1166. It can be appreciated that various other appropriate locations may be selected based on cross points 1312 and 1317.

It can be appreciated that such tuning as noted above may be for or represent tuning of a single one of, all of a level of, or all of (1) signal lines 738 and ground line pairs 1160/1162, or (2) signal lines 748 and ground line pairs 1164/1166 of device 1150. It can be appreciated that such tuning as noted above may be represent by curves different than the convex curves 1310-1311 and 1315-1316 shown in FIG. 13, such as where the selected width W71/width W74 along axis 1330 is selected to be at the highest point of the different curve along the vertical axis 720.

In some cases, this impedance tuning provides (e.g., by determining or identifying a range of or selected target width W71 and width W74 for both of (1) signal lines 738 and ground line pairs 1160/1162, or (2) signal lines 748 and ground line pairs 1164/1166): (1) the best channel performance for lines 738 and 748 (e.g., having length L7*p*; width W71; width W74, pitch PW2 between the line and a horizontally adjacent horizontal data signal transmission line of device 1150; and height H74 between the line and a vertically adjacent grounding line of device 1150), (2) electrical isolation of horizontal data signal transmission lines (e.g., signal lines 738 and 748) that are single line impedance tuned in the routing segment of device 1150 along the channel (e.g., signal lines 738 or 748 along length L7*p*), and (3) minimized impedance discontinuity and cross-talk between vertically adjacent and horizontally adjacent ones of signal lines 738 or 748 of device 1150.

In some cases, the tuning above includes separately tuning lines 738 and 748 of interposer 1106, patch 1104 and package 1110. In some cases, it includes separately tuning lines 738 and 748 of interposer 1106, patch 1104 or package 1110. In some cases, the tuning above includes tuning lines 738 and 748 of interposer 1106 are tuned, but the signal lines of patch 1104 and package 1110 are not. In some cases, the width W71 and width W74 of interposer 1106 are determined by tuning as noted above; and the width W71 and width W74 of patch 1104 and package 1110 are determined based on other factors, or design parameters that do not include the tuning noted above.

Figure 14:
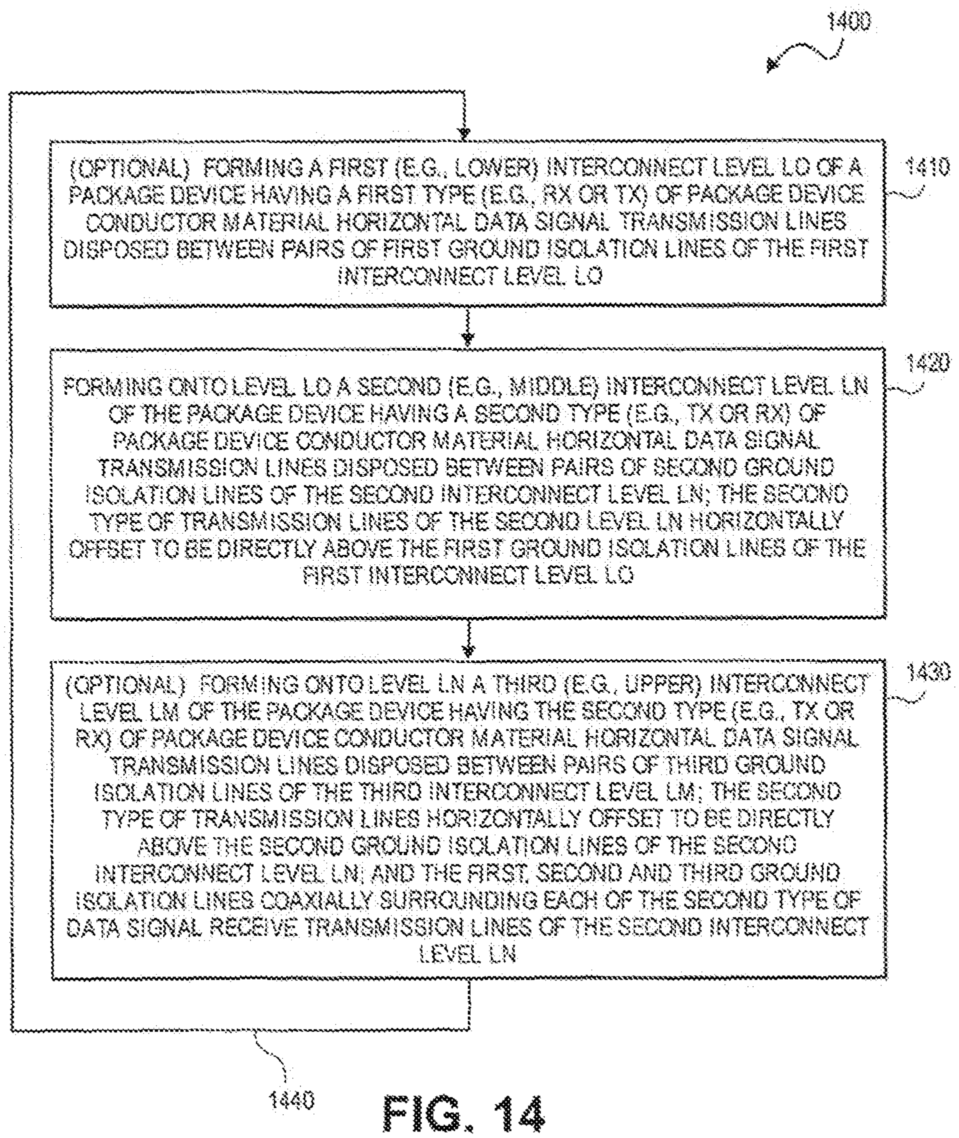
FIG. 14 is a flow chart illustrating a process for forming a ground isolated "coaxial" line separated data signal package, according to embodiments described herein.

FIG. 14 is a flow chart illustrating a process for forming a ground isolated "coaxial" line separated data signal package, according to embodiments described herein. FIG. 14 shows process 1400 which may be a process for forming embodiments described herein of package 1150 of any of FIGS. 5-7. It may also be a process for forming certain levels or layers of FIGS. 15-19 as noted further below. In some cases, process 1400 is a process for forming a ground isolated horizontal data signal transmission line package device that has two ground isolation lines are horizontally surrounding each data signal line; and the two ground isolation lines vertically surrounding each data signal line to cause four ground isolation lines to "coaxially" surrounding each data signal line.

Process 1400 begins at optional block 1410 at which a first (e.g., lower) interconnect level Lo of a package device is formed, having a first type (e.g., RX or TX) of package device conductor material horizontal data signal transmission lines disposed between pairs of horizontally adjacent first ground isolation lines 1164 of the first interconnect level Lo. Block 1410 may also include forming first (e.g., lower) level Lo to have package device non-conductive material portions of the first interconnect level Lo disposed (e.g., horizontally adjacent) between each of the first type (e.g., RX or TX) of package device conductor material horizontal data signal receive transmission lines and each of the first ground isolation lines of the first interconnect level Lo.

Block 1410 may also include forming the first (e.g., lower) interconnect level Lo of the package device with a first level package device non-conductive material layer formed on (e.g., touching) or over a layer having the first type (e.g., RX or TX) of package device horizontal data signal lines, the first ground isolation lines, and the non-conductive material portions of the first interconnect level Lo.

In some cases, block 1410 includes forming non-conductive material layer 703*a* of the first (e.g., lower) interconnect level Lo (e.g., layer 1230) on (e.g., touching) or over a layer (e.g., layer 1232) having the first type TX horizontal data signal lines 748, first ground isolation lines 1164, and non-conductive material portions 703*b* of first interconnect level Lo.

In some cases, block 1410 may only include forming lower layer 1232 of level Lo with first type of data TX signal 748 lines disposed horizontally between dielectric material portions 703*b* which are disposed between horizontally adjacent first ground isolation lines 1164 of the first interconnect level Lo; and then forming upper layer 1230 of or having dielectric material onto layer 1232.

A first example embodiment of block 1410 may include (e.g., prior to forming the upper layer 1230), forming a mask (e.g., DFR, not shown) over a top surface of an upper layer 1240 (e.g., of ajinomoto build up film (ABF)), the mask having (1) first openings over layer 1240 in which to form the first type of data TX signal 748 lines of layer 1232 and (2) second openings over layer 1240 in which to form the horizontally adjacent first ground isolation lines 1164. In some cases, the first openings may be horizontally open to and in communication with different, third openings in the mask over layer 1240 in which data TX signal contacts or data TX signal via contacts will be formed. In some cases, the second openings may be horizontally open to and in communication with fourth openings in the mask over layer 1240 in which ground signal contacts or via contacts will be formed.

Some of these cases may include electroless plating of a seed layer of the conductor material over layer 1240, prior to forming the masks layer. In this case, block 1410 may then include simultaneously forming conductive material (e.g., plating on the exposed seed layer of the openings) to form the data TX signal 748 lines and isolation lines 1164 of layer 1232 in the first and second openings (and optionally the data TX signal or via contacts in the third openings; and the ground signal contacts or via contacst in the fourth openings of layer 1232).

In some of these cases, simultaneously forming the conductive material may include forming that conductive material of all of data TX signal 748 lines and isolation lines 1164 of layer 1232 (and optionally all of the data TX signal or via contacts; and the ground signal contacts or via contacts of layer 1232) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 703*b* (e.g., of ajinomoto build up film (ABF)) may be deposited where the mask was removed. In some cases, forming the mask includes forming a blanket layer of mask material and etching the blanket layer to form the first (and optionally second) openings.

Next, at block 1420 a second (e.g., middle) interconnect level Ln of the package device is formed over or onto (e.g., touching) level Lo; level Ln, having a second type (e.g., TX or RX; the opposite of the first type RX or TX, respectively) of package device conductor material horizontal data signal transmission lines disposed between pairs of horizontally adjacent second ground isolation lines of the second interconnect level Ln; where the second type of transmission lines of second level Ln are horizontally offset to be directly above the first ground isolation lines of the first interconnect level Lo. Block 1420 may also include forming second level Ln to have package device non-conductive material portions of the second interconnect level Ln disposed (e.g., horizontally adjacent) between each of the second type (e.g., TX or RX) of package device conductor material horizontal data signal transmission lines and each of the second ground isolation lines of the second interconnect level Ln.

Block 1420 may also include forming the second level Ln of the package device with a second level package device non-conductive material layer formed on (e.g., touching) or over a layer having the second type (e.g., TX or RX) of package device horizontal data signal lines, the second ground isolation lines, and the non-conductive material portions of the second interconnect level Ln.

In some cases, block 1420 includes forming non-conductive material layer 703*a* of the second (e.g., middle) interconnect level Ln (e.g., layer 1220) on (e.g., touching) or over a layer (e.g., layer 1222) having the second type RX horizontal data signal lines 738, second ground isolation lines 1162, and non-conductive material portions 703*b* of second interconnect level Ln of package device 1150.

In some cases, block 1420 may only include forming lower layer 1222 of level Ln with second type of data RX signal 738 lines disposed horizontally between dielectric material portions 703*b* which are disposed between horizontally adjacent second ground isolation lines 1162 of the second interconnect level Ln; and then forming upper layer 1220 of or having dielectric material onto layer 1222.

A first example embodiment of block 1420 may include (e.g., prior to forming the upper layer 1220), forming a mask (e.g., DFR, not shown) over a top surface of an upper layer 1230 (e.g., of ajinomoto build up film (ABF), the mask having (1) first openings over layer 1230 in which to form the second type of data RX signal 738 lines of layer 1222 and (2) second openings over layer 1230 in which to form the horizontally adjacent second ground isolation lines 1162. In some cases, the first openings may be horizontally open to and in communication with different, third openings in the mask over layer 1230 in which data RX signal contacts or via contacts will be formed. In some cases, the second openings may be horizontally open to and in communication with fourth openings in the mask over layer 1230 in which ground signal contacts or via contacts will be formed.

Some of these cases may include electroless plating of a seed layer of the conductor material over layer 1230, prior to forming the masks layer. In this case, block 1420 may then include simultaneously forming conductive material (e.g., plating on the exposed seed layer of the openings) to form the second type of data RX signal 738 and isolation lines 1162 of layer 1222 in the first and second openings (and optionally the data RX signal or via contacts in the third openings; and the ground signal contacts or via contacts in the fourth openings of layer 1222).

In some of these cases, simultaneously forming the conductive material may include forming that conductive material of all of second type of data RX signal 738 and isolation lines 1162 of layer 1222 (and optionally all of the data RX signal or via contacts; and the ground signal contacts or via contacts of layer 1222) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 703*b* (e.g., of ajinomoto build up film (ABF)) may be deposited where the mask was removed. In some cases, forming the mask includes forming a blanket layer of mask material and etching the blanket layer to form the first (and optionally second) openings.

Next, at block 1430 a third (e.g., upper) interconnect level Lm of the package device is formed over or onto (e.g., touching) level Ln; level Lm having the second type (e.g., TX or RX) of package device conductor material horizontal data signal transmission lines disposed between pairs of horizontally adjacent third ground isolation lines of the third interconnect level Lm; where the second type of transmission lines of third level Lm are horizontally offset to be directly above the second ground isolation lines of the second interconnect level Ln; and where the first, second and third ground isolation lines (e.g., of the lower, middle and upper levels) coaxially surround each of the second type of data signal transmission lines of the second (e.g., middle) level Ln. Block 1430 may also include forming third level Lm to have package device non-conductive material portions of the third interconnect level Lm disposed (e.g., horizontally adjacent) between each of the second type (e.g., TX or RX) of package device conductor material horizontal data signal transmission lines and each of the third ground isolation lines of the third interconnect level Lm.

Block 1430 may also include forming the third level Lm of the package device with a third level package device non-conductive material layer formed on (e.g., touching) or over a layer having the second type (e.g., TX or RX) of package device horizontal data signal lines, the third ground isolation lines, and the non-conductive material portions of the third interconnect level Lm.

In some cases, block 1430 includes forming non-conductive material layer 703*a* of the third (e.g., upper) interconnect level Lm (e.g., layer 1210) on (e.g., touching) or over a layer (e.g., layer 1212) having the second type RX horizontal data signal lines 738, third ground isolation lines 1160, and non-conductive material portions 703*b* of third interconnect level Lm of package device 1150.

In some cases, block 1430 may only include forming lower layer 1212 of level Lm with second type of data RX signal 738 lines disposed horizontally between dielectric material portions 703*b* which are disposed between horizontally adjacent third ground isolation lines 1160 of the third interconnect level Lm; and then forming upper layer 1210 of or having dielectric material onto layer 1212.

A first example embodiment of block 1430 may include (e.g., prior to forming the upper layer 1210), forming a mask (e.g., DFR, not shown) over a top surface of an upper layer 1220 (e.g., of ajinomoto build up film (ABF), the mask having (1) first openings over layer 1220 in which to form the second type of data RX signal 738 lines of layer 1212 and (2) second openings over layer 1220 in which to form the horizontally adjacent third ground isolation lines 1160.

In some cases, the first openings may be horizontally open to and in communication with different, third openings in the mask over layer 1220 in which data RX signal contacts or via contacts will be formed. In some cases, the second openings may be horizontally open to and in communication with fourth openings in the mask over layer 1220 in which ground signal contacts or via contacts will be formed.

Some of these cases may include electroless plating of a seed layer of the conductor material over layer 1220, prior to forming the masks layer. In this case, block 1430 may then include simultaneously forming conductive material (e.g., plating on the exposed seed layer of the openings) to form the second type of data RX signal 738 and isolation lines 1160 of layer 1212 in the first and second openings (and optionally the data RX signal or via contacts in the third openings; and the ground signal contacts or via contacts in the fourth openings of layer 1212).

In some of these cases, simultaneously forming the conductive material may include forming that conductive material of all of second type of data RX signal 738 and isolation lines 1160 of layer 1212 (and optionally all of the data RX signal or via contacts; and the ground signal contacts or via contacts of layer 1212) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 703*b* (e.g., of ajinomoto build up film (ABF)) may be deposited where the mask was removed. In some cases, forming the mask includes forming a blanket layer of mask material and etching the blanket layer to form the first (and optionally second) openings.

Next, at return arrow 1440, process 1400 may continue by returning to a second performance of optional block 1410 at which another "first" (e.g., lower) interconnect level of a package device is formed, having a first type (e.g., RX or TX) of package device conductor material horizontal data signal transmission lines. Then, process 1400 may proceed with a second performance of block 1420, and a second performance of optional block 1430. Process 1400 may continue this way until a predetermined or sufficient number of levels or return processes are completed to form a desired package device 1150. In some cases, it may repeat 3 to 10 times. In some cases, block 1410 is repeated once to form a level similar to level Lq but formed on level Lm.

Next, in a first example case of process 1400, block 1410 may only include forming layer 1232 as described herein; block 1420 may only include forming layer 1222 as described herein; and block 1430 may only include forming layer 1212 as described herein. In a second example case, block 1410 may include forming layers 1230 and 1232 as described herein; block 1420 may include forming layers 1220 and 1222 as described herein; and block 1430 may include forming layers 1210 and 1212 as described herein.

It can be appreciated that although FIGS. 11-14 show and corresponding descriptions describe embodiments for level Lm having RX signal lines, level Ln having RX signal lines, level Lo having TX signal lines, and level Lq having TX signal lines, the figures and descriptions also apply to embodiments where there are only one level of vertically adjacent RX and TX signals (e.g., level Ln is TX and level Lo is RX signals), each level having ground isolation lines and offset as noted herein. In some embodiments, there may be three levels of vertically adjacent RX and TX signals, each level having ground isolation lines and offset as noted herein.

For example, an embodiment of a process similar to process 1400 of FIG. 14 may include not performing block 1430 before proceeding to return 1440 and block 1410, thus forming first (e.g., lower) interconnect level Lo of a package device having one layer of the first type (e.g., RX or TX) of horizontal data signal transmission lines (e.g., a first type of data signal lines or traces, such as RX or TX data signal lines disposed between package device first isolation lines) of the first interconnect level Lo. Then performing block 1420 to form the second (e.g., middle) interconnect level Ln of a package device having one layers of the second type (e.g., TX or RX; the opposite of the first type RX or TX, respectively) of package device horizontal data signal transmission lines (e.g., a first type of data signal lines or traces, such as TX or RX data signal lines disposed between package device second isolation lines) of the second interconnect level Ln. Then returning to perform block 1410 and block 1420 again.

It can be appreciated that although FIGS. 4-8 show and corresponding descriptions describe embodiments for level Lm having RX signal lines, level Ln having RX signal lines, level Lo having TX signal lines, and level Lq having TX signal lines, the figures and descriptions also apply to embodiments where the order can be reversed such as for embodiments where level Lm has TX signal lines, level Ln has TX signal lines, level Lo has RX signal lines, and level Lq has RX signal lines.

It can be appreciated that although FIGS. 4-8 show and corresponding descriptions describe embodiments for levels having RX signal lines and TX signal lines, the figures and descriptions also apply to embodiments where other types of information, clock, timing, alternating current (AC) or data signals can be on those signal lines.

In some cases, a ground isolated horizontal data signal transmission line package device has (1) ground isolation planes separating horizontal data signal receive and transmit layers or levels (e.g., interconnect levels) (e.g., see device 750 of FIGS. 7-10) and (2) ground isolation lines "coaxially" surrounding (e.g., vertically and horizontally separating) vertically and horizontally adjacent horizontal data signal receive (RX) and transmit (TX) signal lines that are routed through the package device (e.g., see device 1150 of FIGS. 11-14). The horizontal ground isolation planes located vertically between the horizontal data signal receive and transmit layers or levels (e.g., interconnect levels) may reduce crosstalk between vertically adjacent levels (e.g., between TX signal lines and RX signal lines in levels above and below each other) such as described for device 750 of FIGS. 7-10. The ground isolation lines horizontally, vertically or coaxially surrounding the horizontal data signal transmission lines may reduce crosstalk between and increase isolation of horizontally and vertically adjacent ones of the horizontal data signal transmission lines such as described for device 1150 of FIGS. 11-14.

In some cases, the horizontal ground isolation planes combined with the isolation lines, reduce crosstalk between vertically adjacent levels (e.g., between TX signal lines and RX signal lines in levels above and below each other), and decrease crosstalk between the horizontal data signal transmission lines that are horizontally adjacent to each other (e.g., in a single vertical level or layer of the device package). This embodiment of a ground isolated horizontal data signal transmission line package device may be described as a "combined horizontal ground isolation planes and ground isolation coaxial lines separated data signal line package device" (e.g., see device 1550).

Figure 15:
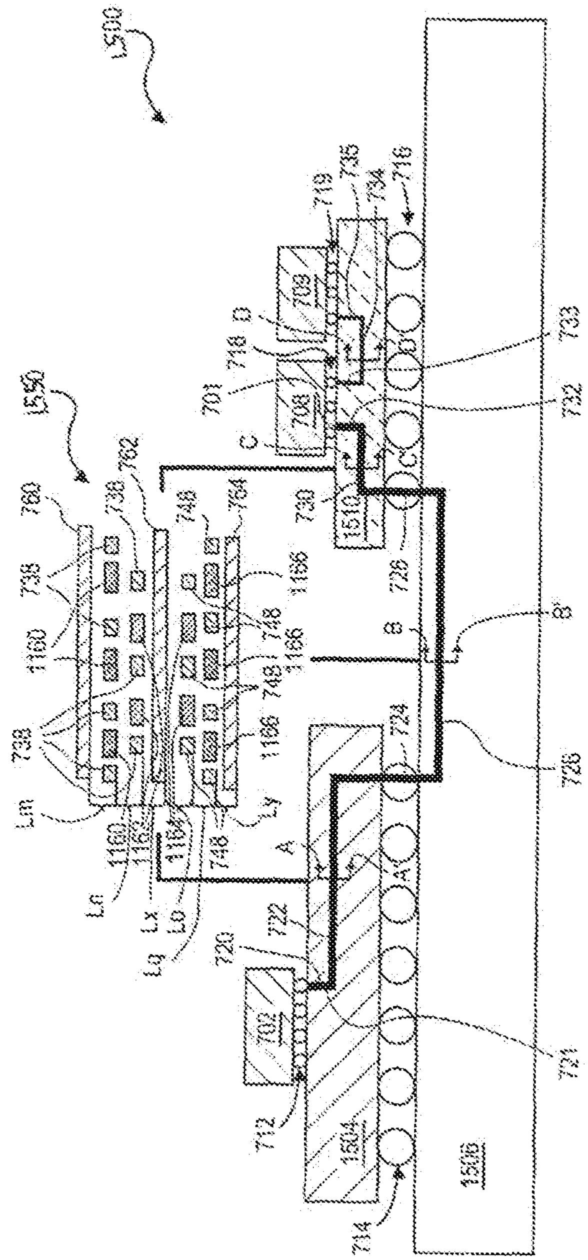
FIG. 15 is schematic cross-sectional side and length views of a computing system, including combined horizontal ground isolation planes and ground isolation coaxial lines separated data signal line package devices.

FIG. 15 is schematic cross-sectional side and length views of a computing system, including combined horizontal ground isolation planes and ground isolation coaxial lines separated data signal line package devices. FIG. 15 shows a schematic cross-sectional side view of computing system 1500, including ground isolated horizontal data signal transmission line package devices, such as patch 1504, interposer 1506 and package 1510. In some cases, system 1500 has CPU chip 702 mounted on patch 1504, which is mounted on interposer 1506 at first location 707. It also shows chip 708 mounted on package 1510 at first location 701; and chip 709 mounted on chip 1510 at second location 711. Package 1510 is mounted on interposer 1506 at second location 713. For example, a bottom surface of chip 702 is mounted on top surface 705 of patch 1504 using solder bumps or bump grid array (BGA) 712. A bottom surface of patch 1504 is mounted on top surface 705 of interposer 1506 at first location 707 using solder bumps or BGA 714. Also, a bottom surface of chip 708 is mounted on top surface 703 of package 1510 at first location 701 using solder bumps or BGA 718. A bottom surface of chip 709 is mounted on surface 703 of package 1510 at location 711 using solder bumps or BGA 719. A bottom surface of package 1510 is mounted on surface 705 of interposer 1506 at second location 713 using solder bumps or BGA 116.

In some cases the only difference between system 1500 and 700 is the difference between patch 1504 and 704; interposer 1506 and 706; and package 1510 and 710. In some cases the only difference between patch 1504 and 704; interposer 1506 and 706; and package 1510 and 710 is that patch 1504, interposer 1506, and package 1510 are or have combined horizontal ground isolation planes and ground isolation coaxial lines separated data signal line package device 1550 instead of ground isolation plane separated data signal package device 750. In other words, in some cases the only difference between patch 1504 and 704; interposer 1506 and 706; and package 1510 and 710 is that horizontal data signal transmission lines 122, 726, 730 and 735 are or have ground isolation "coaxial" line separated data signal package device 1550 in place of ground isolation plane separated data signal package device 750.

FIG. 15 also show vertical data signal transmission lines 720 originating in chip 702 and extending vertically downward through bumps 712 and into vertical levels of patch 1504, such as downward to levels Lm-Lq of patch 1504 at first horizontal location 121.

FIG. 15 also shows patch horizontal data signal transmission lines 122 originating at first horizontal location 121 in levels Lm-Lq of patch 1504 and extend horizontally through level Lm-Lq along length L71 of levels Lm-Lq to second horizontal location 723 in levels Lm-Lq of patch 1504.

Next, FIG. 15 shows vertical data signal transmission lines 724 originating in patch 1504 and extending vertically downward through bumps 714 and into vertical levels of interposer 1506, such as downward to levels Lm-Lq of interposer 1506 at first horizontal location 725.

FIG. 15 also shows interposer horizontal data signal transmission lines 726 originating at first horizontal location 725 in levels Lm-Lq of interposer 1506 and extend horizontally through levels Lm-Lq along length L72 of levels Lm-Lq to second horizontal location 727 in levels Lm-Lq of interposer 1506.

Next, FIG. 15 shows vertical data signal transmission lines 128 originating in interposer 1506, such as originating at levels Lm-Lq at second horizontal location 727 of interposer 1506 and extending vertically upward to levels Lm-Lq of package 1510 at first horizontal location 729 of package 1510.

FIG. 15 also shows package device horizontal data signal transmission lines 730 originating at first horizontal location 725 in levels Lm-Lq of package 1510 and extend horizontally through levels Lm-Lq along length L73 of levels Lm-Lq to second horizontal location 731 in levels Lm-Lq of package 1510.

Next, FIG. 15 shows vertical data signal transmission lines 732 originating in package 1510, such as originating at levels Lm-Lq at second horizontal location 731 of package 1510 and extending upward to and terminate at a bottom surface of chip 708.

FIG. 15 also show vertical data signal transmission lines 733 originating in chip 708 and extending vertically downward to levels Lm-Lq of package 1510 at first horizontal location 734 of package 1510.

FIG. 15 also shows package device horizontal data signal transmission lines 735 originating at third horizontal location 734 in levels Lm-Lq of package 1510 and extend horizontally through levels Lm-Lq along length L74 of levels Lm-Lq to second horizontal location 736 in levels Lm-Lq of package 1510.

Next, FIG. 15 shows vertical data signal transmission lines 737 originating in package 710, such as originating at levels Lm-Lq at fourth horizontal location 736 of package 1510, and extending upward to and terminate at a bottom surface of chip 709. In some cases the data signal transmission signals of lines 720, 122, 724, 726, 128, 730, 732, 733, 735 and/or 737 are or include data signal transmission signals to an IC chip (e.g., chip 702, 708 or 709), patch 1504, interposer 1506, package 1510, or another device attached to thereto, such as described for FIG. 1.

In some cases, lines 720, 122 and 724 also include power and ground signal lines or traces, such as described for FIG. 7 (not shown) that also extend horizontally from location 121 to location 723 within levels Lm-Lq, or other levels of patch 1504.

In some cases, lines 724, 726 and 128 also include power and ground signal lines or traces, such as described for FIG. 7 (not shown) that also extend horizontally from location 725 to location 727 within levels Lm-Lq, or other levels of interposer 1506. In some cases the power and ground signals transmitted and received (or existing) on the power and ground signal lines of lines 720, 122, 724 and 726 originate at or are provided by patch 1504 or interposer 1506, or another device attached to thereto, such as described for FIG. 1.

In some cases, lines 128, 730 and 732 also include power and ground signal lines or traces, such as described for FIG. 7 (not shown) that also extend horizontally from location 729 to location 731 within levels Lm-Lq, or other levels of package 1504. In some cases the power and ground signals transmitted and received (or existing) on the power and ground signal lines of lines 128, 730 and 732 originate at or are provided by package 1510 or interposer 1506, or another device attached to thereto, such as described for FIG. 1.

In some cases, lines 733, 735 and 737 also include power and ground signal lines or traces, such as described for FIG. 7 (not shown) that also extend horizontally from location 734 to location 736 within levels Lm-Lq, or other levels of package 1504. In some cases the power and ground signals transmitted and received (or existing) on the power and ground signal lines of lines 733, 735 and 737 originate at or are provided by package 1510 or interposer 1506, or another device attached to thereto, such as described for FIG. 1.

FIG. 15 also shows a schematic cross-sectional length view of a ground isolated horizontal data signal transmission line package device. In this case, the package device is combined horizontal ground isolation planes and ground isolation coaxial lines separated data signal line package device 1550 (e.g., instead of, but combining package device 750 of FIGS. 7-10 and package device 1150 of FIGS. 11-14). Device 1550 may be a "package device" representing any of patch 1504, interposer 1506 or package 1510. It can be appreciated that device 1550 may represent another package device having horizontal data transmission lines. In some cases, package device 1550 represents horizontal data signal transmission lines 122 of patch 1504 through perspective A-A'; horizontal data signal transmission lines 726 of interposer 1506 through perspective B-B'; horizontal data signal transmission lines 730 of package 1510 through perspective C-C'; or horizontal data signal transmission lines 735 of package 1510 through perspective D-D', such as described for package device 750 and patch 704, interposer 706 or package 710.

Figure 16A:
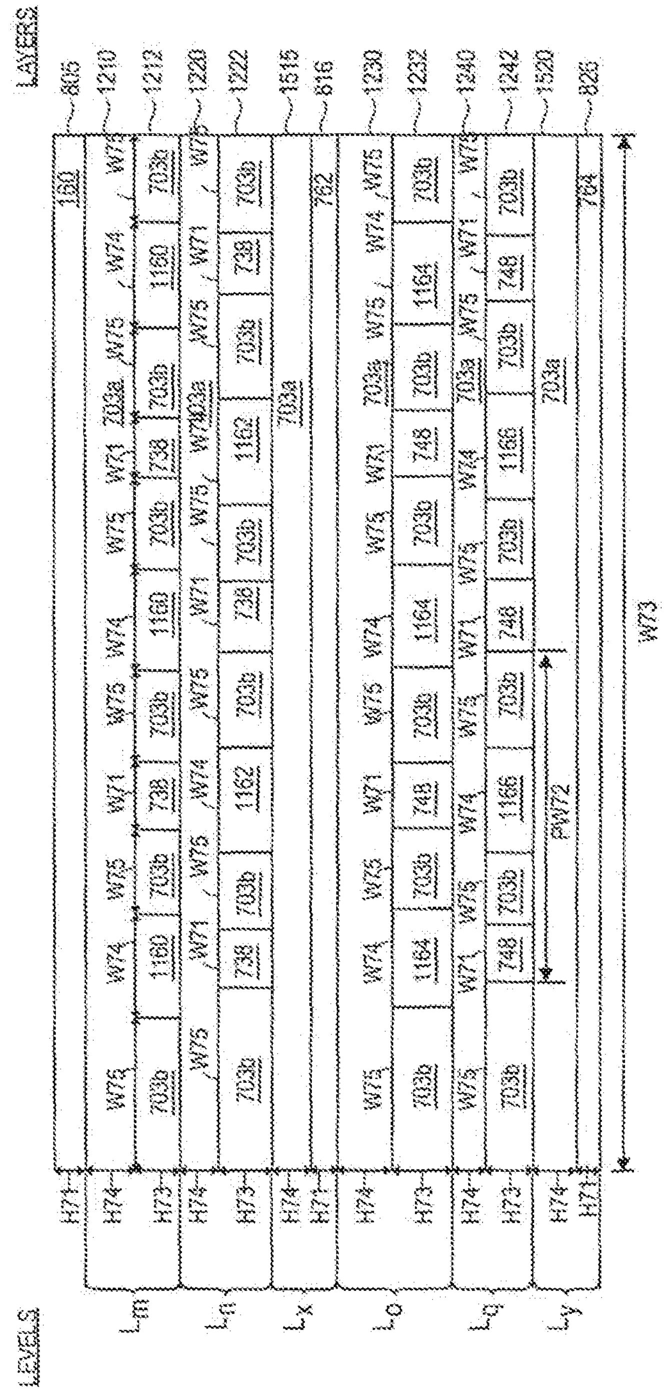
FIG. 16A is an exploded schematic cross-sectional length view of a ground isolated horizontal data signal transmission line package device of FIG. 15 showing combined horizontal ground isolation planes and ground isolation coaxial lines separating horizontal data signal receive and transmit lines.

FIG. 16A is an exploded schematic cross-sectional length view of a ground isolated horizontal data signal transmission line package device of FIG. 15 showing combined horizontal ground isolation planes and ground isolation coaxial lines separating horizontal data signal receive and transmit lines. FIG. 16A shows an exploded schematic cross-sectional length view of combined horizontal ground isolation planes and ground isolation coaxial lines separated data signal line package 1550, such as a "package device" representing any of patch 1504 (e.g., a view through perspective A-A'), interposer 1506 (e.g., a view through perspective B-B') or package 1510 (e.g., a view through perspective C-C' or D-D"). Package device 1550 is shown having interconnect level Lm formed over or onto (e.g., touching) Level Ln which is formed over or onto Level Lx which is formed over or onto (e.g., touching) Level Lo which is formed over or onto (e.g., touching) Level Lq which is formed over or onto (e.g., touching) Level Ly. It also shows layer 805 formed onto (e.g., touching) layer 1210, which is formed onto layer 1212, which is formed onto layer 1220, which is formed onto layer 1222, which is formed onto layer 1515, which is formed onto layer 816, which is formed onto layer 1230, which is formed onto layer 1232, which is formed onto layer 1240, which is formed onto layer 1242, which is formed onto layer 1520, which is formed onto layer 826.

Figure 16B:
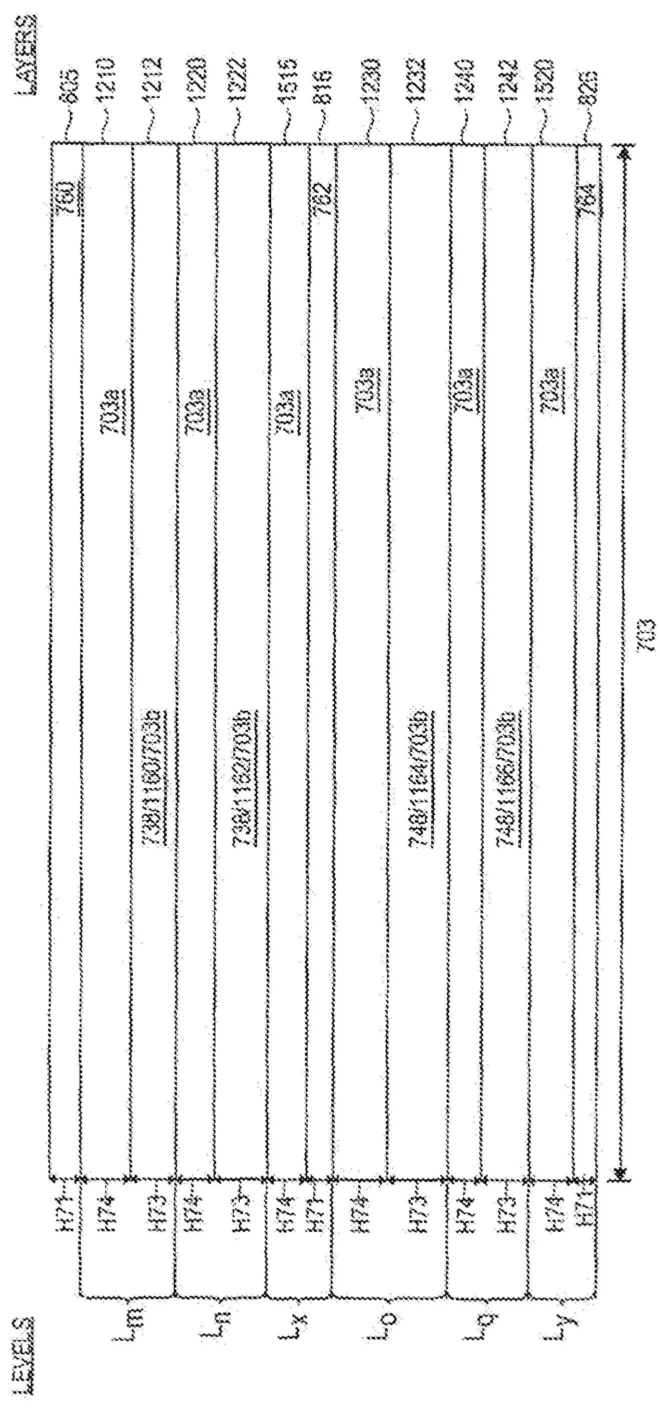
FIG. 16B is an exploded schematic cross-sectional side view of a ground isolated horizontal data signal transmission line package device of FIGS. 15 and 16A showing ground isolation planes separating vertically adjacent levels of horizontal data signal receive and transmit lines; and ground isolation "coaxial" lines separating vertically adjacent and horizontally adjacent ones of horizontal data signal receive and transmit lines.

FIG. 16B is an exploded schematic cross-sectional side view of a ground isolated horizontal data signal transmission line package device of FIGS. 15 and 16A showing ground isolation planes separating vertically adjacent levels of horizontal data signal receive and transmit lines; and ground isolation "coaxial" lines separating vertically adjacent and horizontally adjacent ones of horizontal data signal receive and transmit lines. FIG. 16B shows an exploded schematic cross-sectional side view of combined horizontal ground isolation planes and ground isolation coaxial lines separated data signal line package 1550 of FIGS. 15 and 16A such as a "package device" representing any of patch 1504 (e.g., along length L71), interposer 1506 (e.g., along length L72) or package 1510 (e.g., along length L73 and/or L74). Package device 1550 is shown having interconnect levels Lm, Ln, Lo, Lq and Ly (e.g., see FIG. 16A).

More specifically, FIG. 16B shows package device 1550 having levels Lm, Ln, Lo, Lq and Ly and layers 805, 1210, 1212, 1220, 1222, 1510, 816, 1230, 1232, 1240, 1242, 1520 and 826 along length L7*p*. Length L7*p* may represent any of lengths L71, L72, L73 or L74. In some cases, levels Lm-Ly and layers 805-826 in FIG. 16B may include (e.g., along with other materials that are beyond the edge of length L7*p*) or are (e.g., within length L7*p*) the same as in the descriptions above for levels Lm-Ly and layers 805-826 in FIGS. 9 and 10A, respectively.

FIG. 16B shows layer 1212 that may include (e.g., along with other materials that are beyond the edge of length L7*p*) or be (e.g., within length L7*p*) lines 738, lines 1160 and portions 703*b*. For example, layer 1212 is shown having "738/1160/703*b*" which may represent lines 738, lines 1160, and/or portions 703*b* extending along length L7*p*. FIG. 16B shows layer 1222 that may include (e.g., along with other materials that are beyond the edge of length L7*p*) or be (e.g., within length L7*p*) lines 738, lines 1162 and portions 703*b*. FIG. 16B shows layer 1232 that may include (e.g., along with other materials that are beyond the edge of length L7*p*) or be (e.g., within length L7*p*) lines 748, lines 1164 and portions 703*b*. FIG. 16B shows layer 1242 that may include (e.g., along with other materials that are beyond the edge of length L7*p*) or be (e.g., within length L7*p*) lines 748, lines 1166 and portions 703*b*. In some cases, ground isolation planes 760, 762 and 764; and ground isolation lines 1160, 1162, 1164 or 1166 are each electronically coupled to (e.g., touching, formed with, or directly attached to) ground contacts or other ground signal providing circuitry of device 1550, such as ground contacts disposed in the same layer as each ground plane or line, respectively.

More specifically, FIGS. 10A-B show package device 1550 having layer 805 that includes (e.g., along with other materials that are beyond the edge of width W73) or is (e.g., within width W73) package device conductor material (e.g., pure conductor or metal) ground isolation plane 760 separating upper layer 1210 of package device dielectric material (and package device horizontal data signal receive transmission lines 738 (e.g., data signal RX 738)) of level Lm from package device non-conductor material (and vertically adjacent horizontal data signal transmit transmission lines (e.g., data signal TX or RX lines)) of a level or layer of the package device that is above plane 760. Plane 760 may be the same as described for FIGS. 7-10, except that it is formed on level Lm, where level Lm is as described for FIGS. 11-14, and may be connected as appropriate for system 1500.

Plane 760 may be directly physically connected to, electrically coupled to, or directly attached to ground contacts or via contacts in the same layer 805 as plane 760. In some cases, plane 760 is or includes ground signals from, originating at, provided by, or generated by patch 1504, interposer 1506, package 1510, or another device attached to thereto as described for patch 704, interposer 706, package 710, or another device at FIGS. 7-10. This signal may have a voltage level as described at FIGS. 7-10.

Next, FIGS. 10A-B show package device 1550 having Level Lm with upper layer 1210 formed over or onto (e.g., touching) lower layer 1212 which is formed over or onto upper layer 1220 of level Ln. Level Lm, upper layer 1210, and lower layer 1212 may be the same a described for FIGS. 11-14, except that layer 805 is formed onto layer 1210 and lines 1160 may be connected as appropriate for system 1500.

In some cases, lines 1160 of layer 1212 may be directly physically connected to, electrically coupled to, or directly attached to ground contacts or via contacts in the same layer 1212 or level Lm as lines 1160. In some cases the ground lines 1160 are or include ground signals from, originating at, provided by, or generated by patch 1504, interposer 1506, package 1510, or another device attached to thereto as described for patch 704, interposer 706, package 710, or another device at FIGS. 11-14. This signal may have a voltage level as described at FIGS. 11-14.

Next, FIGS. 10A-B show package device 1550 having Level Ln with upper layer 1220 formed over or onto (e.g., touching) lower layer 1222 which is formed over or onto upper layer 1515 of level Lx. Level Ln, upper layer 1220, and lower layer 1222 may be the same a described for FIGS. 11-14, except that layer 1222 is formed onto layer 1515 and lines 1162 may be connected as appropriate for system 1500.

In some cases, lines 1162 of layer 1222 may be directly physically connected to, electrically coupled to, or directly attached to ground contacts or via contacts in the same layer 1222 or level Ln as lines 1162. In some cases the ground lines 1162 are or include ground signals from, originating at, provided by, or generated by patch 1504, interposer 1506, package 1510, or another device attached to thereto as described for patch 704, interposer 706, package 710, or another device at FIGS. 11-14. This signal may have a voltage level as described at FIGS. 11-14.

Next, FIGS. 10A-B show package device 1550 having Level Lx with upper layer 1515 formed over or onto (e.g., touching) lower layer 816 which is formed over or onto upper layer 1230 of level Lo. Upper layer 1515 may be the same a layer 1210 described for FIGS. 11-14, except that it is formed onto layer 816 and located vertically adjacent to and between layers 1222 and 816. Lower layer 816 may include or be ground isolation plane 762 such as described for FIGS. 7-10. Plane 762 may be the same as described for FIGS. 7-10, except that it is formed on level Lo, where level Lo is as described for FIGS. 11-14, and may be connected as appropriate for system 1500.

Plane 762 may be directly physically connected to, electrically coupled to, or directly attached to ground contacts or via contacts in the same layer 816 as plane 762. In some cases, plane 762 is or includes ground signals from, originating at, provided by, or generated by patch 1504, interposer 1506, package 1510, or another device attached to thereto as described for patch 704, interposer 706, package 710, or another device at FIGS. 7-10. This signal may have a voltage level as described at FIGS. 7-10.

Next, FIGS. 10A-B show package device 1550 having Level Lo with upper layer 1230 formed over or onto (e.g., touching) lower layer 1232 which is formed over or onto upper layer 1240 of level Lq. Level Lo, upper layer 1230, and lower layer 1232 may be the same a described for FIGS. 11-14, except that layer 816 is formed onto layer 1230 and lines 1164 may be connected as appropriate for system 1500.

In some cases, lines 1164 of layer 1232 may be directly physically connected to, electrically coupled to, or directly attached to ground contacts or via contacts in the same layer 1232 or level Lm as lines 1164. In some cases the ground lines 1164 are or include ground signals from, originating at, provided by, or generated by patch 1504, interposer 1506, package 1510, or another device attached to thereto as described for patch 704, interposer 706, package 710, or another device at FIGS. 11-14. This signal may have a voltage level as described at FIGS. 11-14.

Next, FIGS. 10A-B show package device 1550 having Level L q with upper layer 1240 formed over or onto (e.g., touching) lower layer 1242 which is formed over or onto upper layer 1520 of level Ly. Level Lq, upper layer 1240, and lower layer 1242 may be the same a described for FIGS. 11-14, except that level 1242 is formed onto layer 1520 and lines 1166 may be connected as appropriate for system 1500.

In some cases, lines 1166 of layer 1242 may be directly physically connected to, electrically coupled to, or directly attached to ground contacts or via contacts in the same layer 1242 or level Lm as lines 1166. In some cases the ground lines 1166 are or include ground signals from, originating at, provided by, or generated by patch 1504, interposer 1506, package 1510, or another device attached to thereto as described for patch 704, interposer 706, package 710, or another device at FIGS. 11-14. This signal may have a voltage level as described at FIGS. 11-14.

Next, FIGS. 10A-B show package device 1550 having Level Ly with upper layer 1520 formed over or onto (e.g., touching) lower layer 826 which may be formed over or onto another layer of device 1550. Upper layer 1520 may be the same a layer 1210 described for FIGS. 11-14, except that it is formed onto layer 826 and located vertically adjacent to and between layers 1242 and 826. Lower layer 826 may include or be ground isolation plane 764 such as described for FIGS. 7-10, except that layer 1520 is formed onto layer 826 and it may be connected as appropriate for system 1500. Plane 764 may be the same as described for FIGS. 7-10, except that it is formed on a lower level of package device 1550, and may be connected as appropriate for system 1500.

Plane 764 may be directly physically connected to, electrically coupled to, or directly attached to ground contacts or via contacts in the same layer 826 as plane 764. In some cases, plane 764 is or includes ground signals from, originating at, provided by, or generated by patch 1504, interposer 1506, package 1510, or another device attached to thereto as described for patch 704, interposer 706, package 710, or another device at FIGS. 7-10. This signal may have a voltage level as described at FIGS. 7-10.

The embodiments of a ground isolated horizontal data signal transmission line package device 1550 may be described as a combined horizontal ground isolation planes and ground isolation coaxial lines separated data signal line package 1550.

The ground planes 760, 762 and 764 of package device 1550 may each be a ground isolation plane or planar structure across a layer vertically between each horizontal data signal transmission line (e.g., RX or TX) of two levels (e.g., Lm and Ln; or Lo and Lq) and all data signal transmission lines of all levels above (or below) that ground plane (e.g., that one level), thus reducing (e.g., by a factor or 2, 3, 5 or 10 times) "data signal transmission line" crosstalk between each of the horizontal data signal transmission lines of the one level (e.g., an "agressor") and all data signal transmission lines of all levels above (or below) that ground plane (e.g., those two levels).

The ground isolation lines 1160, 1162, 1164 or 1166 horizontally, vertically and coaxially surrounding the horizontal data signal transmission lines 738 RX or 748 TX in each of levels Lm-Lq may (1) reduce crosstalk between vertically adjacent ones of the horizontal data signal transmission lines 738 RX or 748 TX of different levels of levels Lm-Lq; and (2) reduce crosstalk between horizontally adjacent ones of the horizontal data signal transmission lines 738 RX or 748 TX in each of same level of levels Lm-Lq.

More specifically, FIGS. 9-10B show that each of levels Lm-Lq may have an upper layer of non-conductive (e.g., dielectric) material 703*a*; and a lower layer having conductor material (e.g., pure conductor or metal) data signal lines (e.g., traces) 738 RX or 748 TX between (1) horizontally adjacent non-conductive (e.g., dielectric) material portions 703*b* that are between (2) horizontally adjacent ground isolation lines 1160, 1162, 1164 or 1166 (e.g., traces) of conductor material (e.g., pure conductor or metal), such as described for FIGS. 11-14.

In some cases, ground lines of package device 1550 (e.g., lines 1160, 1162, 1164 and 1166) may reduce or decrease (e.g., by a factor or 2, 3, 5 or 10 times) "data signal transmission line" crosstalk (and optionally may increase electronic isolation) between one of the horizontal data signal transmission lines of one level (e.g., an "agressor" of level Lm, Ln, Lo or Lq) and a horizontally adjacent data same type (e.g., RX or TX) signal transmission line of the same level (e.g., that one level Lm, Ln, Lo or Lq), such as described for FIGS. 11-14. This may occur for each of the horizontal RX data signal lines in level Lm, Ln, Lo and Lq, such as described for FIGS. 11-14.

Each level of levels Lo-Lq of FIGS. 9-10B may also have staggered horizontal (e.g., lateral) spacing of its lower layer conductor material data signal lines 738 RX or 748 TX as compared to ground isolation lines 1160, 1162, 1164 or 1166 of a vertically adjacent level above it, such as described for FIGS. 11-14. However, in some cases, level Lo is not staggered with respect to level Ln as described for FIGS. 11-14 (e.g., lines 1162 are directly above lines 1164), such as due to isolation plane 762 providing vertical ground isolation for signal lines of level Ln in place of isolation lines 1164 of level Lo, and for signal lines of level Lo in place of isolation lines 1162 of level Ln.

Here, in some cases, one ground isolation line and one ground isolation plane vertically surround (e.g., are vertically to the top and bottom of) two non-conductive material layers 703*a* that vertically surround (e.g., are vertically to the top and bottom of) each data signal RX or TX line. For example, lines 1162 are vertically below each of lines 738 of level Lm, and ground isolation plane 760 is vertically above each of lines 738 of level Lm. Thus, lines 1162 and plane 760 vertically surround each of lines 738 of level Lm. Also, lines 1160 are vertically above each of lines 738 of level Ln, and ground isolation plane 762 is vertically below each of lines 738 of level Ln. Thus, lines 1160 and plane 762 vertically surround each of lines 738 of level Ln. In another example, lines 1166 are vertically below each of lines 748 of level Lo, and ground isolation plane 762 is vertically above each of lines 748 of level Lo. Thus, lines 1166 and plane 762 vertically surround each of lines 748 of level Lo. Next, lines 1164 are vertically above each of lines 748 of level Lq, and ground isolation plane 764 is vertically below each of lines 748 of level Lq. Thus, lines 1166 and plane 764 vertically surround each of lines 748 of level Lq. In some cases, the one ground isolation line and one ground isolation plane are described as vertically surrounding (e.g., are vertically above and below) each data signal line 738 RX or 748 TX in each of levels Lm-Lq.

In some cases, the combination of the ground planes of package device 1550 (e.g., planes 760, 762 and 764) and the ground lines of package device 1550 (e.g., lines 1160, 1162, 1164 and 1166) may reduce (e.g., by a factor or 2, 3, 5 or 10 times) "data signal transmission line" crosstalk (and optionally may increase isolation) between one of the horizontal data signal transmission lines of one level having signal lines (e.g., an "agressor" of level Lm, Ln, Lo or Lq) and a vertically adjacent data signal transmission line of a level that is two levels (e.g., two levels of levels having signal lines, or two levels of levels Lm, Ln, Lo or Lq) above or below the one transmission line (e.g., above or below the agressor level Lm, Ln, Lo or Lq).

In some cases, the levels of signal lines are also (or instead) vertically surrounded by the isolation planes, in addition to being vertically surrounded by the isolation lines (e.g., either above or below each level of signal lines). In one example, each pair of ground isolation planes of package device 1550 (e.g., pair of planes 760 and 762; or 762 and 764) vertically surrounds each level of the signal lines. For example, plane 762 may reduce (e.g., by a factor or 2, 3, 5 or 10 times) "data signal transmission line" vertical crosstalk (and optionally may increase isolation) produced or created by an "agressor" horizontal RX data signal transmission line 738 of levels Lm and Ln from reaching a vertically adjacent TX data signal transmission line of level Lo that is disposed two levels (e.g., two levels of levels having signal lines, or two levels of levels Lm, Ln, Lo or Lq) below the "agressor" RX line of levels Lm and Ln, such as due to plane 762 being disposed vertically between the signal transmission lines of level Lo and levels Lm and Ln. This may be in addition to vertical isolation provided by an isolation line, such as described above. It is considered that plane 760 cause the same reduction in vertical crosstalk caused by the RX lines of levels Lm and Ln from reaching the a vertically adjacent TX lines of a level above plane 760. Here it can be said the planes 760 and 762 vertically surround levels Lm and Ln.

Similarly, in some cases, plane 762 may reduce (e.g., by a factor or 2, 3, 5 or 10 times) "data signal transmission line" vertical crosstalk (and optionally may increase isolation) produced or created by an "agressor" horizontal TX data signal transmission line 748 of levels Lo and Lq from reaching a vertically adjacent RX data signal transmission line of level Ln that is disposed two levels (e.g., two levels of levels having signal lines, or two levels of levels Lm, Ln, Lo or Lq) above the "agressor" TX line of levels Lo and Lq, such as due to plane 762 being disposed vertially between the signal transmisstion lines of level Ln and levels Lo and Lq. It is considered that plane 764 cause the same reduction in vertical crosstalk caused by the TX lines of levels L7*p* and Lq from reaching the a vertically adjacent RX lines of a level below plane 764. Here it can be said the planes 764 and 762 vertically surround levels Lo and Lq.

In some cases, due to the ground isolation planes (e.g., plane 762), it may not be necessary to horizontally stagger signal lines of level Lo from signal lines of level Ln. In addition, in some cases, it may not be necessary to horizontally stagger signal lines of level Lo from signal lines of level Lm. Also, in some cases, it may not be necessary to horizontally stagger signal lines of level Lo from signal lines of level Lq. Furthermore, in some cases, it may not be necessary to horizontally stagger signal lines of level Lq from signal lines of level Lm.

According to embodiments, by being planes and lines of conductive material electrically grounded (e.g., having a ground signal), each of ground isolation lines 1160-1166 and/or planes 760-164 may absorb, or shield electromagnetic crosstalk signals produced by (or increase electronic isolation from) one data signal transmission line of the vertically adjacent levels (of levels Lm, Ln, Lo or Lq) two levels above (or below) the lines, from reaching each of the data signal transmission line of the one level, due to the amount of grounded conductive material, and location of the conductive grounded material between the two levels. This may include reducing electrical crosstalk caused by undesired capacitive, inductive, or conductive coupling of a first data signal type (e.g., RX or TX) received or transmitted through one of the horizontal data signal transmission lines of the vertically adjacent levels (e.g., an "agressor") from reaching (e.g., effecting or being mirrored in) a second data signal type (e.g., TX or RX; the opposite of the first type RX or TX, respectively) received or transmitted through the horizontal data signal transmission lines of the one level that the ground lines shields.

The combination of the two ground isolation lines (e.g., two of each of lines 1160, 1162, 1164 or 1166) are horizontally surrounding each data signal line 738 RX or 748 TX in each of levels Lm-Lq; and the two ground isolation planes (e.g., pair of planes 760 and 762; or 762 and 764) and optionally isolation lines (e.g., a pair of lines 1160 and plane 762; or plane 762 and lines 1166) vertically surrounding each data signal line 738 RX or 748 TX in each of levels Lm-Lq may be described as four ground isolation lines "coaxially" surrounding each data signal line 738 RX or 748 TX in each of levels Lm-Lq.

In some cases, each date signal RX line of level Ln (e.g., layer 1222) can be said to be coaxially surrounded by being (1) horizontally surrounded by two ground isolation lines 1162 of level Ln (e.g., layer 1222), (2) vertically surrounded by ground isolation line 1160 of level Lm (and/or optionally plane 760) and plane 762 of level Lx (and/or optionally line 1164 of level Lo). Also, in some cases, each date signal TX line of level Lo (e.g., layer 1232) can be said to be coaxially surrounded by being (1) horizontally surrounded by two ground isolation lines 1164 of level Lo (e.g., layer 1232), (2) vertically surrounded by ground isolation line 1166 of level Lq (and/or optionally plane 764) and plane 762 of level Lx (and/or optionally line 1162 of level Ln).

In some cases, the four ground isolation lines "coaxially" surrounding each horizontal data signal line 738 RX or 748 TX in each of levels Lm-Lq provides or causes the combination of (1) the two ground isolation lines (e.g., two of each of lines 1160, 1162, 1164 or 1166) horizontally surrounding each data signal line 738 RX or 748 TX in each of levels Lm-Lq to reduce or decrease (e.g., by a factor or 2, 3, 5 or 10 times) "data signal transmission line" crosstalk (and optionally may increase electronic isolation) between each of the horizontal data signal transmission lines of one level (e.g., level Lm, Ln, Lo or Lq) and a horizontally adjacent data same type (e.g., RX or TX) signal transmission line of the same level (e.g., that one level Lm, Ln, Lo or Lq); and (2) the ground isolation lines and/or planes vertically surrounding each data signal line 738 RX or 748 TX in each of levels Lm-Lq to decrease (e.g., by a factor or 2, 3, 5 or 10 times) "data signal transmission line" crosstalk (and optionally may increase isolation) between one of the horizontal data signal transmission lines of one level (e.g., an "agressor" of level Lm, Ln, Lo or Lq) and a vertically adjacent data signal transmission line of a level two levels of level Lm, Ln, Lo or Lq above or below the one transmission line. In some embodiments, ground isolation lines and planes reduce electrical crosstalk and increase electrical isolation as noted above without re-ordering any horizontal order or sequence of the horizontal data signal transmission lines in a layer or level.

It is noted that for package device 1550, signal lines of level Lm are diagonally isolated by plane 760 from signal lines above plane 760; that signal lines of level Ln are diagonally isolated by plane 762 from signal lines of levels Lo and Lq below plane 762; that signal lines of level Lo are diagonally isolated by plane 762 from signal lines of levels Ln and Lm above plane 762; and that signal lines of level Lq are diagonally isolated by plane 766 from signal lines below plane 766.

Due to the ground isolation planes, in some cases, it may not be necessary to diagonally space (e.g., by a predetermined, tuning determined, selected or otherwise designed distance) the RX and TX lines of the different levels sufficiently so that crosstalk is low enough and isolation is high enough for the data signal lines to operate at the speeds and other characteristics as noted herein. In some cases, due to plane 762 it may not be necessary to provide such diagonally spacing of the signal lines of level Lo from signal lines of level Ln.

Figure 17:
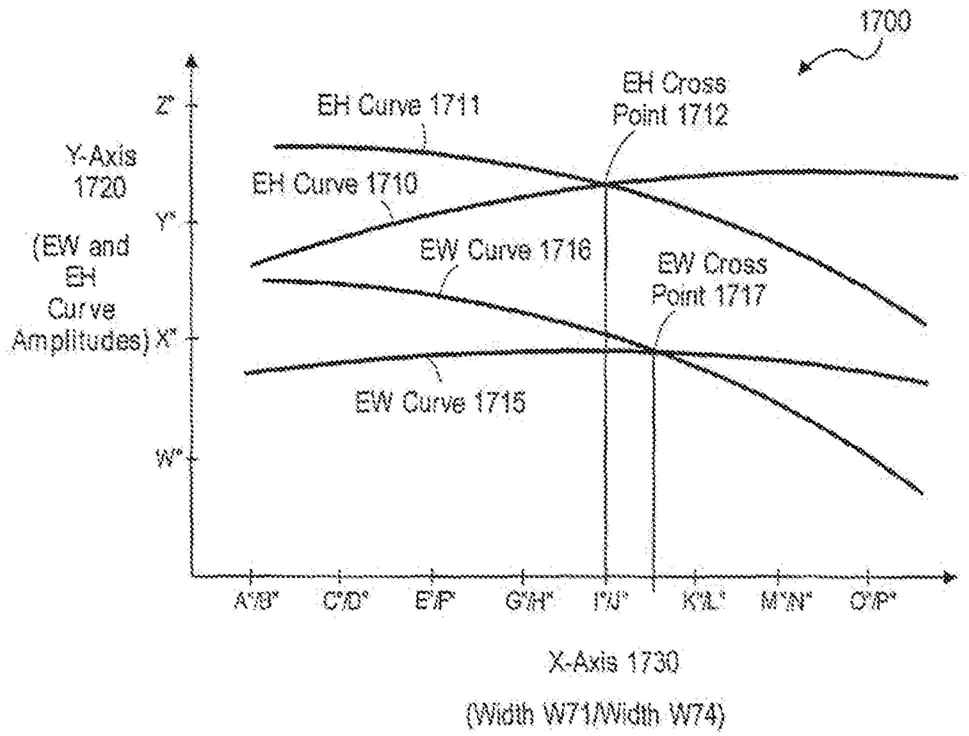
FIG. 17 shows a plot of eye height (EH) curves; and eye width (EW) curves of an eye diagram produced by testing one of horizontal data signal transmission signal lines for a range of horizontal data signal transmission line width and ground line width, such as where spacing is constant between horizontally adjacent signal lines and ground lines.

FIG. 17 shows a plot of eye height (EH) curves; and eye width (EW) curves of an eye diagram produced by testing one of horizontal data signal transmission signal lines for a range of horizontal data signal transmission line width and ground line width, such as where spacing is constant between horizontally adjacent signal lines and ground lines. In some cases, the horizontal signal lines 738 and 748; and the ground lines (e.g., 1160, 1162, 1164 and 1166) of device 1550 are impedance tuned (e.g., see FIG. 17) to minimize impedance discontinuity and crosstalk between vertically adjacent and horizontally adjacent ones of signal lines 738 or 748 (e.g., a channel) of device 1550. This may include performing such tuning to determine or identify: (1) a selected target width W71 (and optionally height H73) of one of signal lines 738 or 748 (e.g., given other set or known heights and widths such as noted below); and (2) a selected target width W74 (and optionally height H73) of one of the ground lines (e.g., 1160, 1162, 1164 or 1166) (e.g., given other set or known heights and widths such as noted below) that provides a the best channel performance as showed as the lowest amplitude cross point of eye height (EH) or eye width (EW) curves (e.g., see FIG. 17) of an eye diagram (e.g., see FIG. 9B) produced by testing one of signal lines 738 or 748. The EH and EW curves (e.g., curves 1710-1711 and 1715-1716) may be output signal measure (or computer modeled) at a location of the data signal line 738 or 748 when (e.g., as a result of running) one or more input test data signals are sent through length L7*p* of the data signal line such as described for FIGS. 3A-B to determine or identify isolated horizontal data signal transmission line widths W71 and ground line width W74 (optionally, and spacing W75) that are single line impedance tuned (e.g., see FIG. 17) in the routing segment of device 1550 along the channel of signal lines 738 and 748 along length L7*p*.

Impedance tuning of the signal line may be based on or include as factors: horizontal data signal transmission line width W71, height H73, length L7*p*; horizontal ground isolation line width W74, height H73, length L7*p*; width W75 between the isolation lines and horizontally adjacent horizontal data signal transmission lines of device 1550; and height H74 between a signal line and a vertically adjacent grounding line (or isolation plane) of device 1550. In some cases, once the length L7*p*, width W75, height H74 and height H73 are known (e.g., predetermined or previously selected based on a specific design of a package device 1550), then tuning is performed (e.g., computer simulation, actual "beta" device testing, or other laboratory testing) to determine or identify a ranges of width W71 and W74 that provide the best channel performance as showed as the lowest amplitude cross point of eye height (EH) or eye width (EW) curves of an eye diagram produced by testing one of signal lines 738 or 748.

For example, FIG. 17 shows a plot of eye height (EH) curves 1710 and 1711; and eye width (EW) curves 1715 and 1716 of an eye diagram (e.g., see FIG. 9B) produced by testing one of horizontal data signal transmission signal lines 738 or 748 for a range of horizontal data signal transmission line width W71 and ground line width W74, such as where spacing W72 is constant between horizontally adjacent signal lines (e.g., lines 738 or 748) and ground lines (e.g., lines 1160, 1162, 1164 or 1166). The testing may include measuring or modeling an output signal in response to an input signals such as step up (e.g., __|‾) and down (e.g., ‾|__) signals as noted above for FIG. 9A. EH curve 1710 may be the EH curve for a first design or use of device 1550 that is independent of (e.g., not based on or does not consider) the above noted factors (e.g., horizontal data signal transmission line width W71, ground line width W74, height H73, length L7*p*; width W75 between the signal line and a horizontally adjacent ground lines of device 750; and height H74 between the signal line and a vertically adjacent grounding line or isolation plane of device 750). EH curve 1711 may be the EH curve for a second, different design or use of device 1550 that is independent of the above noted factors. EW curve 1715 may be the EW curve for the first design or use of device 750 that is independent of the above noted factors. EW curve 1716 may be the EW curve for the second, different design or use of device 1550 that is independent of the above noted factors.

In some cases, such a design or use may include where the different curves represent different manufacture variation combinations, such as where a low impedance package (e.g., package 1510) is connected to high impedance interposer (e.g., interposer 1506). In some cases, such a design or use may include where the different curves represent different corner combinations, or possible component variation combinations. In some cases, such a design or use may include where the different curves represent different designs or usees to tune the impedance to maximize the channel performance. In some cases, FIG. 11A shows EH and EW curves from various channels combining possible package and interposer manufacturing corners, (max/typical/min impedance corners from manufacturing variations). In some cases, for example, max Z patch+min Z interposer+max Z package, where Z denotes impedance. In some cases, the common or intersection area below the EH or EW curvers shows the channel EH/EW solution space. In some cases, the optimized impedance value is tied to the the cross point of EH or EW curves which provides the max EH/EW enveloping all the possible channel manufacture variations.

As described for EH curves 910-911 of FIGS. 3A-B, EH curves 1710-1711 may be examples of an eye-height for different designs, and different signal line width W71 and ground line width W74 (e.g., where spacing W72 is constant) for device 1550. Also, as described for EW curves 315-316 of FIGS. 3A-B, EW curves 1715-1716 may be examples of an eye-width for the different designs, and the different signal line width W71 and ground line width W74 (e.g., where spacing W72 is constant) for device 1550.

In some cases, curves 1710-1711 and 1715-1716 are for a selected (e.g., predetermined, desired, constant or certain) length L7*p* of the horizontal data signal transmission line (e.g., RX line 738 or TX line 748) and ground isolation lines (and isolation planes) of package device 1550. In some cases, curves 1710-1711 and 1715-1716 are also for a selected signal line and ground line height H73 and spacing H74 between the signal line and a vertically adjacent ground line (or isolation plane).

In some other cases, tuning includes knowing length L7*p*, width W75 and height H74, then tuning to determine or identify a range of width W71, width W74 and height H73 that provides a predetermined or target impedance for the line.

More specifically, FIG. 17 shows graph 1700 plotting the amplitude of tuning curves 1710-1711 and 1715-1716 along vertical Y-axis 1720 for different pairs of width W71 of a signal line (e.g., RX line 738 or TX line 748) and width W74 of ground lines (e.g., where spacing W75 is constant value or distance between horizontally adjacent one of the signal lines (e.g., RX or TX lines 738 or 748) and ground lines (e.g., lines 1160, 1162, 1164 or 1166) along horizontal X-axis 1730. Although FIG. 17 shows the amplitude of curves 1710-1711 and 1715-1716 on the same graph 1700, it can be appreciated that they may be on different graphs having different amplitude scaled Y-axis but the same X-axis 1730 (e.g., the curves are all shown vertically scaled on graph 1700 (e.g., moved up or down axis 1720) to compare the cross points for the curves). Curves 1710-1711 and 1715-1716 may be output signal measure (or computer modeled) at a location of the data signal line when (e.g., as a result of running) the one or more test data signals are sent through length L7*p* of the data signal line (e.g., RX line 738 or TX line 748) of device 1550.

Graph 1700 shows cross point 1712 of EH curves 1710 and 1711. I can be appreciated that curves 1710 and 1711 represent more than two curves, but that those curves have a lowest Y-axis cross point at point 1712. Graph 1700 shows cross point 1717 of EW curves 1715 and 1716. I can be appreciated that curves 1715 and 1716 represent more than two curves, but that those curves have a lowest Y-axis cross point at point 1717.

FIG. 17 shows EW and EH curve amplitudes along vertical axis 1720 having values W", X", Y" and Z", such as representing different amplitudes for curves 1710-1711 or 1715-1716 (e.g., curves 1715-1716 or 1710-1711 may be scaled, respectively, to fit onto the same graph or plot). In some cases, for curves 1710-1711 values W", X", Y" and Z", represent different linearly increasing EH signal amplitude values (e.g., voltage amplitudes of EH derived from a test signal) such as 0.2, 0.25, 0.3 and 0.35 volts. In some cases, for curves 1715-1716 values W", X", Y" and Z", represent different linearly increasing EW signal time values (e.g., time values of EW derived from a test signal) such as 4.0, 4.5, 5.0 and 5.5 E-11 seconds. FIG. 17 shows pairs of width W71/width W74 along horizontal axis 1730 having pair values A"/B", C"/D", E"/F", G"/H", I"/J", K"/L", M"/N" and O"/P". In some cases, the aggregate (e.g., addition) of each pair of values (e.g., value A" plus value B"; or value O" plus value P", etc.) represents the same sum or a first constant; and that first constant plus two times the spacing width W75 is a second constant (e.g., such as pitch width PW2). In some cases, the signal line width W71 and ground line width W74 vary in an inversely proportional manner to add up to the first constant, such as where if W71 increases by a value (e.g., W71+W"), W74 decreases by that value (e.g., W74-W"), and vice versa. In some cases, the signal line width W71 and ground line width W74 may be described as being inversely proportional. In some cases, (1) the second constant is signal line to signal lined pitch width PW2; and (2) the signal line width W71 and ground line width W74 vary in an inversely proportional manner so that the addition of W71+W74+2×W5=PW2 (e.g., the second constant).

In some cases, PW2 is between 100 and 200 um. In some cases, it is between 720 and 150 um. In some cases it is between 730 and 140 um. In some cases, pair values A"/B" represent width W71 between 60 and 80 um, and width W74 between 55 and 75 um; pair values O"/P" represent width W71 between 25 and 45 um, and width W74 between 90 and 110 um; and the other pairs are at linear intervals between values A"/B" and values O"/P". In some cases, pair values A"/B" represent width W71/width W74 of 70/65 um, pair values C"/D" represent width W71/width W74 of 65/70 um, pair values E"/F" represent width W71/width W74 of 60/75 um, pair values G"/H" represent width W71/width W74 of 55/80 um, pair values I"/J" represent width W71/width W74 of 50/85 um, pair values K"/L" represent width W71/width W74 of 45/90 um, pair values M"/N" represent width W71/width W74 of 40/95 um, and pair values O"/P" represent width W71/width W74 of 35/100 um.

In some cases, Y-axis 1720 represents eye-height or eye-width which are the figures of merit to quantify the channel performance of the tested signal line (e.g., RX line 738 or TX line 748); and X-axis 1730 is the combination of signal line width W71/width W74 (with constant spacing W75) at constant pitch (line width W71+width W74+2×W5=constant pitch PW, such as PW2). According to embodiments, the impedance tuning of horizontal signal line 738 or 748 of device 1550 includes (or is) selecting (or “tuning”) single horizontal routing signal line (e.g., TX and RX line) impedance, such as to select (or “tune” the TX and RX lines to or at) the combination of signal line width W71/width W74 to an optimized point to achieve the best channel performance as showed as the lowest cross point of EH or EW curves (e.g., such as shown in FIG. 17).

According to embodiments, the impedance tuning of horizontal signal line 738 or 748 of device 1550 includes various possible selections of one or a range of locations on X-Axis 1730 selected based on or as a result of a calculation using EH and EW cross point 1712 and/or point 1717. It can be appreciated that such tuning may include selecting or identifying one or a range of width W71/width W74 along axis 1730 for one or both of (1) signal lines 738 and ground line pairs 1160/1162, or (2) signal lines 748 and ground line pairs 1164/1166, based on or as a result of a calculation using cross point 1712 and/or point 1717.

In some cases, such impedance tuning includes or is selecting the lowest amplitude cross point 1712 of eye height (EH) curves 1710-1712 or of eye width (EW) curves 1715-1716 of an eye diagram produced by testing one of signal lines 738 or 748. Here, for example, as shown in FIG. 17, X-axis 1730 location I"/J" which is under point 1712; or a location at midpoint between I"/J" and K"/L" which is under point 1712 may be chosen for width W71 and width W74 for one or both of (1) signal lines 738 and ground line pairs 1160/1162, or (2) signal lines 748 and ground line pairs 1164/1166. In some cases, one of those locations may be used for both of (1) signal lines 738 and ground line pairs 1160/1162, and (2) signal lines 748 and ground line pairs 1164/1166. In some cases, a range of width W71 and width W74 around either of those locations (e.g., a W71 and W74 tolerance, such as 5 or 10 percent around either location) may be used for both of (1) signal lines 738 and ground line pairs 1160/1162, and (2) signal lines 748 and ground line pairs 1164/1166. In some cases, a range of width W71 and width W74 between those locations (e.g., a W71 and W74 tolerance within that range or any location within that range) may be used for both of (1) signal lines 738 and ground line pairs 1160/1162, and (2) signal lines 748 and ground line pairs 1164/1166.

According to some embodiments, the impedance tuning includes or is selecting the lowest amplitude cross point 1712 and point 1717 produced by testing one of signal lines 738 or 748. Here, for example, as shown in FIG. 17, an X-axis 1730 location between (e.g., midpoint between, and average of, or another statistical calculation between) I"/J" which is under point 1712 and a midpoint between I"/J" and K"/L" which is under point 1712 may be chosen for width W71 and width W74 for one or both of (1) signal lines 738 and ground line pairs 1160/1162, or (2) signal lines 748 and ground line pairs 1164/1166. In some cases, the location between may be used for both of (1) signal lines 738 and ground line pairs 1160/1162, and (2) signal lines 748 and ground line pairs 1164/1166. In some cases, a range of width W71 and width W74 around the location between (e.g., a W71 and W74 tolerance, such as 5 or 10 percent around either location) may be used for both of (1) signal lines 738 and ground line pairs 1160/1162, and (2) signal lines 748 and ground line pairs 1164/1166. It can be appreciated that various other appropriate locations may be selected based on cross points 1712 and 1717.

It can be appreciated that such tuning as noted above may be for or represent tuning of a single one of, all of a level of, or all of (1) signal lines 738 and ground line pairs 1160/1162, or (2) signal lines 748 and ground line pairs 1164/1166 of device 1550. It can be appreciated that such tuning as noted above may be represent by curves different than the convex curves 1710-1711 and 1715-1716 shown in FIG. 17, such as where the selected width W71/width W74 along axis 1730 is selected to be at the highest point of the different curve along the vertical axis 1720.

In some cases, this impedance tuning provides (e.g., by determining or identifying a range of or selected target width W71 and width W74 for both of (1) signal lines 738 and ground line pairs 1160/1162, or (2) signal lines 748 and ground line pairs 1164/1166): (1) the best channel performance for lines 738 and 748 (e.g., having length L7*p*; width W71; width W74, pitch PW2 between the line and a horizontally adjacent horizontal data signal transmission line of device 1550; and height H74 between the line and a vertically adjacent grounding line (or isolation plane) of device 1550), (2) electrical isolation of horizontal data signal transmission lines (e.g., signal lines 738 and 748) that are single line impedance tuned in the routing segment of device 1550 along the channel (e.g., signal lines 738 or 748 along length L7*p*), and (3) minimized impedance discontinuity and crosstalk between vertically adjacent and horizontally adjacent ones of signal lines 738 or 748 of device 1550.

In some cases, the tuning above includes separately tuning lines 738 and 748 of interposer 1506, patch 1504 and package 1510. In some cases, it includes separately tuning lines 738 and 748 of interposer 1506, patch 1504 or package 1510. In some cases, the tuning above includes tuning lines 738 and 748 of interposer 1506 are tuned, but the signal lines of patch 1504 and package 1510 are not. In some cases, the width W71 and width W74 of interposer 1506 are determined by tuning as noted above; and the width W71 and width W74 of patch 1504 and package 1510 are determined based on other factors, or design parameters that do not include the tuning noted above.

Figure 18:
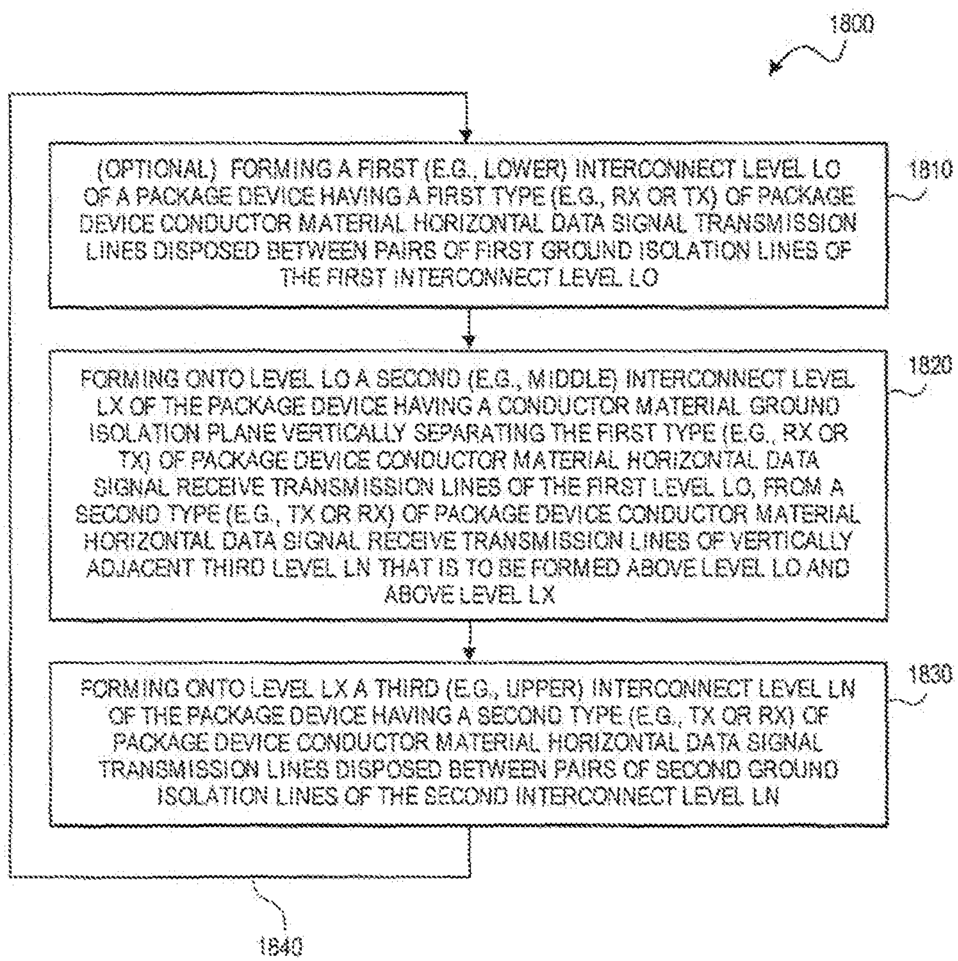
FIG. 18 is a flow chart illustrating a process for forming a combined horizontal ground isolation planes and ground isolation coaxial lines separated data signal line package, according to embodiments described herein.

FIG. 18 is a flow chart illustrating a process for forming a combined horizontal ground isolation planes and ground isolation coaxial lines separated data signal line package, according to embodiments described herein. FIG. 18 shows process 1800 which may be a process for forming embodiments described herein of package 1550 of any of FIGS. 15-19. In some cases, process 1800 is a process for forming a ground isolated horizontal data signal transmission line package device that has ground isolation planes separating vertically adjacent levels of horizontal data signal receive and transmit lines; and ground isolation “coaxial” lines separating vertically adjacent and horizontally adjacent ones of horizontal data signal receive and transmit lines.

Process 1800 begins at optional block 1810 at which a first (e.g., lower) interconnect level Lo of a package device is formed, having a first type (e.g., RX or TX) of package device conductor material horizontal data signal transmission lines disposed between pairs of horizontally adjacent first ground isolation lines of the first interconnect level Lo. Block 1810 may also include forming first (e.g., lower) level Lo to have package device non-conductive material portions of the first interconnect level Lo disposed (e.g., horizontally adjacent) between each of the first type (e.g., RX or TX) of package device conductor material horizontal data signal receive transmission lines and each of the first ground isolation lines of the first interconnect level Lo.

Block 1810 may also include forming the first (e.g., lower) interconnect level Lo of the package device with a first level package device non-conductive material layer formed on (e.g., touching) or over a layer having the first type (e.g., RX or TX) of package device horizontal data signal lines, the first ground isolation lines, and the non-conductive material portions of the first interconnect level Lo.

In some cases, block 1810 includes forming non-conductive material layer 703*a* of the first (e.g., lower) interconnect level Lo (e.g., layer 1230) on (e.g., touching) or over a layer (e.g., layer 1232) having the first type TX horizontal data signal lines 748, first ground isolation lines 1164, and non-conductive material portions 703*b* of first interconnect level Lo.

In some cases, block 1810 may only include forming lower layer 1232 of level Lo with first type of data TX signal 748 lines disposed horizontally between dielectric material portions 703*b* which are disposed between horizontally adjacent first ground isolation lines 1164 of the first interconnect level Lo; and then forming upper layer 1230 of or having dielectric material onto layer 1232.

A first example embodiment of block 1810 may include (e.g., prior to forming the upper layer 1230), forming a mask (e.g., DFR, not shown) over a top surface of an upper layer 1240 (e.g., of ajinomoto build up film (ABF)), the mask having (1) first openings over layer 1240 in which to form the first type of data TX signal 748 lines of layer 1232 and (2) second openings over layer 1240 in which to form the horizontally adjacent first ground isolation lines 1164. In some cases, the first openings may be horizontally open to and in communication with different, third openings in the mask over layer 1240 in which data TX signal contacts or data TX signal via contacts will be formed. In some cases, the second openings may be horizontally open to and in communication with fourth openings in the mask over layer 1240 in which ground signal contacts or via contacts will be formed.

Some of these cases may include electroless plating of a seed layer of the conductor material over layer 1240, prior to forming the masks layer. In this case, block 1810 may then include simultaneously forming conductive material (e.g., plating on the exposed seed layer of the openings) to form the data TX signal 748 lines and isolation lines 1164 of layer 1232 in the first and second openings (and optionally the data TX signal or via contacts in the third openings; and the ground signal contacts or via contacts in the fourth openings of layer 1232).

In some of these cases, simultaneously forming the conductive material may include forming that conductive material of all of data TX signal 748 lines and isolation lines 1164 of layer 1232 (and optionally all of the data TX signal or via contacts; and the ground signal contacts or via contacts of layer 1232) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 703*b* (e.g., of ajinomoto build up film (ABF)) may be deposited where the mask was removed. In some cases, forming the mask includes forming a blanket layer of mask material and etching the blanket layer to form the first (and optionally second) openings.

Next, at block 1820 a second (e.g., middle) level Lx of the package device is formed over or onto (e.g., touching) level Lo; level Lx having a conductor material (e.g., pure conductor or metal) ground isolation plane vertically separating the first type (e.g., RX or TX) of package device conductor material horizontal data signal transmission lines of the first level Lo, from a second type (e.g., TX or RX; the opposite of the first type RX or TX, respectively) of package device conductor material horizontal data signal transmission lines (e.g., a second type of data signal lines or traces, such as TX or RX data signal lines disposed between package device non-conductive material portions) of vertically adjacent level Ln that is to be formed above level Lo (and above level Lx).

In some cases, block 1820 may only include forming lower layer 816 of level Lx having a conductor material ground isolation plane 762 onto upper layer 1230 of level Lo; and forming upper layer 1515 of level Lx of dielectric material layer 703*a*. In some cases, block 1820 includes first forming lower layer 816 onto layer 1230 (e.g., as noted above), then forming upper layer 1515 of or having dielectric material 703*a* onto layer 816.

A first example embodiment of block 1820 may include (e.g., prior to forming the upper layer 1515), forming a mask (e.g., DFR, not shown) over a top surface of upper layer 1230 (e.g., of ajinomoto build up film (ABF) of level Lo, the mask having (1) a first opening over layer 1230 in which to form isolation plane 762 of layer 816. In some cases, the first opening may be horizontally open to and in communication with different, second openings in the mask over layer 1230 in which ground contacts or ground vial contacts will be formed. Some of these cases may include electroless plating of a seed layer of the conductor material over layer 1230, prior to forming the masks layer.

In this case, block 1820 may then include simultaneously forming conductive material (e.g., plating on the exposed seed layer of the openings) to form the isolation plane 762 of layer 816 in the first openings (and optionally the ground contacts or ground vial contacts in the second openings of layer 816).

In some of these cases, simultaneously forming the conductive material may include forming that conductive material of all of isolation plane 762 of layer 816 (and optionally all of the ground contacts or ground vial contacts in the second openings of layer 816) during the same process, deposition or growth of that conductive material in the first (and optionally second) openings. In some cases, simultaneously forming the conductive material includes electrolytic plating of conductor material in the first (and optionally second) openings (e.g., on the electroless plating of seed layer).

In some cases of these, after simultaneously forming the conductive material, the mask is removed. This removal may also include removing the seed layer from between the openings. Then dielectric material (e.g., of ajinomoto build up film (ABF)) may be deposited where the mask was removed. In some cases, forming the mask includes forming a blanket layer of mask material and etching the blanket layer to form the first (and optionally second) openings.

Next, at block 1830 a third (e.g., upper) interconnect level Ln of the package device is formed over or onto (e.g., touching) level Lx; level Ln having a second type (e.g., TX or RX; the opposite of the first type RX or TX, respectively) of package device conductor material horizontal data signal transmission lines disposed between pairs of horizontally adjacent second ground isolation lines of the second interconnect level Ln. In some cases, block 1830 includes forming the third level so that the second type of transmission lines of third level Ln are horizontally offset to be directly above the first ground isolation lines of the first interconnect level Lo. Block 1830 may also include forming third level Ln to have package device non-conductive material portions of level Ln disposed (e.g., horizontally adjacent) between each of the second type (e.g., TX or RX) of package device conductor material horizontal data signal transmission lines and each of the second ground isolation lines of level Ln.

Block 1830 may also include forming level Ln of the package device with a third level package device non-conductive material layer formed on (e.g., touching) or over a layer having the second type (e.g., TX or RX) of package device horizontal data signal lines, the second ground isolation lines, and the non-conductive material portions of level Ln.

In some cases, block 1830 includes forming non-conductive material layer 703*a* of the third interconnect level Ln (e.g., layer 1220) on (e.g., touching) or over a layer (e.g., layer 1222) having the second type RX horizontal data signal lines 738, second ground isolation lines 1162, and non-conductive material portions 703*b* of second interconnect level Ln of package device 1550.

In some cases, block 1830 may only include forming lower layer 1222 of level Ln with second type of data RX signal 738 lines disposed horizontally between dielectric material portions 703*b* which are disposed between horizontally adjacent second ground isolation lines 1162 of the second interconnect level Ln; and then forming upper layer 1220 of or having dielectric material onto layer 1222.

A first example embodiment of block 1830 may include (e.g., prior to forming the upper layer 1220), forming a mask (e.g., DFR, not shown) over a top surface of upper layer 1515 (e.g., of ajinomoto build up film (ABF) of level Lx, the mask having (1) first openings over 1515 in which to form the second type of data RX signal 738 lines of layer 1222 and (2) second openings over layer 1515 in which to form the horizontally adjacent second ground isolation lines 1162. In some cases, the first openings may be horizontally open to and in communication with different, third openings in the mask over layer 1515 in which data RX signal contacts or via contacts will be formed. In some cases, the second openings may be horizontally open to and in communication with fourth openings in the mask over layer 1515 in which ground signal contacts or via contacts will be formed.

Some of these cases may include electroless plating of a seed layer of the conductor material over layer 1515, prior to forming the masks layer. In this case, block 1830 may then include simultaneously forming conductive material (e.g., plating on the exposed seed layer of the openings) to form the second type of data RX signal 738 and isolation lines 1162 of layer 1222 in the first and second openings (and optionally the data RX signal or via contacts in the third openings; and the ground signal contacts or via contacts in the fourth openings of layer 1222).

In some of these cases, simultaneously forming the conductive material may include forming that conductive material of all of second type of data RX signal 738 and isolation lines 1162 of layer 1222 (and optionally all of the data RX signal or via contacts; and the ground signal contacts or via contacts of layer 1222) during the same process, deposition or growth of that conductive material in the first and second (and optionally third and fourth) openings. In some cases, simultaneously forming the conductive material includes electrolytic plating of conductor material in the first and second (and optionally third and fourth) openings (e.g., on the electroless plating of seed layer).

In some cases of these, after simultaneously forming the conductive material, the mask (e.g., DFR) is removed. This removal may also include removing the seed layer from between the openings. Then dielectric material 703*b* (e.g., of ajinomoto build up film (ABF)) may be deposited where the mask was removed. In some cases, forming the mask includes forming a blanket layer of mask material and etching the blanket layer to form the first (and optionally second) openings.

In some performances of process 1800, optional block 1810 is performed twice, once, first, to form a “zero” (e.g., lowest; “zero” indicating below the first level Lo) level Lq of the package device, and then repeated to form level Lo. The first performance of block 1810 forms a zero (e.g., lowest) interconnect level Lq of a package device, prior to forming level Lo, where level Lq is formed having the first type (e.g., RX or TX) of package device conductor material horizontal data signal transmission lines disposed between pairs of horizontally adjacent zero ground isolation lines of level Lq; where the first type of transmission lines of level Lq are horizontally offset to be directly below the first ground isolation lines of level Lo; and where the first and zero ground isolation lines and the ground isolation plane (e.g., of the lowest, lower and middle levels) coaxially surround each of the first type of data signal transmission lines of the first level Lo.

This first performance of block 1810 may also include forming level Lq to have package device non-conductive material portions of level Lq disposed (e.g., horizontally adjacent) between each of the first type (e.g., RX or TX) of package device conductor material horizontal data signal receive transmission lines and each of the zero ground isolation lines of level Lq.

This first performance of block 1810 may also include forming level Lq of the package device with a zero level package device non-conductive material layer formed on (e.g., touching) or over a layer having the first type (e.g., RX or TX) of package device horizontal data signal lines, the zero ground isolation lines, and the non-conductive material portions of level Lq.

In some cases, this first performance of block 1810 includes forming non-conductive material layer 703*a* of the first (e.g., lower) interconnect level Lq (e.g., layer 1240) on (e.g., touching) or over a layer (e.g., layer 1242) having the first type TX horizontal data signal lines 748, zero ground isolation lines 1166, and non-conductive material portions 703*b* of level Lq.

In some performances of process 1800, block 1830 is performed twice, once, first, to form second level Ln, and then repeated to form third (e.g., uppermost or top) level Lm of the package device. The repeat or second performance of block 1830 forms a third (e.g., uppermost) interconnect level Lm of a package device, after forming level Ln, where level Lm is formed having the second type (e.g., TX or RX) of package device conductor material horizontal data signal transmission lines disposed between pairs of horizontally adjacent third ground isolation lines of level Lm; where the second type of transmission lines of level Lm are horizontally offset to be directly above the second ground isolation lines of level Ln; and where the second and third ground isolation lines and the ground isolation plane (e.g., of the uppermost, upper and middle levels) coaxially surround each of the second type of data signal transmission lines of the second level Ln.

This second performance of block 1830 may also include forming level Lm to have package device non-conductive material portions of level Lm disposed (e.g., horizontally adjacent) between each of the second type (e.g., TX or RX) of package device conductor material horizontal data signal receive transmission lines and each of the third ground isolation lines of level Lm.

This second performance of block 1830 may also include forming level Lm of the package device with a third level package device non-conductive material layer formed on (e.g., touching) or over a layer having the second type (e.g., TX or RX) of package device horizontal data signal lines, the third ground isolation lines, and the non-conductive material portions of level L.

In some cases, this second performance of block 1830 includes forming non-conductive material layer 703*a* of level Lm (e.g., layer 1210) on (e.g., touching) or over a layer (e.g., layer 1212) having the second type RX horizontal data signal lines 738, third ground isolation lines 1160, and non-conductive material portions 703*b* of level Lm.

In some cases of process 1800, block 1810 is performed twice as noted above, and then block 1820 is performed once, but block 1830 is not performed. In some cases of process 1800, block 1810 is not performed, block 1820 is performed once, and then block 1830 is performed twice as noted above. In some cases of process 1800, block 1810 is performed twice as noted above, and then block 1820 is performed once, and then block 1830 is performed twice as noted above.

Next, at return arrow 1840, process 1800 may continue by returning to another performance of blocks 1810, 1820 and 1830 as noted above to form more levels of signal lines located between ground isolation lines, and levels having ground planes. Process 1800 may continue this way until a predetermined or sufficient number of levels or performances of processes 1800 are completed to form a desired package device 1550. In some cases, it may repeat 3 to 10 times.

Next, in a first example case of process 1800, block 1810 may only include forming layer 1232 as described herein; block 1820 may only include forming layer 816 as described herein; and block 1830 may only include forming layer 1222 as described herein. In a second example case, block 1810 may include forming layers 1230 and 1232 as described herein; block 1820 may include forming layers 1510 and 816 as described herein; and block 1830 may include forming layers 1220 and 1222 as described herein.

It can be appreciated that although FIGS. 15-19 show and corresponding descriptions describe for level Lm having RX signal lines, level Ln having RX signal lines, level Lo having TX signal lines, and level Lq having TX signal lines, the figures and descriptions also apply to embodiments where the TX and RX of those signal lines may be reversed. It can be appreciated that although FIGS. 15-19 show and corresponding descriptions describe embodiments for level Lm having RX signal lines, level Ln having RX signal lines, level Lo having TX signal lines, and level Lq having TX signal lines, the figures and descriptions also apply to embodiments where there are only one level of vertically adjacent RX and TX signals (e.g., level Ln is TX and level Lo is RX signals), each level having ground isolation lines and offset as noted herein (e.g., such as in FIGS. 7-10). For example, level Lm may be RX signal lines, while level Ln has TX signal lines, level Lo may be RX signal lines, while level Lq has TX signal lines. In some cases, the TX and RX of those signal lines of that example may be reversed. In some embodiments, there may be three levels of vertically adjacent RX and TX signals, each level having ground isolation lines and offset as noted herein.

It can be appreciated that although FIGS. 15-19 show and corresponding descriptions describe embodiments for levels having RX signal lines and TX signal lines, the figures and descriptions also apply to embodiments where other types of information, clock, timing, alternating current (AC) or data signals can be on those signal lines.

In some cases, levels Lj-Ll of FIGS. 7-10, or levels Lm-Lq of FIGS. 11-14, or levels Lm-Ly of FIGS. 15-19 may be levels within a package device (e.g., package device 750, 1150 or 1550) that are not the top or topmost 3, 5 or 6 levels. In some cases, these levels may be levels within a package device that are not the bottom or bottommost 3, 5 or 6 levels. In some cases they are not either. In some cases, these levels may be levels within a package device that are not considered to be a "top" or "bottom" layer such as an exposed layer (e.g., a final build-up (BU) layer, BGA, LGA, or die-backend-like layer) to which an IC chip (e.g., such as microprocessor, coprocessor, graphics processor, memory chip, modem chip, or other microelectronic chip devices), a socket, an interposer, a motherboard, or another next-level component will be mounted or directly attached. In some cases, these levels may be levels within a package device where horizontal signal transmission lines or traces are known to exist or extend horizontally form one to another horizontal location. In some cases, these levels may be levels within a package device that are between 3 and 30 levels from the top (e.g., exposed) level of the device. In some cases, these levels may be levels within a package device that are below a ground plane or a level 5 levels from the top (e.g., exposed) level of the device.

It can be appreciated that there may be additional levels above and/or below levels Lj-Ll of FIGS. 7-10, or levels Lm-Lq of FIGS. 11-14, or levels Lm-Ly of FIGS. 15-19. Also, more data signal lines may exist in these levels, such as additional lines 738 and 748 that are beside the ground isolation lines and have non-conductor portions between the additional lines as described.

In some embodiments, the level L5 from the top will include or be a solid ground plane 760 or a ground plane formed onto level Lm of FIGS. 11-14. In some embodiments, level L6, below level L5 will be a solid planar ground layer 760 or a ground plane formed onto level Lm of FIGS. 11-14.

In some cases, chip 702, chip 708 and chip 709 may each represent an integrated circuit (IC) chip or "die" such as a computer processing unit (CPU), microprocessor, coprocessor, graphics processor, memory chip, modem chip, or other microelectronic chip device. In some cases, chip 702 is an integrated circuit (IC) chip computer processing unit (CPU), microprocessor, or coprocessor. In some cases, chip 708 is an integrated circuit (IC) chip that is a coprocessor, graphics processor, memory chip, fabric controller chip, network interface chip, switch chip, accelerator chip, field programmable gate array (FPGA) chip, or application-specific integrated circuit (ASIC) chip device. In some cases, chip 709 is an integrated circuit (IC) chip coprocessor, graphics processor, memory chip, modem chip, communication output signal chip device, fabric controller chip, network interface chip, switch chip, accelerator chip, field programmable gate array (FPGA) chip, or application-specific integrated circuit (ASIC) chip.

For some embodiments, chips 702, 708 and/or 709 are not included. Some embodiments include only patch 704, interposer 706 and package 710 as described herein. Some embodiments include only patch 1104, interposer 1106 and package 1110 as described herein. Some embodiments include only patch 1504, interposer 1506 and package 1510 as described herein.

For some embodiments, only patch 704, 1104 or 1504 is included (e.g., chip 702 and interposer 706 are not included). For some embodiments, only interposer 706, 1106 or 1506 is included (e.g., patch 704 and package 710, 1110 or 1510 are not included). For some embodiments, only package 710, 1110 or 1510 is included (e.g., chips 708 and 709; and interposer 706, 1106 or 1506 are not included). Some embodiments include only package device 750, 1150, or 1550 as described herein. For some embodiments, only package device 750 is included. For some embodiments, only package device 1150 is included. For some embodiments, only package device 1550 is included.

In some cases, a pitch width (PW1 or PW2 is defined along width W73) between adjacent (a signal line and the signal lined immediately to the left or right of that signal line) data signal transmission lines of FIGS. 1-12 may be between 100 and 150 um. In some cases it is between 50 and 300 um. This pitch may represent a distance (e.g., average or design rule) between the center point of two adjacent transmission lines. In some cases, it is approximately 110 micrometers (110×E-6 meter—"um"). In some cases, it is between 100 and 120 micrometers (um). In some cases, it is between 60 and 200 micrometers.

It is also considered that levels above and below levels Lj-Ll of FIGS. 7-10, or levels Lm-Lq of FIGS. 11-14, or levels Lm-Ly of FIGS. 15-19 may include various interconnect layers, packaging layers, conductive features (e.g., electronic devices, interconnects, layers having conductive traces, layers having conductive vias), layers having dielectric material and other layers as known in the industry for a semiconductor package device. In some cases, the package may be cored or coreless. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

In some cases, any or all of levels Lj-Ll of FIGS. 7-10, or levels Lm-Lq of FIGS. 11-14, or levels Lm-Ly of FIGS. 15-19 may also include such structures noted above for package 150, 1150 or 1550, thought not shown in FIGS. 1-12. In some cases, the contacts and/or traces of these levels are electrically connected to (e.g., physically attached to or formed onto) the conductive structures noted above for package 150, 1150 or 1550.

Devices 150, 1150 or 1550 may have features having standard package pitch as known for a semiconductor die package, chip package; or for another device (e.g., interface, PCB, or interposer) typically connecting a die (e.g., IC, chip, processor, or central processing unit) to a socket, a motherboard, or another next-level component. In some embodiments, the pitch is determined by a standard package design rule (DR) or chip package as known. In some cases, that pitch is a line spacing (e.g., the actual value of the line widths and spaces between lines on the layers) or design rules (DR) of a feature (e.g., conductive contact, or trace) that is between 9 and 12 micrometers.

Lines 738, 748; planes 760, 762 and 764; and lines 1160, 1162, 1164 and 1166 may be formed within their described width, length and height of solid conductive material. The conductive material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all solid copper.

In some cases, the formation of lines 738, 748; planes 760, 762 and 764; and lines 1160, 1162, 1164 and 1166 (all of which, together, may be described below as "planes and lines" or "conductor material features") may be by processes know for typical chip package manufacturing processes (e.g., known in the industry for a semiconductor package device). In some cases, these conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

In some cases, these conductor material features are formed as a blanket layer of conductor material (e.g., a pure conductive material) that is masked and etched to form openings where dielectric material (e.g., 703, such as 703*a*-703*i*) will be deposited, grown or formed (and leave portions of the conductor material where the contacts, traces and webbing are now formed). Alternatively, the conductor material may be a layer (e.g., portions of a blanket layer) that is formed in openings existing through a patterned mask (e.g., ABF and/or dry film resist), and the mask then removed (e.g., dissolved or burned) to form the lines and planes (e.g., as conductor material remaining in the openings after removal of the mask). Such forming of the planes and lines may include plating or growing the conductor material such as an electrolytic layer of metal or conductor grown from a seed layer of electroless metal or conductor to form the planes and lines.

Layers of dielectric 703 (e.g., layers 703*a*-703*i*) may each be a height H72, H73 or H74 for a layer of solid non-conductive material. The dielectric material may be a pure non-conductor (e.g., a pure non-conductive material). Such material may be or include ajinomoto build up films (ABF), cured resin, dry film lamination, porcelain, glass, plastic, or the like as known for such a dielectric. In some cases it is ajinomoto build up films (ABF) and/or dry film lamination.

In some cases, the dielectric may be a blanket layer of dielectric material (e.g., a non-conductive insulator material) that is drilled, or masked and etched to form openings where the contacts, traces and webbing are deposited, grown or formed (e.g., the remaining material is "non-conductor material features") by processes know for typical chip package manufacturing processes (e.g., known in the industry for a semiconductor package device). In some cases, these non-conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

Alternatively, the dielectric may be a layer that is formed on a patterned mask, and the mask then removed (e.g., dissolved or burned) to form openings where the contacts, traces, lines and planes are deposited, grown or formed. Such forming of the dielectric layer, or portions may include or be depositing the dielectric material such as by vacuum lamination of ABF, or dry film lamination such as from or on a lower surface of a dielectric material (e.g., that may be the same type of material or a different type of dielectric material) to form the layer or portions. In some cases, the dielectric layer, portions of dielectric structure, or openings in dielectric layer may be formed by a process known to form such dielectric of a package or chip package device.

In some cases, any or all of the cross sectional length view shapes of lines 738 and lines 748 (e.g., height H73×width W71) is shown as a square or rectangular shape (e.g., see FIGS. 2A, 6A and 10A) it is considered that these shapes may instead be or represent a circle (e.g., having a diameter of H73 or W71); or an oval, a triangle, a rhombus, a trapezoid, or a polygon (e.g., having a maximum height of H73 and maximum width of W71). Also, in some cases, any or all of the cross sectional length view shapes of portions 703*b*, 703*e* and 703*h* of FIG. 8A (e.g., height H73×width W72) is shown as a square or rectangular shape it is considered that these shapes may instead be or represent a circle (e.g., having a diameter of H73 or W72); or an oval, a triangle, a rhombus, a trapezoid, or a polygon (e.g., having a maximum height of H73 and maximum width of W72). Next, in some cases, any or all of the cross sectional length view shapes of portions 703*b* of FIGS. 6A and 10A (e.g., height H73×width W75) is shown as a square or rectangular shape it is considered that these shapes may instead be or represent a circle (e.g., having a diameter of H73 or W75); or an oval, a triangle, a rhombus, a trapezoid, or a polygon (e.g., having a maximum height of H73 and maximum width of W75). Finally, in some cases, any or all of the cross sectional length view shapes of lines 1160, 1162, 1164, and 1166 of FIGS. 6A and 10A (e.g., height H73×width W74) is shown as a square or rectangular shape it is considered that these shapes may instead be or represent a circle (e.g., having a diameter of H73 or W74); or an oval, a triangle, a rhombus, a trapezoid, or a polygon (e.g., having a maximum height of H73 and maximum width of W74).

In some cases, embodiments of (e.g., packages, systems and processes for forming) package devices 150, 1150 and 1550, such as described for FIGS. 1-12, provide quicker and more accurate data signal transfer between the two IC's attached to a package by including ground isolation planes; lines; or planes and lines of package devices 150, 1150 and 1550 that reduce signal line crosstalk, and increase signal line isolation (e.g., see FIGS. 1, 5 and 9). In some cases, embodiments of processes for forming package devices 150, 1150 and 1550, or embodiments of package devices 150, 1150 and 1550 provide a package device having better components for providing high frequency transmit (e.g., through lines 748) and receive (e.g., through lines 738) data signals between horizontal endpoints of those lines (e.g., see FIGS. 1, 5 and 9). The components may be better due to the addition of the ground isolation planes; lines; or planes and lines of package devices 150, 1150 and 1550.

In some cases, embodiments of processes for forming package devices 150, 1150 and 1550, or embodiments of package devices 150, 1150 and 1550 provide the benefits embodied in computer system architecture features, package devices and interfaces made in high volumes (e.g., see FIGS. 1, 5 and 9). In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIGS. 1, 5 and 9). In some cases, embodiments of such processes and devices provide the demanded lower cost high frequency data transfer interconnects solution that is needed across the above segments (e.g., see FIGS. 1, 5 and 9). These benefits may be due to the addition of the ground isolation planes; lines; or planes and lines of package devices 150, 1150 and 1550.

In addition to this, such processes and devices can provide for direct and local data signal delivery to both chips. In some cases, embodiments of such processes and devices provide communication between two IC chips or board ICs including memory, modem, graphics, and other functionality, directly attached to each other (e.g., see FIGS. 1, 5 and 9). These processes and devices provide increased input/output (IO) speed data transfer at lower cost. These provisions and increases may be due to the addition of the conductive material ground isolation planes; lines; or planes and lines of package devices 150, 1150 and 1550.

Figure 19:
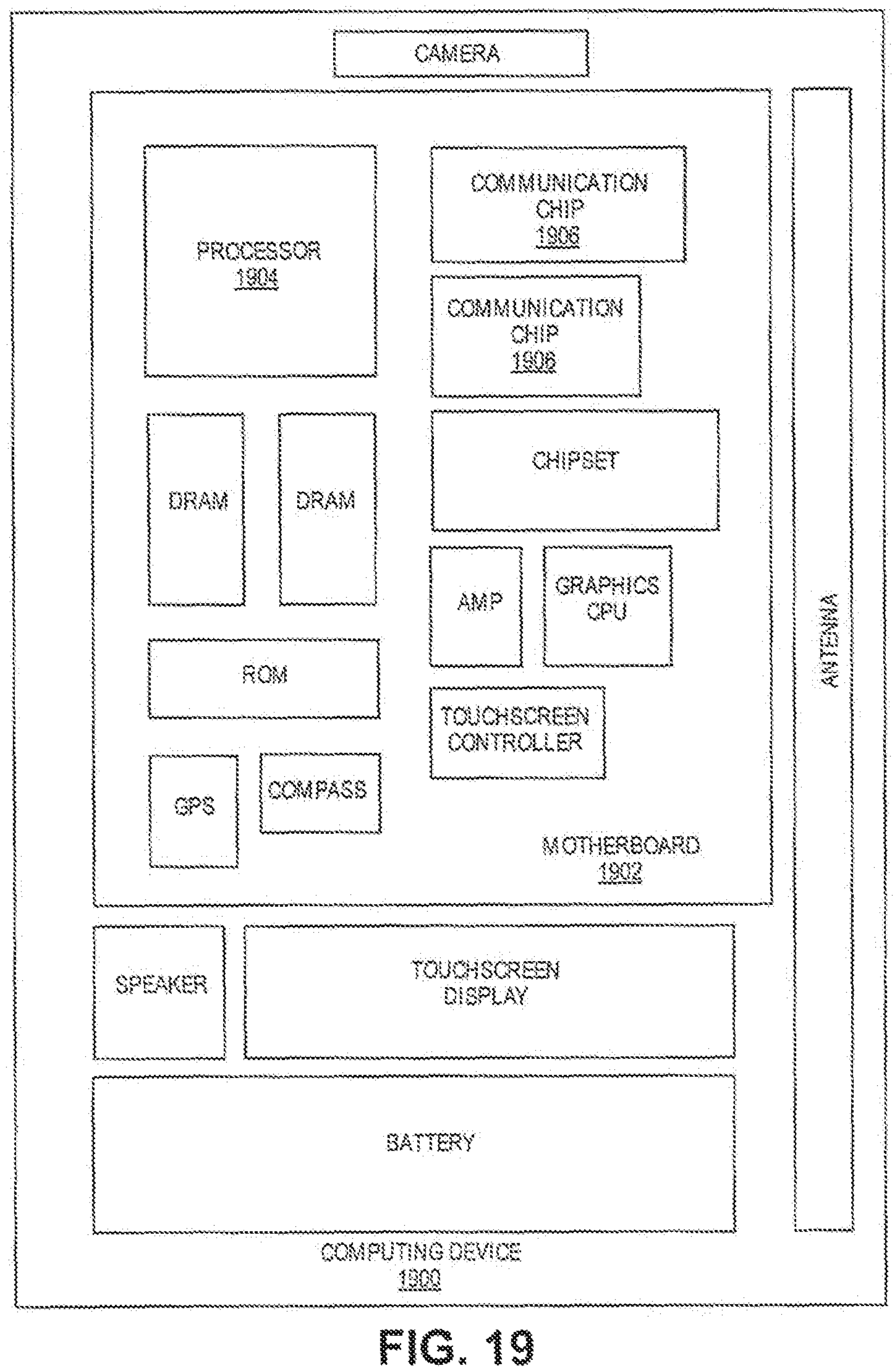
FIG. 19 illustrates a computing device in accordance with one implementation.

FIG. 19 illustrates a computing device in accordance with one implementation. FIG. 19 illustrates computing device 1900 in accordance with one implementation. Computing device 1900 houses board 1902. Board 1902 may include a number of components, including but not limited to processor 1904 and at least one communication chip 1906. Processor 1904 is physically and electrically coupled to board 1902. In some implementations at least one communication chip 1906 is also physically and electrically coupled to board 1902. In further implementations, communication chip 1906 is part of processor 1904.

Depending on its applications, computing device 1900 may include other components that may or may not be physically and electrically coupled to board 1902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1906 enables wireless communications for the transfer of data to and from computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1900 may include a plurality of communication chips 1906. For instance, first communication chip 1906 may be dedicated to shorter range wireless communications such as Wi-Fi and Bluetooth and second communication chip 1906 may be dedicated to longer range wireless communications such as GPS, EDGE, GPRS, CDMA, WiMAX, LTE, Ev-DO, and others.

Processor 1904 of computing device 1900 includes an integrated circuit die packaged within processor 1904. In some implementations, the integrated circuit die of the processor includes one or more devices, such as transistors or metal interconnects. In some embodiments, the package of the integrated circuit die or processor 1904 includes embodiments of processes for forming package devices 150, 1150 and 1550, or embodiments of package devices 150, 1150 and 1550 as described herein. The term "processor" may refer to any device or portion of a device that processes electronic data from registers and/or memory to transform that electronic data into other electronic data that may be stored in registers and/or memory.

Communication chip 1906 also includes an integrated circuit die packaged within communication chip 1906. In accordance with another implementation, the integrated circuit die of the communication chip includes one or more devices, such as transistors or metal interconnects. In some embodiments, the package of the integrated circuit die or chip 606 includes embodiments of processes for forming package devices 150, 1150 and 1550, or embodiments of package devices 150, 1150 and 1550 as described herein.

In further implementations, another component housed within computing device 600 may contain an integrated circuit die that includes one or more devices, such as transistors or metal interconnects. In some embodiments, the package of the other integrated circuit die or chip includes embodiments of processes for forming package devices 150, 1150 and 1550, or embodiments of package devices 150, 1150 and 1550 as described herein.

In various implementations, computing device 1900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1900 may be any other electronic device that processes data.

For example, although the descriptions above show only ground isolation planes; lines; or planes and lines in levels Lj-Ll of FIGS. 7-10, or levels Lm-Lq of FIGS. 11-14, or levels Lm-Ly of FIGS. 15-19 those descriptions can apply to fewer, more or different ground isolation planes; lines; or planes and lines. Embodiments of fewer such structures may be where only one or two of levels Lj-Ll of FIGS. 7-10, or levels Lm-Lq of FIGS. 11-14, or levels Lm-Ly of FIGS. 15-19 exist. Embodiments of more of such structures may be where additional levels of ground isolation planes; lines; or planes and lines similar to levels Lj-Ll of FIGS. 7-10, or levels Lm-Lq of FIGS. 11-14, or levels Lm-Ly of FIGS. 15-19 exist in devices 150, 1150 or 1550, above or below levels Lj-Ll of FIGS. 7-10, or levels Lm-Lq of FIGS. 11-14, or levels Lm-Ly of FIGS. 15-19. Embodiments of different of such ground isolation planes; lines; or planes and lines may be such as where ones of levels Lj-Ll of FIGS. 7-10, or levels Lm-Lq of FIGS. 11-14, or levels Lm-Ly of FIGS. 15-19 replace or are mixed with other levels of levels Lj-Ll of FIGS. 7-10, or levels Lm-Lq of FIGS. 11-14, or levels Lm-Ly of FIGS. 15-19.

FIGS. 20-29 may apply to embodiments of a ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices. Such embodiments of the invention are related in general, to semiconductor device packaging and, in particular, to substrate packages and printed circuit board (PCB) substrates upon which an integrated circuit (IC) chip may be attached, and methods for their manufacture. Such a substrate package device may have vertical data signal transmission interconnects extending through vertical levels of a package device.

Integrated circuit (IC) chips (e.g., "chips", "dies", "ICs" or "IC chips"), such as microprocessors, coprocessors, graphics processors and other microelectronic devices often use semiconductor package devices ("packages") to physically and/or electronically attach the IC chip to a circuit board, such as a motherboard (or motherboard interface). The IC chip (e.g., "die") is typically mounted within a microelectronic substrate package or package device that, among other functions, enables electrical connections between the die and a socket, a motherboard, or another next-level component. Some examples of such package devices are substrate packages, interposers, and printed circuit board (PCB) substrates upon which integrated circuit (IC) chips or other package devices may be attached.

There is a need in the field for an inexpensive and high throughput process for manufacturing such package devices. In addition, the process could result in a high package device yield and a package device of high mechanical stability. Also needed in the field, is a package device having better components for providing stable and clean power, ground, and high frequency transmit and receive data signals between its top surface and other components of or attached to the package device, such as from between different vertical locations of vertical data signal transmission interconnects extending through vertical levels of a package device.

As integrated circuit (IC) chip or die sizes shrink and interconnect densities increase, physical and electrical connections require better components for providing stable and clean high frequency transmit and receive data signals between different vertical locations of, or a vertical length of, vertical data signal transmission interconnects extending through vertical levels of one package device or two physically attached package devices upon which the IC chip is mounted or is communicating the data signals. Some examples of such package devices are one (or two physically attached) of the following: substrate packages, interposers (e.g., silicon interposers), silicon bridges, organic interposers (e.g., or technology thereof), and printed circuit board (PCB) substrates upon or onto which integrated circuit (IC) chips or other package devices may be attached.

In some cases, an IC chip may be mounted within a package device, such as for "flip chip" bonding or packaging. In some cases, the IC chip may be mounted on one package device, which is also physically and electronically connected to another package device or IC chip, so that the package device can provide data signal transfer between IC chip and other package device, or between the two IC chips. In many cases, any of the package devices must route hundreds or even thousands of high frequency data signals between the IC chip(s) and/or other package devices.

According to some embodiments, it is possible for a vertically ground isolated package device to provide higher frequency and more accurate data signal transfer between an IC chip mounted on a top interconnect level of the package device and (1) lower levels of the package device, (2) a next-level component of the package device, and/or (3) a next-level component or another package device mounted to the bottom of the package device, by including vertical ground isolation structures (e.g., of conductor material) for vertical data signal interconnects of package devices that reduce (e.g., improves or mitigates) vertical data signal interconnect crosstalk, signal type cluster-to-cluster crosstalk and in-cluster signal type crosstalk. Such a package may be described as a "vertically ground isolated package device" (e.g., devices, systems and processes for forming).

In some embodiments, the vertical ground isolation structures may include ground shielding attachment structures for different types of data signal surface contacts of the top interconnect level of vertical data signal interconnects of package devices. The ground shielding attachment structures may include solid conductive material ground isolation shielding attachments such as solder balls or ball grid arrays (BGA) and/or solid conductive material ground isolation shielding surface contacts for the isolation attachments. The ground shielding attachment structures may be located or disposed beside and between the different types of data signal surface contacts that are spread over an area of the top interconnect level of a package device. The different types of data signal surface contacts may include "upper" transmit and receive data signal contacts of a die-bump field (e.g., zone or cluster) or a first level die bump design for soldering to another device; and the ground shielding attachment structures may reduce signal type cluster-to-cluster crosstalk by being between and electrically shielding separate fields of the upper transmit and receive data signal contacts. In some cases, there may be additional lower levels of the package (below the first level) with additional vertical ground isolation structures as described herein (e.g., see FIGS. 24A-28).

In some cases, the top interconnect level may be an upper (e.g., top or first) interconnect layer with upper (e.g., top or first) level ground contacts, upper level (e.g., top or first) data signal contacts formed over and connected to via contacts or traces of a lower layer of the same interconnect level.

In some cases, the ground shielding attachment structures may provide a better component for the physical and electrical connections between an IC chip or other package device which is mounted upon or to the vertically ground isolated package device. In some cases, it may increase in the stability and cleanliness of ground, and high frequency transmit and receive data signals transmitted between the data signal contacts on the top surfaces of the package and other components of or attached to the package that are electrically connected to the data signal contacts on the top surface through via contacts to lower level contacts or traces of the package.

In some cases, the data signal contacts, via contacts, and lower level contacts are part of the vertical data signal interconnects of the package device. In some cases, the ground shielding attachment structures may increase the usable frequency of transmit and receive data signals transmitted between the data signal contacts on the top surfaces of the package and other components of or attached to the package, as compared to a package not having the structures. Such an increased frequency may include data signals having a speed of between 7 and 25 gigatransfers per second (GT/s). In some cases, GT/s may refer to a number of operations (e.g., transmission of digital data such as the data signal herein) transferring data that occur in each second in some given data transfer channel such as a channel provided by zone 2002 or 2004; or may refer to a sample rate, i.e. the number of data samples captured per second, each sample normally occurring at the clock edge. 1 GT/s is $10^9$ or one billion transfers per second.

In some cases, the ground shielding attachment structures improve (e.g., reduce) crosstalk (e.g., as compared to the same package but without any of the structures) from very low frequency transfer such as from a speed of 50 megatransfers per second (MT/s) to greater than 40 GT/s (or up to between 40 and 50 GT/s).

Figure 20A:
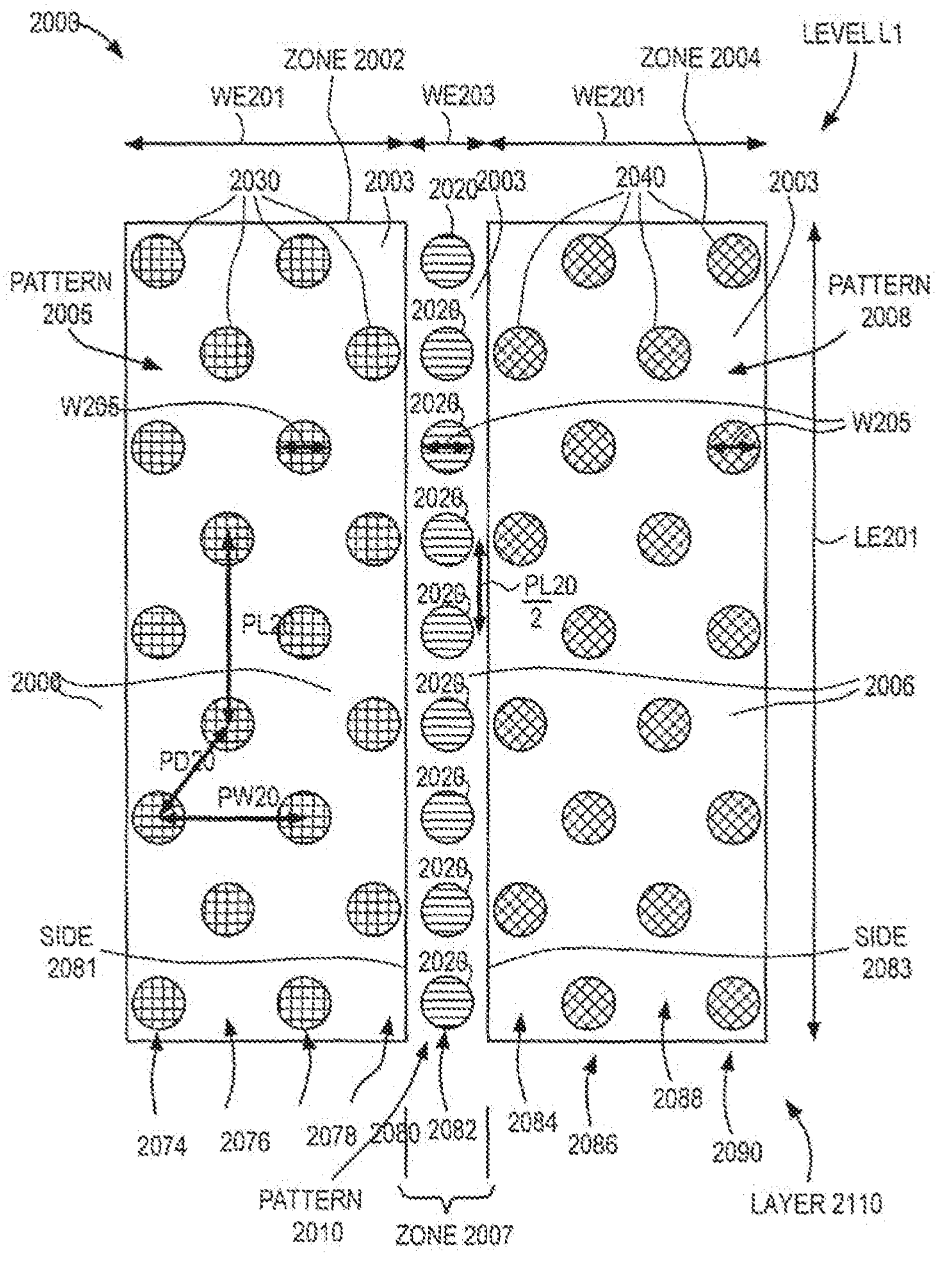
FIG. 20A is a schematic top perspective view of a semiconductor package device upon which at least one integrated circuit (IC) chip (e.g., "die") or other package device may be attached.

FIG. 20A is a schematic top perspective view of a semiconductor package device upon which at least one integrated circuit (IC) chip (e.g., "die") or other package device may be attached. FIG. 20A shows package device 2000 having a first interconnect level L1 (with the number "1", not the letter "1") with upper layer 2110 having one row of upper (e.g., top or first) layer ground isolation contacts 2020, having upper layer receive data signal contacts 2030 and having upper layer transmit data signal contacts 2040 surrounded by dielectric layer 2003 such as an electrically non-conductive or insulating material. Level L1 (or upper layer 2110) may be considered to "top" layer such as a top, topmost or exposed layer (e.g., a final build-up (BU) layer, BGA, LGA, or die-backend-like layer) to which an IC chip (e.g., such as microprocessor, coprocessor, graphics processor, memory chip, modem chip, fabric controller chip, network interface chip, switch chip, accelerator chip, field programmable gate array (FPGA) chip, application-specific integrated circuit (ASIC) chip device, communication output signal chip device, or other microelectronic chip devices), a socket, an interposer, a motherboard, another package device or another next-level component will be mounted or directly attached.

In some cases, device 2000 may represent a substrate package, an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, fabric controller chip, network interface chip, switch chip, accelerator chip, field programmable gate array (FPGA) chip, application-specific integrated circuit (ASIC) chip device, communication output signal chip device, or other microelectronic chip devices).

FIG. 20A shows package device 2000 having top surface 2006, such as a surface of dielectric 2003, upon or in which are formed (e.g., disposed) one row of grounding contacts 2020, receive signal contacts 2030 and transmit contacts 2040. Ground contacts 2020 are shown in locations along length LE201 in fifth row 2082 of zone 2007.

Receive signal contacts 2030 are shown having pattern 2005 in zone 2002. Zone 2002 has width WE201 and length LE201. Pattern 2005 may include having receive signal contacts 2030 in first row 2074, second row 2076, third row 2078, and fourth row 2080 that are horizontally equidistant from each other in zone 2002. Pattern 2005 may include having the receive signal contacts 2030 in rows 2076 and 2080 lengthwise offset (e.g., along LE201) below those of rows 2074 and 2078 by one half pitch length PL20. In some cases, pattern 2005 may include having contacts 2030 in rows 2076 and 2080 lengthwise offset (e.g., along LE201) to be lengthwise between those of rows 2074 and 2078 along pitch length PL20.

In some cases, zone 2002 may be described as a receive or "RX" signal cluster formed in a 4-row deep die-bump pattern 2005. In some cases, zone 2002 and pattern 2005 includes only contacts 2030, but no other contacts (e.g., none of contacts 2020 or 2040). Zone 2002 and pattern 2005 is shown having 18 vertical data signal interconnect stacks, each with exposed data signal upper contact 2030 that may be formed over or onto a data signal via contact of level L1. It can be appreciated that there may be more or fewer of stacks and contacts 2030. In some cases there may be 20 stacks and contacts 2030 in zone 2002. In some cases 8, 10, 12, 16, 32 or 64.

Transmit signal contacts 2040 are shown having pattern 2008 in zone 2004. Zone 2004 has width WE201 and length LE201. Pattern 2008 may include having transmit signal contacts 2040 in sixth row 2084, seventh row 2086, eighth row 2088, and ninth row 2090 that are horizontally equidistant from each other in zone 2004. Pattern 2008 may include having the transmit signal contacts 2040 in rows 2086 and 2090 lengthwise offset (e.g., along LE201) below those of rows 2084 and 2088 by one half pitch length PL20. In some cases, pattern 2008 may include having contacts 2040 in rows 2086 and 2090 lengthwise offset (e.g., along LE201) to be lengthwise between those of rows 2084 and 2088 along pitch length PL20.

In some cases, zone 2004 may be described as a receive or "TX" signal cluster formed in a 4-row deep die-bump pattern 2008. In some cases, zone 2004 and pattern 2008 includes only contacts 2040, but no other contacts (e.g., none of contacts 2020 or 2030). Zone 2004 and pattern 2008 is shown having 18 vertical data signal interconnect stacks, each with exposed data signal upper contact 2040 that may be formed over or onto a data signal via contact of level L1. It can be appreciated that there may be more or fewer of stacks and contacts 2040 in zone 2004 and pattern 2008. In some cases there may be 20 stacks and contacts 2040. In some cases 8, 10, 12, 16, 32 or 64.

Ground signal contacts 2020 are shown having pattern 2010 in zone 2007. Zone 2007 has width WE203 and length LE201. Pattern 2010 may include having ground signal contacts 2020 in fifth row 2082 in zone 2007. In some cases, zone 2007 may be described as a ground signal cluster formed in a 1-row deep die-bump pattern 2010. In some cases, zone 2007 and pattern 2010 (or zone 2009 and pattern 2011 of FIGS. 20B and 21B) includes only contacts 2020, but no other contacts (e.g., none of contacts 2030 or 2040). Pattern 2010 may include having one of contacts 2020 (one of row 2082) located directly between (e.g., side by side, horizontally adjacent, or widthwise adjacent with respect to width WE203 of FIGS. 20A-21A) each of contacts 2030 and a widthwise adjacent one of contacts 2040 (e.g., side by side, or widthwise adjacent with respect to width WE203 of FIGS. 20A-21A). Zone 2007 and pattern 2010 may have 9 vertical ground isolation interconnect stacks, each with an ground isolation upper contact 2020 that may be formed over or onto a ground isolation via contact of level L1. It can be appreciated that there may be more or fewer than 9 of stacks and contacts 2020 in zone 2007 and pattern 2010. In some cases there may be 10 stacks and contacts 2020. In some cases 4, 5, 6, 8, 16 or 32.

Zone 2002 may be described as a four row wide zone of receive contacts, such as forming pattern 2005. Zone 2004 may be described as a four row wide zone of transmit contacts, such as forming pattern 2008. Row 2082 may be described as a one row wide ground isolation zone 2007 located or formed between zone 2002 and zone 2004, such as forming pattern 2010. Zone 2007 may have side 2081 widthwise adjacent to (e.g., along width WE203) or facing zone 2002 and opposite side 2083 (e.g., opposite from side 2081) widthwise adjacent to (e.g., along width WE203) or facing zone 2004. It can be appreciated that although zone 2002 and 2004 are shown with the same width and length, they may have different widths and/or lengths.

Figure 21A:
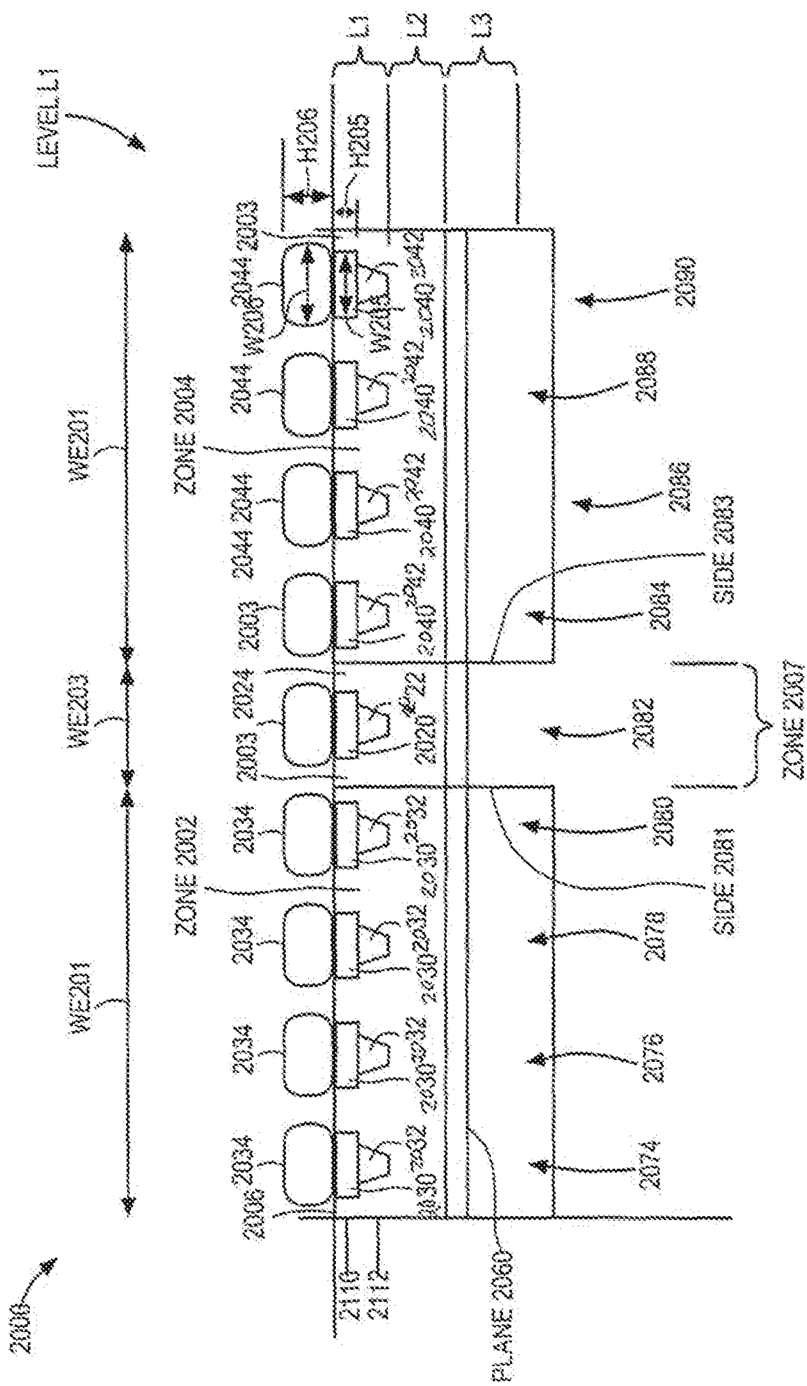
FIG. 21A is a schematic cross-sectional side view of the package of FIG. 20A showing solder bumps formed on zones of upper layer ground isolation contacts and data signal contacts.

FIG. 21A is a schematic cross-sectional side view of the package of FIG. 20A showing solder bumps formed on upper (e.g., top or first) layer ground isolation contacts 2020 of zone 2007, upper layer receive data signal contacts 2030 and upper layer transmit data signal contacts 2040. In level L1 (and similarly for some other levels) device 2000 has contacts 2030 of zone 2002 formed onto or physically attached to a top surface of via contacts 2032, ground isolation contacts 2020 of zone 2007 formed onto or physically attached to a top surface of via contacts 2022, and contacts 2040 of zone 2004 formed onto or physically attached to a top surface of via contacts 2042.

FIG. 21A shows top or topmost (e.g., first level) interconnect level L1 (having top layer 2110 and bottom layer 2112) of package device 2000 formed over second level interconnect level L2, which is formed over third interconnect level L3, which is formed over other interconnect levels of the device. Device 2000 layer 2110 has dielectric 2003, ground isolation contacts 2020 of zone 2007, contacts 2030 of zone 2002 and contacts 2040 of zone 2004.

Some embodiments of device 2000 (e.g., FIG. 21A) have solder bumps 2034 formed onto or physically attached to a top surface of contacts 2030, solder bump 2024 formed onto or physically attached to a top surface of contacts 2020, and solder bumps 2044 formed onto or physically attached to a top surface of contacts 2040 of layer 2110. Some embodiments of device 2000 may not have (e.g., not yet have) solder bumps 2034 formed onto or physically attached to a top surface of contacts 2030, solder bump 2024 formed onto or physically attached to a top surface of contacts 2020, or solder bumps 2044 formed onto or physically attached to a top surface of contacts 2040 of layer 2110.

The exact size of WE201, WE203, WE204 and LE201 may depend on number of contacts employed within each zone (e.g., number of contacts 2030 in zone 2002, the number of contact 2040 in zone 2004 and number of contacts employed within zone 2007 (or 2009)) (e.g., see FIGS. 20A-B and 22A-B). In some cases, the size of WE201, WE203, WE204 and LE201 may also depend on the number of zones 2002, 2004, and 2007 (or 2009) on a package device. In some cases, the number of zones 2002, 2004, and 2007 (or 2009) will be where each of those zones is part of a "unicel" or "unit cell" communication area (e.g., including zones 2002, 2004 and 2007 (or 2009) and there are between 2-20 such unicel areas on the surface of the package (and thus between 2-20 of each of zones 2002, 2004 and 2007 (or 2009)).

In come cases, the size of WE201, WE203, WE204 and LE201 may also depend on the technology capability of forming the contacts and package. In some cases, in general, the size of WE201 and LE201 can span from around a hundred to a couple of hundred micrometers (x E-6 meter—"um" or "microns"). In some cases, LE201 is between 80 and 250 um. In some cases it is between 50 and 300 um. In some cases, WE201 is between 70 and 150 um. In some cases it is between 40 and 200 um. In some cases, in general, the size of WE203 can span from around tens of microns to more than a hundred um. In some cases, WE203 is between 15 and 30 um. In some cases it is between 8 and 40 um. In some cases, the size of WE201, WE203, WE204 and LE201 can be scaled with or depend on the manufacturing or processing pitch (e.g., of the contacts).

Contacts 2020, 2030 and 2040 that may be formed along, or under top surface 2006. Contacts 2020, 2030 and 2040 may have height H205 (e.g., a thickness extending into the page) and width W205 (e.g., see FIGS. 21A-B). In some cases height H205 may be approximately 15 micrometers (15×E-6 meter—"um") and width W205 is between 75 and 85 um. In some cases, height H205 is between 10 and 20 micrometers (um). In some cases, it is between 5 and 30 micrometers. In some cases, width W205 is between 70 and 90 micrometers (um). In some cases, it is between 60 and 110 micrometers. It can be appreciated that height H205 may be an appropriate height of a conductive material contacts formed on a top layer of or within a package device, that is less than or greater than those mentioned above.

In some cases, upper contacts 2020, 2030 and 2040 are formed (e.g., disposed) having top surfaces that are part of or horizontally planar with surface 2006, such as by being formed with or as part of layer 2110 having conductor (1) that includes upper contacts 2020, 2030 and 2040 of level L1; and (2) between which dielectric 2003 of layer 2110 exists (having top surface 2006). In some cases, upper contacts 2020, 2030 and 2040 are formed (e.g., disposed) above top surface 2006, such as where the layer of conductor is formed on or over a layer of dielectric or other material. In some cases, upper contacts 2020, 2030 and 2040 are is formed (e.g., disposed) under top surface 2006, such as when a further layer of dielectric, solder resist, or other material is formed on level L1, over upper contacts 2020, 2030 and 2040.

Figure 20B:
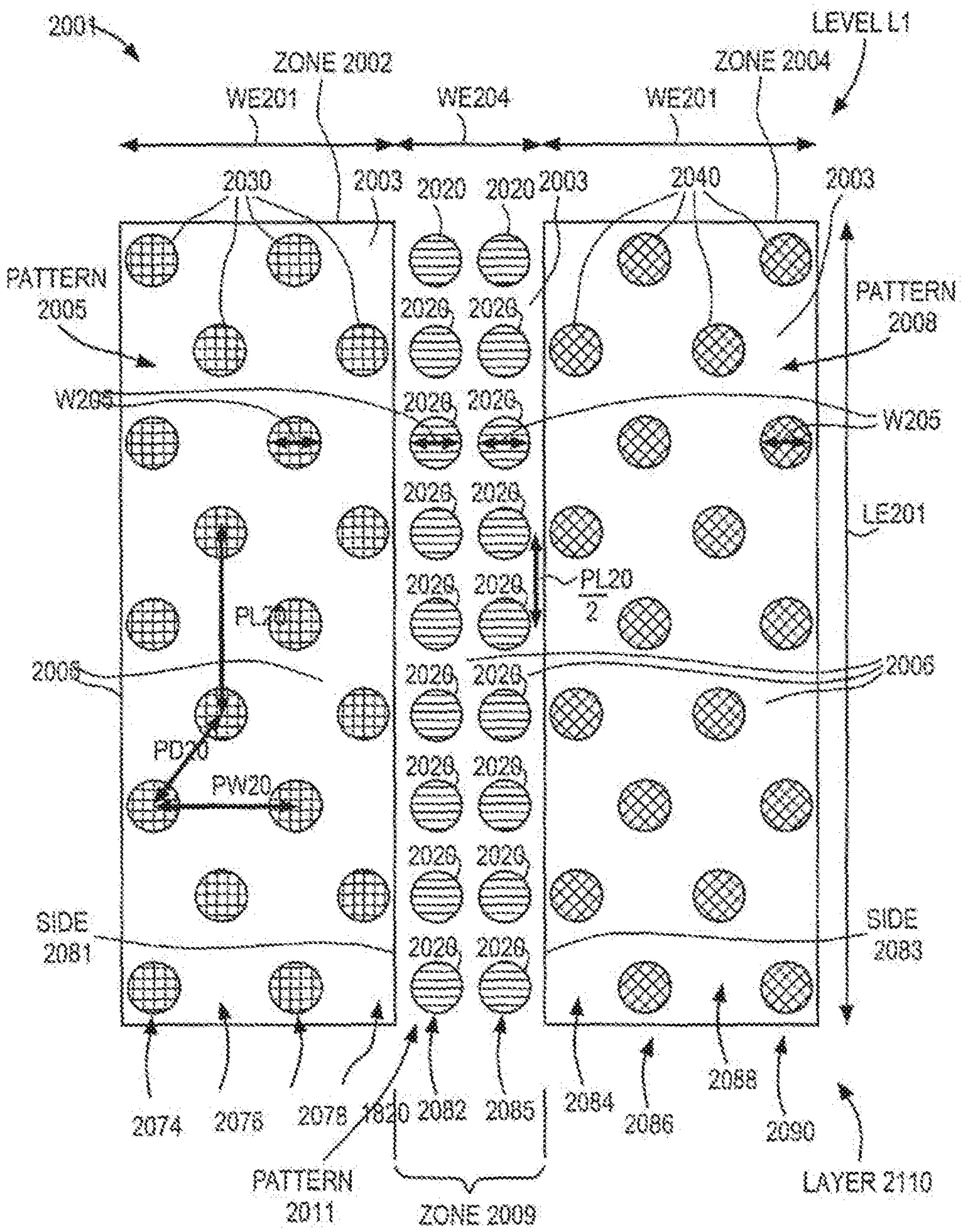
FIG. 20B is a schematic top perspective view of a semiconductor package device upon which at least one integrated circuit (IC) chip (e.g., "die") or other package device may be attached.

FIG. 20B is a schematic top perspective view of a semiconductor package device upon which at least one integrated circuit (IC) chip (e.g., "die") or other package device may be attached. FIG. 20B shows package device 2001 having a first interconnect level L1 with upper layer 2110 having two rows of upper (e.g., top or first) layer ground isolation contacts 2020, having upper layer receive data signal contacts 2030 and having upper layer transmit data signal contacts 2040.

Ground signal contacts 2020 are shown having pattern 2011 in zone 2009. Zone 2009 has width WE204 and length LE201. Width WE204 may be twice as wide as width WE203. In some cases, zone 2009 may be described as a ground signal cluster formed in a 2-row deep die-bump pattern 2011. In some cases, zone 2009 and pattern 2011 includes only contacts 2020, but no other contacts (e.g., none of contacts 2030 or 2040). Pattern 2011 may include having two of contacts 2020 (one of each of rows 2082 and 2085) located directly between (e.g., side by side, horizontally adjacent, or widthwise adjacent with respect to width WE204) each of contacts 2030 and a widthwise adjacent one of contacts 2040 (e.g., side by side, or widthwise adjacent with respect to width WE204 of FIGS. 20B-21B). Zone 2009 and pattern 2011 may have 18 vertical ground isolation interconnect stacks, each with an ground isolation upper contact 2020 that may be formed over or onto a ground isolation via contact of level L1. It can be appreciated that there may be more or fewer than 18 of stacks and contacts 2020 in zone 2009 and pattern 2011. In some cases there may be 20 stacks and contacts 2020. In some cases 8, 10, 12, 16, 32 or 64.

More specifically, FIG. 20B shows package device 2001 having top surface 2006, such as a surface of dielectric, upon or in which are formed (e.g., disposed) two rows of grounding contacts 2020 in locations along length LE201 in fifth and fifth' rows 2082 and 2085 of zone 2009. Two of contacts 2020 (one of each of rows 2082 and 2085) are located directly between (e.g., side by side; horizontally adjacent; or width adjacent with respect to width WE201 or WE204 of top view of FIG. 20B) each of contacts 2030 and a horizontally adjacent one of contacts 2040 (e.g., side by side; horizontally adjacent; or width adjacent with respect to width WE201 or WE204 of top view of FIG. 20B).

In FIG. 20B, level L1; contacts 2020, 2030, and 2040; dielectric 2003; rows 2074-2090, surface 2006; width WE201 and length LE201 of device 2001 may be similar to those of device 2000 except there are two rows (rows 2082 and 2085) of contacts 2020 and 2022 in zone 2009 having width WE204 instead of one row 2082 of contacts 2020 in zone 2007 having width WE203.

Rows 2082 and 2085 may be described as a two row wide ground isolation zone 2009 located or formed between zone 2002 and zone 2004, such as forming pattern 2011. Zone 2009 may have side 2081 widthwise adjacent to (e.g., along width WE204) or facing zone 2002 and opposite side 2083 (e.g., opposite from side 2081) widthwise adjacent to (e.g., along width WE204) or facing zone 2004.

Figure 21B:
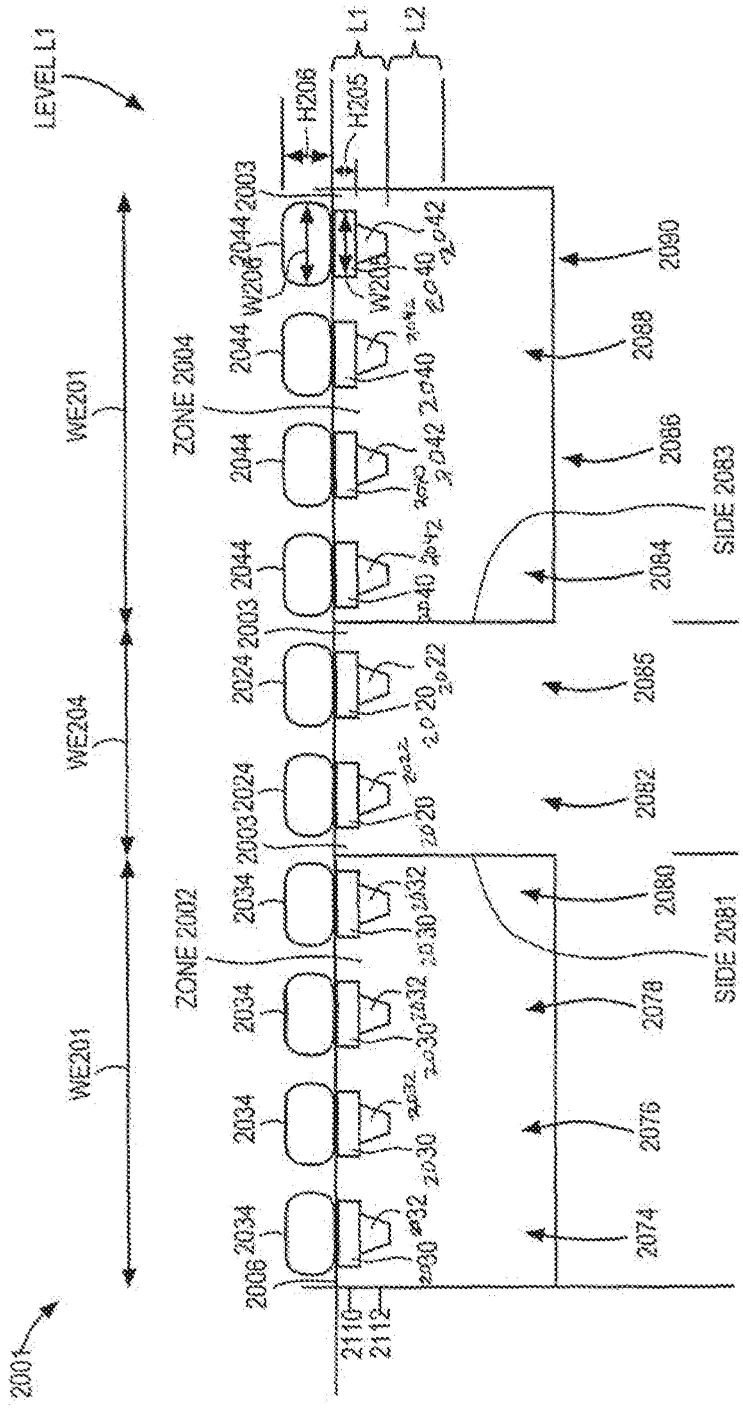
FIG. 21B is a schematic cross-sectional side view of the package of FIG. 20B showing solder bumps formed on zones of upper layer ground isolation contacts and data signal contacts.

FIG. 21B is a schematic cross-sectional side view of the package of FIG. 20B showing solder bumps formed on upper (e.g., top or first) layer ground isolation contacts 2020 of zone 2009, upper layer receive data signal contacts 2030 and upper layer transmit data signal contacts 2040. In level L1 (and similarly for some other levels) device 2001 has contacts 2030 of zone 2002 formed onto or physically attached to a top surface of via contacts 2032, ground isolation contacts 2020 of zone 2007 formed onto or physically attached to a top surface of via contacts 2022, and contacts 2040 of zone 2004 formed onto or physically attached to a top surface of via contacts 2042.

FIG. 21B shows package device 2001 top or topmost (e.g., first level) interconnect level L1 having top layer 2110 formed over or onto second level interconnect level L2. Device 2001 layer 2110 has dielectric 2003, ground isolation contacts 2020 of zone 2009, contacts 2030 of zone 2002 and contacts 2040 of zone 2004.

Some embodiments of device 2001 (e.g., FIG. 21B) have solder bumps 2034 formed onto or physically attached to a top surface of contacts 2030, solder bump 2024 formed onto or physically attached to a top surface of contacts 2020, and solder bumps 2044 formed onto or physically attached to a top surface of contacts 2040 of layer 2110. Some embodiments of device 2001 may not have (e.g., not yet have) solder bumps 2034 formed onto or physically attached to a top surface of contacts 2030, solder bump 2024 formed onto or physically attached to a top surface of contacts 2020, or solder bumps 2044 formed onto or physically attached to a top surface of contacts 2040 of layer 2110.

In FIG. 21B, level L1; contacts 2020, 2030, and 2040; via contacts 2022, 2032 and 2042; dielectric 2003; rows 2074-2090, surface 2006; width WE201, length LE201 and height H205 of device 2001 may be similar to those of device 2000 except there are two rows (rows 2082 and 2085) of contacts 2020 and 2022 in zone 2009 having width WE204 instead of one row 2082 of contacts 2020 in zone 2007 having width WE203.

In some cases, each of rows 2074-2090 (e.g., of FIGS. 20A-21B) may be horizontally (e.g., widthwise) equidistant from each other along the direction of width WE201, and each of the contacts in each row may be vertically (e.g., lengthwise) equidistant from each other along length LE201.

In some cases, contacts 2020 are first level L1 ground contacts located beside and between the first level first type of data signal contacts 2030 and the first level second type of data signal contacts 2040. Contacts 2020 may be or include one (e.g., see FIG. 20A) or two (e.g., see FIG. 20B)

rows of lengthwise adjacent (e.g., along length LE201), or top to bottom located, solid conductive material ground isolation shielding surface contacts, such as in zone 2007 or 2009, respectively. Contacts 2020 (e.g., in zone 2007 or 2009) may be between or have side 2081 adjacent (e.g., widthwise adjacent) to or facing zone 2002 and opposite side 2083 (e.g., opposite from side 2081) adjacent (e.g., widthwise adjacent) to or facing zone 2004.

Figure 22A:
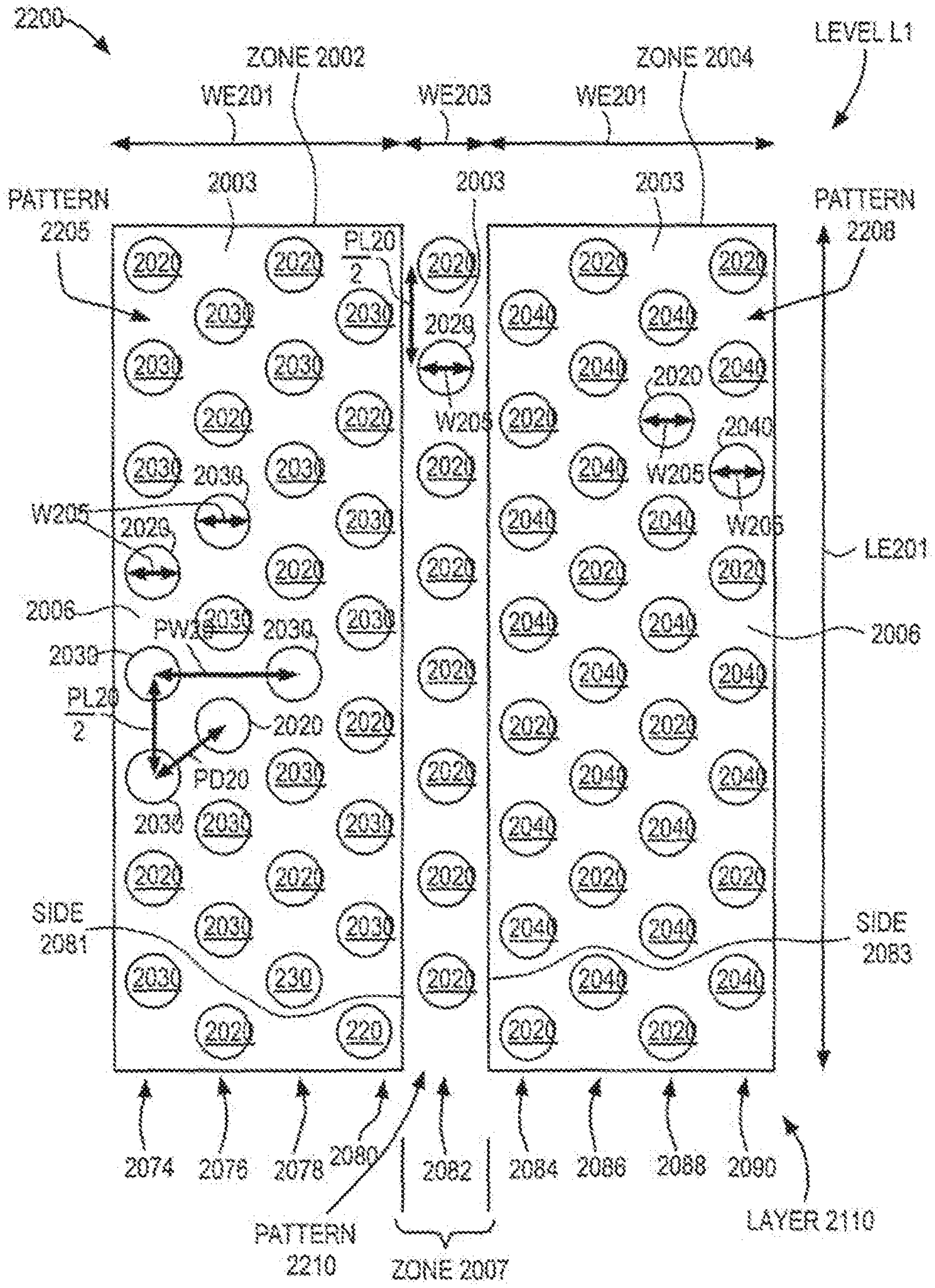
FIG. 22A is a schematic top perspective view of a semiconductor package device upon which at least one integrated circuit (IC) chip (e.g., "die") or other package device may be attached.

FIG. 22A is a schematic top perspective view of a semiconductor package device upon which at least one integrated circuit (IC) chip (e.g., "die") or other package device may be attached. FIG. 22A shows package device 2200 having top surface 2006, such as a surface of dielectric 2003, upon or in which are formed (e.g., disposed) the grounding contacts 2020, receive signal contacts 2030 and transmit contacts 2040. FIG. 22A shows package device 2200 having a first interconnect level L1 with upper layer 2110 having one row of upper (e.g., top or first) layer ground isolation contacts 2020 forming shielding pattern 2210 in zone 2007, having upper layer receive data signal contacts 2030 and additional isolation contacts 2020 forming a shielding pattern 2205 in zone 2002, and having upper layer transmit data signal contacts 2040 and additional isolation contacts 2020 forming a shielding pattern 2208 in zone 2004. Due to having contacts 2020 in rows of pattern 2205, zone 2002 (e.g., pattern 2205) has contacts 2020 and contacts 2030 of FIG. 22A-25B with pitch length of PL20/2 (e.g., half the pitch length of PL20 of zone 2002 of FIG. 20A-21B). Due to having contacts 2020 in rows of pattern 2208, zone 2004 (e.g., pattern 2208) has contacts 2020 and contacts 2040 of FIG. 22A-25B with pitch length of PL/2 (e.g., half the pitch length of PL20 of zone 2004 of FIG. 20A-21B). Contacts 2020, 2030 and 2040 are surrounded by dielectric layer 2003 such as an electrically non-conductive or insulating material.

Receive signal contacts 2030 and contacts 2020 are shown having pattern 2205 in zone 2002. Pattern 2205 may include having receive signal contacts 2030 and contacts 2020 in first row 2074, second row 2076, third row 2078, and fourth row 2080 in zone 2002. Pattern 2205 may include having the receive signal contacts 2030 and contacts 2020 in rows 2076 and 2080 lengthwise offset (e.g., along LE201) below contacts of rows 2074 and 2078 by one half pitch length PL20/2. In some cases, pattern 2205 may include having contacts 2030 and contacts 2020 in rows 2076 and 2080 lengthwise offset (e.g., along LE201) to be lengthwise between those of rows 2074 and 2078 along pitch length PL20.

In some cases, shielding pattern 2205 includes alternating rows having the following patterns of contacts lengthwise adjacent along length LE201: first rows of contacts 2020, 2030, 2030, 2020, 2030, 2030, 2020, 2030 (e.g., in alternating rows 2074 and 2078) alternating with second rows of contacts 2030, 2020, 2030, 2030, 2020, 2030, 2030, 2020 which are rows that extend downwards from one half pitch length PL20 below the first rows (e.g., in alternating rows 2076 and 2080). As shown in FIG. 22A, this sequence may start at row 2074 and continue through row 2080. In some cases, shielding pattern 2205 includes having each of contacts 2020 surrounded in a hexagonal shape (with one corner to tip pointing lengthwise upwards along length LE201) by six of contacts 2030, or by as many of contacts 2030 as there are (e.g., as fit into) zone 2002. In some cases, the pattern includes having two signal contacts 2030 lengthwise adjacent between each pair of contacts 2020. In some cases, the pattern includes two lengthwise adjacent signal contacts 2030 having one grounding contact 2020 lengthwise above and below a two signal contacts 2030; and having two grounding contacts 2020 widthwise adjacent to and offset to be between the lengthwise distance between (PL20/2) the two signal contacts 2030.

In some cases, zone 2002 may be described as a receive or "RX" signal cluster having receive contacts 2030 and isolation contacts 2020 formed in a vertically offset 4-row deep die-bump pattern 2205. In some cases, pattern 2205 includes only contacts 2030 and contacts 2020, but no other contacts (e.g., none of contacts 2040). Pattern 2205 is shown having 20 vertical data signal interconnect stacks and 12 vertical ground isolation signal interconnect stacks, each with exposed data signal upper contact 2030 and 2020 that may be formed over or onto a data signal via contact and a ground signal vial contact, respectively, of level L1. It can be appreciated that there may be more or fewer of stacks and contacts 2030 and 2020. In some cases there may be 18 stacks and contacts 2030; and 10 stacks and contacts 2020 in pattern 2205. In some cases there may be 8, 10, 12, 16, 32 or 64 stacks and contacts 2030; and 4, 5, 6, 8, 16 or 32 stacks and contacts 2020 in pattern 2205.

Next, along the direction of width WE203, row 2082 includes pattern 2210 having contacts 2020 along length LE201. Pattern 2210 is discussed further below with respect to zones 2002 and 2004.

Next, along the direction of width WE201, transmit signal contacts 2040 and contacts 2020 are shown having pattern 2208 in zone 2004. Pattern 2208 may include having transmit signal contacts 2040 and contacts 2020 in sixth row 2084, seventh row 2086, eighth row 2088, and ninth row 2090 in zone 2004. Pattern 2208 may include having the transmit signal contacts 2040 and contacts 2020 in rows 2086 and 2090 lengthwise offset (e.g., along LE201) above contacts of rows 2084 and 2088 by one half pitch length PL20/2. In some cases, pattern 2208 may include having contacts 2040 and contacts 2020 in rows 2086 and 2090 lengthwise offset (e.g., along LE201) to be lengthwise between those of rows 2084 and 2088 along pitch length PL20.

In some cases shielding pattern 2208 includes alternating rows having the following patterns of contacts lengthwise adjacent along length LE201: first row of contacts 2040, 2020, 2040, 2040, 2020, 2040, 2040, 2020 (e.g., in alternating rows 2084 and 2088) alternating with second row of contacts 2020, 2040, 2040, 2020, 2040, 2040, 2020, 2040 which are rows that extend downwards from one half pitch length PL20 above the first rows (e.g., in alternating rows 2086 and 2090). As shown in FIG. 22A, this sequence may start at row 2084 and continue through row 2090. In some cases, shielding pattern 2208 includes having each of contacts 2020 surrounded in a hexagonal shape (with one corner to tip pointing lengthwise upwards along length LE201) by six of contacts 2040, or by as many of contacts 2030 as there are (e.g., as fit into) zone 2004. In some cases, the pattern includes having two signal contacts 2040 lengthwise adjacent between each pair of contacts 2020. In some cases, the pattern includes two lengthwise adjacent signal contacts 2040 having one grounding contact 2020 lengthwise above and below a two signal contacts 2040; and having two grounding contacts 2020 widthwise adjacent to and offset to be between the lengthwise distance between (PL20/2) the two signal contacts 2040.

In some cases, zone 2004 may be described as a transmit or "TX" signal cluster having transmit contacts 2040 and isolation contacts 2020 formed in a vertically offset 4-row deep die-bump pattern 2208. In some cases, pattern 2208 includes only contacts 2040 and contacts 2020, but no other contacts (e.g., none of contacts 2030). Pattern 2208 is shown having 20 vertical data signal interconnect stacks and 12 vertical ground isolation signal interconnect stacks, each with exposed data signal upper contact 2040 and 2020 that may be formed over or onto a data signal via contact and a ground signal vial contact, respectively, of level L1. It can be appreciated that there may be more or fewer of stacks and contacts 2040 and 2020. In some cases there may be 18 stacks and contacts 2040; and 10 stacks and contacts 2020 in pattern 2208. In some cases there may be 8, 10, 12, 16, 32 or 64 stacks and contacts 2040; and 4, 5, 6, 8, 16 or 32 stacks and contacts 2020 in pattern 2208.

Ground signal contacts 2020 are shown having pattern 2210 in zone 2007. Zone 2007 has width WE203 and length LE201. Pattern 2210 may include having ground signal contacts 2020 in fifth row 2082 in zone 2007. In some cases, zone 2007 may be described as a ground signal cluster formed in a vertically offset 1-row deep die-bump pattern 2210. In some cases, pattern 2210 (or pattern 411 of FIG. 22B) includes only contacts 2020, but no other contacts (e.g., none of contacts 2030 or 2040).

In some cases, as shown, pattern 2210 may include having one of contacts 2020 of a first horizontally adjacent row (one of row 2082) located horizontally equidistant directly between and lengthwise offset (e.g., along LE201) above, immediately widthwise adjacent contacts of adjacent rows (e.g., of rows 2080 and 2084) by one half pitch length PL20/2. In some cases, as shown, pattern 2210 may include having one of contacts 2020 (one of row 2082) located horizontally equidistant directly between and lengthwise located horizontally adjacent (e.g., side by side, or widthwise adjacent with respect to width WE203 of FIG. 22A) every second widthwise adjacent pair of (e.g., every other) of contacts (e.g., side by side, or widthwise adjacent with respect to width WE203 of FIG. 22A) of zones 2002 and 2004 (e.g., of rows 2078 and 2086). Pattern 2210 may have 8 vertical ground isolation interconnect stacks, each with an ground isolation upper contact 2020 that may be formed over or onto a ground isolation via contact of level L1. It can be appreciated that there may be more or fewer than 8 of stacks and contacts 2020 in pattern 2210. In some cases there may be 7 stacks and contacts 2020. In some cases 4, 5, 6, 8, 16 or 32.

Pattern 2205 may be described as a vertically offset four row wide zone of receive contacts and isolation contacts. Pattern 2208 may be described as a vertically offset four row wide zone of transmit contacts and isolation contacts. Pattern 2210 may be described as a vertically offset one row wide ground isolation zone 2007 located or formed between zone 2002 and zone 2004. Pattern 2210 may have side 2081 widthwise adjacent to (e.g., along width WE203) or facing zone 2002 and opposite side 2083 (e.g., opposite from side 2081) widthwise adjacent to (e.g., along width WE203) or facing zone 2004. It can be appreciated that although patterns 2205 and 2208 are shown with the same width and length, they may have different widths and/or lengths.

In some cases, each of rows 2074-2090 may be horizontally (e.g., widthwise) equidistant from each other along the direction of width WE201, and each of the contacts in each row may be vertically (e.g., lengthwise) equidistant from each other along length LE201.

In some cases, instead of pattern 2210, device 2200 may have a double wide pattern of contacts 2020 such as described for zone 2009 of FIGS. 20B and 21B. In this case, the pattern may include having two of contacts 2020 (such as shown for zone 2009 of FIGS. 20B and 21B) located directly between (e.g., side by side, horizontally adjacent, or widthwise adjacent with respect to width WE204 of FIG. 22A) each of contacts 2030 and a widthwise adjacent one of contacts 2040 (e.g., side by side, or widthwise adjacent with respect to width WE203 of FIG. 22A). This pattern may have 16 vertical ground isolation interconnect stacks, each with an ground isolation upper contact 2020 that may be formed over or onto a ground isolation via contact of level L1. It can be appreciated that there may be more or fewer than 16 of stacks and contacts 2020 in the pattern. In some cases there may be 18 stacks and contacts 2020. In some cases 8, 10, 12, 16, 32 or 64.

Figure 22B:
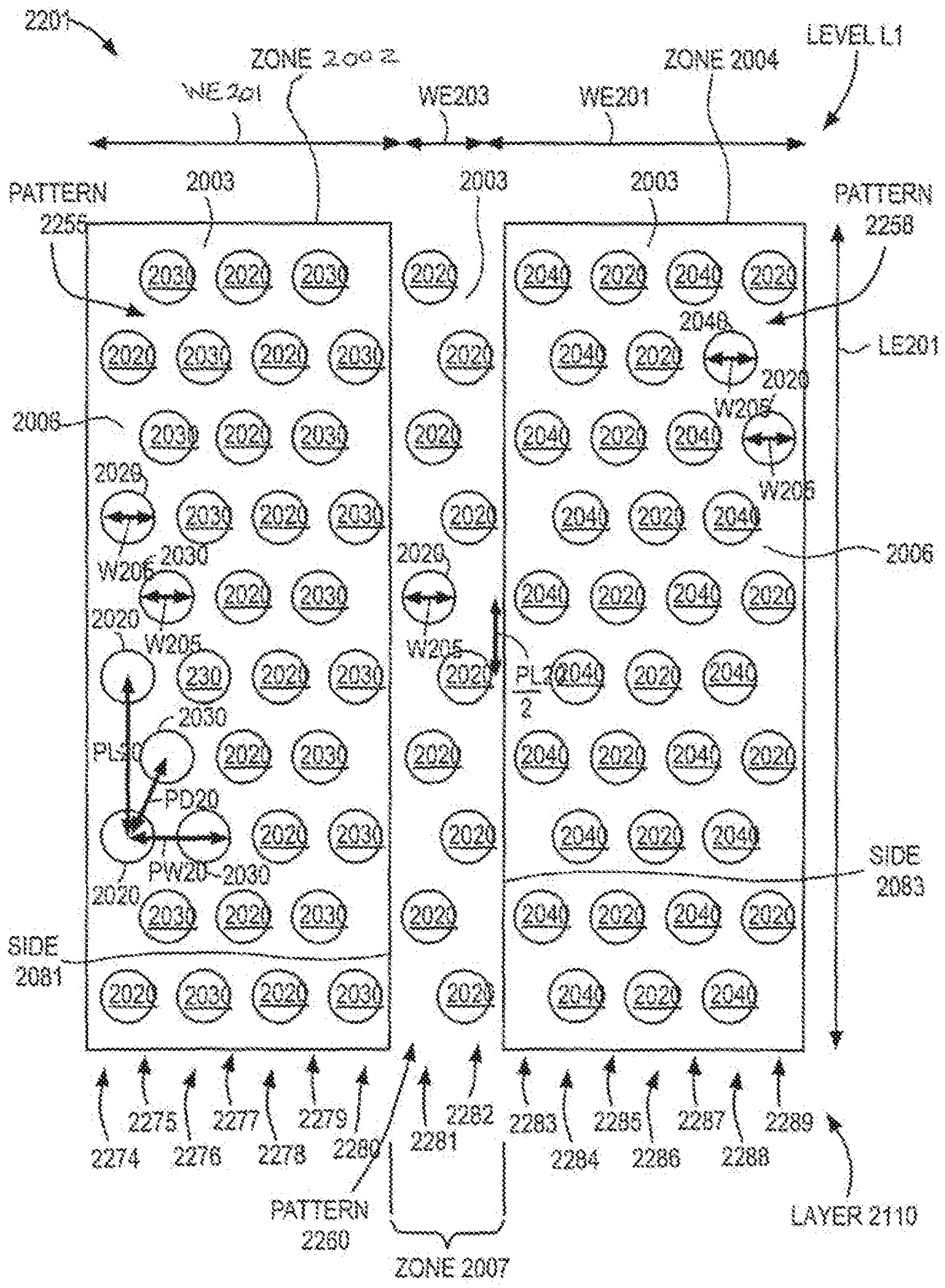
FIG. 22B is a schematic top perspective view of a semiconductor package device upon which at least one integrated circuit (IC) chip (e.g., "die") or other package device may be attached.

FIG. 22B is a schematic top perspective view of a semiconductor package device upon which at least one integrated circuit (IC) chip (e.g., "die") or other package device may be attached. FIG. 22B shows package device 2201 having top surface 2006, such as a surface of dielectric 2003, upon or in which are formed (e.g., disposed) the grounding contacts 2020, receive signal contacts 2030 and transmit contacts 2040. FIG. 22B shows package device 2201 having a first interconnect level L1 with upper layer 2110 having one row of upper (e.g., top or first) layer ground isolation contacts 2020 forming shielding pattern 2260 in zone 2007, having upper layer receive data signal contacts 2030 and additional isolation contacts 2020 forming a shielding pattern 2255 in zone 2002, and having upper layer transmit data signal contacts 2040 and additional isolation contacts 2020 forming a shielding pattern 2258 in zone 2004. Contacts 2020, 2030 and 2040 are surrounded by dielectric layer 2003 such as an electrically non-conductive or insulating material.

Receive signal contacts 2030 and contacts 2020 are shown having pattern 2255 in zone 2002. Pattern 2255 may include having receive signal contacts 2030 or ground contacts 2020 in first row 2274, second row 2275, third row 2276, fourth row 2277, fifth row 2278, sixth row 2279, and seventh row 2280 in zone 2002. Pattern 2255 may include having ground contacts 2020 (e.g., only contacts 2020, but no other contacts (e.g., none of contacts 2030 or 2040)) in first row 2274, fourth row 2277, and fifth row 2278; and having receive signal contacts 2030 (e.g., only contacts 2030, but no other contacts (e.g., none of contacts 2020 or 2040)) in second row 2275, third row 2276, sixth row 2279, and seventh row 2280. Pattern 2255 may include having the receive signal contacts 2030 or contacts 2020 in rows 2275, 2277 and 2279 lengthwise offset (e.g., along LE201) above contacts of rows 2274, 2276, 2278 and 2280 by one half pitch length PL20. In some cases, pattern 2255 may include having contacts 2030 or contacts 2020 in rows 2275, 2277 and 2279 lengthwise offset (e.g., along LE201) to be lengthwise between those of rows 2274, 2276, 2278 and 2280 along pitch length PL20.

In some cases, zone 2002 may be described as a receive or "RX" signal cluster having receive contacts 2030 or isolation contacts 2020 formed in a vertically offset 7-row deep die-bump pattern 2255. In some cases, pattern 2255 includes only contacts 2030 and contacts 2020, but no other contacts (e.g., none of contacts 2040). Pattern 2255 is shown having 20 vertical data signal interconnect stacks and 15 vertical ground isolation signal interconnect stacks, each with exposed data signal upper contact 2030 and 2020 that may be formed over or onto a data signal via contact and a ground signal vial contact, respectively, of level L1. It can be appreciated that there may be more or fewer of stacks and contacts 2030 and 2020. In some cases there may be 18 stacks and contacts 2030; and 13 stacks and contacts 2020 in pattern 2255. In some cases there may be 8, 10, 12, 16, 32 or 64 stacks and contacts 2030; and 4, 5, 6, 8, 16 or 32 stacks and contacts 2020 in pattern 2205.

Next, along the direction of width WE203, rows 2281 and 2282 include pattern 2260 having contacts 2020 along length LE201. Pattern 2260 is discussed further below with respect to zones 2002 and 2004.

Next, along the direction of width WE201, transmit signal contacts 2040 and contacts 2020 are shown having pattern 2258 in zone 2004. Pattern 2258 may include having transmit signal contacts 2040 or ground contacts 2020 in tenth row 2283, eleventh row 2284, twelfth row 2285, thirteenth row 2286, fourteenth row 2287, fifteenth row 2288, and sixteenth row 2289 in zone 2004. Pattern 2258 may include having ground contacts 2020 (e.g., only contacts 2020, but no other contacts (e.g., none of contacts 2030 or 2040)) in twelvth row 2285, thirteenth row 2286 and sixteenth row 2289; and having receive signal contacts 2030 (e.g., only contacts 2040, but no other contacts (e.g., none of contacts 2020 or 2030)) in tenth row 2283, eleventh row 2284, fourteenth row 2287, and fifteenth row 2288. Pattern 2258 may include having the transmit signal contacts 2040 or contacts 2020 in rows 2284, 2286 and 2288 lengthwise offset (e.g., along LE201) below contacts of rows 2283, 2285, 2287 and 2289 by one half pitch length PL20. In some cases, pattern 2258 may include having contacts 2040 or contacts 2020 in rows 2284, 2286 and 2288 lengthwise offset (e.g., along LE201) to be lengthwise between those of rows 2283, 2285, 2287 and 2289 along pitch length PL20.

In some cases, zone 2004 may be described as a transmit or "TX" signal cluster having transmit contacts 2040 or isolation contacts 2020 formed in a vertically offset 7-row deep die-bump pattern 2258. In some cases, pattern 2258 includes only contacts 2040 and contacts 2020, but no other contacts (e.g., none of contacts 2030). Pattern 2258 is shown having 20 vertical data signal interconnect stacks and 15 vertical ground isolation signal interconnect stacks, each with exposed data signal upper contact 2040 and 2020 that may be formed over or onto a data signal via contact and a ground signal vial contact, respectively, of level L1. It can be appreciated that there may be more or fewer of stacks and contacts 2040 and 2020. In some cases there may be 18 stacks and contacts 2040; and 13 stacks and contacts 2020 in pattern 2258. In some cases there may be 8, 10, 12, 16, 32 or 64 stacks and contacts 2040; and 4, 5, 6, 8, 16 or 32 stacks and contacts 2020 in pattern 2205.

Ground signal contacts 2020 are shown having pattern 2260 in zone 2007. Zone 2007 has width WE203 and length LE201. Pattern 2260 may include having ground signal contacts 2020 in eighth row 2281 and ninth row 2282 in zone 2007. In some cases, zone 2007 may be described as a ground signal cluster formed in a vertically offset 2-row deep die-bump pattern 2260. In some cases, pattern 2260 includes only contacts 2020, but no other contacts (e.g., none of contacts 2030 or 2040).

In some cases, as shown, pattern 2260 may include having one of contacts 2020 of a first horizontally adjacent row (one contact of row 2281) located horizontally equidistant directly between and lengthwise offset (e.g., along LE201) above, immediately widthwise adjacent contacts of adjacent rows (e.g., of rows 2280 and 2282) by one half pitch length PL20; and having a one of contacts 2020 of a second horizontally adjacent row (one contact of row 2282) located horizontally equidistant directly between and lengthwise offset (e.g., along LE201) below, immediately widthwise adjacent contacts of adjacent rows (e.g., of rows 2281 and 2283) by one half pitch length PL20. In some cases, as shown, pattern 2260 may include having one of contacts 2020 of two widthwise adjacent rows (one contact of row 2281 and of row 2282) located horizontally equidistant directly between and lengthwise located horizontally adjacent (e.g., side by side, or widthwise adjacent with respect to width WE203 of FIG. 22B) every second widthwise adjacent pair of (e.g., every other) of contacts (e.g., side by side, or widthwise adjacent with respect to width WE203 of FIG. 22B) of zones 2002 and 2004 (e.g., of rows 2279 and 2283; and rows 2280 and 2284, respectively). Pattern 2260 may have 10 vertical ground isolation interconnect stacks, each with an ground isolation upper contact 2020 that may be formed over or onto a ground isolation via contact of level L1. It can be appreciated that there may be more or fewer than 10 of stacks and contacts 2020 in pattern 2210. In some cases there may be 9 stacks and contacts 2020. In some cases 4, 5, 6, 8, 16 or 32.

Pattern 2255 may be described as a vertically offset seven row wide zone of receive contacts and isolation contacts. Pattern 2258 may be described as a vertically offset seven row wide zone of transmit contacts and isolation contacts. Pattern 2260 may be described as a vertically offset two row wide ground isolation zone 2007 located or formed between zone 2002 and zone 2004. Pattern 2260 may have side 2081 widthwise adjacent to (e.g., along width WE203) or facing zone 2002 and opposite side 2083 (e.g., opposite from side 2081) widthwise adjacent to (e.g., along width WE203) or facing zone 2004. It can be appreciated that although patterns 2255 and 2258 are shown with the same width and length, they may have different widths and/or lengths.

In some cases, each of rows 2274-2289 may be horizontally (e.g., widthwise) equidistant from each other along the direction of width WE201, and each of the contacts in each row may be vertically (e.g., lengthwise) equidistant from each other along length LE201.

Similar to descriptions for FIG. 21A solder bumps may be formed on upper (e.g., top or first) layer ground isolation contacts 2020 of patterns 2210 and 2260; upper layer receive data signal contacts 2030 and isolation contacts 2020 of patterns 2205 and 2255; and upper layer transmit data signal contacts 2040 and isolation contacts 2020 of patterns 2208 and 2258. In level L1 (and similarly for some other levels) devices 2200 and 2201 may have contacts 2030 formed onto or physically attached to a top surface of via contacts 2032, ground isolation contacts 2020 formed onto or physically attached to a top surface of via contacts 2022, and contacts 2040 formed onto or physically attached to a top surface of via contacts 2042, similar to descriptions for FIG. 21A.

Some embodiments of devices 2200 and 2201 may have top or topmost (e.g., first level) interconnect level L1 having top layer 2110 formed over or onto second level interconnect level L2. Devices 2200 and 2201 layer 2110 has dielectric 2003 surrounding ground isolation contacts 2020, contacts 2030 and contacts 2040, similar to descriptions for FIG. 21A.

Some embodiments of devices 2200 or 2201 (e.g., FIG. 22A or 22B) may have solder bumps 2034 formed onto or physically attached to a top surface of contacts 2030, solder bump 2024 formed onto or physically attached to a top surface of contacts 2020, and solder bumps 2044 formed onto or physically attached to a top surface of contacts 2040 of layer 2110 (e.g., similar to descriptions for FIGS. 21A and 21B). Some embodiments of devices 2200 and 2201 may not have (e.g., not yet have) solder bumps 2034 formed onto or physically attached to a top surface of contacts 2030, solder bump 2024 formed onto or physically attached to a top surface of contacts 2020, or solder bumps 2044 formed onto or physically attached to a top surface of contacts 2040 of layer 2110.

In some cases, solder bumps 2024, 2034 and 2044 (e.g., herein) may be described as "physical attachments" or "solid conductive material ground isolation shielding attachments" attached to contacts 2020, 2030 and 2040. They may also be describe as "physical attachments" or "solid conductive material ground isolation shielding attachments" attaching (e.g., physically and electrically attaching) contacts 2020, 2030 and 2040; or device 2000, 2001, 2200 or 2201 to another package device or next level component.

In some cases, solder bumps 2024, 2034 and 2044 are shot onto a surface of the substrate and a solder reflow process is performed on solder bumps 2024, 2034 and 2044 to cause the solder to attach the next level component to layer 2110 using solder bumps 2024, 2034 and 2044.

Top or topmost (e.g., first level) interconnect level L1 of devices 2000, 2001, 2200 and 2201 may be formed over a second level interconnect level L2, which is formed over other interconnect levels. In FIGS. 20A-22B data signal interconnect contacts 2030 and 2040 of rows 2074-2090, and 2274-2289 may represent vertical data signal interconnects of the package device (e.g., upper surface contacts of multiple levels of levels). In FIGS. 20A-22B, ground interconnect contacts 2020 may represent solid conductive material ground isolation shielding surface contacts of the package device (e.g., upper surface contacts of multiple levels of levels).

Below level L1, package devices 2000, 2001, 2200 and 2201 may include various interconnect layers, packaging layers, conductive features (e.g., electronic devices, interconnects, layers having conductive traces, layers having conductive vias), layers having dielectric material and other layers as known in the industry for a semiconductor device package. In some cases, the package may be cored or coreless. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peel able core panel. The substrate may be a substrate used in an electronic device package or a microprocessor package. In some cases, level L1 may also include such structures noted above for package device 2000, thought not shown in FIG. 21A. In some cases, the contacts and/or traces of level L1 are electrically connected to (e.g., physically attached to or formed onto) the conductive structures noted above for package device 2000.

Contacts 2020, 2030 and 2040 of devices 2000, 2001, 2200 and 2201 may be areas of an upper (e.g., top or first) layer of conductive material that is formed as part of upper layer 2110 of level L1. In some cases, contacts 2020, 2030 and 2040 are part of an upper layer of conductive material that is formed during the same deposition or plating used to form other conductive material of level L1. In some cases, contacts 2020, 2030 and 2040 are each a layer of solid electrical conductor material extending width W205 and between which is disposed dielectric portions 2003 surrounding upper contacts 2020, 2030 and 2040 of layer 2110.

According to some embodiments, one, two or three of contacts 2020 (e.g., and solder bumps 2024) of row 2082, 2085, 2281 or 2282 may be replaced by power contacts, such as contacts used to transmit or provide power signals to an IC chip or other package device attached to the power contacts of Level L1. In some cases the power contacts are used to provide an alternating current (AC) or a direct current (DC) power signal (e.g., Vdd). In some cases the signal has a voltage of between 0.5 and 2.0 volts. In some cases it is between 0.4 and 7.0 volts. In some cases it is between 0.5 and 5.0 volts. In some cases it is a different voltage level. In some cases, between one and 3 of contacts 2020 (e.g., and solder bumps 2024) in the middle of row 2082, 2085, 2281 or 2282 (e.g., not on the lengthwise end of LE201) may be replaced by power contacts. In some cases, two of contacts 2020 (e.g., and solder bumps 2024) in the middle of row 2082, 2085, 2281 or 2282 may be replaced by power contacts. In some cases, two of contacts 2020 (e.g., and solder bumps 2024) in the middle of row 2082 or 2281 are replaced by power contacts.

Zones 2002, 2004 and 2007 (or 2009) (and level L1) may have features having standard package pitch as known for a semiconductor die package, chip package; or for another device (e.g., interface, PCB, or interposer) typically connecting a die (e.g., IC, chip, processor, or central processing unit) to a socket, a motherboard, or another next-level component. The pitch width (PW20) of adjacent contacts is shown as the width distance between the center point of two adjacent contacts. FIGS. 20A-B and 22A-B show pitch width (PW20), pitch diagonal (PD20) and pitch length (PL20) (or PL20/2) for rows 2074-2090 and 2274-2289. It can be appreciated that the same pitch width may apply to each of adjacent rows of rows 2074-2090 and 2274-2289. In some cases, pitch PW20 is approximately 153 micrometers (153×E-6 meter —"um"). In some cases, pitch PW20 is approximately 160 micrometers. In some cases, it is between 140 and 175 micrometers. The diagonal pitch (PD20) of adjacent contacts is the diagonal distance between the center of two adjacent contacts. In some cases, pitch PD20 is approximately 110 micrometers (110×E-6 meter—"um"). In some cases, pitch PD20 is approximately 130 micrometers. In some cases, it is between 100 and 140 micrometers (um). In some cases, it is between 60 and 200 micrometers. The pitch length (PL20) (or PL20/2) of two adjacent contacts is the length distance between the center point of two adjacent contacts. In some cases, pitch PL20 is approximately 158 micrometers. In some cases, pitch PL20 is approximately 206 micrometers. In some cases, it is between 130 and 240 micrometers (um). In some cases, pitch PD20 is approximately 110 micrometers, PL20 is approximately 158 micrometers and PW20 is approximately 153 micrometers. In some cases, pitch PD20 is approximately 130 micrometers, PL20 is approximately 206 micrometers and PW20 is approximately 160 micrometers. In the cases above, "approximately" may represent a difference of within plus or minus 5 percent of the number stated. In other cases, it may represent a difference of within plus or minus 10 percent of the number stated.

According to some embodiments, the pitches above are for (e.g., apply to) PD20, PL20 and PW20 between contacts 2020, 2030 and/or 2040 (and optionally solder bumps 2024, 2034 and 2044) for BGA 2712, 2718 and/or 2719. It can be appreciated that different pitches PD20, PL20 and PW20 may exist between contacts 2020, 2030 and/or 2040 (and optionally solder bumps 2024, 2034 and 2044) for BGA 2714, 2716, 2816 or contacts 2865 as described below after FIG. 28.

In some cases, "widthwise adjacent" may refer to attachments or contacts that are side by side with respect to direction of width WE203. In some cases, it may also include attachments or contacts that are lengthwise above or below (e.g., in a different column of rows 2074-2090 with repsect to length LE201 of FIG. 20A-B) those that are widthwise adjacent or side by side with respect to direction of width WE203 or WE204.

In some cases, contacts 2020 (e.g., and bumps 2024) are used to transmit or provide grounding (e.g., isolation) signals to an IC chip or other package device attached to contacts 2020 of Level L1. In some cases they are used to provide a zero voltage direct current (DC) grounding signal (e.g., GND). In some cases the signal has a voltage of between 0.0 and 0.2 volts. In some cases it is a different but grounding voltage level.

In some cases, contacts 2030 and 2040 (e.g., and bumps 2034 and 2044) are used to transmit or provide a receive data signal or transmit data signal, respectively, from an IC chip or other package device attached to contacts 2030 and 2040 of Level L1. In some cases they are used to provide an alternating current (AC) or high frequency (HF) receive data signal (e.g., RX and TX). In some cases the signal has a speed (e.g., frequency) of between 7 and 25 GT/s; and a voltage of between 0.5 and 2.0 volts. In some cases the signal has a speed of between 6 and 15 GT/s. In some cases the signal has a voltage of between 0.4 and 5.0 volts. In some cases it is a different speed and/or voltage level.

In some cases, solid conductive material ground isolation shielding attachments such as solder balls or ball grid arrays (BGA) are physically attached to (e.g., soldered to or touching) the first level ground contacts 2020. In some cases, solid conductive material data signal attachments such as solder balls or ball grid arrays (BGA) are physically attached to (e.g., soldered to or touching) the first level data signal contacts 2030 and 2040.

In some cases, solder bumps (or balls) 2024, 2034 and 2044 are formed onto contacts 2020, 2030 and 2040 (e.g., see FIGS. 20A-22B). They may be formed after forming openings in a layer of solder resist formed on layer 2110 as noted herein. They may be formed in the openings through the solder resist (not shown in FIGS. 20A-22B). They may be formed by an appropriate process for forming such bumps. In this case, the ground shielding attachment structures may include solid conductive material ground isolation shielding attachments such as the solder bumps or a ball grid arrays (BGA) of the bumps 2024, 2034 and 2044 physically attached to the solid conductive material ground isolation shielding surface contacts 2020 for forming the isolation attachments onto (e.g., see FIGS. 20A-22B).

In some cases, layer 2110 is a "top" layer such as a top or exposed layer (e.g., a final build-up (BU) layer, BGA layer, LGA layer, or die-backend-like layer) to which an IC chip, a socket, an interposer, a motherboard, or another next-level component will be mounted or directly attached using solder bumps 2024, 2034 and 2044. In some cases, solder bumps 2024, 2034 and 2044 have width W206 and height H206. In some cases, width W206 of solder bumps 2024, 2034 and 2044 may be between 100 and 600 micrometers. In some cases, it is between 300 and 400 micrometers. In some cases, height H206 of solder bumps 2024, 2034 and 2044 may be between 100 and 400 micrometers. In some cases, it is between 200 and 300 micrometers.

In some cases, a solder resist layer (not shown in FIGS. 20A-23) is formed over level L1. Such a resist may be a height (e.g., thickness) of solid non-conductive or electrical insulator solder resist material. Such material may be or include an epoxy, an ink, a resin material, a dry resist material, a fiber base material, a glass fiber base material, a cyanate resin and/or a prepolymer thereof; an epoxy resin, a phenoxy resin, an imidazole compound, an arylalkylene type epoxy resin or the like as known for such a solder resist. In some cases it is an epoxy or a resin. In some cases it is an insulating organic material, laminated material, photosensitive material, or other known solder resist material.

The resist may be a blanket layer that is masked and etched (e.g., by patterning and developing as known in the art) to form openings where solder can be formed on and attached to the upper contacts (e.g., contacts 2020, 2030 and 2040), or where contacts of anther device (e.g., a chip) can be soldered to the upper contacts. Alternatively, the resist may be a layer that is formed on a mask, and the mask then removed to form the openings. In some cases, the resist may be a material (e.g., epoxy) liquid that is silkscreened through or sprayed onto a pattern (e.g., mask) formed on the package; and the mask then removed (e.g., dissolved or burned) to form the openings. In some cases, the resist may be a liquid photoimageable solder mask (LPSM) ink or a dry film photoimageable solder mask (DFSM) blanket layer sprayed onto the package; and then masked and exposed to a pattern and developed to form the openings. This developing process may be selective to remove the resist in the solder bump designated locations (e.g., openings) which were exposed or masked from exposure to light via a lithography process, depending on whether a positive or negative tone resist is used, while keeping the solde resist layer intact in the remaining locations. Furthermore the developing process may be chosen to be selective so as not to remove dielectric 2003 or contacts 2020, 2030 and 2040. In some cases, the solder resist may have a height that may be between 5 and 50 micrometers. In some cases, the resist goes through a thermal cure of some type after the openings (e.g., pattern) are defined. In some cases the resist is laser scribed to form the openings. In some cases, the resist may be formed by a process known to form such a resist of a package.

In some cases, solder bumps (or balls) 2024, 2034 and 2044 are formed onto contacts 2020, 2030 and 2040 (e.g., see FIGS. 20A-21B). They may be formed after forming openings in a layer of solder resist formed on layer 2110 as noted above. They may be formed in the openings through the solder resist (not shown in FIGS. 20A-21B). They may be formed by an appropriate process for forming such bumps. In this case, the ground shielding attachment structures may include solid conductive material ground isolation shielding attachments such as the solder bumps or a ball grid arrays (BGA) of the bumps 2024, 2034 and 2044 physically attached to the solid conductive material ground isolation shielding surface contacts 2020 for forming the isolation attachments onto (e.g., see FIGS. 20A-21B).

As note for FIGS. 20A-23, ground shielding attachment structures may include solid conductive material ground isolation shielding attachments 2024 such as solder balls or ball grid arrays (BGA); and/or solid conductive material ground isolation shielding surface contacts 2020 for the isolation attachments.

In some cases, the solid conductive material ground shielding attachment structures of zones 2007 and 2009 (e.g., surface contacts 2020 and/or bumps 2024 of zone 2007, zone 2009, pattern 2210 and pattern 2260) provide an electrical ground isolation shield between zones 2002 and 2004 of level L1 that reduces "die bump field" crosstalk between all widthwise adjacent ones of different types (e.g., RX and TX) of data signal surface contacts (e.g., contacts 2030 and 2040) and solder bumps (e.g., bumps 2034 and 2044) of or on a top level L1 or layer 2110 of a package device (e.g., device 2000, 2001, 2200 and 2201) by being between zones (e.g., fields or clusters) 2002 and 2004 of level L1. In some cases, "die bump field" crosstalk may be "die bump zone" crosstalk, "die bump cluster" crosstalk, or crosstalk between zones 2002 and 2004. Here "widthwise adjacent" may be along width WE203 or WE204 with respect to FIGS. 20A-B and 22A-B, and may also be described as "horizontally adjacent" such as with respect to FIGS. 21A-B and 23.

In some cases, the solid conductive material ground isolation shielding attachments 2024 of zones 2007 and 2009 (e.g., of the ground shielding attachment structures) (such as of zone 2007, zone 2009, pattern 2210 and pattern 2260) provide an electrical ground isolation shield between two fields (e.g., zones) of different types (e.g., RX and TX) of data signal attachment structures (e.g., bumps 2034 and 2044) formed onto or physically attached to data signal surface contacts (e.g., contacts 2030 and 2040) of a top level L1 or top layer 2110 of a package device (e.g., device 2000, 2001, 2200 and 2201).

In some cases, the ground shielding attachment structures 2024 of zone 2007, zone 2009, pattern 2210 and pattern 2260 provide electrical ground isolation shielding between zones 2002 and 2004 of level L1 that reduces "die bump field" crosstalk between all widthwise adjacent ones of bumps 2034 and 2044 by being between zones 2002 and 2004 above level L1.

In some cases, attachments 2024 (e.g., of zone 2007, zone 2009, pattern 2210 and pattern 2260) between data signal attachment structures 2034 of zone 2002 and 2044 of zone 2004 may each provide an electrical ground isolation shield between structures 2034 and 2044 of zones 2002 and 2004 above level L1 that reduces "die bump field" crosstalk between all widthwise or otherwise adjacent ones of (e.g., above layer 2110) structures 2034 and 2044 that attachments 2024 are between (e.g., by those attachments 2024 being in zone 2007 or 2009 and over level L1).

In some cases, the solid conductive material ground shielding attachment structures 2020 of zones 2007 and 2009 (e.g., of the ground shielding attachment structures) (such as of zone 2007, zone 2009, pattern 2210 and pattern 2260) provide an electrical ground isolation shield between two fields (e.g., zones) of different types (e.g., RX and TX) of data signal surface contacts (e.g., contacts 2030 and 2040) of a top level L1 or top layer 2110 of a package device (e.g., device 2000, 2001, 2200 and 2201).

In some cases, the ground shielding attachment contacts 2020 of zone 2007, zone 2009, pattern 2210 and pattern 2260 provide electrical ground isolation shielding between zones 2002 and 2004 of level L1 that reduces "die contact field" crosstalk between all widthwise adjacent ones of (e.g., of layer 2110) contacts 2030 and 2040 by being between zones 2002 and 2004 of level L1.

In some cases, structures 2020 (e.g., of zone 2007, zone 2009, pattern 2210 and pattern 2260) between data signal contacts 2030 of zone 2002 and 2040 of zone 2004 may each provide an electrical ground isolation shield between contacts 2030 and 2040 of zones 2002 and 2004 of level L1 that reduces "die contact field" crosstalk between all widthwise or otherwise adjacent ones of (e.g., of layer 2110) contacts 2030 and 2040 that contacts 2020 are between (e.g., by those attachments 2020 being in zone 2007 or 2009 of level L1).

In some cases, the solid conductive material ground shielding attachment structures within zones 2002 and 2004 (e.g., surface contacts 2020 and/or bumps 2024 of zone 2002, zone 2004, pattern 2205, pattern 2208, pattern 2255 and pattern 2258) provide an electrical ground isolation shield within zones 2002 and 2004 of level L1 that reduces "die bump in-field" crosstalk between all adjacent ones of same type (e.g., RX or TX) of data signal surface contacts (e.g., contacts 2030 or 2040) and solder bumps (e.g., bumps 2034 or 2044) of or on a top level L1 or layer 2110 of a package device (e.g., device 2000, 2001, 2200 and 2201) by being between two data signal contacts of zones (e.g., fields or clusters) 2002 and 2004 of level L1. In some cases, "die bump in-field" crosstalk may be "die bump in-zone" crosstalk, "die bump in-cluster" crosstalk, or crosstalk within zones 2002 and 2004. Here "adjacent" may be widthwise adjacent, lengthwise adjacent, diagonalwise adjacent with respect to FIGS. 20A-B and 22A-B, and may also be described as horizontally adjacent or vertically adjacent such as with respect to FIGS. 21A-B and 23.

In some cases, the solid conductive material ground isolation shielding attachments 2024 of zones 2002 and 2004 (e.g., of the ground shielding attachment structures) (such as of pattern 2205, pattern 2208, pattern 2255 and pattern 2258) provide an electrical ground isolation shield between two data signal contacts within one field (e.g., zone) of one type (e.g., RX or TX) of data signal attachment structures (e.g., bumps 2034 or 2044) formed onto or physically attached to data signal surface contacts (e.g., contacts 2030 or 2040) of a top level L1 or top layer 2110 of a package device (e.g., device 2000, 2001, 2200 and 2201).

In some cases, the ground shielding attachment structures 2024 of zone 2002, zone 2004, pattern 2205, pattern 2208, pattern 2255 and pattern 2258 provide electrical ground isolation shielding between each data signal contact of zones 2002 and 2004 of level L1 that reduces "die bump in-field" crosstalk between all adjacent ones of bumps 2034 or 2044 by being between those adjacent ones of bumps 2034 or 2044 above level L1.

In some cases, attachments 2024 (e.g., of zone 2002, zone 2004, pattern 2205, pattern 2208, pattern 2255 and pattern 2258) between data signal attachment structures 2034 in zone 2002 or 2044 in zone 2004 may each provide an electrical ground isolation shield between structures 2034 or 2044 of zones 2002 and 2004 above level L1 that reduces "die bump in-field" crosstalk between all adjacent ones of (e.g., above layer 2110) structures 2034 or 2044 that attachments 2024 are between (e.g., by those attachments 2024 being in zone 2002 or 2004 and over level L1).

In some cases, the solid conductive material ground shielding attachment structures 2020 of zones 2002 and 2004 (e.g., of the ground shielding attachment structures) (such as of pattern 2205, pattern 2208, pattern 2255 and pattern 2258) provide an electrical ground isolation shield between two data signal contacts within one field (e.g., zone) of one type (e.g., RX or TX) of data signal surface contacts (e.g., contacts 2030 or 2040) of a top level L1 or top layer 2110 of a package device (e.g., device 2000, 2001, 2200 and 2201).

In some cases, the ground shielding attachment contacts of zone 2002, zone 2004, pattern 2205, pattern 2208, pattern 2255 and pattern 2258 provide electrical ground isolation shielding between each data signal contact of zones 2002 and 2004 of level L1 that reduces "die contact in-field" crosstalk between all adjacent ones of (e.g., of layer 2110) contacts 2030 and 2040 by being between those adjacent ones of contacts 2030 and 2040 of level L1.

In some cases, structures 2020 (e.g., of zone 2002, zone 2004, pattern 2205, pattern 2208, pattern 2255 and pattern 2258) between data signal contacts 2030 in zone 2002 or 2044 in zone 2004 may each provide an electrical ground isolation shield between contacts 2030 or 2040 of zones 2002 and 2004 of level L1 that reduces "die contact in-field" crosstalk between all adjacent ones of (e.g., of layer 2110) contacts 2030 or 2040 that contacts 2020 are between (e.g., by those contacts 2020 being in zone 2002 or 2004 of level L1).

For example, by being conductive material electrically connected to the ground, attachments 2024 and contacts 2020 of zones 2007 and 2009 may provide electrically grounded structure that absorbs, or shields electromagnetic crosstalk signals produced by one of attachments 2034 or contacts 2030 (e.g., of zone 2002 or beyond side 2081) from reaching a widthwise adjacent (e.g., of zone 2004 or beyond side 2083) one of attachments 2044 and contacts 2040, due to the amount of grounded conductive material, and location of the conductive grounded material adjacent to (e.g., between) that one of attachments 2034 or contacts 2030 and the widthwise adjacent one of attachments 2044 and contacts 2040.

In some cases, attachments 2024 and contacts 2020 reduce electrical crosstalk caused by undesired capacitive, inductive, or conductive coupling of a first signal received or transmitted through (or existing on) one of attachments 2034 or contacts 2030 effecting or being mirrored in a second signal received or transmitted through (or existing on) one of attachments 2044 or contacts 2040. Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one of attachments 2034 or contacts 2030 induces current a second data signal in one of attachments 2044 or contacts 2040. It can be appreciated that the descriptions above are also true for a first signal through attachments 2044 or contacts 2040 effecting or being mirrored in a second signal received or transmitted through (or existing on) one of attachments 2034 or contacts 2030.

In some embodiments, any or each of attachments 2024 and contacts 2020 reduce electrical crosstalk as noted above (1) without increasing the horizontal distance or spacing between any of (a) adjacent contacts 2030 or attachments 2034 of zone 2002; or (b) contacts 2040 or attachments 2044 of zone 2004, (2) without increasing the distance or spacing between the any of Levels L1-L3, (3) without re-ordering any of the contacts (or traces) noted above or Levels L1-L3.

In some cases, device 2000, 2001, 2200 or 2201 includes a solid conductive material ground plane located vertically below contacts 2020, 2030 and 2040. The plane has openings vertically below and horizontally surrounding (surrounding a vertical "shadow" of): (1) the first level first type of data signal contacts 2030, and (2) the first level second type of data signal contacts 2040 by a width W204 which may be at least as large as a width of the data signal attachments 2034 or 2044. The openings may reduce parasitic capacitance caused by a vertical overlap of the grounding plane and the attachments 2034 and 2044, such as where a capacitance is formed between attachments 2034 and 2044 and the ground plane. The openings may also minimize data signal reflection and crosstalk caused by a vertical overlap of the grounding plane and the attachments 2034 and 2044, such as where the reflection and crosstalk is formed between attachments 2034 and 2044 and the ground plane.

For example, as noted herein, FIG. 21A is a schematic cross-sectional side view of package device 2000 showing top or upper layer contacts of a top interconnect level; and a typical layer of ground isolation plane structure 2040 of the package below level L1. FIG. 21A shows layer 2110 having bumps 2024, 2034 and 2044 physically attached to contacts 2020, 2030 and 2040 of top interconnect level L1; and plane 2040 representing one typical layer of ground isolation plane of level L3 below level L1.

Figure 23:
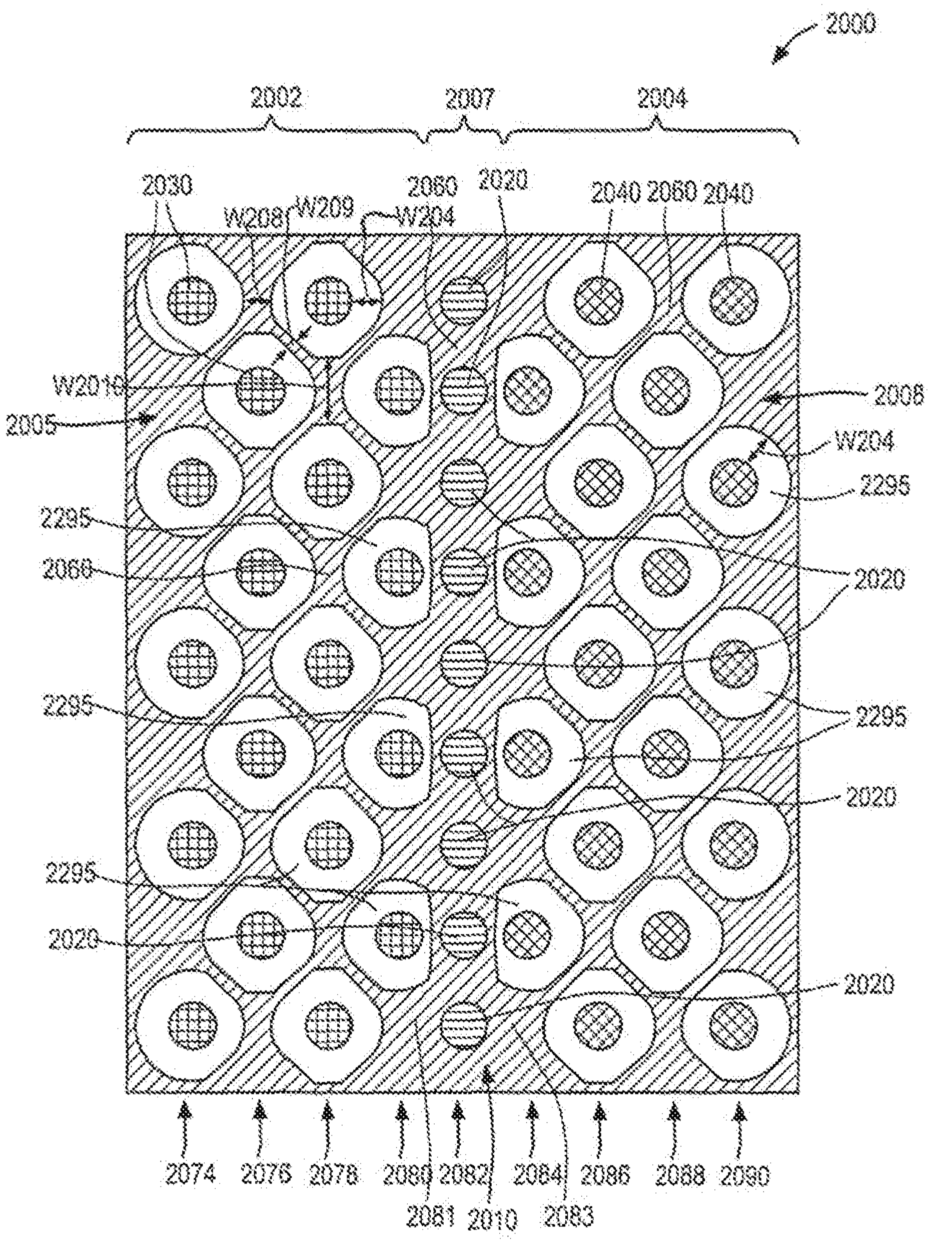
FIG. 23 is a schematic cross-sectional top view of the package device of FIGS. 20A and 21A showing top or upper layer contacts of a top or typical interconnect level; and shading representing one typical layer of ground isolation plane structure of the package below level L1.

FIG. 23 is a schematic cross-sectional top view of the package of FIGS. 20A and 21A showing top or upper layer contacts of a top or typical interconnect level; and shading representing one typical layer of ground isolation plane structure of the package below level L1. FIG. 23 shows layer 2110 having (not shown, bumps 2024, 2034 and 2044 physically attached to) contacts 2020, 2030 and 2040 of top interconnect level L1; and shading 2040 representing one layer of ground isolation plane structure 2040 of the package below level L1. FIG. 23 shows package device 2000 having zone 2002 with contacts 2030 in rows 2074-2080. It shows zone 2004 having contacts 2040 in rows 2084-2090. It shows zone 2007 having contacts 2020 having pattern 2010 in row 2082.

In some cases, level L2 is or includes dielectric material 2003. In some cases, it also include top layer contacts, via contacts, traces or other components that are physically attached to via contacts 2032, 2022 and/or 2042.

Plane 2040 may be a solid conductive material ground plane (e.g., a portion of a layer of device 2000 that is a ground plane) located on level L3, vertically below (e.g., vertically adjacent to and directly below, such as by being in a level below) layer 2110. Plane 2040 has openings 2295 vertically below and horizontally surrounding (e.g., formed from a vertical "shadow" of): (1) the first level first type of data signal contacts 2030, and (2) the first level second type of data signal contacts 2040 by a width W204 at least as large as a width of attachments 2024, 2034 and 2044. In some cases, width W204 is between zero and 20% larger than width W206.

In some cases, ground plane 2040 is connected to electrical grounding to reduce crosstalk between horizontal levels (e.g., level L2 and L4) of device 2000 and openings 2295 reduce parasitic capacitance between (1) the first level first type of data signal attachments 2034 (and optionally also between contacts 2030) and grounding plane 2040, and (2) the first level second type of data signal attachments 2044 (and optionally also between contacts 2040) and the grounding plane 2040. Openings 2295 may reduce the parasitic capacitance by causing attachments 2034 and 2044 (and optionally also contacts 2030 and 2040) to not vertically overlap grounding plane 2040.

In some cases, ground plane 2040 is connected to electrical grounding to reduce crosstalk between horizontal levels (e.g., level L2 and L4) of device 2000 and openings 2295 reduce data signal reflection and crosstalk between (1) the first level first type of data signal attachments 2034 (and optionally also between contacts 2030) and grounding plane 2040, and (2) the first level second type of data signal attachments 2044 (and optionally also between contacts 2040) and the grounding plane 2040. Openings 2295 may reduce the reflection and crosstalk by causing attachments 2034 and 2044 (and optionally also contacts 2030 and 2040) to not vertically overlap grounding plane 2040.

It can be appreciated that in other embodiments, plane 2040 may be located on a level other than level L3, such as level L2, L4 or L5. In can be appreciated that the descriptions for plane 2040 may apply to embodiments having multiple ground planes similar to plane 2040, such as where the multiple planes are on two or more of levels L2-L5.

It can be appreciated that the concepts described above for embodiments of FIGS. 20A, 21A and 23 can also be applied to embodiments of FIGS. 20B and 21B; and FIGS. 22A-B, such as by applying the descriptions for single wide ground contact and solder bump zone 2007 to double wide ground contact and solder bump zone 2009.

More specifically, plane 2040 having openings 2295 vertically below and horizontally surrounding (e.g., formed from a vertical "shadow" of): (1) the first level first type of data signal contacts 2030, and (2) the first level second type of data signal contacts 2040 by a width W204 at least as large as a width of attachments 2024, 2034 and 2044, may also exist in embodiments devices 2001, 2200 and 2201.

In some cases, zones 2002, 2007 (or 2009) and 2004 of FIGS. 20A-21B and 23 are extended lengthwise along LE201 so that another one of upper contacts 2020; 2030 of rows 2076 and 2080; and contacts 2040 of rows 2086 and 2090 are formed lengthwise below those shown. In this case there are 20 of each of contacts 2030 and 2040, and 10 of contacts 2020 of zone 2007 (or 20 of zone 2009).

It can be appreciated that the concepts described above for embodiments of FIGS. 20A-23 shown with level L1 as a top or exposed level, layer 2110 as a top or exposed layer and surface 2003 as a top or exposed surface can also be applied to embodiments where devices 2000, 2001, 2200 and 2201 are inverted (e.g., upside down with respect to cross-sectional side view of FIGS. 20A-23, such as where L1 is a lowest level or bottom level; layer 2110 is a lowest layer or layer; and surface 2006 is a bottom surface of the device. According to these embodiments, device 2000, 2001, 2200 or 2201 may be attached to another package device dispose below surface 2006 (e.g., using solder bumps 2034, 2024 and 2044).

In some embodiments, the vertical ground isolation structures may include vertical ground shielding structures for different types of vertical data signal interconnects (e.g., see vertical data interconnect stacks of FIGS. 20A-23) of package devices. The vertical ground shielding structures may include solid conductive material vertical ground shield interconnects (e.g., see vertical ground isolation signal interconnect stacks of FIGS. 20A-22B), and solid conductive material vertical ground shield fencing structures such as ground plated through hole (PTH) and micro-vias (uVia) (see FIGS. 24-26) that are physically attached to the ground shielding attachment structures as described herein (see FIGS. 20-23). The vertical data signal interconnects may be located or disposed beside and between the different types of vertical data signal interconnects that are spread over an area of and extend through vertical interconnect levels of a package device. The different types of vertical data signal interconnects may include vertically extending transmit and receive data signal interconnects; and the vertical ground shielding structures may reduce signal type (e.g., same or single signal type RX or TX) inter-cluster crosstalk by being between and electrically shielding separate single ones of the vertically extending transmit and receive vertical data signal interconnects.

In some cases, the vertical ground shielding structures may extend through package micro-via interconnect levels and PTH interconnect levels with upper layer ground contacts, upper layer data signal contacts formed over and connected to via contacts or traces of a lower layer of the same micro-via interconnect levels and PTH interconnect levels.

In some cases, the vertical ground shielding structures may provide a better component for the physical and electrical connections between an IC chip or other package device which is mounted upon or to the vertically ground isolated package device. In some cases, it may increase in the stability and cleanliness of ground, and high frequency transmit and receive data signals transmitted between the micro-via interconnect levels and PTH interconnect levels of the package and other components of or attached to the package that are electrically connected to the micro-via interconnect levels and PTH interconnect levels through data signal contacts on the top surface of the package.

In some cases, the micro-via interconnect levels and PTH interconnect levels are part of the vertical data signal interconnects of the package device. In some cases, the vertical ground shielding structures may increase the usable frequency of transmit and receive data signals transmitted through the micro-via interconnect levels and PTH interconnect levels of the package and other components of or attached to the package, as compared to a package not having the structures. Such an increased frequency may include data signals having a speed of between 7 and 25 gigatransfers per second (GT/s). In some cases, GT/s may refer to a number of operations (e.g., transmission of digital data such as the data signal herein) transferring data that occur in each second in some given data transfer channel such as a channel provided by zone 2002 or 2004; or may refer to a sample rate, i.e. the number of data samples captured per second, each sample normally occurring at the clock edge. 1 GT/s is $10^9$ or one billion transfers per second.

In some cases, the vertical ground shielding structures improve (e.g., reduce) crosstalk (e.g., as compared to the same package but without any of the structures) from very low frequency transfer such as from 50 megatransfers per second (MT/s) to greater than 40 GT/s (or up to between 40 and 50 GT/s).

Figure 24A:
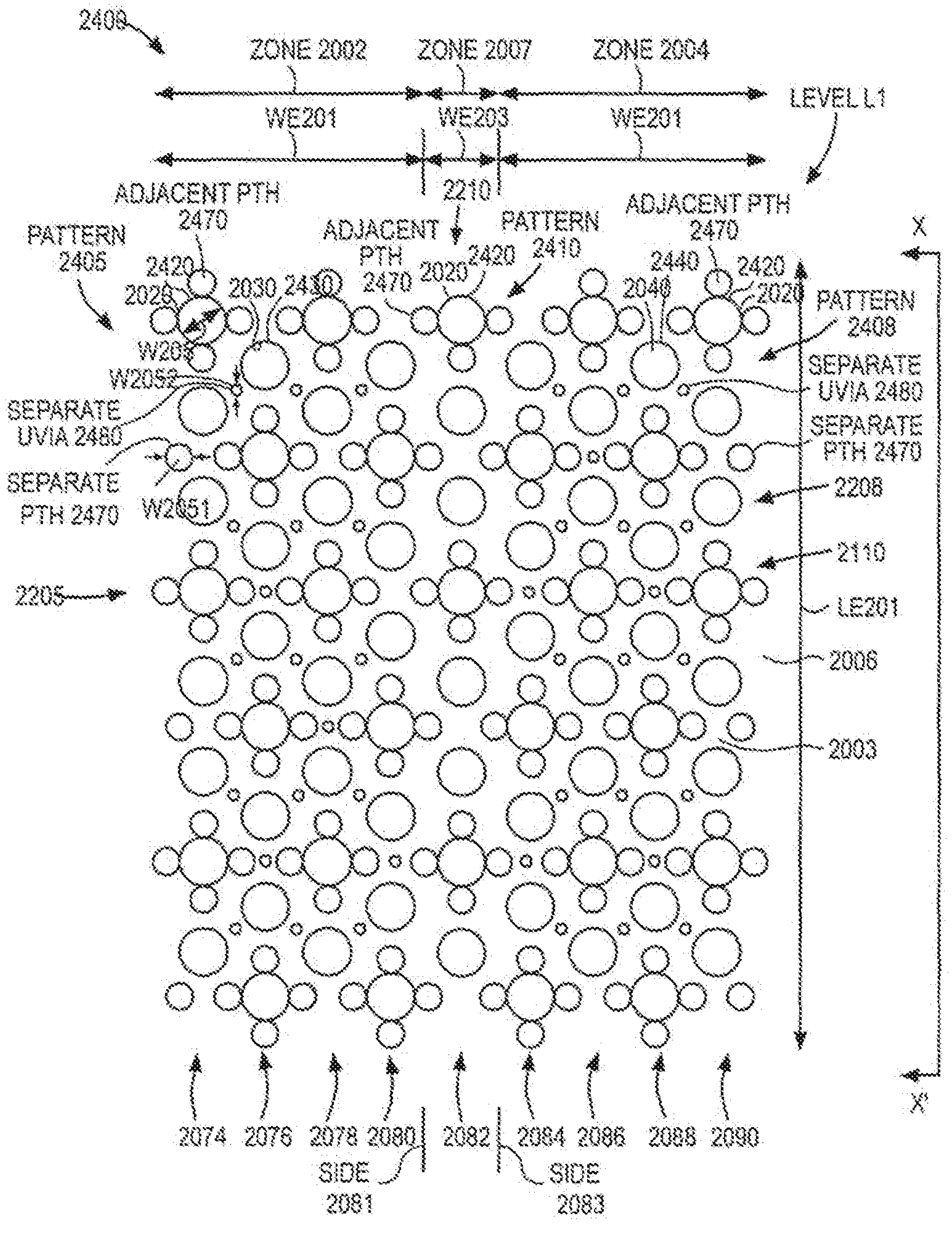
FIG. 24A is a schematic cross-sectional top view of the semiconductor package device of FIG. 22A showing interconnect levels below level L1 with isolation interconnects and adjacent isolation plated through holes (PTH) forming shielding patterns in different zones.

FIG. 24A is a schematic cross-sectional top view of the semiconductor package device of FIG. 22A showing interconnect levels below level L1 with isolation interconnects and adjacent isolation plated through holes (PTH) forming shielding patterns in different zones. FIG. 24A shows package device 2400 as a cross-sectional view from above first interconnect level L1 with upper layer 2110 having upper (e.g., top or first) layer ground isolation contacts 2020, having upper layer receive data signal contacts 2030 and having upper layer transmit data signal contacts 2040. Contacts 2020, 2030 and 2040 are shown surrounded by dielectric layer 2003 such as an electrically non-conductive or insulating material. Device 2400 has top surface 2006, such as a surface of dielectric 2003, upon or in which are formed (e.g., disposed) grounding contacts 2020, receive signal contacts 2030 and transmit contacts 2040.

In some cases, device 2400 is package device 2200 of FIG. 22A. In other cases, device 2200 has layers under level L1 or L2 that are different than those of device 2400, such as by not having structures 2470 and 2480.

In some cases, grounding contacts 2020, receive signal contacts 2030 and transmit contacts 2040 of device 2400 or 2401 may represent grounding contacts 2020, receive signal contacts 2030 and transmit contacts 2040 of any one of device 2000, 2001, 2200 or 2201. In these cases, contacts 2020 of any one of device 2000, 2001, 2200 or 2201 may have layers under level L1 or L2 include structures 2470 and 2480 as described for device 2400 (e.g., in a pattern and physically attached to contacts 2020 or via contacts thereof).

FIG. 24A shows package device 2400 having a first interconnect level L1 with upper layer 2110 having one row of upper (e.g., top or first) layer ground isolation contacts 2020 forming pattern 2210 in zone 2007; having upper layer receive data signal contacts 2030 and additional isolation contacts 2020 forming a shielding pattern 2205 in zone 2002; and having upper layer transmit data signal contacts 2040 and additional isolation contacts 2020 forming a shielding pattern 2208 in zone 2004, such as described for device 2200 of FIG. 22A.

Solder bumps may be formed on upper (e.g., top or first) layer ground isolation contacts 2020 of pattern 2210; upper layer receive data signal contacts 2030 and isolation contacts 2020 of pattern 2205; and upper layer transmit data signal contacts 2040 and isolation contacts 2020 of pattern 2208, of device 2400 such as described for device 2200 of FIG. 22A.

In some cases, instead of pattern 2210, device 2400 may have a double wide pattern of contacts 2020 such as described for zone 2009 of device 2200 of FIG. 22A.

Device 2400 may have contacts 2030 formed onto or physically attached to a top surface of via contacts 2032, ground isolation contacts 2020 formed onto or physically attached to a top surface of via contacts 2022, and contacts 2040 formed onto or physically attached to a top surface of via contacts 2042, such as described for device 2200 of FIG. 22A.

FIG. 24A also shows device 2400 having solid conductive material vertical (e.g., vertically extending through levels of device 2400 below level L1) receive data signal interconnects 2430, solid conductive material vertical transmit data signal interconnects 2440, solid conductive material vertical ground signal interconnects 2420, solid conductive material vertical ground plated through holes (PTH) 2470, and solid conductive material vertical ground micro-vias (uVia) 2480.

In some cases, interconnects 2430 are a vertical extension of interconnect conductive material formed in levels below level L1, that extend below contacts 2030 (and via contacts 2032). For example, Level L1 may be formed on (e.g., physically connected to) a second, lower level L2 having a top layer interconnect contact (that may be less wide than top surface contact width W205) and a lower layer via contact as described for contacts 2030 and 2032. In some cases, interconnects 2430 include contacts 2030 and 2032 as well as the vertical extension of interconnect conductive material formed in levels below level L1.

Such via contact of level L1 may be formed on the top interconnect contact of level L2. Level L2 may be formed on another lower level L3 of device 2400 similar to level L1 being formed on level L2. Level L3 may be formed on a number of additional interconnect levels of device 2400. There may be between 5 and 50 levels in device 2400. In some case there are between 3 and 100 levels.

In some cases, interconnects 2440 are a vertical extension of interconnect conductive material formed in levels below level L1, that extend below contacts 2040 (and via contacts 2042) such as described above for interconnects 2430. In some cases, interconnects 2440 include contacts 2040 and 2042 as well as the vertical extension of interconnect conductive material formed in levels below level L1.

In some cases, interconnects 2420 are a vertical extension of interconnect conductive material formed in levels below level L1, that extend below contacts 2020 (and via contacts 2022). For example, Level L1 may be formed on (e.g., physically connected to) a second, lower level L2 having a top layer interconnect contact (that may be less wide than top surface contact width W205) and a lower layer via contact as described for contacts 2020 and 2022. In some cases, interconnects 2420 include contacts 2020 and 2022 as well as the vertical extension of interconnect conductive material formed in levels below level L1. Such via contacts of level L1 may be formed on the top interconnect contact of level L2, which may be formed on another lower level L3 of device 2400 such as described above for interconnects 2430.

In some cases, PTH 2470 are a vertical extension of interconnect conductive material formed in levels below level L1. For example, Level L1 may be formed on (e.g., physically connected to) a second, lower level L2 having a top layer PTH contact (that may have width W2051 that is less wide than top surface contact width W205) and a lower layer PTH via contact as described for contacts 2020 and 2022. In some cases, PTH 2470 do not include any contact on or at level L1, but are only the vertical extension of interconnect conductive material formed in levels below level L1. In some cases, PTHs 2470 are physically and electrically connected to interconnects 2420 through horizontal ground planes disposed in levels below level L1.

In some cases, PTH 2470 begins with a PTH via contact of level L2 formed on the top interconnect PTH contact of level L3. PTH contacts of Level L3 may be formed on PTH contacts of another lower level L4 of device 2400 similar to level L2 being formed on level L3. Level L4 may be formed on a number of additional interconnect levels of device 2400.

In some cases, uVia 2480 are a vertical extension of interconnect conductive material formed in levels below level L1. For example, Level L1 may be formed on (e.g., physically connected to) a second, lower level L2 having a top layer uVia contact (that may have width W2052 that is less wide than width W2051 and less than top surface contact width W205) and a lower layer uVia via contact as described for contacts 2020 and 2022. In some cases, uVia 2480 do not include any contact on or at level L1, but are only the vertical extension of interconnect conductive material formed in levels below level L1. In some cases, uVias 2480 are physically and electrically connected to interconnects 2420 through horizontal ground planes disposed in levels below level L1.

In some cases, uVia 2480 begins with a uVia via contact of level L2 formed on the top interconnect uVia contact of level L3. uVia contacts of Level L3 may be formed on uVia contacts of another lower level L4 of device 2400 similar to level L2 being formed on level L3. Level L4 may be formed on a number of additional interconnect levels of device 2400.

Each of interconnects 2420 also has at least one widthwise adjacent (but not touching) and/or lengthwise adjacent (but not touching) solid conductive material vertical ground plated through hole (PTH) 2470. Each PTH 2470 may be widthwise adjacent (e.g., above or below in the top view) interconnect 2420; or lengthwise adjacent (e.g., left or right in the top view) of interconnect 2420. For example, in some cases there is only one adjacent PTH 2470, widthwise adjacent, above or below interconnect 2420; or two lengthwise adjacent, left or right of interconnect 2420. In some cases there are two or three adjacent as described for the one. In some cases there are four adjacent PTH 2470, two widthwise adjacent, above and below interconnect 2420; and two lengthwise adjacent, left and right of interconnect 2420.

In addition, FIG. 24A shows separate (e.g., not adjacent to any of interconnects 2420) solid conductive material vertical ground PTHs 2470, and separate (e.g., not adjacent to any of interconnects 2420) solid conductive material vertical ground uVias 2480. The separate PTHs 2470 and uVias 2480 may be not widthwise adjacent (but not touching) or lengthwise adjacent (but not touching) any of interconnects 2420.

PTHs 2470 are shown having width (e.g., diameter) W2051 which may be between 60 and 400 um. In some cases it may be between 180 and 270 um. PTHs 2470 may have height (e.g., thickness) which may be between 50 and 800 um. In some cases it may be between 300 and 500 um. UVias 2480 are shown having width (e.g., diameter) W2052 which may be between 60 and 100 um. In some cases it may be between 70 and 90 um. UVias 2480 may have height (e.g., thickness) which may be between 10 and 45 um. In some cases it may be between 25 and 30 um.

FIG. 24A shows package device 2400 having interconnect levels below level L1 (and including level L1) with interconnects 2430, interconnects 2420 (including adjacent PTH 2470), separate PTHs 2470 and separate uVias 2480 forming shielding pattern 2405 in zone 2002. It also shows device 2400 having interconnect levels below level L1 (and including level L1) with interconnects 2440, interconnects 2420 (including adjacent PTHs 2470), separate PTHs 2470 and separate uVias 2480 forming shielding pattern 2408 in zone 2004. It also shows device 2400 having interconnect levels below level L1 (and including level L1) with interconnects 2420 (including adjacent PTHs 2470) forming shielding pattern 2410 in zone 2007. Interconnects 2420, 2430, and 2440; PTH 2470 and uVias 2480 may be surrounded by dielectric layer 2003 such as an electrically non-conductive or insulating material, except where they are physically attached to a ground plane, trace, signal line or other contact.

In some cases, shielding pattern 2405 includes having each of interconnects 2420 (including adjacent PTHs 2470) (1) surrounded in a "first" hexagonal shape (with one corner to tip pointing lengthwise upwards along length LE201) by six of interconnects 2430, or by as many of interconnects 2430, as there are (e.g., as fit into) zone 2002. This may include each of the six interconnects 2430 disposed at a corner to tip of the hexagonal shape. In this case, pattern 2405 may also include each of interconnects 2420 (including adjacent PTHs 2470) (2) surrounded in a "second" hexagonal shape (with one corner to tip pointing widthwise sideways along width WE201) by six of separate uVias 2480 (or six of separate PTHs 2470 and separate uVias 2480), or by as many of separate PTHs 2470 and separate uVias 2480, as there are (e.g., as fit into) zone 2002. This may include each of the separate PTHs 2470 and/or separate uVias 2480 disposed along a length or line of the hexagonal shape. In addition, in some cases, shielding pattern 2405 includes having each of interconnects 2420 (including adjacent PTHs 2470) and each of interconnects 2430 in pattern 2205.

In some cases, shielding pattern 2405 includes having each of interconnects 2420 of zone 2002 having two adjacent PTH widthwise adjacent (e.g., above and below in the top view) interconnect 2420; two adjacent PTH lengthwise adjacent (e.g., left and right in the top view) of interconnect 2420; six interconnects 2430 (or as many as there are in zone 2002) surrounding interconnect 2420 at the corners of a hexagonal shape (with one corner to tip pointing lengthwise upwards along length LE201); and six separate PTHs 2470 and/or separate uVias 2480 (or as many as there are in zone 2002) surrounding interconnect 2420 at the sides of the hexagonal shape. Here also, in addition, in some cases, shielding pattern 2405 includes having each of interconnects 2420 (including adjacent PTHs 2470) and each of interconnects 2430 in pattern 2205.

In some cases, pattern 2405 includes only interconnects 2430, interconnects 2420 (including adjacent PTH 2470), separate PTHs 2470 and separate uVias 2480; but no other interconnects (e.g., none of interconnects 2440). Pattern 2405 is shown having 20 interconnects 2430, 12 interconnects 2420 (including 48 adjacent PTH 2470), 3 separate PTHs 2470 and 21 separate uVias 2480 forming shielding pattern 2405 in zone 2002. It can be appreciated that there may be more or fewer of these, such as by using separate PTHs 2470 in place of the separate uVias 2480; or vice versa.

Next, along the direction of width WE201, zone 2007 includes pattern 2410 having interconnects 2420 along length LE201. Pattern 2410 is discussed further below with respect to zones 2002 and 2004.

In some cases, shielding pattern 2408 includes having each of interconnects 2420 (including adjacent PTHs 2470) (1) surrounded in a "first" hexagonal shape (with one corner to tip pointing lengthwise upwards along length LE201) by six of interconnects 2440 (in place of 2430), etc., as described for pattern 2405 but have interconnects 2440 in place of interconnects 2430. In some cases, shielding pattern 2408 includes having each of interconnects 2420 (including adjacent PTHs 2470) (1) surrounded in a "second" hexagonal shape, as described for pattern 2405 but have interconnects 2440 in place of interconnects 2430. In addition, in some cases, shielding pattern 2408 includes having each of interconnects 2420 (including adjacent PTHs 2470) and each of interconnects 2440 in pattern 2208.

In some cases, shielding pattern 2408 includes having each of interconnects 2420 of zone 2004 having two adjacent PTH widthwise adjacent (e.g., above and below in the top view) interconnect 2420; two adjacent PTH lengthwise adjacent (e.g., left and right in the top view) of interconnect 2420; six interconnects 2440 (in place of 2430), etc., as described for pattern 2405 but have interconnects 2440 in place of interconnects 2430. Here also, in addition, in some cases, shielding pattern 2408 includes having each of interconnects 2420 (including adjacent PTHs 2470) and each of interconnects 2440 in pattern 2208.

In some cases, pattern 2408 includes only interconnects 2440, interconnects 2420 (including adjacent PTH 2470), separate PTHs 2470 and separate uVias 2480; but no other interconnects (e.g., none of interconnects 2430). Pattern 2408 is shown having 20 interconnects 2440, 12 interconnects 2420 (including 48 adjacent PTH 2470), 3 separate PTHs 2470 and 21 separate uVias 2480 forming shielding pattern 2408 in zone 2004. It can be appreciated that there may be more or fewer of these, such as by using separate PTHs 2470 in place of the separate uVias 2480; or vice versa.

In some cases, any of interconnects 2420, adjacent PTHs 2470, separate PTHs 2470, or separate uVias 2480 may each be described as "vertically extending grounding structures" that are horizontally adjacent to (side by side, and surrounding on at least 4 sides of a hexagon shape) vertically extending data signal interconnects (e.g., interconnects 2430 and 2440). Here, the vertically extending grounding structures and the vertically extending data signal interconnects and are vertically extending along interconnect levels of device 2400. In some cases, shielding pattern 2405 includes having each of interconnects 2430 of zone 2002 having at least four of adjacent PTHs 2470, separate PTHs 2470, or separate uVias 2480 surrounding interconnect 2430 at the corners and along one length of a pentagonal shape. In some cases, shielding pattern 2408 includes having each of interconnects 2440 of zone 2004 having at least four of adjacent PTHs 2470, separate PTHs 2470, or separate uVias 2480 surrounding interconnect 2440 at the corners and along one length of a pentagonal shape.

Ground signal interconnects 2420 are shown having pattern 2410 in zone 2007. Pattern 2410 may include having ground signal interconnects 2420 in fifth row 2082 in zone 2007. In some cases, shielding pattern 2410 includes having each of interconnects 2420 including between one and three adjacent PTHs 2470.

In some cases, shielding pattern 2410 includes having a lengthwise first (e.g., topmost) interconnect 2420 having two widthwise adjacent PTHs 2470, one to the left and one to the right; a lengthwise second (e.g., below the topmost) interconnect 2420 having one lengthwise adjacent PTHs 2470 above the interconnect (e.g., between the second and first interconnects); a lengthwise third (e.g., below the second) interconnect 2420 having one lengthwise adjacent PTHs 2470 below the interconnect (e.g., between the third and a fourth interconnects) and having no adjacent PTHs 2470 between the second and third interconnects; a lengthwise fourth (e.g., below the third) interconnect 2420 having having two widthwise adjacent PTHs 2470, one to the left and one to the right; a lengthwise fifth (e.g., below the fourth) interconnect 2420 having one lengthwise adjacent PTHs 2470 above the interconnect (e.g., between the fifth and fourth interconnects); a lengthwise sixth (e.g., below the fifth) interconnect 2420 having one lengthwise adjacent PTHs 2470 below the interconnect (e.g., between the sixth and seventh interconnects) and having no adjacent PTHs 2470 between the fifth and sixth interconnects; a lengthwise seventh (e.g., below the sixth) interconnect 2420 having having two widthwise adjacent PTHs 2470, one to the left and one to the right; a lengthwise eighth (e.g., below the seventh) interconnect 2420 having one lengthwise adjacent PTHs 2470 above the interconnect (e.g., between the seventh and eighth interconnects). In addition, in some cases, shielding pattern 2410 includes having each of interconnects 2420 (including adjacent PTHs 2470) in pattern 2210.

In some cases, shielding pattern 2410 includes having a lengthwise first (e.g., topmost) interconnect 2420 having one lengthwise adjacent PTHs 2470 below the interconnect (e.g., between the first and a second interconnects); a lengthwise second (e.g., below the first) interconnect 2420 having having two widthwise adjacent PTHs 2470, one to the left and one to the right; a lengthwise third (e.g., below the second) interconnect 2420 having one lengthwise adjacent PTHs 2470 above the interconnect (e.g., between the second and third interconnects); and then repeating this sequence until length LE201 of zone 2007 is full of interconnects 2420. Here also, in addition, in some cases, shielding pattern 2410 includes having each of interconnects 2420 (including adjacent PTHs 2470) in pattern 2210.

In some cases, pattern 2410 includes only interconnects 2420 (including adjacent PTH 2470); but no other interconnects (e.g., none of interconnects 2430 or 2040), and no separate PTHs 2470 or separate uVias 2480. Pattern 2410 is shown having 8 interconnects 2420 (including 11 adjacent PTH 2470) in zone 2007. It can be appreciated that there may be more or fewer of these, such as by adding adjacent PTHs 2470 lengthwise between all of interconnects 2420.

In some cases, any of interconnects 2420, and adjacent PTHs 2470 may each be described as "vertically extending grounding structures" that are horizontally adjacent to (side by side, and surrounding on 1 to 3 sides of a hexagon shape) vertically extending data signal interconnects (e.g., interconnects 2430 and 2440 of zones 2002 and 2004). Here, the vertically extending grounding structures and the vertically extending data signal interconnects and are vertically extending along interconnect levels of device 2400. In some cases, shielding pattern 2410 includes having each of interconnects 2420 of zone 2007 having one to two of adjacent PTHs 2470, no separate PTHs 2470, and no separate uVias 2480 widthwise between all of interconnect 2430 of zone 2002 and widthwise adjacent ones of interconnects 2440 of zone 2004.

In some cases, instead of pattern 2410, device 2400 may have a double wide pattern of interconnects 2420 such as described for zone 2009 of FIGS. 20B and 21B. In this case, the pattern may include having two widthwise adjacent ones of interconnects 2420, each including between one and three adjacent PTHs 2470 as noted above. Here also, in addition, in some cases, this pattern includes having each of interconnects 2420 (including adjacent PTHs 2470) in a double wide pattern of interconnects 2420 such as described for zone 2009 of FIGS. 20B and 21B.

Figure 24B:
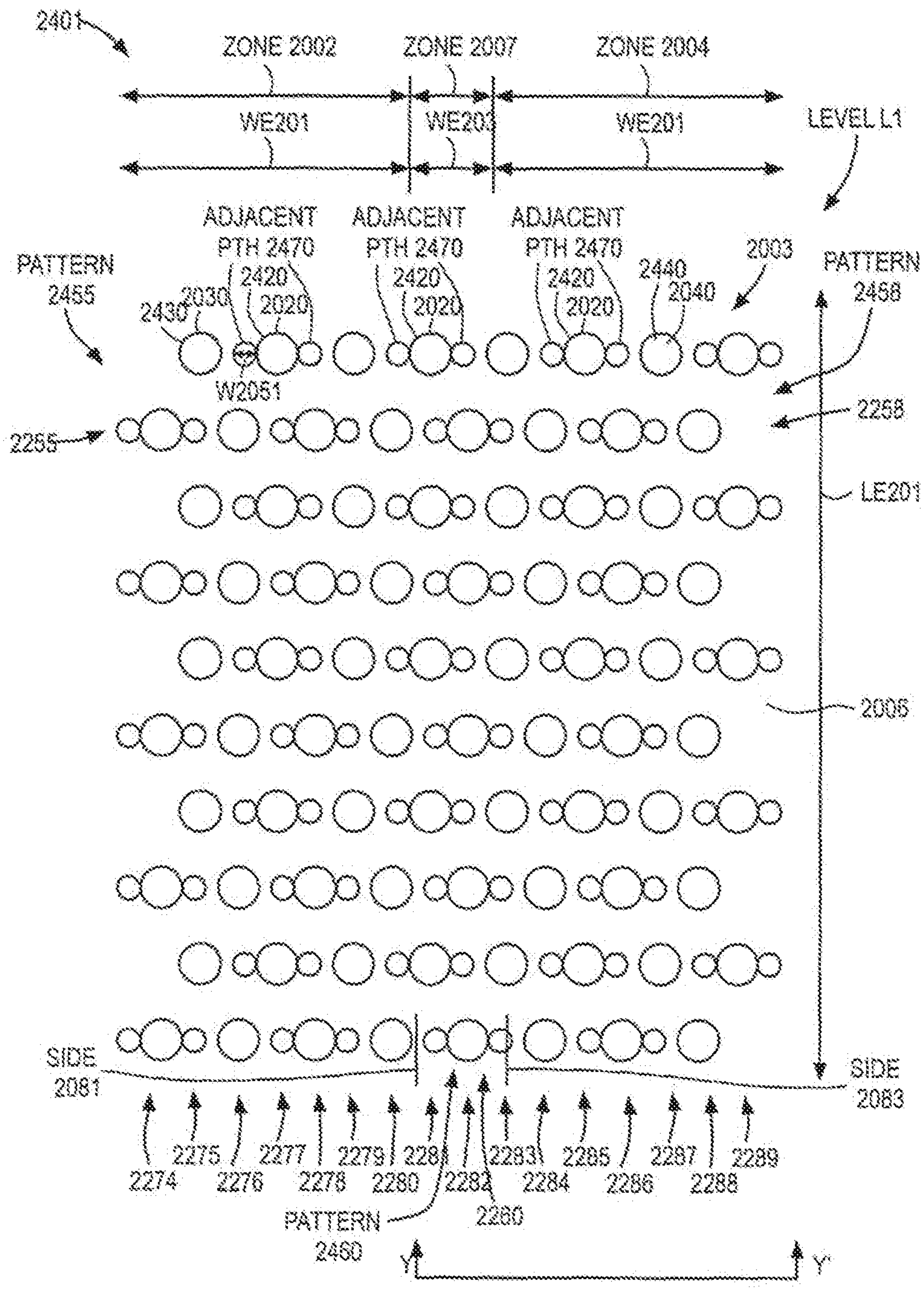
FIG. 24B is a schematic cross-sectional top view of the semiconductor package device of FIG. 22B showing interconnect levels below level L1 with isolation interconnects and adjacent isolation plated through holes (PTH) forming shielding patterns in different zones.

FIG. 24B is a schematic cross-sectional top view of the semiconductor package device of FIG. 22B showing interconnect levels below level L1 with isolation interconnects and adjacent isolation plated through holes (PTH) forming shielding patterns in different zones. FIG. 24B shows package device 2401 having interconnect levels below level L1 (and including level L1) with interconnects 2430, interconnects 2420 (including adjacent PTH 2470) forming shielding pattern 2455 in zone 2002. It also shows device 2401 having interconnect levels below level L1 (and including level L1) with interconnects 2440, interconnects 2420 (including adjacent PTHs 2470) forming shielding pattern 2458 in zone 2004. It also shows device 2400 having interconnect levels below level L1 (and including level L1) with interconnects 2420 (including adjacent PTHs 2470) forming shielding pattern 2460 in zone 2007. Interconnects 2420, 2430, and 2440; PTH 2470 and uVias 2480 may be surrounded by dielectric layer 2003 such as an electrically non-conductive or insulating material, except where they are physically attached to a ground plane, trace, signal line or other contact.

In some cases, shielding pattern 2455 includes having each of interconnects 2420 (including two widthwise adjacent PTHs 2470) widthwise adjacent and between two of interconnects 2430. This may include each of interconnects 2420 having as many of the two widthwise adjacent PTHs 2470 (e.g., one to the left and one to the right), as there are (e.g., as fit into) zone 2002. This may include no separate PTHs 2470 or separate uVias in pattern 2455; and interconnects 2420 of pattern 2455 not having any lengthwise adjacent PTHs 2470. In addition, in some cases, shielding pattern 2455 includes having each of interconnects 2420 (including adjacent PTHs 2470) and each of interconnects 2430 in pattern 2255.

In some cases, shielding pattern 2455 includes each of interconnects 2430 surrounded by four of adjacent PTHs 2470 in a diamond shape (with one corner to tip pointing lengthwise upwards along length LE201), or by as many of adjacent PTHs 2470, as there are (e.g., as fit into) zone 2002. This may include each of the four adjacent PTHs 2470 disposed at a corner to tip of the diamond shape. In addition, in some cases, shielding pattern 2455 includes having each of interconnects 2420 (including adjacent PTHs 2470) and each of interconnects 2430 in pattern 2255.

In some cases, pattern 2455 includes only interconnects 2430, and interconnects 2420 (including adjacent PTH 2470); but no other interconnects (e.g., none of interconnects 2440), no separate PTHs 2470 and no separate uVias 2480. Pattern 2455 is shown having 20 interconnects 2430, and 15 interconnects 2420 (including 30 adjacent PTH 2470) forming shielding pattern 2455 in zone 2002. It can be appreciated that there may be more or fewer of these, such as by excluding or not having the left widthwise adjacent PTHs 2470 of interconnects 2420 in row 2274. In this case there are only 25 adjacent PTHs 2470.

Next, along the direction of width WE201, zone 2007 includes pattern 2460 having interconnects 2420 along length LE201. Pattern 2460 is discussed further below with respect to zones 2002 and 2004.

In some cases, shielding pattern 2458 includes having each of interconnects 2420 (including two widthwise adjacent PTHs 2470) widthwise adjacent and between two of interconnects 2440 (in place of 2430), etc., as described for pattern 2455 but having interconnects 2440 in place of interconnects 2430. In addition, in some cases, shielding pattern 2458 includes having each of interconnects 2420 (including adjacent PTHs 2470) and each of interconnects 2440 in pattern 2258.

In some cases, shielding pattern 2458 includes each of interconnects 2440 surrounded by four of adjacent PTHs 2470 in a diamond shape (with one corner to tip pointing lengthwise upwards along length LE201), or by as many of adjacent PTHs 2470, as there are (e.g., as fit into) zone 2004. This may include each of the four adjacent PTHs 2470 disposed at a corner to tip of the diamond shape. In addition, in some cases, shielding pattern 2458 includes having each of interconnects 2420 (including adjacent PTHs 2470) and each of interconnects 2440 in pattern 2258.

In some cases, pattern 2458 includes only interconnects 2440, and interconnects 2420 (including adjacent PTH 2470); but no other interconnects (e.g., none of interconnects 2430), no separate PTHs 2470 and no separate uVias 2480. Pattern 2458 is shown having 20 interconnects 2440, and 15 interconnects 2420 (including 30 adjacent PTH 2470) forming shielding pattern 2458 in zone 2002. It can be appreciated that there may be more or fewer of these, such as by excluding or not having the right widthwise adjacent PTHs 2470 of interconnects 2420 in row 2289. In this case there are only 25 adjacent PTHs 2470.

In some cases, any of interconnects 2420, adjacent PTHs 2470 may each be described as "vertically extending grounding structures" that are horizontally adjacent to (side by side, and surrounding on at least 3 sides of a diamond shape) vertically extending data signal interconnects (e.g., interconnects 2430 and 2440). Here, the vertically extending grounding structures and the vertically extending data signal interconnects and are vertically extending along interconnect levels of device 2401. In some cases, shielding pattern 2455 includes having each of interconnects 2430 of zone 2002 having at least three of adjacent PTHs 2470 surrounding interconnect 2430 at the corners of a diamond shape (e.g., having a point or corner lengthwise upwards). In some cases, shielding pattern 2458 includes having each of interconnects 2440 of zone 2002 having at least three of adjacent PTHs 2470 surrounding interconnect 2440 at the corners of a diamond shape (e.g., having a point or corner lengthwise upwards).

Ground signal interconnects 2420 are shown having pattern 2460 in zone 2007. Pattern 2460 may include having each of interconnects 2420 (including two widthwise adjacent PTHs 2470) widthwise adjacent and between one of interconnects 2430 of zone 2002 and a widthwise adjacent one of interconnects 2440 of zone 2004. This may include each of interconnects 2420 having as many of the two widthwise adjacent PTHs 2470 (e.g., one to the left and one to the right), as there are (e.g., as fit into) zone 2007. In some cases, this may include each of interconnects 2420 of row 2281 having a left widthwise adjacent PTHs 2470 extending into zone 2002 (e.g., optionally into pattern 2455). In some cases, this may include each of interconnects 2420 of row 2282 having a right widthwise adjacent PTHs 2470 extending into zone 2004 (e.g., optionally into pattern 2458). This may include no separate PTHs 2470 or separate uVias in pattern 2460; and interconnects 2420 of pattern 2460 not having any lengthwise adjacent PTHs 2470. In addition, in some cases, shielding pattern 2460 includes having each of interconnects 2420 (including adjacent PTHs 2470) in pattern 2260.

In some cases, pattern 2460 includes only interconnects 2420 (including adjacent PTH 2470); but no other interconnects (e.g., none of interconnects 2430 or 2040), and no separate PTHs 2470 or separate uVias 2480. Pattern 2460 is shown having 10 interconnects 2420 (including 20 adjacent PTH 2470) in zone 2007. It can be appreciated that there may be more or fewer of these, such as by adding adjacent PTHs 2470 lengthwise between all of interconnects 2420.

In some cases, any of interconnects 2420, and adjacent PTHs 2470 may each be described as "vertically extending grounding structures" that are horizontally adjacent to (side by side, and surrounding on 1 to 3 sides of a diamond shape) vertically extending data signal interconnects (e.g., interconnects 2430 and 2440 of zones 2002 and 2004). Here, the vertically extending grounding structures and the vertically extending data signal interconnects and are vertically extending along interconnect levels of device 2401. In some cases, shielding pattern 2460 includes having each of interconnects 2420 of zone 2007 having two of adjacent PTHs 2470, no separate PTHs 2470, and no separate uVias 2480 widthwise between all of interconnect 2430 of zone 2002 and widthwise adjacent ones of interconnects 2440 of zone 2004.

Figure 25A:
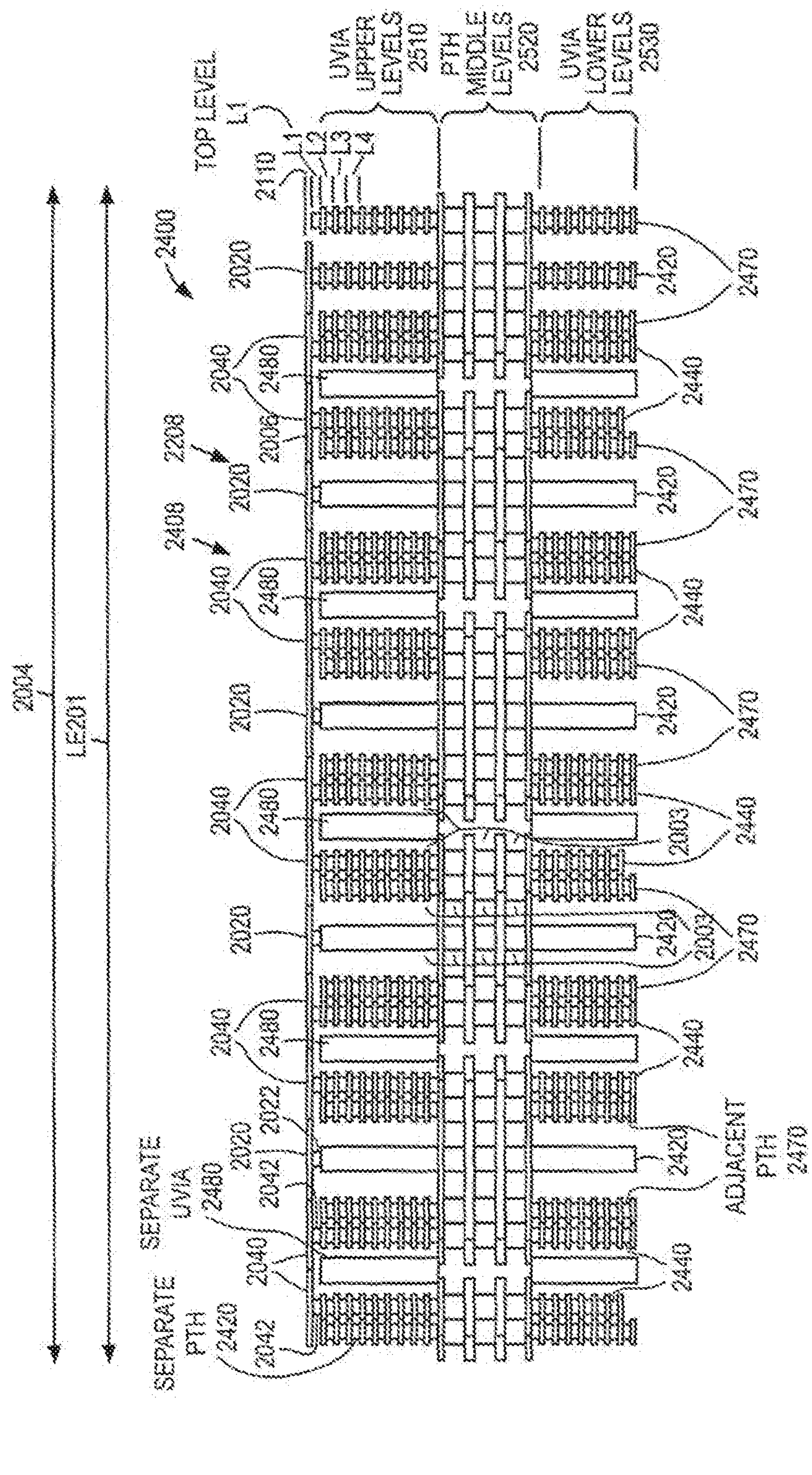
FIG. 25A is a schematic cross-sectional side view of the package of FIG. 24A showing vertically extending ground isolation signal interconnects, vertically extending adjacent plated through holes (PTHs), vertically extending separate PTHs, vertically extending separate micro-vias (uVias), and vertically extending data signal interconnects forming different shielding patterns in different zones.

FIG. 25A is a schematic cross-sectional side view of the package of FIG. 24A showing vertically extending ground isolation signal interconnects, vertically extending adjacent PTHs, vertically extending separate PTHs, vertically extending separate uVias 2480, and vertically extending data signal interconnects forming different shielding patterns in different zones. FIG. 25A shows package device 2400 as a cross-sectional view from perspective X-X' of FIG. 24A. FIG. 25A shows package device 2400 (e.g., a vertically shielded vertical data signal interconnect package device) having a multiple vertical interconnect levels (e.g., level L1, levels 2510, levels 2520 and levels 2530) having vertically extending ground isolation signal interconnects 2420 (e.g., including contacts 2020) each including a plurality of vertically extending adjacent PTHs 2470, vertically extending separate PTHs 2470, vertically extending separate uVias 2480, and vertically extending transmit data signal interconnects 2440 (e.g., including contacts 2040) forming shielding pattern 2408 in zone 2004. It can be appreciated that the descriptions for multiple vertical interconnect levels (e.g., level L1, levels 2510, levels 2520 and levels 2530) having pattern 2408 in zone 2004 also apply to multiple vertical interconnect levels (e.g., level L1, levels 2510, levels 2520 and levels 2530) having the vertically extending ground isolation signal interconnects 2420 (e.g., including contacts 2020) each including a plurality of vertically extending adjacent PTHs 2470, vertically extending separate PTHs 2470, vertically extending separate uVias 2480, and vertically extending transmit data signal interconnects 2430 (e.g., including contacts 2030) forming a shielding pattern 2405 in zone 2002. Similarly, it can be appreciated that the descriptions for multiple vertical interconnect levels (e.g., level L1, levels 2510, levels 2520 and levels 2530) having pattern 2408 in zone 2004 also apply to multiple vertical interconnect levels (e.g., level L1, levels 2510, levels 2520 and levels 2530) having the vertically extending ground isolation signal interconnects 2420 (e.g., including contacts 2020) each including at least one vertically extending adjacent PTH 2470 forming shielding pattern 2410 in zone 2007 located beside and between the zone 2002 and zone 2004.

FIG. 25A shows package device 2400 top or topmost (e.g., first level) interconnect level L1 is formed over (e.g., onto and physically connected to) second level interconnect level L2, which is formed over third interconnect level L3, which is formed over fourth interconnect level L4, which is formed over uVia upper levels 2510, which is formed over PTH middle levels 2520, which is formed over uVia lower levels 2530.

In some cases, adjacent and separate PTHs 2470 and separate uVias 2480 are a vertical interconnects of interconnect conductive material formed in (e.g., that extend) levels below level L1, and that horizontally surround interconnects 2420 on at least one side (or two or three or four), as interconnects 2420 (e.g., extending below contacts 2020 and via contacts 2022). For example, Level L2 (and level L3) may include (a top or first level of) uVias 2480 (or optionally PTH 2470) formed on (e.g., physically connected to) lower levels (e.g., level L3 plus) having a top layer uVia (or optionally PTH 2470) interconnect contact and a lower layer uVia (or optionally PTH 2470) interconnect contact (e.g., as described for contacts 2020 and 2022).

Such via contacts of level L2 may be formed on the top layer uVia (or optionally PTH 2470) interconnect contact of level L3, which may be formed on another lower level L4 of device 2400 such as described above for interconnects 2420. Below or at level L2, PTHs 2470 and uVias 2480 may be physically connected to interconnects 2420 (and contacts 2020 and optionally bumps 2024) through or by one or more of solid conductive material horizontal ground planes (e.g., not shown but such as described for plane 2040). It can be appreciated that such planes may include plane 2040, and planes located on levels other than level L3, such as level L4, levels 2510, levels 2520 and levels 2530. In can be appreciated that the planes may exist on only some of such as level L4, levels 2510, levels 2520 and levels 2530.

In some cases, FIG. 25A shows package device 2400 having vertical top level L1 (e.g., layer 2110) including surface contacts 2020 of the ground isolation signal interconnects 2420, and surface contacts 2040 of the transmit data signal interconnects 2440 (which in some cases can represent surface contacts 2030 of the receive data signal interconnect 2430). FIG. 25A shows level L1 physically attached to (formed over and conductively electrically attached to such as with zero resistance) lower vertically extending (disposed) micro via upper levels 2510 (e.g., including levels L2-L4).

FIG. 25A shows micro via upper levels 2510 including uVia upper levels of the ground isolation signal interconnects 2420, uVia upper levels of the transmit data signal interconnects 2440 (which in some cases can represent uVia upper levels of the receive data signal interconnects 2430), uVia upper levels of the adjacent PTHs 2470, uVia upper levels of the separate PTHs 2470, and uVia upper levels of the separate uVias 2480.

FIG. 25A shows micro via upper levels 2510 physically attached to lower vertically extending plated through hole (PTH) middle levels 2520. FIG. 25A shows PTH middle levels 2520 including PTH middle levels of the ground isolation signal interconnects 2420, PTH middle levels of the transmit data signal interconnects (which in some cases can represent PTH middle levels of the receive data signal interconnects 2430), PTH middle levels of the adjacent PTHs 2470, and PTH middle levels of the separate PTHs 2470, but not PTH middle levels of the separate uVias 2480.

FIG. 25A shows PTH middle levels 2520 is physically attached to lower vertically extending micro via lower levels 2530. FIG. 25A shows micro via lower levels 2530 including uVia lower levels of the ground isolation signal interconnects 2420, uVia lower levels of the transmit data signal interconnects (which in some cases can represent uVia lower levels of the receive data signal interconnects), uVia lower levels of the adjacent PTHs 2470, uVia lower levels of the separate PTHs 2470, and uVia lower levels of the separate uVias 2480.

Although not shown in FIG. 25A, in some cases, the upper, middle and lower level adjacent PTHs 2470, separate PTHs 2470, and separate uVias 2480 are physically attached to (formed with or on the same layer; and conductively electrically attached to such as with zero resistance) the ground isolation signal interconnects 2420 by horizontally adjacent ground isolation planes of the upper, middle and lower levels (e.g., such as described for layer 2040). Such ground planes may extend horizontally through and form such physically connections at 2 or more levels of device 2400 that are below level L1. In some cases they extend through and form such physically connections at between 10 and 30 levels of device 2400 that are below level L1. In some cases they extend through and form such physically connections at between 15 and 25 levels of device 2400 that are below level L1.

Figure 25B:
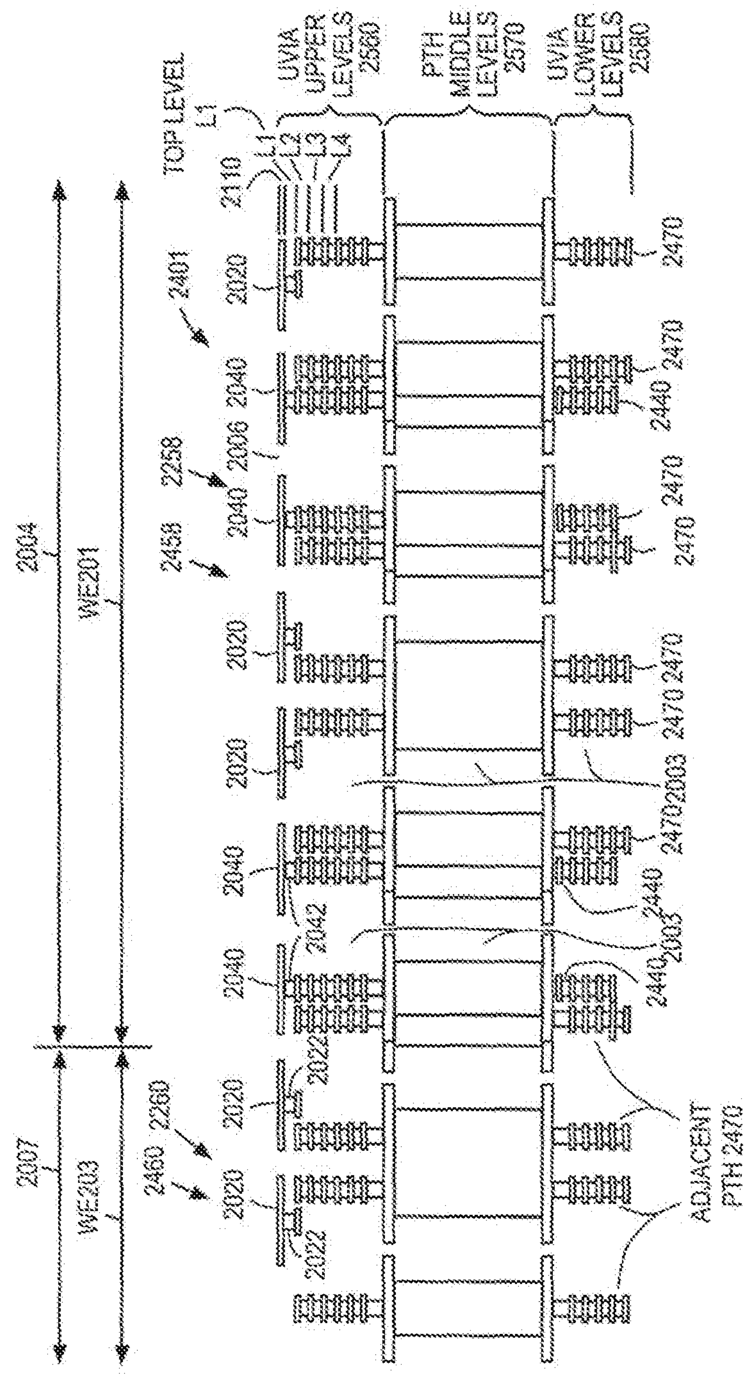
FIG. 25B is a schematic cross-sectional side view of the package of FIG. 24B showing vertically extending ground isolation signal interconnects, vertically extending adjacent PTHs, and vertically extending data signal interconnects forming different shielding patterns in different zones.

FIG. 25B is a schematic cross-sectional side view of the package of FIG. 24B showing vertically extending ground isolation signal interconnects, vertically extending adjacent PTHs, and vertically extending data signal interconnects forming different shielding patterns in different zones. FIG. 25B shows package device 2401 as a cross-sectional view from perspective Y-Y' of FIG. 24B. FIG. 25B shows package device 2401 (e.g., a vertically shielded vertical data signal interconnect package device) having a multiple vertical interconnect levels (e.g., level L1, levels 2560, levels 2570 and levels 2580) having vertically extending ground isolation signal interconnects 2420 (e.g., not shown but formed below and including contacts 2020) each including vertically extending adjacent PTHs 2470, and vertically extending transmit data signal interconnects 2440 (e.g., including contacts 2040) forming shielding pattern 2458 in zone 2004. It can be appreciated that the descriptions for multiple vertical interconnect levels (e.g., level L1, levels 2560, levels 2570 and levels 2580) having pattern 2458 in zone 2004 also apply to multiple vertical interconnect levels (e.g., level L1, levels 2560, levels 2570 and levels 2580) having the vertically extending ground isolation signal interconnects 2420 (e.g., not shown but formed below and including contacts 2020) each including vertically extending adjacent PTHs 2470, and vertically extending transmit data signal interconnects 2430 (e.g., including contacts 2030) forming a shielding pattern 2455 in zone 2002. FIG. 25B also shows package device 2401 having multiple vertical interconnect levels (e.g., level L1, levels 2560, levels 2570 and levels 2580) having the vertically extending ground isolation signal interconnects 2420 (e.g., not shown but formed below and including contacts 2020) each including at least one vertically extending adjacent PTH 2470 forming shielding pattern 2460 in zone 2007 located beside and between the zone 2002 and zone 2004.

FIG. 25B shows package device 2401 top or topmost (e.g., first level) interconnect level L1 is formed over second level interconnect level L2, which is formed over third interconnect level L3, which is formed over fourth interconnect level L4, which is formed over uVia upper levels 2560, which is formed over PTH middle levels 2570, which is formed over uVia lower levels 2580. In some cases, adjacent and separate PTHs 2470 and separate uVias 2480 are a vertical interconnects of interconnect conductive material formed in (e.g., that extend) levels L2, L3, L4 as described for FIG. 25A.

Below or at level L2, PTHs 2470 and uVias 2480 may be physically connected to interconnects 2420 (and contacts 2020 and optionally bumps 2024) through or by one or more of solid conductive material horizontal ground planes (e.g., not shown but such as described for plane 2040) as described for FIG. 25A.

In some cases, FIG. 25B shows package device 2401 having vertical top level L1 (e.g., layer 2110) including surface contacts 2020, 2030 and 2040 of signal interconnects 2420, 2430 and 2440 as described for FIG. 25A. Level L1 may be physically attached to micro via upper levels 2560 as described for Level L1 attached to levels 2510 of FIG. 25A.

FIG. 25B shows micro via upper levels 2560 including uVia upper levels of the ground isolation signal interconnects 2420 (not shown but formed below contacts 2020, such as shown for FIG. 25A), uVia upper levels of the transmit data signal interconnects 2440 (which in some cases can represent uVia upper levels of the receive data signal interconnects 2430), and uVia upper levels of the adjacent PTHs 2470.

FIG. 25B shows micro via upper levels 2560 physically attached to lower vertically extending plated through hole (PTH) middle levels 2570. FIG. 25B shows PTH middle levels 2520 including PTH middle levels of the ground isolation signal interconnects 2420 (not shown but formed below contacts 2020, such as shown for FIG. 25A), PTH middle levels of the transmit data signal interconnects (which in some cases can represent PTH middle levels of the receive data signal interconnects 2430), and PTH middle levels of the adjacent PTHs 2470.

FIG. 25B shows PTH middle levels 2570 is physically attached to lower vertically extending micro via lower levels 2580. FIG. 25B shows micro via lower levels 2580 including uVia lower levels of the ground isolation signal interconnects 2420 (not shown but formed below contacts 2020, such as shown for FIG. 25A), uVia lower levels of the transmit data signal interconnects (which in some cases can represent uVia lower levels of the receive data signal interconnects), and uVia lower levels of the adjacent PTHs 2470.

Although not shown in FIG. 25B, in some cases, the upper, middle and lower level adjacent PTHs 2470, separate PTHs 2470, and separate uVias 2480 are physically attached to (formed with or on the same layer; and conductively electrically attached to such as with zero resistance) the ground isolation signal interconnects 2420 by horizontally adjacent ground isolation planes of the upper, middle and lower levels (e.g., such as described for layer 2040). Such ground planes may extend horizontally through and form such physically connections at 2 or more levels of device 2401 that are below level L1. In some cases they extend through and form such physically connections at between 8 and 28 levels of device 2401 that are below level L1. In some cases they extend through and form such physically connections at between 12 and 20 levels of device 2401 that are below level L1.

It can be appreciated that although FIG. 25B shows a left one of each pair of horizontally adjacent transmit data signal interconnects 2440 (which in some cases can represent PTH middle levels of the receive data signal interconnects 2430) proximal to the right one of the pair (which is distal), in an actual view from perspective Y-Y', the right one of the pair would be proximal and the left one distal. However, both patterns, as well as other patterns as noted for FIG. 24B are considered.

In some cases (thought not shown in FIGS. 25A-B), similar to descriptions for FIGS. 21A and 22A (and 21B and 22B) solder bumps 2024 may be formed on (e.g., physically attached to) upper (e.g., top or first) layer ground isolation contacts 2020 of patterns 2410 (and 2460); bumps 2034 may be formed on upper layer receive data signal contacts 2030 and isolation contacts 2020 of patterns 2405 (and 2455); and bumps 2044 and 2024 may be formed on upper layer transmit data signal contacts 2040 and isolation contacts 2020 of patterns 2408 (and 2458).

In some cases (thought not shown in FIG. 25A), solder bumps 2024, 2034 and 2044 of FIG. 25A, are attached to contacts 2020, 2030 and 2040 of another vertically shielded vertical data signal interconnect package device (e.g., interposer 2706 at location 2707) having vertically extending ground isolation signal interconnects, vertically extending adjacent PTHs, vertically extending separate PTHs (but not vertically extending separate uVias 2480), and vertically extending data signal interconnects forming different shielding patterns 2405, 2408 and 2410 in zones 2002, 2004 and 2007. The other package device may have multiple vertical interconnect levels (e.g., level L1, and levels 2520; but not levels 2510 or levels 2530) having vertically extending ground isolation signal interconnects 2420 (e.g., including contacts 2020) each including a plurality of vertically extending adjacent PTHs 2470, vertically extending separate PTHs 2470 (but not vertically extending separate uVias 2480), and vertically extending transmit data signal interconnects 2440 (e.g., including contacts 2040) forming shielding pattern 2408 in zone 2004. It can be appreciated that the descriptions for multiple vertical interconnect levels (e.g., level L1, and levels 2520; but not levels 2510 or levels 2530) having pattern 2408 in zone 2004 also apply to multiple vertical interconnect (e.g., level L1, and levels 2520; but not levels 2510 or levels 2530) having the vertically extending ground isolation signal interconnects 2420 (e.g., including contacts 2020) each including a plurality of vertically extending adjacent PTHs 2470, vertically extending separate PTHs 2470 (but not vertically extending separate uVias 2480), and vertically extending transmit data signal interconnects 2430 (e.g., including contacts 2030) forming a shielding pattern 2405 in zone 2002. Similarly, it can be appreciated that the descriptions for multiple vertical interconnect levels (e.g., level L1, and levels 2520; but not levels 2510 or levels 2530) having pattern 2408 in zone 2004 also apply to multiple vertical interconnect (e.g., level L1, and levels 2520; but not levels 2510 or levels 2530) having the vertically extending ground isolation signal interconnects 2420 (e.g., including contacts 2020) each including at least one vertically extending adjacent PTH 2470 forming shielding pattern 2410 in zone 2007 located beside and between the zone 2002 and zone 2004.

In some cases (thought not shown in FIG. 25B), solder bumps 2024, 2034 and 2044 of FIG. 25B, are attached to contacts 2020, 2030 and 2040 of another vertically shielded vertical data signal interconnect package device (e.g., interposer 2706 at location 2713) having vertically extending ground isolation signal interconnects, vertically extending adjacent PTHs, and vertically extending data signal interconnects forming different shielding patterns 2455, 2458 and 2460 in zones 2002, 2004 and 2007. The other package device may have multiple vertical interconnect levels (e.g., level L1, and levels 2570; but not levels 2560 or levels 2580) having vertically extending ground isolation signal interconnects 2420 (e.g., including contacts 2020) each including two vertically extending adjacent PTHs 2470, and vertically extending transmit data signal interconnects 2440 (e.g., including contacts 2040) forming shielding pattern 2458 in zone 2004. It can be appreciated that the descriptions for multiple vertical interconnect levels (e.g., level L1, and levels 2570; but not levels 2560 or levels 2580) having pattern 2458 in zone 2004 also apply to multiple vertical interconnect (e.g., level L1, and levels 2570; but not levels 2560 or levels 2580) having the vertically extending ground isolation signal interconnects 2420 (e.g., including contacts 2020) each including tow of vertically extending adjacent PTHs 2470, and vertically extending transmit data signal interconnects 2430 (e.g., including contacts 2030) forming a shielding pattern 2455 in zone 2002. Similarly, it can be appreciated that the descriptions for multiple vertical interconnect levels (e.g., level L1, and levels 2570; but not levels 2560 or levels 2580) having pattern 2458 in zone 2004 also apply to multiple vertical interconnect (e.g., level L1, and levels 2570; but not levels 2560 or levels 2580) having the vertically extending ground isolation signal interconnects 2420 (e.g., including contacts 2020) each including two vertically extending adjacent PTH 2470 forming shielding pattern 2460 in zone 2007 located beside and between the zone 2002 and zone 2004.

It can be appreciated that the concepts described above for vertically extending ground isolation signal interconnects 2420, vertically extending adjacent PTHs 2470, vertically extending separate PTHs 2470, vertically extending separate uVias 2480, and vertically extending data signal interconnects 2430 and 2440 forming different shielding patterns in different zones of FIGS. 25A-B, can also be applied to interconnects or interconnect stacks of devices 2000, 2001, 2200, and 2201. In some cases, grounding contacts 2020, receive signal contacts 2030 and transmit contacts 2040 of devices 2400 may represent vertically extending ground isolation signal interconnects 2420 (having vertically extending adjacent PTHs 2470), vertically extending receive data signal interconnects 2430, and vertically extending transmit data signal interconnects 2430 and 2440 of any one of device 2000, 2001, 2200 or 2201.

In some cases, the solid conductive material vertical ground signal interconnects 2420, (adjacent and/or separate) solid conductive material vertical ground plated through holes (PTH) 2470, and separate solid conductive material vertical ground micro-vias (uVia) 2480 provide an electrical ground isolation shields between zones 2002 and 2004 of levels L1, 2510, 2520, 2530, 2560, 2570 and 2580 that reduces "die bump field" crosstalk between solid conductive material vertical receive data signal interconnects 2430 and solid conductive material vertical transmit data signal interconnects 2440 zones 2002 and 2004 of levels L1, 2510, 2520, 2530, 2560, 2570 and 2580. In some cases, they reduce "die bump in-field" crosstalk between all (e.g., each pair of) adjacent ones of same type (e.g., RX or TX) of solid conductive material vertical receive data signal interconnects 2430 or solid conductive material vertical transmit data signal interconnects 2440 of levels L1, 2510, 2520, 2530, 2560, 2570 and 2580 by being between, surrounding or being surrounded by a type of data signal contacts of a zone (e.g., fields or clusters) 2002 or 2004 of levels L1, 2510, 2520, 2530, 2560, 2570 and 2580 (or as many of those levels as they exist in). Here "adjacent" may be horizontally adjacent (or widthwise adjacent) with respect to WE201, or lengthwise adjacent with respect to LE201 of FIGS. 24A-B and 25A-B.

In some cases, they reduce "die bump field" crosstalk as described for contacts 2030 of zone 2002 and contacts 2040 of zone 2004 for FIGS. 20A-B and 21A-B, but between interconnects 2430 of zone 2002 and interconnects 2440 of zone 2004 (e.g., of levels L1, 2510, 2520, 2530, 2560, 2570 and 2580). In some cases, they reduce "die bump in-field" crosstalk as described for contacts 2030 of zone 2002 or contacts 2040 of zone 2004 for FIGS. 22A-B and 24A-B, but between interconnects 2430 of zone 2002 or interconnects 2440 of zone 2004 (e.g., of levels L1, 2510, 2520, 2530, 2560, 2570 and 2580).

For example, by being conductive material electrically connected to the ground, solid conductive material vertical ground signal interconnects 2420, (adjacent and/or separate) solid conductive material vertical ground plated through holes (PTH) 2470, and separate solid conductive material vertical ground micro-vias (uVia) 2480 may provide electrically grounded structure that absorbs, or shields electromagnetic crosstalk signals produced by one of solid conductive material vertical receive data signal interconnects 2430 (e.g., of zone 2002 or beyond side 2081) from reaching a (horizontally, lengthwise, or widthwise) adjacent one of interconnects 2430 or interconnects 2440 (e.g., of zone 2002 or zone 2004), due to the amount of grounded conductive material, and location of the conductive grounded material adjacent to (e.g., between) that one of interconnects 2430 and interconnects 2430 or 2440.

In some cases, solid conductive material vertical ground signal interconnects 2420, (adjacent and/or separate) solid conductive material vertical ground plated through holes (PTH) 2470, and separate solid conductive material vertical ground micro-vias (uVia) 2480 reduce electrical crosstalk caused by undesired capacitive, inductive, or conductive coupling of a first signal received or transmitted through (or existing on) one of interconnects 2430 effecting or being mirrored in a second signal received or transmitted through (or existing on) one of interconnects 2440. Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one of interconnects 2430 induces current a second data signal in one of interconnects 2440. It can be appreciated that the descriptions above are also true for a first signal through interconnects effecting or being mirrored in a second signal received or transmitted through (or existing on) one of interconnects 2430.

In some embodiments, any or each of solid conductive material vertical ground signal interconnects 2420, (adjacent and/or separate) solid conductive material vertical ground plated through holes (PTH) 2470, and separate solid conductive material vertical ground micro-vias (uVia) 2480 reduce electrical crosstalk as noted above (1) without increasing the horizontal distance or spacing between any of (a) adjacent interconnects 2430 or of zone 2002; or (b) interconnects 2440 of zone 2004, (2) without increasing the distance or spacing between the any of levels L1, 2510, 2520, 2530, 2560, 2570 and 2580, (3) without re-ordering any of the contacts (or traces) noted above or levels L1, 2510, 2520, 2530, 2560, 2570 and 2580.

Figure 26A:
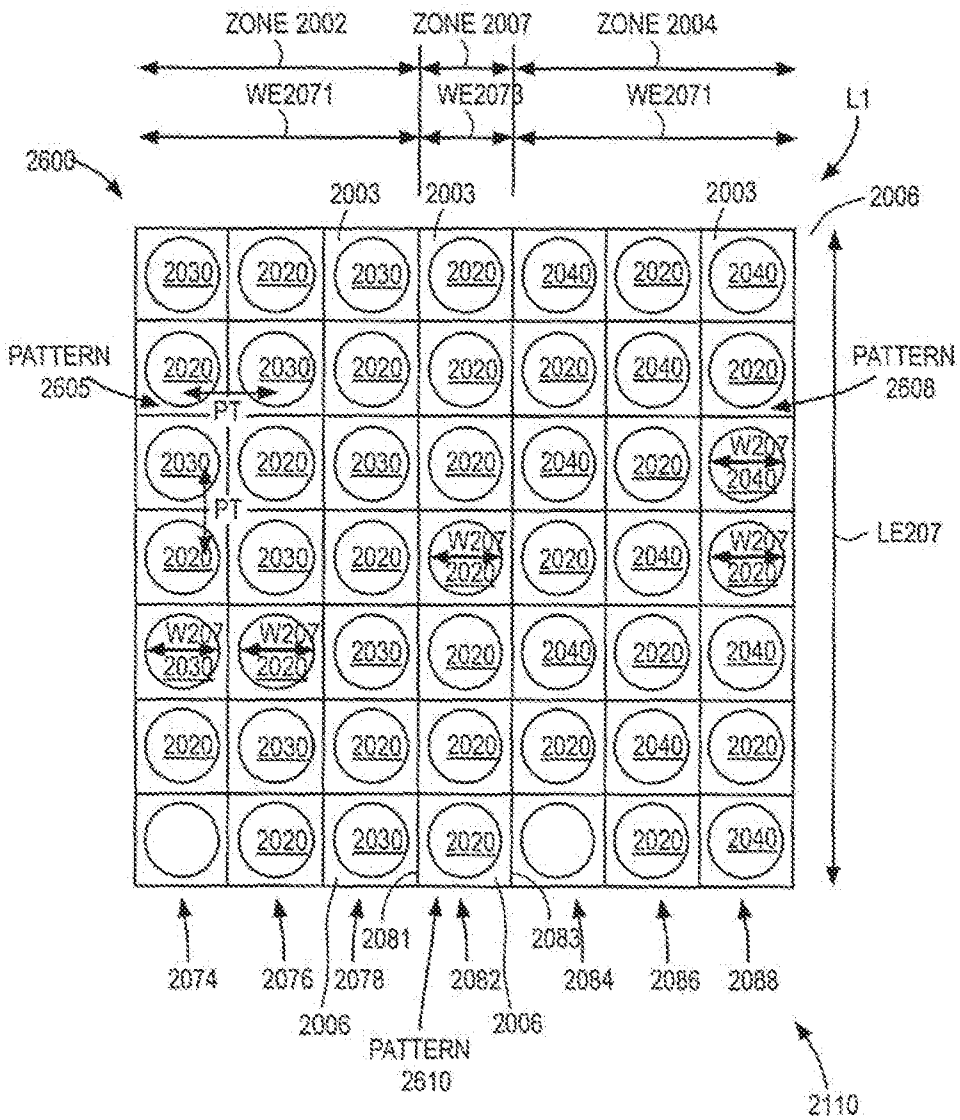
FIG. 26A is a schematic top perspective view of a semiconductor package device upon which at least one integrated circuit (IC) chip (e.g., "die") or other package device may be attached.

FIG. 26A is a schematic top perspective view of a semiconductor package device upon which at least one integrated circuit (IC) chip (e.g., "die") or other package device may be attached. FIG. 26A shows package device 2600 having top surface 2006, such as a surface of dielectric 2003, upon or in which are formed (e.g., disposed) the grounding contacts 2020, receive signal contacts 2030 and transmit contacts 2040. FIG. 26A shows package device 2600 having a first interconnect level L1 with upper layer 2110 having one row of upper (e.g., top or first) layer ground isolation contacts 2020 forming shielding pattern 2610 in zone 2007; having upper layer receive data signal contacts 2030 and additional isolation contacts 2020 forming a shielding pattern 2605 in zone 2002; and having upper layer transmit data signal contacts 2040 and additional isolation contacts 2020 forming a shielding pattern 2605 in zone 2004. Contacts 2020, 2030 and 2040 are surrounded by dielectric layer 2003 such as an electrically non-conductive or insulating material. In some embodiments, device 2600 may be a package device, may be used and may include contacts as described for device 2000, except device 2600 has contact (e.g., shielding) patterns 2605, 2608 and 2610 instead of patterns 2005, 2008 and 2010.

Receive signal contacts 2030 and contacts 2020 are shown having pattern 2605 in zone 2002. Pattern 2605 may include having receive signal contacts 2030 and contacts 2020 in first row 2074, second row 2076, and third row 2078. Pattern 2605 may include having a 1:1 ratio of the receive signal contacts 2030 and contacts 2020 in rows 2074-2078. It may include having non-widthwise (e.g., along WE2071) and non-lengthwise offset (e.g., along LE207) offset contacts in zone 2002, such as to have the contacts in those zones arranged widthwise adjacent (e.g., along WE2071) and lengthwise adjacent to each other (e.g., as shown).

In some cases, shielding pattern 2605 includes the following patterns of contacts lengthwise adjacent along length LE201: first row 2074 having contacts 2030, 2020, 2030, 2020, 2030, 2020, and no contact (or optionally, contact 2030); second row 2076 having contacts 2020, 2030, 2020, 2030, 2020, 2030, 2020; and third row 2078 having contacts 2030, 2020, 2030, 2020, 2030, 2020, and contact 2030 (or optionally, no contact).

In some cases, zone 2002 may be described as a receive or "RX" signal cluster having alternating receive contacts 2030 and isolation contacts 2020 formed in a lengthwise and widthwise grid pattern (e.g., with square grids of alternating contacts) of a 3-row deep die-bump pattern 2605. In some cases, pattern 2605 includes only contacts 2030 and contacts 2020, but no other contacts (e.g., none of contacts 2040). Pattern 2605 is shown having 10 vertical data signal interconnect stacks and 10 vertical ground isolation signal interconnect stacks, each with exposed data signal upper contact 2030 and 2020 that may be formed over or onto a data signal via contact and a ground signal vial contact, respectively, of level L1. It can be appreciated that there may be more or fewer of stacks and contacts 2030 and 2020. In some cases there may be 20 stacks and contacts 2030; and 20 stacks and contacts 2020 in pattern 2605. In some cases there may be 8, 10, 12, 16, 32 or 64 stacks and contacts 2030; and 4, 5, 6, 8, 16 or 32 stacks and contacts 2020 in pattern 2605.

Next, along the direction of width WE2073, row 2082 includes pattern 2610 having contacts 2020 along length LE207. Pattern 2610 is discussed further below with respect to zones 2002 and 2004.

Next, along the direction of width WE2071, transmit signal contacts 2040 and contacts 2020 are shown having pattern 2608 in zone 2004. Pattern 2608 may include having transmit signal contacts 2040 and contacts 2020 in fifth row 2084, sixth row 2086 and seventh row 2088. Pattern 2608 may include having a 1:1 ratio of the transmit signal contacts 2040 and contacts 2020 in rows 2084-2078. Pattern 2608 include having non-widthwise (e.g., along WE2071) and non-lengthwise offset (e.g., along LE207) offset contacts in zone 2004, such as to have the contacts in those zones arranged widthwise adjacent (e.g., along WE2071) and lengthwise adjacent to each other (e.g., as shown).

In some cases, shielding pattern 2608 includes the following patterns of contacts lengthwise adjacent along length LE201: fifth 2084 having contacts 2040, 2020, 2040, 2020, 2040, 2020, and no contact (or optionally, contact 2040); sixth row 2086 having contacts 2020, 2040, 2020, 2040, 2020, 2040, 2020; and seventh row 2088 having contacts 2040, 2020, 2040, 2020, 2040, 2020, and contact 2040 (or optionally, no contact).

In some cases, zone 2004 may be described as a transmit or "TX" signal cluster having alternating receive contacts 2040 and isolation contacts 2020 formed in a lengthwise and widthwise grid pattern (e.g., with square grids of alternating contacts) of a 3-row deep die-bump pattern 2608. In some cases, pattern 2608 includes only contacts 2040 and contacts 2020, but no other contacts (e.g., none of contacts 2030). Pattern 2608 is shown having 10 vertical data signal interconnect stacks and 10 vertical ground isolation signal interconnect stacks, each with exposed data signal upper contact 2040 and 2020 that may be formed over or onto a data signal via contact and a ground signal vial contact, respectively, of level L1. It can be appreciated that there may be more or fewer of stacks and contacts 2040 and 2020. In some cases there may be 20 stacks and contacts 2040; and 20 stacks and contacts 2020 in pattern 2608. In some cases there may be 8, 10, 12, 16, 32 or 64 stacks and contacts 2040; and 4, 5, 6, 8, 16 or 32 stacks and contacts 2020 in pattern 2605.

Ground signal contacts 2020 are shown having pattern 2610 in zone 2007. Zone 2007 has width WE2073 and length LE207. Pattern 2610 may include having ground signal contacts 2020 in fourth row 2082 in zone 2007. In some cases, zone 2007 may be described as a ground signal cluster formed in a vertically offset 1-row deep die-bump pattern 2610. In some cases, pattern 2610 includes only contacts 2020, but no other contacts (e.g., none of contacts 2030 or 2040).

In some cases, as shown, pattern 2610 may include having one of contacts 2020 of a first horizontally adjacent row (one of row 2082) located widthwise equidistant directly between and not lengthwise offset (e.g., along LE207), immediately widthwise adjacent contacts of adjacent rows (e.g., of rows 2078 and 2084).

Pattern 2610 may have 7 vertical ground isolation interconnect stacks, each with an ground isolation upper contact 2020 that may be formed over or onto a ground isolation via contact of level L1. It can be appreciated that there may be more or fewer than 7 of stacks and contacts 2020 in pattern 2210. In some cases there may be 14 stacks and contacts 2020. In some cases 4, 5, 6, 8, 16 or 32.

Pattern 2605 may be described as a three row wide zone of widthwise and lengthwise alternating receive contacts and isolation contacts. Pattern 2608 may be described as a three row wide zone of widthwise and lengthwise alternating transmit contacts and isolation contacts. Pattern 2610 may be described as a one row wide ground isolation zone 2007 located or formed between zone 2002 and zone 2004. Pattern 2610 may have side 2081 widthwise adjacent to (e.g., along width WE2073) or facing zone 2002 and opposite side 2083 (e.g., opposite from side 2081) widthwise adjacent to (e.g., along width WE2073) or facing zone 2004. It can be appreciated that although patterns 2605 and 2608 are shown with the same width and length, they may have different widths and/or lengths.

Patterns 2605, 2608 and 2610 may include having non-widthwise (e.g., along WE2071) and non-lengthwise offset (e.g., along LE207) offset contacts in zones 2002, 2007 and 2004, such as to have the contacts in those zones arranged widthwise adjacent (e.g., along WE2071) and lengthwise adjacent to each other (e.g., as shown). In some cases, each of rows 2074-2088 may be horizontally (e.g., widthwise) equidistant from each other along the direction of width WE2071, and each of the contacts in each row may be vertically (e.g., lengthwise) equidistant from each other along length LE207.

In some cases, instead of pattern 2610, device 2600 may have a double wide pattern of contacts 2020 such as described for zone 2009 of FIGS. 20B and 21B.

Package device 2600 may represent any of patch 2704 or interposer 2706. Device 2600 may be part of an interposer or package device upon which an electro-optical connector will be physically attached (e.g., directly mouted, such as using solder bumps.

Figure 26B:
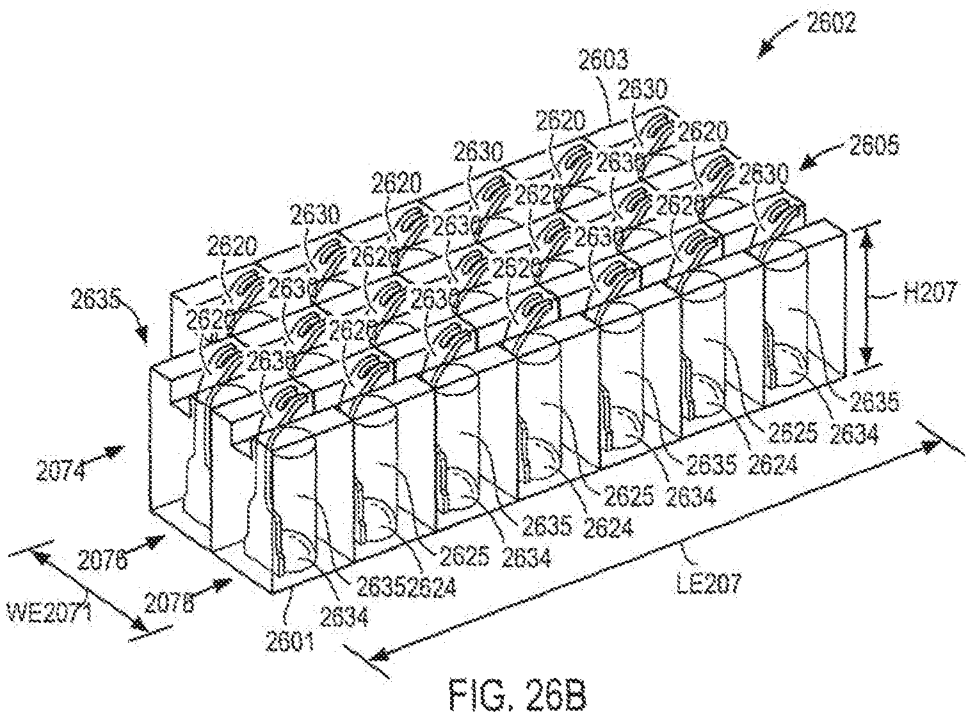
FIG. 26B is a schematic three dimensional cross-sectional perspective view of an electro-optical (EO) connector upon which at least one package device may be mounted.

FIG. 26B is a schematic three dimensional cross-sectional perspective view of an electro-optical (EO) connector 2602 upon which at least one package device may be mounted (e.g., physically attached to a top surface of). In some cases, an integrated circuit (IC) chip (e.g., "die") or electro-optical (EO) module or device (e.g., EO module 2808) may be mounted (e.g., physically attached to a top surface of) the package device (e.g., package 2810 of FIG. 28) that is mounted on connector 2602. In some cases, connector 2602 may be mounted on (e.g., physically attached to a top surface of) another package device (e.g., interposer 2706).

FIG. 26B shows connector 2602 having width WE2071, length LE207, and height H207. It shows connector 2602 having three alternating lengthwise rows 2074, 2076 and 2078, each having alternating ground isolation contact pins 2620 and receive data signal contact pins 2630 (e.g., forming shielding pattern 2605 in zone 2002). Each pin (e.g., pin 2620 or 2630) is within a housing (e.g., see housing 2601, such as representing a connector unit or cell) of dielectric material 2603 (e.g., such as material 2003 shaped as a housing as shown) and is physically attached to or mounted onto a solder bump (e.g., 2624 or 2634). The pin and solder bump may be disposed within an open space (e.g., cylindrical opening 2625 or 2635) formed in the dielectric material.

It shows housings (e.g., see housing 2601) having solder bumps 2634 at the bottom of open spaces 2635 within dielectric 2603. Also in open space 2635 is flexible contact 2630. It shows housings (e.g., see housing 2601) having solder bumps 2624 at the bottom of open spaces 2625 within dielectric 2603. Also in open space 2625 is flexible contact 2620. Similar to contacts 2020 and 2030 of zones 2002 of device 2600, contact pins 2620 and 2630 of connector 2602 have pattern 2605.

Figure 26C:
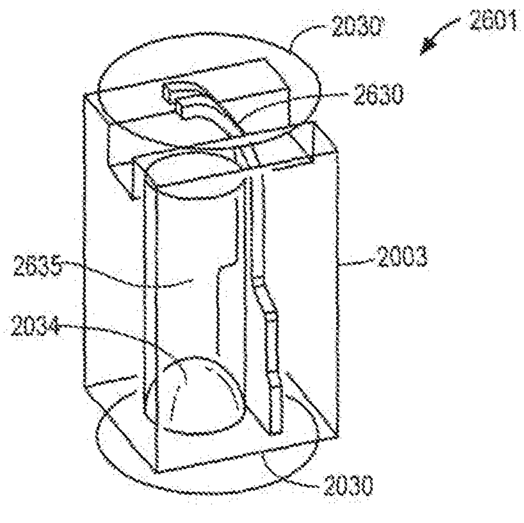
FIG. 26C is a schematic three dimensional cross-sectional perspective view of a housing or cell of the electro-optical (EO) connector of FIG. 26B.

FIG. 26C is a schematic three dimensional cross-sectional perspective view of a housing or cell of the electro-optical (EO) connector of FIG. 26B. FIG. 26C shows housing (e.g., cell) 2601 of device 2602. Housing 2601 (e.g., and connector 2602) may be used to or may be physically and electrically connected between two surface contacts 2630 of different package devices (e.g., as described herein). Housing 2601, is shown for signal pin 2630 but may represent a cell for any of pins 2620, 2630 or 2640.

Cell 2601 is shown having solder bump 2034 physically attached to or formed over contact 2030 (e.g., of a top surface) of a package device (e.g., interposer 2706). FIG. 26C also shows contact pin 2630 physically touching or contacting surface contact 2030' (e.g., of a bottom surface) of a package device (e.g., package 2810). In some cases, an integrated circuit (IC) chip (e.g., "die") or electro-optical (EO) module or device (e.g., EO module 2808) may be mounted (e.g., physically attached to a top surface of) the top surface of the package device (e.g., package 2810) that is mounted on connector housing 2601 (e.g., and connector 2602).

Pins 2620 and 2630 may be conductor material pins, such as of a metal. They may be formed of a material as noted for contacts 2020. They may be flexible contact pins. They may bend within openings 2625 and 2635. Housing 2601 may provide mechanical support for pins 2620 and 2630, and for bumps 2023 and 2034 of each housing. Housing 2601 may provide electrical separation of pins 2620 and 2630 (and bumps 2023 and 2034) of each housing, such as to electrically isolate the pin and bump of that housing from those of adjacent housings.

Although FIGS. 26B-C show connector 2602 having rows 2074-2078 and connector pins 2630 (e.g., RX) and 2620 for zone 2002 of device 2600, the concepts shown and described for those figures can be applied to a version of connector 2602 having rows 2084-2088 and connector pins 740 (e.g., TX) and 2620 for zone 2004 of device 2600. Also, although FIGS. 26B-C show connector 2602 having rows 2074-2078 and connector pins 2630 (e.g., RX) and 2620 for zone 2002 of device 2600, the concepts shown and described for those figures can be applied to a version of connector 2602 having rows 2082 and only connector pins 2620 (e.g., ground isolation GND) for zone 2007 of device 2600.

Rows 2074, 2076 and 2078 of connector 2602 may be mounted upon rows 2074, 2076 and 2078 of device 2600. Connector 2602 may be attached to solder bumps formed on contacts 2020 and 2030 of zone 2002, or zone 2004 of package device 2600. In some cases, one of connector 2602 is attached to both zone 2002 and zone 2004 of package device 2600. In addition, in some cases, a part of the connector, such as a single row 2078 of ground connector cells is attached to zone 2007 of package device 2600. In some cases, connector 2602 includes (1) a single one of connector 2602 as shown attached to contacts 2020 and 2030 in zone 2002 of device 2600, (2) a second one of 2602 as shown attached to contacts 2020 and 2040 zone 2004 of device 2600, and (3) a row of cells such as row 2078 as shown but having all and only contact pins 2620 attached to contacts 2020 zone 2007 of device 2600.

FIGS. 26A-B show pitch PT as the pitch length between lengthwise adjacent ones of, and as pitch width between widthwise adjacent ones of contacts of device 2600 and contact pins of connector 2602. Pitch PT may be a distance of between 0.25 and 1.0 millimeters (mm). It can be between 0.4 and 0.6 mm. In some cases, it can be 0.5 mm.

FIGS. 26A-C show connector 2602 having width WE2071, length LE207, and height H207. In some cases, height H207 is the height between a top surface of a package device upon which connector 2602 is mounted (e.g., interposer 2706) and the bottom surface of another package device (e.g., package 2810) that is mounted on the top of connector 2602 and upon which a chip or EP module. Height H207 may be a distance of between 0.5 and 1.5 millimeters (mm). It can be between 0.8 and 1.2 mm. In some cases, it can be 1.0 mm. In some cases, connector 2602 is considered a "low profile" connector, such as by having height H207 less than 1.5 mm.

In some cases, width WE2071 is the width of 3 rows of contacts or pins (e.g., of zone 2002 or 2004). Width WE2071 may be a distance of between 2.5 and 3.5 millimeters (mm). It can be between 2.8 and 3.2 mm. In some cases, it can be 3.0 mm.

In some cases, width WE2073 is the width of 1 row of contacts or pins (e.g., of zone 2007). Width WE2073 may be a distance of between 0.5 and 1.5 millimeters (mm). It can be between 0.8 and 1.2 mm. In some cases, it can be 1.0 mm.

In some cases, length LE207 is the length of 7 contacts or pins (e.g., of zone 2002, 2004 and 2007). Width LE207 may be a distance of between 6.0 and 8.0 millimeters (mm). It can be between 6.5 and 7.5 mm. In some cases, it can be 7.0 mm.

For FIGS. 26A-C, as note for FIGS. 20A-4, ground shielding attachment structures may include solid conductive material ground isolation shielding attachments 2024 such as solder balls or ball grid arrays (BGA); and/or solid conductive material ground isolation shielding surface contacts 2020 for the isolation attachments of device 2600.

General benefits of zone 2007 shielding between data signal zones/fields/clusters In some cases, the solid conductive material ground shielding attachment structures of zone 2007 and 2009 of device 2600 (e.g., surface contacts 2020 and/or bumps 2024 of zone 2007 or pattern 2610) provide an electrical ground isolation shield between zones 2002 and 2004 of level L1 that reduces "die bump field" crosstalk as noted above for device 2000 (e.g., for surface contacts 2020 and/or bumps 2024 of zone 2007).

In some cases, the solid conductive material ground isolation shielding attachments 2024 of zone 2007 of device 2600 (e.g., of the ground shielding attachment structures) (such as of zone 2007 and pattern 2610) provide an electrical ground isolation shield between two fields (e.g., zones) of different types (e.g., RX and TX) of data signal attachment structures (e.g., bumps 2034 and 2044) formed onto or physically attached to data signal surface contacts (e.g., contacts 2030 and 2040) of a top level L1 or top layer 2110 of device 2600 as noted above for device 2000 (e.g., for surface contacts 2020 and/or bumps 2024 of zone 2007).

In some cases, the solid conductive material ground shielding attachment structures 2020 of zones 2007 and 2009 (e.g., of the ground shielding attachment structures) (such as of zone 2007, zone 2009, pattern 2210 and pattern 2260) provide an electrical ground isolation shield between two fields (e.g., zones) of different types (e.g., RX and TX) of data signal surface contacts (e.g., contacts 2030 and 2040) of a top level L1 or top layer 2110 of package device 2600 as noted above for device 2000 (e.g., for surface contacts 2020 and/or bumps 2024 of zone 2007).

In some cases, the ground shielding attachment contacts 2020 of zone 2007 provide electrical ground isolation shielding between zones 2002 and 2004 of level L1 that reduces "die contact field" crosstalk as noted above for device 2000 (e.g., for surface contacts 2020 and/or bumps 2024 of zone 2007).

In some cases, pins 2620 are the solid conductive material vertical ground signal contact pins that provide an electrical ground isolation shield between zones 2002 and 2004 of levels of connector 2602 that reduces "die bump field" crosstalk between solid conductive material vertical receive data signal contact pins 2630 and solid conductive material vertical transmit data signal contact pins 2640 zones 2002 and 2004 of levels of connector 2602. In some cases, they reduce "die bump in-field" crosstalk between all (e.g., each pair of) adjacent ones of same type (e.g., RX or TX) of solid conductive material vertical receive data signal contact pins 2630 or solid conductive material vertical transmit data signal contact pins 740 of levels of connector 2602 by being between, surrounding or being surrounded by a type of data signal contact pins of a zone (e.g., fields or clusters) 2002 or 2004 of levels of connector 2602. Here "adjacent" may be horizontally adjacent (or widthwise adjacent) with respect to WE2071, or lengthwise adjacent with respect to LE207.

In some cases, they reduce "die bump field" crosstalk as described for contacts 2030 of zone 2002 and contacts 2040 of zone 2004 for FIGS. 20A-B and 21A-B, but between contact pins 2630 of zone 2002 and contact pins 2640 of zone 2004. In some cases, they reduce "die bump in-field" crosstalk as described for contacts 2030 of zone 2002 or contacts 2040 of zone 2004 for FIGS. 22A-B and 24A-B, but between contact pins 2630 of zone 2002 or contact pins 2640 of zone 2004.

For example, by being conductive material electrically connected to the ground, solid conductive material vertical ground signal contact pins 2620 may provide electrically grounded structure that absorbs, or shields electromagnetic crosstalk signals produced by one of solid conductive material vertical receive data signal contact pins 2630 (e.g., of zone 2002 or beyond side 2081) from reaching a (horizontally, lengthwise, or widthwise) adjacent one of contact pins 2630 or contact pins 2640 (e.g., of zone 2002 or zone 2004), due to the amount of grounded conductive material, and location of the conductive grounded material adjacent to (e.g., between) that one of contact pins 2630 and contact pins 2630 or 2640.

In some cases, solid conductive material vertical ground signal contact pins 2620 reduce electrical crosstalk caused by undesired capacitive, inductive, or conductive coupling of a first signal received or transmitted through (or existing on) one of contact pins 2630 effecting or being mirrored in a second signal received or transmitted through (or existing on) one of contact pins 2640. Such electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one of contact pins 2630 induces current a second data signal in one of contact pins 2640. It can be appreciated that the descriptions above are also true for a first signal through interconnects effecting or being mirrored in a second signal received or transmitted through (or existing on) one of contact pins 2630.

In some embodiments, any or each of solid conductive material vertical ground signal contact pins 2620 reduce electrical crosstalk as noted above (1) without increasing the horizontal distance or spacing between any of (a) adjacent contact pins 2630 or of zone 2002; or (b) contact pins 2640 of zone 2004, and/or (2) without increasing the distance or spacing between the any of the levels of device 2600.

In some embodiments, contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 2640 are formed of a solid conductive (e.g., pure conductor) material. In some cases, they may each be a height (e.g., a thickness), width and length of solid conductor material.

In some embodiments, plated through holes (PTH) 2470 may be a vertical cylinder (e.g., along height of levels 2520 and 2570) of outer width W2051 of solid conductor surrounding a hollow shaft (e.g., of air or a vacuum). In some embodiments, plated through holes micro-vias (uVia) 2480 may be a vertical cylinder (e.g., along height of levels 2510 and 2530; or 2560 and 2580) of width W2052 of solid conductor surrounding a hollow shaft (e.g., of air or a vacuum).

The conductive (e.g., conductor) material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper.

In some cases, the formation of contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 2640 of a level or layer (all of which, together, may be described as "conductor material features") may be by processes know for typical chip package manufacturing processes (e.g., known in the industry for a semiconductor package device). In some cases, these conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

In some cases, these conductor material features are formed as a blanket layer or plating of conductor material (e.g., a pure conductive material) that is masked (e.g., ABF and/or dry film resist) and etched to form openings where dielectric material will be deposited, grown or formed (and leave portions of the conductor material where the contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 2640 are now formed). Alternatively, the conductor material may be a layer that is formed or plated in openings existing through a patterned mask, and the mask then removed (e.g., dissolved or burned) to form the contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 2640. Such forming may include or be plating or growing the conductor material such as by plating an electrolytic layer of metal or conductor grown from a seed layer of electroless metal or conductor to form the contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 2640.

In some cases, the contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 2640 may be formed by a process known to form such devices or features of a package or chip package device.

Layers of dielectric 2003 (e.g., and material 2603) may each be a height (e.g., a thickness), width and length of solid non-conductive material. The dielectric material may be a pure non-conductor (e.g., a pure non-conductive material). Such material may be or include ajinomoto build up films (ABF), cured resin, dry film lamination, porcelain, glass, plastic, or the like as known for such a dielectric. In some cases it is ajinomoto build up films (ABF) and/or dry film lamination.

In some cases, the dielectric may be a blanket layer of dielectric material (e.g., a non-conductive insulator material) that is drilled, or masked and etched to form openings where the contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 2640 are deposited, grown or formed (e.g., the remaining material is "non-conductor material features") by processes know for typical chip package manufacturing processes (e.g., known in the industry for a semiconductor package device). In some cases, these non-conductor material features are formed according to a standard package substrate formation processes and tools such as those that include or use: lamination of dielectric layers such as ajinomoto build up films (ABF), curing, laser or mechanical drilling to form vias in the dielectric films, desmear of seed conductor material, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic package device or a microprocessor package.

Alternatively, the dielectric may be a layer that is formed on a patterned mask, and the mask then removed (e.g., dissolved or burned) to form openings where the contacts 2020, 2030, and 2040; via contacts 2022, 2032 and 2042; bumps 2024, 2034 and 2044; interconnects 2420, 2430 and 2440; plated through holes (PTH) 2470; micro-vias (uVia) 2480; and pins 2620, 2630 and 740 are deposited, grown or formed. Such forming of the dielectric layer, or portions may include or be depositing the dielectric material such as by vacuum lamination of ABF, or dry film lamination such as from or on a lower surface of a dielectric material (e.g., that may be the same type of material or a different type of dielectric material) to form the layer or portions. In some cases, the dielectric layer, portions of dielectric structure, or openings in dielectric layer may be formed by a process known to form such dielectric of a package or chip package device.

In some cases, the mask used may be a material formed on a surface (e.g., of a layer); and then having a pattern of the mask removed (e.g., dissolved, developed or burned) to form the openings where the conductor material (or dielectric) are to be formed. In some cases, the mask may be patterned using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form the openings. Depending on the mask type, the exposed or unexposed areas are removed. In some cases, the mask goes through a thermal cure of some type after the openings (e.g., pattern) are defined. In some cases, the mask may be formed by a process known to form such a mask of a chip package, or device formed using a chip package device POR.

In some cases, a "package device" may be defined as two physically attached (e.g., the one and other) package devices. In some cases, such data signals (e.g., from an IC chip or other package device) may be received from or transmitted to (or exist on) contacts on the top or bottom surfaces of the package device (e.g., 2000, 2001, 2200, 2201, 2400, 2401 and 2600) that will be electrically connected to vertical data signal transmission interconnects of the package device. According to embodiments, the vertical data signal transmission interconnects of may be or include vertical stacks of or vertically adjacent (e.g., vertically aligned) contacts and via contacts of one package device. In some cases the vertical data signal transmission interconnects may also include (1) vertically adjacent surface contacts on opposing surfaces of two package devices and (2) physical attachments (e.g., solder balls) between the vertically adjacent surface contacts of the two package devices. In some cases the vertical data signal transmission interconnects may also include vertical data signal transmission interconnects of the second package device that is attached to the first package device. In these cases, the "package device" may include the vertical data signal transmission interconnects described above, and thus may be or include the vertically adjacent contacts, via contacts, surface contacts, physical attachments, of one or both of the first and second package devices.

In some cases, such data signals may be received from or transmitted through (or exist on) (1) vertical data signal transmission interconnects of a first package device, (2) a physical connection between (e.g., surface contacts on and solder bumps between) the first package and a second package device, and (3) vertical data signal transmission interconnects of the second package device that is attached to the first package device.

In some cases, the first package device (e.g., a patch, socket or package upon which at least one IC chip is mounted) may be mounted on or to one location of the second package device (e.g., interposer), and a third package device (e.g., a patch, socket or package upon which at least one other IC chip is mounted) may be mounted on or to another location of the second package device, so that the second package device can provide data signal transfer between first and third package devices. In some cases, the vertical data signal transmission interconnects may extend through (e.g., and include) solder bumps or ball grid array (BGA) contacts attached between the top and bottom surfaces of the two (e.g., first and second; or second and third) attached package devices.

Figure 27:
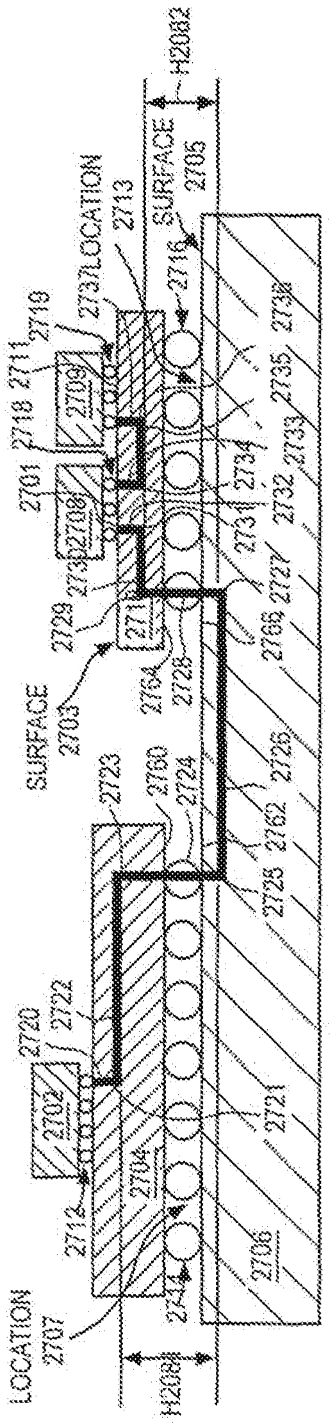
FIG. 27 is schematic cross-sectional side and length views of a computing system, including vertically ground isolated package devices.

FIG. 27 is schematic cross-sectional side and length views of a computing system, including vertically ground isolated package devices. FIG. 27 shows a schematic cross-sectional side view of computing system 2700 (e.g., a system routing signals from a computer processor or chip such as chip 2702 to another device such as chip 2708, or chip 2709), including vertically ground isolated package devices, such as patch 2704, interposer 2706 and package 2710. In some cases, system 2700 has CPU chip 2702 mounted on patch 2704, which is mounted on interposer 2706 at first location 2707. It also shows CLR chip 2708 mounted on package 2710 at first location 2701; and MNH chip 2709 mounted on chip 2710 at second location 2711. Package 2710 is mounted on interposer 2706 at second location 2713.

For example, a bottom surface of chip 2702 is mounted on top surface 2705 of patch 2704 using solder bumps or bump grid array (BGA) 2712. A bottom surface of patch 2704 is mounted on top surface 2705 of interposer 2706 at first location 2707 using solder bumps or BGA 2714. Also, a bottom surface of chip 2708 is mounted on top surface 2703 of package 2710 at first location 2701 using solder bumps or BGA 2718. A bottom surface of chip 2709 is mounted on surface 2703 of package 2710 at location 2711 using solder bumps or BGA 2719. A bottom surface of package 2710 is mounted on surface 2705 of interposer 2706 at second location 2713 using solder bumps or BGA 2716.

In some cases, device 2704, 2706 or 2710 may represent (e.g., a vertically ground isolated package device version of) a substrate package (e.g., 2000, 2001, 2200, 2201, 2400 and 2401), an interposer, a printed circuit board (PCB), a PCB an interposer, a "package", a package device, a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices).

In some cases, chip 2702, chip 2708 and chip 2709 may each represent an integrated circuit (IC) chip or "die" such as a computer processing unit (CPU), microprocessor, coprocessor, graphics processor, memory chip, modem chip, or other microelectronic chip device. In some cases, chip 2702 is an integrated circuit (IC) chip computer processing unit (CPU), microprocessor, or coprocessor. In some cases, chip 2708 is an integrated circuit (IC) chip that is a coprocessor, graphics processor, memory chip, fabric controller chip, network interface chip, switch chip, accelerator chip, field programmable gate array (FPGA) chip, or application-specific integrated circuit (ASIC) chip device. In some cases, chip 2709 is an integrated circuit (IC) chip coprocessor, graphics processor, memory chip, modem chip, communication output signal chip device, fabric controller chip, network interface chip, switch chip, accelerator chip, field programmable gate array (FPGA) chip, or application-specific integrated circuit (ASIC) chip.

FIG. 27 also shows patch vertical "signal" (e.g., here, "signal" including data signal RX and TX lines or traces; power signal lines or traces; and ground signal lines or traces) transmission lines 2720 originating in chip 2702 and extending vertically downward through bumps 2712 and into vertical levels of patch 2704. In some case, lines 2720 may originate at (e.g., include signal and ground contacts on) the bottom surface of chip 2702, extend downward through bumps 2712 (e.g., include some of bumps 2712), extend downward through (e.g., include signal and ground contacts on) a top surface of patch 2704, and extend downward to levels Lj-Ll (with the letter "l" not the number "1") of patch 2704 at first horizontal location 2721 of patch 2704 (e.g., include vertical signal and ground lines within vertical levels Ltop-L1 of patch 2704, such as where level Ltop is the topmost or uppermost level of patch 2004 and has an exposed top surface 2006; and level L1 (with the letter "l" not the number "1") is below level Ltop).

FIG. 27 also shows patch horizontal "signal" transmission lines 2722 originating at first horizontal location 2721 in levels Lj-Ll of patch 2704 and extend horizontally through level Lj-Ll along a length of levels Lj-Ll to second horizontal location 2723 in levels Lj-Ll of patch 2704. "Signal" lines 2722 may be physically attached and/or electrically connected (e.g., with zero electrical resistance) to "signal" lines 2720 at location 2721 in levels Lj-Ll of patch 2704.

Next, FIG. 27 shows vertical "signal" transmission lines 2724 originating in patch 2704 and extending vertically downward along height H2081 through bumps 2714 and into vertical levels of interposer 2706. Height H2081 may be between 0.5 and 2.5 mm. In some cases it may be between 1 and 2 mm. In some cases, it can represent a height equal to between 20 percent and 90 percent of the height of two package devices (e.g., the height of patch 2704 plus of interposer 2706). In some case, lines 2724 may originate at (e.g., from horizontal data signal and ground transmission lines in) levels Lj-Ll at second horizontal location 2723 of patch 2704, extend downward to surface contacts on bottom surface 2760 of patch 2704, extend downward through bumps 2714 (e.g., include signal and ground contacts on the bottom surface 2760 of patch 2704 and some of bumps 2714 at location 2707), extend downward through (e.g., include signal and ground contacts on) top surface 2705 of interposer 2706, and extend downward to levels Lj-Ll of interposer 2706 at first horizontal location 2725 of interposer 2706 (e.g., include vertical signal lines or interconnects within vertical levels L1-L1 of interposer 2706).

In some cases, lines 2724 include or are vertical data signal interconnects and vertical ground isolation structures (e.g., as shown in FIGS. 1-6) originating in patch 2704 and extending vertically downward to bumps 2724, or through bumps 2724 and into interposer 2706. In some case, bottom surface 2760 of patch 2704 represents surface 2006 (e.g., inverted or upside down to that shown in FIGS. 20-25, such as inverted with respect to height such as height H206 of FIG. 2) of a vertically ground isolated package device version of a substrate package (e.g., device 2000, 2001, 2200, 2201, 2400 or 2401). In some case, top surface 2762 or 2705 of interposer 2706 represents surface 2006 of a vertically ground isolated package device version of a substrate package (e.g., device 2000, 2001, 2200, 2201, 2400 or 2401). In some case, bottom surface 2760 of patch 2704 represents surface 2006 (inverted) and top surface 2762 of interposer 2706 represents surface 2006. In some embodiments, lines 2724 represent interconnects, PTH, uVia, solder bumps, surface contacts, and levels as described for device 2000, 2001, 2200, 2201, 2400 or 2401.

In some case, levels Lj-Ll at second horizontal location 2723 of patch 2704 represent levels below level L1 (e.g., such as levels 2530 or 2580; levels including patterns 2405, 2408, and 2410; or levels including patterns 2455, 2458, and 2460); surface contacts on bottom surface 2760 represent contacts 2020, 2030 and 2040 (e.g., such as in patterns 2005, 2008, and 2010; in patterns 2005, 2008, and 2011; in patterns 2205, 2208, and 2210; or in patterns 2255, 2258, and 2260); bumps 2714 represent bumps 2024, 2034 and 2044 as described for device 2000, 2001, 2200, 2201, 2400 or 2401.

In some case, bumps 2714 represent bumps 2024, 2034 and 2044; surface contacts on top surface 2762 (e.g., of surface 2705) of interposer 2706 represent contacts 2020, 2030 and 2040 (e.g., such as in patterns 2005, 2008, and 2010; in patterns 2005, 2008, and 2011; in patterns 2205, 2208, and 2210; or in patterns 2255, 2258, and 2260); levels Lj-Ll of interposer 2706 at first horizontal location 2725 of interposer 2706 represent levels below level L1 (e.g., such as levels 2530 or 2580; levels including patterns 2405, 2408, and 2410; or levels including patterns 2455, 2458, and 2460) as described for device 2000, 2001, 2200, 2201, 2400 or 2401.

In some cases (thought not shown), solder bumps 2714 are physically attached to contacts 2020, 2030 and 2040 of vertically shielded vertical data signal interconnect interposer 2706 at location 2707, where interposer 2706 has levels L1 and 2520 with vertically extending ground isolation signal interconnects, vertically extending adjacent PTHs, and vertically extending data signal interconnects forming different shielding patterns 2405, 2408 and 2410 in zones 2002, 2004 and 2007. "Signal" lines 2724 may be physically attached and/or electrically connected (e.g., with zero electrical resistance) to "signal" lines 2722 at location 2723 in levels Lj-Ll of patch 2704.

FIG. 27 also shows interposer horizontal "signal" transmission lines 2726 originating at first horizontal location 2725 in levels Lj-Ll of interposer 2706 and extend horizontally through levels Lj-Ll along a length of levels Lj-Ll to second horizontal location 2727 in levels Lj-Ll of interposer 2706. "Signal" lines 2726 may be physically attached and/or electrically connected (e.g., with zero electrical resistance) to "signal" lines 2724 at location 2725 in levels Lj-Ll of interposer 2706.

Next, FIG. 27 shows vertical "signal" transmission lines 2728 originating in interposer 2706 and extending vertically upward along height H2082 through bumps 2716 and into vertical levels of package 2710. Height H2082 may be between 0.5 and 2.5 mm. In some cases it may be between 1 and 2 mm. In some cases, it can represent a height equal to between 20 percent and 90 percent of the height of two package devices (e.g., the height of package 2710 plus of interposer 2706). In some case, lines 2728 may originate at (e.g., from horizontal data and ground signal transmission lines in) levels Lj-Ll at second horizontal location 2727 of interposer 2706, extend upward through bumps 2716 (e.g., include signal and ground contacts on top surface 2705 of interposer 2706 and some of bumps 2716 at location 2713), extend upward through (e.g., include signal and ground contacts on) a bottom surface of package 2710, and extend upward to levels Lj-Ll of package 2710 at first horizontal location 2729 of package 2710 (e.g., include vertical signal and ground lines within vertical levels Llast-L1 of package 2710).

In some cases, lines 2728 include or are vertical data signal interconnects and vertical ground isolation structures (e.g., as shown in FIGS. 1-6) originating in package 2710 and extending vertically downward to bumps 2716, or through bumps 2716 and into interposer 2706. In some case, bottom surface 2764 of patch 2704 represents surface 2006 (e.g., inverted or upside down to that shown in FIGS. 1-6, such as inverted with respect to height such as height H206 of FIG. 2) of a vertically ground isolated package device version of a substrate package (e.g., device 2000, 2001, 2200, 2201, 2400 or 2401). In some case, top surface 2766 (e.g., of surface 2705) of interposer 2706 represents surface 2006 of a vertically ground isolated package device version of a substrate package (e.g., device 2000, 2001, 2200, 2201, 2400 or 2401). In some case, bottom surface 2764 of package 2710 represents surface 2006 (inverted), and top surface 2766 of interposer 2706 represents surface 2006. In some embodiments, lines 2724 represent interconnects, PTH, uVia, solder bumps, surface contacts, and levels as described for device 2000, 2001, 2200, 2201, 2400 or 2401.

In some case, levels Lj-Ll at first horizontal location 2730 of package 2710 represent levels below level L1 (e.g., such as levels 2530 or 2580; levels including patterns 2405, 2408, and 2410; or levels including patterns 2455, 2458, and 2460); surface contacts on bottom surface 2760 represent contacts 2020, 2030 and 2040 (e.g., such as in patterns 2005, 2008, and 2010; in patterns 2005, 2008, and 2011; in patterns 2205, 2208, and 2210; or in patterns 2255, 2258, and 2260); bumps 2714 represent bumps 2024, 2034 and 2044 as described for device 2000, 2001, 2200, 2201, 2400 or 2401.

In some case, bumps 2716 represent bumps 2024, 2034 and 2044; contacts on top surface 2766 (e.g., of surface 2705) of interposer 2706 represent contacts 2020, 2030 and 2040 (e.g., such as in patterns 2005, 2008, and 2010; in patterns 2005, 2008, and 2011; in patterns 2205, 2208, and 2210; or in patterns 2255, 2258, and 2260); levels Lj-Ll of interposer 2706 at first horizontal location 2725 of interposer 2706 represent levels below level L1 (e.g., such as levels 2530 or 2580; levels including patterns 2405, 2408, and 2410; or levels including patterns 2455, 2458, and 2460) as described for device 2000, 2001, 2200, 2201, 2400 or 2401.

In some cases (thought not shown), solder bumps 2716 are physically attached to contacts 2020, 2030 and 2040 of vertically shielded vertical data signal interconnect interposer 2706 at location 2713, where interposer 2706 has levels L1 and 2520 with vertically extending ground isolation signal interconnects, vertically extending adjacent PTHs, and vertically extending data signal interconnects forming different shielding patterns 2455, 2458 and 2460 in zones 2002, 2004 and 2007. "Signal" lines 2728 may be physically attached and/or electrically connected (e.g., with zero electrical resistance) to "signal" lines 2726 at location 2727 in levels Lj-Ll of interposer 2706.

FIG. 27 also shows package device horizontal "signal" transmission lines 2730 originating at first horizontal location 2725 in levels Lj-Ll of package 2710 and extend horizontally through levels Lj-Ll along a length of levels Lj-Ll to second horizontal location 2731 in levels Lj-Ll of package 2710. "Signal" lines 2730 may be physically attached and/or electrically connected (e.g., with zero electrical resistance) to "signal" lines 2728 at location 2727 in levels Lj-Ll of interposer 2706.

Next, FIG. 27 shows vertical "signal" transmission lines 2732 originating in package 2710 and extending vertically upward through bumps 2718 and into chip 2708. In some case, lines 2732 may originate at (e.g., from horizontal data and ground signal transmission lines in) levels Lj-Ll at second horizontal location 2731 of package 2710, extend upward through bumps 2718 (e.g., include signal and ground contacts on top surface 2703 of package 2710 and some of bumps 2718 at location 2701), extend upward through (e.g., include signal and ground contacts on) a bottom surface of chip 2708, and extend upward to and terminate at (e.g., include signal and ground contacts on) a bottom surface of chip 2708. "Signal" lines 2732 may be physically attached and/or electrically connected (e.g., with zero electrical resistance) to "signal" lines 2730 at location 2731 in levels Lj-Ll of package 2710.

In some cases the data transmission signals transmitted and received (or existing on) the data signal transmission lines of lines 2720, 2722, 2724, 2728, 2730 and 2732 originate at (e.g., are generate or are provided by) chip 2702 and chip 2708. In some cases, these data signal transmission signals may be generated by active circuits, transistors, transmitter circuitry or other components of or attached to chip 2702 and 2708.

In some cases the ground signals transmitted and received (or existing on) the data signal transmission lines of lines 2720, 2722, 2724, 2728, 2730 and 2732 originate at (e.g., are generate or are provided by) patch 2704 or interposer 2706. In some cases, these data signal transmission signals may be generated by active circuits, transistors, transmitter circuitry or other components of or attached to patch 2704 or interposer 2706.

FIG. 27 also show vertical "signal" transmission lines 2733 originating in chip 2708 and extending vertically downward through bumps 2718 and into vertical levels of package 2710. In some case, lines 2733 may originate at (e.g., include signal and ground contacts on) the bottom surface of chip 2708, extend downward through bumps 2718 (e.g., include some of bumps 2718), extend downward through (e.g., include signal and ground contacts on) a top surface of package 2710, and extend downward to levels Lj-Ll of package 2710 at first horizontal location 2734 of package 2710 (e.g., include vertical signal and ground lines within vertical levels L1-L1 of package 2710).

FIG. 27 also shows package device horizontal "signal" transmission lines 2735 originating at third horizontal location 2734 in levels Lj-Ll of package 2710 and extend horizontally through levels Lj-Ll along a length of levels Lj-Ll to second horizontal location 2736 in levels Lj-Ll of package 2710. "Signal" lines 2735 may be physically attached and/or electrically connected (e.g., with zero electrical resistance) to "signal" lines 2733 at location 2734 in levels Lj-Ll of package 2710.

Next, FIG. 27 shows vertical "signal" transmission lines 2737 originating in package 2710 and extending vertically upward through bumps 2719 and into chip 2709. In some case, lines 2737 may originate at (e.g., from horizontal data and ground signal transmission lines in) levels Lj-Ll at fourth horizontal location 2736 of package 2710, extend upward through bumps 2719 (e.g., include signal contacts on top surface 2703 of package 2710 and some of bumps 2719 at location 2711), extend upward through (e.g., include signal and ground contacts on) a bottom surface of chip 2709, and extend upward to and terminate at (e.g., include signal and ground contacts on) a bottom surface of chip 2709. "Signal" lines 2737 may be physically attached and/or electrically connected (e.g., with zero electrical resistance) to "signal" lines 2735 at location 2736 in levels Lj-Ll of package 2710.

In some cases the data and ground signal transmission signals transmitted and received (or existing on) the data signal transmission lines of lines 2733, 2735 and 2737 originate at (e.g., are generate or are provided by) chip 2708 and chip 2709. In some cases, these data signal transmission signals may be generated by active circuits, transistors, transmitter circuitry or other components of or attached to chip 2708 and 2709.

In some cases the ground signals transmitted and received (or existing on) the data signal transmission lines of lines 2733, 2735 and 2737 originate at (e.g., are generate or are provided by) patch 2704 or interposer 2706. In some cases, these data signal transmission signals may be generated by active circuits, transistors, transmitter circuitry or other components of or attached to patch 2704 or interposer 2706.

Figure 28:
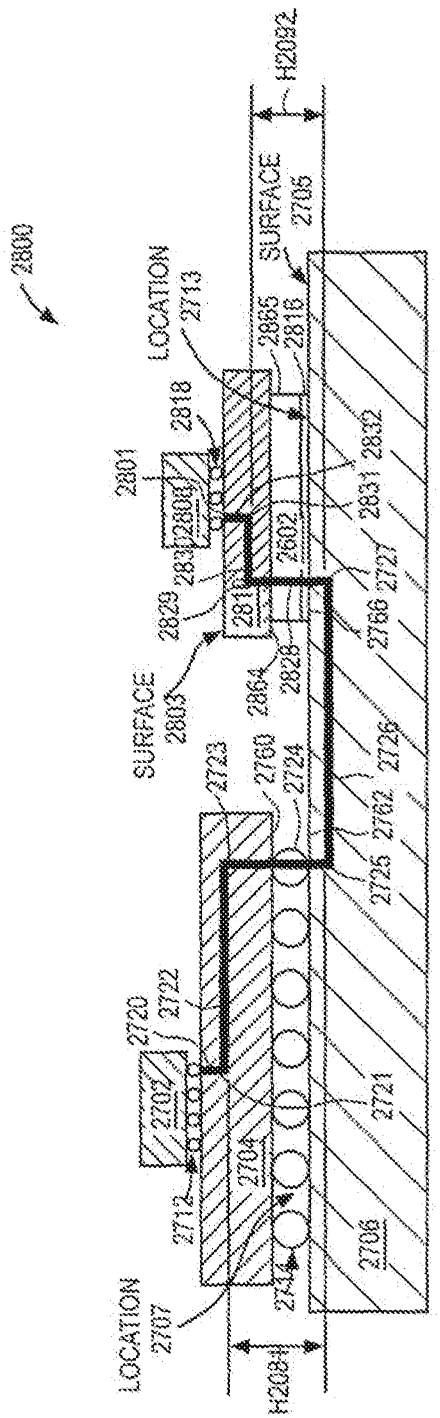
FIG. 28 is schematic cross-sectional side and length views of a computing system, including vertically ground isolated package devices.

FIG. 28 is schematic cross-sectional side and length views of a computing system, including vertically ground isolated package devices. FIG. 28 shows a schematic cross-sectional side view of computing system 2800 (e.g., a system routing signals from a computer processor or chip such as chip 2702 to another device such as electro optical (EO) module or chip 2808 through electro optical (EO) module connector 2602 and package 2810, including vertically ground isolated package devices, such as patch 2704, interposer 2706, connector 2600 and package 2810. In some cases, system 2800 has CPU chip 2702 mounted on patch 2704 (e.g., as noted for FIG. 27), which is mounted on interposer 2706 at first location 2707 (e.g., as noted for FIG. 27). It also shows electro optical (EO) chip 2808 mounted on package 2810 at first location 2801. Package 2810 is mounted on EO module connector 2602. EO module connector 2602 is mounted on the top of interposer 2706 at second location 2713 (e.g., such as mounted on device 2600). In some cases, EO module 2808 converts electronic data communication signals to be sent or for transmission to another device, into optical signals for transmission to the other device. Such optical signals may be sent to an output port which is capable of outputting the optical signals to a connector of a cable which is inserted into the output port.

For example, a bottom surface of chip 2808 is mounted on top surface 2803 of package 2810 at first location 2801 using solder bumps or BGA 2818. In addition, a bottom surface 2864 of package 2810 is mounted on a top surface of EO connector 2602 using flexible contact pins 2865 (e.g., pins 2620, 2630 and 740) of connector 2602 and surface contacts (e.g., see contact 2030' as noted for FIG. 26C; the pins contact contacts 2020, 2030 and 2040) of package 2810. A bottom surface of connector 2602 is mounted on top surface 2766 (e.g., of surface 2705) of interposer 2706 at second location 2713 using solder bumps or BGA 2816 of interposer 2706 (e.g., solder bumps 2024, 2034 and 2044 of device 2600 are physically attached to contacts 2020, 2030 and 2040 of connector 2602 as noted for FIGS. 26A-C).

In some cases, device 2704, 2706 or 2810 may represent (e.g., a vertically ground isolated package device version of) a substrate package (e.g., 2000, 2001, 2200, 2201, 2400, 2401 and 2600), an interposer, a printed circuit board (PCB), a PCB an interposer, a "package", a package device, a socket, an interposer, a motherboard, an EO connector or another substrate upon which integrated circuit (IC) chips or other package devices may be attached (e.g., such as microprocessor, coprocessor, graphics processor, memory chip, modem chip, or other microelectronic chip devices).

FIG. 28 also shows patch vertical and horizontal "signal" (e.g., here, "signal" including data signal RX and TX lines or traces; power signal lines or traces; and ground signal lines or traces) transmission lines 2720-2726 such as noted for FIG. 27.

Next, FIG. 28 shows vertical "signal" transmission lines 2828 originating in interposer 2706 and extending vertically upward along height H2092 through bumps 2816, through connector 2602, and through contact pins 2865 and into vertical levels of package 2810. Height H2092 may be between 1.5 and 3.5 mm. In some cases it may be between 2 and 3 mm. In some cases, it can represent a height equal to between 20 percent and 90 percent of the height of two package devices plus the height of connector 2602 (e.g., the height of package 2810 plus of interposer 2706 plus of connector 2602). In some case, lines 2828 may originate at (e.g., from horizontal data and ground signal transmission lines in) levels Lj-Ll at second horizontal location 2727 of interposer 2706, extend upward through bumps 2816 (e.g., include signal and ground contacts on top surface 2766 (of surface 2705) of interposer 2706 at location 2813, extend upward through (e.g., through solder bumps and contact pints of) connector 2602, extend upward through pins 2865 of connector 2602, extend upward through (e.g., include signal and ground contacts on) bottom surface 2864 of package 2810, and extend upward to levels Lj-Ll of package 2810 (e.g., include vertical signal and ground lines within vertical levels Llast-L1 of package 2810).

In some cases, lines 2828 include or are vertical data signal interconnects and vertical ground isolation structures (e.g., as shown in FIGS. 26A-C) originating in package 2810 and extending vertically downward to pins 2865 and into interposer 2706. In some case, bottom surface 2864 of package 2810 represents surface 2006 (e.g., inverted or upside down to that shown in FIGS. 26A-C, such as inverted with respect to height such as height H207) of a vertically ground isolated package device version of a substrate package (e.g., device 2600). In some case, top surface 2766 (e.g., of surface 2705) of interposer 2706 represents surface 2006 of a vertically ground isolated package device version of a substrate package (e.g., device 2600). In some case, bottom surface 2864 of package 2810 represents surface 2006 (inverted) of device 2600, and top surface 2766 of interposer 2706 represents surface 2006 of device 2600. In some embodiments, lines 2824 represent interconnects, contact pins, solder bumps, surface contacts, and levels as described for device 2600 and connector 2602.

In some case, levels Lj-Ll at first horizontal location 2829 of package 2810 represent levels below level L1 (e.g., such as levels including patterns 2605, 2608, and 2610); surface contacts on bottom surface 2864 represent contacts 2020, 2030 and 2040 (e.g., such as in patterns 2605, 2608, and 2610); and bumps 2816 represent bumps 2024, 2034 and 2044 (e.g., such as in patterns 2605, 2608, and 2610) as described for device 2600.

In some case, bumps 2816 represent bumps 2024, 2034 and 2044 of connector 2602 (e.g., such as in patterns 2605, 2608, and 2610) and pins 2865 repersent pins 2620, 2630 and 2640 of connector 2602 (e.g., such as in patterns 2605, 2608, and 2610).

In some cases (thought not shown), solder bumps 2816 are physically attached to contacts 2020, 2030 and 2040 of vertically shielded vertical data signal interconnect interposer 2706 at location 2713, where interposer 2706 has levels L1 and 2520 with vertically extending ground isolation signal interconnects, vertically extending adjacent PTHs, and vertically extending data signal interconnects forming different shielding patterns 2605, 2608 and 2610 in zones 2002, 2004 and 2007. "Signal" lines 2828 may be physically attached and/or electrically connected (e.g., with zero electrical resistance) to "signal" lines 2726 at location 2727 in levels Lj-Ll of interposer 2706.

FIG. 28 also shows package horizontal "signal" transmission lines 2830 originating at first horizontal location 2829 in levels Lj-Ll of package 2810 and extend horizontally through level Lj-Ll along a length of levels Lj-Ll to second horizontal location 2831 in levels Lj-Ll of package 2810. "Signal" lines 2830 may be physically attached and/or electrically connected (e.g., with zero electrical resistance) to "signal" lines 2828 at location 2829 in levels Lj-Ll of package 2810.

Next, FIG. 28 shows vertical "signal" transmission lines 2832 originating in package 2810 and extending vertically upward through bumps 2818 and into chip 2808. In some case, lines 2832 may originate at (e.g., from horizontal data and ground signal transmission lines in) levels Lj-Ll at second horizontal location 2831 of package 2810, extend upward through bumps 2818 (e.g., include signal and ground contacts on top surface 2803 of package 2810 and some of bumps 2818 at location 2801), extend upward through (e.g., include signal and ground contacts on) a bottom surface of chip 2808, and extend upward to and terminate at (e.g., include signal and ground contacts on) a bottom surface of chip 2808. "Signal" lines 2832 may be physically attached and/or electrically connected (e.g., with zero electrical resistance) to "signal" lines 2830 at location 2831 in levels Lj-Ll of package 2810.

In some cases the data transmission signals transmitted and received (or existing on) the data signal transmission lines of lines 2720, 2722, 2724, 2828, 2830 and 2832 originate at (e.g., are generate or are provided by) chip 2702 and chip 2808. In some cases, these data signal transmission signals may be generated by active circuits, transistors, transmitter circuitry or other components of or attached to chip 2702 and 2808.

In some cases the ground signals transmitted and received (or existing on) the data signal transmission lines of lines 2720, 2722, 2724, 2828, 2830 and 2832 originate at (e.g., are generate or are provided by) patch 2704 or interposer 2706. In some cases, these data signal transmission signals may be generated by active circuits, transistors, transmitter circuitry or other components of or attached to patch 2704 or interposer 2706.

In some cases the data signal transmission signals of lines 2720, 2722, 2724, 2726, 2728, 2730, 2732, 2733, 2735, 2737, 2828, 2830 and/or 2832 are or include data signal transmission signals to an IC chip (e.g., chip 2702, 2708, 2709 or 2808), patch 2704, interposer 2706, package 2710, EO connector 2602, package 2810, EO module 2810; or another device attached to thereto. In some cases the data signal transmission signals of lines 2720, 2722, 2724, 2726, 2728, 2730, 2732, 2733, 2735, 2737, 2828, 2830 and/or 2832 are or include data signal transmission signals from or generated by chip 2702, chip 2708, chip 2709, chip 2808, EO module 2808; or another device attached to thereto.

In some cases the data signal transmission signals described herein are high frequency (HF) data signals (e.g., RX and TX data signals). In some cases, the signals are signals to be or for communication to another device that is not part of system 2700 or 2800; or a system having device 2000, device 2001, device 2200, device 2201, device 2400, device 2401, device 2600, chip 2702, chip 2708, chip 2709, patch 2704, interposer 2706, package 2710, EO connector 2602, or EO module 2810. In this case they may be signal to be or for communication to another device from or by chip 2709 or EO module 2808, or a wired, wireless or optical connector attached to chip 2709 or EO module 2808.

In some cases, the signals have a speed of between 4 and 10 Gigabits per second. In some cases, the signals have a speed of between 6 and 8 Gigabits per second. In some cases, the signals have a speed of between 4 and 5 Gigabits per second. In some cases, the signals have a speed of up to 10 Gigabits per second. In some cases, the signals have a speed of between 4 and 12 Giga-Transfers per second (GT/s). In some cases the signals have a speed of between 30 and 50 GT/s, or between 7 and 25 GT/s; and a voltage of between 0.5 and 2.0 volts. In some cases the signal has a speed of between 6 and 15 GT/s. In some cases the signal has a voltage of between 0.4 and 5.0 volts. In some cases it is a different speed and/or voltage level that is appropriate for receiving or transmitting data signals through or within a package device. In some cases, they are in a range between a very low speed transfer such as from 50 Mega-transfers per second (MT/s) to a GT/s transfer level, such as greater than 40 GT/s (or up to between 40 and 50 GT/s).

In some cases, L1 is a top level; layer 2110 is a top layer; and surface 2006 of device 2000, device 2001, device 2200, or device 2400 is top (e.g., exposed) surface 2762 of interposer 2706. In some cases, L1 is a top level; layer 2110 is a top layer; and surface 2006 of device 2000, device 2001, device 2201, device 2401 or device 2600 is top surface 2766 of interposer 2706.

It can be appreciated that the concepts described above for embodiments of FIGS. 20A-26C shown with level L1 as a top or exposed level, layer 2110 as a top or exposed layer and surface 2006 as a top or exposed surface can also be applied to embodiments where device 2000, device 2001, device 2200, device 2201, device 2400, device 2401, or device 2600 is inverted (e.g., upside down with respect to cross-sectional side view of FIGS. 20A-26C, such as where L1 is a lowest level or bottom level; layer 2110 is a lowest layer or layer; and surface 2006 is a bottom (e.g., exposed) surface of the device. According to these embodiments, device 2000, device 2001, device 2200, device 2201, device 2400, device 2401, device 2600 may be attached to another package device dispose below surface 2006 (e.g., using solder bumps 2034, 2024 and 2044). In some of these cases, L1 is a lowest level or bottom level; layer 2110 is a lowest layer; and surface 2006 of device 2000, device 2001, device 2200, or device 2400 is bottom (e.g., exposed) surface 2760 of patch 2704. In some of these cases, L1 is a lowest level or bottom level; layer 2110 is a lowest layer; and surface 2006 of device 2000, device 2001, device 2201, or device 2401 is bottom surface 2764 of package 2710.

In some cases, (1) L1 represents a top level; layer 2110 represents a top layer; and surface 2006 of device 2000, device 2001, device 2200, or device 2400 represents top surface 2762 of interposer 2706; and (2) L1 represents a lowest level or bottom level; layer 2110 represents a lowest layer; and surface 2006 of device 2000, device 2001, device 2200, or device 2400 represents bottom (e.g., exposed) surface 2760 of patch 2704. In some cases, (1) L1 represents a top level; layer 2110 represents a top layer; and surface 2006 of device 2000, device 2001, device 2201, device 2401 or device 2600 represents top surface 2766 of interposer 2706; and (2) L1 represents a lowest level or bottom level; layer 2110 represents a lowest layer; and surface 2006 of device 2000, device 2001, device 2201, or device 2400 represents bottom (e.g., exposed) surface 2764 of package 2710. Some embodiments combine the description of the two sentences above.

In some cases, for surface 2760 or 2762 (e.g., of FIGS. 27 and 28) the diagonal pitch (PD20) of adjacent interconnects (e.g., separated in an equally widthwise and lengthwise manner which is the diagonal distance between the center of two diagonally adjacent interconnects) between any of two interconnects (e.g., interconnects 2420, 2430 and 2440 from Level L2 or a level below L1 and extending to level Lj-Ll of a package device) of vertical interconnects of zones 2002, 2004 and 2007 (or 2009) is approximately 450 micrometers. In some cases, this pitch PD20 is between 350 and 550 micrometers (um).

In some cases, the numbers above apply to PD20 between any of two contacts 2020, 2030 and 2040 in zones 2002, 2004 and 2007 (or 2009) of surface 2760 or 2762. In some cases, the numbers above apply to PD20 between any of two solder bumps 2024, 2034 and 2044 (e.g., which may be represented by BGA 2724) in zones 2002, 2004 and 2007 (or 2009) between surface 2760 and 2762.

In some cases, the corresponding pitch length (e.g., PL20) and pitch width (e.g., PW20) of the patterns having this PD20 are calculated on a right triangle basis from this PD20, where the right angle is between sides PL20 and PW20 and the triangle hypotenuse is 2×PD20 (e.g., for PD20 of 450 um; PL20 and PW20 may be approximately 636 um if PL20=PW20).

In some cases, the descriptions above in this paragraph apply to device 2000, device 2001, device 2200 (though note that lengthwise pitch of contacts is actually PL20/2) and device 2400. In some of these cases, with WE201 is 5×PD20+/−40 percent, width WE203 is PD20+/−40 percent, and length LE201 is 10×PD20+/−40 percent. In some of these cases, with WE201 is 5×PD20+/−20 percent, width WE203 is PD20+/−20 percent, and length LE201 is 10×PD20+/−20 percent. In some of these cases, with WE201 is approximately 2250 um, width WE203 is approximately 450 um, and length LE201 is approximately 4500 um. In some of these cases, with WE201 is between 1350 um and 3150 um; width WE203 is between 300 um and 600 um; and length LE201 is between 3000 um and 6000 um.

In some cases, for surface 2764 or 2766 (e.g., of FIGS. 27 and 28) the diagonal pitch (PD20) of adjacent interconnects (e.g., separated in an equally widthwise and lengthwise manner which is the diagonal distance between the center of two diagonally adjacent interconnects) between any of two interconnects (e.g., interconnects 2420, 2430 and 2440 from Level L2 or a level below L1 and extending to level Lj-Ll of a package device) of vertical interconnects of zones 2002, 2004 and 2007 (or 2009) is approximately 650 micrometers. In some cases, this pitch PD20 is between 550 and 750 micrometers (um).

In some cases, the numbers above apply to PD20 between any of two contacts 2020, 2030 and 2040 in zones 2002, 2004 and 2007 (or 2009) of surface 2764 or 2766. In some cases, the numbers above apply to PD20 between any of two solder bumps 2024, 2034 and 2044 (e.g., which may be represented by BGA 2724) in zones 2002, 2004 and 2007 (or 2009) between surface 2764 and 2766.

In some cases, the corresponding pitch length (e.g., PL20) and pitch width (e.g., PW20) of the patterns having this PD20 are calculated on a right triangle basis from this PD20, where the right angle is between sides PL20 and PW20 and the triangle hypotenuse is 2×PD20 (e.g., for PD20 of 650 um; PL20 and PW20 may be approximately 919 um if PL20=PW20).

In some cases, the descriptions above in this paragraph apply to device 2000, device 2001, device 2201 and device 2401. In some of these cases, with WE201 is 5×PD20+/−40 percent, width WE203 is PD20+/−40 percent, and length LE201 is 10×PD20+/−40 percent. In some of these cases, with WE201 is 5×PD20+/−20 percent, width WE203 is PD20+/−20 percent, and length LE201 is 10×PD20+/−20 percent. In some of these cases, with WE201 is approximately 3250 um, width WE203 is approximately 650 um, and length LE201 is approximately 6500 um. In some of these cases, with WE201 is between 1950 um and 4550 um; width WE203 is between 400 um and 900 um; and length LE201 is between 4000 um and 9000 um.

In the cases above, "approximately" may represent a difference of within plus or minus 5 percent of the number stated. In other cases, it may represent a difference of within plus or minus 10 percent of the number stated.

For some embodiments, chips 2002, 2008 and/or 2009 are not included. Some embodiments include only patch 2004, interposer 2006 and package 2010 as described herein. Some embodiments include only patch 2404, interposer 2406 and package 2410 as described herein. Some embodiments include only patch 2806, interposer 2806 and package 2810 as described herein.

For some embodiments, only patch 2704 is included (e.g., chip 2702 and interposer 2706 are not included). For some embodiments, only interposer 2706 is included (e.g., patch 2704 and package 2710 or 2810 are not included). For some embodiments, only package 2710 or 2810 is included (e.g., chips 2708, 2709 and 2809; and interposer 2706 are not included). Some embodiments include only one of package device 2000, device 2001, device 2200, device 2201, device 2400, device 2401, or device 2600 as described herein. For some embodiments, only two of device 2000, device 2001, device 2200, device 2201, device 2400, device 2401, or device 2600 are includes. For some embodiments any 3 of those devices are included. For some embodiments any 4 of those devices are included.

In some cases, descriptions herein for "each" or "each of" of a feature, such as in "each of contacts 2020 in zone 2007", "each of contacts 2020 in zone 2002", "each of bumps 2024 in zone 2007", "each of bumps 2024 in zone 2002"; the like for contacts 2030 or 2040 in zones 2002 or 2004; or the like for bumps 2034 or 2044 in zones 2002 or 2004 may be for most of those features or for less than all of those feature in that zone. In some cases they may refer to between 80 and 90 percent of those features existing in that zone.

In some cases, descriptions herein for "each" of a feature, such as in "each of interconnects 2420 in zone 2007", "each of interconnects 2420 in zone 2002", "each of adjacent PTH 2470" in zone 2002, 2004 or 2007, "each of separate PTH 2470" in zone 2002 or 2004, "each of separate uVia PTH 2480" in zone 2002 or 2004; the like for interconnects 2430 or 2040 in zones 2002 or 2004 may be for between most of those features and less than all of those feature in that zone. In some cases they may refer to between 80 and 90 percent of those features existing in that zone.

In some cases, any or all of length LE201 and LE207 may be between 3 and 5 percent less than or greater than that described herein. In some cases, they may be between 5 and 10 percent less than or greater than that described herein.

In some cases, any or all of widths WE201, WE203, WE204, WE2071, WE2073, W204, W205, W207, W208, W209, W210, W2051, and W2052 may represent a circular diameter, or the maximum width (maximum distance from one edge to another farthest edge from above) of an oval, a rectangle, a square, a triangle, a rhombus, a trapezoid, or a polygon. In some cases, any or all of widths WE201, WE203, WE204, WE2071, WE2073, W204, W205, W207, W208, W209, W210, W2051, and W2052 may be between 3 and 5 percent less than or greater than that described herein. In some cases, they may be between 5 and 10 percent less than or greater than that described herein.

In some cases, any or all of height H205, H206, H207, H2081, H2082 and H2093 may be between 3 and 5 percent less than or greater than that described herein. In some cases, they may be between 5 and 10 percent less than or greater than that described herein.

In some cases, any or all of pitch PL20, PH, PW20, PD20 may be between 3 and 5 percent less than or greater than that described herein. In some cases, they may be between 5 and 10 percent less than or greater than that described herein.

In some cases, embodiments of (e.g., packages, systems and processes for forming) a vertical ground isolated package device, such as described for FIGS. 20-28, provide quicker and more accurate data signal transfer between the two IC's attached to a package device by including ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices that reduces bump field signal type cluster-to-cluster crosstalk, reduces bump field in-cluster signal type crosstalk, reduces vertical "signal" line signal type cluster-to-cluster crosstalk, reduces vertical "signal" line in-cluster signal type crosstalk, The ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices (e.g., of the top interconnect level, and other vertical levels) may be formed with or connected to upper grounding contacts to reduce bump field crosstalk, signal type cluster-to-cluster crosstalk and in-cluster signal type crosstalk in the vertical levels by horizontally surrounding each of the transmit and receive data vertical "signal" lines or interconnects.

In some cases, embodiments of processes for forming a vertical ground isolated package device or embodiments of a vertical ground isolated package device provide a package device having better components for providing stable and clean ground (e.g., from contacts 2020), and high frequency transmit (e.g., from contacts 2030) and receive (e.g., from contacts 2040) data signals between its top surface 2006 (or layer 2110) and (1) other components attached to the package device, such as at other contacts on the top surface of the package where similar ground webbing structure(s) exist, or (2) other components of lower vertical levels of the package that will be electrically connected to the contacts through via contacts, vertical "signal" lines (or interconnects), or horizontal "signal" lines of the package device. The components may be better due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce the crosstalk between the data transfer contacts and vertical "signal" lines or interconnects.

In some cases, embodiments of processes for forming a vertical ground isolated package device, or embodiments of a vertical ground isolated package device provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIGS. 27-28). In some cases, embodiments of such processes and devices provide the demanded lower cost high frequency data transfer interconnects solution that is needed across the above segments. These benefits may be due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices, which reduce crosstalk between the data transfer contacts and vertical "signal" lines or interconnects.

In some cases, embodiments of processes for forming a vertical ground isolated package device or embodiments of a vertical ground isolated package device provide ultra-high frequency data transfer interconnect in a standard package, such as a flip-chip x grid array (FCxGA), where 'x' can be ball, pin, or land, or a flip-chip chip scale package (FCCSP, etc) due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce crosstalk between the data transfer contacts and vertical "signal" lines or interconnects.

In addition to this, such processes and devices can provide for direct and local ground and data signal delivery to both chips. In some cases, embodiments of such processes and devices provide communication between two IC chips or board ICs including memory, modem, graphics, electro optical module, and other functionality, directly attached to each other (e.g., see FIGS. 27-28). These processes and devices provide increased input/output (IO) frequency data transfer at lower cost. These provisions and increases may be due to the addition of the conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce crosstalk between the data transfer contacts and vertical "signal" lines or interconnects.

In some cases, due to the ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices, these package devices are able to provide ultra-high frequency data transfer interconnect (e.g., in the herein described package device) of signals having a speed of between 4 and 10 GT/s. In some cases, the signals have a speed of between 6 and 8 GT/s. In some cases, the signals have a speed of between 4 and 5 GT/s. In some cases, the signals have a speed of up to 10 GT/s. In some cases, the signals have a speed of between 4 and 12 Giga-Transfers per second. In some cases the signals have a speed of between 30 and 50 GT/s, or between 7 and 25 GT/s; and a voltage of between 0.5 and 2.0 volts. In some cases the signal has a speed of between 6 and 15 GT/s. In some cases the signal has a voltage of between 0.4 and 5.0 volts. In some cases it is a different speed and/or voltage level that is appropriate for receiving or transmitting data signals through or within a package device. In some cases, they are in a range between a very low speed transfer such as from 50 mega-transfers per second to a GT/s transfer level, such as greater than 40 GT/s (or up to between 40 and 50 GT/s).

According to embodiments, a vertically ground isolated package device can include (1) ground shielding attachment structures and shadow voiding for data signal contacts of the package device; (2) vertical ground shielding structures and shield fencing of vertical data signal interconnects of the package device; and (3) ground shielding for electro-optical module connector data signal contacts and contact pins of the package device. The (1) ground shielding attachment structures may include patterns of solid conductive material ground isolation shielding attachments such as solder balls or ball grid arrays (BGA) and/or patterns of solid conductive material ground isolation shielding surface contacts for the isolation attachments. The shadow voiding may be an area of ground planes of the package device that surrounds and is larger than the solder bumps on the data signal contacts of the package device. The (2) vertical ground shielding structures may include patterns of solid conductive material vertical ground shield interconnects between the vertical data signal interconnects. The shield fencing of vertical data signal interconnects may include patterns of vertical ground plated through holes (PTH) and patterns of vertical micro-vias (uVia) that are physically attached to the ground shielding attachment structures. The (3) ground shielding for electro-optical module connector data signal contacts and contact pins may include patterns of solid conductive material ground isolation shielding attachments and contacts. The vertically ground isolated package device electrically isolates and reduces cross talk between the signal contacts, attachment structures and vertical "signal" interconnects (e.g., lines), thus providing higher frequency and more accurate data signal transfer between devices such as integrated circuit (IC) chips attached to one or more of such package devices.

Figure 29:
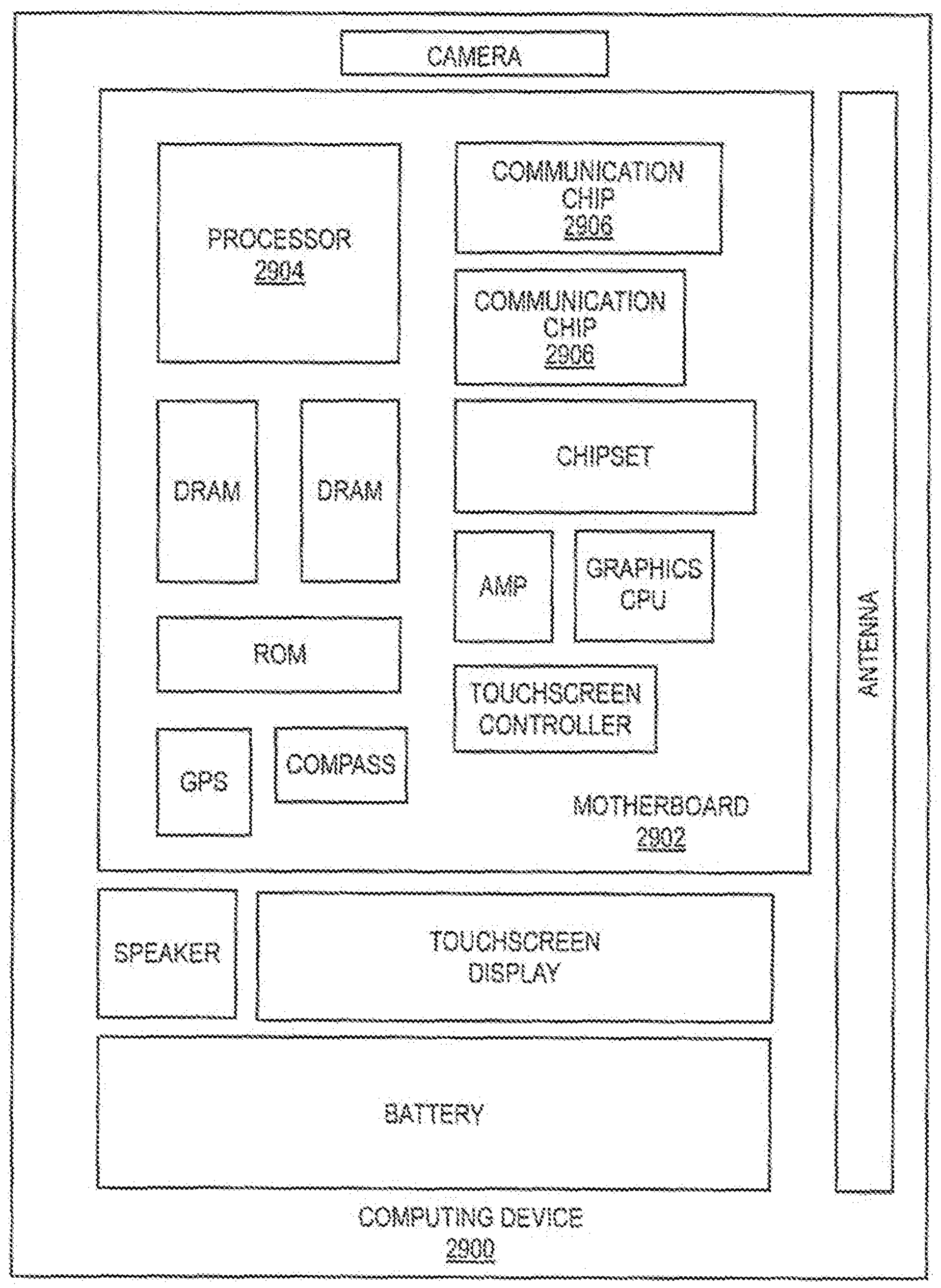
FIG. 29 illustrates a computing device in accordance with one implementation.
Figure 70A:
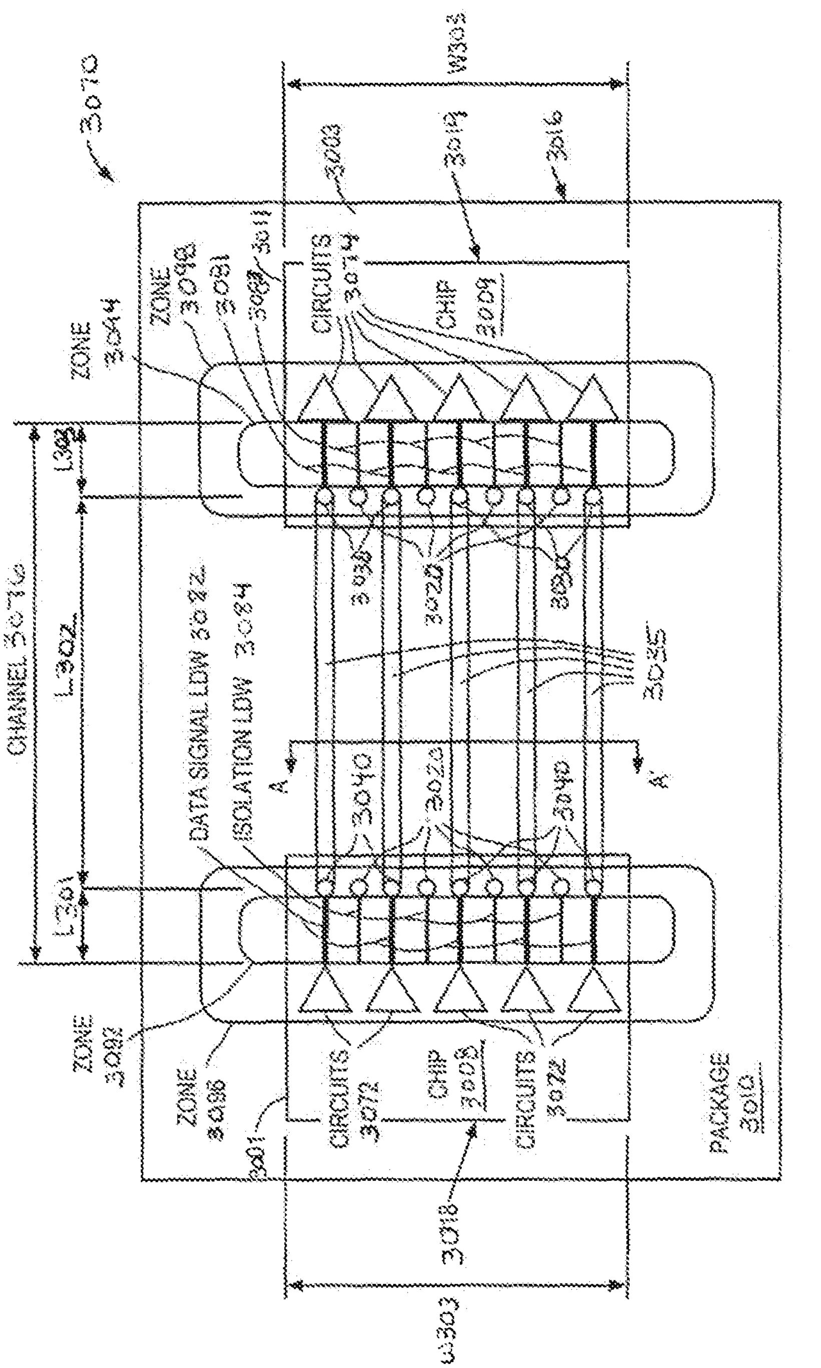

FIG. 29 illustrates a computing device in accordance with one implementation. FIG. 29 illustrates computing device 2900 in accordance with one implementation. Computing device 2900 houses board 2902. Board 2902 may include a number of components, including but not limited to processor 2904 and at least one communication chip 2906. Processor 2904 is physically and electrically coupled to board 2902. In some implementations at least one communication chip 2906 is also physically and electrically coupled to board 2902. In further implementations, communication chip 2906 is part of processor 2904.

Depending on its applications, computing device 2900 may include other components that may or may not be physically and electrically coupled to board 2902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 2906 enables wireless communications for the transfer of data to and from computing device 2900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 2906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 2900 may include a plurality of communication chips 2906. For instance, first communication chip 2906 may be dedicated to shorter range wireless communications such as Wi-Fi and Bluetooth and second communication chip 2906 may be dedicated to longer range wireless communications such as GPS, EDGE, GPRS, CDMA, WiMAX, LTE, Ev-DO, and others.

Processor 2904 of computing device 2900 includes an integrated circuit die packaged within processor 2904. In some implementations, the integrated circuit die of the processor includes one or more devices, such as transistors or metal interconnects. In some embodiments, the package of the integrated circuit die or processor 2904 includes embodiments of processes for forming a "ground webbing structure package" or embodiments of a "ground webbing structure package" as described herein. The term "processor" may refer to any device or portion of a device that processes electronic data from registers and/or memory to transform that electronic data into other electronic data that may be stored in registers and/or memory.

Communication chip 2906 also includes an integrated circuit die packaged within communication chip 2906. In accordance with another implementation, the integrated circuit die of the communication chip includes one or more devices, such as transistors or metal interconnects. In some embodiments, the package of the integrated circuit die or chip 2906 includes embodiments of processes for forming a "ground webbing structure package" or embodiments of a "ground webbing structure package" as described herein.

In further implementations, another component housed within computing device 2900 may contain an integrated circuit die that includes one or more devices, such as transistors or metal interconnects. In some embodiments, the package of the other integrated circuit die or chip includes embodiments of processes for forming a "ground webbing structure package" or embodiments of a "ground webbing structure package" as described herein.

In various implementations, computing device 2900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 2900 may be any other electronic device that processes data.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although the descriptions above show only zones 2002, 2004 and 2007 (or 2009) of package devices (e.g., device 2000, 2001, 2200, 2201, 2400, 2401 and 2600), those descriptions can apply to more or different number of zones 2002, 2004 and 2007 (or 2009). Embodiments of different of such zones 2002, 2004 and 2007 (or 2009) may be such as where any one or two of zones 2002, 2004, or 2007 (or 2009) does not exist. Embodiments of more of such zones may be where a first set of zones 2002, 2004, (and 2007 (or 2009)) as shown, are connected or electrically coupled to a second set of corresponding zones 2002, 2004, (and 2007 (or 2009)) of the same package device (e.g., device 2704, 2706, 2710, 2602 or 2810), such as through vertical and horizontal "signal" lines. In this case, the first set of zones 2002 and 2004 may be connected or electrically coupled to a second set of corresponding zones 2004 and 2002 respectively so that the transmit signal zone 2002 of the first set as shown is connected to the receive signal zone 2004 of the second set, and vice versa. In this case, the first set of zones may be connected to a first IC chip or device (e.g., at level L1) and the second set of zones may be connected to a second, different IC chip or device (e.g., at level L1) through one or more vertical ground isolated package devices so that the first and second IC chips or devices can exchange data (e.g., using transmit data signals and receive data signals as noted above) using zones 2002 and 2004 of the one or more vertical ground isolated package devices. This provides a benefit of increased electronic isolation and reduced cross talk as noted herein during such data exchange due to or based on use the one or more vertical ground isolated package devices. In this case, the one or more vertical ground isolated package devices may operate to link the first and second IC chips.

FIGS. 30-41 may apply to embodiments of an on-die interconnect features to enable signaling. Such embodiments of the invention are related in general, to integrated circuit (IC) chip interconnection features for improved signal connections and transmission through a data signal communication channel from one chip, through semiconductor device packaging and to another chip, including (1) lengths of "last silicon metal level (LSML)" data signal "leadway (LDW) routing" traces isolated between LSLM isolation traces to: (2) increase a total length of and tune data signal communication channels extending through a package between two communicating chips and (3) create switched buffer (SB) pairs of data signal channels that use the lengths of isolated data signal LDW traces to switch the locations of the pairs data signal circuitry and surface contacts for packaging connection bumps.

Integrated circuit (IC) chips (e.g., "chips", "dies", "ICs" or "IC chips"), such as microprocessors, coprocessors, graphics processors and other microelectronic devices often use package devices ("packages") to physically and/or electronically attach the IC chip to a circuit board, such as a motherboard (or motherboard interface). The IC chip (e.g., "die") is typically mounted within a microelectronic substrate package or package device that, among other functions, enables electrical connections such as to form a data signal communication channel between the chip and a socket, a motherboard, another chip, or another next-level component (e.g., microelectronic device). Some examples of such package devices are substrate packages, interposers, and printed circuit board (PCB) substrates upon which integrated circuit (IC) chips, next-level components or other package devices may be attached, such as by solder bumps.

There is a need in the field for an inexpensive and high throughput process for manufacturing such chips and packages. In addition, the process could result in a high chip yield and an improved data signal communication channel between the chip and package; or between the chip and a next-level component or chip attached to the package. In some cases, there is a needed in the field for a chip having better components for providing stable and clean high frequency transmit and receive data signals through a data signal communication channel between its signal transmit or receive circuits, through one or more packages, and to signal receive or transmit circuits of another next-level component or chip attached to the package(s).

As integrated circuit (IC) chip or die sizes shrink (e.g., see chips 3008 and/or 3009) and interconnect densities increase, physical and electrical connections require better components for providing stable and clean high frequency transmit and receive data signals between data signal circuitry of a chip and data signal transmission surface contacts to be attached or attached to a package device (e.g., see package device 3010) (or two physically attached package devices) upon which the IC chip is mounted or is communicating the data signals (e.g., see system 3070). In some cases, there is a needed for one or two chips having better components for providing stable and clean high frequency transmit and receive data signals through a data signal communication channel between its data signal transmit or receive circuits, through one or more packages, and to data signal receive or transmit circuits of another next-level component (e.g., microelectronic device) or chip attached to the package(s). This may include for providing stable and clean data signals through surface contacts (e.g., solder bump contacts) on and electrical connections between (e.g., solder bumps) the chips and package(s). Some examples of such package devices that may be in the data signal communication channel are one (or two physically attached) of the following: substrate packages, interposers (e.g., silicon interposers), silicon bridges, organic interposers (e.g., or technology thereof), and printed circuit board (PCB) substrates upon or onto which integrated circuit (IC) chips or other package devices may be attached. In some cases, the data signal communication channel includes connections between the IC chip and a package upon or to which the IC chip is mounted, such as between the chip bottom surface (e.g., solder bump contacts) and other components of or attached to the package. The data signal communication channel may include signals transmitted between upper level signal transmit and receive circuitry and contacts or traces of the chip that will be electrically connected through via contacts to contacts on the bottom surface of the chip. In some cases, the data signal communication channel may extend from IC chip mounted on (e.g., physically soldered and attached to a top surface of the package) a microelectronic substrate package, which is also physically and electronically connected to another package, chip or next-level component. Such data signal communication channel may be a channel for signals transmitted from the chip to contacts on the top surfaces of a package that will be electrically connected through via contacts to lower level contacts or traces of one or more the package, and from there to another chip mounted on the package(s).

In some cases, an IC chip may be mounted within a package device, such as for "flip chip" bonding or packaging, such as to form a data signal communication channel. In some cases, the IC chip may be mounted on one package device, which is also physically and electronically connected to another package device or IC chip, so that the package device can provide data signal transfer between IC chip and other package device, or between the two IC chips, such as to form a data signal communication channel. In many cases, a data signal communication channel must route hundreds or even thousands of high frequency data signals between the IC chip(s) and/or other package devices.

According to some embodiments, it is possible for integrated circuit (IC) chip "on-die" interconnection features to provide higher frequency and more accurate data signal transfer through a data signal communication channel between a bottom interconnect level or surface (e.g., level LV1) of an IC chip mounted on a top interconnect level (e.g., level L301) of the package device and (1) lower levels (e.g., levels Lj-Ll) of the package device, (2) a next-level component of (e.g., another chip mounted on) the package device, or (3) another package device mounted to the top or bottom of the package device (or a next-level component or another chip mounted on the second package device). In some cases, the on-die interconnection features reduce data signal cross-talk, lossy lines, and reflections (e.g., ringback or singing) in data signals transmitted by a chip (to or) through chip connections (e.g., interfaces, attachments, solder bumps) to a semiconductor device package the chip is mounted on, through the packaging, and (to or) through a second "receiver" chip. Such a chip may be described as a "chip having on-die interconnection features to enable signaling" or a "chip having on-die interconnection features for improved signal connections and transmission through a semiconductor device package channel" (e.g., devices, systems and processes for forming).

In some cases, the on-die interconnection features may include (1) "last silicon metal layer/level (LSML)" (e.g., one or more levels that are next below the exposed bump contact, first level) data signal "leadway (LDW) routing" (e.g., traces) isolated between isolation (e.g., power and/or ground) LDW routing/traces (e.g., see FIGS. 30-34) to: (2) add a length of the isolated data signal LDW traces (e.g., along the LSML level of the chip) to increase a total length of and to tune data signal communication channels extending through a package between two communicating chips (e.g., see FIGS. 35A-37), and (3) create switched buffer (SB) pairs of data signal channels that use the isolated data signal LDW traces to put the locations of one of the pairs data signal circuitry/buffer and at the location of the other of the pairs surface contact for packaging connection bumps, and vice versa (e.g., to exchange the locations of the pair's signal circuitry/buffers and their surface contacts for bumps) (e.g., see FIGS. 38A-40B).

According to embodiments, such "on-die" interconnection features (e.g., (1)-(3) above) include on-die leadway LDW routing (e.g., isolated data signal LDW traces that extend the data channel length) to improve performance of data channel signaling of single-ended signaling interfaces such as on-package input output (OPIO) on muti-channel packages (MCP) with short channel length (such as less than 5 mm), which without the "on-die" interconnection features will suffer from crosstalk ring-back issues due to dense and short packaging routing and consequently have a small minimum eye opening (e.g., poorer performance).

Figures 34A, 34B:
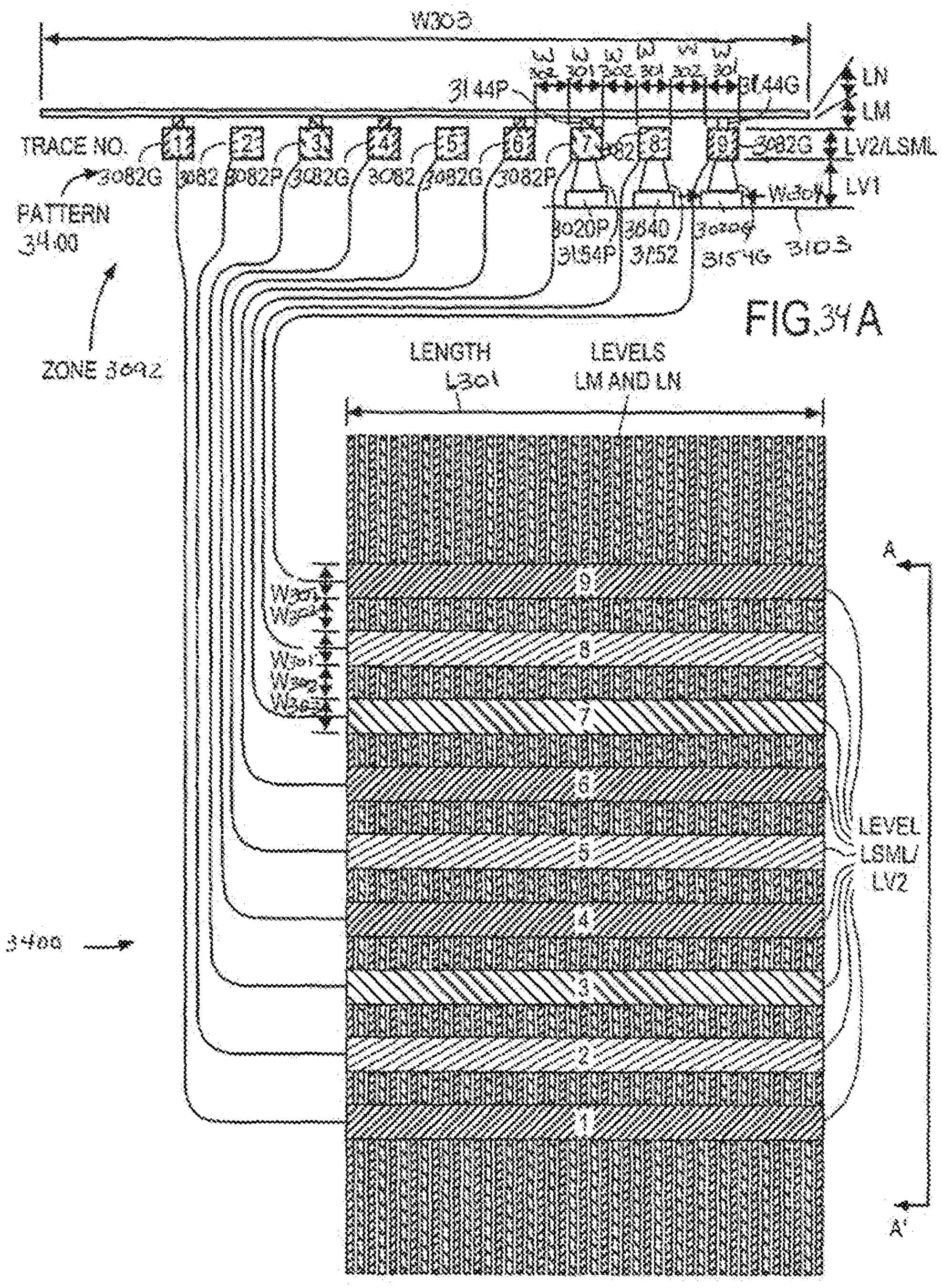
FIGS. 34A and 34B show embodiments of data signal LDW routing features on an LSML layer of transmit and/or receive data chips (e.g., chip "on-die" interconnection features).

According to some embodiments, performance of data channel signaling of single-ended signaling interfaces (e.g., between a transmitter circuit on one chip that is attached through a package to a receiver circuit on a second chip) can be improved by, at the package-level, increasing package routing length (e.g., increasing length L302 of FIGS. 30A-B) and/or decreasing package routing density (e.g., increasing width W302 of FIGS. 34A-B). In some cases, this may meet the eye opening specifications of short single-ended MCP input and output interfaces such as OPIO. However, these solutions can result in an increased package form-factor and layer-count both of which increase cost. At the chip (e.g., silicon-level) one can include termination at the receiver end. Moreover, additional termination will consume significantly higher power than the non-terminated case.

Figure 30B:
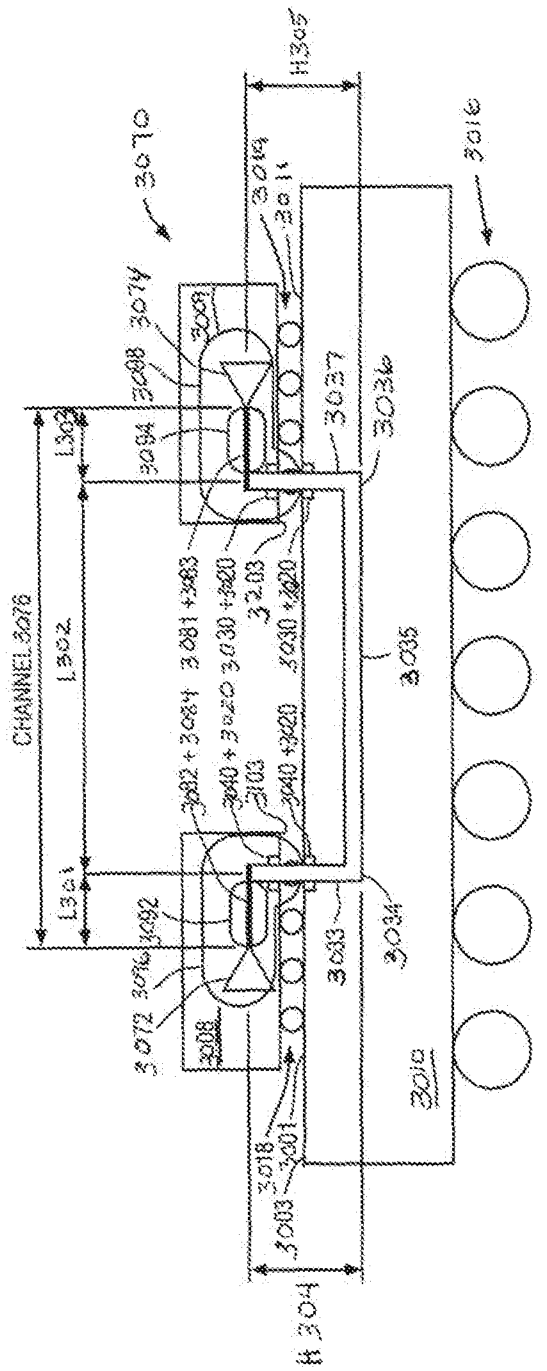
FIG. 30B is schematic cross-sectional side view of the computing system of FIG. 30A.

On the other hand, "cascading" well isolated on-silicon data signal LDW routing (e.g., using data signal LDW traces on data signal transmit and/or receive chips, see at least FIGS. 30A-B and 33) with dense package routing without having to change the package routing length is found to be an effective solution to this problem without having to increase cost (e.g., see at least FIGS. 35A-37). Cascaded isolated data signal LDW routing is a simple solution which cascades isolated silicon routing at last silicon metal layer (LSML) with the existing package routing. This is shown to have a negligible impact to silicon size and floor plan for OPIO-like circuits. In some cases, for an effective implementation, the isolated data signal LDW traces are implemented either on data signal receiver side only or on the receiver and the transmitters sides (e.g., chips) (e.g., see at least FIG. 33). Consequently, embodiments described herein provide on-die LDW routing for data signal channels and a comprehensive MCP interconnect architecture solution including the "LDW routing" structures (e.g., including data signal and isolation LDW traces; transmit and/or receive circuits; and surface and via contacts)(e.g., see at least FIGS. 30-33), the switched buffer (SB) circuit arrangement (e.g., see at least FIGS. 38A-40B), and the cascaded package interconnect (e.g., see at least FIGS. 30A-B and 33).

FIG. 30A is schematic top view of a computing system, including integrated circuit (IC) chip "on-die" interconnection features for improved signal connections and transmission through semiconductor device packages. FIG. 30B is schematic cross-sectional side view of the computing system of FIG. 30A. In some cases, FIGS. 30A-40B shows examples of "cascading" well isolated on-silicon data signal LDW routing (e.g., using SB pairs of data signal LDW traces) with the data signal channel through a package device (e.g., with the package routing) in order to make a serious impact on the signaling performance through the channel (e.g., see FIGS. 35-37).

FIGS. 30A-B show computing system 3070 (e.g., a system routing signals from a computer processor or chip such as chip 3008 to another device such as chip 3009), including IC chip "on-die" interconnection features and circuitry on chips 3008 and 3009 for improved signal connections and transmission through semiconductor package device 3010. In some cases, system 3007 has chip 3008 mounted on package 3010 at first location 3001; and chip 3009 mounted on chip 3010 at second location 3011. In some cases, system 3007 includes chip 3008, solder bumps 3018 physically attaching chip 3008 to package 3010 at first location 3001, chip 3009, solder bumps 3019 physically attaching chip 3009 to package 3010 at second location 3011. Package 3010 may also be mounted on an interposer or patch. For example, a bottom surface of chip 3008 is mounted on top surface 3003 of package 3010 at first location 3001 using solder bumps or ball grid array (BGA) 3018. A bottom surface of chip 3009 is mounted on surface 3003 of package 3010 at location 3011 using solder bumps or BGA 3019. A bottom surface of package device 3010 may in turn be mounted on an interposer or patch using solder bumps or BGAs.

Figure 31A:
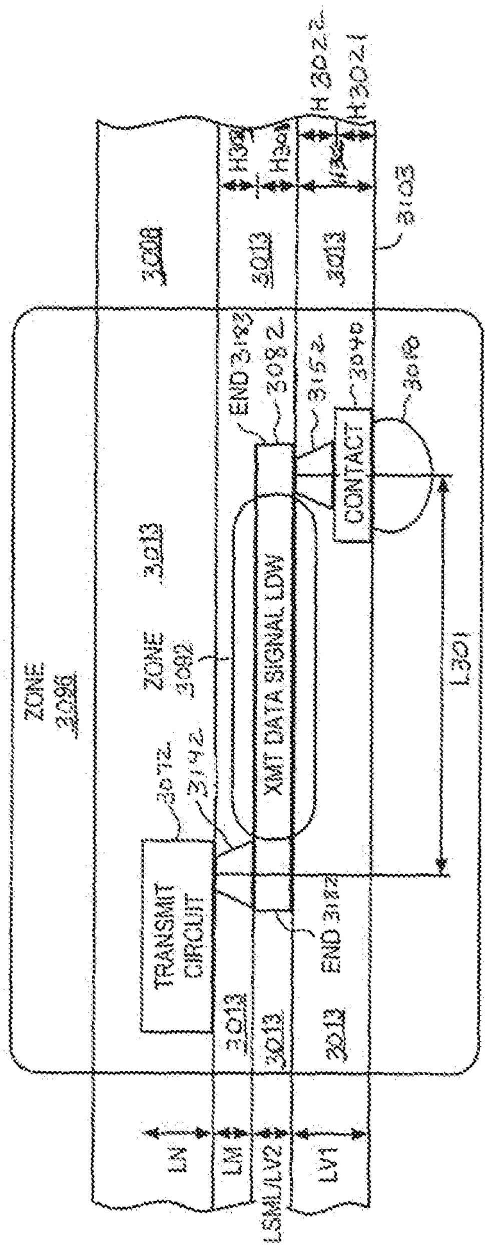
FIG. 31A is an expanded schematic cross-sectional side view of chip "on-die" interconnection feature zone of a first chip showing a chip transmit data signal "leadway" (LDW) routing trace of the computing system of FIG. 30A-B.
Figure 31B:
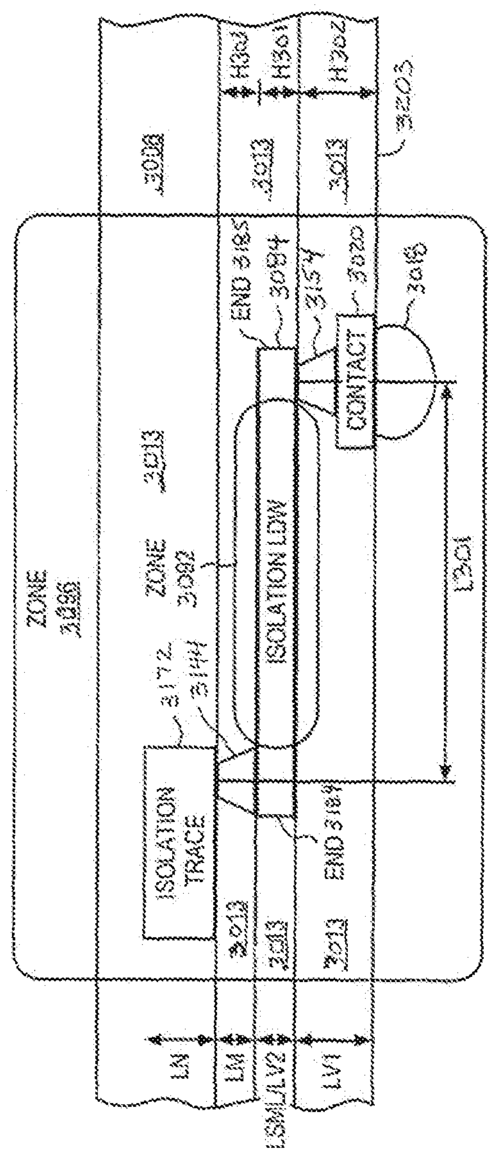
FIG. 31B is an expanded schematic cross-sectional side view of the chip "on-die" interconnection feature zone of FIG. 31A showing a chip isolation "leadway" (LDW) routing trace.
Figure 32A:
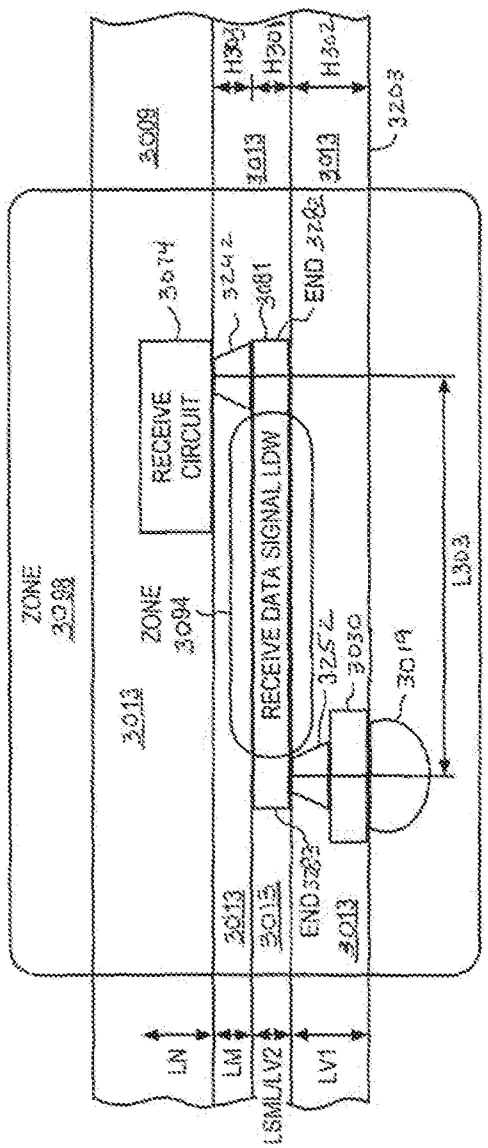
FIG. 32A is an expanded schematic cross-sectional side view of chip "on-die" interconnection feature zone of a first chip showing a chip receive data signal "leadway" (LDW) routing trace of the computing system of FIG. 30A-B.
Figure 32B:
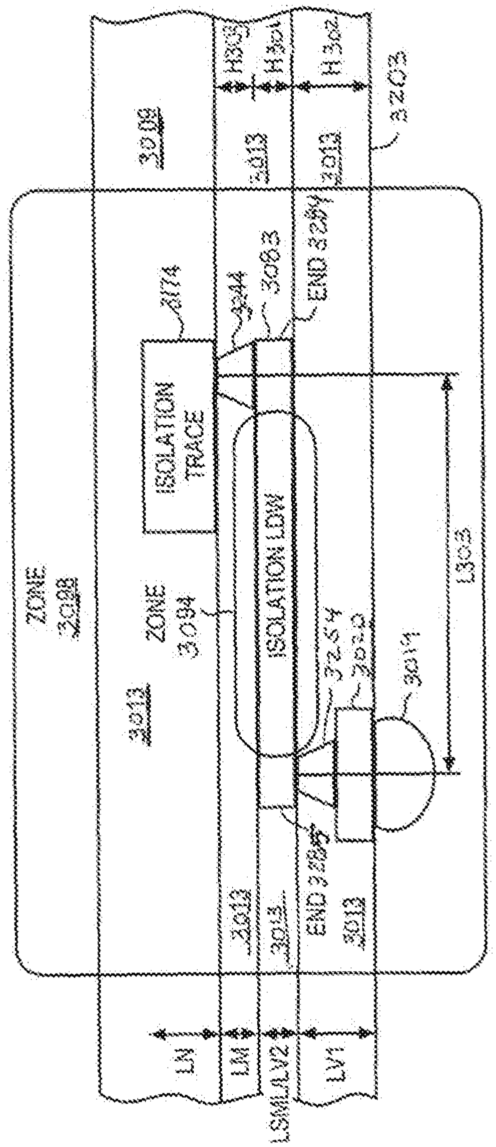
FIG. 32B is an expanded schematic cross-sectional side view of the chip "on-die" interconnection feature zone of FIG. 32A showing a chip isolation "leadway" (LDW) routing trace.

FIG. 31A is an expanded schematic cross-sectional side view of chip "on-die" interconnection feature zone of a first chip showing a chip transmit data signal "leadway" (LDW) routing trace of the computing system of FIG. 30A-B. FIG. 31B is an expanded schematic cross-sectional side view of the chip "on-die" interconnection feature zone of FIG. 31A showing a chip isolation "leadway" (LDW) routing trace. FIG. 32A is an expanded schematic cross-sectional side view of chip "on-die" interconnection feature zone of a first chip showing a chip receive data signal "leadway" (LDW) routing trace of the computing system of FIG. 30A-B. FIG. 32B is an expanded schematic cross-sectional side view of the chip "on-die" interconnection feature zone of FIG. 32A showing a chip isolation "leadway" (LDW) routing trace.

FIGS. 31A-32B show chips 3008 and 3009 having a first interconnect level LV1 with bottom surfaces 3103 and 3203, respectively. Level LV1 is below LSML or second level, LV2 level from the bottom of the chips. Level LV2 is below level LM of the chips; and level LM is below level LN of the chips. In some cases, if there is more than one switch buffer pair of data signal LDW traces, some pairs of LDW traces may be in one or more levels of the chips that are vertically disposed between levels LV2 and LM (e.g., LV4 and/or LV3). Level LV1 may be considered to "bottom" layer such as a lower, lowest or exposed layer (e.g., a final build-up (BU) layer, BGA, LGA, or die-backend-like layer) of an IC chip (e.g., such as microprocessor, coprocessor, graphics processor, memory chip, modem chip, or other microelectronic chip devices) which may be mounted onto (or have mounted onto it) a package device (e.g., a socket, an interposer, a motherboard, or another next-level component).

Chip 3008 is shown having bottom surface 3103, such as a bottom exposed surface of dielectric, upon or in which are formed (e.g., disposed) contacts 3040 and 3020 in an area of zone 3096. Contacts 3040 and 3020 are shown in a row along width W303 of chip 3008. In some cases, contacts 3040 and 3020 are located lengthwise along or at opposing ends of length L301, L3011 or L30111 (e.g., see FIGS. 38A-40B). In some cases, only contacts 3040 are located lengthwise along or at opposing ends of length L301, L3011 or L30111 (e.g., see FIGS. 38A-40B) and contacts 3020 are located at another lengthwise location in area 3001 of package 3010. In some cases, contacts 3040 may be described as a signal cluster formed in a lengthwise 4-row deep die-bump pattern, where the first and second rows are SB pairs, and the third and fourth rows are SB pairs (e.g., see FIGS. 38A-40B).

Chip 3009 is shown having bottom surface 3203, such as a bottom exposed surface of dielectric, upon or in which are formed (e.g., disposed) contacts 3030 and 3020 in an area of zone 3098. Contacts 3030 and 3020 are shown in a row along width W303 of chip 3009. In some cases, contacts 3030 and 3020 are located lengthwise along or at opposing ends of length L301, L3031 or L30311 (e.g., see FIGS. 38A-40B). In some cases, only contacts 3030 are located lengthwise along or at opposing ends of length L301, L3031 or L30311 (e.g., see FIGS. 38A-40B) and contacts 3020 are located at another lengthwise location in area 3011 of package 3010. In some cases, contacts 3030 may be described as a signal cluster formed in a lengthwise 4-row deep die-bump pattern, where the first and second rows are SB pairs, and the third and fourth rows are SB pairs (e.g., see FIGS. 38A-40B).

Package 3010 is shown having top surface 3003, such as a top exposed surface of dielectric, upon or in which are formed (e.g., disposed) contacts 3040 and 3020 in a zone of area 3001 under of chip 3008 (and optionally near an edge towards chip 3009). In some cases, the pattern of contacts 3040 and 3020 in area 3001 matches or is a mirror image of the pattern of contacts 3040 and 3020 in zone 3096 of chip 3008. Package 3010 is also shown having top surface 3003, such as a surface of dielectric, upon or in which are formed (e.g., disposed) contacts 3030 and 3020 in a zone of area 3011 under of chip 3009 (and optionally near an edge towards chip 3008). In some cases, the pattern of contacts 3030 and 3020 in area 3011 matches or is a mirror image of the pattern of contacts 3040 and 3020 in zone 3098 of chip 3009.

According to embodiments chip 3008 and chip 3009 may each be an IC chip such as microprocessor, coprocessor, graphics processor, memory chip, modem chip, or other microelectronic chip devices. According to embodiments chip 3008 and chip 3009 may each be an IC chip capable of being mounted or directly attached onto a socket, an interposer, a motherboard, or another next-level component (e.g., package device 3010). In some cases, package device 3010 may represent a substrate package, an interposer, a printed circuit board (PCB), a PCB an interposer, a "package", a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices) (e.g., chips 3008 and 3009). According to embodiments, chip 3008 and chip 3009 may each include (e.g., on one or more levels above level L302 or L305) active microprocessor circuitry and/or hardware logic (e.g., solid state hardware) such as microprocessor processing logic, memory, cache, gates, transistors (e.g., metal oxide semiconductor (MOS) field effect transistor (FET), fin FET and the like) as known to be on or part of an IC chip such as a central processing unit (CPU), microprocessor, coprocessor, graphics processor, memory chip, modem chip, or other microelectronic chip devices. A portion of such circuitry and/or logic may by electrically coupled or physically attached to circuits 3072 and 3074. According to embodiments, chip 3008 and chip 3009 may each include (e.g., on one or more levels above level L302 or L305, such as in level LM) active microprocessor circuitry and/or hardware logic of a multipurpose, clock driven, register based, programmable electronic device which accepts digital or binary data as input (e.g., at contact 3030 of a channel having circuit 3074 as an RX data signal circuit at chip 3009), processes it according to instructions stored in its memory, and provides results as output (e.g., at contact 3040 of a channel having circuit 3072 as a TX data signal circuit of chip 3008). According to embodiments, chip 3008 and chip 3009 may each contain both combinational logic and sequential digital logic; and may operate on numbers and symbols represented in the binary numeral system.

FIGS. 30-32 show chip 3008 having chip "on-die" interconnection feature "zone" 3096 and "zone" 3092. FIGS. 30-32 show chip 3009 having chip "on-die" interconnection feature "zone" 3098 and "zone" 3094. Such a "zone" as described herein may be considered a three dimensional part or portion of an IC chip. Such a zone may include various active and passive circuitry; traces; interconnects and/or other structure know to be on an IC chip.

FIGS. 30-32 show chip 3008 including zone 3096 which includes zone 3092. In some cases, solder bumps 3018 of zone 3096 are considered not to be part of chip 3008. Zone 3096 is shown including data signal transmit circuits 3072 electrically coupled (e.g., with zero or less than 20 Ohm resistance) to one end 3182 (e.g., see FIG. 31A) of on-die "last silicon metal layer" (LSML) or last silicon metal level chip data signal "leadway" (LDW) routing traces 3082. In some cases, "LSML" or "last silicon metal layer/level" refers to a level or layer of the chip having metal, such as traces, contacts and via contacts that is the level or layer immediately above a bottom exposed level or layer of the chip (e.g., above the level or layer having exposed surface contacts). In some cases, "leadway" (LDW) routing traces or "LDW traces" refers to a length of on-die data signal traces in a level of the chip that extends a length of the data signal channel in the chip, thus extending the total data signal channel length from a transmit circuit, through a package device and to a receive circuit, by extending that total channel length with the "leadway" routing/trace length added in the chip. The opposite end 3183 of signal LDW traces 3082 are electrically coupled to surface contact 3040 (e.g., see FIG. 31A). In some cases, circuits 3072 are or include on-die circuits or data buffers located above the LSML of chip 3008 and for transmitting data signals across a data signal channel to data signal receiver circuits 3074 of chip 3009.

Zone 3092 includes on-die "last silicon metal layer" (LSML) or last silicon metal level chip data signal "leadway" (LDW) routing traces 3082. In some cases, traces 3082 extend along a lower level or a planar surface of an on-die second or "LV2" level that is the level above the bottommost "LV1" level or a level having surface contacts 3040 on which to form solder bumps 3018 on for connecting the chip to a package 3010. Some or all of traces 3082 may be extending between and coupled to (e.g., electrically coupled to conduct electrical signals with zero or less than 20 Ohm resistance) data signal transmit circuits 3072 of chip 3008 and bottom level transmit data signal contact 3040 of chip 3008. Contacts 3040 of chip 3008 may be contacts upon which solder bumps (e.g., bumps 3018) may be formed for attaching some or all of contacts 3040 to an opposing, upper level transmit data signal contacts 3040 of package 3010.

In some cases, each of traces 3082 has a first end 3182 (e.g., see FIG. 31A) physically coupled to (e.g., through one or more via or other contacts) and electrically attached to (e.g., with zero or less than 20 Ohm electrical resistance) a transmit circuit 3072 of chip 3008 and a second end 3183 (e.g., see FIG. 31A) physically coupled to (e.g., through a via or other contact) and electrically attached to (e.g., with zero electrical or less than 20 Ohm electrical resistance) a data transmit signal surface contact 3040 of chip 3008 (upon which a solder bump 3018 may be formed to attach that contact to an opposing data transmit signal surface contact 3040 of package 3010).

Zone 3092 also includes on-die "last silicon metal layer" (LSML) or last silicon metal level chip isolation (e.g., isolation signal) leadway routing traces 3084 separating (e.g., extending along side and parallel to; and having a length similar to traces 3082) adjacent pairs of traces 3082. Traces 3084 may include at least one of a power trace; a ground traces; or both a power and ground trace between each adjacent ones of traces 3082 (e.g., see FIG. 33). There may be a number of traces of 3084 disposed between two adjacent ones of traces 3082. In some cases, there are one or two disposed between. In some cases, traces 3084 extend along a lower level or a planar surface of an on-die second or "LV2" level. Some or all of traces 3084 may be extending between and coupled to (e.g., electrically coupled to conduct electrical signals with zero or less than 20 Ohm resistance) isolation traces (e.g., see traces 3172 of FIG. 31) of chip 3008 and bottom level isolation contacts 3020 of chip 3008. Contact 3020 of chip 3008 may be a contact upon which a solder bump (e.g., bump 3018) may be formed for attaching that contact to an opposing, upper level contact 3020 of package 3010.

In some cases, each of traces 3084 has a first end 3184 (e.g., see FIG. 31B) physically coupled to (e.g., through one or more via or other contact) and electrically attached to (e.g., with zero or less than 20 Ohm electrical resistance) an isolation trace 3072 of chip 3008. In some cases, each of traces 3084 has a second end 3185 (e.g., see FIG. 31B) physically coupled to (e.g., through at least one via or other contact) and electrically attached to (e.g., with zero or less than 20 Ohm electrical resistance) an isolation surface contact 3020 of chip 3008 (upon which a solder bump 3018 may be formed to attach that contact to an opposing isolation surface contact 3020 of package 3010).

In some cases, the use of "level" describes a "layer" of material (e.g., dielectric and/or conductive material) of a chip as known. In some cases, the use of a top, bottom, and/or last silicon metal "level" describes a top, bottom, and/or last silicon metal "layer" of material (e.g., dielectric and/or conductive material) of a chip as known. In some cases, a "level" may have two layers, such as a lower main or contact layer; and an upper via layer to connect structures on the lower layer with structures above the via layer.

FIG. 31A shows chip "on-die" interconnection feature zones 3096 and 3092 of chip 3008 and chip transmit data signal "leadway" (LDW) routing traces 3082. FIG. 31A shows chip 3008 including zone 3096 which includes zone 3092. Zone 3096 is shown including circuit 3072 physically and electrically attached to contact 3142 (e.g., contact 3142 may be formed onto or physically touching) which is physically and electrically attached end 3182 of signal LDW trace 3082. The opposite end 3183 of LDW trace 3082 is physically and electrically attached to contact 3152; which is physically and electrically attached to surface contact 3040.

Solder 3018 may be mounted on the exposed surface of contact 3040 which is on or has the exposed surface planar with the bottom surface of chip 3008. The bottom (e.g., exposed) surface of chip 3008 is shown as surface 3103. The distance between the center of contact 3142 and of contact 3040 is shown as length L301 or pitch length PL30. In some cases, length L301 is the length of data signal LDW traces 3082 and 3084. Zone 3092 is shown as having a portion of length L301 that includes trace 3082 between contacts 3142 and 3040. First exposed level LV1 of chip 3008 is shown including contacts 3152 and 3040. In some cases, contact 3152 may represent a single contact such as a via contact formed on the bottom surface of end 3183 of trace 3082. In some cases it represents more than one contact formed that way. In some cases, contact 3040 may represent a single solder bump contact formed on the bottom surface of contact 3152.

In some cases, contact 3152 may represent between one and three contact levels, similar to but above level LV1. In some cases, it may represent between one and three of such levels including a contact similar to 3152 and a contact similar to 3040 located between the bottom surface of trace 3082 and top surface 3103. In some cases, trace 3082 will be vertically located as low and close as possible to surface 3103 or contact 3040.

In some cases where switched buffer (SB) signal channels are implemented as described herein, level LV2 will represent a number of levels such as LV2, that is equal to the number of switched buffer (SB) signal channels; and each of these levels has contacts such as 3152 and 3040 for each pair of switch buffers (e.g. see FIGS. 38A-40B). In some cases, each of these levels will also include via contacts between each end of each data signal LDW trace, such as contacts 3152 and 3142 that connect one end to a data signal circuit and the other end to a solder bump surface contact of each data signal LDW trace, for each pair of switch buffers (e.g. see FIGS. 38A-40B).

In some cases, contact 3142 may represent a single contact such as a via contact upon which the top surface of end 3182 of trace 3082 is formed. In some cases, contact 3142 may also represent a single contact such as a via contact formed on the bottom surface of a data signal output contact of circuit 3072. In some cases contact 3142 represents more than one contact formed that way.

In some cases, trace 3082 and optionally contact 3142 exists on the LSML or second, LV2 level from the bottom of chip 3008 (e.g., level LM is part of a level LV2). However, if there is more than one switch buffer pair, some pairs of traces 3082 and some of contacts 3142 may be in an upper level from surface 3103 of chip 3008 (e.g., LV4 and/or LV3).

In some cases, level LM and contact 3142 represent more than one level of contacts. In some cases they represent a single contact such as via contact 3142 as shown. In other cases they represent multiple levels of via and/or contacts such as contact 3142 and contact 3040 extending vertically between first end 3182 of trace 3082 and a contact of circuit 3072. In some cases they represent between one and 50 levels between the top surface of trace 3082 and the bottom surface of a contact of circuit 3072.

FIG. 31A shows data signal (e.g., transmitter or buffer) circuit 3072 on Level LN. It can be appreciated that Level LN may be any level above and including levels above Level LM.

FIG. 31A shows dielectric material 3013 filling in any space between (e.g., above, below, and beside such as in the length, width and height directions) the chip on-die interconnect features: circuit 3072, contact 3142 trace 3082, contact 3152 and contact 3040, such as shown in FIG. 31A.

In some cases, filling in the space between the interconnect features includes material 3013 existing in any space where those features do not exist, and are not physically attached to (e.g., are not touching) each other, such as shown in FIG. 31A. In some cases, filling in the space between the interconnect features includes material 3013 separating each and all of those features except where they are coupled or physically attached to each other, such as shown in FIG. 31A. In some cases, filling in the space between the interconnect features includes material 3013 existing in any space where those features do not exist, are not coupled to each other, and are not physically attached to each other. In some cases, filling in the space between the interconnect features includes material 3013 existing in any space where those features do not exist, are not coupled to each other, and are not physically attached to each other, except where other circuitry, traces, contacts exist, such as is known.

FIG. 31B shows chip "on-die" interconnection feature zones 3096 and 3092 of FIGS. 30A-B showing a chip isolation "leadway" (LDW) routing trace 3084 to isolate a chip transmit data signal "leadway" (LDW) routing traces 3082. In FIG. 31B zone 3096 is shown including trace 3172 physically and electrically attached to contact 3144 (e.g., contact 3144 may be formed onto or physically touching) which is physically and electrically attached end 3184 of isolation LDW trace 3084. The opposite end 3185 of LDW trace 3084 is physically and electrically attached to contact 3154; which is physically and electrically attached to surface contact 3020.

Solder 3018 may be mounted on the exposed surface of contact 3020 which is on or has the exposed surface planar with the bottom surface of chip 3008. The distance between the center of contact 3144 and of contact 3020 is shown as length L301 or pitch length PL30. Zone 3092 is shown as having a portion of length L301 that includes trace 3084 between contacts 3144 and 3020. First exposed level LV1 of chip 3008 is shown including contacts 3154 and 3020. In some cases, contact 3154 may represent a single contact such as a via contact formed on the bottom surface of end 3185 of trace 3084. In some cases it represents more than one contact formed that way. In some cases, contact 3020 may represent a single solder bump contact formed on the bottom surface of contact 3154.

In some cases, contact 3154 may represent between one and three contact levels, similar to but above level LV1. In some cases, it may represent between one and three of such levels including a contact similar to 3154 and a contact similar to 3020 located between the bottom surface of trace 3084 and top surface 3103. In some cases, trace 3084 will be vertically located as low and close as possible to surface 3103 or contact 3020.

In some cases where switched buffer (SB) signal channels are implemented as described herein, level LV2 will represent a number of levels such as LV2, that is equal to the number of switched buffer (SB) signal channels; and each of these levels has contacts such as 3154 and 3020 for each pair of switch buffers (e.g. see FIGS. 38A-40B). In some cases, each of these levels will also include via contacts between each end of each data signal LDW trace, such as contacts 3154 and 3144 that connect one end to a data signal circuit and the other end to a solder bump surface contact of each data signal LDW trace, for each pair of switch buffers (e.g. see FIGS. 38A-40B).

In some cases, contact 3144 may represent a single contact such as a via contact upon which the top surface of end 3184 of trace 3084 is formed. In some cases, contact 3144 may also represent a single contact such as a via contact formed on the bottom surface of a data signal output contact of circuit 3074. In some cases contact 3144 represents more than one contact formed that way.

In some cases, trace 3084 and optionally contact 3144 exists on the LSML or second, LV2 level from the bottom of chip 3008 (e.g., level LM is part of a level LV2). However, if there is more than one switch buffer pair, some pairs of traces 3084 and some of contacts 3144 may be in an upper level from surface 3103 of chip 3008 (e.g., LV4 and/or LV3).

In some cases, level LM and contact 3144 represent more than one level of contacts. In some cases they represent a single contact such as via contact 3144 as shown. In other cases they represent multiple levels of via and/or contacts such as contact 3144 and contact 3020 extending vertically between first end 3184 of trace 3084 and a contact of circuit 3074. In some cases they represent between one and 50 levels between the top surface of trace 3084 and the bottom surface of a contact of circuit 3074.

FIG. 31B shows isolation (e.g., ground or DC power signal trace or plane) trace 3172 on Level LN. It can be appreciated that Level LN may be any level above and including levels above Level LM.

In some cases, zone 3096 includes zone 3092 and transmit circuits 3072. In some cases, zone 3096 includes zone 3092, surface contacts 3040 of chip 3008, and transmit circuits 3072. In some cases, zone 3096 includes zone 3092, surface contacts 3040 of chip 3008, solder bumps 3018 attaching contacts 3040 of chip 3008 to contacts 3040 of package 3010, and transmit circuits 3072. In some cases, transmit circuits 3072 represent a transmit buffer, such as a part of a data signal transmission circuit that is connected to data signal traces, via contacts, or surface contacts to transmit the signal to another electronic device or chip.

In some embodiments, traces 3082 and 3084 (e.g., LDW traces on level LV2; or other data signal LDW traces of patterns 3400, 3800, 3805, 3900, 3905, 4000 and 4005 on level LV2, LV3, LV4 and/or LV5) may have length L301, width W301 and Height H301.

In some embodiments, length L301 may be between 50 and 1 millimeter (mm). In some cases it is between 20 and 800 um. In some embodiments, length L301 may be between 100 and 600 micrometers (um). In some embodiments, length L301 may be between 200 and 500 micrometers (um). In some embodiments, length L301 may be approximately 400 micrometers (um) (e.g., see FIGS. 35A-B and 37). In some embodiments, length L301 may be between 100 and 400 micrometers (um) (e.g., see FIGS. 36A-B). In some embodiments, length L301 may be between 150 and 450 micrometers (um) (e.g., see FIGS. 38A-40B). In some embodiments, length L301 may be between 350 and 450 micrometers (um). In some embodiments, length L301 may be between 400 and 500 micrometers (um).

In some embodiments, width W301 may be between 1 and 8 micrometers (um). In some embodiments, width W301 may be between 1 and 5 micrometers (um). In some embodiments, width W301 may be between 2 and 4 micrometers (um). In some cases, W301 is between 1 and 10 um. In some cases it is between 3.5 and 7.5 um. In some cases it is between 5 and 6 um.

In some embodiments, level LV2 also has Height H301. In some embodiments, level LV3 also has Height H301 (e.g., see FIGS. 39A-40B). In some embodiments, level LV4 also has Height H301 (e.g., see FIGS. 40A-40B). In some embodiments, level LV5 (not shown) also has Height H301.

In some embodiments, height H301 may be between 1 and 8 micrometers (um). In some embodiments, height H301 may be between 1 and 5 micrometers (um). In some embodiments, height H301 may be between 2 and 4 micrometers (um). In some embodiments, height H301 may be between 4 and 8 micrometers (um). In some embodiments, height H301 may be between 5 and 7 micrometers (um).

In some embodiments, level LV1 of chip 3008 may have height H302. In some embodiments, height H302 may be between 10 and 40 micrometers (um). In some embodiments, height H302 may be between 15 and 30 micrometers (um). In some embodiments, height H302 may be between 20 and 40 micrometers (um). In some embodiments, height H302 represents the height H3021 of the surface contact (e.g., contact 3020, 3030 or 3040 and the like of FIGS. 9-11) plus the height H3022 of the dielectric between that contact and the LDW traces (or plus the height of the via contact between that contact and the LDW traces, such as the height of via contact 3152, 3154, 3252 or 3254; e.g., see FIG. 31A). In some embodiments, height H3021 may be between 5 and 20 micrometers (um). In some embodiments, height H3021 may be between 8 and 14 micrometers (um). In some cases it is between 8 and 12 um. In some embodiments, height H3022 may be between 5 and 25 micrometers (um). In some embodiments, height H3021 may be between 8 and 16 micrometers (um). In some embodiments, height H3021 may be between 10 and 14 micrometers (um).

In some embodiments, level LM of chip 3008 may have height H303. In some embodiments, height H303 may be between 0.5 and 5 micrometers (um). In some embodiments, height H303 may be between 1 and 3 micrometers (um). In some embodiments, height H303 may be between 1.5 and 2 micrometers (um). In some cases, it is between 1.6 and 1.8 um.

In some embodiments, height H303 may be for multiple layers (e.g., where level LM represents multiple levels) and be between 4 and 35 micrometers (um). In some embodiments, it may be between 4 and 26 micrometers (um). In some embodiments, it may be between 4 and 8 micrometers (um). In some embodiments, it may be between 8 and 16 micrometers (um). In some embodiments, it may be between 16 and 25 micrometers (um). In some embodiments, height H303 may be between 6 and 8 um per layer that LM represents.

In some embodiments, each of contacts 3142, 3144, 3152, 3154, 3020 and 3040 of chip 3008 may have or represent one or more contacts that are each combined to have a length, width and height of between 14 and 45 micrometers.

FIGS. 30-32 show chip 3009 including zone 3098 which includes zone 3094. In some cases, solder bumps 3019 of zone 3098 are considered not to be part of chip 3008. Zone 3098 is shown including data signal receive circuits 3074 electrically coupled (e.g., with zero or less than 20 Ohm resistance) to one end 3282 (e.g., see FIG. 32A) of on-die "last silicon metal layer" (LSML) or last silicon metal level chip data signal "leadway" (LDW) routing traces 3081. The opposite end 3283 of signal LDW traces 3081 are electrically coupled to surface contact 3030 (e.g., see FIG. 32A). In some cases, circuits 3074 are or include on-die circuits or data buffers located below the LSML of chip 3009 and for receiving data signals sent across a data signal channel by data signal transmit circuits 3072 of chip 3008.

Zone 3094 includes on-die "last silicon metal layer" (LSML) or last silicon metal level chip data signal "leadway" (LDW) routing traces 3081. In some cases, traces 3081 extend along a top level or a planar surface of an on-die second or "LV2" level that is the level below the topmost "LV3" level or a level having surface contacts 3030 on which to form solder bumps 3019 on for connecting the chip to a package 3010. Some or all of traces 3081 may be extending between and coupled to (e.g., electrically coupled to conduct electrical signals with zero or less than 20 Ohm resistance) data signal receive circuits 3074 of chip 3009 and upper level receive data signal contact 3030 of chip 3009. Contacts 3030 of chip 3009 may be contacts upon which solder bumps (e.g., bumps 3019) may be formed for attaching some or all of contacts 3030 to an opposing, upper level receive data signal contacts 3030 of package 3010.

In some cases, each of traces 3081 has a first end 3282 (e.g., see FIG. 32A) physically coupled to (e.g., through one or more via or other contacts) and electrically attached to (e.g., with zero or less than 20 Ohm electrical resistance) a transmit circuit 3074 of chip 3009 and a second end 3283 (e.g., see FIG. 32A) physically coupled to (e.g., through a via or other contact) and electrically attached to (e.g., with zero electrical or less than 20 Ohm electrical resistance) a data receive signal surface contact 3030 of chip 3009 (upon which a solder bump 3019 may be formed to attach that contact to an opposing data receive signal surface contact 3030 of package 3010).

Zone 3094 also includes on-die "last silicon metal layer" (LSML) or last silicon metal level chip isolation (e.g., isolation signal) leadway routing traces 3083 separating (e.g., extending along side and parallel to; and having a length similar to traces 3081) adjacent pairs of traces 3081. Traces 3083 may include at least one of a power trace; a ground traces; or both a power and ground trace between each adjacent ones of traces 3081 (e.g., see FIG. 33). There may be a number of traces of 3083 disposed between two adjacent ones of traces 3081. In some cases, there are one or two disposed between. In some cases, traces 3083 extend along a top level or a planar surface of an on-die second or "LV2" level. Some or all of traces 3083 may be extending between and coupled to (e.g., electrically coupled to conduct electrical signals with zero or less than 20 Ohm resistance) isolation traces (e.g., see traces 3174 of FIG. 32) of chip 3009 and upper level isolation contacts 3020 of chip 3009. Contact 3020 of chip 3009 may be a contact upon which a solder bump (e.g., bump 3019) may be formed for attaching that contact to an opposing, upper level contact 3020 of package 3010.

In some cases, each of traces 3083 has a first end 3284 (e.g., see FIG. 32B) physically coupled to (e.g., through one or more via or other contact) and electrically attached to (e.g., with zero or less than 20 Ohm electrical resistance) an isolation trace 3174 of chip 3009. In some cases, each of traces 3083 has a second end 3285 (e.g., see FIG. 32B) physically coupled to (e.g., through at least one via or other contact) and electrically attached to (e.g., with zero or less than 20 Ohm electrical resistance) an isolation surface contact 3020 of chip 3009 (upon which a solder bump 3019 may be formed to attach that contact to an opposing isolation surface contact 3020 of package 3010).

FIG. 32A shows chip "on-die" interconnection feature zones 3098 and 3094 of chip 3009 and chip receive data signal "leadway" (LDW) routing traces 3081. FIG. 32A shows chip 3009 including zone 3098 which includes zone 3094. Zone 3098 is shown including circuit 3074 physically and electrically attached to contact 3242 (e.g., contact 3242 may be formed onto or physically touching) which is physically and electrically attached end 3282 of signal LDW trace 3081. The opposite end 3283 of LDW trace 3081 is physically and electrically attached to contact 3252; which is physically and electrically attached to surface contact 3030.

Solder 3019 may be mounted on the exposed surface of contact 3030 which is on or has the exposed surface planar with the bottom surface of chip 3009. The bottom (e.g., exposed) surface of chip 3009 is shown as surface 3203. The distance between the center of contact 3242 and of contact 3030 is shown as length L301 or pitch length PL30. In some cases, length L301 is the length of data signal LDW traces 3081 and 3083.

Zone 3094 is shown as having a portion of length L301 that includes trace 3081 between contacts 3242 and 3030. First exposed level LV1 of chip 3009 is shown including contacts 3252 and 3030. In some cases, contact 3252 may represent a single contact such as a via contact formed on the bottom surface of end 3283 of trace 3081. In some cases it represents more than one contact formed that way. In some cases, contact 3030 may represent a single solder bump contact formed on the bottom surface of contact 3252.

In some cases, contact 3252 may represent between one and three contact levels, similar to but above level LV1. In some cases, it may represent between one and three of such levels including a contact similar to 3252 and a contact similar to 3030 located between the bottom surface of trace 3081 and top surface 3203. In some cases, trace 3081 will be vertically located as low and close as possible to surface 3203 or contact 3030.

In some cases where switched buffer (SB) signal channels are implemented as described herein, level LV2 will represent a number of levels such as LV2, that is equal to the number of switched buffer (SB) signal channels; and each of these levels has contacts such as 3252 and 3030 for each pair of switch buffers (e.g. see FIGS. 38A-40B). In some cases, each of these levels will also include via contacts between each end of each data signal LDW trace, such as contacts 3252 and 3242 that connect one end to a data signal circuit and the other end to a solder bump surface contact of each data signal LDW trace, for each pair of switch buffers (e.g. see FIGS. 38A-40B).

In some cases, contact 3242 may represent a single contact such as a via contact upon which the top surface of end 3282 of trace 3081 is formed. In some cases, contact 3242 may also represent a single contact such as a via contact formed on the bottom surface of a data signal receive contact circuit 3074. In some cases contact 3242 represents more than one contact formed that way.

In some cases, trace 3081 and optionally contact 3242 exists on the LSML or second, LV2 level from the bottom of chip 3009 (e.g., level LM is part of a level LV2). In some cases, trace 3081 and optionally contact 3242 exists on the LSML or second, LV2 level from the bottom of chip 3009. However, if there is more than one switch buffer pair, some pairs of traces 3081 and some of contacts 3242 may be in an upper level from surface 3203 of chip 3009 (e.g., LV4 and/or LV3).

In some cases, level LM and contact 3242 represent more than one level of contacts. In some cases they represent a single contact such as via contact 3242 as shown. In other cases they represent multiple levels of via and/or contacts such as contact 3242 and contact 3030 extending vertically between first end 3282 of trace 3081 and a contact of circuit 3074. In some cases they represent between one and 50 levels between the top surface of trace 3081 and the bottom surface of a contact of circuit 3074.

FIG. 32A shows data signal (e.g., receive or buffer) circuit 3074 on Level LN. It can be appreciated that Level LN may be any level above and including levels above Level LM.

FIG. 32B shows chip "on-die" interconnection feature zones 3098 and 3094 of FIGS. 30A-B showing a chip isolation "leadway" (LDW) routing trace 3083 to isolate a chip receive data signal "leadway" (LDW) routing traces 3081. In FIG. 32B zone 3098 is shown including trace 3174 physically and electrically attached to contact 3244 (e.g., contact 3244 may be formed onto or physically touching) which is physically and electrically attached end 3284 of isolation LDW trace 3083. The opposite end 3285 of LDW trace 3083 is physically and electrically attached to contact 3254; which is physically and electrically attached to surface contact 3020.

Solder 3019 may be mounted on the exposed surface of contact 3020 which is on or has the exposed surface planar with the bottom surface of chip 3009. The distance between the center of contact 3244 and of contact 3020 is shown as length L301 or pitch length PL30.

Zone 3094 is shown as having a portion of length L301 that includes trace 3083 between contacts 3244 and 3020. First exposed level LV1 of chip 3009 is shown including contacts 3254 and 3020. In some cases, contact 3254 may represent a single contact such as a via contact formed on the bottom surface of end 3285 of trace 3083. In some cases it represents more than one contact formed that way. In some cases, contact 3020 may represent a single solder bump contact formed on the bottom surface of contact 3254.

In some cases, contact 3254 may represent between one and three contact levels, similar to but above level LV3. In some cases, it may represent between one and three of such levels including a contact similar to 3254 and a contact similar to 3020 located between the bottom surface of trace 3083 and top surface 3203. In some cases, trace 3083 will be vertically located as low and close as possible to surface 3203 or contact 3020.

In some cases where switched buffer (SB) signal channels are implemented as described herein, level LV3 will represent a number of levels such as LV3, that is equal to the number of switched buffer (SB) signal channels; and each of these levels has contacts such as 3254 and 3020 for each pair of switch buffers (e.g. see FIG. 35).

In some cases where switched buffer (SB) signal channels are implemented as described herein, level LV2 will represent a number of levels such as LV2, that is equal to the number of switched buffer (SB) signal channels; and each of these levels has contacts such as 3254 and 3020 for each pair of switch buffers (e.g. see FIGS. 38A-40B). In some cases, each of these levels will also include via contacts between each end of each data signal LDW trace, such as contacts 3254 and 3244 that connect one end to a data signal circuit and the other end to a solder bump surface contact of each data signal LDW trace, for each pair of switch buffers (e.g. see FIGS. 38A-40B).

In some cases, contact 3244 may represent a single contact such as a via contact upon which the top surface of end 3284 of trace 3083 is formed. In some cases, contact 3244 may also represent a single contact such as a via contact formed on the bottom surface of a data signal output contact of circuit 3074. In some cases contact 3244 represents more than one contact formed that way.

In some cases, trace 3083 and optionally contact 3244 exists on the LSML or second, LV2 level from the bottom of chip 3009 (e.g., level LM is part of a level LV2). In some cases, trace 3083 and optionally contact 3244 exists on the LSML or second, LV2 level from the bottom of chip 3009. However, if there is more than one switch buffer pair, some pairs of traces 3083 and some of contacts 3244 may be in an upper level from surface 3203 of chip 3009 (e.g., LV4 and/or LV3).

In some cases, level LM and contact 3244 represent more than one level of contacts. In some cases they represent a single contact such as via contact 3244 as shown. In other cases they represent multiple levels of via and/or contacts such as contact 3244 and contact 3020 extending vertically between first end 3284 of trace 3083 and a contact of circuit 3074. In some cases they represent between one and 50 levels between the top surface of trace 3083 and the bottom surface of a contact of circuit 3074.

FIG. 32B shows isolation signal (e.g., ground or DC power signal trace or plane) trace 3174 on Level LN. It can be appreciated that Level LN may be any level above and including levels above Level LM.

In some cases, zone 3098 includes zone 3094 and receive circuits 3074. In some cases, zone 3098 includes zone 3094, surface contacts 3030 of chip 3009, and receive circuits 3074. In some cases, zone 3098 includes zone 3094, surface contacts 3030 of chip 3009, solder bumps 3019 attaching contacts 3030 of chip 3009 to contacts 3030 of package 3010, and receive circuits 3074. In some cases, receive circuits 3074 represent a receive buffer, such as a part of a data signal receive circuit that is connected to data signal traces, via contacts, or surface contacts to receive a data signal from another electronic device or chip.

In some embodiments, traces 3081 and 3083 (e.g., LDW traces on level LV2; or other data signal LDW traces of patterns 3400, 3800, 3805, 3900, 3905, 4000 and 4005 on level LV2, LV3, LV4 and/or LV5) may have length L301, width W301 and Height H301.

In some embodiments, length L301 may be between 50 and 1 millimeter (mm). In some embodiments, length L301 may be between 100 and 600 micrometers (um). In some embodiments, length L301 may be between 200 and 500 micrometers (um). In some embodiments, length L301 may be approximately 400 micrometers (um) (e.g., see FIGS. 35A-B and 37). In some embodiments, length L301 may be between 100 and 400 micrometers (um) (e.g., see FIGS. 36A-B). In some embodiments, length L301 may be between 150 and 450 micrometers (um) (e.g., see FIGS. 38A-40B). In some embodiments, length L301 may be between 350 and 450 micrometers (um). In some embodiments, length L301 may be between 400 and 500 micrometers (um). In some embodiments, L301 will be equal to L301.

In some embodiments, level LV1 of chip 3009 may have height H302. In some embodiments, level LM of chip 3009 may have height H303. In some embodiments, level LN of chip 3009 may have height similar to that described for chip 3008.

In some embodiments, each of contacts 3242, 3244, 3252, 3254, 3020 and 3030 of chip 3009 may have or represent one or more contacts that are each combined to have a length, width and height of between 4 and 25 micrometers.

In some embodiments, level LN of chip 3008 and 3009 may have height of between 2 and 4 micrometers (um). In some embodiments, LN may represent multiple layers and be between 4 and 25 micrometers (um). In some embodiments, it may be between 4 and 16 micrometers (um). In some embodiments, it may be between 4 and 8 micrometers (um). In some embodiments, it may be between 8 and 16 micrometers (um). In some embodiments, it may be between 16 and 25 micrometers (um). In some embodiments, it may represent the total height of chip 3008 or 3009, minus the heights of layers LM, LV2 (and any of LV3-5 if they exist) and LV1. Above level LN, chip 3008 and 3009 may include various interconnect layers, chip layers, chip circuits and IC processor circuitry (e.g., electronic devices, transistors, diodes, logic, gates, and the like) as known in the industry for a semiconductor device IC chip.

In some cases, package device 3010 may be cored or coreless package. In some cases, the package includes features formed according to a standard package substrate formation processes and tools such as those that include or use: lamination of dielectric layers such as ajinomoto build up films (ABF), laser or mechanical drilling to form vias in the dielectric films, lamination and photolithographic patterning of dry film resist (DFR), plating of conductive traces (CT) such as copper (Cu) traces, and other build-up layer and surface finish processes to form layers of electronic conductive traces, electronic conductive vias and dielectric material on one or both surfaces (e.g., top and bottom surfaces) of a substrate panel or peel able core panel. The substrate may be a substrate used in an electronic device package or a microprocessor package.

In some cases, each of traces 3082 and/or 3081 coupled to a contact 3040 and/or 3030 may represent a data signal or high frequency (HF) data signal trace (e.g., having a data signal or high frequency (HF) data signal (e.g., transmit or "TX" data signal and receive or "RX" data signal, respectively) as described herein or known) coupled to a transmit or receive contact (e.g., see 3082 coupled to 3040 for transmit; and 3081 coupled to 3030 for receive of FIGS. 34A-B). In some cases, each of traces 3082 and/or 3081 coupled to a contact 3040 and/or 3030 may represent a first and second chip pair of an electronic system 3070 that are connected and communicating with each other through a package (e.g., package 3010).

In some cases, each of traces 3084 and/or 3083 coupled to a contact 3020 may represent a ground or power trace (e.g., having a ground signal or direct current power signal as described herein or known) coupled to a ground or power contact (e.g., see 3084G coupled to 3020G for ground; and 3084P coupled to 3020P for power of FIGS. 34A-B). In some cases, each of traces 3084 and/or 3083 coupled to an isolation trace or plane 3172 and/or 3174. Each of traces 3172 and 3174 may be a trace or plane having an isolation (e.g., ground or DC power) signal capable of isolating one data signal from another (e.g., adjacent) data signal of adjacent ones of LDW traces 3082 and/or 3081, when that isolation signal is electrically coupled to traces 3084 and/or 3083 which are located between the adjacent ones of the LDW traces. This isolation signal may be a ground signal or direct current power signal as described herein or known. In some cases, each of traces 3084 and/or 3083 coupled to a contact 3020 may represent a side by side pair (e.g., on the same level, such as LV2) of a ground and power trace coupled to a ground and power contact (e.g., see 3084G coupled to 3020G side by side with 3084P coupled to 3020P, between a pair of traces 3082 of FIGS. 34A-B).

It is considered that trace 3083, 3084, 3084G or 3084P is capable of electronically isolating or shielding a data signal transmitted (or received) on one (e.g., on level LV2) signal trace 3082 or 3081 from a data signal transmitted (or received) of an adjacent (e.g., also on level LV2) signal trace 3082 or 3081. In some cases, each of trace 3083, 3084, 3084G or 3084P is capable of reducing data signal crosstalk, lossy lines, and reflections (e.g., singing) in a data signal transmitted (or received) on one (e.g., on level LV2) signal trace 3082 or 3081 from a data signal transmitted (or received) of an adjacent (e.g., also on level LV2) signal trace 3082 or 3081.

The electronically isolating or shielding may occur when such data signals are transmitted by a transmitter circuit on a first chip (to or) through traces 3082 (and possibly other on-die features, chip connections, interfaces, attachments, solder bumps, etc.) to a semiconductor device package the first chip is mounted on, through the packaging, and (to or) through traces 3081 of a second chip. In some cases, they occur when such signals are transmitted through traces 3081 of a second chip but not through traces 3082 on the first chip (e.g., traces 3082 do not exist on the first chip).

Chip 3008 is shown having bottom surface 3103, such as a surface of dielectric, upon or in which are formed (e.g., disposed) contacts 3040 and 3020 in an area of zone 3096. Contacts 3040 and 3020 are shown in a row along width W303 of chip 3008. In some cases, contacts 3040 and 3020 are located lengthwise along or at opposing ends of length L301, L3011 or L30111 (e.g., see FIGS. 38A-40B). In some cases, only contacts 3040 are located lengthwise along or at opposing ends of length L301, L3011 or L30111 (e.g., see FIGS. 38A-40B) and contacts 3020 are located at another lengthwise location in area 3001 of package 3010. In some cases, contacts 3040 may be described as a signal cluster formed in a lengthwise 4-row deep die-bump pattern, where the first and second rows are SB pairs, and the third and fourth rows are SB pairs (e.g., see FIGS. 38A-40B).

Chip 3009 is shown having bottom surface 3203, such as a surface of dielectric, upon or in which are formed (e.g., disposed) contacts 3030 and 3020 in an area of zone 3098. Contacts 3030 and 3020 are shown in a row along width W303 of chip 3009. In some cases, contacts 3030 and 3020 are located lengthwise along or at opposing ends of length L301, L3031 or L30311 (e.g., see FIGS. 38A-40B). In some cases, only contacts 3030 are located lengthwise along or at opposing ends of length L301, L3031 or L30311 (e.g., see FIGS. 38A-40B) and contacts 3020 are located at another lengthwise location in area 3011 of package 3010. In some cases, contacts 3030 may be described as a signal cluster formed in a lengthwise 4-row deep die-bump pattern, where the first and second rows are SB pairs, and the third and fourth rows are SB pairs (e.g., see FIGS. 38A-40B).

Package 3010 is shown having top surface 3003, such as a surface of dielectric, upon or in which are formed (e.g., disposed) contacts 3040 and 3020 in a zone of area 3001 under of chip 3008 (and optionally near an edge towards chip 3009). In some cases, the pattern of contacts 3040 and 3020 in area 3001 matches or is a mirror image of the pattern of contacts 3040 and 3020 in zone 3096. Package 3010 is also shown having top surface 3003, such as a surface of dielectric, upon or in which are formed (e.g., disposed) contacts 3030 and 3020 in a zone of area 3011 under of chip 3009 (and optionally near an edge towards chip 3008). In some cases, the pattern of contacts 3030 and 3020 in area 3011 matches or is a mirror image of the pattern of contacts 3040 and 3020 in zone 3098.

FIGS. 30A-B show system 3070 having package 3010 data signal transmission lines 3033 3035 and 3037 disposed within levels of package 3010 and forming a "connection" connecting data signal solder bumps 3018 and 3019 on top surface contacts on areas 3001 and 3011 of package 3010 to each other. This connection may include bumps 3018 and 3019. This connection may be an electrically conductive connection that is part of a single channel between a single transmit circuit (e.g., circuit 3072) and a corresponding single receive circuit (e.g., circuit 3074) through which it is possible to transmit data signals. This connection may be an electrically conductive connection with zero or less than 30 Ohms of electrical resistance.

The combination of this connection (e.g., of package 3010 data signal transmission (and receive) lines 3033 3035 and 3037 connecting data signal solder bumps 3018 and 3019) and the chip on-die interconnection features (e.g., zone 3092 (or pattern 3800, pattern 3900 or pattern 4000) and/or zone 3094 (or pattern 3805, pattern 3905 or pattern 4005) such shown in FIGS. 30A-40B) may form a single channel between a single transmit circuit (e.g., circuit 3072) and a corresponding single receive circuit (e.g., circuit 3074). It can be appreciated that there may be many such channels (e.g., 5 channels are shown in FIGS. 30A-B, but there can be dozens or hundreds). Some embodiments of these data signal channels are also described with respect to FIGS. 33 and 38A-40B.

In some case, this connection plus the structures in chip on-die interconnection features (e.g., zone 3092 (or pattern 3800, pattern 3900 or pattern 4000) and/or zone 3094 (or pattern 3805, pattern 3905 or pattern 4005) between data transmit and receive circuits may form data signal transmission (and receive) channels (e.g., including through package 3010) such as channel 3076, channel 3076B of FIG. 33, and similar channels with longer channel lengths of FIGS. 38A-40B. In some cases, these data signal transmission (and receive) channels include all of the data signal transmission LDW traces, package traces, bumps, contacts, and other structures between signal transmit circuits (e.g., circuits 3072) and corresponding signal receive circuits (e.g., circuits 3074) (e.g., see FIGS. 30-40B). In some cases, these data signal channels may also include signal transmit circuits (e.g., circuits 3072) and corresponding signal receive circuits (e.g., circuits 3074).

In some cases, there are isolation signal traces, connections or routing extending in package 3010 parallel to, shielding and electronically isolating each of data signal lines 3033 3035 and 3037 from other ones of data signal lines 3033 3035 and 3037 within package 3010 (e.g., on the same level or on different levels of package 3010) between solder bumps 3018 and 3019. These isolation connections may include some of solder bumps 3018 and 3019 that attach isolation signal surface contacts in zones 3001 and 3011 of package 3010 to corresponding isolation signal surface contacts in 3096 and 3098 of chips 3008 and 3009, respectively. In some cases, isolation (e.g., ground and/or power) signal transmission LDW traces, package traces, bumps, contacts, and other structures (e.g., between circuit 3072 and circuit 3074) are disposed parallel to, on the same level as, and provide electrical shielding and isolation of the data signal transmission LDW traces, package traces, bumps, contacts, and other structures between circuit 3072 and circuit 3074 of these data signal channels (e.g., see FIGS. 30-40B).

In some cases, this electrical shielding and isolation, through package 3010, may be the same as described above (and/or for FIG. 34A-B) for each of trace 3083, 3084, 3084G or 3084P being capable of reducing data signal cross-talk, lossy lines, and reflections (e.g., singing) in a data signals transmitted (or received) on one (e.g., on level LV2, LV3, LV4, LV5, vertical via contacts, surface contacts, solder bumps, horizontal package levels) data signal LDW trace (e.g., trace 3082 or 3081, or those of FIGS. 38A-40B) from a data signals transmitted (or received) of an adjacent (e.g., also on level LV2, LV3, LV4, LV5, vertical via contacts, surface contacts, solder bumps, horizontal package levels, respectively) data signal LDW trace (e.g., trace 3082 or 3081, or those of FIGS. 38A-40B).

FIGS. 30A-B show vertical data signal transmission lines 3033 (e.g., data signal transmit lines or traces) originating at chip 3008 and extending vertically downward through bumps 3018 and into vertical levels of package 3010. In some cases, lines 3033 may originate at (e.g., start at the bottom surface of transmit signal contacts 3040 on) the bottom surface 3103 of chip 3008, extend downward through bumps 3018 (e.g., include height of bumps 3018), extend downward through (e.g., include signal contacts 3040 on) a top surface 3003 of package 3010 at location 3001, and extend downward to levels Lj-Ll of package 3010 at first horizontal location 3034 of package 3010 (e.g., include vertical signal lines within vertical levels Ltop-L1 of package 3010, such as where level Ltop is the topmost or uppermost level of package 3010 and has an exposed top surface 3003; and level L1 is below level Ltop).

FIGS. 30A-B also show package device horizontal data signal transmission lines 3035 (e.g., data signal transmit lines or traces) originating at first horizontal location 3034 in levels Lj-L1 of package 3010 and extend horizontally along levels Lj-Ll along length L302 of levels Lj-Ll to second horizontal location 3036 in levels Lj-Ll of package 3010. Length L302 may be between 0.5 and 25 mm. In some cases it is between 1.0 and 15 mm. In some cases it is between 0.2 and 10 mm. In some cases it is between 2 and 10 mm. In some cases it is between 2 and 6 mm. In some cases it is between 3 and 5 mm. In some cases it is between 3.5 and 4.5 mm. In some cases it is between 4 and 5 mm. It can be appreciated that length L302 may be an appropriate line or trace length within a package device, that is less than or greater than those mentioned above.

Next, FIGS. 30A-B show vertical data signal transmission lines 3037 (e.g., data signal transmission lines or traces) originating in package 3010 and extending vertically upward through bumps 3019 and terminating at chip 3009. In some cases, lines 3037 may originate at (e.g., from horizontal data signal transmission lines 3035 in) levels Lj-Ll at second horizontal location 3036 of package 3010, extend upward through receive signal contacts 3030 at location 3011 on top surface 3003 of package 3010, extend upward through bumps 3019 (e.g., include height of bumps 3019), and extend upward to and terminate at receive signal contacts 3030 on bottom surface 3203 of chip 3009.

In some cases the data signal transmit signals transmitted and received (or existing) on data signal transmission lines of lines 3033, 3035 and 3037 originate at (e.g., are generated or are provided by) chip 3008 and are sent or transmitted to chip 3009. In some cases, these data signal transmission signals may be generated by active circuits, transistors, transmitter, buffer circuitry 3072 or other components of chip 3008.

In some cases the data signal transmit signals described herein are high frequency (HF) data signals (e.g., TX data signals). In some cases, the signals have a speed of between 4 and 10 gigatransfers per second (GT/s). In some cases, the signals have a speed of between 6 and 8 gigatransfers per second. In some cases, the signals have a speed of between 4 and 5 Gigabits per second. In some cases, the speed is between 4.1 and 4.5 Gigabits per second. In some cases, the signals have a speed of between 2 and 12 Gigabits per second. In some cases, the signals have a speed of between 3 and 12 Giga-Transfers per second. In some cases the signals have a speed between 7 and 25 GT/s; and a voltage of between 0.5 and 2.0 volts. In some cases the signal has a speed between 6 and 15 GT/s. In some cases the signal has a voltage of between 0.4 and 5.0 volts. In some cases it is between 0.5 and 2.0 volts. In some cases it is a different speed and/or voltage level that is appropriate for receiving or transmitting data signals through or within a package device. In some cases, they are in a range between a very low speed transfer rate such as from 50 MT/s to greater than 40 GT/s (or up to between 40 and 50 GT/s).

In some cases, lines 3033, 3035 and 3037 also include power and ground signal lines or traces (e.g., in addition to high frequency data signals transmit lines or traces). These power and ground lines are not shown. In some cases, they extend horizontally from the bottom surface of contacts 3020 of chip 3008 to location 3034 within levels Lj-Ll or other levels of package 3010. In some cases they extend horizontally from location 3034 to location 3036 within levels Lj-Ll or within other levels of package 3010. In some cases the power and ground signals transmitted and received (or existing) on the power and ground signal lines of lines 3033, 3035 and 3037 originate at or are provided by chip 3008 or by package 3010 or by chip 3009. In some cases, these power and ground signals may be generated by power and ground traces, transistors or other components of or attached to chip 3008, package 3010 or chip 3009.

In some cases the power signal of lines 3033, 3035 and 3037 (or of isolation LDW trace 3084; or power LDW trace 3084P—See FIGS. 34A-B) is or includes power signals to an IC chip (e.g., chip 3008 or 3009), package 3010, or another device attached to thereto. In some cases this power signal is a direct current (DC) power signal (e.g., Vdd). In some cases the power signal has a DC voltage of between 0.4 and 7.0 volts. In some cases it is between 0.5 and 5.0 volts. In some cases it is a different voltage level that is appropriate for providing one or more electrical power signals through or within a package device or IC chip.

In some cases the ground signal of lines 3033, 3035 and 3037 (or of isolation LDW trace 3084 or ground LDW trace 3084G—See FIGS. 34A-B) is or includes ground signals to an IC chip (e.g., chip 3008 or 3009), package 3010, or another device attached to thereto. In some cases this ground signal is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

FIGS. 30A-B show system 3070 having vertical height H304 between traces 3082 (and optionally 3084) and location (e.g., corner) 3035. Height H304 may include structures in zone 3096 levels LV1, LV2 and LM. In some cases, height H304 may include or be equal to height H301, plus height H302, plus height H3; plus the height of bumps 3018; and the height from surface 3003 to levels Lj-Ll of package 3010. In some cases, H304 is between 10 and 150 um. In Some cases it is between 30 and 100 um. In some cases it is between 45 and 85 um. In some cases, H304 describes a vertical height from the top surface of the package (3003) to levels Lj-Ll of package where the horizontal signal traces go between the two chips.

FIGS. 30A-B show system 3070 having vertical height H305 between traces 3081 (and optionally 3083) and location (e.g., corner) 3036. Height H305 may include structures in zone 3098 levels LV1, LV2 and LM. In some cases, height H305 may include or be equal to height H301, plus height H302, plus height H303; plus the height of bumps 3019; and the height from surface 3003 to levels Lj-Ll of package 3010. In some cases, height H305 may be equal to height H304. In some cases, they may be different heights. In some cases, H305 is between 10 and 150 um. In Some cases it is between 30 and 100 um. In some cases it is between 45 and 85 um.

The connection formed by data signal transmission lines 3033 3035 and 3037 (including solder bumps 3018 and 3019) plus the structures in zones 3096 and 3098 between circuits 3072 and 3074 may form data signal transmission channel 3076 (e.g., through package 3010). In some cases, channel 3076 has a "channel length" CL (e.g. see FIG. 33), such as a total length a signal must travel between circuits 3072 and 3074. In some cases length CL includes the lengths and heights of the signal transmission features, paths and traces between circuits 3072 and 3074. In some cases, this channel length CL is length L301, plus height H304, plus length L302, plus height H305, plus length L301. In some cases, channel length CL will be different depending on whether zone 3092, zone 3094, or both zones exist in system 3070 (e.g., such as discussed with respect to FIGS. 33 and 35-37).

Data signal transmission lines 3035 are shown having length L302. Thus, the horizontal distance between circuits 3072 and 3074 may be length L301, plus L302, plus L301. In some cases, the combination of the lengths traces 3082, signal lines 3033, 3035 and 3037; and traces 3081 form data signal transmission channel 3076 horizontal distance, such as of a data transmit channel from chip transmit circuits 3072 of chip 3008 to receive circuits 3074 of chip 3009.

Data signal transmission lines 3033 and 3037 are shown having height H304 and H305, respectively. Thus, the aggregate vertical distance between circuits 3072 and 3074 may be height H304 plus H305. In some cases, the combination of the heights of levels LM, LV2 and LV1; bumps 3018 and 3019; and signal lines 3033 and 3037 form data signal transmission channel 3076 vertical distance, such as of a data transmit channel from chip transmit circuits 3072 of chip 3008 to receive circuits 3074 of chip 3009.

Figure 33A:
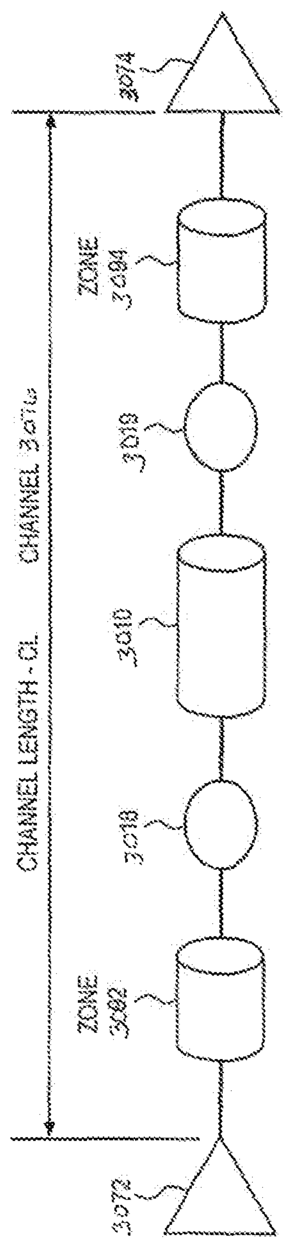
FIGS. 33A and B show embodiments of data signal transmission channels having data signal LDW traces (e.g., chip "on-die" interconnection features).
Figure 33B:
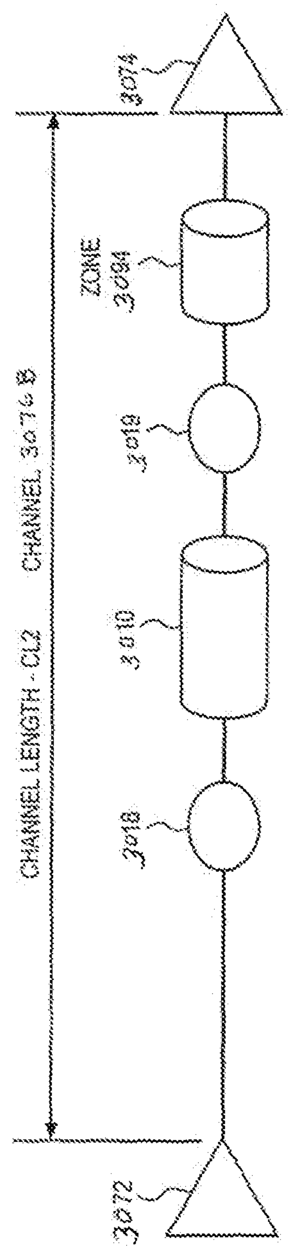

FIGS. 33A and B show embodiments of data signal transmission channels having data signal LDW traces (e.g., chip "on-die" interconnection features). FIGS. 33A-B may show embodiments of two feasible data signal channel topologies to maximize OPIO performance, which are LDW routing on TX and RX chips, and LDW routing on RX chip only. For some embodiments, FIG. 33A may describe one feasible channel topology (channels 3076) to maximize on-package (e.g., package 3010) input and output performance, using LDW traces (e.g., trace lengths, routes or "routing") for or on both a transmit chip 3008 and receive 3009 chip of a data communication channel. For some embodiments, FIG. 33B may describe one feasible channel topology (channels 3076B) to maximize on-package (e.g., package 3010) input and output performance, using LDW traces (e.g., trace lengths, routes or "routing") for or on only a receive 3009 chip of a data communication channel. In some case, FIG. 33A shows channel 3076 as one example of a data signal transmission channel (e.g., based on channel 3076 herein) between and connecting circuit 3072 of chip 3008 to circuit 3074 of chip 3009, having data signal LDW traces on both chip 3008 and 3009. In some case, FIG. 33B shows channel 3076B as a second example of a data signal transmission channel (e.g., based on parts of channel 3076 herein) between and connecting circuit 3072 of chip 3008 to circuit 3074 of chip 3009, having data signal LDW traces on chip 3009 but not on chip 3008. In some cases, channel 3076 or 3076B may exist between and electronically connect circuit 3072 of chip 3008 to circuit 3074 of chip 3009 for transmitting high speed data signals as noted herein.

In some case, FIG. 33A shows data signal transmission channel 3076 having data signal LDW traces (e.g., chip "on-die" interconnection features) at zones 3092 and 3094. Channel 3076 may correspond to the descriptions herein, including descriptions for FIGS. 30-32, and have channel length CL. Channel 3076 is shown having transmit circuit 3072 physically and electrically coupled to LDW traces of zone 3092, which are physically and electrically coupled to solder bumps 3018, which are physically and electrically coupled to signal traces extending through package 3010, which are physically and electrically coupled to solder bumps 3019, which are physically and electrically coupled to LDW traces of zone 3094, which are physically and electrically coupled to received circuits 3074. Channel 3076 may include these features as physically and electrically coupled to each other, extending between circuit 3072 and 3074.

In some cases, channel 3076 represents the combination of package 3010 data signal transmission (and receive) lines 3033 3035 and 3037 connecting data signal solder bumps 3018 and 3019 (e.g., shown as feature "3010" in FIG. 33A), and the chip on-die interconnection features of chips 3008 and 3009 (e.g., zone 3092 (or pattern 3800, pattern 3900 or pattern 4000 such shown in FIGS. 38A-40B), shown as "zone 3092" in FIG. 33A) and zone 3094 (or pattern 3805, pattern 3905 or pattern 4005 such shown in FIGS. 38A-40B), shown as "zone 3094" in FIG. 33A)), such as to form a single channel between a single transmit circuit (e.g., circuit 3072) and a corresponding single receive circuit (e.g., circuit 3074). It can be appreciated that there may be many such channels (e.g., 5 channels are shown in FIGS. 30A-B, but there can be dozens or hundreds).

In some case, FIG. 33B shows data signal transmission channel 3076B having data signal LDW traces (e.g., chip "on-die" interconnection features) only at zone 3094. Channel 3076B is shown having a channel such as described above for channel 3076 having zone 3094 (e.g., with LDWs 3081 and 3083) but without zone 3092 (e.g., without LDWs 3082 and 3084) and without having length L301 as described herein, including descriptions for FIGS. 30-32. Thus, instead of having channel length CL, channel 3076B has channel length CL2 which may be equal to the length CL1 minus length L301 of zone 3092. In some cases, channel length CL2 is height H304, plus length L302, plus height H305, plus length L303.

Channel 3076B is shown having transmit circuit 3072 physically and electrically coupled to solder bumps 3018 (e.g., without LDW traces of zone 3092 connected between circuit 3072 and bumps 3018), which are physically and electrically coupled to signal traces extending through package 3010, which are physically and electrically coupled to solder bumps 3019, which are physically and electrically coupled to LDW traces of zone 3094, which are physically and electrically coupled to received circuits 3074. In some cases, vertical via contacts and other contacts extend vertically through levels LM and LV2 (but not horizontally and without any horizontal length such as length L301) to physically and electrically coupled circuit 3072 to contacts 3040 of chip 3008. Channel 3076B may include these features as physically and electrically coupled to each other, extending between circuit 3072 and 3074.

In some cases, channel 3076B represents the combination of package 3010 data signal transmission (and receive) lines 3033 3035 and 3037 connecting data signal solder bumps 3018 and 3019 (e.g., shown as feature "3010" in FIG. 33B), and only the chip on-die interconnection features of chip 3009 (e.g., excluding zone 3092 (or pattern 3800, pattern 3900 or pattern 4000 such shown in FIGS. 38A-40B), but including zone 3094 (or pattern 3805, pattern 3905 or pattern 4005 such shown in FIGS. 38A-40B), shown as "zone 3094" in FIG. 33B)), such as to form a single channel between a single transmit circuit (e.g., circuit 3072) and a corresponding single receive circuit (e.g., circuit 3074). It can be appreciated that there may be many such channels (e.g., 5 channels are shown in FIGS. 30A-B, but there can be dozens or hundreds).

For some embodiments, a data signal transmission channel (e.g., channel 3076 and/or 3076B) represents a data signal: transmission path, separate path through which data signals can flow, transmission path of multiple such paths within a single link between network points (e.g., chip 3008 transmit circuits 3072 and chip 3009 receive circuits 3074), or physical transmission medium such as including contacts, solder bumps and traces. In some cases, a channel is used to convey a data information signal, for example a digital bit stream, from one or several senders (e.g., transmitters 3072) to one or several receivers (e.g., receivers 3074). In some cases, a channel has a certain capacity for transmitting data signal information, often measured by its bandwidth in hertz (Hz) or its data rate in bits per second.

FIGS. 34A and 34B show embodiments of data signal LDW routing features on an LSML layer of transmit and/or receive data chips (e.g., chip "on-die" interconnection features). FIGS. 34A-B show examples of the LSML isolated LDW trace routing in transmit and/or receive data chips (e.g., "silicon") with typical dense package data signal (and isolation) routing for cascading with short on-package MCP channels, according to embodiments.

FIG. 34A shows a cross-sectional length wise perspective view through perspective A-A' across a width of zone 3092 (or zone 3094) showing a pattern of data signal and isolation LDW traces, according to various embodiments. For example, it may be a cross section perspective through perspective A-A', such as a cross section of levels LV1, LV2, LM and LN perpendicular to length (e.g., looking at a cross sectional view of the plane of height and width, and down direction L301) and showing 3400 a pattern of data signal and isolation LDW traces.

FIG. 34B shows a bottom perspective view of zone 3092 (or of zone 3094), as shown in FIG. 34A showing a pattern of data signal and isolation LDW traces extending along a length (e.g., L301 or L303), according to various embodiments of the application. It is noted that the bottom view of FIG. 34B shows embodiments from the perspective of looking upwards in FIGS. 30A-32B, such as a perspective viewing through exposed bottom surface 3103 of chip 3008 and/or surface 3203 of chip 3009. Thus, the descriptions of levels LV1, LV2, LM and LN for FIG. 34B may be in a reverse or inverted order (e.g., using bottommost for the top of the paper) as compared to looking down at the page, or as compared to the top of FIGS. 30A-32B. More specifically, the descriptions of FIGS. 38A, 39A and 40A may refer to level LV1 as a bottom (e.g., bottom most or lower) level as opposed to a top (e.g., topmost or upper) level LN such as shown for FIGS. 30A-32B.

FIGS. 34A and B show pattern 3400 having each one of data signal LDW traces 3082 isolated from each other one of (e.g., each of an adjacent trace 3082 on level LV2) by an isolation LDW trace 3084P and 3084G. In some embodiments, each trace 3084P and 3084G represents an embodiment of isolation trace 3084. In some examples, trace 3084G represents an isolation ground signal LDW trace version of trace 3084, such as by having a ground signal on trace 3084G (e.g., representing a version of trace 3084 where isolation is provided by trace 3084G only having a ground signal transmitted on that trace). In some examples, trace 3084P represents an isolation power signal LDW trace version of trace 3084, such as by having a power signal on trace 3084P (e.g., representing a version of trace 3084 where isolation is provided by trace 3084G only having a power signal transmitted on that trace). In some cases, traces 3084G and 3084P represent isolation ground and power signal LDW trace versions of traces 3084G and 3084P, respectively. Each trace 3082, 3084G and 3084P is shown having width W301 and a distance between each trace as shown as width W302.

In some embodiments, width W302 may be between 1 and 8 micrometers (um). In some embodiments, width W302 may be between 1 and 5 micrometers (um). In some embodiments, width W302 may be between 2 and 4 micrometers (um). In some cases, W302 is between 1 and 10 um. In some cases it is between 3.5 and 7.5 um. In some cases it is between 5 and 6 um. In some cases, W302 is equal to W301 for the same embodiment.

FIG. 34A shows level LM including via contacts 3144P and 3144G. Level LN is represented in FIG. 34A by a horizontal plane, which may represent level LN as described herein, such as with respect to FIGS. 30A-32B. FIG. 34B shows level LM and LN represented by a cross-striped plane. In some cases, level LN is shown included in level LM as "level LM and LN". This level represents a combination of level LM and level LN and described herein. In some cases, level LM and level LN are represented by a lengthwise (e.g., along L301) strips of hash marks on a level above level LV2 or LSML, and between the signal and isolation LDW traces numbered 1-9.

Pattern 3400 is shown having, left to right along width W303 along perspective A-A', trace numbers 1-9 which are LDW traces 3084G, 3082, 3084P, 3084G, 3082, 3084G, 3084P, 3082, and 3084G. According to pattern 3400, as shown, one of each, a power LDW trace 3084P and ground LDW trace 3084G trace are disposed widthwise between each adjacent pair (e.g., side by side along width W303) of signal LDW traces 3082. For example, adjacent pair of signal traces number 5 and number 8 ground trace 3084G which is trace number 6 and power isolation trace 3084P which is trace number 7 located between that pair in level LV2 or the LSML. In other embodiments, only one isolation trace is located between each adjacent pair of signal traces. In this instance, the isolation trace can be a ground trace or a power trace.

In some cases, a pattern may be used similarly to pattern 3400 with an arrangement of any order of one or two of traces 3084G and/or 3084P between each adjacent one or pair of LDW traces 3082. In some cases the pattern on level LV2/LSML may be each data signal LDW trace 3082 having at least one or two isolation traces 3084P and 3084G between and isolating from another trace 3082. In some cases, there may be 3084G then 3084P, or 3084P then 3084G, left to right between each adjacent trace 3082 on level LSML. In some cases, there may be either 3084G then 3084P; or 3084P then 3084G, left to right between each adjacent trace 3082. In some embodiments, a sequence similar to pattern 3400 may have each of data signal LDW traces 3082 isolated from each of an adjacent (e.g., pair of traces 3082) by only one of an isolation ground LDW trace 3084G or an isolation power LDW trace 3084P.

FIGS. 34A-B show the data signal and isolation LDW traces on level LV2 or LSML. Above level LV2 they show level LM including via contacts, such as those described for contacts 3144 in embodiments of FIGS. 30A-32B. In some cases, similar to embodiments having isolation LDW traces 3084 that are power or ground isolation traces, via contacts 3144 will be power via contact 3144P or ground via contact 3144G, respectively. In some cases, similar to embodiments having isolation LDW traces 3084 that are power or ground isolation traces, via contacts 3154 will be power via contact 3154P or ground via contact 3154G, respectively. Also, in some cases, similar to embodiments having isolation LDW traces 3084 that are power or ground isolation traces, surface bump contacts 3020 will be power surface bump contact 3020P or ground surface bump contact 3020G, respectively.

FIGS. 34A-B also show power isolation signal via contact 3154P and surface bump contact 3020P for power isolation signal LDW trace number 7; data signal via contact 3152 and surface bump contact 3040 for data signal LDW trace number 8; ground isolation signal via contact 3154G and surface bump contact 3020G for ground isolation signal LDW trace number 9. It can be appreciated that the via contacts 3154P and 3154D, and 3152; and surface contacts 3020P and 3020G and 3040 also exist above the other data signal and isolation traces numbered 1-6, respectively, even thought not shown.

In some cases, any or all of the via contacts (e.g., 3142 and 3152; 3144 (e.g., P or G) and 3144 (e.g., P or G); 3154 (e.g., P or G) and 3154 (e.g., P or G); and the like) and surface contacts (e.g., 3020G, 3020 (e.g., P or G), 3030 and 3040) may have top view X,Y cross sectional areas (e.g., from view of FIGS. 30A and 38A-40B) that are circular having diameter or width W304. In some cases, width W304 is between 3 and 25 um. In some cases, it is between 5 and 10 micrometers (um). In some cases, it is between 5 and 15 micrometers. In some cases, these top view X,Y cross sectional areas (e.g., from view of FIGS. 30A and 38A-40B) are for a shape having a maximum width (maximum distance from one edge to another farthest edge from above) of an oval, a rectangle, a square, a triangle, a rhombus, a trapezoid, or a polygon shape.

According to some embodiments, via contact 3144P and 3144G may physically and electronically attach traces 3084P and 3084G to contacts 3020P and 3020G, respectively, along length L301 of trace 3172, instead of just being located near trace 3172, as shown in FIGS. 30A-32B. For example, an embodiment of FIGS. 30A-32B is considered where a length of contact 3144 (e.g., 3144P and 3144G) is physically and electrically attached between traces 3084 (e.g., 3084P and 3084G) and an isolation trace (e.g., a length of a long trace 3172) or an isolation plane (e.g., having an isolation signal as described for trace 3172), along at least half, most or all of the length L301. In some cases they physically and electrically are attached along most or all of length L301. In some cases they physically and electrically are attached along most of length L301. In some cases, most of length L301 is 70, 80 or 90 percent of length L301. In some cases, most of length L301 is 90, 95 or 98 percent of length L301. In some cases, most of length L301 is 95 percent of length L301.

In some cases, contact 3144P describes a via contact attached between the power isolation trace 3084P and a power plane disposed in level LN, along half, most, or all of length L301. In some cases they physically and electrically are attached along most or all of length L301. In some cases they physically and electrically are attached along most of length L301. In some cases, contact 3144G describes a via contact attached between the power isolation trace 3084G and a power plane disposed in level LN, along half, most, or all of length L301. In some cases they physically and electrically are attached along most or all of length L301. In some cases they physically and electrically are attached along most of length L301. In a more general embodiment, contact 3144 describes a via contact attached between the an isolation trace 3084 and an isolation plane disposed in level LN, along half, most, or all of length L301. In some cases they physically and electrically are attached along most or all of length L301. In some cases they physically and electrically are attached along most of length L301.

In some cases, circuits 3072 are attached to the left end (e.g., left side of the page along length L301) of traces 3082, and contacts 3040 are attached to the right (e.g., right side of the page along length L301) of traces 3082 along length L301 (although not shown in FIG. 34B). Also, in some cases, traces 3172G (e.g., representing an isolation ground signal trace) and 3172P (e.g., representing an isolation power signal trace) are attached to the left end of traces 3084G and 3084P; and contacts 3020G and 3020P are attached to the right end of traces 3084G and 3084P, respectively along length L301 (although not shown in FIG. 34B).

Although two isolation LDW traces (power and ground) are shown between each pair of signal LDW traces, it is considered that a different number may be disposed between each adjacent pair of signal LDW traces along level LV2. For example, there may only be one isolation LDW trace, 3084P or 3084G, disposed between each adjacent signal LDW trace pair. In other cases, there may be three isolation LDW traces, such as 3084PGP (e.g., representing 3084P, 3084G and 3084P); 3084PPG; 3084GGP; 3084GPG; 3084PPP; or 3084GGG between each adjacent pair of signal LDW traces 3082 on level LV2.

According to some embodiments, pattern 3400 may be repeated such as where a new set of traces 1-9 repeat to the right of trace 9 as shown in FIG. 34A, along width W303. They may repeat between 1 and 20 times. According to some embodiments, pattern 3400 may only include trace numbers 2-7 (e.g., traces 1 and 8-9 do not exist), and those traces may be repeated such as where a new set of traces 2-7 repeat to the right of trace 7 as shown in FIG. 34A, along width W303.

According to embodiments, the descriptions above for FIGS. 34A-B (e.g., and pattern 3400) also apply to chip 3009. For example, in some cases, chip 3009 (e.g., in zone 3098) may include the same structure described above for FIGS. 34A-B for chip 3008 (e.g., in zone 3096). In some cases, such a replacement includes (or optionally is) replacing zone 3096 with zone 3098. In some cases, such a replacement includes (or optionally is) replacing zone 3092 with zone 3094.

In some cases, such a replacement includes (or optionally is) using descriptions of pattern 3400 or other patterns of signal traces 3082 and isolation traces 3084 (e.g., ground isolation traces 3084G and power isolation traces 3084P) of FIGS. 34A-B to describe pattern 3400 or other patterns of traces 3081 and isolation traces 3083 of chip 3009 (e.g., ground isolation traces 3083G and power isolation traces 3083P, similar to 3084G and 3084P); using descriptions of pattern 3400 or other patterns of transmit data contacts 3040 of FIGS. 34A-B to describe pattern 3400 or other patterns of receive data contacts 3030 of chip 3009; and using descriptions of pattern 3400 or other patterns of transmit circuits 3072 of FIGS. 34A-B to describe pattern 3400 or other patterns of receive circuits 3074 of chip 3009.

In some cases, such a replacement includes (or optionally is) using descriptions of pattern 3400 or other patterns of circuits 3072 and isolation traces 3172 (e.g., ground isolation traces 3172G and power isolation traces 3172P) of FIGS. 34A-B to describe pattern 3400 or other patterns of circuits 3074 and isolation traces 3174 of chip 3009 (e.g., ground isolation traces 3174G and power isolation traces 3174P, similar to 3172G and 3172P). In some cases, such a replacement includes (or optionally is) using descriptions of pattern 3400 or other patterns of contact 3142, contact 3152, contact 3040, and bump3018 of FIGS. 34A-B to describe pattern 3400 or other patterns of contact 3242, contact 3252, contact 3030, and bump 3019 of chip 3009. In some cases, such a replacement includes (or optionally is) using descriptions of pattern 3400 or other patterns of contact 3144 (e.g., ground isolation contact 3144G and power isolation contact 3144P), contact 3154 (e.g., ground isolation contact 3154G and power isolation contact 3154P), and contact 3020 (e.g., ground isolation contact 3020G and power isolation contact 3020P) of FIGS. 34A-B to describe pattern 3400 or other patterns of contact 3244 (e.g., contact 3244G and 3244P), and contact 3254 (e.g., contact 3254G and 3254P), contact 3020 (e.g., contact 3020G and 3020P) of chip 3009.

In some cases, each of circuits 3072 and/or 3074 coupled to traces 3082 and/or 3081 may represent a data signal or high frequency (HF) data signal transmit and receive circuits (e.g., transmitting and receiving, respectively, a data signal or high frequency (HF) data signal as described herein or known (such as a high speed data buffer circuit)) coupled through traces 3082 and/or 3081 to a transmit and/or receive contact (e.g., see circuit 3072 coupled through trace 3082 to contact 3040 for transmit; and circuit 3074 coupled through trace 3081 to contact 3030 for receive). In some cases, each of circuits 3072 and/or 3074 coupled to traces 3082 and/or 3081, which are then coupled to a contact 3040 and/or 3030 may represent a first and second chip transmit and receive data signal circuit pair of an electronic system that are connected and communicating with each other through a package (e.g., package 3010).

In some cases, each of traces 3084 (e.g., ground isolation traces 3084G and power isolation traces 3084P) and/or 3083 (e.g., ground isolation traces 3083G and power isolation traces 3083P) coupled to a contact 3020 (e.g., ground isolation contact 3020G and power isolation contact 3020P) may represent a ground or power trace (e.g., having a ground signal or direct current power signal as described herein or known) coupled to a ground or power contact (e.g., see 3084G coupled to 3020G for ground; and 3084P coupled to 3020P for power). In some cases, each of traces 3084 (e.g., ground isolation traces 3084G and power isolation traces 3084P) and/or 3083 (e.g., ground isolation traces 3083G and power isolation traces 3083P) coupled to a contact 3020 (e.g., ground isolation contact 3020G and power isolation contact 3020P) may represent a side by side pair (e.g., on the same level, such as LSML) of a ground and power trace coupled to a ground and power contact (e.g., see 3084G coupled to 3020G side by side with 3084P coupled to 3020P, between a pair of traces 3082 or 3081).

It is considered that trace 3083, 3084, 3084G or 3084P is capable of electronically isolating or shielding a data signal transmitted (or received) on one (e.g., on level LV2) signal trace 3082 or 3081 from a data signal transmitted (or received) of an adjacent (e.g., also on level LV2) signal trace 3082 or 3081. In some cases, each of trace 3083, 3084, 3084G or 3084P is capable of reducing data signal cross-talk, lossy lines, and reflections (e.g., singing) in a data signal transmitted (or received) on one (e.g., on level LV2) signal trace 3082 or 3081 from a data signal transmitted (or received) of an adjacent (e.g., also on level LV2) signal trace 3082 or 3081.

The electronically isolating or shielding may occur when such data signals are transmitted by a transmitter circuit on a first chip (to or) through traces 3082 (and possibly other on-die features, chip connections, interfaces, attachments, solder bumps, etc.) to a semiconductor device package the first chip is mounted on, through the packaging, and (to or) through traces 3081 of a second chip. In some cases, they occur when such signals are transmitted through traces 3081 of a second chip but not through traces 3082 on the first chip (e.g., traces 3082 do not exist on the first chip).

It can be appreciated that the descriptions of isolation (e.g., power and/or ground) LDW traces, via contacts, surface contacts and signal circuits for FIG. 34A-B can also be applied to the isolation traces shown and described for FIGS. 38A-40B.

FIGS. 35A-37 may be examples of an results from or related to (e.g., laboratory or test) experiments or simulations performed on or for a chip having a on-package chip features described herein; and/or an electronic system having 2 chips having a on-package chip features described herein that can (or are) communicate high speed data signals through a chip package as described herein (e.g., such as based on FIGS. 30-34 and 38A-40B). In some cases, a data signal channel (e.g., channel 3076; 3076B, and data signal channels described for FIGS. 30-34 and 38A-40B); or another channel without isolated data signal LDW traces of system 3070) is impedance tuned (e.g., see FIGS. 35A-37) to minimize impedance discontinuity and crosstalk between horizontally adjacent ones of isolated data signal LDW traces (e.g., traces 3082 and/or 3081; and isolated data signal traces of FIGS. 30-34 and 38A-40B) of the channel. In some cases, the terms "data signal channel including data signal LDW traces" will be used to refer to channel 3076, channel 3076B, and other data signal channels described for FIGS. 30-34 and 38A-40B.

In some cases, impedance tuning the data signal channel may include tuning to determine or identify a selected target length for L301, L302 and/or L303 (e.g., given other set or known heights and widths of traces 3033, 3035, 3037, 3082 and/or 3081) that provides a the best channel performance as showed as the largest amplitude eye height (EH) and eye width (EW) charts of example FIGS. 35A-37 produced by testing one of isolated traces 3082 and/or 3081. In some cases, impedance tuning the data signal channel may include tuning to determine or identify a selected target length for data signal LDW traces of SB patterns 3800, 3805, 3900, 3905, 4000 and 4005, such as length L301 (and L303), L3011 (and L3031), L30111 (and L30311) which can be extended to be one times, two times or three times the pitch PL between each of the adjacent solder bump surface contact (e.g., see FIGS. 38A-40B) (e.g., given other set or known heights and widths of traces 3033, 3035, 3037, isolation LDW traces and/or data signal LDW traces) that provides a the best channel performance as showed as the largest amplitude eye height (EH) and eye width (EW) charts of example FIGS. 35A-37 produced by testing one isolated data signal LDW traces of FIGS. 38A-40B.

The EH and EW charts may be output signal measure (or computer modeled) at a location of isolated data signal traces (e.g., of channel 3076; 3076B, and data signal channels described for FIGS. 30-34 and 38A-40B) when (e.g., as a result of running) one or more input test data signals are sent through the channel length (e.g., as described for example FIGS. 35A-37) of the channel. This testing may include sending simultaneous test signals, such as step up (e.g.,_|‾‾) and down (e.g.,‾‾|_) signals, through one type of isolated data signal traces traces for a channel having a given channel length. This may include performing such tuning to determine or identify lengths L301 (or L3011 or L30111), L302 and/or L303 (or L3031 or L30311) for FIGS. 30-34 and 38A-40B, for a channel having both, one or neither of isolated data signal LDW traces that are single line impedance tuned in the routing along the channel length.

Impedance tuning of the line may be based on or include as factors: horizontal data signal transmission line width W301, width W302, height H301, height H304, height H305. In some cases, once the W301, width W302, height H301, height H304, height H305 are known (e.g., predetermined or previously selected based on a specific design of system 3070), then tuning is performed (e.g., computer simulation, actual "beta" device testing, or other laboratory testing) to determine or identify a range of lengths L301 (or L3011 or L30111), L302 and/or L303 (or L3031 or L30311) for FIGS. 30-34 and 38A-40B, that provide the best channel performance as showed as the lowest amplitude cross point of eye height (EH) or eye width (EW) curves of an eye diagram produced by testing one isolated data signal LDW traces of FIGS. 38A-40B.

Figure 35A:
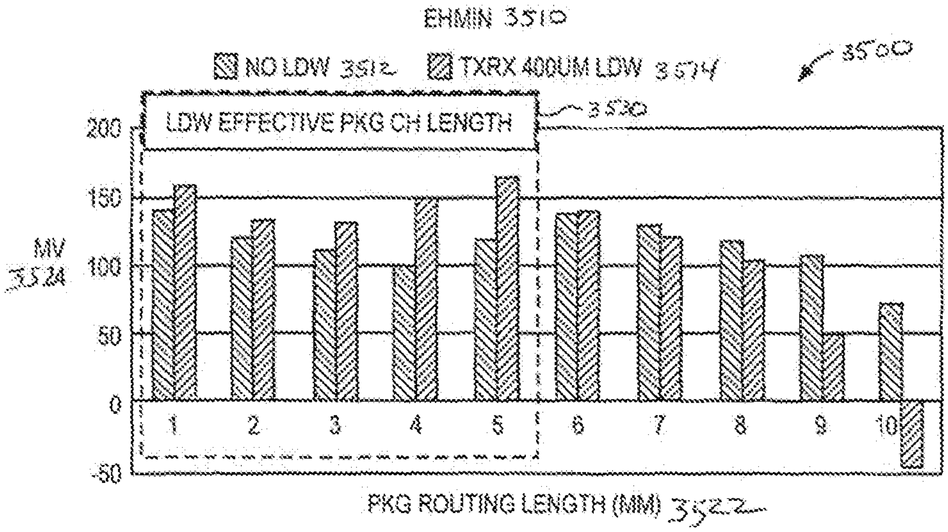
FIG. 35A shows an example of an a bar chart eye height minimum performance comparison of a data signal channel having various package channel/routing lengths between a transmit chip and a receive chip that have data signal LDW traces isolated by isolation LDW traces, as compared to such a channel excluding LDW traces.
Figure 35B:
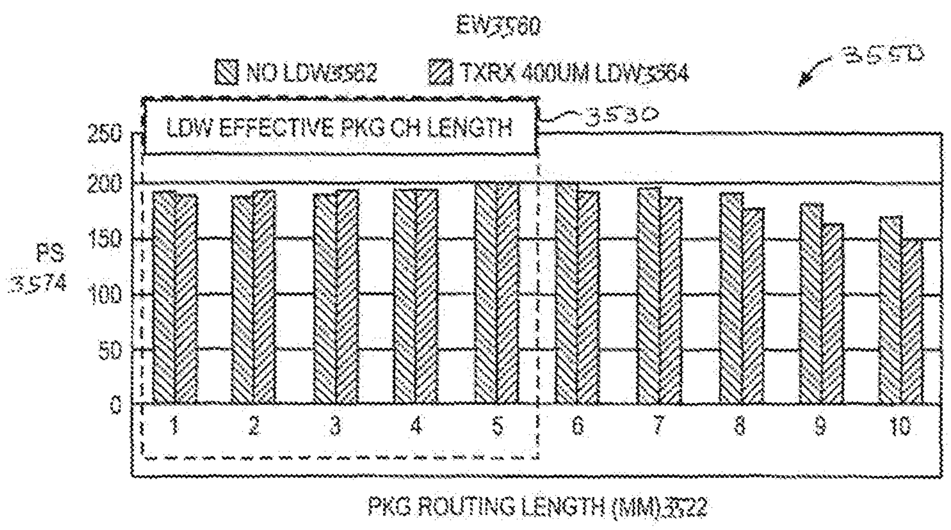
FIG. 35B shows an example of a bar chart eye width minimum performance comparison of a data signal channels of FIG. 35A.

FIGS. 35A-B may be an example of results from or related to (e.g., laboratory or test) experiments or simulations that show eye height and eye width comparison for an electronic system having a transmit chip and a receive chip that can (or are) communicate high speed data signals through a chip package using (1) a data signal channel having transmit chip and receive chip (e.g., "isolated") data signal LDW traces isolated by isolation LDW traces (e.g., having on-package features described herein), as compared to (e.g., with all other sizes, lengths, widths, heights, etc. being the same) (2) a data signal channel excluding LDW traces (e.g., excluding such on-package features) for various channel routing lengths of the package. FIG. 35A shows an example of an a bar chart eye height minimum performance comparison of a data signal channel having various package channel/routing lengths between a transmit chip and a receive chip that have data signal LDW traces isolated by isolation LDW traces, as compared to such a channel excluding LDW traces. FIG. 35A shows a bar chart eye height minimum 3510 performance comparison 3500 of (bars 3514) a data signal channel (e.g., channel 3076) having: (1) a zone of transmit data signal LDW traces isolated by isolation LDW traces (e.g., having zone 3092, pattern 3800, pattern 3900 or pattern 4000 of FIGS. 30-34, 38A, 39A and 40A), and (2) a zone of receive data signal LDW traces isolated by isolation LDW traces (e.g., having zone 3094, pattern 3805, pattern 3905 or pattern 4005 of FIGS. 30-34, 38A, 39A and 40A), as compared to (bars 3512) a channel excluding those zones and/or patterns (e.g., channel 3076 without those zones and patterns).

In some cases, FIG. 35A shows bar chart 3500 graphing first vertical bars 3512 for or representing eye height for a channel 3076 excluding: zones 3092 and 3094; pattern 3800 and 3805; patterns 3900 and 3905; or patterns 4000 and 4005, and thus having a channel length equal to horizontal length L302 (e.g., ranging from 1-10 mm), plus vertical height H304' (e.g., H304-H301), plus vertical height H305' (e.g., H305-H301) (e.g., between circuits 3072 and 3074; 3872A-B; 3972A-B; or 4072A-B). In some cases, it also shows second vertical bars 3514 for or representing eye height for a channel having: (1) a zone of transmit data signal LDW traces isolated by isolation LDW traces and with length L301, L3011 or L30111 of 400 um (e.g., of FIGS. 30-34, 38A, 39A and 40A), and (2) a zone of receive data signal LDW traces isolated by isolation LDW traces and with length L303, L3031 or L30311 of 400 um (e.g., of FIGS. 30-34, 38B, 39B and 40B), as compared to (bars 3512) a channel excluding those zones and/or patterns (e.g., channel 3076 without those zones and patterns). Thus, bars 3514 are for a data signal channel having a data signal channel length equal to horizontal length 400 um (e.g., L301, L3011 or L30111), plus L302 (e.g., ranging from 1-10 mm), plus 400 um (e.g., L303, L3031 or L30311), plus vertical height H304, plus vertical height H305 (e.g., between circuits 3072 and 3074).

Chart 3500 has vertical axis 3524 of eye height minimum 3510 between 0 and 200 mV; and a horizontal axis 3522 showing the package routing length (mm) of length L302. As shown in the LDW trace effective package channel length area 3530 of chart 3500, where axis 3522 is between 1 and 5 mm, the eye height minimum or vertical axis 3524 is greater in height by at least 10 percent for bars 3514 than for bars 3512. Notably, at length 3522 of L302 of 5 mm, bar 3514 is above 150 mV and appears to be at least 45% greater in height than bar 3512 which is below 120 mV.

FIG. 35B shows an example of a bar chart eye width minimum 3560 performance comparison 3550 of a data signal channels of FIG. 35A. FIG. 35B shows a bar chart eye width 3550 performance comparison 3560 of (bars 3564) a data signal channel (e.g., channel 3076) having: (1) a zone of transmit data signal LDW traces isolated by isolation LDW traces (e.g., having zone 3092, pattern 3800, pattern 3900 or pattern 4000 of FIGS. 30-34, 38A, 39A and 40A), and (2) a zone of receive data signal LDW traces isolated by isolation LDW traces (e.g., having zone 3094, pattern 3805, pattern 3905 or pattern 4005 of FIGS. 30-34, 38A, 39A and 40A), as compared to (bars 3562) a channel excluding those zones and/or patterns (e.g., channel 3076 without those zones and patterns).

Chart 3550 has vertical axis 3574 of eye width minimum between 0 and 250 ps (pico seconds); and a horizontal axis 3522 (e.g., same as FIG. 35A). As shown in the LDW trace effective package channel length area 3530 of chart 3550, where axis 3522 is between 1 and 5 mm, the eye width minimum or vertical axis 3574 is within 5 percent in height for bars 3514 and 3512. Notably, at length 3522 of L302 of 5 mm, bar 3564 is appears to be equal in height to that of bar 3512.

In some cases, FIGS. 35A-B show the performance comparison results indicate that a data signal channel having (1) a zone of transmit data signal LDW traces isolated by isolation LDW traces, and (2) a zone of receive data signal LDW traces isolated by isolation LDW traces effectively improves the minimum eye opening by up to 50 percent (e.g., see FIG. 35A) while maintaining eye width margins for 1-5 mm package channel length (e.g., L302) for a data signal having a speed for frequency of 4.3 Gpbs data rate and 26 IO/mm routing density, as compared to a channel excluding zones of transmit and receive data signal LDW traces isolated by isolation LDW traces (e.g., channel 3076 without zones 3092 and 3094). In some cases, the "Gpbs data rate" is a data rate or data transfer rate of how many bit can be transferred in 1 second at a single wire or an input or output (IO) wire, channel or trace. In some cases, the "IO/mm" is a routing density of how many wires (IO wires) can be routed out in a single layer in 1 mm height.

Figure 36A:
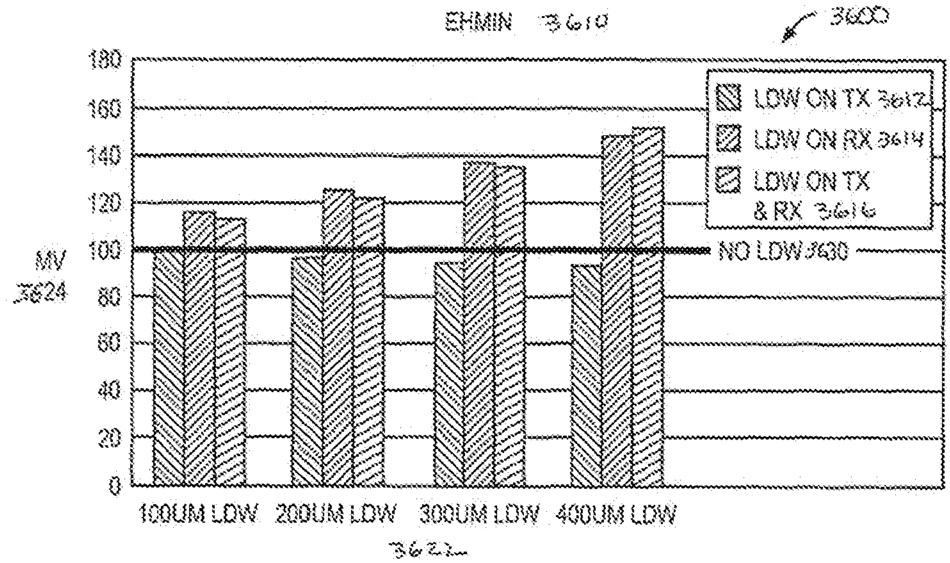
FIG. 36A shows an example of a bar chart eye height minimum performance comparison of a data signal channel having various transmit chip and/or receive chip isolated data signal LDW trace lengths for a channel between a transmit chip and a receive chip that have data signal LDW traces isolated by isolation LDW traces only on the transmit chip, only on the receive chip, and on both the receive and transmit chips.
Figure 36B:
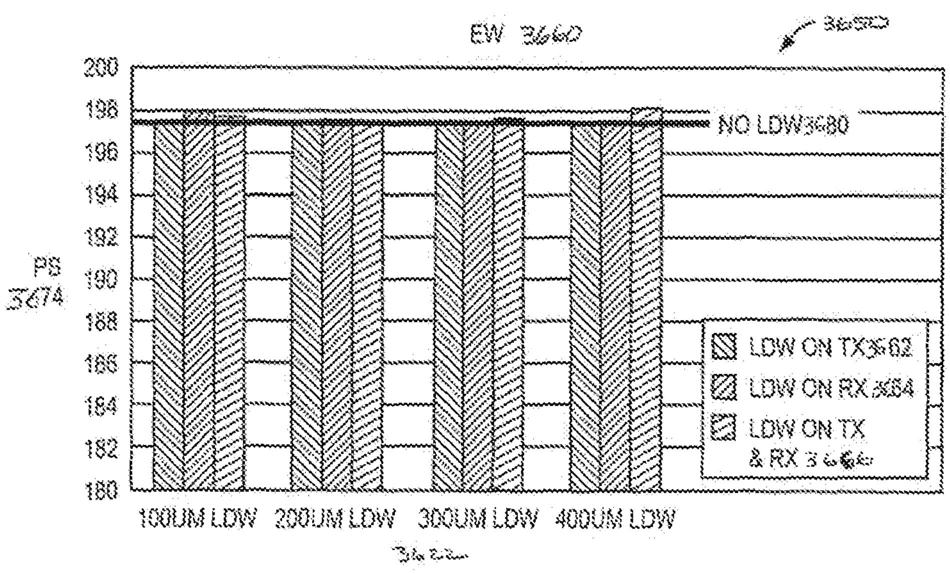
FIG. 36B shows an example of a bar chart eye width minimum performance comparison of a data signal channels of FIG. 36A.

FIGS. 36A-B may be example results from or related to (e.g., laboratory or test) experiments or simulations that show eye height and eye width comparison for an electronic system having a transmit chip and a receive chip that can (or are) communicate high speed data signals through a chip package using a data signal channel having transmit chip and/or receive chip (e.g., "isolated") data signal LDW traces isolated by isolation LDW traces (e.g., having on-package features described herein), for (1) a channel having various trace length isolated data signal LDW traces only on the transmit chip (e.g., no LDW traces on the receive chip); (2) a channel having various trace length isolated data signal LDW traces only on the receive chip (e.g., no LDW traces on the transmit chip); and (3) a channel having various trace length isolated data signal LDW traces on both the receive and transmit chips (e.g., with all other sizes, lengths, widths, heights, etc. being the same). FIG. 36A shows an example of a bar chart eye height minimum 3610 performance comparison 3600 of a data signal channel having various transmit chip and/or receive chip isolated data signal LDW trace lengths for a channel between a transmit chip and a receive chip that have data signal LDW traces isolated by isolation LDW traces, for (1) isolated data signal LDW traces only on the transmit chip (e.g., not on the receive chip); (2) isolated data signal LDW traces only on the receive chip (e.g., not on the transmit chip); and (3) isolated data signal LDW traces on both the receive and transmit chips (e.g., with all other sizes, lengths, widths, heights, etc. being the same).

FIG. 36A shows a bar chart eye height minimum performance comparison of a data signal channel (e.g., channel 3076) having: (1) a zone of transmit data signal LDW traces isolated by isolation LDW traces (e.g., having zone 3092, pattern 3800, pattern 3900 or pattern 4000 of FIGS. 30-34, 38A, 39A and 40A), and/or (2) a zone of receive data signal LDW traces isolated by isolation LDW traces (e.g., having zone 3094, pattern 3805, pattern 3905 or pattern 4005 of FIGS. 30-34, 38A, 39A and 40A), for a fixed or predetermined package routing length L302 of 4 mm.

FIG. 36A shows bar chart 3600 graphing first vertical bars 3612 for or representing eye height for a data signal channel (e.g., channel 3076) having (1) a zone of transmit data signal LDW traces isolated by isolation LDW traces (e.g., having zone 3092, pattern 3800, pattern 3900 or pattern 4000 of FIGS. 30-34, 38A, 39A and 40A), but excluding (2) a zone of receive data signal LDW traces isolated by isolation LDW traces (e.g., not including zone 3094, pattern 3805, pattern 3905 or pattern 4005 of FIGS. 30-34, 38A, 39A and 40A), for a fixed or predetermined package routing length L302 of 4 mm. Bars 3612 may be for a data signal channel having a channel length equal to horizontal length L301, L3011 or L30111 (e.g., between 100 and 400 um), plus length L302 (e.g., of 4 mm), plus vertical height H304, plus vertical height H305, but excluding length L303, L3031 or L30311 (e.g., between circuits 3072 and 3074, or the like). In some cases, bars 3612 are for isolated data signal LDW routing only including zone 3092 (or pattern 3800, pattern 3900 or pattern 4000) on chip 3008, but excluding zone 3094 (or pattern 3805, pattern 3905 or pattern 4005) on chip 3009. In some cases, the data signal channel length for bars 3612 may be similar to that shown in FIGS. 30-32, 33 and 38-40, for a data signal channel 3076 without zone 3094, pattern 3805, pattern 3905 or pattern 4005 of FIGS. 30-34, 38A, 39A and 40A FIG. 36A shows bar chart 3600 graphing second vertical bars 3614 for or representing eye height for a data signal channel (e.g., channel 3076) excluding (1) a zone of transmit data signal LDW traces isolated by isolation LDW traces (e.g., excluding zone 3092, pattern 3800, pattern 3900 or pattern 4000 of FIGS. 30-34, 38A, 39A and 40A), but having (2) a zone of receive data signal LDW traces isolated by isolation LDW traces (e.g., including zone 3094, pattern 3805, pattern 3905 or pattern 4005 of FIGS. 30-34, 38A, 39A and 40A), for a fixed or predetermined package routing length L302 of 4 mm. Bars 3614 may be for a data signal channel having a channel length equal to horizontal length L303, L3031 or L30311 (e.g., between 100 and 400 um), plus length L302 (e.g., of 4 mm), plus vertical height H304, plus vertical height H305, but excluding length L301, L3011 or L30111 (e.g., between circuits 3072 and 3074, or the like). In some cases, bars 3614 are for isolated data signal LDW routing only including zone 3094 (or pattern 3805, pattern 3905 or pattern 4005) on chip 3009, but excluding zone 3092 (or pattern 3800, pattern 3900 or pattern 4000) on chip 3008. In some cases, the data signal channel length for bars 3614 may be similar to that shown in FIGS. 30-32, 33 and 38-40, for a data signal channel 3076 without zone 3092, pattern 3800, pattern 3900 or pattern 4000 of FIGS. 30-34, 38A, 39A and 40A FIG. 36A shows bar chart 3600 graphing third vertical bars 3616 for or representing eye height for a data signal channel (e.g., channel 3076) having (1) a zone of transmit data signal LDW traces isolated by isolation LDW traces (e.g., having zone 3092, pattern 3800, pattern 3900 or pattern 4000 of FIGS. 30-34, 38A, 39A and 40A), and having (2) a zone of receive data signal LDW traces isolated by isolation LDW traces (e.g., including zone 3094, pattern 3805, pattern 3905 or pattern 4005 of FIGS. 30-34, 38A, 39A and 40A), for a fixed or predetermined package routing length L302 of 4 mm. Bars 3616 may be for a data signal channel having a channel length equal to horizontal length L301, L3011 or L30111 (e.g., between 100 and 400 urn), plus length L302 (e.g., of 4 mm), plus vertical height H304, plus vertical height H305, plus length L303, L3031 or L30311 (e.g., between circuits 3072 and 3074, or the like). In some cases, bars 3616 are for isolated data signal LDW routing including both zone 3092 (or pattern 3800, pattern 3900 or pattern 4000) on chip 3008; and including zone 3094 (or pattern 3805, pattern 3905 or pattern 4005) on chip 3009. In some cases, the data signal channel length for bars 3616 may be similar to that shown in FIGS. 30-32, 33 and 38-40, for a data signal channel 3076 with zone 3092, pattern 3800, pattern 3900 or pattern 4000; and with zone 3094, pattern 3805, pattern 3905 or pattern 4005 of FIGS. 30-34, 38A, 39A and 40A. In some cases, the data signal channel length for bars 3612 may be similar to that shown in FIGS. 30-32 and 33, for channel 3076 (e.g., length CL, such as of FIG. 33).

Chart 3600 has vertical axis 3624 of eye height minimum 3610 between 0 and 180 mV. Chart 3600 has horizontal axis 3622 showing trace lengths of 100 um, 200 um, 300 um and 400 um for lengths L301 (or L3011 or L30111) and/or L303 (or L3031 or L30311 of between 100 um and 400 mm) for isolated data signal LDW traces on the transmit chip and/or receive chip, respectively. Horizontal line 3630 represents the system without isolated data signal LDW traces on the transmit chip and receive chip, such as where the channel length is equal to 4 mm (e.g., L302), plus H304 plus H305, and there are not data signal LDW traces or trace lengths.

As shown, for trace lengths between 100 um and 400 um of axis 3622 having isolated data signal LDW traces on the receive chip; or transmit chip and receive chip, the eye height minimum or vertical axis 3624 is greater in height by between 10 and 50 percent (e.g., for bars 3614 and 3616 than for bars 3612). Also, as shown, for trace lengths of 300 um and 400 um of axis 3622 having isolated data signal LDW traces on the receive chip; or transmit chip and receive chip, the eye height minimum or vertical axis 3624 is greater in height by at least 40 and 50 percent respectively (e.g., for bars 3614 and 3616 than for bars 3612). Notably, at length 3622 of L301 and L303 of 400 um, bars 3614 and 3616 are above 140 mV and appear to be at least 50% greater in height than bar 3612 which is below 100 mV.

It can also be seen in each case, having the receive zone 3094 (or pattern 3805, pattern 3905 or pattern 4005); or transmit and receive zones 3092 (or pattern 3800, pattern 3900 or pattern 4000) and 3094 (or pattern 3805, pattern 3905 or pattern 4005), result in a larger eye height minimum 3610 than does the system or channel 3076 without the receive zone as shown by bars 3612; or without the transmit plus receive zone as shown by line 3630. It is also noted that for a 400 mm length L301 and of length L303, the eye height minimum (e.g., bar 3616) is above 150 millivolts (mV) as compared to being below 100 millivolts when there is no LDW length L303; or no length L301 and L303 (e.g., where zone 3094; or 3092 and 3094 do not exist).

FIG. 36B shows an example of a bar chart eye width minimum 3660 performance comparison 3650 of a data signal channels of FIG. 36A. FIG. 36B shows bar chart 3650 graphing first vertical bars 3662 for or representing eye width for a data signal channel excluding zone 3094 (or pattern 3805, pattern 3905 or pattern 4005), and thus having a channel length equal to horizontal length L301, L3011 or L30111 (e.g., between 100 and 400 um), plus length L302 (e.g., of 4 mm), plus vertical height H304, plus vertical height H305, but excluding length L303, L3031 or L30311 (e.g., between circuits 3072 and 3074, or the like). It also shows second vertical bars 3664 for or representing eye width for a data signal channel excluding zone 3092 (or pattern 3800, pattern 3900 or pattern 4000), and thus having a channel length equal to a horizontal length excluding length L301, L3011 or L30111 (e.g., between 100 and 400 um), but having length L302 (e.g., of 4 mm), plus length L303, L3031 or L30311 (e.g., between 100 and 400 um), plus vertical height H304, plus vertical height H305 (e.g., between circuits 3072 and 3074, or the like). It also shows third vertical bars 3666 for or representing eye width for a data signal channel including zones 3092 (or pattern 3800, pattern 3900 or pattern 4000) and 3094 (or pattern 3805, pattern 3905 or pattern 4005); and thus having a channel length equal to horizontal length L301, L3011 or L30111, plus length L302 (e.g., of 4 mm), plus length L303, L3031 or L30311 (e.g., between 100 and 400 um), plus vertical height H304, plus vertical height H305 (e.g., between circuits 3072 and 3074, or the like).

Chart 3650 has vertical axis 3674 of eye width minimum 3660 between 180 and 200 ps (pico seconds); and a horizontal axis 3622 (e.g., same as FIG. 36A). Horizontal line 3680 represents the system without isolated data signal LDW traces on the transmit chip and receive chip, such as where the channel length is equal to 4 mm (e.g., L302), plus H304 plus H305, and there are not data signal LDW traces or trace lengths.

As shown, for trace lengths between 100 um and 400 um of axis 3622 having isolated data signal LDW traces on the transmit chip and/or receive chip, the eye width minimum or vertical axis 3674 is within 0.5 percent in height for bars 3612, 3614 and 3616. For example, the height for bars 3612, 3614 and 3616 are all at or within 1 percent of line 3680, or 197 ps (Pico seconds). Notably, the variation of width 3660 appears to be less than 0.5 percent or zero; except at length 3622 of L301 and L303 of 400 um, where bar 3666 is appears to be 1 percent greater in height to that of bars 3612 and 3614.

In some cases, FIGS. 36A-B show the performance comparison results indicate that the minimum eye opening improvement is linearly proportional to the length of isolated data signal LDW routing for a data signal channel having zone 3094 (or pattern 3805, pattern 3905 or pattern 4005) (e.g., improvement in height 3610 is linearly proportional to length L303); or zones 3092 (or pattern 3800, pattern 3900 or pattern 4000) and 3094 (or pattern 3805, pattern 3905 or pattern 4005) (e.g., improvement in height 3610 is linearly proportional to length L301 plus L303) for an increase of up to 50 percent (e.g., see FIG. 36A) while maintaining eye width margins for fixed 4 mm package channel length (e.g., L302) for a data signal having a speed for frequency of 4.3 Gpbs data rate and 26 IO/mm routing density, as compared to a channel excluding zone 3094; or excluding zones 3092 and 3094 (e.g., channel 3076 without zones 3094). In some cases, the "Gpbs data rate" is a data rate or data transfer rate of how many bit can be transferred in 1 second at a single wire or an input or output (IO) wire, channel or trace. In some cases, the "IO/mm" is a routing density of how many wires (10 wires) can be routed out in a single layer in 1 mm height.

Figure 37:
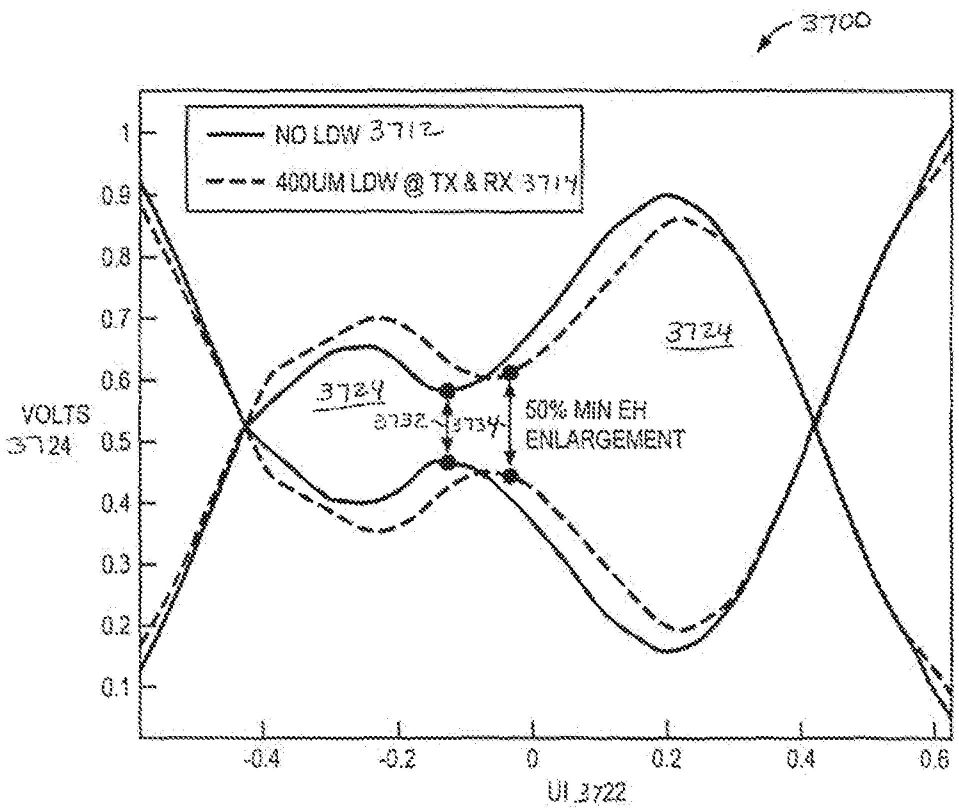
FIG. 37 shows an example of an eye diagram performance comparison of data signal channels having a 4 mm channel routing length of the package and 400 um trace lengths of isolated data signal LDW traces on both the receive and transmit chips, as compared to not having any isolated data signal LDW traces on either chip.

FIG. 37 may be example results from or related to (e.g., laboratory or test) experiments or simulations that show an eye diagram comparison for an electronic system having a transmit chip and a receive chip that can (or are) communicate high speed data signals through a chip package using (1) a data signal channel having transmit chip and receive chip (e.g., "isolated") data signal LDW traces isolated by isolation LDW traces (e.g., having on-package features described herein), as compared to (e.g., with all other sizes, lengths, widths, heights, etc. being the same) (2) a data signal channel excluding LDW traces (e.g., excluding such on-package features) for a set or predetermined 4 mm channel routing length (e.g., L302) of the package; and a set or predetermined 400 um trace length (e.g., for each of L301 and L303) for isolated data signal LDW traces on both the receive and transmit chips (e.g., with all other sizes, lengths, widths, heights, etc. being the same).

FIG. 37 shows an example of an eye diagram performance comparison of (1) a data signal channel having a 4 mm channel routing length (e.g., L302) of the package; and 400 um trace lengths (e.g., for L301, L3011 or L30111, as well as for L303, L3031 or L30311) of isolated data signal LDW traces on both the receive and transmit chips (e.g., as diagram 3714), as compared to (2) a channel having a 4 mm channel routing length (e.g., L302) of the package but not having any (e.g., excluding) isolated data signal LDW traces on both the receive and transmit chips (e.g., as diagram 3712) (e.g., with all other sizes, lengths, widths, heights, etc. being the same). FIG. 37 shows diagram 3700 having vertical y-axis 3724 indicating the amplitude of the output signal measured (e.g., "eye width") of eye diagram performance signals 3712 and 3714 when the test signal is applied to the data signal channel (e.g., channel 3076); or at the output contact of circuit 3072 (or the like), the input contact of circuit 3074 (or the like), trace 3033, trace 3035, trace 3037, bump 3018, or or 3019. X-axis 3722 is a time scale mapping the an in-phase version of output data signals 3712 and 3714 measured (e.g., "eye height") when the output signals are time synchronized to be in phase such that the step up and step down test signals would normally form a rectangle or square, but form the central hexagon shaped "eye" 3724. Eye 3724 has y-axis eye-height minimum represented by its vertical distance along axis 3724 within eye 3724; and x-axis eye-width minimum represented by its horizontal distance along axis 3722 within eye 3724.

Thus, eye diagram performance signals 3714 may be the output of or for (1) a data signal channel having a 4 mm channel routing length (e.g., L302) of the package; and 400 um trace lengths (e.g., for L301, L3011 or L30111, as well as for L303, L3031 or L30311) of isolated data signal LDW traces on both the receive and transmit chips. Also, thus, eye diagram performance signals 3712 may be the output of or for (2) a channel having a 4 mm channel routing length (e.g., L302) of the package but not having any (e.g., excluding) isolated data signal LDW traces on both the receive and transmit chips (e.g., with all other sizes, lengths, widths, heights, etc. being the same for system 3070).

In some cases, FIG. 37 shows an example of eye diagram 3714 for a data signal channel (e.g., channel 3076) having zone 3092 (or pattern 3800, pattern 3900 or pattern 4000) (e.g., having isolated transmit data signal LDW traces isolated by isolation LDW traces, both with length L301, L3011 or L30111 of 400 um) and zone 3094 (or pattern 3805, pattern 3905 or pattern 4005) (e.g., having isolated receive data signal LDW traces isolated by isolation LDW traces, both with length L303, L3031 or L30311 of 400 um), as compared to eye diagram 3712 for a data signal channel excluding zones 3092 (or pattern 3800, pattern 3900 or pattern 4000) and 3094 (or pattern 3805, pattern 3905 or pattern 4005). In some cases, diagram 3714 may be for a data signal channel having a channel length equal to that of a data signal channel (e.g., channel 3076) having zone 3092 (or pattern 3800, pattern 3900 or pattern 4000) with length L301, L3011 or L30111 of 400 um; zone 3094 (or pattern 3805, pattern 3905 or pattern 4005) with length L303, L3031 or L30311 of 400 um; and a package routing length L302 equal to 4 mm. Thus, diagram 3714 may be for a data signal channel having a data signal channel length equal to: horizontal length 400 um (e.g., L301, L3011 or L30111), plus horizontal length 400 um (e.g., L303, L3031 or L30311), plus package routing horizontal length 4 mm (e.g., plus L302), plus vertical height H304, plus vertical height H305 (e.g., between circuits 3072 and 3074; or the like). In some cases, diagram 3712 may be for a data signal channel having a channel length equal to horizontal length L302 (e.g., 4 mm), plus vertical height H304, plus vertical height H305 (e.g., between circuits 3072 and 3074; or the like) (e.g., channel 3076 without zones 3092 (or pattern 3800, pattern 3900 or pattern 4000) or 3094 (or pattern 3805, pattern 3905 or pattern 4005)).

Diagram 3700 has vertical axis 3724 of eye height minimum between 0.1 and 0.9 Volts; and a horizontal axis 3722 showing the unit increments (UI) of between −0.4 and 0.6. in some cases, "unit increments" is a unit interval, or UI that is equal to 1/data rate (e.g., as known in the art). As shown in diagram 3700, there is a vertical eye height "funnel point" 3732 having vertical axis 3724 height 0.9 Volts (e.g., from 4.8 to 5.9 Volts) for eye diagram 3712 at or close to UI value −0.16 of horizontal axis 3722. Also, as shown in diagram 3700, there is a vertical eye height "funnel point" 3734 having vertical axis 3724 height 1.5 Volts (e.g., from 4.5 to 6.0 Volts) for eye diagram 3714 at or close to UI value −0.05 of horizontal axis 3722. The funnel point minimum eye height expansion from eye 3712 to eye 3714 represents approximately a 50% minimum eye height increase or enlargement is gained by using 400 mm isolated transmit and receive data signal LDW traces (e.g., zones 3092 (or pattern 3800, pattern 3900 or pattern 4000) and 3094 (or pattern 3805, pattern 3905 or pattern 4005)) on both the transmit and receive chips 3008 and 3009 (e.g., shown as eye signal 3714), as opposed to not having any of the isolated data signal LDW traces (e.g., shown as eye signal 3712) for package horizontal channel length L302 of 4 mm.

It can be appreciated that an eye diagram (e.g., as shown in FIG. 37) can be a common indicator of the quality of signals in high-speed digital transmissions (e.g., along data signal channels described herein, such as including channel 3076 or 3076B). An oscilloscope can be used to generate an eye diagram by overlaying sweeps of different segments of a long data stream driven by a master clock. The triggering edge may be positive or negative, but the displayed pulse that appears after a delay period may go either way; there is no way of knowing beforehand the value of an arbitrary bit. Therefore, when many such transitions have been overlaid, positive and negative pulses are superimposed on each other (e.g., as shown by signals 3712 and 3714 in FIG. 37). Overlaying many bits produces an eye diagram, so called because the resulting image looks like the opening of an eye (e.g., as shown by eye 3724, though not such a well shaped "eye" due to funnel points 3732 and 3734 in FIG. 37).

In an ideal world, eye diagrams (e.g., as shown by signals 3712 and 3714 in FIG. 37) would look like rectangular boxes. In reality, communications are imperfect, so the transitions do not line perfectly on top of each other, and an eye-shaped pattern results (e.g., as shown by eye 3724 in FIG. 37). On an oscilloscope, the shape of an eye diagram will depend upon various types of triggering signals (e.g., input test signals), such as clock triggers, divided clock triggers, and pattern triggers. Differences in timing and amplitude from bit to bit cause the eye opening to shrink.

Also, for data links operating at gigahertz transmission frequencies (e.g., chip 3008, chip 3009 or system 3070), variables that can affect the integrity of signals (e.g., the shape, EW and EH of the eye) can include: (e.g., data signal LDW traces of zones 3092 (or pattern 3800, pattern 3900 or pattern 4000) and/or 3094 (or pattern 3805, pattern 3905 or pattern 4005)) transmission-line effects; impedance mismatches; signal routing; termination schemes; grounding schemes; interference from other signal lines, connectors, and cables; and when signals on adjacent pairs of signal lines toggle, crosstalk among those signals on those lines can interfere with other signals on those lines (e.g., on data signal channels described herein, such as including channel 3076 or 3076B).

FIGS. 38A-40B show embodiments of some patterns of switched buffer (SB) data signal LDW trace pairs, according to embodiments. They may demonstrate the SB pattern examples to implement various routing lengths (e.g., data signal channel lengths) of LDW structures for cascading with data signal channels, without having to grow die size. They may show SB pattern example solutions designed to switch a pair of circuit buffers from their original locations directly on (e.g., under and at the same horizontal X,Y plane location) the solder bump surface contact pads, to exchange that own original location with the location of the other buffers pad by rout back to corresponding other buffers pad using LDW routing. In some cases, for targeted package and chip (e.g., silicon) technologies (e.g., see FIGS. 35A-40B), SB patterns allow feasible LDW trace length the range of (100 um-2 mm) increased trace routing length as compared to surface (e.g., "exit" data signal surface contact) pitch length PL30 (e.g., LDW trace length the range of 150 to 450 um) and allow sufficient on-die isolation.

FIGS. 38A-40B shows cross-sectional bottom views (e.g., through bottom surface 3103 of chip 3008 and/or bottom surface 3203 of chip 3009) of some patterns of chip "on-die" interconnection feature zones having data signal LDW traces between pairs of surface contacts and data signal circuits/buffers with switched X,Y horizontal locations (e.g., "switch buffer or SB pairs") in levels LV2-LV4, according to embodiments. It is noted that the bottom view of FIGS. 38A, 39A and 40A embodiments from the perspective of looking upwards in FIGS. 30A-32B and 34A (and the same perspective as FIG. 34B), such as a perspective viewing exposed bottom surfaces 3103 of chip 3008 and/or 3203 of chip 3009. Thus, the descriptions of levels LV1, LV2, LV3, LV4, LM and LN for FIGS. 38A, 39A and 40A may be in a reverse or inverted order (e.g., using bottommost for the top of the paper) as compared to looking down at the page, or as compared to the top of FIGS. 30A-32B, 38B, 39B and 40B. More specifically, the descriptions of FIGS. 38A, 39A and 40A may refer to level LV1 as a bottom (e.g., bottom most or lower) level as opposed to a top (e.g., topmost or upper) level LN such as shown for FIGS. 30A-32B, 38B, 39B and 40B. Similarly, the descriptions of FIGS. 38A, 39A and 40A may refer to level LV2 as above level LV1, level LV3 as above level LV2, level LV4 as above level LV3, level LM as above level LV4, and level LN as above level LM (e.g., ascending order in height) as opposed level LV2 as below level LV1, level LV3 as below level LV2, level LV4 as below level LV3, level LM as below level LV4, and level LN as below level LM (e.g., descending order in height) such as shown for FIGS. 30A-32B, 38B, 39B and 40B.

Figure 38A:
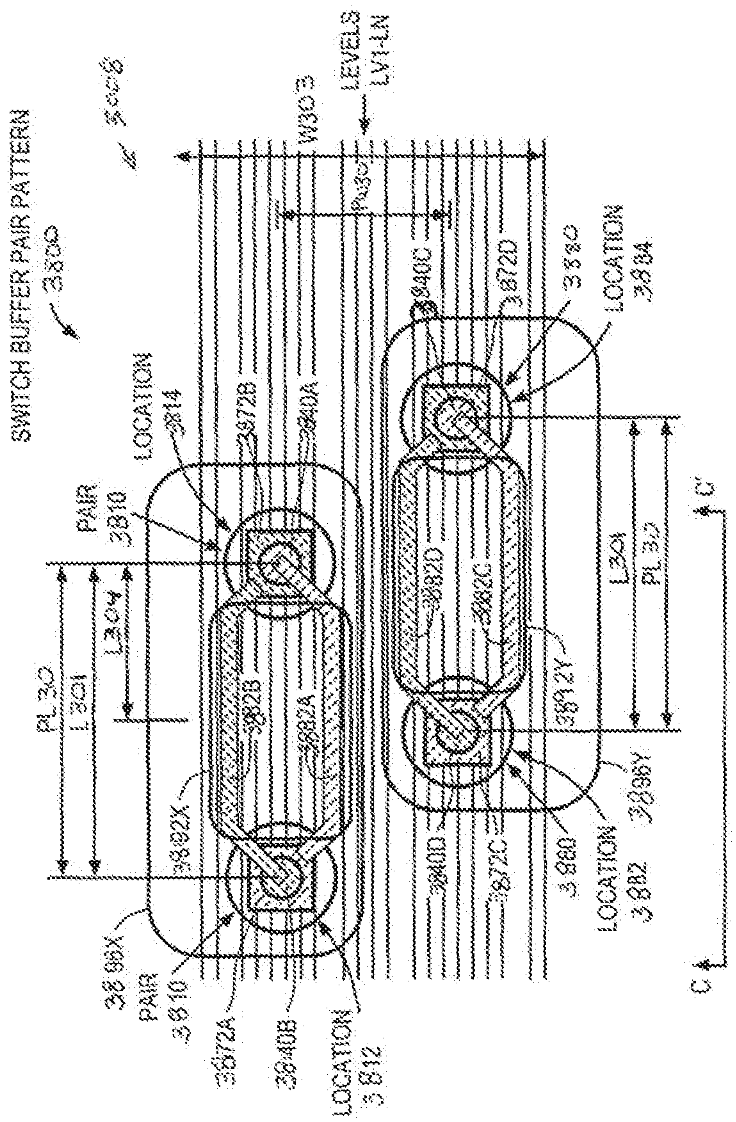
FIG. 38A shows a cross-sectional bottom view of some patterns of 2 chip "on-die" interconnection feature zones, each having single surface contact pitch length switched buffer (SB) data signal LDW traces, according to embodiments.

FIG. 38A shows a cross-sectional bottom view of some patterns of 2 chip "on-die" interconnection feature zones, each having single surface contact pitch length switched buffer (SB) data signal LDW traces, according to embodiments. FIG. 38A shows a cross-sectional bottom view of pattern 3800 having chip "on-die" interconnection feature zones 3896X and 3896Y with single surface contact X,Y pitch length (PL30) switched buffer (SB) data signal LDW trace pairs 3810 and 3860 respectively. In some cases of pattern 3800, length L301 is equal to length PL30. Embodiment 3800 shows the location of a transmit circuit (e.g., circuit 3072) and transmit contact (e.g., contact 3040) of 2 data signal LWD traces have been switched, reversed, or otherwise had their locations exchanged in zone 3896X and 3896Y.

Pattern 3800 is shown having first chip "on-die" interconnection feature zone 3896X which includes zone 3892X and first switch buffer (SB) pair 3810. SB pair 3810 may be or include a SB pair of data signal transmit (or receive) circuits. In some cases, SB pair 3810 also includes a switched buffer (SB) pair of surface bump contacts. SB pair 3810 may describe a "single pitch" or "1-pitch" SB data signal LDW trace embodiment of chip on-die interconnect features (e.g., where length L301 is equal to length PL30).

Pair 3810 may include signal data LDW trace 3882A physically and electronically coupling transmit circuitry 3872A (on the left of zone 3896X) to transmit contact 3840A (on the right of the zone 3896X). Pair 3810 may also include signal data LDW trace 3882B physically and electronically coupling transmit circuitry 3872B (on the right of zone 3896X) to transmit contact 3840B (on the left of the zone 3896X). In some cases, such transmit contacts 3840A and B may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW trace 3882A or B physically and electronically coupling transmit circuitry 3872A or B to transmit contact 3840A or B may be part of a channel 3076 or 3076B, such as described for transmit contacts 3040 or receive contacts 3030 as described for FIGS. 30-37. In some cases, such a channel includes having transmit contact 3840A or B physically and electronically coupled to corresponding surface contact at a location of a package (e.g., package 3010) using solder bumps (e.g., bumps 3018 or 3019), such as described for transmit contacts 3040 or receive contacts 3030 as described for FIGS. 30-37.

In some cases, such a channel includes a channel from (e.g., between) circuit 3872A or B of chip 3008 and through zone 3896X on chip 3008, bumps 3018, traces 3033, traces 3035, traces 3037, bumps 3019, and to zone 3098 on chip 3009 to circuit 3074 of chip 3009. In some cases, such a channel includes a channel from (e.g., between) circuit 3072 of chip 3008 and through zone 3096 on chip 3008, bumps 3018, traces 3033, traces 3035, traces 3037, bumps 3019, and to zone 3896X on chip 3009 to circuit 3874A or B (e.g., represented by 3872A or B and functioning like 3074) of chip 3009 (e.g., see FIG. 38B). In some cases, such a channel includes a channel from (e.g., between) circuit 3872A or B of chip 3008 and through zone 3896X on chip 3008, bumps 3018, traces 3033, traces 3035, traces 3037, bumps 3019, and to zone 3896X on chip 3009 to circuit 3874A or B (e.g., represented by 3872A or B and functioning like 3074) of chip 3009 (e.g., see FIG. 38B).

FIG. 38A may show a cross-sectional "bottom" or upward looking view such as shown for FIGS. 30 and 34B that includes vertical level LV1 (e.g., an exposed surface of bottommost level LV1 of zone 3896X representing surface 3103 of zone 3096 and/or surface 3203 of zone 3098); vertical level LV2 (or LSML); vertical level LM and vertical level LN. In some cases, contacts 3840A-B are on level LV1, traces 3882A-B are on level LV2 (or LSML), and circuits 3872A-B are on level LN (e.g., such as shown for corresponding contacts 3040, traces 3082 and circuits 3072 of FIGS. 31A and 34).

In some cases, level LSML is an LV2 or LSML level that is the level directly above (e.g., having level LV1 formed onto and touching level LSML) and closest to exposed bottom surface 3103 or 3203). In this case, levels LSML (e.g., LV2) is vertically disposed in between level LV1 and LM (e.g., such as shown for corresponding levels of FIGS. 31-32 and 34).

It is also considered that one or both of trace pairs 3882A-B and 3882C-D may be on level LV3 (e.g., LSML−1) (and the other traces on level LV2), such as described above for level LV2.

In some cases, contact 3840A is on level LV1, at the same horizontal X,Y location 3814 as circuit 3872B which is on level LN and disposed above contact 3840A at the same horizontal X,Y location 3814. Also, in some cases, contact 3840B is on level LV1, at the same horizontal X,Y location 3812 as circuit 3872A which is on level LN and disposed above contact 3840B at the same horizontal X,Y location 3812.

In some cases, having contact 3840A and circuit 3872B at the same horizontal X,Y location 3814; and having contact 3840B and circuit 3872A at the same and different horizontal X,Y location 3812 may be described as switching, reversing, or otherwise exchanging the locations of a data signal transmit (or receive) circuit (e.g., circuit 3872A and B) and of a transmit (or receive) contact (e.g., contact 3840B and A) of (e.g., coupled by) 2 data signal LWD traces.

FIG. 38A represents isolation LDW traces and other structures of levels LV1-LN (e.g., as described herein, such as with respect to FIGS. 30-34) with the shading or lines (e.g., green colored lines) indicated by the label "Levels LV1-LN".

In some cases, zones 3896X and 3892X may include isolation LDW traces isolating traces 3882A and 3882B from horizontally adjacent (e.g., on the same level such as level LV2/LSML) data signal traces (including any adjacent ones of traces 3882A, 3882B, 3882C and 3882D), such as described for isolation LDW traces 3084 (e.g., and 3084G and 3084P) as described for FIGS. 30-37. These isolation LDW traces may be show in FIG. 38A as green lengthwise lines or shading between the signal LDW traces 3982A, 3982B, 4282A and 4282B. Such isolation LDW traces may extend parallel to and between trace 3882A and 3882B thus electronically isolating (e.g., data signals transmitted on, when zone 3896X represents zone 3092; or data signals received on, when zone 3896X represents zone 3094) horizontally adjacent pair of data signal LDW trace 3882A from trace 3882B (e.g., as described herein). In some cases, such isolation LDW traces may also electronically isolate horizontally adjacent pair of data signal LDW trace 3882B from trace 3882A. In some cases, more isolation LDW traces may extend parallel to and between each of traces 3882A and 3882B, and another horizontally adjacent data signal LDW trace to shield each of traces 3882A and 3882B from the other horizontally adjacent data signal LDW traces.

In some cases, such isolation LDW traces may also be physically and electronically coupled to isolation signal traces and surface contacts, such as described for isolation traces 3172 and 3174 (e.g., and 3172G or P; and 3174G or P) and contacts 3020 (e.g., and 3020G or P) as described for FIGS. 30-37. In some cases, such isolation surface contacts may be physically and electronically coupled to corresponding isolation contacts of a package using solder bumps (e.g., bumps 3018 or 3019), such as described for isolation contacts 3020 (e.g., and 3020G or P) as described for FIGS. 30-37.

Although not show in FIG. 38A, for cases when zone 3896X represents zone 3092 of chip 3008, it can be appreciated that in some cases, zone 3896X may include (1) structure (e.g., one or more via contacts on level LM) vertically attaching one end of traces 3882A and 3882B to transmit circuitry 3872A and 3872B, respectively; and (2) structure (e.g., one or more via contacts on level LV1) vertically attaching the opposing end of traces 3882A and 3882B to transmit contacts 3840A and 3840B, respectively, such as described for vertically attaching trace 3082 to transmit circuitry 3072 and to transmit contact 3040 as described for FIGS. 30-37 (e.g., see FIGS. 31A and 34). Although not show in FIG. 38A, (1) via contacts similar to 3142 and 3242 (e.g., a via contact on level LM) may physically, vertically attach (e.g., so they are touching) one end of traces 3882A and 3882B to transmit circuitry 3872A and 3872B, respectively; and (2) via contacts similar to 3152 and 3252 (e.g., a via contact on level LV1) may physically, vertically attach a second end of traces 3882A and 3882B to transmit contacts 3840A and 3840B, respectively, such as described for vertically attaching trace 3082 to transmit circuitry 3072 and to transmit contact 3040 as described for FIGS. 31A and 34.

Figure 38B:
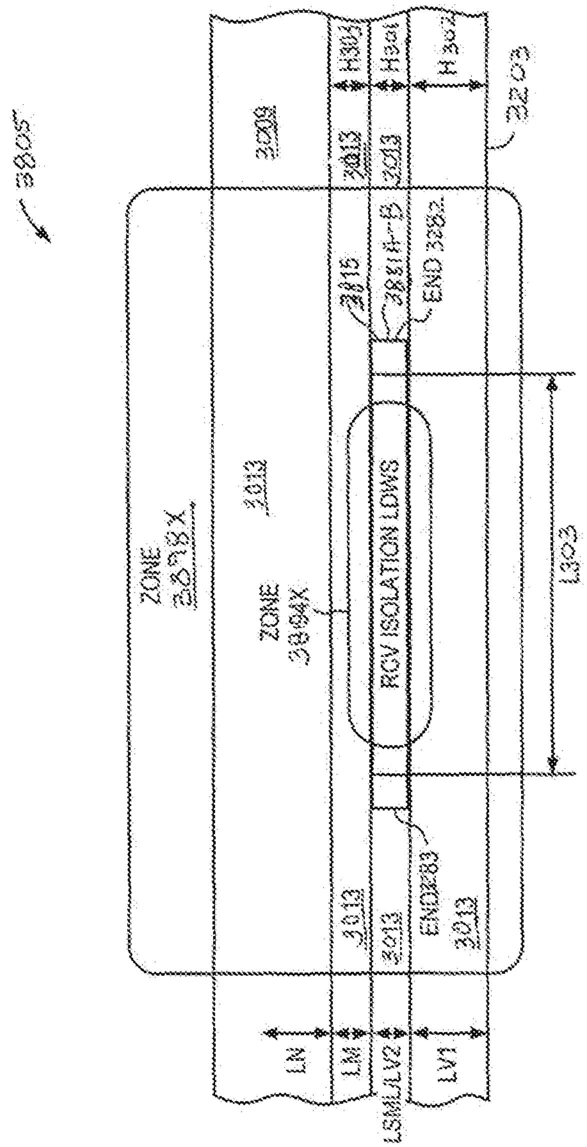
FIG. 38B shows a cross-sectional side view of some patterns of 2 chip "on-die" interconnection feature zones, each having single surface contact pitch length switched buffer (SB) data signal LDW traces, according to embodiments.

FIG. 38B shows a cross-sectional side view of some patterns of 2 chip "on-die" interconnection feature zones, each having single surface contact pitch length switched buffer (SB) data signal LDW traces, according to embodiments. The side view of FIG. 38B may be similar to that through perspective C-C' shown in FIG. 38A for an embodiment of a SB receive data signal LDW trace pair (e.g., as explained for FIG. 38A).

FIG. 38B shows a cross-sectional side view of a receive data signal LDW trace pattern 3805 similar to pattern 3800 having chip "on-die" interconnection feature zones 3898X and 3894X with single surface contact X,Y pitch length (PL30) switched buffer (SB) receive data signal LDW trace pair 3815 (e.g., traces 3881A-B) similar to pair 3810 for chip 3009 for an embodiment of a SB receive data signal LDW trace pair (e.g., as explained for FIG. 38A). In some cases, length L303 is equal to length PL30.

Pattern 3805 does not show the location of the two receive circuits (e.g., circuits 3874A-B, located similar to 3872A-B of FIG. 38A and functioning similar to circuit 3074) or of the two receive contacts (e.g., contacts 3830A-B, located similar to 3840A-B of FIG. 38A and functioning similar to contact 3030). The locations of receive circuits 3874A-B and contacts 3830A-B of 2 data signal LWD traces 3881A-B of FIG. 38B have been switched, reversed, or otherwise had their locations exchanged in zone 3898X and 3894X, similar to the description for circuits 3872A-B and contacts 3840A-B of FIG. 38A.

SB pair 3815 may describe a "single pitch" or "1-pitch" SB data signal LDW trace embodiment of chip on-die interconnect features (e.g., where length L301 is equal to length PL30). Pair 3815 may include signal data LDW trace 3881A physically and electronically coupling receive circuitry 3874A (not shown but on the left end of trace 3881A and on the left of zone 3898X) to receive contact 3830A (not shown but on the right end of trace 3881A and on the right of the zone 3898X). Pair 3815 may also include signal data LDW trace 3881B physically and electronically coupling receive circuitry 3874B (not shown but on the right end of trace 3881B and on the right of zone 3898X) to receive contact 3830B (not shown but on the left end of trace 3881B and on the left of the zone 3898X). In some cases, such receive contacts 3830A and B may be physically and electronically coupled to corresponding transmit contacts at a location of a package (e.g., package 3010) using solder bumps (e.g., bumps 3019), such as described for transmit contacts 3030 as described for FIGS. 30-38A. Pair 3815 (e.g., traces 3881A-B) may be on level LSML or LV2; and have height H301 and length L303. In some cases, length L303 is the same length as described for embodiments of length L301.

In some cases, isolated signal data LDW trace 3881A or B physically and electronically coupling receive circuitry 3874A or B to receive contact 3830A or B may be part of a channel 3076 or 3076B, such as described for receive contacts 3030 as described for FIGS. 30-38A. In some cases, such a channel includes a channel from (e.g., between) circuit 3872A or B of chip 3008 and through zone 3896X on chip 3008, bumps 3018, traces 3033, traces 3035, traces 3037, bumps 3019, and to zone 3898X on chip 3009 to circuit 3874A-B of chip 3009. In some cases, such a channel includes a channel from (e.g., between) circuit 3072 of chip 3008 and through zone 3096 on chip 3008, bumps 3018, traces 3033, traces 3035, traces 3037, bumps 3019, and to zone 3896X on chip 3009 to circuit 3874A or B of chip 3009.

FIG. 38B shows a case when zone 3894X represents zone 3094 of chip 3009 and may include (1) structure (e.g., one or more via contacts on level LM) vertically attaching one end of traces 3881A and 3881B to receive circuitry 3874A-B (e.g., represented by 3872A and 3872B in FIG. 38A, respectively); and (2) structure (e.g., one or more via contacts on level LV1) vertically attaching the opposing end of traces 3881A and 3881B to receive contacts 3830A-B (e.g., represented by 3840A and 3840B in FIG. 38A, respectively), such as described for vertically attaching trace 3081 to receive circuitry 3074 and to receive contact 3030 as described for FIGS. 30-38A (e.g., see FIGS. 32A and 34). Although not show in FIG. 38A, (1) via contacts similar to 3144 and 3244 (e.g., a via contact on level LM) may physically, vertically attach (e.g., so they are touching) one end (e.g., end 3283 or 3282, respectively) of traces 3881A and 3881B to receive circuitry 3874A-B (e.g., represented by 3872A and 3872B in FIG. 38A, respectively); and (2) via contacts similar to 3154 and 3254 (e.g., a via contact on level LV1) may physically, vertically attach a second end (e.g., end 3282 or 3283, respectively) of traces 3882A and 3882B to receive contacts 3830A-B (e.g., represented by 3840A and 3840B in FIG. 38A, respectively), such as described for vertically attaching trace 3081 receive circuitry 3074 and to receive contact 3030 as described for FIGS. 32A, 34 and 38A.

Trace 3882A and 3882B may each also be "isolated" data signal LDW traces that are electronically isolated or shielded from adjacent data signal LDW traces on the same level (e.g., LV2 or LSML) by isolation LDW traces (represented by shading or green lines of FIG. 38A within width W303) such as described for traces 3084 and 3083 shielding traces 3082 and 3081 respectively.

Although not show in FIG. 38A-B, it can be appreciated that in some cases, zone 3896X may include (1) structure (e.g., one or more via contacts such as 3144 and/or 3244 on level LM) vertically attaching one end of the isolation LDW traces to isolation traces and (2) structure (e.g., one or more via contacts such as 3154 and/or 3254 on level LV1) vertically attaching the opposing end of the isolation LDW traces to isolation contacts, such as described for vertically attaching trace 3084 and/or 3083 to isolation traces 3172 and/or 3174, and to isolation contacts 3020 and/or 3020, respectively as described for FIGS. 30-37 (e.g., see FIGS. 31B, 32B and 34).

Trace 3882A and 3882B may each have length L301, width W301 and height H301 such as described for trace 3081 and 3082. Zone 3896X, or a number of zones 3896X may extend widthwise across a portion of width W303 of a chip (e.g., such as chip 3008 or 3009).

According to embodiments, zone 3896X may represent zone 3096 or 3098; and zone 3892X may represent zone 3092 or 3094 (e.g., as described for FIGS. 30-37). Here, trace 3882A may represent trace 3082 or trace 3081, physically and electronically attaching transmit circuitry 3072 or receive circuitry 3074 (on the left of zone 3896X) to transmit contact 3040 or receive contact 3030, respectively (on the right of the zone 3896X). In some cases, here, trace 3882A may represent one of trace 3082 or trace 3081, physically and electronically attaching a transmit circuit or receive circuit 3074 (on the right of zone 3896X) to a transmit contact 3040 or a receive contact 3030, respectively (on the left of the zone 3896X).

According to embodiments, zone 3896X may represent zone 3096 and 3098; and zone 3892X may represent zone 3092 and 3094 (e.g., as described for FIGS. 30-37). Here, trace 3882A may be a representation of both trace 3082 and trace 3081, physically and electronically attaching transmit circuitry 3072 and receive circuitry 3074 (on the left of zone 3896X) to transmit contact 3040 and receive contact 3030, respectively (on the right of the zone 3896X). In some cases, here, trace 3882A may represent both of trace 3082 and trace 3081, physically and electronically attaching a transmit circuit and receive circuit 3074 (on the right of zone 3896X) to a transmit contact 3040 and a receive contact 3030, respectively (on the left of the zone 3896X).

According to embodiments, the two chips 3008 and 3009 will have corresponding X,Y lengthwise bump patters similar to pattern 3800 so that the channel length of each location (e.g., of a contact 3840A and 3840B) is the same between the chips.

In some cases, pattern 3800 has second chip "on-die" interconnection feature zone 3896Y which includes zone 3892Y for second switch buffer (SB) pair 3880. In some cases, zone 3896Y is widthwise adjacent to zone 3896X along width W303. SB pair 3880 may be or include a SB pair of data signal transmit (or receive) circuits similar to that described for zone 3896X. In some cases, SB pair 3880 also includes a switched buffer (SB) pair of surface bump contacts similar to that described for zone 3896X. SB pair 3880 may describe a "single pitch" or "1-pitch" SB data signal LDW trace embodiment of chip on-die interconnect features (e.g., where length L301 is equal to length PL30) similar to that described for zone 3896X.

Pair 3880 may include signal data LDW trace 3882C physically and electronically coupling transmit circuitry 3872D (on the left of zone 3896Y) to transmit contact 3840D (on the right of the zone 3896X). Pair 3880 may also include signal data LDW trace 3882D physically and electronically coupling transmit circuitry 3872D (on the right of zone 3896Y) to transmit contact 3840D (on the left of the zone 3896Y). In some cases, such transmit contacts 3840C and D may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, pair 3880 and zones 3896Y and 3892Y: (1) perform the same functions (e.g., for data signal LDW: traces, functions, transmission and receiving) as, (2) have the same dimensions (e.g., width and height) as, (3) have the same relative locations (e.g., length L301 is the same between location 3882 and 3884 as the length between location 3812 and 3814) as, (4) have the same length between data signal circuits and contacts (e.g., the length L301 of traces 3882C and D are PL30), have the same isolation (e.g., traces 3882C and D are isolated by isolation LDW traces from other data signal LDW traces on the same level LV2 or LSML) as, (5) are located in the same chips (e.g., chip 3008 and/or 3009) as, (6) are in the same levels (e.g., surface contacts in level LV1, traces 3882C and D in level LV2 or LSML, data circuits in level LN) as, (7) have the same additional via contacts (e.g., see FIGS. 31-32 and 34) as, (8) are part of channels similar and having lengths equal to (e.g., see channels 3076 and 3076B; and lengths CL and CL2) those of pair 3090 and zones 3896X and 3892X, respectively.

In some cases, pair 3880 and zones 3896Y and 3892Y are different than pair 3090 and zones 3896X and 3892X, respectively because location 3882 and 3884 are X,Y offset widthwise by pitch width PW30 and offset lengthwise by half pitch length PL30 from locations 3812 and 3814, respectively.

In some cases, traces 3882D and 3882A (e.g., zones 3896Y and 3896X) are each also "isolated" data signal LDW traces that are electronically isolated or shielded from each other (represented by shading of figure within width W303) on the same level (e.g., LV2 or LSML) by isolation LDW traces (e.g., such as described for traces 3084 and 3083 shielding traces 3082 and 3081 respectively). In some cases, these isolation LDW traces may be one or more traces disposed widthwise between (e.g., along width W303, such as at a midpoint of pitch width PW30) and extending lengthwise along where length L301 overlaps for traces 3882D and 3882A.

In some cases, there can be many SB pairs 3810 and 3880, such as on chip 3008 or 3009. According to embodiments, there can be many SB pairs 3810 or 3880 on chip 3008 or 3009, as there are pairs of 2 adjacent data signal LDW traces (e.g., pair of two of traces 3082 or 3081) on chip 3008 or 3009.

In some cases, the multiple SB pairs 3810 and 3880 on chip 3008 or 3009 can extend parallel to each other, X,Y lengthwise (e.g., along the direction of length L301) and are X,Y horizontally adjacent widthwise (e.g., along width W303). In some cases, the multiple SB pairs 3810 and 3880 on chip 3008 or 3009 can extend parallel to each other, lengthwise (e.g., along L301) and have X,Y pitch width PW30 horizontally between adjacent widthwise ones of SB pairs 3810 and 3880 (e.g., along width W303). In some cases, PW30 depends on the min center-to-center bump or surface contact pitch in this design. In some cases, PW30 between 110-130 um. In some cases, PW30 is between 79-103 um. In some cases, PW30 can be between 50-150 um.

In some cases, the multiple SB pairs 3810 and 3880 on chip 3008 or 3009 can extend parallel to each other, X,Y lengthwise (e.g., along L301); be horizontally adjacent X,Y widthwise (e.g., along width W303); and be offset X,Y lengthwise (e.g., have location 3814 offset with respect to location 3882 and/or 3884 along direction of length L301) by length L304. In some cases, L304 may be ½ pitch length PL30 (and in this case ½ length L301). Such an offset may put one horizontal X,Y location 3814 of a circuit and surface contact of a first SB pair 3810 at the X,Y lengthwise midpoint between the two horizontal X,Y locations 3882 and 3884 of the circuits and surface contacts of a second SB pair 3880. In some cases, the offset may be ⅕ length PL30, ¼ length PL30, or ⅓ pitch length PL30. In some cases there may be no offset and the two horizontal X,Y locations of the circuits and surface contacts of both pair of SB pairs 3810 and 3880 are lengthwise aligned, and side by side along width W303.

Figure 39A:
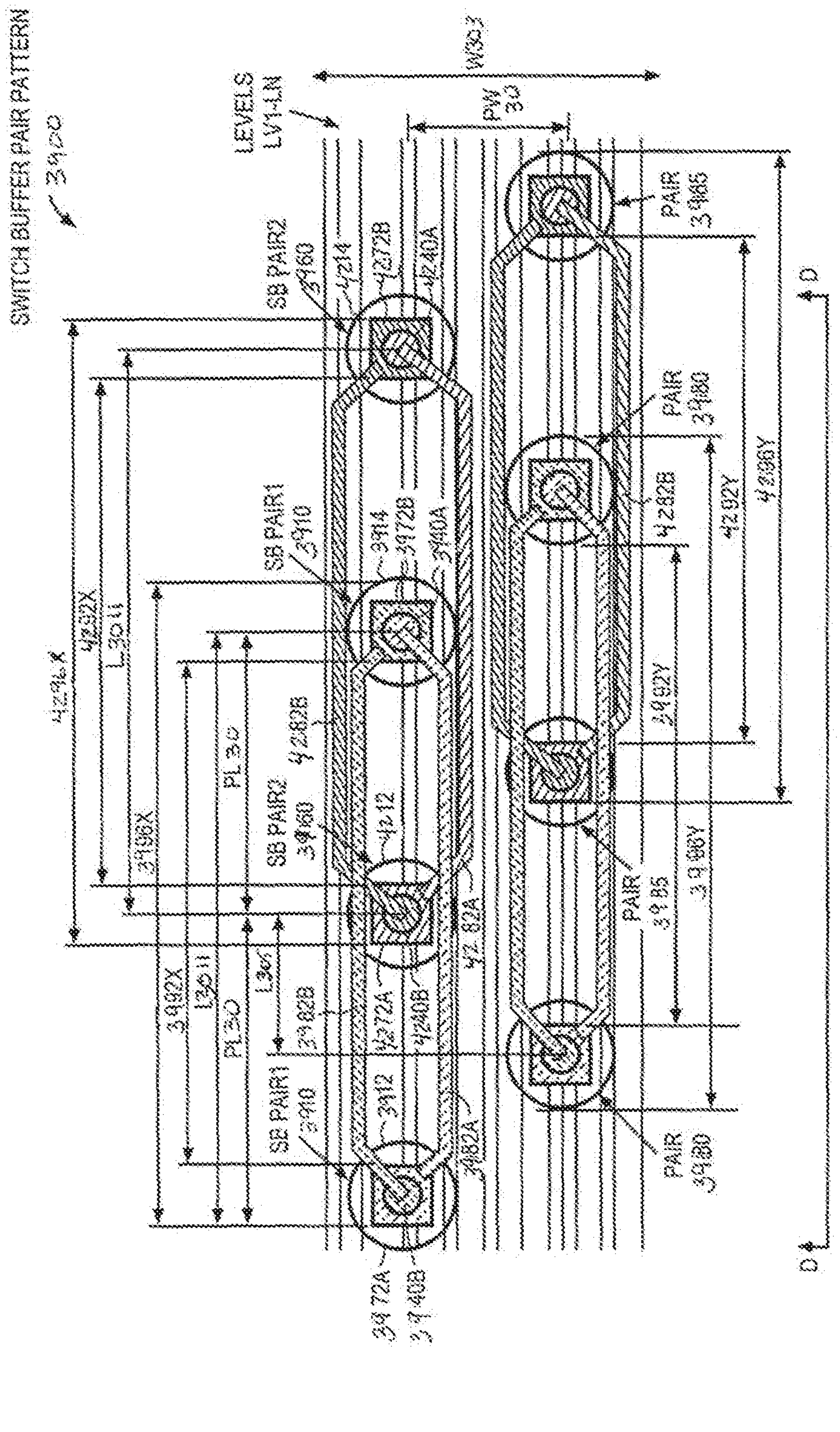
FIG. 39A shows a cross-sectional bottom view of some patterns of 4 chip "on-die" interconnection feature zones, each zone having double surface contact pitch length switched buffer (SB) data signal LDW traces, according to embodiments.

FIG. 39A shows a cross-sectional bottom view of some patterns of 4 chip "on-die" interconnection feature zones, each zone having double surface contact pitch length switched buffer (SB) data signal LDW traces, according to embodiments.

FIG. 39A shows a cross-sectional bottom view of pattern 3900 having chip "on-die" interconnection feature zones 3996X, 4296X, 3996Y and 4296Y with double surface contact pitch length (PL30) switched buffer (SB) data signal LDW trace pairs. Zones 3996X and 4296X are shown having an "upper row" (e.g., located above pairs 3980 and 3985 along direction W303 in FIG. 39A) of double surface contact pitch length (PL30) switched buffer (SB) data signal LDW trace pairs 3910 and 3960 respectively. In some cases, row of SB data signal LDW trace pairs 3910 and 3960 (1) extend in a lengthwise "row" of multiple SB data signal LDW trace pair along the direction of length L3011, and are (2) at a single widthwise "column" of data signal LDW traces along width W303. In some cases, upper row of SB data signal LDW trace pairs 3910 and 3960, extend in a row at a column as noted, that are widthwise above zones 3996Y and 4296Y which are shown having a "lower row" of double surface contact PL SB data signal LDW trace pairs similar to "upper row" pairs 3910 and 3960 respectively, but in a lower "row" of pattern 3900 as shown. In some cases of pattern 3900, length L3011 is equal to twice or 2X length PL30. Embodiment 3900 may show the location of a transmit circuit (e.g., circuit 3072) and transmit contact (e.g., contact 3040) of 4 data signal LWD traces have been switched, reversed, or otherwise had their locations exchanged in zones 3996X+4296X and zones 3996Y+4296Y.

Pattern 3900 is shown having first chip "on-die" interconnection feature zone 3996X which includes zone 3992X and first switch buffer (SB) pair 3910. SB pair 3910 may be or include a SB pair of data signal transmit (or receive) circuits. In some cases, SB pair 3910 also includes a switched buffer (SB) pair of surface bump contacts. SB pair 3910 may describe a "double pitch" or "2×-pitch" SB data signal LDW trace embodiment of chip on-die interconnect features (e.g., where length L3011 is equal to twice or 2×length PL30).

Pair 3910 may include signal data LDW trace 3982A physically and electronically coupling transmit circuitry 3972A (on the left of zone 3996X) to transmit contact 3940A (on the right of the zone 3996X). Pair 3910 may also include signal data LDW trace 3982B physically and electronically coupling transmit circuitry 3972B (on the right of zone 3996X) to transmit contact 3940B (on the left of the zone 3996X). In some cases, such transmit contacts 3940A and B may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW trace 3982A or B physically and electronically coupling transmit circuitry 3972A or B to transmit contact 3940A or B may be part of a channel 3076 or 3076B, such as described for transmit contacts 3040 or receive contacts 3030 as described for FIGS. 30-37. In some cases, such a channel includes having transmit contact 3940A or B physically and electronically coupled to corresponding surface contact at a location of a package (e.g., package 3010) using solder bumps (e.g., bumps 3018 or 3019), such as described for transmit contacts 3040 or receive contacts 3030 as described for FIGS. 30-37.

In some cases, such a channel includes a channel from (e.g., between) circuit 3972A or B of chip 3008 and through zone 3996X on chip 3008, bumps 3018, traces 3033, traces 3035, traces 3037, bumps 3019, and to zone 3098 on chip 3009 to circuit 3074 of chip 3009. In some cases, such a channel includes a channel from (e.g., between) circuit 3072 of chip 3008 and through zone 3096 on chip 3008, bumps 3018, traces 3033, traces 3035, traces 3037, bumps 3019, and to zone 3996X on chip 3009 to circuit 3974A or B (e.g., represented by 3972A or B and functioning like 3074) of chip 3009 (e.g., see FIG. 39B). In some cases, such a channel includes a channel from (e.g., between) circuit 3972A or B of chip 3008 and through zone 3996X on chip 3008, bumps 3018, traces 3033, traces 3035, traces 3037, bumps 3019, and to a zone 3996X on chip 3009 to circuit 3974A or B (e.g., represented by 3972A or B and functioning like 3074) of chip 3009 (e.g., see FIG. 39B).

Pattern 3900 is shown also having second chip "on-die" interconnection feature zone 4296X which includes zone 4292X and second switch buffer (SB) pair 3960. SB pair 3960 may be or include a SB pair of data signal transmit (or receive) circuits. In some cases, SB pair 3960 also includes a switched buffer (SB) pair of surface bump contacts. SB pair 3960 may describe a "double pitch" or "2×-pitch" SB data signal LDW trace embodiment of chip on-die interconnect features (e.g., where length L301 is equal to twice or 2×length PL30).

Pair 3960 may include signal data LDW trace 4282A physically and electronically coupling transmit circuitry 4272A (on the left of zone 4296X) to transmit contact 4240A (on the right of the zone 4296X). Pair 3960 may also include signal data LDW trace 4282B physically and electronically coupling transmit circuitry 4272B (on the right of zone 4296X) to transmit contact 4240B (on the left of the zone 4296X). In some cases, such transmit contacts 4240A and B may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW trace 4282A or B physically and electronically coupling transmit circuitry 4272A or B to transmit contact 4240A or B may be part of a channel 3076 or 3076B, such as described for transmit contacts 3040 or receive contacts 3030 as described for FIGS. 30-37. In some cases, such a channel includes having transmit contact 4240A or B physically and electronically coupled to corresponding surface contact at a location of a package (e.g., package 3010) using solder bumps (e.g., bumps 3018 or 3019), such as described for transmit contacts 3040 or receive contacts 3030 as described for FIGS. 30-37.

In some cases, such a channel includes a channel from (e.g., between) circuit 4272A or B of chip 3008 and through zone 4296X on chip 3008, bumps 3018, traces 3033, traces 3035, traces 3037, bumps 3019, and to zone 3098 on chip 3009 to circuit 3074 of chip 3009. In some cases, such a channel includes a channel from (e.g., between) circuit 3072 of chip 3008 and through zone 3096 on chip 3008, bumps 3018, traces 3033, traces 3035, traces 3037, bumps 3019, and to zone 4296X on chip 3009 to circuit 4274A or B (e.g., represented by 4272A or B and functioning like 3074) of chip 3009 (e.g., see FIG. 39B). In some cases, such a channel includes a channel from (e.g., between) circuit 4272A or B of chip 3008 and through zone 4296X on chip 3008, bumps 3018, traces 3033, traces 3035, traces 3037, bumps 3019, and to zone 4296X on chip 3009 to circuit 4274A or B (e.g., represented by 4272A or B and functioning like 3074) of chip 3009 (e.g., see FIG. 39B).

FIG. 39A may show a cross-sectional "bottom" or down looking view such as shown for FIGS. 30, 34B and 38A that includes (1) vertical level LV1 (e.g., an exposed surface of bottommost level LV1 of zones 3996X and 4296X representing surface 3103 of zone 3096 and/or surface 3203 of zone 3098); (2) vertical levels LV2 and LV3 (or LSML level and LSML−1 level); (3) vertical level LM and vertical level LN. In some cases, contacts 3940A-B and 4240A-B are on level LV1; traces 3982A-B and 4282A-B are on vertical levels LV2 and LV3 (LSML level and LSML−1 level); and circuits 3972A-B and 4272A-B are on level LN (e.g., such as shown for corresponding contacts 3040, traces 3082 and circuits 3072 of FIGS. 31A and 34).

In some cases, level LSML is an LV2 or LSML level that is the level vertically directly above (e.g., having level LV1 formed onto and touching level LSML) and closest to exposed bottom surface 3103 or 3203); and levels LSML−1 is an LV3 (or LSML minus one level) level that is the level directly above (e.g., having level LV2 formed onto and touching level LSML−1) and closest to level LSML or LV2. In this case, levels LSML (e.g., LV2) and LSML−1 (e.g., LV3) are in between level LV1 and LM (e.g., such as shown for corresponding levels of FIGS. 31-32 and 34).

In some case, traces 3982A-B are on either vertical level LV2 or LV3 (LSML level or LSML−1 level) and traces 4282A-B of SB pair 4296X are also on either vertical level LV2 or LV3 (LSML level or LSML−1 level). In some case, traces 3982A-B are on one of vertical levels LV2 or LV3 (LSML level or LSML−1 level) because traces 4282A-B of SB pair 4296X are on a different one of either vertical level LV2 or LV3 (LSML level or LSML−1 level). In some cases, traces 3982A-B are on a different level of levels LV2 or LV3 (LSML level or LSML−1 level) because location 4262 of pair 3960 is located between locations 3912 and 3914 of pair 3910 so that traces 3982A-B can extend between locations 3912 and 3914 (e.g., from and between contact 3940A-B and circuit 3972A-B) without physically contacting traces 4282A-B (which would create an undesired electronic short between traces 4282A-B and traces 3982A-B). In some case, traces 3982A-B are on vertical level LV2 (LSML level) and traces 4282A-B of SB pair 4296X are on vertical level LV3 (LSML−1 level). In some case, traces 4282A-B are on vertical level LV2 (LSML level) and traces 3982A-B of SB pair 3996X are on vertical level LV3 (LSML−1 level).

It is also considered that either of traces 3982A-B or traces 4282A-B may be on level LV2 and the other traces on level LV4 (e.g., LSML−2), such as described above for levels LV2 and LV3.

In some cases, contact 3940A is on level LV1, at the same horizontal X,Y location 3914 as circuit 3972B which is on level LN and disposed vertically directly above contact 3940A at the same horizontal X,Y location 3914. Also, in some cases, contact 3940B is on level LV1, at the same horizontal X,Y location 3912 as circuit 3972A which is on level LN and disposed vertically above contact 3940B at the same horizontal X,Y location 3912.

In some cases, having contact 3940A and circuit 3972B at the same horizontal X,Y location 3914; and having contact 3940B and circuit 3972A at the same and different horizontal X,Y location 3912 may be described as switching, reversing, or otherwise exchanging the locations of a data signal transmit (or receive) circuit (e.g., circuit 3972A and B) and of a transmit (or receive) contact (e.g., contact 3940B and A) of (e.g., coupled by) 2 data signal LWD traces.

In some cases, contact 4240A is on level LV1, at the same horizontal X,Y location 4214 as circuit 4272B which is on level LN and disposed above contact 4240A at the same horizontal X,Y location 4214. Also, in some cases, contact 4240B is on level LV1, at the same horizontal X,Y location 4212 as circuit 4272A which is on level LN and disposed above contact 4240B at the same horizontal X,Y location 4212.

In some cases, having contact 4240A and circuit 4272B at the same horizontal X,Y location 4214; and having contact 4240B and circuit 4272A at the same and different horizontal X,Y location 4212 may be described as switching, reversing, or otherwise exchanging the locations of a data signal transmit (or receive) circuit (e.g., circuit 4272A and B) and of a transmit (or receive) contact (e.g., contact 4240B and A) of (e.g., coupled by) 2 data signal LWD traces.

In some case, horizontal X,Y location 3914 is X,Y lengthwise between (and lengthwise offset by pitch length PL30) horizontal X,Y locations 4212 and 4214 of SB pair 4296X at the same widthwise X,Y location; and horizontal X,Y location 4212 is X,Y lengthwise between (and lengthwise offset by pitch length PL30) horizontal X,Y locations 3912 and 3914 of SB pair 3996X at the same widthwise X,Y location. In some cases, SB pair 3910 and 3960 are two SB pair (e.g., pair 3910 and 3960) having lengthwise X,Y interleaved or alternating locations that are lengthwise offset by pitch length PL30 (e.g., of surface contacts and data signal circuits/buffers attached by data signal LDW traces) at the same widthwise X,Y location. In some cases, right side X,Y location 3914 of pair 3910 is lengthwise X,Y is interleaved or alternating with (e.g., and lengthwise offset by pitch length PL30) locations 4212 and 4214 of pair 3960; and left side X,Y location 4214 of pair 3960 is lengthwise X,Y interleaved or alternating with (e.g., and lengthwise offset by pitch length PL30) locations 3912 and 3914 of pair 3910. Such lengthwise X,Y interleaving or alternating may describe a "rung", "ladder", "zipper" or "switchback" or "zigzag" pattern (lengthwise offset by pitch length PL30) of two upper SB pairs of surface contacts and data signal circuits/buffers locations (e.g., attached by data signal LDW traces).

FIG. 39A represents isolation LDW traces and other structures of levels LV1-LN (e.g., as described herein, such as with respect to FIGS. 30-34) with the shading or lines (e.g., green colored lines) indicated by the label "Levels LV1-LN".

In some cases, zones 3996X and 4296X may include isolation LDW traces isolating each of traces 3982A, 3982B, 4282A and 4282B from any (or all) horizontally adjacent (e.g., on the same level such as level LV2/LSML or level LV3/LSML−1) data signal traces (including any adjacent one of traces 3982A, 3982B, 4282A and 4282B), such as described for isolation LDW traces 3084 (e.g., and 3084G and 3084P) as described for FIGS. 30-37. These isolation LDW traces may be show in FIG. 39 as green lengthwise lines or shading between the signal LDW traces 3982A, 3982B, 4282A and 4282B.

Such isolation LDW traces may extend parallel to and between traces 3982A, 3982B, 4282A and 4282B and any (or all) X,Y widthwise horizontally adjacent data signal LDW traces; thus electronically isolating (e.g., data signals transmitted on, when zones 3996X and 4296X represent zone 3092; or data signals received on, when zones 3996X and 4296X represent zone 3094) traces 3982A, 3982B, 4282A and 4282B from any (or all) X,Y widthwise horizontally adjacent data signal LDW traces (e.g., electronically isolating and shielding the data signal LDW traces as described herein). In some cases, such isolation LDW traces may also electronically isolate an X,Y widthwise horizontally adjacent data signal LDW trace from traces 3982A, 3982B, 4282A and 4282B. In some cases, more isolation LDW traces may extend parallel to and between each of traces 3982A, 3982B, 4282A and 4282B, and another widthwise horizontally adjacent data signal LDW trace to shield each of these traces from a lower pair of SB traces.

In some cases, such isolation LDW traces may also be physically and electronically coupled to isolation signal traces and surface contacts, such as described for isolation traces 3172 and 3174 (e.g., and 3172G or P; and 3174G or P) and contacts 3020 (e.g., and 3020G or P) as described for FIGS. 30-37. In some cases, such isolation surface contacts may be physically and electronically coupled to corresponding isolation contacts of a package using solder bumps (e.g., bumps 3018 or 3019), such as described for isolation contacts 3020 (e.g., and 3020G or P) as described for FIGS. 30-37.

Although not show in FIG. 39A, for cases when zones 3996X and 4296X represent zone 3092 of chip 3008, it can be appreciated that in some cases, zones 3996X and 4296X may include (1) structure (e.g., one or more via contacts on level LM) vertically attaching one end of traces 3982A-B and 4282A-B to transmit circuitry 3972A-B and 4272A-B, respectively; and (2) structure (e.g., one or more via contacts on level LV1) vertically attaching the opposing end of traces 3982A-B and 4282A-B to transmit contacts 3940A-B and 4240A-B, respectively, such as described for vertically attaching trace 3082 to transmit circuitry 3072 and to transmit contact 3040 as described for FIGS. 30-38A (e.g., see FIGS. 31A, 34 and 38A). Although not show in FIG. 39A, (1) via contacts similar to 3142 and 3242 (e.g., a via contact on level LM) may physically, vertically attach (e.g., so they are touching) one end of traces 3982A-B and 4282A-B to transmit circuitry 3972A-B and 4272A-B, respectively; and (2) via contacts similar to 3152 and 3252 (e.g., a via contact on level LV1) may physically, vertically attach a second end of traces 3982A-B and 4282A-B to transmit contacts 3940A-B and 4240A-B, respectively, such as described for vertically attaching trace 3082 to transmit circuitry 3072 and to transmit contact 3040 as described for FIGS. 31A, 34 and 38A.

Figure 39B:
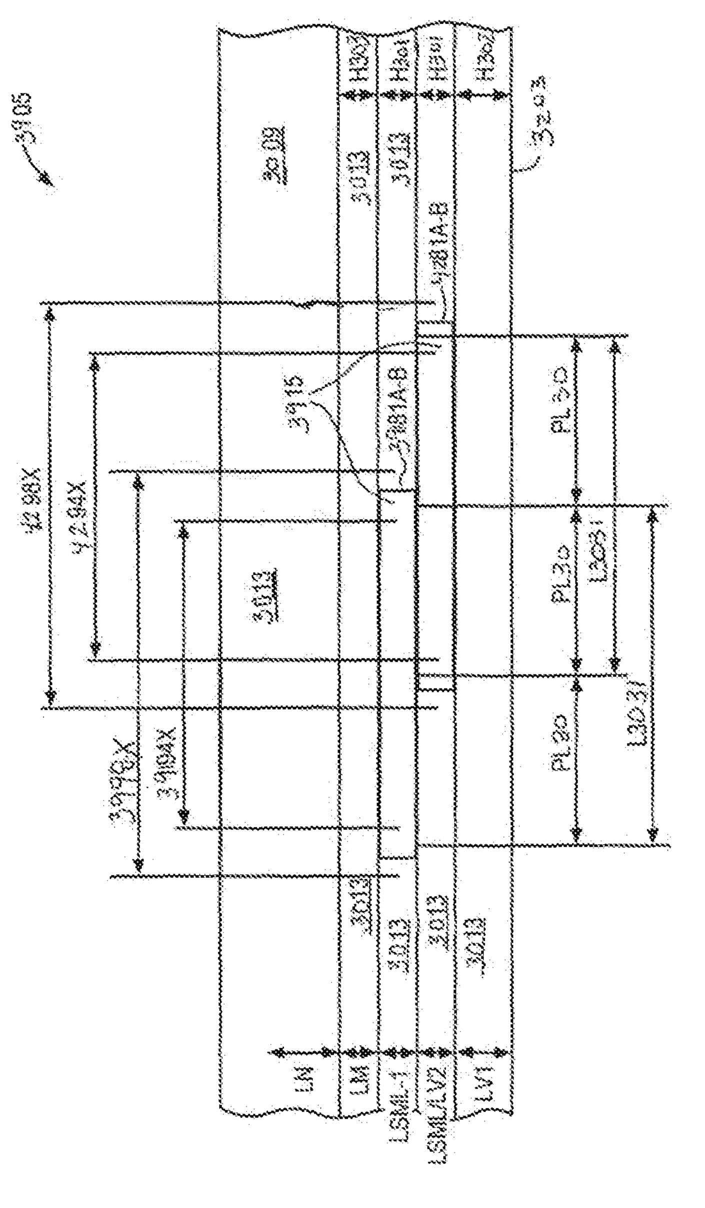
FIG. 39B shows a cross-sectional side view of some patterns of 4 chip "on-die" interconnection feature zones, each having double surface contact pitch length switched buffer (SB) data signal LDW traces, according to embodiments.

FIG. 39B shows a cross-sectional side view of some patterns of 4 chip "on-die" interconnection feature zones, each having double surface contact pitch length switched buffer (SB) data signal LDW traces, according to embodiments. The side view of FIG. 39B may be similar to that through perspective D-D' shown in FIG. 39A for an embodiment of a SB receive data signal LDW trace pair (e.g., as explained for FIG. 39A).

FIG. 39B shows a cross-sectional side view of a receive data signal LDW trace pattern 3905 similar to pattern 3900 having chip "on-die" interconnection feature zone 3894X with double surface contact X,Y pitch length (PL30) switched buffer (SB) receive data signal LDW trace pairs 3915 (e.g., traces 3918A-B and 4281A-B) similar to pairs 3910 and 3960 for chip 3009 for an embodiment of a SB receive data signal LDW trace pair (e.g., as explained for FIG. 39A). In some cases, length L3031 between the circuit and surface contact of each pair is equal to 2×length PL30.

Pattern 3905 does not show the location of the 4 receive circuits (e.g., circuits 3974A-B and 4274A-B, located similar to 3972A-B and 4272A-B of FIG. 39A and functioning similar to circuit 3074) or of the 4 receive contacts (e.g., contacts 3930A-B and 4230A-B, located similar to 3940A-B and 4240A-B of FIG. 39A and functioning similar to contact 3030). The locations of receive circuits 3974A-B and 4274A-B and contacts 3930A-B and 4230A-B of the 4 data signal LWD traces 3918A-B and 4281A-B of FIG. 39B have been switched, reversed, or otherwise had their locations exchanged in zone 3994X, similar to the description for circuits 3972A-B and 4272A-B exchanged with contacts 3940A-B and 4240A-B of FIG. 39A.

SB pairs 3915 describe a "double pitch" or "2-pitch" SB data signal LDW trace embodiment of chip on-die interconnect features (e.g., where length L3031 is equal to 2×length PL30). Pairs 3915 may include signal data LDW trace 3918A physically and electronically coupling receive circuitry 3974A (not shown but on the left end of trace 3918A and on the left of zone 3994X) to receive contact 3930A (not shown but on the right end of trace 3918A and on the right of the zone 3994X). Pair 3915 may also include signal data LDW trace 3918B physically and electronically coupling receive circuitry 3974B (not shown but on the right end of trace 3918B and on the right of zone 3994X) to receive contact 3930B (not shown but on the left end of trace 3918B and on the left of the zone 3994X).

Pairs 3915 may include signal data LDW trace 4281A physically and electronically coupling receive circuitry 4274A (not shown but on the left end of trace 4281A and on the left of zone 3994X) to receive contact 4230A (not shown but on the right end of trace 4281A and on the right of the zone 3994X). Pairs 3915 may also include signal data LDW trace 4281B physically and electronically coupling receive circuitry 4274B (not shown but on the right end of trace 3918B and on the right of zone 3994X) to receive contact 4230B (not shown but on the left end of trace 4281B and on the left of the zone 3994X). In some cases, such receive contacts 3930A-B and 4230A-B may be physically and electronically coupled to corresponding transmit contacts at a location of a package (e.g., package 3010) using solder bumps (e.g., bumps 3019), such as described for transmit contacts 3030 as described for FIGS. 30-39A.

Pairs 3915 (e.g., traces 3918A-B and 4281A-B) may be on levels LV2/LSML and LV3/LSML−1; and each trace may have height H301 and length L3031. In some cases, traces 3918A-B are on level LV3/LSML−1 and traces 4281A-B are on level LV2/LSML (e.g., as shown). In another case, traces 3918A-B are on level LV2/LSML and traces 4281A-B are on level LV3/LSML−1 (e.g., not as shown). In some cases, length L3031 is the same length as described for embodiments of length L3011.

In some cases, each of isolated signal data LDW traces 3918A-B and 4281A-B physically and electronically coupling receive circuitry to a receive contact may be part of a channel 3076 or 3076B, such as described for receive contacts 3030 as described for FIGS. 30-39A. In some cases, such channels include channels from (e.g., between) circuits 3972A-B and 4272A-B of chip 3008 and through zone 3996X on chip 3008, bumps 3018, traces 3033, traces 3035, traces 3037, bumps 3019, and to zone 3994X on chip 3009 to circuits 3974A-B and 4274A-B of chip 3009. In some cases, such channels include channels from (e.g., between) circuits 3072 of chip 3008 and through zone 3096 on chip 3008, bumps 3018, traces 3033, traces 3035, traces 3037, bumps 3019, and to 3994X on chip 3009 to circuit 3974A-B and 4274A-B of chip 3009.

In some cases zones 3996X and 4296X represent zone 3094 of chip 3009. FIG. 39B shows a case when zone 3994X represents zone 3094 of chip 3009 and may include (1) structure (e.g., one or more via contacts on level LM) vertically attaching one end of traces 3918A-B and 4281A-B to receive circuitry 3974A-B and 4274A-B (e.g., represented by 3972A-B and 4272A-B in FIG. 39A, respectively); and (2) structure (e.g., one or more via contacts on level LV1) vertically attaching the opposing end of traces 3918A-B and 4281A-B to receive contacts 3930A-B and 4230A-B (e.g., represented by 3940A-B and 4240A-B in FIG. 39A, respectively), such as described for vertically attaching trace 3081 to receive circuitry 3074 and to receive contact 3030 as described for FIGS. 30-39A (e.g., see FIGS. 32A and 34). Although not show in FIG. 39A, (1) via contacts similar to 3144 and 3244 (e.g., a via contact on level LM) may physically, vertically attach (e.g., so they are touching) one end of traces 3918A-B and 4281A-B to receive circuitry 3974A-B and 4274A-B (e.g., represented by 3972A-B and 4272A-B in FIG. 39A, respectively); and (2) via contacts similar to 3154 and 3254 (e.g., a via contact on level LV1) may physically, vertically attach a second end of traces 3918A-B and 4281A-B to receive contacts 3930A-B and 4230A-B (e.g., represented by 3940A-B and 4240A-B in FIG. 39A, respectively), such as described for vertically attaching trace 3081 receive circuitry 3074 and to receive contact 3030 as described for FIGS. 32A, 34 and 38-39A.

Trace 3982A, 3982B, 4282A and 4282B may each also be "isolated" data signal LDW traces that are electronically isolated or shielded from adjacent data signal LDW traces on the same level (e.g., LV2 or LSML; or LV3 or LSML−1) by isolation LDW traces (represented by shading or green lines of FIG. 39 within width W303) such as described for traces 3084 and 3083 shielding traces 3082 and 3081 respectively.

Although not show in FIG. 39A-B, it can be appreciated that in some cases, zones 3996X and 4296X may include (1) structure (e.g., one or more via contacts such as 3144 and/or 3244 on level LM) vertically attaching one end of the isolation LDW traces to isolation traces; and (2) structure (e.g., one or more via contacts such as 3154 and/or 3254 on level LV1) vertically attaching the opposing end of the isolation LDW traces to isolation contacts, such as described for vertically attaching trace 3084 and/or 3083 to isolation traces 3172 and/or 3174, and to isolation contacts 3020 and/or 3020, respectively as described for FIGS. 30-37 (e.g., see FIGS. 31B, 32B and 34).

Traces 3982A, 3982B, 4282A and 4282B may each have length L3011=twice length L301, width W301 and height H301 such as described for trace 3081 and 3082. Zones 3996X and 4296X, or a number of zones 3996X and 4296X may extend widthwise across a portion of width W303 of a chip (e.g., such as chip 3008 or 3009).

According to embodiments, zones 3996X and 4296X may represent zone 3096 or 3098; and zones 3992X and 4296X may represent zone 3092 or 3094 (e.g., as described for FIGS. 30-37). Here, each of trace 3982A and 4282A may represent one of trace 3082 or trace 3081, physically and electronically attaching transmit circuitry 3072 or receive circuitry 3074 (on the left of zone 3996X and 4296X) to transmit contact 3040 or receive contact 3030, respectively (on the right of the zone 3996X and 4296X). In some cases, here, each of trace 3982A and 4282A may represent one of trace 3082 or trace 3081, physically and electronically attaching a transmit circuit or receive circuit 3074 (on the right of zone 3996X and 4296X) to a transmit contact 3040 or a receive contact 3030, respectively (on the left of the zone 3996X and 4296X).

According to embodiments, zones 3996X and 4296X may represent zone 3096 and 3098; and zones 3992X and 42962 may represent zone 3092 and 3094 (e.g., as described for FIGS. 30-37). Here, each of trace 3982A and 4282A may represent both of trace 3082 and trace 3081, physically and electronically attaching transmit circuitry 3072 and receive circuitry 3074 (on the left of zone 3996X and 4296X) to transmit contact 3040 and receive contact 3030, respectively (on the right of the zone 3996X and 4296X). In some cases, here, each of trace 3982A and 4282A may represent both of trace 3082 and trace 3081, physically and electronically attaching a transmit circuit and receive circuit 3074 (on the right of zone 3996X and 4296X) to a transmit contact 3040 and a receive contact 3030, respectively (on the left of the zone 3996X and 4296X). According to embodiments, the two chips 3008 and 3009 will have corresponding X,Y lengthwise bump patters similar to pattern 3900 so that the channel length of each location (e.g., of a contact 3940A, 3940B, 4240A and 4240B) is the same between the chips.

In some cases, each of pair 3910 and 3960: (1) perform the same functions (e.g., for data signal LDW: traces, functions, transmission and receiving) as, (2) have the same dimensions (e.g., width and height) as, are located in the same chips (e.g., chip 3008 and/or 3009) as, have the same additional via contacts (e.g., see FIGS. 31-32 and 34) as those of pair 3810.

In some cases, each of pair 3910 and 3960 are different than pair 3810 because: (1) locations 3912-3914 and 4212-4214 have relative locations twice as far apart (e.g., length L3011 is twice the length as that between location 3812 and 3814), (2) circuits 3972A-B and contacts 3940A-B have twice the length between locations of data signal circuits and contacts (e.g., the length L3011 of traces 3982A-B and 4282A-B is twice or 2×PL30), (3) more isolation LDW traces are used to isolate traces 3982A-B and 4282A-B from other data signal LDW traces (e.g., on the same level LV2 or LSML, and LV3 or LSML−1), (4) more levels are used (e.g., surface contacts in level LV1; traces 3982A-B and 4282A-B in levels LV2 or LSML, and LV3 or LSML−1; data circuits in level LN), are part of channels similar to but have longer channel lengths by length 2×PL30 (e.g., see channel 3076 and channel 3076B but using length L3011 in place of L301; and lengths CL plus length 2×PL30, and CL2 plus length 1×PL30, respectively). In some cases, embodiments having pair 3910 and 3960 on chip 3008 and 3009 will have channel 3076 with channel length increased from length CL by length 1×PL30 on chip 3008, plus length 1×PL30 on chip 3009. In some cases, embodiments having pair 3910 and 3960 on chip 3008 or 3009 will have channel 3076 with channel length increased from length CL2 by length 1×PL30 on chip 3008 or on chip 3009.

In some cases, pattern 3900 has third chip "on-die" interconnection feature zone 3996Y which includes zone 3992Y for a third switch buffer (SB) pair 3980. In some cases, zone 3996Y is widthwise adjacent to zone 3996X along width W303. SB pair 3980 may be or include a SB pair of data signal transmit (or receive) circuits similar to that described for zone 3996X. In some cases, SB pair 3980 also includes a switched buffer (SB) pair of surface bump contacts similar to that described for zone 3996X. SB pair 3980 may describe a "double pitch" or "2×-pitch" SB data signal LDW trace embodiment of chip on-die interconnect features (e.g., where length L3011 is equal to twice or 2×length PL30) similar to that described for zone 3996X.

Pair 3980 may include a signal data LDW trace (e.g., similar to trace 3982A) physically and electronically coupling transmit circuitry (e.g., similar to circuit 3972A) (on the left of zone 3996Y) to a transmit contact (e.g., similar to contact 3940A) (on the right of the zone 3996Y). Pair 3980 may also include signal data LDW trace (e.g., similar to trace 3982B) physically and electronically coupling transmit circuitry (e.g., similar to circuit 3972B) (on the right of zone 3996Y) to transmit contact (e.g., similar to contact 3940B) (on the left of the zone 3996Y). In some cases, such transmit contacts may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW traces of pair 3980 physically and electronically coupling transmit circuitry of pair 3980 to transmit contacts of pair 3980, may be part of a channel 3076 or 3076B, such as described for pair 3910 (e.g., and transmit contacts 3040 or receive contacts 3030 as described for FIGS. 30-37).

In some cases, pattern 3900 has fourth chip "on-die" interconnection feature zone 4296Y which includes zone 4292Y and fourth switch buffer (SB) pair 3985. In some cases, zone 4296Y is widthwise adjacent to zone 4296X along width W303. SB pair 3985 may be or include a SB pair of data signal transmit (or receive) circuits similar to that described for zone 4296X. In some cases, SB pair 3985 also includes a switched buffer (SB) pair of surface bump contacts similar to that described for zone 4296X. SB pair 3985 may describe a "double pitch" or "2×-pitch" SB data signal LDW trace embodiment of chip on-die interconnect features (e.g., where length L3011 is equal to twice or 2×length PL30) similar to that described for zone 4296X.

Pair 3985 may include a signal data LDW trace (e.g., similar to trace 4282A) physically and electronically coupling transmit circuitry (e.g., similar to circuit 4272A) (on the left of zone 4296Y) to a transmit contact (e.g., similar to contact 4240A) (on the right of the zone 4296Y). Pair 3985 may also include signal data LDW trace (e.g., similar to trace 4282B) physically and electronically coupling transmit circuitry (e.g., similar to circuit 4272B) (on the right of zone 4296Y) to transmit contact (e.g., similar to contact 4240B) (on the left of the zone 4296Y). In some cases, such transmit contacts may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW traces of pair 3985 physically and electronically coupling transmit circuitry of pair 3985 to transmit contacts of pair 3985, may be part of a channel 3076 or 3076B, such as described for pair 3960 (e.g., and transmit contacts 3040 or receive contacts 3030 as described for FIGS. 30-37).

In some cases, pair 3980 and 3985 (e.g., data signal circuits, contacts, data signal LDW traces, isolation LDW traces and locations (e.g., of surface contacts vertically below circuits/buffers)): (1) perform the same functions (e.g., for data signal LDW: traces, functions, transmission and receiving) as, have the same dimensions (e.g., width and height) as, (2) have the same relative locations (e.g., length L3011 is the same length between data signal circuits and contacts, which is 2×PL30) as, (3) have the same isolation (e.g., data signal LDW traces are isolated by isolation LDW traces from other data signal LDW traces on the same level LV2/LSML and level LV3/LSML−1) as, (4) are located in the same chips (e.g., chip 3008 and/or 3009) as, (5) are in the same levels (e.g., surface contacts in level LV1; data signal and isolation LDW traces in level LV2/LSML and level LV3/LSML−1; and data circuits in level LN) as, (6) have the same additional via contacts (e.g., see FIGS. 31-32 and 34) as, and are part of channels similar and having lengths equal to as, those of pair 3910 and 3965, respectively. In some cases, for embodiments having 3910 and 3965 (and 3980 and 3985) at chip 3008 and/or 3009 channel 3076 has length CL=(2×L301+H3041+L302+H3051+2×L301), and channel 3076B has length CL2=(H304+L302+H3051+2×L301), where height H3041 is equal to H304+H301 (e.g., height of the interleaved SB pair on level LV3) and height H3051 is equal to H305+H301 (e.g., height of the interleaved SB pair on level LV3) (e.g., see FIGS. 31-32, 34 and 38A-39B).

In some cases, traces 3982A and 4282A (e.g., zones 3996X and 4296X) are each also "isolated" data signal LDW traces that are electronically isolated or shielded from data signal LDW traces of zones 3996Y and 4296Y (e.g., and vice versa) (represented by green lines or shading of figure within width W303) on the same level (e.g., LV2 or LSML; and level LV3 or LSML−1) by isolation LDW traces (e.g., such as described for traces 3084 and 3083 shielding traces 3082 and 3081 respectively).

In some cases, traces 3982A-B and 4282A-B (e.g., zones 3996X and 4296X) are each also "isolated" data signal LDW traces that are electronically isolated or shielded from all data signal LDW traces of zones 3996Y and 4296Y (e.g., and vice versa) (represented by green lines or shading of figure within width W303) on the levels LV2 or LSML; and level LV3 or LSML−1 by isolation LDW traces (e.g., such as described for traces 3084 and 3083 shielding traces 3082 and 3081 respectively).

In some cases, these isolation LDW traces may be one or more traces disposed widthwise between (e.g., along width W303, such as at a midpoint of pitch width PW30) and extending lengthwise along where length L3011 of pairs 3910 and 3960 overlap with length L3011 of pairs 3980 and 3985.

In some cases, there can be many of SB pairs 3910, 3960, 3980 and 3985 on a chip, such as on chip 3008 or 3009. According to embodiments, there can be many SB pairs 3910, 3960, 3980 and 3985 on chip 3008 or 3009, as there are pairs of 2 adjacent data signal LDW traces (e.g., pairs of 2 traces 3082 or 3081) on chip 3008 or 3009.

In some cases, the multiple SB pairs 3910+3960 (e.g., the combination of pair 3910 interleaved with pair 3960) and 3980+3985 (e.g., the combination of pair 3980 interleaved with pair 3985) on chip 3008 or 3009 can extend parallel to each other, X,Y lengthwise (e.g., pair 3910+3960 parallel to pair 3980+3985 along the direction of length L3011) and are X,Y horizontally adjacent widthwise (e.g., pair 3910+3960 horizontally adjacent to pair 3980+3985 along width W303). In some cases, the multiple SB pairs 3910+3960 and 3980+3985 on chip 3008 or 3009 can extend parallel to each other, lengthwise (e.g., along L3011) and have X,Y pitch width PW30 horizontally between adjacent widthwise ones of SB pairs 3910+3960 and 3980+3985 (e.g., along width W303).

In some cases, the multiple SB pairs 3910+3960 and 3980+3985 on chip 3008 or 3009 can extend parallel to each other, X,Y lengthwise (e.g., along L3011); be horizontally adjacent X,Y widthwise (e.g., along width W303); and be offset X,Y lengthwise (e.g., the location of a surface contact of 3910+3960 as compared to the location of a surface contact of pair 3980+3985 along direction of length L3011) by length L305. In some cases, L305 may be ½ pitch length PL30 (and in this case ¼ length L3011). Such an offset may put one horizontal X,Y location 4212 of a circuit and surface contact of a second SB pair 3960 at the X,Y lengthwise midpoint between the two horizontal X,Y locations (leftmost two) of the circuits and surface contacts of a third and fourth interleaved SB pair 3980+3985. In some cases, the offset length L305 may be ⅕ length PL30, ¼ length PL30, or ⅓ pitch length PL30. In some cases there may be no offset and the two horizontal X,Y locations of the circuits and surface contacts of both pair of SB pairs 3910+3960 and 3980+3985 are lengthwise aligned, and side by side along width W303.

Figure 40A:
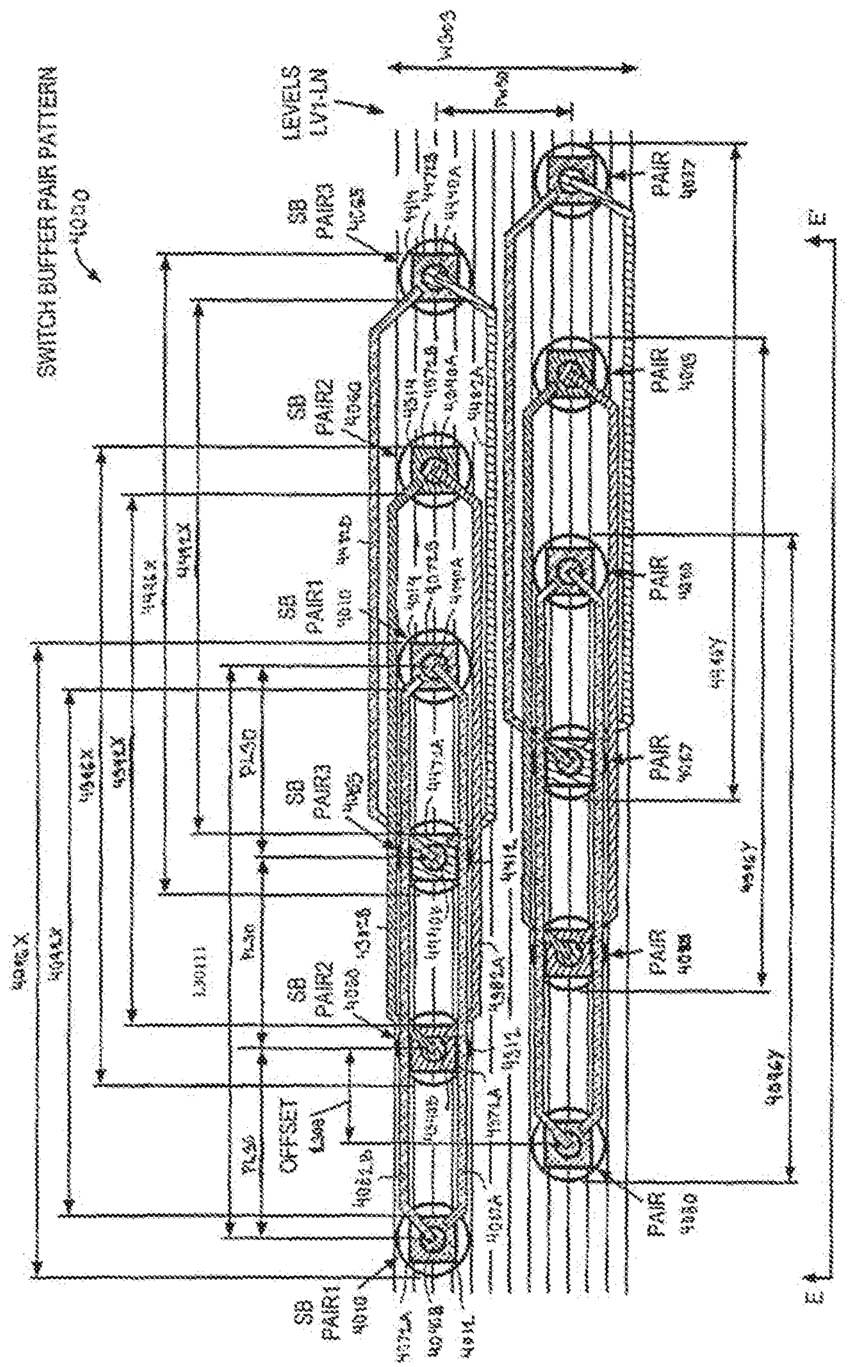
FIG. 40A shows a cross-sectional bottom view of some patterns of 6 chip "on-die" interconnection feature zones, each zone having triple surface contact pitch length switched buffer (SB) data signal LDW traces, according to embodiments.

FIG. 40A shows a cross-sectional bottom view of some patterns of 6 chip "on-die" interconnection feature zones, each zone having triple surface contact pitch length switched buffer (SB) data signal LDW traces, according to embodiments.

FIG. 40A shows a cross-sectional bottom view of pattern 4000 having chip "on-die" interconnection feature zones 4096X, 4396X, 4496X, 4096Y, 4396Y and 4496Y with triple surface contact pitch length (PL30) switched buffer (SB) data signal LDW trace pairs 4010, 4060, 4065, 4080, 4085 and 4087, respectively. Zones 4096X, 4396X, and 4496X are shown having an "upper row" (e.g., located above pairs 4080, 4085 and 4087 along direction W303 in FIG. 40A) of triple surface contact pitch length (PL30) switched buffer (SB) data signal LDW trace pairs 4010, 4060, and 4065 respectively. In some cases, row of SB data signal LDW trace pairs 4010, 4060, and 4065 (1) extend in a lengthwise "row" of multiple SB data signal LDW trace pair along the direction of length L30111, and are (2) at a single widthwise "column" of data signal LDW traces along width W303. In some cases, upper row of SB data signal LDW trace pairs 4010, 4060, and 4065, extend in a row at a column as noted, that are widthwise above zones 4096Y, 4396Y and 4496Y which are shown having a "lower row" of tripple surface contact PL SB data signal LDW trace pairs similar to "upper row" pairs 4010, 4060, and 4065 respectively, but in a lower "row" of pattern 4000 as shown. In some cases of pattern 4000, length L30111 is equal to thrice or 3X solder bump surface contact pitch length PL30. Embodiment 4000 may show the location of a transmit circuit (e.g., circuit 3072) and transmit contact (e.g., contact 3040) of 6 data signal LWD traces have been switched, reversed, or otherwise had their locations exchanged in zones 4096X+4396X+4496X and 4096Y+4396Y+4496Y.

Pattern 4000 is shown having first chip "on-die" interconnection feature zone 4096X which includes zone 4092X and first switch buffer (SB) pair 4010. SB pair 4010 may be or include a SB pair of data signal transmit (or receive) circuits. In some cases, SB pair 4010 also includes a switched buffer (SB) pair of surface bump contacts. SB pair 4010 may describe a "triple pitch" or "3×-pitch" SB data signal LDW trace embodiment of chip on-die interconnect features (e.g., where length L30111 is equal to thrice or 3×length PL30).

Pair 4010 may include signal data LDW trace 4082A physically and electronically coupling transmit circuitry 4072A (on the left of zone 4096X) to transmit contact 4040A (on the right of the zone 4096X). Pair 4010 may also include signal data LDW trace 4082B physically and electronically coupling transmit circuitry 4072B (on the right of zone 4096X) to transmit contact 4040B (on the left of the zone 4096X). In some cases, such transmit contacts 4040A and B may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW trace 4082A or B physically and electronically coupling transmit circuitry 4072A or B to transmit contact 4040A or B may be part of a channel 3076 or 3076B, such as described for transmit contacts 3040 or receive contacts 3030 as described for FIGS. 30-37. In some cases, such a channel includes having transmit contact 4040A or B physically and electronically coupled to corresponding surface contact at a location of a package (e.g., package 3010) using solder bumps (e.g., bumps 3018 or 3019), such as described for transmit contacts 3040 or receive contacts 3030 as described for FIGS. 30-37.

In some cases, such a channel includes a channel from (e.g., between) circuit 4072A or B of chip 3008 and through zone 4096X on chip 3008, bumps 3018, traces 3033, traces 3035, traces 3037, bumps 3019, and to zone 3098 on chip 3009 to circuit 3074 of chip 3009. In some cases, such a channel includes a channel from (e.g., between) circuit 3072 of chip 3008 and through zone 3096 on chip 3008, bumps 3018, traces 3033, traces 3035, traces 3037, bumps 3019, and to zone 4096X on chip 3009 to circuit 4074A or B (e.g., represented by 4072A or B and functioning like 3074) of chip 3009 (e.g., see FIG. 40B). In some cases, such a channel includes a channel from (e.g., between) circuit 4372A or B of chip 3008 and through zone 4096X on chip 3008, bumps 3018, traces 3033, traces 3035, traces 3037, bumps 3019, and to a zone 4096X on chip 3009 to circuit 4074A or B (e.g., represented by 4072A or B and functioning like 3074) of chip 3009 (e.g., see FIG. 40B).

Pattern 4000 is shown also having second chip "on-die" interconnection feature zone 4396X which includes zone 4392X and second switch buffer (SB) pair 4060. SB pair 4060 may be or include a SB pair of data signal transmit (or receive) circuits. In some cases, SB pair 4060 also includes a switched buffer (SB) pair of surface bump contacts. SB pair 4060 may describe a "double pitch" or "2×-pitch" SB data signal LDW trace embodiment of chip on-die interconnect features (e.g., where length L301 is equal to twice or 2×length PL30).

Pair 4060 may include signal data LDW trace 4382A physically and electronically coupling transmit circuitry 4372A (on the left of zone 4396X) to transmit contact 4340A (on the right of the zone 4396X). Pair 4060 may also include signal data LDW trace 4382B physically and electronically coupling transmit circuitry 4372B (on the right of zone 4396X) to transmit contact 4340B (on the left of the zone 4396X). In some cases, such transmit contacts 4340A and B may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW trace 4382A or B physically and electronically coupling transmit circuitry 4372A or B to transmit contact 4340A or B may be part of a channel 3076 or 3076B, such as described for transmit contacts 3040 or receive contacts 3030 as described for FIGS. 30-37. In some cases, such a channel includes having transmit contact 4340A or B physically and electronically coupled to corresponding surface contact at a location of a package (e.g., package 3010) using solder bumps (e.g., bumps 3018 or 3019), such as described for transmit contacts 3040 or receive contacts 3030 as described for FIGS. 30-37.

In some cases, such a channel includes a channel from (e.g., between) circuit 4372A or B of chip 3008 and through zone 4396X on chip 3008, bumps 3018, traces 3033, traces 3035, traces 3037, bumps 3019, and to zone 3098 on chip 3009 to circuit 3074 of chip 3009. In some cases, such a channel includes a channel from (e.g., between) circuit 3072 of chip 3008 and through zone 3096 on chip 3008, bumps 3018, traces 3033, traces 3035, traces 3037, bumps 3019, and to zone 4396X on chip 3009 to circuit 4374A or B (e.g., represented by 4372A or B and functioning like 3074) of chip 3009 (e.g., see FIG. 40B). In some cases, such a channel includes a channel from (e.g., between) circuit 4372A or B of chip 3008 and through zone 4396X on chip 3008, bumps 3018, traces 3033, traces 3035, traces 3037, bumps 3019, and to zone 4396X on chip 3009 to circuit 4374A or B (e.g., represented by 4372A or B and functioning like 3074) of chip 3009 (e.g., see FIG. 40B).

Pattern 4000 is shown also having third chip "on-die" interconnection feature zone 4496X which includes zone 4492X and third switch buffer (SB) pair 4065. SB pair 4065 may be or include a SB pair of data signal transmit (or receive) circuits. In some cases, SB pair 4065 also includes a switched buffer (SB) pair of surface bump contacts. SB pair 4065 may describe a "double pitch" or "2×-pitch" SB data signal LDW trace embodiment of chip on-die interconnect features (e.g., where length L301 is equal to twice or 2×length PL30).

Pair 4065 may include signal data LDW trace 4482A physically and electronically coupling transmit circuitry 4472A (on the left of zone 4496X) to transmit contact 4440A (on the right of the zone 4496X). Pair 4065 may also include signal data LDW trace 4482B physically and electronically coupling transmit circuitry 4472B (on the right of zone 4496X) to transmit contact 4440B (on the left of the zone 4496X). In some cases, such transmit contacts 4440A and B may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW trace 4482A or B physically and electronically coupling transmit circuitry 4472A or B to transmit contact 4440A or B may be part of a channel 3076 or 3076B, such as described for transmit contacts 3040 or receive contacts 3030 as described for FIGS. 30-37. In some cases, such a channel includes having transmit contact 4440A or B physically and electronically coupled to corresponding surface contact at a location of a package (e.g., package 3010) using solder bumps (e.g., bumps 3018 or 3019), such as described for transmit contacts 3040 or receive contacts 3030 as described for FIGS. 30-37.

In some cases, such a channel includes a channel from (e.g., between) circuit 4472A or B of chip 3008 and through zone 4496X on chip 3008, bumps 3018, traces 3033, traces 3035, traces 3037, bumps 3019, and to zone 3098 on chip 3009 to circuit 3074 of chip 3009. In some cases, such a channel includes a channel from (e.g., between) circuit 3072 of chip 3008 and through zone 3096 on chip 3008, bumps 3018, traces 3033, traces 3035, traces 3037, bumps 3019, and to zone 4496X on chip 3009 to circuit 4474A or B (e.g., represented by 4472A or B and functioning like 3074) of chip 3009 (e.g., see FIG. 40B). In some cases, such a channel includes a channel from (e.g., between) circuit 4472A or B of chip 3008 and through zone 4496X on chip 3008, bumps 3018, traces 3033, traces 3035, traces 3037, bumps 3019, and to zone 4496X on chip 3009 to circuit 4474A or B (e.g., represented by 4472A or B and functioning like 3074) of chip 3009 (e.g., see FIG. 40B).

FIG. 40A may show a cross-sectional "bottom" or upward looking view such as shown for FIGS. 30, 34B and 38-39 that includes (1) vertical level LV1 (e.g., an exposed surface of topmost level LV1 of zones 4096X, 4396X, and 4496X representing surface 3103 of zone 3096 and/or surface 3203 of zone 3098); (2) vertical levels LV2, LV3 and LV4 (or LSML level, LSML−1 level, and LSML−2 level); (3) vertical level LM and vertical level LN. In some cases, contacts 4040A-B, 4340A-B and 4440A-B are on level LV1; traces 4082A-B, 4382A-B and 4482A-B are on vertical levels LV2, LV3 and LV4 (LSML level, LSML−1 level, and LSML−2 level); and circuits 4072A-B, 4372A-B and 4472A-B are on level LN (e.g., such as shown for corresponding contacts 3040, traces 3082 and circuits 3072 of FIGS. 31A and 34).

In some cases, level LSML−2 is an LV4 or (LSML minus two levels) level that is the level directly above (e.g., having level LV3 formed onto and touching level LSML−2) and closest to level LSML−1 or LV3. In this case, levels LSML (e.g., LV2), LSML−1 (e.g., LV3), and LSML−2 (e.g., LV4) are in between level LV1 and LM (e.g., such as shown for corresponding levels of FIGS. 31-32 and 34).

In some case, each pair of traces 4082A-B, 4382A-B and 4482A-B are on one of either vertical level LV2, LV3 or LV4 (e.g., one pair per level). In some cases, each pair of traces 4082A-B, 4382A-B and 4482A-B are on a different level of levels LV2, LV3 or LV4 because location 4412 of pair 4065 is located between locations 4012 and 4014 of pair 4010, and is located between locations 4312 and 4314 of pair 4060, so that traces 4482A-B can extend between locations 4412 and 4414 (e.g., from and between contact 4440A-B and circuit 4472A-B) without physically contacting traces 4082A-B or 4382A-B (which would create an undesired electronic short between traces 4482A-B and traces 4082A-B or 4382A-B).

In some case, each pair of traces 4082A-B, 4382A-B and 4482A-B are on a different level of levels LV2, LV3 or LV4, respectively as follows: LV2, LV3, LV4 (e.g., 4082A-B on LV2, 4382A-B on LV3, and 4482A-B on LV4); or LV2, LV4, LV3; or LV3, LV4, LV2; or LV3, LV2, LV4; or LV4, LV2, LV3; or LV4, LV3, LV2. In some case, each pair of traces 4082A-B, 4382A-B and 4482A-B are on a different level of levels LV2, LV3 or LV4, respectively as follows: LV2, LV3, LV4; or LV4, LV2, LV3; or LV3, LV4, LV2. In some case, each pair of traces 4082A-B, 4382A-B and 4482A-B are on a different level of levels LV2, LV3 or LV4, respectively as follows: LV2, LV3, LV4; or LV4, LV3, LV2.

It is also considered that one of pair of traces 4082A-B, 4382A-B and 4482A-B in the above level sequences may be removed from the sequence between Levels LV2-LV4 and may be on level LV5 (e.g., LSML−3), such as described above for levels LV2-LV4. In this case, none of the pairs is on the level that the pair on level LV5 was removed from.

In some cases, each corresponding contact and circuit of pairs 4040B+4072A (e.g., the pair of contact 4040B and circuit 4072A), 4040A+4072B, 4340B+4372A, 4340A+4372B, 4440B+4472A, and 4440A+4472B have a contact on level LV1, at the same horizontal X,Y location (e.g., locations 4012, 4014, 4312, 4314, 4412 and 4414 respectively) as the corresponding circuit which is on level LN and disposed vertically directly above the corresponding contact at the same horizontal X,Y location (e.g., as described for FIGS. 38-39).

In some cases, having one of (e.g., 4040B+4072A) corresponding contact and circuit of pairs 4040B+4072A and 4040A+4072B; or 4340B+4372A and 4340A+4372B; or 4440B+4472A and 4440A+4472B at a first same horizontal X,Y location, and having the second one of (e.g., 4040A+4072B) corresponding contact and circuit of those pairs at a same and different horizontal X,Y location may be described as switching, reversing, or otherwise exchanging the locations of a data signal transmit (or receive) circuit (e.g., circuit 3972A and B) and of a transmit (or receive) contact (e.g., contact 3940B and A) of (e.g., coupled by) 2 data signal LWD traces (e.g., as described for FIGS. 38-39).

In some case, horizontal X,Y location 4312 is X,Y lengthwise between (and lengthwise offset by pitch length PL30) horizontal X,Y locations 4012 and 4412 at the same widthwise X,Y location; horizontal X,Y location 4412 is X,Y lengthwise between (and lengthwise offset by pitch length PL30) horizontal X,Y locations 4312 and 4014 at the same widthwise X,Y location; and horizontal X,Y location 4014 is X,Y lengthwise between (and lengthwise offset by pitch length PL30) horizontal X,Y locations 4412 and 4314 at the same widthwise X,Y location. In some cases, SB pair 4010, 4060 and 4065 are three SB pair having lengthwise X,Y interleaved or alternating locations that are lengthwise offset by pitch length PL30 (e.g., of surface contacts and data signal circuits/buffers attached by data signal LDW traces) at the same widthwise X,Y location. In some cases, right side X,Y location 4014 is lengthwise X,Y interleaved or alternating with (e.g., and lengthwise offset by pitch length PL30) locations 4412 and 4314; and left side X,Y location 4412 is lengthwise X,Y interleaved or alternating with (e.g., and lengthwise offset by pitch length PL30) locations 4312 and 4014. Such lengthwise X,Y interleaving or alternating may describe a "rung", "ladder", "zipper" or "switchback" or "zigzag" pattern (lengthwise offset by pitch length PL30) of three upper SB pairs of surface contacts and data signal circuits/buffers locations (e.g., attached by data signal LDW traces).

FIG. 40A represents isolation LDW traces and other structures of levels LV1-LN (e.g., as described herein, such as with respect to FIGS. 30-34) with the shading or lines (e.g., green colored lines) indicated by the label "Levels LV1-LN".

In some cases, zones 4096X, 4396X and 4496X may include isolation LDW traces isolating each of traces 4082A-B, 4382A-B and 4482A-B from any (or all) horizontally adjacent (e.g., on the same level such as level LV2/LSML, level LV3/LSML−1, or level LV4/LSML−2) data signal traces (including any adjacent one of traces 4082A-B, 4382A-B and 4482A-B; and data signal LDW traces of pair 4080, 4085 and 4087), such as described for isolation LDW traces 3084 (e.g., and 3084G and 3084P) as described for FIGS. 30-37. These isolation LDW traces may be show in FIG. 40A as green lengthwise lines or shading between the signal LDW traces 4082A-B, 4382A-B and 4482A-B; and data signal LDW traces of pair 4080, 4085 and 4087.

Such isolation LDW traces may extend parallel to and between each of traces 4082A-B, 4382A-B and 4482A-B and any (or all) X,Y widthwise horizontally adjacent data signal LDW traces; thus electronically isolating (e.g., data signals transmitted on, when zones 4096X, 4396X and 4496X represent zone 3092; or data signals received on, when zones 4096X, 4396X and 4496X represent zone 3094) traces 4082A-B, 4382A-B and 4482A-B from any (or all) X,Y widthwise horizontally adjacent data signal LDW traces (e.g., electronically isolating and shielding the data signal LDW traces as described herein). In some cases, such isolation LDW traces may also electronically isolate an X,Y widthwise horizontally adjacent data signal LDW trace from traces 4082A-B, 4382A-B and 4482A-B. In some cases, more isolation LDW traces may extend parallel to and between each of traces 4082A-B, 4382A-B and 4482A-B, and another widthwise horizontally adjacent data signal LDW trace to shield each of these traces from a lower pair of SB traces.

In some cases, such isolation LDW traces may also be physically and electronically coupled to isolation signal traces and surface contacts, such as described for isolation traces 3172 and 3174 (e.g., and 3172G or P; and 3174G or P) and contacts 3020 (e.g., and 3020G or P) as described for FIGS. 30-37. In some cases, such isolation surface contacts may be physically and electronically coupled to corresponding isolation contacts of a package using solder bumps (e.g., bumps 3018 or 3019), such as described for isolation contacts 3020 (e.g., and 3020G or P) as described for FIGS. 30-37.

Although not show in FIG. 40A, for cases when zones 4096X, 4396X and 4496X represent zone 3092 of chip 3008, it can be appreciated that in some cases, zones 4096X, 4396X and 4496X may include (1) structure (e.g., one or more via contacts on level LM) vertically attaching one end of traces 4082A-B, 4382A-B and 4482A-B to transmit circuitry 4072A-B, 4372A-B and 4472A-B, respectively; and (2) structure (e.g., one or more via contacts on level LV1) vertically attaching the opposing end of traces 3982A-B and 4282A-B to transmit contacts 4040A-B, 4340A-B and 4440A-B, respectively, such as described for vertically attaching trace 3082 to transmit circuitry 3072 and to transmit contact 3040 as described for FIGS. 30-38 (e.g., see FIGS. 31A, 34 and 38). Although not show in FIG. 40A, (1) via contacts similar to 3142 and 3242 (e.g., a via contact on level LM) may physically, vertically attach (e.g., so they are touching) one end of traces 4082A-B, 4382A-B and 4482A-B to transmit circuitry 4072A-B, 4372A-B and 4472A-B, respectively; and (2) via contacts similar to 3152 and 3252 (e.g., a via contact on level LV1) may physically, vertically attach a second end of traces 4082A-B, 4382A-B and 4482A-B to transmit contacts 4040A-B, 4340A-B and 4440A-B, respectively, such as described for vertically attaching trace 3082 to transmit circuitry 3072 and to transmit contact 3040 as described for FIGS. 31A, 34 and 38-39.

Although not show in FIG. 40A, for cases when zones 4096X, 4396X and 4496X represents zone 3094 of chip 3009, it can be appreciated that in some cases, zones 4096X, 4396X and 4496X may include (1) structure (e.g., one or more via contacts on level LM) vertically attaching one end of traces 4082A-B, 4382A-B and 4482A-B to receive circuitry (e.g., represented here by 4072A-B, 4372A-B and 4472A-B, respectively); and (2) structure (e.g., one or more via contacts on level LV1) vertically attaching the opposing end of traces 4082A-B, 4382A-B and 4482A-B to receive contacts (e.g., represented here by 4040A-B, 4340A-B and 4440A-B, respectively), such as described for vertically attaching trace 3081 to receive circuitry 3074 and to receive contact 3030 as described for FIGS. 30-37 (e.g., see FIGS. 32A and 34). Although not show in FIG. 40A, (1) via contacts similar to 3144 and 3244 (e.g., a via contact on level LM) may physically, vertically attach (e.g., so they are touching) one end of traces 4082A-B, 4382A-B and 4482A-B to receive circuitry (e.g., represented here by 4072A-B, 4372A-B and 4472A-B, respectively); and (2) via contacts similar to 3154 and 3254 (e.g., a via contact on level LV1) may physically, vertically attach a second end of traces 4082A-B, 4382A-B and 4482A-B to receive contacts (e.g., represented here by 4040A-B, 4340A-B and 4440A-B, respectively) such as described for vertically attaching trace 3081 receive circuitry 3074 and to receive contact 3030 as described for FIGS. 32A, 34 and 38-39.

Figure 40B:
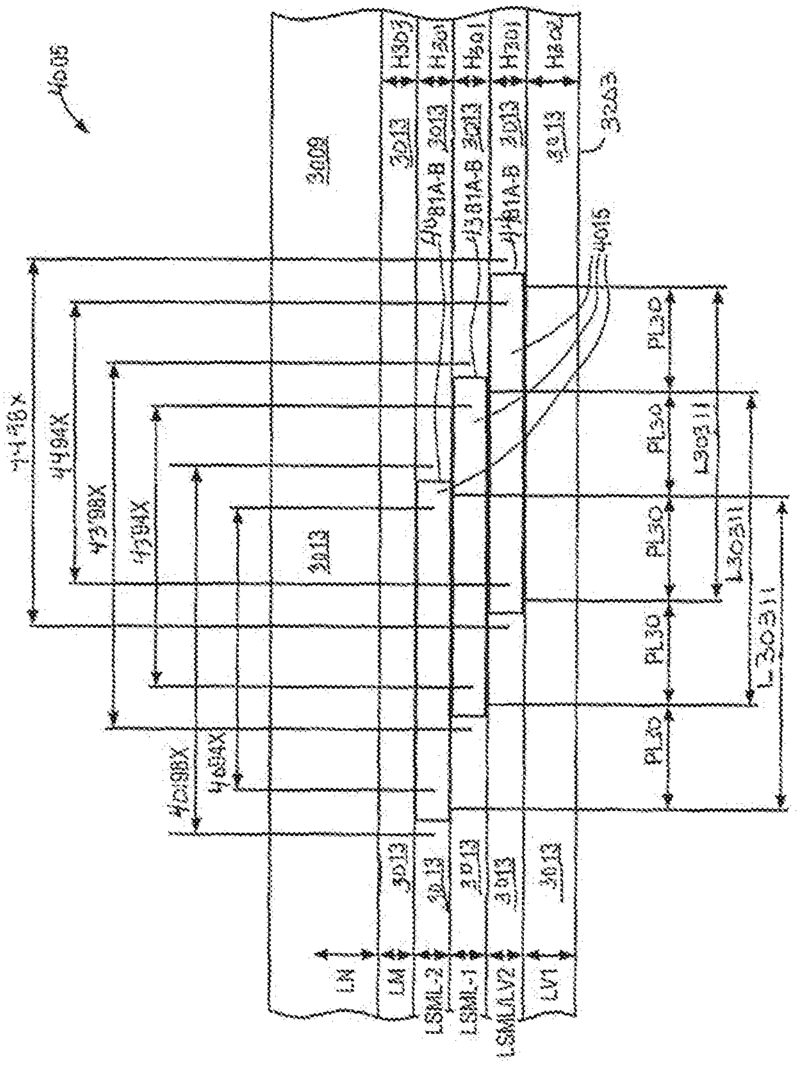
FIG. 40B shows a cross-sectional side view of some patterns of 6 chip "on-die" interconnection feature zones, each zone having triple surface contact pitch length switched buffer (SB) data signal LDW traces, according to embodiments.

FIG. 40B shows a cross-sectional side view of some patterns of 2 chip "on-die" interconnection feature zones, each having triple surface contact pitch length switched buffer (SB) data signal LDW traces, according to embodiments. The side view of FIG. 40B may be similar to that through perspective E-E' shown in FIG. 40A for an embodiment of a SB receive data signal LDW trace pair (e.g., as explained for FIG. 40A).

FIG. 40B shows a cross-sectional side view of a receive data signal LDW trace pattern 4005 similar to pattern 4000 having chip "on-die" interconnection feature zone 4094X with triple surface contact X,Y pitch length (PL30) switched buffer (SB) receive data signal LDW trace pairs 4015 (e.g., traces 4081A-B, 4381A-B and 4481A-B) similar to pairs 4010, 4060 and 4065 for chip 3009 for an embodiment of a SB receive data signal LDW trace pair (e.g., as explained for FIG. 40A). In some cases, length L30311 between the circuit and surface contact of each pair is equal to 3×length PL30.

Pattern 4005 does not show the location of the 6 receive circuits (e.g., circuits 4074A-B, 4374A-B and 4474A-B, located similar to 4072A-B, 4372A-B and 4472A-B of FIG. 40A and functioning similar to circuit 3074) or of the 6 receive contacts (e.g., contacts 4030A-B, 4330A-B and 4430A-B, located similar to 4040A-B, 4340A-B and 4440A-B of FIG. 40A and functioning similar to contact 3030). The locations of receive circuits and contacts of the 6 data signal LWD traces 4081A-B, 4281A-B and 4481A-B of FIG. 40B have been switched, reversed, or otherwise had their locations exchanged in zone 4094X, similar to the description for circuits 4072A-B, 4372A-B and 4472A-B exchanged with contacts 4040A-B, 4340A-B and 4440A-B of FIG. 40A.

SB pairs 4015 describe a "triple pitch" or "3-pitch" SB data signal LDW trace embodiment of chip on-die interconnect features (e.g., where length L30311 is equal to 3×length PL30). Pairs 4015 may include signal data LDW trace 4081A physically and electronically coupling receive circuitry 4074A (not shown but on the left end of trace 4081A and on the left of zone 4094X) to receive contact 4030A (not shown but on the right end of trace 4081A and on the right of the zone 4094X). Pairs 4015 may also include signal data LDW trace 4081B physically and electronically coupling receive circuitry 4074B (not shown but on the right end of trace 4081B and on the right of zone 4094X) to receive contact 4030B (not shown but on the left end of trace 4081B and on the left of the zone 4094X).

Pairs 4015 may include signal data LDW trace 4381A physically and electronically coupling receive circuitry 4374A (not shown but on the left end of trace 4381A and on the left of zone 4094X) to receive contact 4330A (not shown but on the right end of trace 4381A and on the right of the zone 4094X). Pair 1715 may also include signal data LDW trace 4381B physically and electronically coupling receive circuitry 4374B (not shown but on the right end of trace 4081B and on the right of zone 4094X) to receive contact 4330B (not shown but on the left end of trace 4381B and on the left of the zone 4094X).

Pairs 4015 may include signal data LDW trace 4481A physically and electronically coupling receive circuitry 4474A (not shown but on the left end of trace 4481A and on the left of zone 4094X) to receive contact 4430A (not shown but on the right end of trace 4481A and on the right of the zone 4094X). Pair 4415 may also include signal data LDW trace 4481B physically and electronically coupling receive circuitry 4474B (not shown but on the right end of trace 4081B and on the right of zone 4094X) to receive contact 4430B (not shown but on the left end of trace 4481B and on the left of the zone 4094X). In some cases, such receive contacts 4030A-B, 4330A-B and 4430A-B may be physically and electronically coupled to corresponding transmit contacts at a location of a package (e.g., package 3010) using solder bumps (e.g., bumps 3019), such as described for transmit contacts 3030 as described for FIGS. 30-40A.

Pairs 4015 (e.g., traces 4081A-B, 4381A-B and 4481A-B) may be on levels LV2/LSML, LV3/LSML−1 and LV4/LSML−2; and each trace may have height H301 and length L30311. In some cases, traces 4081A-B are on level LV4/LSML−2, traces 4381A-B are on level LV3/LSML−1 and traces 4481A-B are on level LV2/LSML (e.g., as shown). In some cases, traces 4081A-B, 4381A-B and 4481A-B may be on levels LV2/LSML, LV3/LSML−1 and LV4/LSML−2 as described for traces 4082A-B, 4382A-B and 4482A-B being on levels LV2/LSML, LV3/LSML−1 and LV4/LSML−2. In some cases, length L30311 is the same length as described for embodiments of length L30111.

In some cases, each of isolated signal data LDW traces 4081A-B, 4381A-B and 4481A-B physically and electronically coupling receive circuitry to a receive contact may be part of a channel 3076 or 3076B, such as described for receive contacts 3030 as described for FIGS. 30-40A. In some cases, such channels include channels from (e.g., between) circuits 4072A-B, 4372A-B and 4472A-B of chip 3008 and through zone 4096X on chip 3008, bumps 3018, traces 3033, traces 3035, traces 3037, bumps 3019, and to zone 4094X on chip 3009 to circuits 4074A-B, 4374A-B and 4474A-B of chip 3009. In some cases, such channels include channels from (e.g., between) circuits 3072 of chip 3008 and through zone 3096 on chip 3008, bumps 3018, traces 3033, traces 3035, traces 3037, bumps 3019, and to 3994X on chip 3009 to circuits 4074A-B, 4374A-B and 4474A-B of chip 3009.

In some cases zones 4096X, 4396X and 4496X represent zone 3094 of chip 3009. FIG. 40B shows a case when zone 4094X represents zone 3094 of chip 3009 and may include (1) structure (e.g., one or more via contacts on level LM) vertically attaching one end of traces 4081A-B, 4381A-B and 4481A-B to receive circuitry 4074A-B, 4374A-B and 4474A-B (e.g., represented by 4072A-B, 4372A-B and 4472A-B in FIG. 40A, respectively); and (2) structure (e.g., one or more via contacts on level LV1) vertically attaching the opposing end of traces 4081A-B, 4381A-B and 4481A-B to receive contacts 4030A-B, 4330A-B and 4430A-B (e.g., represented by 4040A-B, 4340A-B and 4440A-B in FIG. 40A, respectively), such as described for vertically attaching trace 3081 to receive circuitry 3074 and to receive contact 3030 as described for FIGS. 30-40A (e.g., see FIGS. 32A and 34). Although not show in FIG. 40A, (1) via contacts similar to 3144 and 3244 (e.g., a via contact on level LM) may physically, vertically attach (e.g., so they are touching) one end of traces 4081A-B, 4381A-B and 4481A-B to receive circuitry 4074A-B, 4374A-B and 4474A-B (e.g., represented by 4072A-B, 4372A-B and 4472A-B in FIG. 40A, respectively); and (2) via contacts similar to 3154 and 3254 (e.g., a via contact on level LV1) may physically, vertically attach a second end of traces 4081A-B, 4381A-B and 4481A-B to receive contacts 4030A-B, 4330A-B and 4430A-B (e.g., represented by 4040A-B, 4340A-B and 4440A-B in FIG. 40A, respectively), such as described for vertically attaching trace 3081 receive circuitry 3074 and to receive contact 3030 as described for FIGS. 32A, 34 and 38-40A.

Each of traces 4082A-B, 4382A-B and 4482A-B may also be "isolated" data signal LDW traces that are electronically isolated or shielded from adjacent data signal LDW traces on the same level (e.g., LV2 or LSML; LV3 or LSML−1; or LV4 or LSML−2) by isolation LDW traces (represented by shading or green lines of FIG. 40A within width W303) such as described for traces 3084 and 3083 shielding traces 3082 and 3081 respectively.

Although not show in FIG. 40A-B, it can be appreciated that in some cases, zones 4096X, 4396X and 4496X may include (1) structure (e.g., one or more via contacts such as 3144 and/or 3244 on level LM) vertically attaching one end of the isolation LDW traces to isolation traces; and (2) structure (e.g., one or more via contacts such as 3154 and/or 3254 on level LV1) vertically attaching the opposing end of the isolation LDW traces to isolation contacts, such as described for vertically attaching trace 3084 and/or 3083 to isolation traces 3172 and/or 3174, and to isolation contacts 3020 and/or 3020, respectively as described for FIGS. 30-37 (e.g., see FIGS. 31B, 32B and 34).

Traces 4082A-B, 4382A-B and 4482A-B may each have length L30111=three times length L301, width W301 and height H301 such as described for trace 3081 and 3082. Zones 4096X, 4396X and 4496X, or a number of zones 4096X, 4396X and 4496X may extend widthwise across a portion of width W303 of a chip (e.g., such as chip 3008 or 3009).

According to embodiments, zones 4096X, 4396X and 4496X may represent zone 3096 or 3098; and zones 4096X, 4396X and 4496X may represent zone 3092 or 3094 (e.g., as described for FIGS. 30-37). Here, each of trace 4082A-B, 4382A-B and 4482A-B may represent one of trace 3082 or trace 3081, physically and electronically attaching transmit circuitry 3072 or receive circuitry 3074 (on the left of zone 4096X, 4396X and 4496X) to transmit contact 3040 or receive contact 3030, respectively (on the right of the zone 4096X, 4396X and 4496X). In some cases, here, trace 4082A-B, 4382A-B and 4482A-B may represent one of trace 3082 or trace 3081, physically and electronically attaching a transmit circuit or receive circuit 3074 (on the right of zone 4096X, 4396X and 4496X) to a transmit contact 3040 or a receive contact 3030, respectively (on the left of the zone 4096X, 4396X and 4496X).

According to embodiments, zones 4096X, 4396X and 4496X may represent zone 3096 and 3098; and zones 4096X, 4396X and 4496X may represent zone 3092 and 3094 (e.g., as described for FIGS. 30-37). Here, each of trace 4082A-B, 4382A-B and 4482A-B may represent both of trace 3082 and trace 3081, physically and electronically attaching transmit circuitry 3072 and receive circuitry 3074 (on the left of zone 4096X, 4396X and 4496X) to transmit contact 3040 and receive contact 3030, respectively (on the right of the zone 4096X, 4396X and 4496X). In some cases, here, each of trace 4082A-B, 4382A-B and 4482A-B may represent both of trace 3082 and trace 3081, physically and electronically attaching a transmit circuit and receive circuit 3074 (on the right of zone 4096X, 4396X and 4496X) to a transmit contact 3040 and a receive contact 3030, respectively (on the left of the zone 4096X, 4396X and 4496X). According to embodiments, the two chips 3008 and 3009 will have corresponding X,Y lengthwise bump patters similar to pattern 4000 so that the channel length of each location (e.g., of a contact 4040A, 4040B, 4340A, 4340B, 4440A and 4440B) is the same between the chips.

In some cases, each of pair 4010, 4060 and 4065: (1) perform the same functions (e.g., for data signal LDW: traces, functions, transmission and receiving) as, (2) have the same dimensions (e.g., width and height) as, are located in the same chips (e.g., chip 3008 and/or 3009) as, have the same additional via contacts (e.g., see FIGS. 31-32 and 34) as those of pair 3810.

In some cases, each of pair 4010, 4060 and 4065 are different than pair 3810 because: (1) locations 4012-4014, 4312-1711 and 4412-4414 have relative locations three times as far apart (e.g., length L30111 is 3× the length as that between location 3812 and 3814), (2) circuits 4072A-B, 4372A-B and 4472A-B and contacts 4040A-B, 4340A-B and 4440A-B have 3× the length between locations of data signal circuits and contacts (e.g., the length L30111 of traces 4082A-B, 4382A-B and 4482A-B is thrice or 3×PL30), (3) more isolation LDW traces are used to isolate traces 4082A-B, 4382A-B and 4482A-B from other data signal LDW traces (e.g., on the same level LV2 or LSML, LV3 or LSML−1, and LV4 or LSML−2), (4) more levels are used (e.g., surface contacts in level LV1; traces in levels LV2 or LSML, LV3 or LSML−1, and LV4 or LSML−2; data circuits in level LN), are part of channels similar to but have longer channel lengths by length 3×PL30 (e.g., see channel 3076 and channel 3076B but using length L30111 in place of LV1; and lengths CL plus length 4×PL30, and CL2 plus length 2×PL30, respectively). In some cases, embodiments having pair 4010, 4060 and 4065 on chip 3008 and 3009 will have channel 3076 with channel length increased from length CL by length 2×PL30 on chip 3008, plus length 2×PL30 on chip 3009. In some cases, embodiments having pair 4010, 4060 and 4065 on chip 3008 or 3009 will have channel 3076 with channel length increased from length CL2 by length 2×PL30 on chip 3008 or on chip 3009. In some cases, for embodiments having 4010, 4060 and 4065 (and 4080, 4085 and 4087) at chip 3008 and/or 3009 channel 3076 has length CL=(3×L301+H30411+L302+H30511+3×L301), and channel 3076B has length CL2=(H304+L302+H30511+3×L301), where height H30411 is equal to H304+H301+H301 (e.g., height of the interleaved SB pairs on levels LV3 and LV4) and height H30511 is equal to H305+H301+H301 (e.g., height of the interleaved SB pairs on levels LV3 and LV4) (e.g., see FIGS. 31-32, 34 and 38A-40B).

In some cases, pattern 4000 has fourth chip "on-die" interconnection feature zone 4096Y which includes a zone similar to zone 3992Y for a fourth switch buffer (SB) pair 4080. In some cases, zone 4096Y is widthwise adjacent to zone 4096X along width W303. SB pair 4080 may be or include a SB pair of data signal transmit (or receive) circuits similar to that described for zone 4096X. In some cases, SB pair 4080 also includes a switched buffer (SB) pair of surface bump contacts similar to that described for zone 4096X. SB pair 4080 may describe a "triple pitch" or "3×-pitch" SB data signal LDW trace embodiment of chip on-die interconnect features (e.g., where length L30111 is equal to thrice or 3×length PL30) similar to that described for zone 4096X.

Pair 4080 may include a signal data LDW trace (e.g., similar to trace 4082A) physically and electronically coupling transmit circuitry (e.g., similar to circuit 4072A) (on the left of zone 4096Y) to a transmit contact (e.g., similar to contact 4040A) (on the right of the zone 4096Y). Pair 4080 may also include signal data LDW trace (e.g., similar to trace 4082B) physically and electronically coupling transmit circuitry (e.g., similar to circuit 4072B) (on the right of zone 4096Y) to transmit contact (e.g., similar to contact 4040B) (on the left of the zone 4096Y). In some cases, such transmit contacts may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW traces of pair 4080 physically and electronically coupling transmit circuitry of pair 4080 to transmit contacts of pair 4080, may be part of a channel 3076 or 3076B, such as described for pair 4010 (e.g., and transmit contacts 3040 or receive contacts 3030 as described for FIGS. 30-37).

In some cases, pattern 4000 has fifth chip "on-die" interconnection feature zone 4396Y which includes zone 4392Y and fifth switch buffer (SB) pair 4085. In some cases, zone 4396Y is widthwise adjacent to zone 4396X along width W303. SB pair 4085 may be or include a SB pair of data signal transmit (or receive) circuits similar to that described for zone 4396X. In some cases, SB pair 4085 also includes a switched buffer (SB) pair of surface bump contacts similar to that described for zone 4396X. SB pair 4085 may describe a "triple pitch" or "3×-pitch" SB data signal LDW trace embodiment of chip on-die interconnect features (e.g., where length L30111 is equal to thrice or 3×length PL30) similar to that described for zone 4396X.

Pair 4085 may include a signal data LDW trace (e.g., similar to trace 4382A) physically and electronically coupling transmit circuitry (e.g., similar to circuit 4372A) (on the left of zone 4396Y) to a transmit contact (e.g., similar to contact 4340A) (on the right of the zone 4396Y). Pair 4085 may also include signal data LDW trace (e.g., similar to trace 4382B) physically and electronically coupling transmit circuitry (e.g., similar to circuit 4372B) (on the right of zone 4396Y) to transmit contact (e.g., similar to contact 4340B) (on the left of the zone 4396Y). In some cases, such transmit contacts may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW traces of pair 4085 physically and electronically coupling transmit circuitry of pair 4085 to transmit contacts of pair 4085, may be part of a channel 3076 or 3076B, such as described for pair 4060 (e.g., and transmit contacts 3040 or receive contacts 3030 as described for FIGS. 30-37).

In some cases, pattern 4000 has sixth chip "on-die" interconnection feature zone 4496Y which includes zone 4492Y and sixth switch buffer (SB) pair 4087. In some cases, zone 4496Y is widthwise adjacent to zone 4496X along width W303. SB pair 4087 may be or include a SB pair of data signal transmit (or receive) circuits similar to that described for zone 4496X. In some cases, SB pair 4087 also includes a switched buffer (SB) pair of surface bump contacts similar to that described for zone 4496X. SB pair 4087 may describe a "triple pitch" or "3×-pitch" SB data signal LDW trace embodiment of chip on-die interconnect features (e.g., where length L30111 is equal to thrice or 3×length PL30) similar to that described for zone 4496X.

Pair 4087 may include a signal data LDW trace (e.g., similar to trace 4482A) physically and electronically coupling transmit circuitry (e.g., similar to circuit 4472A) (on the left of zone 4496Y) to a transmit contact (e.g., similar to contact 4440A) (on the right of the zone 4496Y). Pair 4087 may also include signal data LDW trace (e.g., similar to trace 4482B) physically and electronically coupling transmit circuitry (e.g., similar to circuit 4472B) (on the right of zone 4496Y) to transmit contact (e.g., similar to contact 4440B) (on the left of the zone 4496Y). In some cases, such transmit contacts may be physically and electronically coupled to corresponding transmit contacts at a location of a package (e.g., package 3010) using solder bumps (e.g., bumps 3018 or 3019), such as described for transmit contacts 3040 or receive contacts 3030 as described for FIGS. 30-37.

In some cases, isolated signal data LDW traces of pair 4087 physically and electronically coupling transmit circuitry of pair 4087 to transmit contacts of pair 4087, may be part of a channel 3076 or 3076B, such as described for pair 4065 (e.g., and transmit contacts 3040 or receive contacts 3030 as described for FIGS. 30-37).

In some cases, pair 4080, 4085 and 4087 (e.g., data signal circuits, contacts, data signal LDW traces, isolation LDW traces and locations (e.g., of surface contacts vertically below circuits/buffers)): (1) perform the same functions (e.g., for data signal LDW: traces, functions, transmission and receiving) as, have the same dimensions (e.g., width and height) as, (2) have the same relative locations (e.g., length L30111 is the same length between data signal circuits and contacts, which is 3×PL30) as, (3) have the same isolation (e.g., data signal LDW traces are isolated by isolation LDW traces from other data signal LDW traces on the same level LV2/LSML, level LV3/LSML−1, and level LV4/LSML−2) as, (4) are located in the same chips (e.g., chip 3008 and/or 3009) as, (5) are in the same levels (e.g., surface contacts in level LV1; data signal and isolation LDW traces in level LV2/LSML, level LV3/LSML−1, and level LV4/LSML−2; and data circuits in level LN) as, (6) have the same additional via contacts (e.g., see FIGS. 31-32 and 34) as, and are part of channels similar and having lengths equal to (e.g., here channel 3076 has length CL=(3×L301+H304+L302+H305+3×L301); and channel 3076B has length CL2=(H304+L302+H305+3×L301) as, those of pair 4010, 4060 and 4065, respectively.

In some cases, traces 4082A, 4382A and 4482A (e.g., zones 4096X, 4396X and 4496X) are each also "isolated" data signal LDW traces that are electronically isolated or shielded from data signal LDW traces of zones 4096Y, 4396Y and 4496Y (e.g., and vice versa) (represented by green lines or shading of figure within width W303) on the same level (e.g., LV2 or LSML; level LV3/LSML−1, and level LV4/LSML−2) by isolation LDW traces (e.g., such as described for traces 3084 and 3083 shielding traces 3082 and 3081 respectively).

In some cases, traces 4082A-B, 4382A-B and 4482A-B (e.g., zones 4096X, 4396X and 4496X) are each also "isolated" data signal LDW traces that are electronically isolated or shielded from all data signal LDW traces of zones 4096Y, 4396Y and 4496Y (e.g., and vice versa) (represented by green lines or shading of figure within width W303) on the levels LV2 or LSML; LV3/LSML−1, and level LV4/

LSML-2 by isolation LDW traces (e.g., such as described for traces 3084 and 3083 shielding traces 3082 and 3081 respectively).

In some cases, these isolation LDW traces may be one or more traces disposed widthwise between (e.g., along width W303, such as at a midpoint of pitch width PW30) and extending lengthwise along where length L30111 of pairs 4010, 4060 and 3965 overlap with length L30111 of pairs 4080, 4085 and 4087.

In some cases, there can be many of SB pairs 4010, 4060, 3965, 4080, 4085 and 4087 on a chip, such as on chip 3008 or 3009. According to embodiments, there can be many SB pairs 4010, 4060, 3965, 4080, 4085 and 4087 on chip 3008 or 3009, as there are pairs of 2 adjacent data signal LDW traces (e.g., pairs of 2 traces 3082 or 3081) on chip 3008 or 3009.

In some cases, the multiple SB pairs 4010+4060+4065 (e.g., the combination of pair 4010 interleaved with pairs 4060 and 4065) and 4080+4085+4087 (e.g., the combination of pair 4080 interleaved with pairs 4085 and 4087) on chip 3008 or 3009 can extend parallel to each other, X,Y lengthwise (e.g., pair 4010+4060+4065 parallel to pair 4080+4085+4087 along the direction of length L30111) and are X,Y horizontally adjacent widthwise (e.g., pair 4010+4060+4065 horizontally adjacent to pair 4080+4085+4087 along width W303). In some cases, the multiple SB pairs 4010+4060+4065 and 4080+4085+4087 on chip 3008 or 3009 can extend parallel to each other, lengthwise (e.g., along L30111) and have X,Y pitch width PW30 horizontally between adjacent widthwise ones of SB pairs 4010+4060+4065 and 4080+4085+4087 (e.g., along width W303).

In some cases, the multiple SB pairs 4010+4060+4065 and 4080+4085+4087 on chip 3008 or 3009 can extend parallel to each other, X,Y lengthwise (e.g., along L30111); be horizontally adjacent X,Y widthwise (e.g., along width W303); and be offset X,Y lengthwise (e.g., the location of a surface contact of 4010+4060+4065 as compared to the location of a surface contact of pair 4080+4085+4087 along direction of length L30111) by length L306. In some cases, L306 may be ½ pitch length PL30 (and in this case ⅙ length L30111). Such an offset may put one horizontal X,Y location 4312 of a circuit and surface contact of a second SB pair 4060 at the X,Y lengthwise midpoint between the two horizontal X,Y locations (leftmost two) of the circuits and surface contacts of a fourth and fifth interleaved SB pair 4080+4085. In some cases, the offset length L306 may be ⅕ length PL30, ¼ length PL30, or ⅓ pitch length PL30. In some cases there may be no offset and the two horizontal X,Y locations of the circuits and surface contacts of pair of SB pairs 4010+4060+4065 and 4080+4085+4087 are lengthwise aligned, and side by side along width W303.

In some cases, length PL30 may be a lengthwise pitch length of directly adjacent contacts such as the lengthwise distance between the center point of two lengthwise adjacent contacts. In some cases, length PL30 may be considered the pitch length for the solder bump surface contacts 3020, 3030 and 3040; and of SB pattern 3800, 3805, 3900, 3905, 4000 and 4005. For example, the solder bump surface contact pitch length PL30 may be a lengthwise distance between each two adjacent contacts (e.g., contacts 3840A-B, 3940B-4240B, and 4040B-4340B), such as shown along lengths L301 (and L303), L3011 (and L3031), L30111 (and L30311) in FIGS. 38A-40B. In some cases, PL30 is between 150 and 155 micrometers (x E-6 meter—"um"). In some cases PL30 equals between 135 and 145 mm. In some cases PL30 equals between 155 and 165 mm. In some cases, it is between 140 and 175 micrometers.

In some cases PL30 equals approximately 150 mm. Thus, in some embodiments L301 (and L303) may be approximately 1×PL30 or 150 mm; L3011 (and L3031) may be approximately 2×PL30 or 300 mm; and L30111 (and L30311) may be approximately 3×PL30 or 450 mm (e.g., for PW30 equal to approximately 150 mm). It can be appreciated that PL30 may depend on a design rule or targeted package and/or silicon technology being used to form chip 3008, chip 3009, and/or package 3010. In some cases, PL30 depends on a design rule or targeted package technology for forming package 3010, such as one that reduces or targets a minimum possible length for PL30. In some cases, length PL30 (e.g., of level LV1) may be a standard package pitch length as known for connecting a semiconductor die or IC chip to a package device (e.g., a package, interface, PCB, or interposer) which may in turn be connected to another die or IC chip, and which may also in turn be mounted onto to a socket, a motherboard, or another next-level component.

In some embodiments, the channel length between the transmit and receive circuits excludes zone 3092 (or pattern 3800, pattern 3900 or pattern 4000) and/or zone 3094 (or pattern 3805, pattern 3905 or pattern 4005). It can be appreciated that in these embodiments, the data channel length is reduced by length L301 (e.g., L301, L3011 or L30111) and/or L303 (e.g., L303, L3031 or L30311). On the other hand, according to other embodiments, including zone 3092 (or pattern 3800, pattern 3900 or pattern 4000) and/or zone 3094 (or pattern 3805, pattern 3905 or pattern 4005) increases the data channel length of system 3070 by length L301 (e.g., L301, L3011 or L30111) and/or L303 (e.g., L303, L3031 or L30311), which results in a longer channel length and cleaner, more high frequency data signal transmission.

In some cases, by using or including SB patterns 3800, 3805, 3900, 3905, 4000 and 4005, it can be appreciated that length L301 (and L303), L3011 (and L3031), L30111 (and L30311) can be extended to be one times, two times or three times the pitch PL30 between each of the adjacent solder bump surface contact. In addition, according to embodiments, by using or including SB patterns 3800, 3805, 3900, 3905, 4000 and 4005, it can be appreciated that each SB pair exchanges its signal TX (or RX) circuitry/buffer locations (e.g., at LN) and its package connection solder bump locations at L301 so that the bumps are electronically shielded and isolated from the circuitry/buffers (e.g., instead of directly on top of them) (see FIGS. 38A-40B).

In some cases, using zone 3096 (or 3896X) or pattern 3800 on chip 3008 as described can extend the data signal channel length by 1×PL30 on chip 3008 (e.g., to have channel length=PL30+H304+L302+H305), which can provide the eye width (EW) and eye height (EH) benefits described for FIGS. 35A-37 for use on the transmission (TX) chip (e.g., chip 3008).

In some cases, using zone 3098 (or 3898X) or pattern 3805 on chip 3009 as described can extend the data signal channel length by 1×PL30 on chip 3009 (e.g., to have channel length=H304+L302+H305+PL30), which can provide the eye width (EW) and eye height (EH) benefits described for FIGS. 35A-37 for use on the receive (RX) chip (e.g., chip 3009).

Also, in some cases, using zones 3096 (or 3896X) and 3098 (or 3898X); or patterns 3800 and 3805 on chips 3008 and 3009 as described can extend the data signal channel length by 1×PL30 on each of chip 3008 and 3009 (e.g., to have channel length=PL30+H304+L302+H305+PL30), which can provide the eye width (EW) and eye height (EH)

benefits described for FIGS. 35A-37 for use on the transmission (TX) chip (e.g., chip 3008) and receive (RX) chip (e.g., chip 3009).

In some cases, using zone 3996X or pattern 3900 on chip 3008 as described can extend the data signal channel length by 2×PL30 on chip 3008 (e.g., to have channel length=2×PL30+H304+L302+H305), which can provide the eye width (EW) and eye height (EH) benefits described for FIGS. 35A-37 for use on the transmission (TX) chip (e.g., chip 3008).

In some cases, using zone 3998X or pattern 3905 on chip 3009 as described can extend the data signal channel length by 2×PL30 on chip 3009 (e.g., to have channel length=H304+L302+H305+2×PL30), which can provide the eye width (EW) and eye height (EH) benefits described for FIGS. 35A-37 for use on the receive (RX) chip (e.g., chip 3009).

Also, in some cases, using zones 3996X and 3998X; or patterns 3900 and 3905 on chips 3008 and 3009 as described can extend the data signal channel length by 2×PL30 on each of chip 3008 and 3009 (e.g., to have channel length=2×PL30+H304+L302+H305+2×PL30), which can provide the eye width (EW) and eye height (EH) benefits described for FIGS. 35A-37 for use on the transmission (TX) chip (e.g., chip 3008) and receive (RX) chip (e.g., chip 3009).

In some cases, using zone 4096X or pattern 4000 on chip 3008 as described can extend the data signal channel length by 3×PL30 on chip 3008 (e.g., to have channel length=3×PL30+H304+L302+H305), which can provide the eye width (EW) and eye height (EH) benefits described for FIGS. 35A-37 for use on the transmission (TX) chip (e.g., chip 3008).

In some cases, using zone 4098X or pattern 4005 on chip 3009 as described can extend the data signal channel length by 3×PL30 on chip 3009 (e.g., to have channel length=H304+L302+H305+3×PL30), which can provide the eye width (EW) and eye height (EH) benefits described for FIGS. 35A-37 for use on the receive (RX) chip (e.g., chip 3009).

Also, in some cases, using zones 4096X and 4098X; or patterns 4000 and 4005 on chips 3008 and 3009 as described can extend the data signal channel length by 3×PL30 on each of chip 3008 and 3009 (e.g., to have channel length=3×PL30+H304+L302+H305+3×PL30), which can provide the eye width (EW) and eye height (EH) benefits described for FIGS. 35A-37 for use on the transmission (TX) chip (e.g., chip 3008) and receive (RX) chip (e.g., chip 3009).

In some cases, width PW30 may be a widthwise pitch length of directly adjacent contacts such as the widthwise distance between the center point of two widthwise adjacent contacts. It can be appreciated that the same pitch width may apply to each row of adjacent surface contacts of FIGS. 30-40B, such as those for zones 3096; 3098; SB pairs in zones 3896 X and Y; SB pairs in zones 3996 X and Y; and SB pairs in zones 4096 X and Y; and the like. FIGS. 38A-40B show pitch with PW30 between adjacent lengthwise rows of contacts. Pitch width PW30 may be a width between two width wise adjacent switched buffer pair, such as between SB pairs in zones 3896 X and Y; SB pairs in zones 3996 X and Y; and SB pairs in zones 4096 X and Y; and the like. In some cases, width PW30 (e.g., of level LV1) may be a standard package pitch width as known for connecting a semiconductor die or IC chip to package device (e.g., a package, interface, PCB, or interposer) which may in turn be connected to another die or IC chip, and which may also in turn be mounted onto to a socket, a motherboard, or another next-level component.

In some cases, the use of "approximately" describes exactly that number. In some cases, the use of "approximately" describes within 10 percent above and below that number. In some cases, the use of "approximately" describes within 5 percent above and below that number. In some cases, the use of "approximately" describes within 2 percent above and below that number. In some embodiments, surface contacts (e.g., contacts 3020, 3020P, 3020G, 3030, 3040, and surface contacts of FIGS. 38-40); via contacts (e.g., contacts 3142, 3152, 3184, 3154, 3252, 3282, 3285, 3284, and via contacts of FIGS. 38-40); solder bumps 3018 and 3019; LDW traces (e.g., 3081, 3082, 3082P, 3082G, 3083, 3083P, 3083G, 3084, and LDW traces of FIGS. 38-40) are formed of a solid conductive (e.g., pure conductor) material. In some cases, they may each be a height (e.g., a thickness), width and length (such as shown and described herein) of solid conductor material.

In some cases, the conductive (e.g., conductor) material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper. In some cases, they all include copper and may include one or more other metals.

Layers of dielectric 3003 (e.g., and material 3603) may each be a height (e.g., a thickness), width and length of solid non-conductive material. The dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride.

Layers of dielectric 3013 (e.g., and other descriptions of dielectric or non-conductive material herein) may each be a height (e.g., a thickness), width and length of solid non-conductive material. In some cases, the dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride. In some cases, it is a pure oxide, non-conductive material.

In some cases, zone 3092 (or pattern 3800, pattern 3900 or pattern 4000) or zone 3094 (or pattern 3805, pattern 3905 or pattern 4005) are part of a field having multiple ones of such a zone of a chip 3008 or 3009 that includes a number of other similar contact, LDW traces and data signal circuits.

It can be appreciated that in addition to the descriptions above, similar data signal circuits; LDW trace routing; and transmit channels as described for FIGS. 30-40 can exist initiating at transmit circuits on chip 3009 and terminating at received circuits on chip 3008 such as to transmit data signal from chip 3009 to 3008 in addition to transmitting from chip 3008 to 3009.

According to some embodiments, it is possible for the integrated circuit (IC) chip "on-die" interconnection features herein to improve signaling to and through a single ended bus or data signal communication channel by (e.g., zone 3092 (or pattern 3800, pattern 3900 or pattern 4000) and/or zone 3094 (or pattern 3805, pattern 3905 or pattern 4005)) being included in that bus or channel.

In some cases, a "single ended" channel or bus includes is capable of successfully sending a high speed data signal through such a channel without using "differential" bus technology or differential bus pairs of positive and negative polarity versions of the same signals (e.g., on two wires or channels).

In some cases, channel 3076 or 3076B (e.g., and the like having (pattern 3800, pattern 3900 or pattern 4000) and/or (pattern 3805, pattern 3905 or pattern 4005)) is or includes a "single ended" data signal channel or bus (e.g., for single ended connections and transmission through semiconductor device packages) originating at circuit 3072 of chip 3008 and extending through features of zone 3092 (or pattern 3800, pattern 3900 or pattern 4000) to contact 3040 in chip 3008; then through a solder bump on contact 3040 and to a package device, through the package device; through a solder bump to contact 3030 of chip 3009; and through features of zone 3094 (or pattern 3805, pattern 3905 or pattern 4005); and to circuit 3074 of chip 3009.

Embodiments herein (e.g., zone 3092 (or pattern 3800, pattern 3900 or pattern 4000) and/or zone 3094 (or pattern 3805, pattern 3905 or pattern 4005)) have described integrated circuit (IC) chip "on-die" interconnection features (and methods for their manufacture) for improved signal connections and transmission through a data signal communication channel from one chip (e.g., chip 3008), through semiconductor device packaging (e.g., package device 3010), and to another component, such as another chip (e.g., chip 3009). Such packaging may include one or more substrate packages and/or printed circuit board (PCB) substrates upon which the integrated circuit (IC) chip and other component are to be attached. Such chip interconnection features may include (1) "last silicon metal level (LSML)" data signal "leadway (LDW) routing" traces isolated between LSLM isolation (e.g., power and/or ground) traces to: (2) add a length of the isolated data signal LDW traces to increase a total length of and tune data signal communication channels extending through a package between two communicating chips and (3) create switched buffer (SB) pairs of data signal channels that use the isolated data signal LDW traces to switch the locations of the pairs data signal circuitry and surface contacts for packaging connection bumps.

More specifically, embodiments herein (e.g., zone 3092 (or pattern 3800, pattern 3900 or pattern 4000) and/or zone 3094 (or pattern 3805, pattern 3905 or pattern 4005)) have described "on-die" LSML (e.g., LV2-LV4 as needed) LDW data signal LDW traces isolated between LDW isolation (e.g., power and ground) traces to (1) create on-die LDW routing/length to increase channel lengths (e.g., see at least FIGS. 30-40B) and (2) provide SB pair switch (e.g., see at least FIGS. 38A-40B). In some cases, chips 3008 and 3009 may represent chips having on-die interconnection features (e.g., zone 3092 (or pattern 3800, pattern 3900 or pattern 4000) and/or zone 3094 (or pattern 3805, pattern 3905 or pattern 4005)) to enable signaling. In some cases, the on-die interconnection features of chip chips 3008 and 3009 include "on-die", LSML that is above the exposed bump contact—first "LV1" level) data signal "leadway" (LDW) routing traces isolated by being between one or more LDW isolation (e.g., power and/or ground) traces. In some cases, device 3009 may represent a chip having on-die interconnection features to enable signaling, having on-die interconnection features as described for chip 3008. In some cases, devices 3008 and 3009 both represent chips having on-die interconnection features to enable signaling as described for chip 3008. In some cases, the isolated on-die data signal leadway (LDW) routing traces can (1) provide LDW routing by adding a (e.g., horizontal channel length) length of the isolated signal traces (along the second level of the chip) that increases a total length of signal communication channel between chip 3008 and another component (e.g., chip 3009) (e.g., see at least FIGS. 30-40B) and (2) to create switched buffer (SB) pair signal channels that use the isolated LDW routing to put the locations of one of the pairs signal circuitry/buffer and at the location of the other of the pairs surface contact for packaging connection bumps, and vice versa (e.g., to exchange the locations of the pair's signal circuitry/buffers and their surface contacts for bumps)(e.g., see at least FIGS. 38A-40B).

According to some embodiments, the proposed isolated data signal LDW trace (e.g., on-die interconnect feature) concepts described for FIGS. 30-40A can be extended to the same or other on-package input output (e.g., data signal channel) configurations with higher data rates (e.g., than the high frequency data signals herein) and higher routing density as well (e.g., greater than the 5 data channels shown in FIGS. 30A-B between circuits 3072 of chip 3008 and circuits 3074 of chip 3009). According to some embodiments, those concepts can also improve the terminated on-package input output (e.g., data signal channel) channel margins by up to 15 percent (e.g., eye height minimums, see at least FIGS. 35A-37).

In some cases, the on-die interconnection features (e.g., zone 3092 (or pattern 3800, pattern 3900 or pattern 4000) and/or zone 3094 (or pattern 3805, pattern 3905 or pattern 4005)) may increase in the stability and cleanliness of high frequency transmit and receive data signals transmitted between the data signal circuits of two chips communicating though a package device upon which they are mounted (e.g., as compared to a data signal transmitting and/or receiving chip without the on-die interconnection features). Such an increased frequency may include data signals having a frequency of between 7 and 25 gigatransfers per second (GT/s). In some cases, GT/s may refer to a number of operations (e.g., transmission of digital data such as the data signal herein) transferring data that occur in each second in some given data transfer channel such as a channel provided by the on-die interconnection features (e.g., zone 3092 (or pattern 3800, pattern 3900 or pattern 4000) and/or zone 3094 (or pattern 3805, pattern 3905 or pattern 4005)); or may refer to a sample rate, i.e. the number of data samples captured per second, each sample normally occurring at the clock edge. 1 GT/s is $10^9$ or one billion transfers per second. In some cases, the on-die interconnection features improves (e.g., reduce) crosstalk (e.g., as compared to a data signal transmitting and/or receiving chip without the on-die interconnection features) from very low frequency transfer such as from 50 mega hertz (MHz) to a GHz transfer level, such as greater than 40 GHz (or up to between 40 and 50 GHz).

In some cases, electrical crosstalk may include interference caused by two signals becoming partially superimposed on each other due to electromagnetic (inductive) or electrostatic (capacitive) coupling between the contacts (e.g., conductive material) carrying the signals. Such electrical crosstalk may include where the magnetic field from changing current flow of a first data signal in one data signal LDW trace in a level induces current in a second data signal LDW trace in the same level. The first and second signals may be flowing in data signal LDW trace extending or running parallel to each other, as in a transformer.

In some cases, the on-die interconnection features (e.g., zone 3092 (or pattern 3800, pattern 3900 or pattern 4000) and/or zone 3094 (or pattern 3805, pattern 3905 or pattern 4005)) are formed using processes or processing as know in the industry for forming traces, interconnects, via contact and surface contacts of an IC chip or die. In some cases, forming them includes using masking and etching of a silicon wafer. In some cases, the masking includes masking with a solder resist and etching dielectric and/or conductor material.

In some cases, forming them includes using chemical vapor deposition (CVD); atomic layer deposition (ALD); growing dielectric material such as from or on a surface having a pattern of dielectric material and conductor material. In some cases, forming them includes patterning a mask using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form openings where the features will exists. Depending on the mask type, the exposed or unexposed areas are removed. In some cases, the mask goes through a thermal cure of some type after the openings (e.g., pattern) are defined. In some cases, the mask may be formed by a process known to form such a mask of a chip, or device formed using IC chip processing.

In some cases, embodiments of processes for forming chips having on-die interconnection features (e.g., zone 3092 (or pattern 3800, pattern 3900 or pattern 4000) and/or zone 3094 (or pattern 3805, pattern 3905 or pattern 4005)) provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIG. 30). In some cases, embodiments of such processes and devices provide the demanded lower cost high frequency data transfer interconnects solution that is needed across the above segments. These benefits may be due to the addition of on-die interconnection features which increase performance and speed of the data transfer.

Some embodiments include chip 3008 and 3009 mounted onto package 3010 such as using solder balls 3018 and 3019. Some embodiments only include chip 3008 and not chip3009 mounted onto package 3010 such as using solder balls 3018. Some embodiments include only chip 3009 and 3008 mounted onto package 3010 such as using solder balls 3019. Some embodiments only include chip 3008, not chip3009, not package 3010 and no solder balls 3018. Some embodiments only include chip 3009, not chip3008, not package 3010 and no solder balls 3019.

Figure 41:
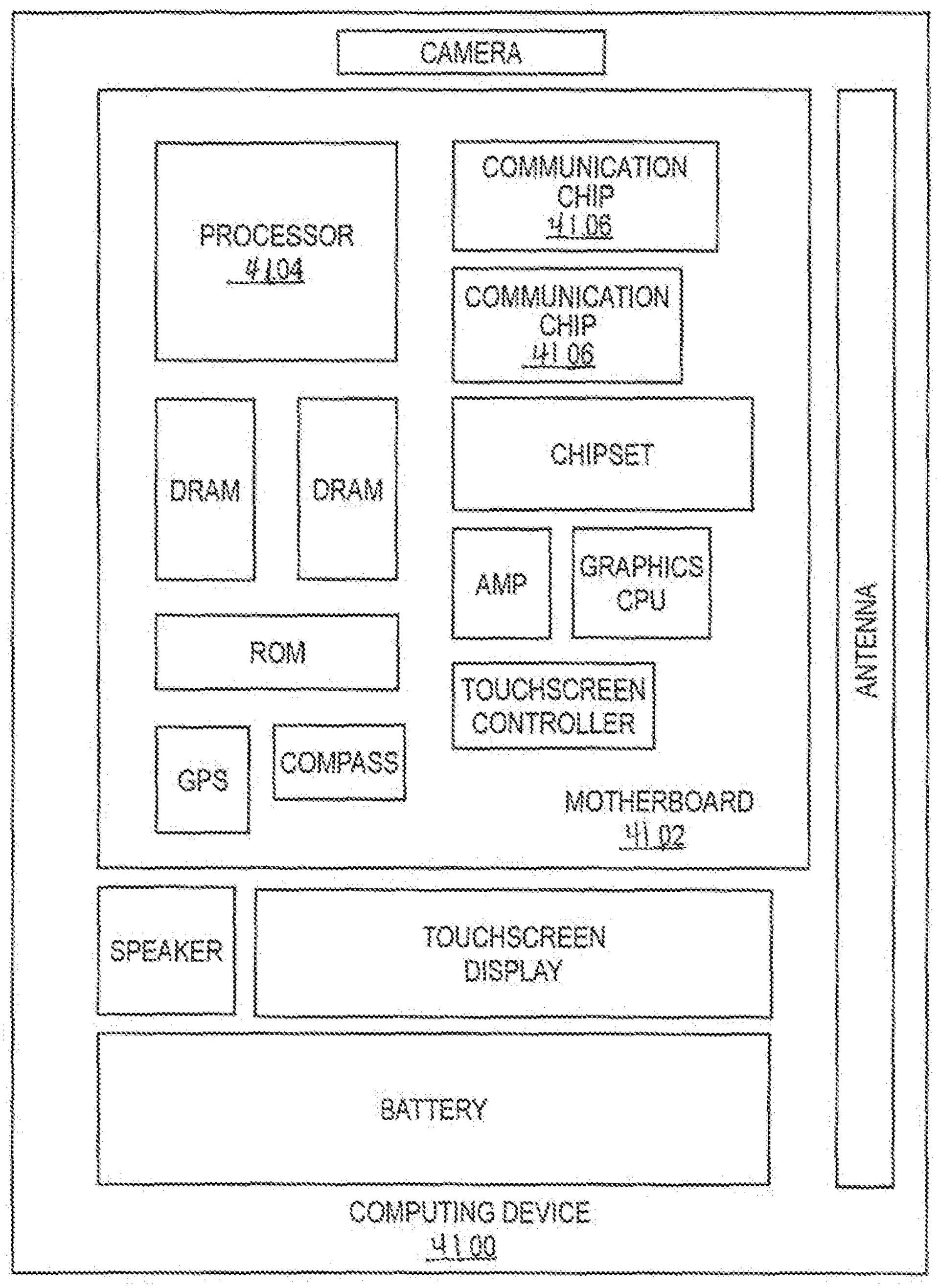
FIG. 41 illustrates a computing device in accordance with one implementation.

FIG. 41 illustrates a computing device in accordance with one implementation. FIG. 41 illustrates computing device 4100 in accordance with one implementation. Computing device 4100 houses board 4102. Board 4102 may include a number of components, including but not limited to processor 4104 and at least one communication chip 4106. Processor 4104 is physically and electrically coupled to board 4102. In some implementations at least one communication chip 4106 is also physically and electrically coupled to board 4102. In further implementations, communication chip 4106 is part of processor 4104.

Depending on its applications, computing device 4100 may include other components that may or may not be physically and electrically coupled to board 4102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 4106 enables wireless communications for the transfer of data to and from computing device 4100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 4106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 4100 may include a plurality of communication chips 4106. For instance, first communication chip 4106 may be dedicated to shorter range wireless communications such as Wi-Fi and Bluetooth and second communication chip 4106 may be dedicated to longer range wireless communications such as GPS, EDGE, GPRS, CDMA, WiMAX, LTE, Ev-DO, and others.

Processor 4104 of computing device 4100 includes an integrated circuit die packaged within processor 4104. In some implementations, the integrated circuit die of the processor includes one or more devices, such as transistors or metal interconnects. In some embodiments, the package of the integrated circuit die or processor 4104 includes embodiments of processes for forming a "on-die interconnection features (e.g., zone 3092 (or pattern 3800, pattern 3900 or pattern 4000) and/or zone 3094 (or pattern 3805, pattern 3905 or pattern 4005))" or embodiments of a "on-die interconnection features (e.g., zone 3092 (or pattern 3800, pattern 3900 or pattern 4000) and/or zone 3094 (or pattern 3805, pattern 3905 or pattern 4005))" as described herein. The term "processor" may refer to any device or portion of a device that processes electronic data from registers and/or memory to transform that electronic data into other electronic data that may be stored in registers and/or memory.

Communication chip 4106 also includes an integrated circuit die packaged within communication chip 4106. In accordance with another implementation, the integrated circuit die of the communication chip includes one or more devices, such as transistors or metal interconnects. In some embodiments, the package of the integrated circuit die or chip 4106 includes embodiments of processes for forming a "on-die interconnection features (e.g., zone 3092 (or pattern 3800, pattern 3900 or pattern 4000) and/or zone 3094 (or pattern 3805, pattern 3905 or pattern 4005))" or embodiments of a "on-die interconnection features (e.g., zone 3092 (or pattern 3800, pattern 3900 or pattern 4000) and/or zone 3094 (or pattern 3805, pattern 3905 or pattern 4005))" as described herein.

In further implementations, another component housed within computing device 4100 may contain an integrated circuit die that includes one or more devices, such as transistors or metal interconnects. In some embodiments, the package of the other integrated circuit die or chip includes embodiments of processes for forming a "on-die interconnection features (e.g., zone 3092 (or pattern 3800, pattern 3900 or pattern 4000) and/or zone 3094 (or pattern 3805, pattern 3905 or pattern 4005))" or embodiments of a "on-die interconnection features (e.g., zone 3092 (or pattern 3800, pattern 3900 or pattern 4000) and/or zone 3094 (or pattern 3805, pattern 3905 or pattern 4005))" as described herein.

In various implementations, computing device 4100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 4100 may be any other electronic device that processes data.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although some embodiments described above show only on-die interconnection features (e.g., zone 3092 (or pattern 3800, pattern 3900 or pattern 4000) and/or zone 3094 (or pattern 3805, pattern 3905 or pattern 4005)) at levels L302-LM, those descriptions can apply to forming or having those same on-die interconnection features at levels L303-LM−1 (e.g., one level above where the features are shown). In another example, although some embodiments described above show only data signal LDW traces and isolation LDW traces at levels L302-L304, those descriptions can apply to forming or having those same LDW traces on more levels (e.g., more SB pairs) such as on levels L302-L305; or on levels L302-L306. The terms used in the following claims should not be construed to limit the invention to the specific implementations disclosed in the specification and the claims. Rather, the scope is to be determined entirely by the following claims, which are to be construed in accordance with established doctrines of claim interpretation.

FIGS. 42-46 may apply to embodiments of an on-die inductor structures to improve signaling. Such embodiments of the invention are related in general, to integrated circuit (IC) chip interconnection features for improved signal connections and transmission to and through a data signal communication channel from one chip, through semiconductor device packaging and to another electronic device or chip, including on-die inductor structures to improve signaling in single ended or serial busses.

Integrated circuit (IC) chips (e.g., "chips", "dies", "ICs" or "IC chips"), such as microprocessors, coprocessors, graphics processors and other microelectronic devices often use package devices ("packages") to physically and/or electronically attach the IC chip to a circuit board, such as a motherboard (or motherboard interface). The IC chip (e.g., "die") is typically mounted within a microelectronic substrate package or package device that, among other functions, enables electrical connections such as to form a data signal communication channel between the chip and a socket, a motherboard, another chip, or another next-level component (e.g., microelectronic device). Some examples of such package devices are substrate packages, interposers, and printed circuit board (PCB) substrates upon which integrated circuit (IC) chips, next-level components or other package devices may be attached, such as by solder bumps.

There is a need in the field for an inexpensive and high throughput process for manufacturing such chips and packages. In addition, the process could result in a high chip yield and an improved data signal communication channel between the chip and package; or between the chip and a next-level component or chip attached to the package. In some cases, there is a need in the field for a chip having better components for providing stable and clean high frequency transmit and receive data signals through a data signal communication channel between its signal transmit or receive circuits, through one or more packages, and to signal receive or transmit circuits of another next-level component or chip attached to the package(s).

As integrated circuit (IC) chip or die sizes shrink (e.g., see chip 4508) and interconnect densities increase, physical and electrical connections require better components for providing stable and clean high frequency transmit and receive data signals between data signal circuitry (e.g., circuit 4572) of a chip and data signal transmission surface contacts (e.g., contact 4530) attached or to be attached to a package device (or two physically attached package devices) upon which the IC chip is mounted or is communicating the data signals. In some cases, there is a need for one or two chips to have better data transmission interconnect features (e.g., components) for providing stable and clean high frequency transmit and receive data signals through a data signal communication channel between data signal transmit or receive circuits of one chip mounted on a package, through one or more packages, and to data signal receive or transmit circuits of another next-level component (e.g., microelectronic device) or chip attached to the package(s). This may include for providing stable and clean data signals through surface contacts (e.g., solder bump contacts) on and electrical connections between (e.g., solder bumps or solder ball grid array (BGA)) the chips and package(s). Some examples of such package devices that may be in the data signal communication channel are one (or two physically attached) of the following: substrate packages, interposers (e.g., silicon interposers), silicon bridges, organic interposers (e.g., or technology thereof), and printed circuit board (PCB) substrates upon or onto which integrated circuit (IC) chips or other package devices may be attached.

In some cases, the data signal communication channel includes connections between the IC chip and a package upon or to which the IC chip is mounted, such as between the chip bottom surface (e.g., solder bump contacts) and other components of or attached to the package. The data signal communication channel may include signals transmitted between upper level signal transmit and receive circuitry and contacts or traces of the chip that will be electrically connected through via contacts to contacts on the bottom surface of the chip. In some cases, the data signal communication channel may extend from IC chip mounted on (e.g., having a bottom surface and/or bottom surface signal contacts of a bottom surface physically soldered and attached to a top surface and/or top surface signal contacts of) a microelectronic substrate package, which is also physically and electronically connected to another package, chip or next-level component. Such data signal communication channel may be a channel for signals transmitted from the chip to contacts on the top surfaces of a package that will be electrically connected through via contacts to lower level contacts or traces of one or more the package, and from there to another chip mounted on the package(s). In many cases, a data signal communication channel must route hundreds or even thousands of high frequency data signals between the IC chip(s) and/or other package devices.

According to some embodiments, it is possible for integrated circuit (IC) chip (e.g., chip 4508) "on-die" interconnection features (such as on-die inductor structures of FIGS. 42-45A-D) to improve signaling by providing higher frequency and more accurate data signal transfer through a data signal communication channel between a bottom interconnect level or surface (e.g., level LV1) of an IC chip mounted on a top interconnect level (e.g., level L1) of the package device and (1) lower levels (e.g., levels Lj-Ll) of the package device, (2) a next-level component of (e.g., another chip mounted on) the package device, or (3) another package device mounted to the top or bottom of the package device (or a next-level component or another chip mounted on the second package device).

According to some embodiments, it is possible for IC chip "on-die" inductor structures to improve signaling by canceling or reducing the effects of capacitance that exists between the data signal output contact of a data signal generation (e.g., transmit or receive) circuit and the data signal surface contact of the chip (e.g., the contact for using a solder bump or ball to attach the chip to another device or package) of a "single ended" channel or bus. According to some embodiments, it is possible for the on-die inductor structures to cancel out parasitic capacitance at (e.g., existing at, measured at, or "looking into") the data signal surface contact or solder bump that may be associated with the active circuitry devices, such as those of the single ended data signal transmit or receive circuitry of the chip.

In some cases, such a chip may be described as a "chip having on-die inductor structures to improve signaling" or a "chip having on-die inductor structures for improved signal connections and transmission through a semiconductor device package channel" (e.g., devices, systems and processes for forming).

In some cases, a "single ended" channel or bus includes is capable of successfully sending a high speed data signal through such a channel without using "differential" bus technology or differential bus pairs of positive and negative polarity versions of the same signals (e.g., on two wires or channels).

According to some embodiments, it is possible for the on-die inductor structures to exist between the data signal (e.g., transmit or receive) circuitry of the chip and other on-die interconnect features that provide additional help with improve signaling by providing higher frequency and more accurate data signal transfer through a data signal communication channel between an IC chip and another device or chip mounted on one or more package device(s). Such other on-die interconnect features may include leadway (LDW) routing and/or LDW traces in same and/or in other levels of the chip, and between the on-die inductor structures and data signal surface contact or die bump contact locations (e.g., on a surface of the chip).

Figure 42:
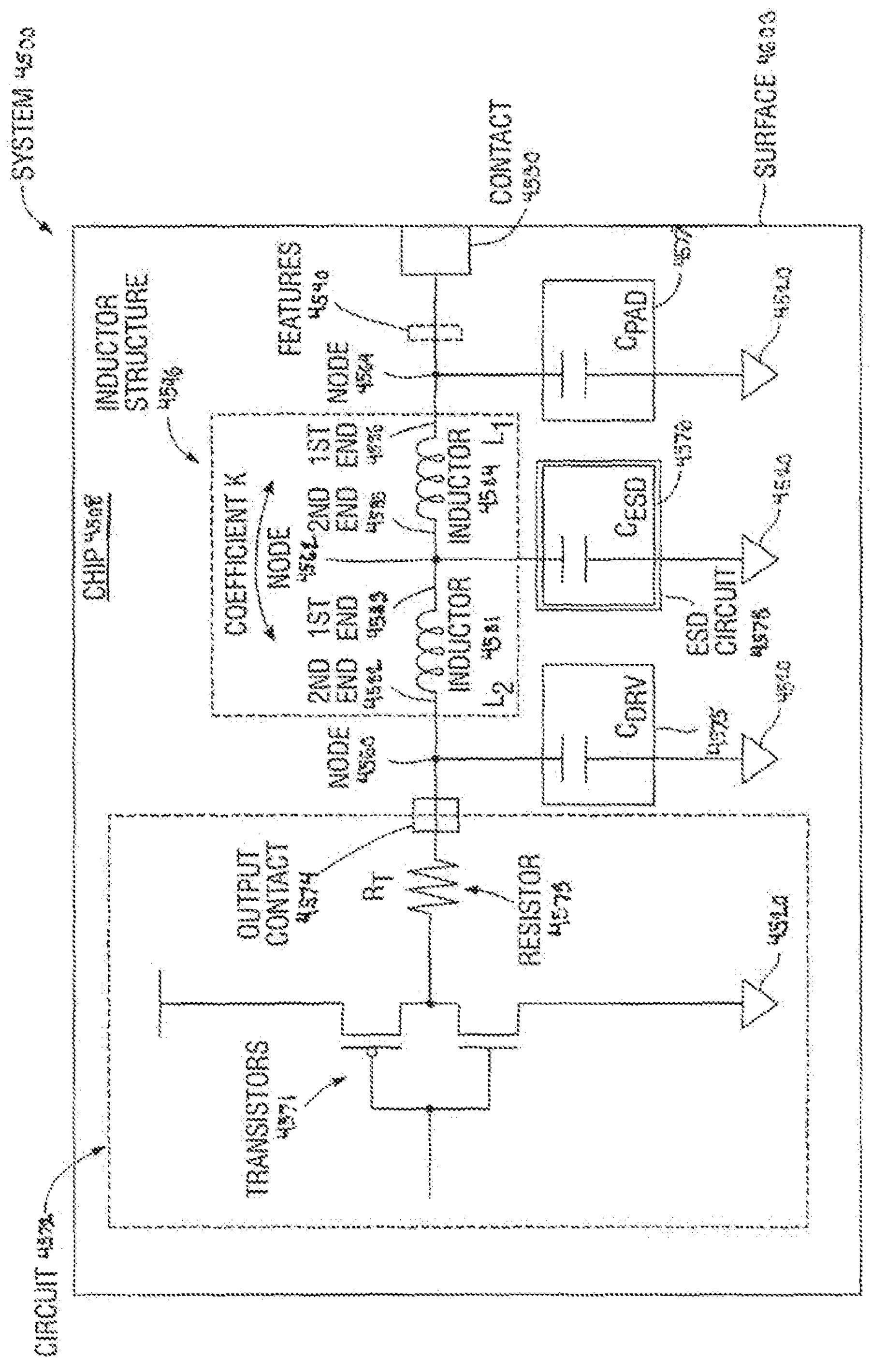
FIG. 42 is schematic view of a computing system including an integrated circuit (IC) chip having "on-die" inductor structures to improve signaling between (e.g., from) a data signal output contact of a data signal circuit and (e.g., to) a data signal surface contact of a chip.

FIG. 42 is schematic view of a computing system including an integrated circuit (IC) chip having "on-die" inductor structures to improve signaling between (e.g., from) a data signal output contact of a data signal circuit and (e.g., to) a data signal surface contact of a chip. FIG. 42 may show a schematic bottom view that includes bottom surface 4603 of chip 4508, but otherwise shows various components, interconnect features, and/or inductor structures that may exist on levels LV1-LV5 that are above bottom surface 4603. FIG. 42 shows computing system 4500 including IC chip 4508 having "on-die" inductor structures 4596 to improve signaling between (e.g., from) a data signal output contact 4574 of a data signal (e.g., transmit or receive) circuit 4572 and (e.g., to) a data signal surface contact 4530 of chip 4508. In some cases, chip 4508 is an integrated circuit chip having inductor structures 4596 (e.g., interconnect features) to improve signaling though a data signal channel of electronic system 4500.

In some cases, system 4500 is or includes a "single ended" data signal channel or bus (e.g., for single ended connections and transmission through semiconductor device packages) originating at circuit 4572 and extending through structures 4596 to contact 4530 in chip 4508; then through a solder bump on contact 4530 and to a package device, through the package device; through a solder bump; and into and through another chip to another data signal circuit.

According to embodiments, contact 4530 may be a data signal surface contact upon which a solder bump may be formed for attaching contacts 4530 to an opposing, upper level data signal contact of a package or another electronic device. Contact 4530 may be a signal surface contact disposed on an exposed horizontal (e.g., bottom) surface 4603 of chip 4508. This bottom surface is shown on the right side of chip 4508 in FIG. 42, but it can be appreciated that it may be a surface contact on the bottom of the chip such as a contact for attaching to an opposing data signal surface contact on an exposed top surface of a package device using a solder bump or ball (or other electrically conductive attachment as known). Contact 4530 may be formed over or on (e.g., having a bottom surface planar with) bottom surface 4603 of bottom level LV1 of chip 4508 (e.g., see FIGS. 42 and 45A-D).

Surface contact 4530 may be electrically coupled to (e.g., with less than 10 Ohm resistance) or physically attached to (e.g., touching) node 4564. This connection may extend through one or more of levels LV1-LV5 of chip 4508 (e.g., see FIGS. 45A-D). In some cases a "node" as described herein may be (or include) a location or part of an electrically conductor material trace or routing connecting two or more electrical components. Node 4564 may be electrically coupled to or physically attached to: (1) first end 4586 of first inductor 4584 (e.g., of the inductor structure 4596), (2) contact 4530 (or features 4540), and (3) capacitance 4577 representing capacitance Cpad of contact 4530.

In some cases, node 4564 represents an electrical node or electrically conductive attachment of contact 4530, first end 4586 and capacitance 4577. In some cases, node 4564 includes one or more on-die signal traces, signal contacts, signal via contacts electrically coupled between first end 4586 of inductor 4584 and contact 4530.

In some cases, capacitance 4577 represents all of the capacitance associated with the signal surface contact 4530. It may represent all of the capacitance between the first end 4586 of first inductor 4584 and the surface contact 4530. In some cases, it also includes the capacitance of the surface contact 4530 and a solder bump formed thereon to connect the surface contact with an opposing contact, such as of a package device. In some cases, capacitance 4577 represents a capacitance value Cpad between node 4564 and ground 4520 (e.g., a ground signal as known in the art). In some cases, the capacitance 4577 includes all of the capacitance of all on-die interconnect features, signal traces, signal contacts, signal via contacts, signal LDW traces, surface contacts, and wiring between node 4564 and the surface contact or pad 4530.

In some cases, capacitance 4577 is a capacitance that is between (e.g., from) contact 4530 (or optionally features 4540 if they exist) and (e.g., to) ground. It may be a capacitance measure at node 4564, from the perspective of end 4586, such as by disconnecting end 4586 from node 4564 and replacing it with a measurement device or meter capable of measuring capacitance, and measuring the capacitance (e.g., 4577) "looking into" contact 4530 (or optionally features 4540 if they exist) while end 4586 is disconnected.

In some cases, capacitance 4577 is between 0.5 and 2.0 pF (pico Farad). In some cases, it is between 0.75 and 1.5 pF. In some cases, it is between 20 and 500 femto (e.g., E-15) Farad (fF). In some cases, it is between 30 and 100 fF. In some cases, it is between 40 and 60 fF. In some cases, it depends on the packaging technology, such as whether structures 4569 are formed using a package or package device design rule, or an IC chip design rule.

In some cases, system 4500 (e.g., chip 4508) includes other on-die interconnect features 4540 that provide additional help with improve signaling by providing higher frequency and more accurate data signal transfer through a data signal communication channel between chip 4508 and another device or chip mounted on one or more package device(s). In this case, capacitance 4577 may include any capacitance due to features 4540, and those due to Cpad described herein (e.g., capacitance looking into contact 4530).

Such other on-die interconnect features may include leadway (LDW) routing and/or LDW traces in same (e.g., levels LV2-LV5) and/or in other levels of the chip as structure 4596, and between node 4564 or (the second end of the second inductor) and data signal surface contact 4530. In some cases, features 4540 are electrically coupled to or physically attached to (e.g., between) node 4564 and contact 4530.

According to embodiments, inductor 4584 may be a first data signal inductor of inductor structure 4596. It may be located in electrical series with and between inductor 4581 and surface 4530. According to embodiments, inductor 4584 may be a passive electrical device inductor that provides inductance L451 between (e.g., from) second end 4585 and (e.g., to) first end 4586 (and in the reverse direction as well). Inductor 4584 may be formed within one or more of levels LV2-LV5 of chip 4508 (e.g., see FIGS. 45A-D).

Inductor 4584 may have first end 4586 electrically coupled or physically attached to node 4564 and second end 4585 electrically coupled or physically attached to node 4562. This connection of end 4585 may extend through one or more of levels LV2-LV5 of chip 4508 (e.g., see FIGS. 45A-D). In some case, inductor 4584 may have first end 4586 electrically coupled or physically attached to contact 4530 (or features 4540) and capacitance 4577; and second end 4585 electrically coupled or physically attached to first end 4583 of inductor 4581 and capacitance 4576.

Node 4562 may be electrically coupled to or physically attached to: (1) a second end 4585 of a first inductor 4584 (e.g., of the inductor structure 4596), (2) a first end 4583 of a second inductor 4581 (e.g., of the inductor structure 4596), and (3) capacitance 4576 representing capacitance Cesd of ESD circuit 4578.

In some cases, node 4562 represents an electrical node or electrically conductive attachment of second end 4585, first end 4583, and capacitance 4576. In some cases, node 4562 includes one or more on-die signal traces, signal contacts, signal via contacts electrically coupled between second end 4585 and first end 4583.

Inductor 4584 may be a first data signal inductor having: (1) second end 4585 electrically coupled (e.g., attached, or with less than 10 ohm resistance) to capacitance value 4576 that represents capacitance Cesd of an electrostatic discharge (ESD) circuit 4578 (e.g., where Cesd is between second end 4585 of first inductor 4584 and ground 4520 when looking at end 4583), and (2) first end 4586 electrically coupled (attached, or with less than 10 ohm resistance) to capacitance value 4577 (inherent Cpad) that represents a capacitance Cpad of the data signal surface contact 4530 (e.g., where Cpad is between the first end 4586 of the first inductor 4584 and ground 4520 when looking at contact 4530) and to the data signal surface contact 4530.

In some cases, electrostatic discharge (ESD) circuit 4578 is or includes an ESD diode to provide ESD protection as known in the art for an IC chip data signal path or channel (e.g., data transmission to and through a channel).

It may be located in electrical series with and between inductor 4584 (e.g., end 4585) and inductor 4581 (e.g., end 4583). According to embodiments, circuit 4578 may provide a discharge of an amount of electrical static or charge buildup (e.g., that is over a threshold level) existing at node 4562, through (e.g., from) circuit 4578 and (e.g., to) ground 4520. It may be formed within levels LV2-LV5 of chip 4508 (e.g., see FIGS. 45A-D).

It can be appreciated that structure 4596 may not be used or relevant in an ESD event, such as when ESD charge is being discharged through circuit 4578 to ground. However, it is noted that inductor 4581 provides a benefit during an ESD event by presenting a high impedance (e.g., inductance L452) for high-frequency ESD currents (e.g., also being discharged through ESD circuit 4578), thus providing additional protection for the transmitter devices from unexpected high-frequency ESD currents.

Capacitance 4576 may be an inherent capacitance of ESD circuit 4578. In some cases, it may include the capacitance of an ESD diode of circuit 4578. In some cases, capacitance 4576 represents all of the capacitance associated with the ESD circuit 4578. It may represent all of the capacitance between the first end 4583 of second inductor 4581 and second end 4585 of first inductor 4584. In some cases, capacitance 4576 represents a capacitance value Cesd between (e.g., from) node 4562, through the ESD circuit 4578, and to ground 4520 (e.g., a ground signal as known in the art).

In some cases, the capacitance 4576 also includes all of the capacitance of any wiring or traces from ends 4583 and 4585 to circuit 4578 (e.g., as well as Cesd of circuit 4578). In some cases, the capacitance 4576 includes all of the capacitance of all on-die interconnect features, signal traces, signal contacts, signal via contacts, signal LDW traces, surface contacts, and wiring between node 4562, through circuit 4578 and to ground 4520.

In some cases, capacitance 4576 is a capacitance that is between (e.g., from) end 4583 and end 4585 and (e.g., to) ground. It may be a capacitance measure at node 4562, from the perspective of ends 4583 and 4585, such as by disconnecting ends 4583 and 4585 from node 4562 and replacing them with a measurement device or meter capable of measuring capacitance, and measuring the capacitance (e.g., 4576) "looking into" circuit 4578 while ends 4583 and 4585 are disconnected.

In some cases, capacitance 4576 is between 0.5 and 2.0 pF (pico Farad). In some cases, it is between 0.75 and 1.5 pF.

According to embodiments, inductor 4581 may be a second data signal inductor of inductor structure 4596. It may be located in electrical series with and between inductor 4584 and output contact 4574. According to embodiments, inductor 4581 may be a passive electrical device inductor that provides inductance L452 between (e.g., from) second end 4582 and (e.g., to) first end 4583 (and in the reverse direction as well). Inductor 4581 may be formed within levels LV3-LV5 of chip 4508 (e.g., see FIGS. 45A-D).

Inductor 4581 may have first end 4583 electrically coupled or physically attached to node 4562 and second end 4582 electrically coupled or physically attached to node 4596. This connection of ends 4583 and 4582 may extend through one or more of levels LV2-LV5 of chip 4508 (e.g., see FIGS. 45A-D). In some case, inductor 4581 may have first end 4583 electrically coupled or physically attached to second end 4585 of inductor 4584 and capacitance 4576; and second end 4582 electrically coupled or physically attached to contact 4574 and capacitance 4575.

Node 4596 may be electrically coupled to or physically attached to: (1) a second end 4582 of a second inductor 4581 (e.g., of the inductor structure 4596), (2) data signal output contact 4574 (e.g., of the circuit 4572), and (3) capacitance 4575 representing capacitance Cdry of data signal output circuit 4572.

In some cases, node 4596 represents an electrical node or electrically conductive attachment of second end 4582, contact 4574, and capacitance 4575. In some cases, node 4596 includes one or more on-die signal traces, signal contacts, signal via contacts electrically coupled between second end 4582 and contact 4574.

Inductor 4581 may be a second data signal inductor having: (1) second end 4583 electrically coupled (e.g., attached, or with less than 10 ohm resistance) data signal output contact 4574 (or to resistor 4573) of the data signal circuit 4572, and to capacitance value 4575 that represents capacitance Cdry of data signal circuit 4572 (e.g., where Cdry is between output contact 4574 and ground 4520); and (2) first end 4583 electrically coupled (attached, or with less than 10 ohm resistance) to second end 4585 of first inductor 4584, and to capacitance value 4576 (inherent Cesd) that represents a capacitance Cesd of the ESD circuit 4578 (e.g., where Cesd is between the second end 4585 of the first inductor 4584, through ESD circuit 4578, and to ground 4520). I some cases, Cesd may be a capacitance between the first end 4583 of the second inductor 4581, through the ESD circuit 84578 and to ground 4520.

In some cases, capacitance 4575 represents all of the capacitance associated with circuit 4572 (e.g., at output contact 4574). It may represent all of the capacitance between the second end 4582 of inductor 4581 and ground (e.g., looking into circuit 4572). In some cases, it also includes the capacitance of contact 4574, resistor 4573 and transistors 4571. In some cases, capacitance 4575 represents a capacitance value Cdry between node 4596 and ground 4520 (e.g., a ground signal as known in the art). In some cases, the capacitance 4575 includes all of the capacitance of all on-die interconnect features, signal traces, signal contacts, signal via contacts, signal LDW traces, surface contacts, and wiring between node 4596 and contact 4574.

In some cases, capacitance 4575 is a capacitance that is between (e.g., from) contact 4574 and (e.g., to) ground. It may be a capacitance measure at node 4596, from the perspective of end 4582, such as by disconnecting end 4582 from node 4596 and replacing it with a measurement device or meter capable of measuring capacitance, and measuring the capacitance (e.g., 4575) "looking into" contact 4574 while end 4582 is disconnected.

In some cases, capacitance 4575 is between 0.5 and 2.0 pF (pico Farad). In some cases, it is between 0.75 and 1.5 pF. In some cases, it is between 100 fF and 10 pF. In some cases, it is between 300 fF and 1 pF. In some cases, it is between 500 fF and 800 fF. In some cases, it depends on the technology of data signal circuit 4572, such as depending on the types and sizes of electronic devices used in circuit 4572.

Data signal circuit 4572 may be or include a data signal circuit (e.g., a transmitter or receiver) of a data signal channel through a package and to another device or chip. Data signal circuit 4572 may represent data signal transmit or receive circuit (TX or RX) disposed on one or more horizontal inner levels within chip 4508 and having a data signal output contact 4574 upon which circuit 4572 can provide a high speed data signal suitable for transmission across a channel having a length of between 3 and 50 mm (e.g., through a package device and) to an opposing data signal circuit (e.g., receive or transmit, respectively) of another electronic device or chip. Data signal circuit 4572 may be a high speed data signal voltage mode driver, transmit circuit, receive circuit 4572, or another data signal circuit as known in the art for transmitting or receiving analog data or digital data at high speeds. Data signal circuit 4572 may be formed within one or more of levels LV3-LVN of chip 4508 (e.g., see FIGS. 4A-D).

In some cases, circuit 4572 (e.g., at contact 4574) may generate a data signal having a speed (e.g., frequency) of between 2 and 10 GHz. In some cases, it may be between 4 and 9 GHz. In some cases, it may be between 7 and 9 GHz. In some cases, it may be 8 GHz.

In some cases, circuit 4572 may include signal output transistors 4571 for outputting a high speed data signal to a first end of resistor 4573 which has a second end electronically attached to data signal output contact 4574. Circuit 4572 (and structures thereof) may be formed within one or more of levels LV3-LV5 of chip 4508 (e.g., see FIGS. 4A-D). In some cases, transistors (e.g., logic and gate structures for a microprocessor) may be located in levels LV5 or higher (e.g., level LN) of chip 4508 (e.g., see FIGS. 4A-D). In some cases, circuit 4572 does not include transistors 4571 or resistor 4573, but has proper circuitry (e.g., as known in the art) to transmit or receive a data signal as described herein. In some cases, circuit 4572 does not include contact 4574, transistors 4571 or resistor 4573, but has proper circuitry (e.g., as known in the art) to transmit or receive a data signal as described herein, such as at node 4596 (e.g., directly and without contact 4574).

In some cases, contact 4574 may represent a location, trace or conductor material contact at which circuit 4572 outputs a high speed data signal. It may be an end of resistor 4573 that is opposite the end of that resistor which is electronically coupled or physically attached to transistors 4571. Contact 4574 may be located in electrical series with and between resistor 4573 and node 4596 (e.g., end 4582). According to embodiments, contact 4574 may provide a high speed data signal having a speed (e.g., frequency) of between 2 and 10 GHz from circuit 4572 for transmission through structure 4596 and to contact 4530 (such as for transmission through a data signal channel through a package and to another device or chip).

In some cases, output contact 4574 may be electrically coupled to (e.g., with less than 10 Ohm resistance) or physically attached to (e.g., touching) node 4596. Node 4596 may be electrically coupled to or physically attached to a second end 4582 of a second inductor 4581 (e.g., of the inductor structure) and capacitance representing Cdrv. Contact 4574 may be formed within one of levels LV3-LV5 of chip 4508 (e.g., see FIGS. 45A-D).

In some cases, resistor 4573 may be or include a resistor at the output of circuit 4572 that provides a selected or predetermined amount of desired resistance Rt (e.g., looking into circuit 4572) for data signal circuit (e.g., a transmitter) of a data signal channel through a package and to another device or chip. Resistor 4573 may be formed within one or more of levels LV3-LV5 of chip 4508 (e.g., see FIGS. 45A-D).

Resistance Rt may be between 10 and 100 Ohms. In some cases it is between 25 and 75 Ohms. In some cases it is between 40 and 60 Ohms. In some cases it is approximately 50 Ohms.

Resistor 4573 may be a passive electrical device resistor, which is electronically coupled or physically attached between transistors 4571 and contact 4574. It may be located in electrical series with and between transistors 4571 and contact 4574. According to embodiments, it may pass a high speed data signal having a speed (e.g., frequency) of between 2 and 10 GHz from circuit 4572 for transmission through structure 4596 and to contact 4530 (such as for transmission through a data signal channel to another device or chip).

In some cases, transistors 4571 may be or include one or more output transistors at the output of circuit 4572 that generate (e.g., a transmitter) or receive a data signal of a data signal channel through a package and to another device or chip. Transistors 4571 may be formed within one or more of levels LV3-LVN of chip 4508 (e.g., see FIGS. 45A-D). In some cases, transistors 4571 may be located in levels LV5 or higher (e.g., level LN) of chip 4508 (e.g., see FIGS. 45A-D). of.

In some cases, transistors 4571 may be active electrical devices, which have an output electronically coupled or physically attached to resistor 4573. They may be located in electrical series with resistor 4573. According to embodiments, they may provide a high speed data signal having a speed (e.g., frequency) of between 2 and 10 GHz from circuit 4572 for transmission through resistor 4573, through structure 4596 and to contact 4530 (such as for transmission through a data signal channel to another device or chip).

Inductor 4584 may represent a first inductor coil having at least one conductive material loop, a first inductance L451, and having coupling coefficient K with inductor 4581. Inductor 4581 may represent a second inductor coil having at least one conductive material loop, a second inductance L452, and having coupling coefficient K with inductor 4584. Inductors 4581 and 4584 may be discrete inductors, or inductors formed as part of an IC chip 4508. In some cases, inductors 4581 and 4584 are formed in levels of IC chip 4508.

In some cases, inductors 4581 and 4584 may be or include conductor material wires or traces in at least one loop or circle in at least one level of IC chip 4508. In some cases, inductors 4581 and 4584 includes multiple loops (e.g. coils, wraps, turns, windings, spirals, curls, rectangles, squares, ovals or circles) of a conductive trace formed on one or more levels of a chip. Each loop may represent one single loop or circle (e.g., 360 degrees of structure or shape having an open center) of a number of loops, coils, wraps, turns, windings, spirals, curls, rectangles, squares, ovals or circles of conductor material. Such as conductor material may be a solid metal (e.g., copper or similar) or alloy trace, wire or other inductor structure as known. In some cases, the one or more loops may be disconnected at a point or area where they are connected through via contacts and a trace on another level.

In some cases, the coupling coefficient K between L451 and L452 may cause a magnetic field of one of the inductors caused by a data signal existing on or being transmitted through that inductor, causing a proportional magnetic field in the other inductor. In some cases the inductors are described as "coupled" inductors based on having the coupling coefficient. In some cases the coupling coefficient is between 5.5 and 7 a data speed of 20 GHz. In some cases it is between 0 and 1 at a data speed of between 4 and 15 GHz. In some cases it is as close to +1 as possible. In some cases it is between 0.5 and 0.8 at a data speed of between 4 and 15 GH. In some cases it is between 0.5 and 0.7 at a data speed of between 4 and 15 GHz.

In some cases, inductors 4581 and 4584 may be located (e.g., on one or more levels of the chip) and electrically coupled (e.g., on one or more levels of the chip) to the data signal surface contact, ESD circuit and data signal circuit so that a data signal transmitted by the data signal circuit flows (e.g., has electrical current moving) in the same direction through the loops of both inductors 4581 and 4584 (e.g., clockwise if circuit 4572 is a data signal transmit circuit, or counterclockwise if circuit 4572 is a data signal receive circuit).

In some cases, inductors 4581 and 4584 may be located (e.g., on one or more levels of the chip) and electrically coupled (e.g., on one or more levels of the chip) to the data signal surface contact, ESD circuit and data signal circuit such that a magnetic field produced by the second inductor when a data signal is output by the data signal circuit towards the data signal circuit output, causes a magnetic field proportional to the data signal by coupling coefficient K, to be received by the first inductor. It can be appreciated that in this case, a magnetic field produced by the first inductor when the data signal is output by the data signal circuit towards the data signal circuit output may also (e.g., at the same time) cause a magnetic field proportional to the data signal by coupling coefficient K, to be received by the second inductor.

In some cases, inductors 4581 and 4584 may be located (e.g., on one or more levels of the chip) and electrically coupled (e.g., on one or more levels of the chip) to the data signal surface contact, ESD circuit and data signal circuit so that a data signal transmitted by the data signal circuit flows (e.g., has electrical current moving) in the same direction through the loops of the first and second inductors, such that a magnetic field produced by the second inductor when the data signal is output by the data signal circuit towards the data signal circuit output, causes a magnetic field proportional to the data signal output by a coupling coefficient amount K, to be received by the first inductor According to embodiments, the on die inductor structures 4596 may be on both of a data transmit chip and a data receive chip of a single data signal channel. In some cases, they will be on the receive chip only. On some cases, they will be on the transmit chip only. Determining whether they are needed on either or both chips may depend on the lossiness of the channel between the transmitter circuit of one chip and the receiver of the other chip.

In some embodiments, chip 4508 is a data signal transmit (e.g., TX) chip having "on-die" inductor structures 4596 to improve signaling from a data signal transmit output contact 4574 of a data signal transmit circuit 4572 to a data signal transmit surface contact 4530 of chip 4508. In some embodiments, chip 4508 is a data signal receive (e.g., RX) chip having "on-die" inductor structures 4596 to improve signaling from a data signal receive surface contact 4530 of a data to a data signal receive output contact 4574 of a data signal receive circuit 4574 of chip 4508.

In some embodiments, a version of chip 4508 that is a data signal transmit (e.g., TX) chip having "on-die" inductor structures 4596 as noted above is mounted onto one area of one or more packages and a second version of chip 4508 that is a data signal receive (e.g., RX) chip having "on-die" inductor structures 4596 is mounted onto another area of the one or more package devices. This may form one or more data signal channels from the data signal transmit circuits 4572 of the version of chip 4508 that is a data signal transmit (e.g., TX) chip, through the one or more package devices and to data signal receive circuits 4572 of the version of chip 4508 that is a data signal receive (e.g., RX) chip. The channels may include solder bumps between surface contacts of the chips and package(s), surface contacts, via contacts traces and other structure of the one or more package devices.

According to embodiments, the on die inductor structures 4596 may be on a data transmit chip, a data receive chip, or both, as noted, for each channel of multiple data signal channels existing between a transmitter circuit of a first chip, extending through one or more package devices, and to a receiver circuit of a second chip. In some cases, there may be between 1 and 500 such channels between the chips. In some cases, there may be between 10 and 400 such channels between the chips. In some cases, there may be between 20 and 200 such channels between the chips. Determining whether they are needed on either or both chips may depend on an analysis of the lossiness of many or all of the channels between the transmitter circuit of one chip and the receiver of the other chip.

Figure 46:
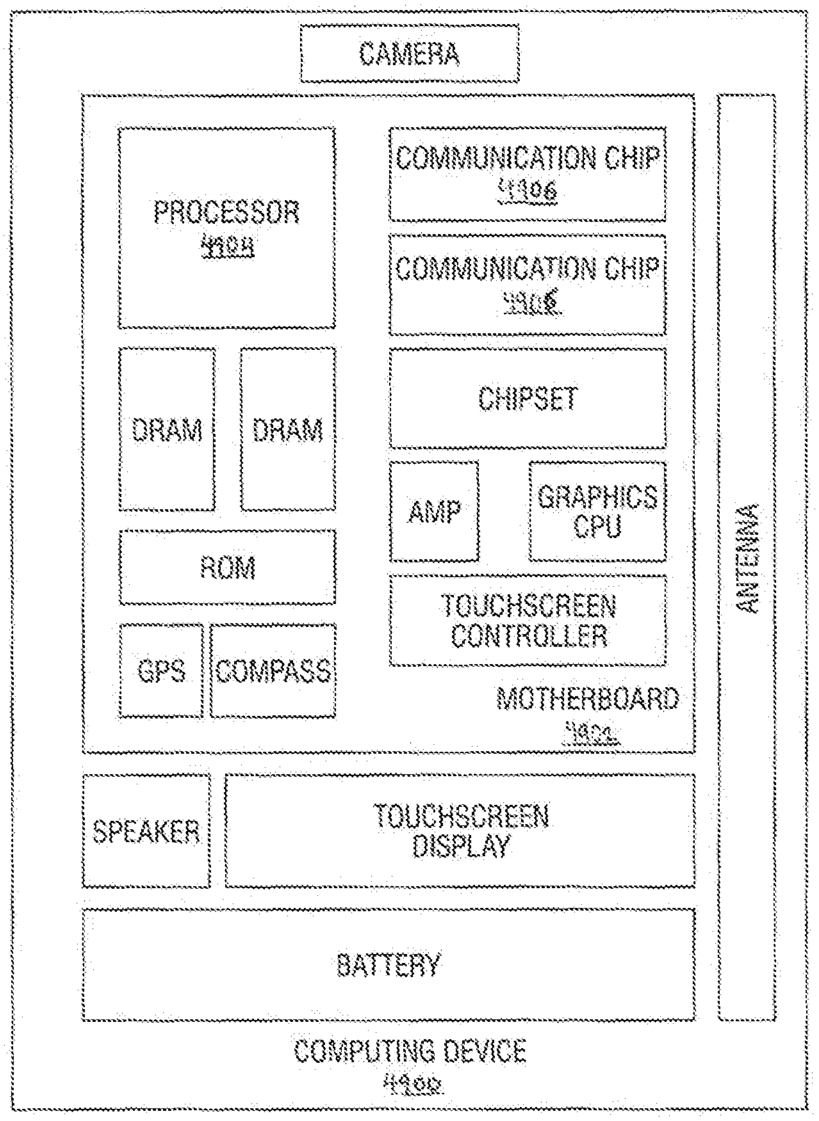
FIG. 46 illustrates a computing device in accordance with one implementation.

FIGS. 46-47 may be examples of a results from or related to (e.g., laboratory or test) experiments or simulations performed on or for a chip having on-package chip inductor structures 4569 described herein that can communicate high speed data signals to a package device, or through one or more package device(s) and to another chip as described herein. In some cases, inductors 4581 and 4584 (e.g., inductor structures 4569) are designed (e.g., the inductance L452 of the second inductor and inductance L451 of the first inductor (and optionally coefficient K) can be selected or predetermined) to cause the impendance measured at (e.g., looking into) the surface contact 4530 to be desired impedance (e.g., resistance, with zero capacitance and zero inductance looking into or at surface contact 4530) at a desired frequency (e.g., see Zout 4624 and frequency 4622 of FIG. 43). In some cases, they are designed to cause the insertion loss measured at (e.g., looking into) the surface contact 4530 to be desired insertion loss (e.g., looking into or at surface contact 4530) at a desired frequency (e.g., see insertion loss 4724 and frequency 4622 of FIG. 44).

Figure 43:
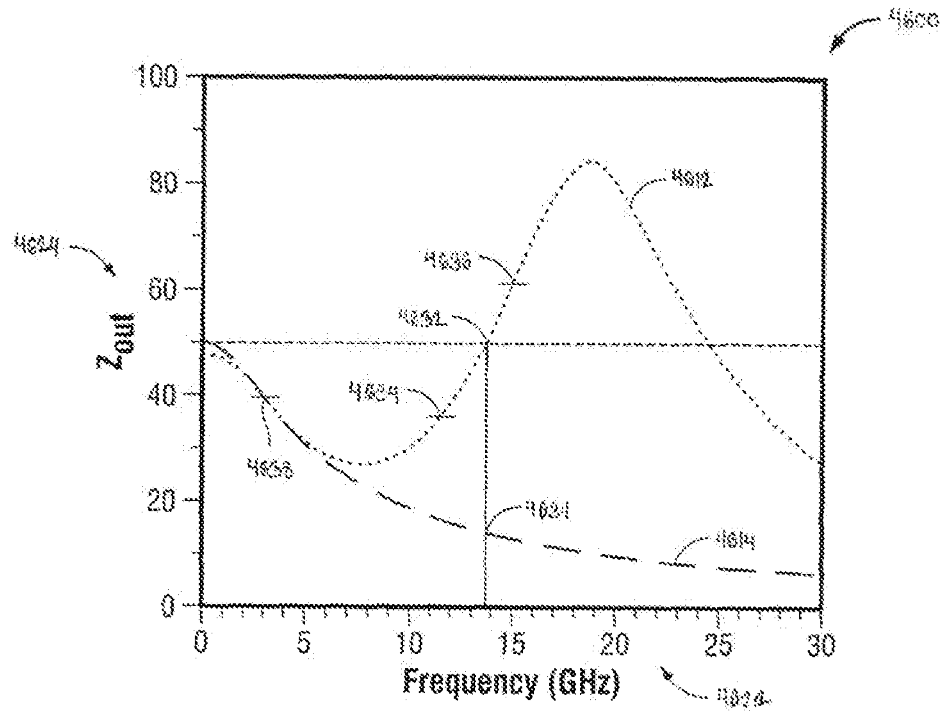
FIG. 43 shows an example of a graph of impedance measured at a data signal surface contact of an IC chip having "on-die" inductor structures to improve signaling between a data signal output contact of a data signal circuit and a data signal surface contact of a chip, and a chip without the inductor structures.

FIG. 43 shows an example of a graph of impedance measured at a data signal surface contact of an IC chip having "on-die" inductor structures to improve signaling between a data signal output contact of a data signal circuit and a data signal surface contact of a chip, and a chip without the inductor structures. FIG. 43 shows graph 4600 of impedance Zout 4624 measured at a data signal surface contact 4530 (e.g., looking into contact 4530 towards node 4564) of an IC chip having "on-die" inductor structures 4569 to improve signaling between a data signal output contact 4574 of a data signal circuit 4572 and a data signal surface contact 4530 of a chip; as compared to a chip without the inductor structures.

FIG. 43 shows graph 4600 having plot 4612 of impedance Zout 4624 for a chip having inductors 4581 and 4584 (e.g., inductor structures 4569) with respect to data signal speed or frequency 4622 (e.g., gigahertz—GHz). FIG. 43 shows graph 4600 having plot 4614 of impedance Zout 4624 for a chip not having (e.g., excluding) inductors 4581 and 4584 (e.g., inductor structures 4569) with respect to data signal speed or frequency 4622. In some cases, frequency 4622 represents data signals having a frequency in gigahertz—GHz. In some cases, frequency 4622 represents data signals having a frequency in gigatransfers per second (GT/s). In some cases, GT/s may refer to a number of operations (e.g., transmission of digital data such as the data signal herein) transferring data that occur in each second in some given data transfer channel such as a channel provided by the on-die inductor structures 4596; or may refer to a sample rate, i.e. the number of data samples captured per second, each sample normally occurring at the clock edge. 1 GT/s is 109 or one billion transfers per second.

In some cases, (e.g., as shown for plot 4612 in FIG. 43) inductors 4581 and 4584 (e.g., for embodiments including inductor structures 4569) are designed or "tuned" (e.g., the inductance L452 of the second inductor and inductance L451 of the first inductor (and optionally coefficient K) are selected or predetermined) to cause the impendence measured at (e.g., looking into) the surface contact 4530 to be a desired impedance that is a resistance of approximately 50 Ohms at crossing 4632 (with approximately zero capacitance and approximately zero inductance) looking into or at surface contact 4530 at a desired frequency of approximately 13.5 GHz at crossing 4632. In some cases, they are designed or "tuned" to cause a desired impedance range that is a resistance of between 40 and 60 Ohms at crossings 4634 and 4636, respectively (with approximately zero capacitance and approximately zero inductance) looking into or at surface contact 4530 at a desired frequency range of between 12 and 15 GHz at crossings 4634 and 4636, respectively.

On the other hand, plot 4614 of impedance Zout 4624 for a chip not having (e.g., excluding) inductors 4581 and 4584 (e.g., inductor structures 4569) with respect to data signal speed or frequency 4622 may represent a chip having only a resistor and capacitor (e.g., RC) load such as with resistor 4573 (resistance Rt) and capacitance (e.g., capacitance equal to capacitance 4575 plus 4576 plus 4577, since the capacitances are not decreased or canceled by inductor structures 4569). In some cases, (e.g., as shown for plot 4614 in FIG. 43) not having inductors 4581 and 4584 (e.g., for embodiments excluding inductor structures 4569) causes the impendence measured at (e.g., looking into) the surface contact 4530 to be an undesired impedance that is a resistance dropping below 40 Ohms (e.g., smaller or fewer Ohms than 40 Ohms) at crossing 4638 (with approximately capacitance=4575 plus 4576 plus 4577) looking into or at surface contact 4530 at a frequency of only approximately 3.5 GHz at crossing 4638. In some cases, not having inductors 4581 and 4584 causes the impendence measured at (e.g., looking into) the surface contact 4530 to be an undesired impedance that is a resistance dropping below 20 Ohms at crossing 4639 (with approximately capacitance=4575 plus 4576 plus 4577) looking into or at surface contact 4530 at a frequency of only approximately 13.5 GHz at crossing 4639.

That is, in some embodiments, while impedance of plot 4612 looking into the driver circuit 4572 from contact 4530 is closer to an ideal 50 Ohms at a high frequency (e.g., 12-14 GHz or GT/S), for the case without the inductor structures 4569 (just RC load) impedance of plot 4614 is below 20 Ohms and has capacitance. Thus, for plot 4612 the impedance is close to 50 Ohm, and the signal reflection at (e.g., looking into) the contact 4530 is smaller, and better for a data signal channel at the high frequencies as described herein. For instance, in some cases, having an impedance above 40 Ohms (e.g., between 40 and 60 Ohms) is extended from 2.5 GHz at crossing 4638 to above 12 GHz at crossing 4634.

Figure 44:
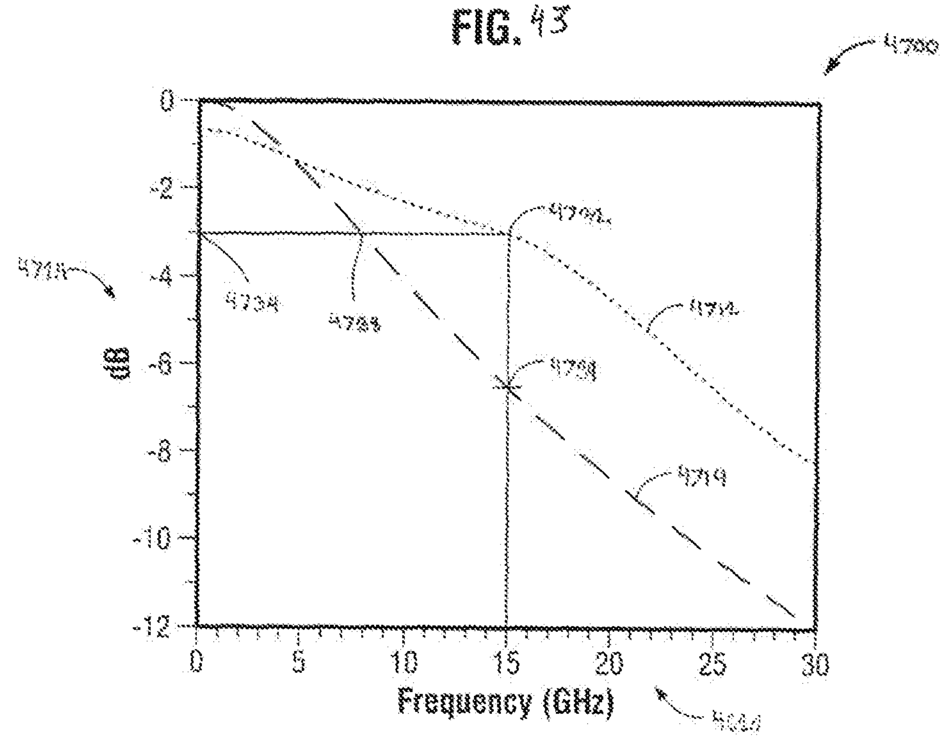
FIG. 44 shows an example of a graph of insertion loss measured at a data signal surface contact of an IC chip having "on-die" inductor structures to improve signaling between a data signal output contact of a data signal circuit and a data signal surface contact of a chip, and a chip without the inductor structures.

FIG. 44 shows an example of a graph of insertion loss measured at a data signal surface contact of an IC chip having "on-die" inductor structures to improve signaling between a data signal output contact of a data signal circuit and a data signal surface contact of a chip, and a chip without the inductor structures. FIG. 44 shows graph 300 of insertion loss 4724 in decibels (dB) 4724 measured at a data signal surface contact 4530 (e.g., looking into contact 4530 towards node 4564) of an IC chip having "on-die" inductor structures 4569 to improve signaling between a data signal output contact 4574 of a data signal circuit 4572 and a data signal surface contact 4530 of a chip; as compared to a chip without the inductor structures. FIG. 44 shows graph 300 having plot 4712 of insertion loss dB 4724 for a chip having inductors 4581 and 4584 (e.g., inductor structures 4569) with respect to data signal speed or frequency 4622 (e.g., gigahertz—GHz). FIG. 44 shows graph 300 having plot 4714 of insertion loss dB 4724 for a chip not having (e.g., excluding) inductors 4581 and 4584 (e.g., inductor structures 4569) with respect to data signal speed or frequency 4622 (e.g., gigahertz —GHz or GT/s).

In some cases, (e.g., as shown for plot 4712 in FIG. 44) inductors 4581 and 4584 (e.g., for embodiments including inductor structures 4569) are designed or "tuned" (e.g., the inductance L452 of the second inductor and inductance L451 of the first inductor (and optionally coefficient K) are selected or predetermined) to cause the insertion loss measured at (e.g., looking into) the surface contact 4530 to be a desired insertion loss that is approximately −3 dB at crossing 4732 looking into or at surface contact 4530 at a desired frequency of approximately 15 GHz at crossing 4732. In some cases, they are designed or "tuned" to cause a desired insertion loss range that is between 0 dB and −3 dB at crossings 4734 and 4732, respectively looking into or at surface contact 4530 at a desired frequency range of between 0 and 15 GHz at crossings 4734 and 4732, respectively.

On the other hand, plot 4714 of insertion loss dB 4724 for a chip not having (e.g., excluding) inductors 4581 and 4584 (e.g., inductor structures 4569) with respect to data signal speed or frequency 4622 may represent a chip having only a resistor and capacitor (e.g., RC) load such as with resistor 4573 (resistance Rt) and capacitance (e.g., capacitance equal to capacitance 4575 plus 4576 plus 4577, since the capacitances are not decreased or canceled by inductor structures 4569). In some cases, (e.g., as shown for plot 4714 in FIG. 44) not having inductors 4581 and 4584 (e.g., for embodiments excluding inductor structures 4569) causes the insertion loss measured at (e.g., looking into) the surface contact 4530 to be an undesired insertion loss that is dropping below −3 dB (e.g., more loss such as more negative than −3 dB along dB 4724) at crossing 4738 (with approximately capacitance=4575 plus 4576 plus 4577) looking into or at surface contact 4530 at a frequency of only approximately 7.5 GHz at crossing 4738. In some cases, not having inductors 4581 and 4584 causes the insertion loss measured at (e.g., looking into) the surface contact 4530 to be an undesired insertion loss that is a resistance dropping below −7 dB at crossing 4739 (with approximately capacitance=4575 plus 4576 plus 4577) looking into or at surface contact 4530 at a frequency of only approximately 15 GHz at crossing 4739.

That is, in some embodiments, while insertion loss of plot 4712 looking into the driver circuit 4572 from contact 4530 is closer to an ideal −3 dB at a high frequency (e.g., 15 GHz or GT/S), for the case without the inductor structures 4569 (just RC load) insertion loss of plot 4714 is below −7 dB. Thus, for plot 4712 the 3 dB insertion loss bandwidth for the data signal at (e.g., looking into) the contact 4530 is larger or extended; and better for a data signal channel at the high frequencies as described herein. For instance, in some cases, it is extended from 7.5 GHz at crossing 4738 to 15 GHz at crossing 4732.

According to some embodiments, capacitances 4575, 4576 and 4577 represent a distributive capacitance between the output contact 4574 of the circuit and the surface contact 4530. According to embodiments, inductors 4581 and 4584 (e.g., inductor structures 4569) are asymmetric inductors that are specifically designed (e.g., can be designed by having selected or predetermined inductance L452 of inductor 4581, inductance L451 of inductor 4584 (and optionally coefficient K)) to cancel out the parasitic capacitance of this distributed capacitance (e.g., see Zout 4624 and loss 4724 versus frequency 4622 of FIGS. 46-47). According to embodiments, inductors 4581 and 4584 (e.g., inductor structures 4569) are "asymmetric" inductors that are specifically designed to have a selected or predetermined inductance L452 of inductor 4581, that is different than (e.g., not equal to) inductance L451 inductor 4584.

In some cases, inductors 4581 and 4584 are asymmetric inductors that are designed to cancel out the parasitic capacitance (e.g., including capacitance 4575, 4576 and 4577) at the output surface contact 4530 (e.g., that would be seen or measured "looking into" the surface contact 4530), where that capacitance is associated with active devices, resistor templates, ESD diodes, and die bumps of chip 4508 that exist in circuit 4572 and in the data signal path from that circuit to contact 4530 (e.g., see Zout 4624 and loss 4724 versus frequency 4622 of FIGS. 46-47). According to some embodiments, inductors 4581 and 4584 may be designed (e.g., have inductance L452 and inductance L451 (and optionally coefficient K) selected or predetermined) based on: (1) a (e.g., known) resistance of the circuit seen at the data signal surface contact 4530, a (e.g., known) capacitance 4575 that represents Cdrv, a (e.g., known) capacitance 4576 that represents Cesd, and a (e.g., known) capacitance 4577 that represents Cpad to cancel out the parasitic capacitance (e.g., including capacitance 4575, 4576 and 4577) at the output surface contact 4530, In some cases, they are specifically designed to cause the impendance measured at (e.g., looking into) the surface contact 4530 to be approximately 50 Ohms and to have zero capacitance or inductance (looking from the compact pad at the driver) at a frequency between 12 and 15 GHz (e.g., see Zout 4624 and loss 4724 versus frequency 4622 of FIGS. 46-47). In some cases, they are designed to cause the impedance to be between 40 and 60 Ohms between 12 and 16 GHz and to have an insertion loss between 0 and −3 dB at a data signal frequency range 8 and 15 GHz (e.g., see Zout 4624 and loss 4724 versus frequency 4622 of FIGS. 46-47).

In some cases, by the nature of inductors 4581 and 4584 being designed to resonate with (e.g., cancel out) any parallel capacitance sources (e.g., including capacitance 4575, 4576 and 4577) at the output surface contact 4530, allow inductor structures 4569 to be used in any other matching networks for serial input and/or output (IO) front-end circuits such as data signal transmitters and receivers (e.g., circuit 4572). In some cases, inductors 4581 and 4584 are designed for the purpose of using the inductor structures 4569 to extend bandwidth and improve return loss (or reduce reflection) at output surface contact 4530 (e.g., that would be seen or measured "looking into" the surface contact 4530), when contact 4530 is externally connected through die bump, package routes, socket, mother board routes, connectors, and/or cables.

In some cases, inductors 4581 and 4584; and a bridging capacitance (internal parasitic capacitance of inductors 4581 and 4584) can be designed (e.g., the inductance L452 of inductor 4581, inductance L451 inductor 4584, and internal parasitic capacitance of inductors 4581 and 4584) can be selected or predetermined) to cause parasitic capacitance 4575 of circuit 4572, capacitance 4576 of circuit 4578, and parasitic capacitance 4577 of contact 4530 to be effectively mitigated resulting in extended surface contact bandwidth and reduced reflection (e.g., at or looking into contact 4530), ultimately improving signal integrity of the entire serial link system (e.g., data signal channel as describe herein).

According to some embodiments, based on: (1) a (e.g., known) resistance of the circuit seen at the data signal surface contact 4530, a (e.g., known) capacitance 4575 that represents Cdrv, a (e.g., known) capacitance 4576 that represents Cesd, and a (e.g., known) capacitance 4577 that represents Cpad, the inductance L452 of the second inductor and inductance L451 of the first inductor (and optionally coefficient K) can be selected (e.g., predetermined or designed): (1) to have the impedance at (e.g., looking into) the contact 4530 be approximately between 30 and 70 ohms for an output signal having a frequency between 7.5 and 17 GHZ; and to have an insertion loss of less than 3 dB between approximately 0 and 15 GHZ (e.g., see FIGS. 46-47); and/or (2) to cause inductors 4581 and 4584 to resonate with/cancel out any parallel capacitance sources (e.g., capacitance 4575, 4576 and 4577) for 10 circuits.

FIGS. 45A-D show various levels of IC chip having "on-die" inductor structures to improve signaling between (e.g., from) a data signal output contact of a data signal circuit and (e.g., to) a data signal surface contact of a chip. FIG. 45A-D may show a schematic bottom view of the bottom surface 4603 of chip 4508 showing components, interconnect features, and/or inductor structures of levels LV2-LV5 that are above bottom surface 4603 in a view from the bottom up. It can be appreciated that this view onto the page of the figure is upside down when compared to a top view of the top surface of the chip or a package device upon which the chip is mounted. FIG. 45A-D show IC chip 4508 having "on-die" inductor structures 4596 on levels LV1-LV5 to improve signaling between (e.g., from) a data signal output contact 4574 (e.g., on level LV2) of a data signal (e.g., transmit or receive) circuit 4572 (e.g., on level LV2 or above) and (e.g., to) a data signal surface contact 4530 (e.g., on surface 4603 of level LV1) of chip 4508. In some cases, inductors 4584 and 4581 are each planar inductors having loops or portions of loops on one or more of levels LV2-LV5 of chip 4508.

FIGS. 45A-D show chip 4508 which has bottom interconnect level LV1 (not shown) with bottom surface 4603 (not shown), below last silicon metal layer (LSML) or second level, LV2 level from the bottom of the chip. Level LV2 is below level LV3 of the chip; level LV3 is below level LV4 of the chip, and level LV4 is below level LV5 of the chip. Level LV1 (not shown) may be considered to "bottom" level such as a lower, lowest or exposed level (e.g., a final build-up (BU) layer, BGA, LGA, or die-backend-like layer) of an IC chip, such as chip 4508 (e.g., such as microprocessor, coprocessor, graphics processor, memory chip, modem chip, or other microelectronic chip devices) which may be mounted onto (or have mounted onto it) a package device (e.g., a socket, an interposer, a motherboard, or another next-level component).

Figure 45A:
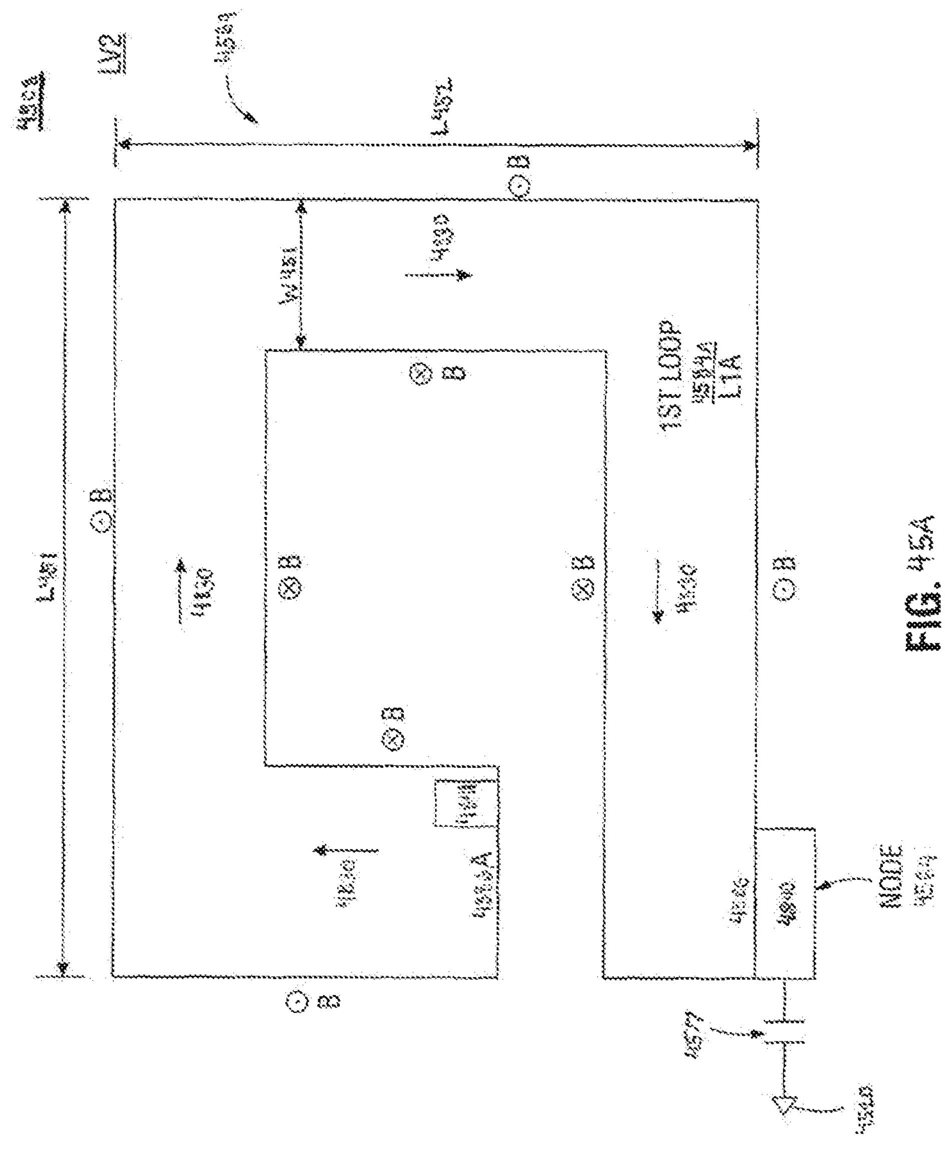
FIGS. 45A-D show various levels of IC chip having "on-die" inductor structures to improve signaling between a data signal output contact of a data signal circuit and a data signal surface contact of a chip.

FIG. 45A show levels LV2 or LSML of IC chip 4508 having a portion of "on-die" inductor 4584 of structures 4569 that improve signaling between (e.g., from) a data signal output contact of a data signal circuit and (e.g., to) a data signal surface contact of a chip.

FIG. 45A shows a schematic bottom view of a LSML or LV2 level of chip 4508 having a first loop 4584A of a first data signal inductor 4584 having a first end 4586 (e.g., the first end of inductor 4584) electrically coupled to (e.g., with less than 10 Ohm resistance) or physically attached to (e.g., touching) node 4564.

In some cases, end 4586 is electrically coupled to or physically attached to via contact 4840 which extends upwards (e.g., extends downwards from a bottom perspective view) to contact 4530 on or at exposed horizontal bottom surface 4603 of level LV1 of chip 4508. Via contact 4840 may represent or be one or more via contacts, contacts, traces or other structure as known for connecting a conductive trace (e.g., end 4586) to a surface contact (e.g., 4530). In some cases, end 4586 is electrically coupled to or physically attached through capacitance 4577 to ground 4520.

FIG. 45A shows first loop 4584A having a second end 4886A opposite end 4586 of loop 4584A and electrically coupled to or physically attached to via contact 4841 which extends downwards (e.g., extend upwards from a bottom perspective view) to loop 4584B on or at of level LV3 of chip 4508. Via contact 4841 may represent or be one or more via contacts, contacts, traces or other structure as known for connecting a conductive trace (e.g., end 4886A) to another conductive trace (e.g., end 4886B) in another level of a chip.

In some cases, loop 4584A may be or include conductor material (e.g., data signal traces) forming more than half or forming 94 percent (e.g., approximately 340 degrees) of a complete or whole loop or circle (e.g., in counterclockwise direction) in level LV2. A complete loop may represent one single loop or circle of structure or shape of conductor material extending 360 around a central axis of the loop (e.g., 360 degrees measured around an axis in a center of a center opening of the loop). Such conductor material may be solid metal (e.g., copper or similar) or alloy trace, wire or other inductor structure as known.

Loop 4584A may have inductance L451A, which is a portion or fraction of inductance L451. In some cases, L451A is approximately 29 percent of L451.

Figure 45B:
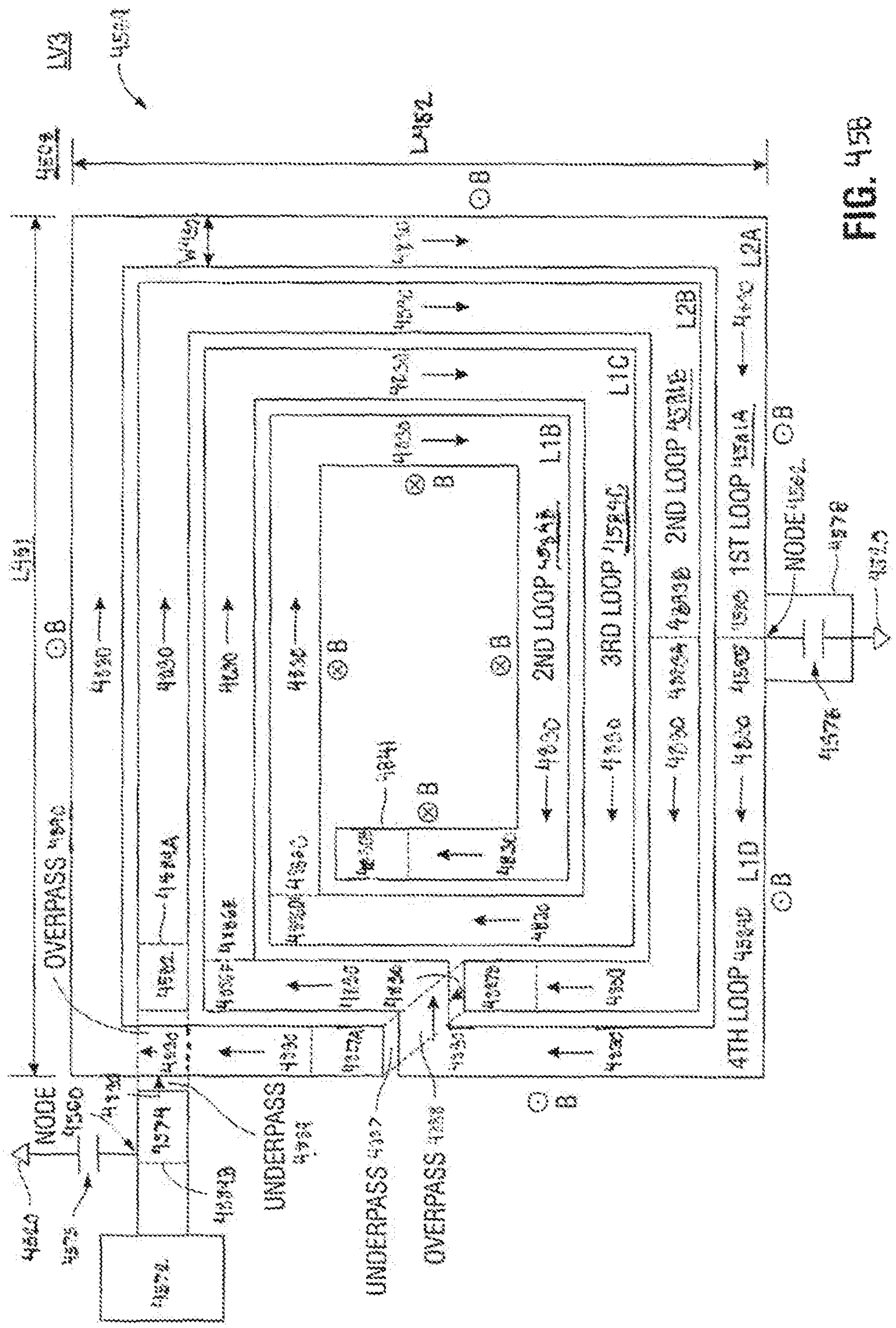

Loop 4584A may create or contribute to magnetic fields or flux B shown going down (e.g., extend upwards from a bottom perspective view) into the page in the center or opening of loop 4584A and coming up (e.g., extend below from a bottom perspective view) out of the page beyond the outer perimeter of loop 4584A. Flux B may also be caused by or contributed to by other loops of inductor 4584 (e.g., 4584B, C and D as shown in FIG. 45B) and by loops of inductor 4581 (e.g., 4584A and B as shown in FIG. 45B).

It can be appreciated that features 4840, 4841 and 4530 may be located on levels other than LV2.

FIG. 45A shows first loop 4584A having a data signal transmitted by the data signal circuit 4572 flowing in direction 4830 (e.g., has positive electrical current moving in direction 4830).

Data signal direction or current flow 4830 for loop 4584A is shown initiating at end 4886A (e.g., from end 4886B, through via contact 4841 and to end 4886A), flowing clockwise through loop 4584A, and exiting through end 4586 (e.g., through via contact 4840) and to contact 4530.

FIG. 45B show levels LV3 or LSML−1 of IC chip 4508 having a portion of "on-die" inductors 4581 and 4584 of structures 4569 that improve signaling between (e.g., from) a data signal output contact of a data signal circuit and (e.g., to) a data signal surface contact of a chip. FIG. 45B is a schematic bottom view of level LV3 above level LV2 and having additional loops of the first inductor 4584 and loops of a second inductor 4581.

FIG. 45B shows second loop 4584B of a first data signal inductor 4584 having a first end 4886B electrically coupled to end 4886A (e.g., with less than 10 Ohm resistance) such as by being physically attached through via contact 4841.

FIG. 45B shows second loop 4584B having a second end 4886C opposite end 4886B of loop 4584B and electrically coupled to or physically attached to end 4886D of loop 4584C.

In some cases, loop 4584B may be or include conductor material (e.g., data signal traces) forming a complete or whole loop or circle (e.g., in counterclockwise direction) in level LV3.

Loop 4584B may have inductance L451B, which is a portion or fraction of inductance L451. In some cases, L451B is approximately 31 percent of L451.

Loop 4584B may create magnetic fields or flux B shown going down (e.g., extend upwards from a bottom perspective view) into the page in the center or opening of structure 4569 and coming up (e.g., extend below from a bottom perspective view) out of the page beyond the outer perimeter of structure 4569. Flux B may also be caused by or contributed to by other loops of inductor 4584 (e.g., 4584A, C and D as shown in FIGS. 45A-B) and by loops of inductor 4581 (e.g., 4584A and B as shown in FIG. 45B).

FIG. 45B shows loop 4584B having a data signal transmitted by the data signal circuit 4572 flowing in direction 4830 (e.g., has positive electrical current moving in direction 4830).

Data signal direction or current flow 4830 for loop 4584B is shown initiating at end 4886C (e.g., from end 4886D), flowing clockwise through loop 4584B, and exiting through end 4886B (e.g., through via contact 4841) and to end 4886A.

FIG. 45B shows third loop 4584C of a first data signal inductor 4584 having a first end 4886D electrically coupled to or physically attached to (e.g., part of the same trace) end 4886C.

FIG. 45B shows third loop 4584C having a second end 4886E opposite end 4886D of loop 4584C and electrically coupled to or physically attached to (e.g., part of the same trace) end 4886F of loop 4584D.

In some cases, loop 4584C may be or include conductor material (e.g., data signal traces) forming a complete or whole loop or circle (e.g., in counterclockwise direction) in level LV3.

Loop 4584C may have inductance L451C, which is a portion or fraction of inductance L451. In some cases, L451C is approximately 31 percent of L451.

Loop 4584C may create magnetic fields or flux B shown going down (e.g., extend upwards from a bottom perspective view) into the page in the center or opening of structure 4569 and coming up (e.g., extend below from a bottom perspective view) out of the page beyond the outer perimeter of structure 4569. Flux B may also be caused by or contributed to by other loops of inductor 4584 (e.g., 4584A, B and D as shown in FIGS. 45A-B) and by loops of inductor 4581 (e.g., 4584A and B as shown in FIG. 45B).

FIG. 45B shows loop 4584C having a data signal transmitted by the data signal circuit 4572 flowing in direction 4830 (e.g., has positive electrical current moving in direction 4830).

Data signal direction or current flow 4830 for loop 4584C is shown initiating at end 468E of loop 4584C of inductor 4584, flowing clockwise through loop 4584C, and exiting through end 4886D and to end 4886C.

FIG. 45B shows fourth loop 4584D of a first data signal inductor 4584 having a first end 4886F electrically coupled to or physically attached to (e.g., part of the same trace) end 4886E.

FIG. 45B shows fourth loop 4584D having a second end 4585 (e.g., the second end of inductor 4584) opposite end 4886F of loop 4584D and electrically coupled to or physically attached to (e.g., part of the same trace) end 4583 of loop 4581A (e.g., the first end of inductor 4581).

In some cases, loop 4584D may be or include conductor material (e.g., data signal traces) forming more than on quarter or forming 33 percent (e.g., approximately 4520 degrees) of a complete or whole loop or circle (e.g., in counterclockwise direction) in level LV3.

Loop 4584D may have inductance L451D, which is a portion or fraction of inductance L451. In some cases, L451D is approximately 10 percent of L451.

Loop 4584D may create magnetic fields or flux B shown going down (e.g., extend upwards from a bottom perspective view) into the page in the center or opening of structure 4569 and coming up (e.g., extend below from a bottom perspective view) out of the page beyond the outer perimeter of structure 4569. Flux B may also be caused by or contributed to by other loops of inductor 4584 (e.g., 4584A, B and C as shown in FIGS. 45A-B) and by loops of inductor 4581 (e.g., 4584A and B as shown in FIG. 45B).

FIG. 45B shows loop 4584D having a data signal transmitted by the data signal circuit 4572 flowing in direction 4830 (e.g., has positive electrical current moving in direction 4830).

Data signal direction or current flow 4830 for loop 4584D is shown initiating at end 4585 of loop 4584D of inductor 4584 (e.g., from end 4583 of loop 4581A of inductor 4581), flowing clockwise through loop 4584D, and exiting through end 4886F and to end 4886E.

Loop 4584D is shown having over pass 4888 such as where loop 4584D and inductor 4584 crosses over (e.g., extend below from a bottom perspective view) underpass 4887 of loop 4581A and inductor 4581. Data signal flow direction 4830 is shown continuing in the clockwise direction through overpass 4888. Overpass 4888 and underpass 4887 may cause or contribute to the data signal flow direction 4830 to be in the same direction for loops of inductors 4581 and 4584. They may also cause or contribute to the magnetic fields or flux B going down (e.g., extend upwards from a bottom perspective view) into the page in the center or opening of structure 4569 and coming up (e.g., extend below from a bottom perspective view) out of the page beyond the outer perimeter of structure 4569.

FIG. 45B shows loop 4584D of a first data signal inductor 4584 having a second end 4585 (e.g., the second end of inductor 4584) electrically coupled to (e.g., with less than 10 Ohm resistance) or physically attached to (e.g., touching) to node 4562.

In some cases, end 4585 is electrically coupled to or physically attached to a via contact which extends upwards or downwards (e.g., extends downwards or upwards, respectively, from a bottom perspective view) to ESD circuit 4578 on or at another level of chip 4508. Such a via contact may represent or be one or more via contacts, contacts, traces or other structure as known for connecting a conductive trace (e.g., end 4585) to an ESD circuit (e.g., 4578). In some cases, end 4585 is electrically coupled to or physically attached through capacitance 4576 to ground 4520.

FIG. 45B shows first loop 4581A of a second data signal inductor 4581 having a first end 4583 (e.g., the first end of inductor 4581) electrically coupled to (e.g., with less than 10 Ohm resistance) or physically attached to (e.g., touching) node 4562.

In some cases, end 4583 is electrically coupled to or physically attached to a via contact which extends upwards or downwards (e.g., extends downwards or upwards, respectively, from a bottom perspective view) to ESD circuit 4578 on or at another level of chip 4508. Such a via contact may represent or be one or more via contacts, contacts, traces or other structure as known for connecting a conductive trace (e.g., end 4583) to an ESD circuit (e.g., 4578). In some cases, end 4583 is electrically coupled to or physically attached through capacitance 4576 to ground 4520.

FIG. 45B shows first loop 4581A of a second data signal inductor 4581 having a first end 4583 (e.g., the first end of inductor 4581) electrically coupled to or physically attached to (e.g., part of the same trace) end 4585 (e.g., the second end of inductor 4584).

FIG. 45B shows first loop 4581A having a second end 483A opposite end 4583 of loop 4581A and electrically coupled to or physically attached to (e.g., part of the same trace) end 483B of loop 4581B.

In some cases, loop 4581A may be or include conductor material (e.g., data signal traces) forming a complete or whole loop or circle (e.g., in counterclockwise direction) in level LV3.

Loop 4581A may have inductance L452A, which is a portion or fraction of inductance L452. In some cases, L452A is approximately 60 percent of L452.

Loop 4581A may create magnetic fields or flux B shown going down (e.g., extend upwards from a bottom perspective view) into the page in the center or opening of structure 4569 and coming up (e.g., extend below from a bottom perspective view) out of the page beyond the outer perimeter of structure 4569. Flux B may also be caused by or contributed to by loops of inductor 4584 (e.g., 4584A, B, C and D as shown in FIGS. 45A-B) and by other loops of inductor 4581 (e.g., 4584B as shown in FIG. 45B).

Loop 4581A is shown having over pass 4890 such as where loop 4581A and inductor 4581 crosses over (e.g., extend below from a bottom perspective view) underpass 4889 of loop 4581B and inductor 4581. Data signal flow direction 4830 is shown continuing in the clockwise direction through overpass 4890. Overpass 4890 and underpass 4889 may cause or contribute to the data signal flow direction 4830 to be in the same direction for loops of inductors 4581 and 4584. They may also cause or contribute to the magnetic fields or flux B going down (e.g., extend upwards from a bottom perspective view) into the page in the center or opening of structure 4569 and coming up (e.g., extend below from a bottom perspective view) out of the page beyond the outer perimeter of structure 4569.

FIG. 45B shows loop 4581A having a data signal transmitted by the data signal circuit 4572 flowing in direction 4830 (e.g., has positive electrical current moving in direction 4830).

Data signal direction or current flow 4830 for loop 4581A is shown initiating at end 483A of loop 4581A of inductor 4581, flowing clockwise through loop 4581A, and exiting through end 4583 of loop 4581A of inductor 4581 (e.g., through end 4583 of loop 4581A of inductor 4581).

Loop 4581A is shown having under pass 4887 such as where loop 4581A and inductor 4581 crosses under (e.g., extend above from a bottom perspective view) overpass 488 of loop 4584D and inductor 4584. Underpass 4887 may include via contacts 4887A-B (e.g., see FIGS. 48B-C) and underpass trace or connection 4887C (e.g., see FIG. 48D). Data signal flow direction 4830 is shown continuing in the clockwise direction through underpass 4887. Underpass 4887 may cause or contribute to (1) direction 4830 being in the same direction for loops of inductors 4581 and 4584; and (2) magnetic fields or flux B going down (e.g., extend upwards from a bottom perspective view) into the page in the center or opening of structure 4569 and coming up (e.g., extend below from a bottom perspective view) out of the page beyond the outer perimeter of structure 4569.

FIG. 45B shows second loop 4581B of a second data signal inductor 4581 having a first end 483B electrically coupled to or physically attached to (e.g., part of the same trace) end 483A.

FIG. 45B shows second loop 4581B having a second end 4582 (e.g., the second end 4582 of inductor 4581) opposite end 4883B of loop 4581A and electrically coupled to (e.g., with less than 10 Ohm resistance) or physically attached to (e.g., touching) to underpass 4889 (e.g., via contact 4889A).

In some cases, loop 4581B may be or include conductor material (e.g., data signal traces) forming more than on half or forming 66 percent (e.g., approximately 240 degrees) of a complete or whole loop or circle (e.g., in counterclockwise direction) in level LV3.

Loop 4581B may have inductance L452B, which is a portion or fraction of inductance L452. In some cases, L452B is approximately 40 percent of L452.

Loop 4581B may create magnetic fields or flux B shown going down (e.g., extend upwards from a bottom perspective view) into the page in the center or opening of structure 4569 and coming up (e.g., extend below from a bottom perspective view) out of the page beyond the outer perimeter of structure 4569. Flux B may also be caused by or contributed to by other loops of inductor 4584 (e.g., 4584A, B, C and D as shown in FIGS. 45A-B) and by loops of inductor 4581 (e.g., 4584A as shown in FIG. 45B).

FIG. 45B shows loop 4581B having a data signal transmitted by the data signal circuit 4572 flowing in direction 4830 (e.g., has positive electrical current moving in direction 4830).

Data signal direction or current flow 4830 for loop 4581B is shown initiating at end 4582 of loop 4581B of inductor 4581 (e.g., from contact 4574 of circuit 4572, through underpass 4889 and to end 4582 of loop 4581B), flowing clockwise through loop 4581B, and exiting through end 483B and to end 483A.

FIG. 45B shows second loop 4581B having a second end 4582 (e.g., the second end 4582 of inductor 4581) opposite end 483B of loop 4581A and electrically coupled to (e.g., with less than 10 Ohm resistance) or physically attached to (e.g., touching) to node 4596.

Loop 4581B is shown having under pass 4889 at end 4582 such as where loop 4581B and inductor 4581 crosses under (e.g., extend above from a bottom perspective view) overpass 4890 of loop 4581A and inductor 4581 and is electrically coupled to or physically attached to contact 4574. Underpass 4889 may include via contacts 4889A-B (e.g., see FIGS. 48B-C) and underpass trace or connection 4889C (e.g., see FIG. 45D). Data signal flow direction 4830 is shown continuing in the clockwise direction through underpass 4889. Underpass 4889 may cause or contribute to (1) direction 4830 being in the same direction for loops of inductors 4581 and 4584; and (2) magnetic fields or flux B going down (e.g., extend upwards from a bottom perspective view) into the page in the center or opening of structure 4569 and coming up (e.g., extend below from a bottom perspective view) out of the page beyond the outer perimeter of structure 4569.

In some cases, end 4582 is electrically coupled to or physically attached to underpass 4889 (e.g., to via contact 4889A) which extends under (e.g., extends over from a bottom perspective view) loop 4581A to output contact 4574 (e.g., of data signal circuit 4572) on or at level LV3 of chip 4508. In some cases, end 4582 is electrically coupled through underpass 4889 to output contact 4574 (e.g., of data signal circuit 4572). In some cases, end 4582 is electrically coupled through underpass 4889 to capacitance 4575 (e.g., at via contact 4889B or at contact 4574); and through capacitance 4575 to ground 4520.

FIG. 45B shows contact 4574 as part of circuit 4572, and circuit 4572 on level LV3. However, in some cases, data signal circuit 4572 (TX or RX; or both) may disposed on a different horizontal inner level within the chip than contact 4574. In such cases, one or more via contacts, contacts, traces or other structure as known for connecting an output contact (e.g., contact 4574) to a data signal circuit may be used to electrically couple contact 4574 to circuit 4572.

Figure 45C:
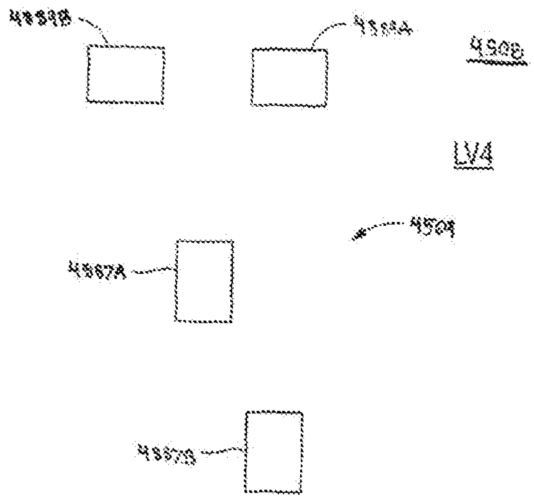

FIG. 45C show level LV4 or LSML-2 of IC chip 4508 having a portion of "on-die" inductor 4581 of structures 4569 that improve signaling between (e.g., from) a data signal output contact of a data signal circuit and (e.g., to) a data signal surface contact of a chip. FIG. 45C shows a schematic bottom view of a level LV4 above level LV3 showing underpass via contacts to underpass connections 4887C and 4889C for underpasses 4887 and 4889 of loops of the second inductor 4581.

FIG. 45C shows via contacts 4887A and B of underpass 4887, such as extending downward from level LV3 through LV4 and to level LV5.

In some cases, a first location (e.g., discontinuation or end on level LV3) of loop 4581A is electrically coupled to or physically attached to via contact 4887A which extends downwards (e.g., extend upwards from a bottom perspective view) to a first end of underpass connection 4887C on or at of level LV5 of chip 4508. Via contact 4887A may represent or be one or more via contacts, contacts, traces or other structure as known for connecting a conductive trace (e.g., the first location of loop 4581A) to another conductive trace (e.g., first end of underpass connection 4887C) in another level (e.g., level LV5) of a chip.

In some cases, a second location (e.g., second discontinuation or end on level LV3) of loop 4581A is electrically coupled to or physically attached to via contact 4887B which extends downwards (e.g., extend upwards from a bottom perspective view) to a second end of underpass connection 4887C on or at of level LV5 of chip 4508. Via contact 4887B may represent or be one or more via contacts, contacts, traces or other structure as known for connecting a conductive trace (e.g., the second location of loop 4581A) to another conductive trace (e.g., second end of underpass connection 4887C) in another level (e.g., level LV5) of a chip.

FIG. 45C also shows via contacts 4889A and B of underpass 4889, such as extending downward from level LV3 through LV4 and to level LV5.

In some cases, end 4582 of loop 4581B is electrically coupled to or physically attached to via contact 4889A which extends downwards (e.g., extend upwards from a bottom perspective view) to a first end of underpass connection 4889C on or at of level LV5 of chip 4508. Via contact 4889A may represent or be one or more via contacts, contacts, traces or other structure as known for connecting a conductive trace (e.g., end 4582 of loop 4581B) to another conductive trace (e.g., first end of underpass connection 4889C) in another level (e.g., level LV5) of a chip.

In some cases, contact 4574 is electrically coupled to or physically attached to via contact 4889B which extends downwards (e.g., extend upwards from a bottom perspective view) to a second end of underpass connection 4889C on or at of level LV5 of chip 4508. Via contact 4889B may represent or be one or more via contacts, contacts, traces or other structure as known for connecting an output contact (e.g., contact 4574) to a conductive trace (e.g., second end of underpass connection 4889C) in another level (e.g., level LV5) of a chip.

Figure 45D:
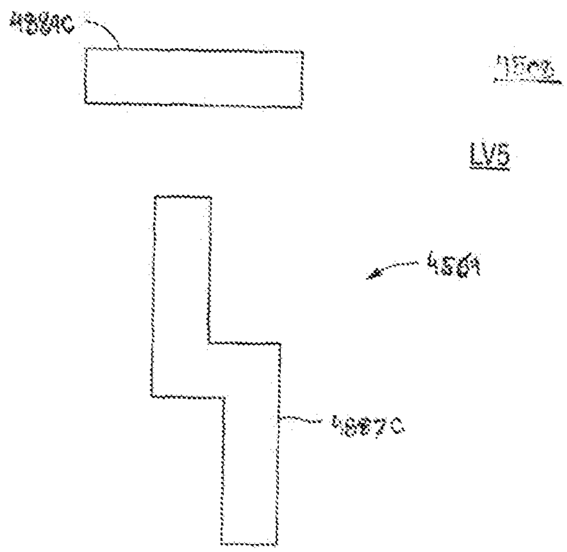

FIG. 45D show level LV5 or LSML-3 of IC chip 4508 having a portion of "on-die" inductor 4581 of structures 4569 that improve signaling between (e.g., from) a data signal output contact of a data signal circuit and (e.g., to) a data signal surface contact of a chip. FIG. 45D shows a schematic bottom view of a level LV5 above level LV4 showing underpass connections 4887C and 4889C for underpasses 4887 and 4889 of loops of the second inductor 4581.

FIG. 45D shows underpass connection 4887C of underpass 4887, extending horizontally on or at level LV5; and electrically coupling or physically connecting via contact 4887A to 4887B.

FIG. 45D shows underpass connection 4889C of underpass 4889, extending horizontally on or at level LV5; and electrically coupling or physically connecting via contact 4889A to 4889B.

In some cases, a "level" may have two layers, such as a lower main or contact layer; and an upper via layer to connect structures on the lower layer with structures above the via layer. In some cases, levels LV2, LV3, and LV5 are "metal layers" in chip 4508, such as layers having metal conductor material structures, contacts and traces for data signal routing. In some cases, levels LV1-LV5 may have via layers between the structure shown in FIGS. 45A-D, such as an upper via layer in levels LV2 and LV3 between the structures shown in FIGS. 45A-D LV2 and LV3. In some cases, level LV4 is a via layer between and for connecting such structures of level LV3 to LV5, such as using via contacts in level LV4. Here, level LV4 may be considered an upper via layer of level LV3 and level LV5 may be considered a fourth layer having metal conductor structures (e.g., LV4')

In some cases, via connection/contact 4840 may exists in an upper via layer of level LV1 to connect contact 4530 in lower contact layer of level LV1 to end 4586 of loop 4584A in a lower layer of level LV2. Also, for example, via connection/contact 4840 may exists in an upper via layer of level LV2 to connect end 4886A of loop 4584A in a lower layer of level LV2 to end 4886B of loop 4584B in a lower layer of level LV3.

According to embodiments, the loops, overpasses, underpasses (e.g., via contacts, connections; and ends of loops), of inductors 4581 and 4584 may be vertically aligned. In some cases, via contact 4840 of loop 4584A extends vertically tangential to the planar shape of loop 4584A (e.g., tangential to level LV2). In some cases, via contact 4841 of loop 4584B extends vertically tangential to the planar shape of loop 4584B (e.g., tangential to level LV3). In some cases, via contacts 4887A, 4887B, 4889A and 4889B of loops 4581A and 189B extend vertically tangential to the planar shape of loops 4581A and 4589B (e.g., tangential to level LV3).

Direction 4830 may be in the same direction through the loops of both inductors 4581 and 4584 (e.g., clockwise). It can be appreciated that for embodiment where circuit 4572 is a receiver circuit, direction 4830 will be in the opposite direction, but will still be in the same direction through the loops of both inductors 4581 and 4584 (e.g., counterclockwise).

Description for broadening embodiments from FIG. 4

According to embodiments, by having the inductor loops 4584B-D and 4581A-B on the same level (e.g., LV3), the coupling coefficient K may be increased, as compared to having those inductor loops on separate levels. According to embodiments, most of the inductor loops of inductor 4584 and of inductor 4581 are on the same level (e.g., LV3), to increase the coupling coefficient K, as compared to having the inductor loops on separate levels. In some cases, each of inductors 4581 and 4584 may have their loops disposed on only two levels above level LV1. In some cases they use two consecutive levels LV1, LV2 or LV3, LV4, or LV4, LV5.

In some cases, one or more underpasses may be used by loops of a first of inductor 4584 and/or of inductor 4581 to "jump across" loops of the other inductor in order for the first inductors signal direction to cross a path of loops of the other inductor.

In some cases, one loop (or more or less) of inductor 4584 may exist at a bottom metal, LSML, LV2 level, extending from a via contact to the surface contact, and looping to a via contact to the LV3 level. From the via contact, inductor 4584 may continue in multiple loops on the LV3 level. It may contact the ESD circuit using a via contact and/or ESD trace on the LV3 level. One of the loops of inductor 4584 may be transitioned or jumped by the underpass of the inductor 4581.

According to embodiments, the parts of structure 4569 (e.g., loops of inductors 4584 and 4581) on level LV5 may have a chip or silicon design rule that is smaller than the parts of structure 4569 (e.g., loops of inductors 4584 and 4581) on levels LV3 and LV4 which may have a on-die interconnect feature design rule which may be smaller than the structure on level LV2 which may have a surface contact or package design rule.

In some cases, there may be isolation structures, such as isolation (e.g., power and/or ground signal) traces, interconnect features, circuit output contacts, surface contacts, package traces, and/or channels between chips, between each adjacent pair of data signal traces, data signal interconnect features, data signal circuit output contacts, data signal surface contacts, package data signal traces, and/or data signal channels between chips.

FIGS. 45A-B show length L451 as a left to right length along level LV2 of loop 4584A, and length L452 as a top to bottom length along level LV2 of loop 4584A. In some cases, length L451 is between 30 and 60 micrometers (um) and length L452 is between 20 and 50 um. In some cases, length L451 is between 40 and 50 micrometers (um) and length L452 is between 30 and 42 um. In some cases, length L451 is between 42 and 47 micrometers (um) and length L452 is between 34 and 38 um.

FIGS. 45A-B show width W451 as a width along level LV2 of loop 4584A, and width W452 as width of loops 4584B-D and 4581A-B along level LV3. In some cases, width W451 is between 2 and 10 um. In some cases it is between 3 and 8 um. In some cases it is between 4.5 and 6.5 um. In some cases, width W452 is between 0.5 and 5 um. In some cases it is between 1 and 3 um. In some cases it is between 1.5 and 2.5 um.

According to embodiments, loop 4584A has vertical height H1 (not shown) as it extends horizontally along level LV2 (e.g., extending in a direction between level LV1 and LV3), and loops 4584B-D and 4581A-B have vertical height H2 (not shown) as they extends horizontally along level LV3 (e.g., extending in a direction between level LV2 and LV4). In some cases, heights H1 and H2 are between 1 and 8 um. In some cases they are between 4 and 8 um. In some cases they are between 5 and 7 um. In some cases they are between 4 and 15 um.

According to embodiments, the structure 4569 (e.g., loops of inductors 4584 and 4581) have or exhibit a total inductance of between 600 and 900 pH; a coupling factor (e.g., K) of between 0.5 and 0.7 at a data speed of 20 GHz; and a quality factor of between 3.5 and 5.5 at a data speed of 20 GHz. In some cases, they have or exhibit a total inductance of between 700 and 800 pH; a coupling factor (e.g., K) of between 0.55 and 0.65 at a data speed of 20 GHz; and a quality factor of between 4 and 5 at a data speed of 20 GHz. In some cases, they have or exhibit a total inductance of approximately 750 pH, a coupling factor (e.g., K) of approximately 0.6 at a data speed of 20 GHz, and a quality factor of approximately 4.5 at a data speed of 20 GHz.

Chip 4508—Bump contacts and contact patterns and surface dielectric

Chip 4508 is shown having bottom surface 4603, such as a bottom, exposed surface of dielectric, upon or in which may be formed (e.g., disposed) contacts 4530, such as in an area. In some cases, contacts 4530 may be described as a signal cluster formed in a lengthwise 4-row deep die-bump pattern.

In some embodiments, computing system 4500 may be part of a system for routing signals from a version of chip 4508 (e.g., including IC chip "on-die" inductor structures 4569) having TX circuit 4572, through a package device, and to another version of chip 4508 (e.g., including IC chip "on-die" inductor structures 4569) having RX circuit 4572 in order to achieve improved signal connections and transmission through a package device.

In some cases, system 4500 has the version of chip 4508 having TX circuit 4572 mounted on a package device at first location; and the version of chip 4508 having RX circuit 4572 mounted on the same package device at second location (or a different if the two package devices have data channels formed through them). In some cases, system 4500 includes the version of chip 4508 having TX circuit 4572, solder bumps physically attaching that chip to a package device at first location, the version of chip 4508 having RX circuit 4572, and solder bumps physically attaching that chip to a package device at second location, such as forming data signal transmit channels from the TX circuits to the RX circuits. The package device may also be mounted on a package, an interposer or a patch. For example, a bottom surface of the package device may in turn be mounted on an interposer or patch using solder bumps or BGAs.

According to embodiments chip 4508 may be an IC chip such as microprocessor, coprocessor, graphics processor, memory chip, modem chip, or other microelectronic chip devices. According to embodiments chip 4508 may be an IC chip capable of being mounted or directly attached onto a socket, an interposer, a motherboard, or another next-level component (e.g., a package device). In some cases, a package device may represent a substrate package, an interposer, a printed circuit board (PCB), a PCB an interposer, a "package", a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices) (e.g., chip 4508).

FIG. 42-45A-D show chip 4508 having chip "on-die" inductor structures 4596 in levels LV2-LV5. Such levels and inductor structures 4569 as described herein may be considered a three dimensional part or portion of an IC chip. Such levels may include various active and passive circuitry; traces; interconnects and/or other structure know to be on an IC chip. FIGS. 42-45A-D show chip 4508 having chip "on-die" inductor structures 4596 in levels LV2-LV5. In some cases, chip 4508 includes levels above level LV5. These levels may include various active and passive circuitry; traces; interconnects and/or other structure know to be on an IC chip. According to embodiments, chip 4508 may include (e.g., on one or more levels above level L2 or above level L5) active microprocessor circuitry and/or hardware logic (e.g., solid state hardware) such as microprocessor processing logic, memory, cache, gates, transistors (e.g., metal oxide semiconductor (MOS) field effect transistor (FET), fin FET and the like) as known to be on or part of an IC chip such as a central processing unit (CPU), microprocessor, coprocessor, graphics processor, memory chip, modem chip, or other microelectronic chip devices. A portion of such circuitry and/or logic may by electrically coupled or physically attached to circuits 4572 (e.g., transistors 4571) and 4578. According to embodiments, chip 4508 may include (e.g., on one or more levels above level L2 or L5) active microprocessor circuitry and/or hardware logic of a multipurpose, clock driven, register based, programmable electronic device which accepts digital or binary data as input (e.g., at contact 4530 of a channel having circuit 4572 and an RX data signal circuit), processes it according to instructions stored in its memory, and provides results as output (e.g., at contact 4530 of a channel having circuit 4572 and a TX data signal circuit). According to embodiments, chip 4508 may contain both combinational logic and sequential digital logic; and may operate on numbers and symbols represented in the binary numeral system.

In some cases, the use of "level" describes a "layer" of material (e.g., dielectric and/or conductive material) of a chip as known. In some cases, the use of a top, bottom, and/or last silicon metal "level" describes a top, bottom, and/or last silicon metal "layer" of material (e.g., dielectric and/or conductive material) of a chip as known. In some cases, a "level" may have two layers, such as a lower main or contact layer; and an upper via layer to connect structures on the lower layer with structures above the via layer.

FIG. 42-45A-D show chip 4508 having chip "on-die" inductor structures 4596 in levels LV2-LV5. In some cases, only dielectric material (in some cases shown by blank areas of figures not having labeled or named features) fills in any space between (e.g., above, below, and beside such as in the length, width and height directions) the chip on-die inductor structures 4596 in levels LV2-LV5. In some cases, dielectric material and various active and passive circuitry; traces; interconnects and/or other structure know to be on an IC chip fill in any space between, but do not interfere with the electrical function of the chip on-die inductor structures 4596 in levels LV2-LV5. In some cases, filling in the space between the interconnect features includes existing in any space where those features do not exist, and are not physically attached to (e.g., are not touching) each other. In some cases, filling in the space between the interconnect features includes separating each and all of those features except where they are coupled or physically attached to each other.

In some cases the data signal transmit signals described herein are high frequency (HF) data signals (e.g., TX data signals). In some cases, the signals have a speed of between 4 and 10 gigatransfers per second (GT/s). In some cases, the signals have a speed of between 6 and 8 gigatransfers per second. In some cases, the signals have a speed of between 4 and 5 Gigabits per second. In some cases, the speed is between 4 and 4.5 Gigabits per second. In some cases, the signals have a speed of between 2 and 12 Gigabits per second. In some cases, the signals have a speed of between 3 and 12 Giga-Transfers per second. In some cases the signals have a speed between 7 and 25 GT/s; and a voltage of between 0.5 and 2.0 volts. In some cases the signal has a speed between 6 and 15 GT/s. In some cases the signal has a voltage of between 0.4 and 5.0 volts. In some cases it is between 0.5 and 2.0 volts. In some cases it is a different speed and/or voltage level that is appropriate for receiving or transmitting data signals through or within a package device. In some cases, they are in a range between a very low speed transfer rate such as from 50 MT/s to greater than 40 GT/s (or up to between 40 and 50 GT/s). In some cases, the speeds above are a data rate or data transfer rate of how many bit can be transferred in 1 second at a single wire or an input or output (IO) wire, channel or trace.

In some cases the ground signals described herein is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

In some cases, the use of "approximately" describes exactly that number. In some cases, the use of "approximately" describes within 10 percent above and below that number. In some cases, the use of "approximately" describes within 5 percent above and below that number. In some cases, the use of "approximately" describes within 2 percent above and below that number.

In some embodiments, surface contacts 4530 (optional features 4540); output contact 4574; inductors 4584 and 4581; via contacts 4840 and 4841; inductor loops 4584A-D and 4581A-B; underpass via contacts 4887A, 4887B, 4889A and 498B; underpass connections 4887C and 4889C; and overpass 4888 and 4890 (e.g., parts of loops 4584D and 4581A respectively) are formed of a solid conductive (e.g., pure conductor) material. In some cases, they may each be a height (e.g., a thickness), width and length (such as shown and described herein) of solid conductor material.

In some cases, the conductive (e.g., conductor) material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper. In some cases, they all include copper and may include one or more other metals.

Layers of dielectric or dielectric material (in some cases shown by blank areas of figures not having labeled or named features) may each be a height (e.g., a thickness), width and length of solid non-conductive material. The dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride. In some cases, it is a pure oxide, non-conductive material.

In some cases, the on-die inductor structures 4569 (e.g., inductors 4584 and 4581) may increase in the stability and cleanliness of high frequency transmit and receive data signals transmitted between the data signal circuits of two chips communicating though a package device upon which they are mounted (e.g., as compared to a data signal transmitting and/or receiving chip without the on-die inductor structures). Such an increased frequency may include data signals having a frequency of between 7 and 25 gigatransfers per second (GT/s). In some cases, GT/s may refer to a number of operations (e.g., transmission of digital data such as the data signal herein) transferring data that occur in each second in some given data transfer channel such as a channel provided by the on-die inductor structures; or may refer to a sample rate, i.e. the number of data samples captured per second, each sample normally occurring at the clock edge. 1 GT/s is 109 or one billion transfers per second. In some cases, the on-die interconnection features improves (e.g., reduce) crosstalk (e.g., as compared to a data signal transmitting and/or receiving chip without the on-die interconnection features) from very low frequency transfer such as from 50 mega hertz (MHz) to a GHz transfer level, such as greater than 40 GHz (or up to between 40 and 50 GHz).

In some cases, the on-die inductor structures 4569 (e.g., inductors 4584 and 4581) are formed using processes or processing as know in the industry for forming traces, interconnects, via contact and surface contacts of an IC chip or die. In some cases, forming them includes using masking and etching of a silicon wafer. In some cases, the masking includes masking with a solder resist and etching dielectric and/or conductor material.

In some cases, forming them includes using chemical vapor deposition (CVD); atomic layer deposition (ALD); growing dielectric material such as from or on a surface having a pattern of dielectric material and conductor material. In some cases, forming them includes patterning a mask using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form openings where the features will exists. Depending on the mask type, the exposed or unexposed areas are removed. In some cases, the mask goes through a thermal cure of some type after the openings (e.g., pattern) are defined. In some cases, the mask may be formed by a process known to form such a mask of a chip, or device formed using IC chip processing.

In some cases, embodiments of processes for forming chips having on-die inductor structures 4569 (e.g., inductors 4584 and 4581) provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIG. 42). In some cases, embodiments of such processes and devices provide the demanded lower cost high frequency data transfer interconnects solution that is needed across the above segments. These benefits may be due to the addition of on-die inductor structures 4569 (e.g., inductors 4584 and 4581) which increase performance and speed of the data transfer.

FIG. 46 illustrates a computing device in accordance with one implementation. FIG. 46 illustrates computing device 4900 in accordance with one implementation. Computing device 4900 houses board 4902. Board 4902 may include a number of components, including but not limited to processor 4904 and at least one communication chip 4906. Processor 4904 is physically and electrically coupled to board 4902. In some implementations at least one communication chip 4906 is also physically and electrically coupled to board 4902. In further implementations, communication chip 4906 is part of processor 4904.

Depending on its applications, computing device 4900 may include other components that may or may not be physically and electrically coupled to board 4902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 4906 enables wireless communications for the transfer of data to and from computing device 4900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 4906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 4900 may include a plurality of communication chips 4906. For instance, first communication chip 4906 may be dedicated to shorter range wireless communications such as Wi-Fi and Bluetooth and second communication chip 4906 may be dedicated to longer range wireless communications such as GPS, EDGE, GPRS, CDMA, WiMAX, LTE, Ev-DO, and others.

Processor 4904 of computing device 4900 includes an integrated circuit die packaged within processor 4904. In some implementations, the integrated circuit die of the processor includes one or more devices, such as transistors or metal interconnects. In some embodiments, the package of the integrated circuit die or processor 4904 includes embodiments of processes for forming "on-die inductor structures 4569 (e.g., inductors 4584 and 4581)" or embodiments of "on-die inductor structures 4569 (e.g., inductors 4584 and 4581)" as described herein. The term "processor" may refer to any device or portion of a device that processes electronic data from registers and/or memory to transform that electronic data into other electronic data that may be stored in registers and/or memory.

Communication chip 4906 also includes an integrated circuit die packaged within communication chip 4906. In accordance with another implementation, the integrated circuit die of the communication chip includes one or more devices, such as transistors or metal interconnects. In some embodiments, the package of the integrated circuit die or chip 4906 includes embodiments of processes for forming "on-die inductor structures 4569 (e.g., inductors 4584 and 4581)" or embodiments of "on-die inductor structures 4569 (e.g., inductors 4584 and 4581)" as described herein.

In further implementations, another component housed within computing device 4900 may contain an integrated circuit die that includes one or more devices, such as transistors or metal interconnects. In some embodiments, the package of the other integrated circuit die or chip includes embodiments of processes for forming “on-die inductor structures 4569 (e.g., inductors 4584 and 4581)” or embodiments of “on-die inductor structures 4569 (e.g., inductors 4584 and 4581)” as described herein.

In various implementations, computing device 4900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 4900 may be any other electronic device that processes data.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although some embodiments described above show only on-die inductor structures 4569 (e.g., inductors 4584 and 4581) at levels LV2-LV5, those descriptions can apply to forming or having those same on-die inductor structures 4569 (e.g., inductors 4584 and 4581) at levels LV3-LV6 (e.g., one level above where the features are shown). The terms used in the following claims should not be construed to limit the invention to the specific implementations disclosed in the specification and the claims. Rather, the scope is to be determined entirely by the following claims, which are to be construed in accordance with established doctrines of claim interpretation.

FIGS. 47-52 may apply to embodiments of die to die channel interconnect configurations to improve signaling. Such embodiments of the invention are related in general, to die to die channel interconnect configurations to improve signaling (e.g., for improved signal connections and transmission) to and through a single ended bus data signal communication channel from one chip; through one or more semiconductor device packages; and to another electronic device or chip.

FIG. 47 is schematic cross-sectional side view of a computing system (e.g., computing configuration), including die to die interconnect configurations for improved signal connections and transmission through a data signal channel extending through a semiconductor device package.

FIG. 47 shows computing system 5000 (e.g., a system routing signals from a computer processor or chip such as chip 5008 to another device such as chip 5009), including chip 5008 mounted on a first area 5001 of package 5010 and connected through channel 5076 to chip 5009 which is on a second area 5011 of package 5010. FIG. 47 shows computing system 5000 including die to die interconnect configurations, features and circuitry on chips 5008 and 5009; and on package 5010 for improved signal connections and transmission through semiconductor package device 5010. In some cases, system 5000 has chip 5008 mounted on package 5010 at first location 5001; and chip 5009 mounted on chip 5010 at second location 5011. In some cases, system 5000 includes chip 5008, solder bumps 5018 physically attaching chip 5008 to package 5010 at first location 5001, chip 5009, solder bumps 5019 physically attaching chip 5009 to package 5010 at second location 5011. Package 5010 may also be mounted on an interposer or patch. For example, a bottom surface of chip 5008 is mounted on top surface 5003 of package 5010 at first location 5001 using solder bumps or ball grid array (BGA) 5018. A bottom surface of chip 5009 is mounted on surface 5003 of package 5010 at location 5011 using solder bumps or BGA 5019. A bottom surface of package device 5010 may in turn be mounted on an interposer or patch using solder bumps or BGAs.

Chip 5008 is shown having bottom surface 5023, such as a bottom exposed surface of dielectric, upon or in which are formed (e.g., disposed) contacts 5040 in an area of zone 5096. Contacts 5040 are (not shown) in one or more rows along a width of chip 5008 (e.g., see FIGS. 50-6, 20-29 and 30-41). In some cases, contacts 5040 are located lengthwise along or at opposing ends of length L1, L11 or L111 (e.g., see FIGS. 38-41). In some cases, contacts 5040 may be described as a signal cluster formed in a lengthwise 4-row deep die-bump pattern, where the first and second rows are SB pairs, and the third and fourth rows are SB pairs (e.g., see FIGS. 38-41).

Chip 5009 is shown having bottom surface 5024, such as a bottom exposed surface of dielectric, upon or in which are formed (e.g., disposed) contacts 5030 in an area of zone 5098. Contacts 5030 are (not shown) in one or more rows along a width of chip 5009 (e.g., see FIGS. 50-6, 20-29 and 30-41). In some cases, contacts 5030 are located lengthwise along or at opposing ends of length L3, L31 or L311 (e.g., see FIGS. 38-41). In some cases, contacts 5030 may be described as a signal cluster formed in a lengthwise 4-row deep die-bump pattern, where the first and second rows are SB pairs, and the third and fourth rows are SB pairs (e.g., see FIGS. 38-41).

Package 5010 is shown having top surface 5003, such as a top exposed surface of dielectric, upon or in which are formed (e.g., disposed) contacts 5040 in a zone of area 5001 under of chip 5008 (and optionally near an edge towards chip 5009). In some cases, the pattern of contacts 5040 in area 5001 matches or is a mirror image of the pattern of contacts 5040 in zone 5096 of chip 5008. Package 5010 is also shown having top surface 5003, such as a surface of dielectric, upon or in which are formed (e.g., disposed) contacts 5030 in a zone of area 5011 under of chip 5009 (and optionally near an edge towards chip 5008). In some cases, the pattern of contacts 5030 in area 5011 matches or is a mirror image of the pattern of contacts 5030 in zone 5098 of chip 5009.

According to embodiments chip 5008 and chip 5009 may each be an IC chip such as microprocessor, coprocessor, graphics processor, memory chip, modem chip, or other microelectronic chip devices. According to embodiments chip 5008 and chip 5009 may each be an IC chip capable of being mounted or directly attached onto a socket, an interposer, a motherboard, or another next-level component (e.g., package device 5010). In some cases, package device 5010 may represent a substrate package, an interposer, a printed circuit board (PCB), a PCB an interposer, a “package”, a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices) (e.g., chips 5008 and 5009).

According to embodiments, chip 5008 and chip 5009 may each include (e.g., on one or more levels above level L2 or L5) active microprocessor circuitry and/or hardware logic (e.g., solid state hardware) such as microprocessor processing logic, memory, cache, gates, transistors (e.g., metal oxide semiconductor (MOS) field effect transistor (FET), fin FET and the like) as known to be on or part of an IC chip such as a central processing unit (CPU), microprocessor, coprocessor, graphics processor, memory chip, modem chip, or other microelectronic chip devices. A portion of such circuitry and/or logic may by electrically coupled or physically attached to circuits 5072 and 5074. According to embodiments, chip 5008 and chip 5009 may each include (e.g., on one or more levels above level L2 or L5, such as in level LM) active microprocessor circuitry and/or hardware logic of a multipurpose, clock driven, register based, programmable electronic device which accepts digital or binary data as input (e.g., at contact 5030 of a channel having circuit 5074 as an RX data signal circuit at chip 5009), processes it according to instructions stored in its memory, and provides results as output (e.g., at contact 5040 of a channel having circuit 5072 as a TX data signal circuit of chip 5008). According to embodiments, chip 5008 and chip 5009 may each contain both combinational logic and sequential digital logic; and may operate on numbers and symbols represented in the binary numeral system.

FIG. 47 shows vertical "signal" transmission lines 5033 (e.g., here, "signal" may include data signal RX and/or TX lines or traces; power signal lines or traces; and ground signal lines or traces) originating at chip 5008 and extending vertically downward through bumps 5018 and into vertical levels of package 5010. In some cases, lines 5033 may originate at (e.g., start at the bottom surface of transmit signal contacts 5040 on) the bottom surface 5023 of chip 5008, extend downward through bumps 5018 (e.g., include height of bumps 5018), extend downward through (e.g., include signal contacts 5040 on) a top surface 5003 of package 5010 at location 5001, and extend downward to levels Lj-Ll (with the letter "l" not the number "1") of package 5010 at first horizontal location 5034 of package 5010 (e.g., include vertical signal lines within vertical levels Ltop-L1 of package 5010, such as where level Ltop is the topmost or uppermost level of package 5010 and has an exposed top surface 5003; and level L1 is level Ltop, with the number "1" not the letter "l").

In some case, herein, "signal" transmission lines may include data signal RX and/or TX lines or traces; power signal lines or traces; and ground signal lines or traces. In some case, herein, "signal" transmission lines may be physically attached or electrically coupled or connected (e.g., with zero or less than 10 Ohm electrical resistance) between two of contacts, signal lines and/or locations in levels Lj-Ll of a package device or chip.

FIG. 47 also shows package device horizontal "signal" transmission lines 5035 originating at first horizontal location 5034 in levels Lj-Ll of package 5010 and extend horizontally along levels Lj-Ll along length L2 of levels Lj-Ll to second horizontal location 5036 in levels Lj-Ll of package 110. Length L2 may be between 0.5 and 25 mm. In some cases it is between 1.0 and 15 mm. In some cases it is between 0.2 and 10 mm. In some cases it is between 2 and 10 mm. In some cases it is between 2 and 6 mm. In some cases it is between 3 and 5 mm. In some cases it is between 3.5 and 4.5 mm. In some cases it is between 4 and 5 mm. It can be appreciated that length L502 may be an appropriate line or trace length within a package device, that is less than or greater than those mentioned above.

Next, FIG. 47 shows vertical "signal" transmission lines 5037 originating in package 5010 and extending vertically upward through bumps 5019 and terminating at chip 5009. In some cases, lines 5037 may originate at (e.g., from horizontal data signal transmission lines 5035 in) levels Lj-Ll at second horizontal location 5036 of package 5010, extend upward through receive signal contacts 5030 at location 5011 on top surface 5003 of package 5010, extend upward through bumps 5019 (e.g., include height of bumps 5019), and extend upward to and terminate at receive signal contacts 5030 on bottom surface 5024 of chip 5009.

FIG. 47 shows chip 5008 having chip "on-die" interconnection feature "zone" 5096 (e.g., see FIGS. 30-41) and inductor structures 5097 (e.g., see FIGS. 45-49). FIG. 47 shows chip 5009 having chip "on-die" interconnection feature "zone" 5098 (e.g., see FIGS. 30-41) and inductor structures 5099 (e.g., see FIGS. 45-49). Such a "zone" and a "structure" as described herein may be considered a three dimensional part or portion of an IC chip. Such a zone or structure may include various active and passive circuitry; traces; interconnects and/or other structure know to be on an IC chip.

FIG. 47 shows computing system 5000 including IC chip 5008 having "on-die" inductor structures 5097 to improve signaling between (e.g., from) a data signal transmit output contact (e.g., see contact 4574 of FIGS. 45-49) of a data signal (e.g., transmit) circuit 5072 and (e.g., to) a data signal surface contact 5040 of chip 5008, such as described for chip 4508 having on-die inductor structure 4569 of FIGS. 45-49 when circuit 4572 is a data transmit circuit (e.g., with inductors 4584 and 4581 having selected or predetermined inductances L451 and L452). In some cases, chip 5008 is an integrated circuit chip having inductor structures 4596 (e.g., interconnect features) to improve signaling though a data signal channel of electronic system 5000.

In some cases, inductor structures 5097 represent structures 4569 as described for FIGS. 45-49 electrically coupled between a data signal transmit output contact (e.g., see contact 4574 of FIGS. 45-49) of a data signal (e.g., transmit) circuit 5072 and a data signal surface contact 5040 of chip 5008 (e.g., see contact 4530 of FIGS. 45-49) as described for chip 4508 having on-die inductor structure 4569 of FIGS. 45-49 when circuit 4572 is a data transmit circuit with inductors 4584 and 4581 having selected or predetermined inductances L451 and L452.

FIG. 47 also shows computing system 5000 including IC chip 5009 having "on-die" inductor structures 5099 to improve signaling between (e.g., from) a data signal receive output contact (e.g., see contact 4574 of FIGS. 45-49) of a data signal (e.g., receive) circuit 5074 and (e.g., from) a data signal surface contact 5030 of chip 5009, such as described for chip 4508 having on-die inductor structure 4569 of FIGS. 45-49 when circuit 4572 is a data receive circuit (e.g., with inductors 4584 and 4581 having inductances L1 and L2 selected or predetermined). In some cases, chip 5009 is an integrated circuit chip having inductor structures 4596 (e.g., interconnect features) to improve signaling though a data signal channel of electronic system 5000.

In some cases, inductor structures 5099 represent structures 4569 as described for FIGS. 45-49 electrically coupled between a data signal receive output contact (e.g., see contact 4574 of FIGS. 45-49) of a data signal (e.g., receive) circuit 5074 and a data signal surface contact 5030 of chip 5009 (e.g., see contact 4530 of FIGS. 45-49), such as described for chip 4508 having on-die inductor structure 4569 of FIGS. 45-49 when circuit 4572 is a data receive circuit with inductors 4584 and 4581 having selected or predetermined inductances L451 and L452.

In some cases, bottom level LV1 up to level LV5 or above (e.g., level LN) as described for FIGS. 45-49 may exist in chips 5008 and/or 5009.

According to embodiments, it is possible for the on-die inductor structures 5097 and/or 5099 to be electrically coupled or physically attached between the data signal (e.g., transmit and/or receive) circuitry 5072 and/or 5074 of the chips 5008 and/or 5009 (e.g., between a data signal transmit and/or receive output contact as described for contact 4574 of FIGS. 45-49) and on-die interconnect features in zones 5096 and/or 5098 (see FIGS. 30-41) that provide additional help with improve signaling by providing higher frequency and more accurate data signal transfer through a data signal communication channel 5076 between an IC chip 5008 and chip 5009 mounted on package device 5010. Such on-die interconnect features 5097 may include leadway (LDW) routing and/or LDW traces in same and/or in other levels of chips 5008 and/or 5009, and between the corresponding on-die inductor structures 5097 and/or 5099 and data signal surface contacts 5018 and/or 5019 or die bump contact locations (e.g., on surfaces of the chips).

FIG. 47 shows computing system 5000 including IC chip 5008 having "on-die" interconnection features in zone 5096 to improve signaling between (e.g., from) a data signal transmit output circuit 5072 and (e.g., to) a data signal surface contact 5040 of chip 5008, such as described for chip 3008 having on-die interconnection features (e.g., zone 3092 (or pattern 3800, pattern 3900 or pattern 4000) and/or zone 3094 (or pattern 3805, pattern 3905 or pattern 4005)) of FIGS. 30-41. In some cases, chip 5008 is an integrated circuit chip having interconnection features in zone 5096 to improve signaling though a data signal channel 5076 of electronic system 5000.

In some cases, interconnection features of zone 5096 represent structures of zone 3092 (or pattern 3800, pattern 3900 or pattern 4000) as described for FIGS. 30-41 electrically coupled between a data signal transmit output circuit 5072 and a data signal surface contact 5040 chip 5008, as described for chip 3008 having structures of zone 3092 (or pattern 3800, pattern 3900 or pattern 4000) between a data signal transmit output circuit 3072, 3872A/B, 3972A/B or 4072A/B; and a data signal surface contact 3040, 3840A/B, 3940A/B or 4040A/B of chip 3008.

FIG. 47 shows computing system 5000 including IC chip 5009 having "on-die" interconnection features in zone 5098 to improve signaling between (e.g., to) a data signal receive output circuit 5074 and (e.g., from) a data signal surface contact 5030 of chip 5009, such as described for chip 3009 having on-die interconnection features (e.g., zone 3094 (or pattern 3805, pattern 3905 or pattern 4005) of FIGS. 30-41. In some cases, chip 5009 is an integrated circuit chip having interconnection features in zone 5098 to improve signaling though a data signal channel 5076 of electronic system 5000.

In some cases, interconnection features of zone 5098 represent structures of zone 3094 (or pattern 3805, pattern 3905 or pattern 4005) as described for FIGS. 30-41 electrically coupled between a data signal receive output circuit 5074 and a data signal surface contact 5030 chip 5009, as described for chip 3009 having structures of zone 3094 (or pattern 3805, pattern 3905 or pattern 4005) between a data signal receive output circuit 3074, 3874A/B, 3974A/B or 4074A/B; and a data signal surface contact 3030, 3830A/B, 3930A/B or 4030A/B of chip 3009.

In some cases, bottom level LV1 up to level LV5 or above (e.g., level LN) as described for FIGS. 30-41 may exist in chips 5008 and/or 5009.

FIG. 47 shows package device 5010 having package device "on-package" first level die bump designs, and ground webbing structures 5020 under chip 5008 and/or 5009 (see FIGS. 1-6).

In some cases, areas 5001 and/or 5011 of package device 5010 may include or be package 100, 300 or 500, such as having surface contact zones or patterns (e.g., of contacts 110, 120, 130 and 140), and ground webbing 160-164 or 200-206 as described for (see FIGS. 1-6). In some cases, features 5020 at areas 5001 and/or 5011 may be surface 5003, bumps 5018 and/or bumps 5019 representing package 100, 300 or 500, such as having surface contact zones or patterns (e.g., of contacts 110, 120, 130 and 140), and ground webbing 160-164 or 200-206 as described for FIGS. 1-6.

In some cases, features 5020 at areas 5001 and/or 5011 may include contacts 5040 and/or 5030, and vertical routing or traces 5033 and/or 5037. In some cases, they include vertical routing or traces 5033 and/or 5037 extending from top level L down to levels Lj-Ll at first and second horizontal locations 5034 and 5036 of package device 5010 such as described for ground webbing 160-164 or 200-206 in levels L1-L6 for FIGS. 1-6.

In some cases, solder bumps 5018 and/or 5019 may be formed on corresponding surface contacts of device 5010 having surface contact zones 102, 104, 105, and 107 as described for as described for surface contacts 110, 120, 130, and 140 of package devices 100, 300 or 500 as described for FIGS. 1-6.

In some cases, solder bumps 5018 and/or 5019 may be formed on corresponding surface contacts of device 5010 as described for surface contacts 110, 120, 130, and 140 of package devices 100, 300 or 500, and having ground webbing 160-164 or 200-206 as described for FIGS. 1-6.

In some cases, top level L1 down to level L6 or below (e.g., levels Lj-Ll) as described for FIGS. 1-6 may exist in package device 5010.

FIG. 47 shows package device 5010 having package device "on-package" high speed horizontal data signal transmission lines 5035 between horizontal locations 5034 and 5036 (see FIGS. 7-19).

In some cases, lines 5035 of package device 5010 may include or be lines 722 between horizontal locations 721 and 723; lines 730 between horizontal locations 729 and 732; or lines 735 between horizontal locations 734 and 736 as described for FIGS. 7-19.

In some cases, lines 5035 between horizontal locations 5034 and 5036 of package device 5010 may include or be horizontal lines of package device 750, 1150 or 1500, as described for FIGS. 7-19. They may include horizontal lines of package device 750 in levels Lj-Ll; of device 1150 in levels Lm-Lq; or of device 1500 in levels Lm, Ln, Lx, Lo, Lq and Ly as described for FIGS. 7-19.

In some cases, top level L1 down to level L1 or below (e.g., level Ly) as described for FIGS. 7-19 may exist in package device 5010.

In some cases, levels Lj-Ll; levels Lm-Lq; or levels Lm, Ln, Lx, Lo, Lq and Ly (e.g., levels Lj-Ll) as described for FIGS. 7-19 may exist in package device 5010.

According to embodiments, the on die inductor structures 5097 and 5099 will be on both data transmit chip 5008 and data receive chip 5009 for each data signal channel 5076. In some cases, structure 5099 will be on the receive chip 5009 only, and structure 5097 will not be on transmit chip 5008. In some cases, structure 5097 will be on the transmit chip 5009 only, and structure 5099 will not be on receive chip 5009. In some cases, determining whether they are needed on either or both chips may depend on the lossiness of the channel 5076 between the transmitter circuit of one chip and the receiver of the other chip (e.g., see FIGS. 45-49).

According to embodiments, the on die interconnection features of zones 5096 and 5098 will be on both data transmit chip 5008 and data receive chip 5009 for each data signal channel 5076. In some cases, interconnection features of zones 5098 will be on the receive chip 5009 only, and interconnection features of zones 5096 will not be on transmit chip 5008. In some cases, interconnection features of zones 5096 will be on the transmit chip 5008 only, and interconnection features of zones 5098 will not be on receive chip 5009. In some cases, determining whether they are needed on either or both chips may depend on the tuning of the channel 5076 between the transmitter circuit of one chip and the receiver of the other chip (e.g., see FIGS. 30-41).

According to embodiments, the on package bump designs and ground webbing structures 5020 will be on both on area 5001 of package device 5010 under data transmit chip 5008 and on area 5011 of package device 5010 under data receive chip 5009 for each data signal channel 5076. In some cases, structures 5020 will be on area 5011 of package device 5010 only, and will not be on area 5001 of package device 5010. In some cases, structures 5020 will be on area 5001 of package device 5010 only, and will not be on area 5011 of package device 5010.

In some cases, determining whether they are needed on either or both area 5001 and on area 5011 of package device 5010 may depend on the amount of crosstalk between data signal surface contacts and vertical signal lines of the package; and/or tuning of the channel 5076 between the transmitter circuit of one chip and the receiver of the other chip (e.g., see FIGS. 1-6).

According to embodiments, the high speed horizontal data signal transmission lines 5035 of package device 5010 may include or be lines 722 between horizontal locations 721 and 723; lines 730 between horizontal locations 729 and 732; or lines 735 between horizontal locations 734 and 736 as described for FIGS. 7-19. In some cases, lines 5035 may include none of the lines of FIGS. 7-19.

In some cases, determining whether they include lines 722, lines 730, lines 735 or none of the lines of FIGS. 7-19 may depend on the amount of crosstalk between data signal horizontal signal lines of the package; and/or tuning of the channel 5076 between the transmitter circuit of one chip and the receiver of the other chip (e.g., see FIGS. 7-19).

According to embodiments, the on die inductor structures 5097 and/or 5099; on die interconnect features of zone 5069 and/or 5098; on package bump designs and ground webbing structures 5020; and/or on package high speed horizontal data signal transmission lines 5035 may be on the chip(s) or package device, as noted, for each channel 5076 of multiple data signal channels existing between a transmitter circuit of a first chip, extending through one or more package devices, and to a receiver circuit of a second chip. In some cases, there may be between 1 and 500 such channels between the chips. In some cases, there may be between 10 and 400 such channels between the chips. In some cases, there may be between 20 and 200 such channels between the chips.

FIG. 47 show system 5000 having package 5010 data signal transmission lines 5033, 5035 and 5037 disposed within levels of package 5010 and forming a "connection" connecting data signal solder bumps 5018 and 5019 on top surface contacts on areas 5001 and 5011 of package 5010 to each other. This connection may include bumps 5018 and 5019. This connection may be an electrically conductive connection that is part of a single channel 5076 between a single transmit circuit (e.g., circuit 5072) and a corresponding single receive circuit (e.g., circuit 5074) through which it is possible to transmit data signals. This connection may be an electrically conductive connection with zero or less than 30 Ohms of electrical resistance.

The combination of this connection (e.g., of package 5010 data signal transmission (and receive) lines 5033, 5035 and 5037 connecting data signal solder bumps 5018 and 5019); inductor structures 5097 and/or 5099; and interconnection features of zone 5096 and/or 5098 may form a single channel between a single transmit circuit (e.g., circuit 5072) and a corresponding single receive circuit (e.g., circuit 5074). It can be appreciated that there may be many such channels (e.g., 5 channels are shown in FIGS. 30A-B, but there can be dozens or hundreds).

In some case, this connection plus the on die inductor structures 5097 and/or 5099; on die interconnect features of zone 5069 and/or 5098; on package bump designs and ground webbing structures 5020; and/or on package high speed horizontal data signal transmission lines 5035 between data transmit and receive circuits may form data signal transmission (and receive) channels (e.g., including through package 5010) such as channel 5076. In some cases, these data signal transmission (and receive) channels include all of the on die inductor structures 5097 and/or 5099; on die interconnect features of zone 5069 and/or 5098; on package bump designs and ground webbing structures 5020; and/or on package high speed horizontal data signal transmission lines 5035, and other structures between signal transmit circuits (e.g., circuits 5072) and corresponding signal receive circuits (e.g., circuits 5074). In some cases, these data signal channels may also include signal transmit circuits (e.g., circuits 5072) and corresponding signal receive circuits (e.g., circuits 5074).

In some cases the channel length of channel 5076 will be length CH or CH2 as describe for FIGS. 30-41, or a channel length as describe for FIGS. 30-41 where lengths L501, L502 and L503 represent lengths L1, L2 and L3; and heights H504 and H505 represent heights H304 and H305.

Figure 48:
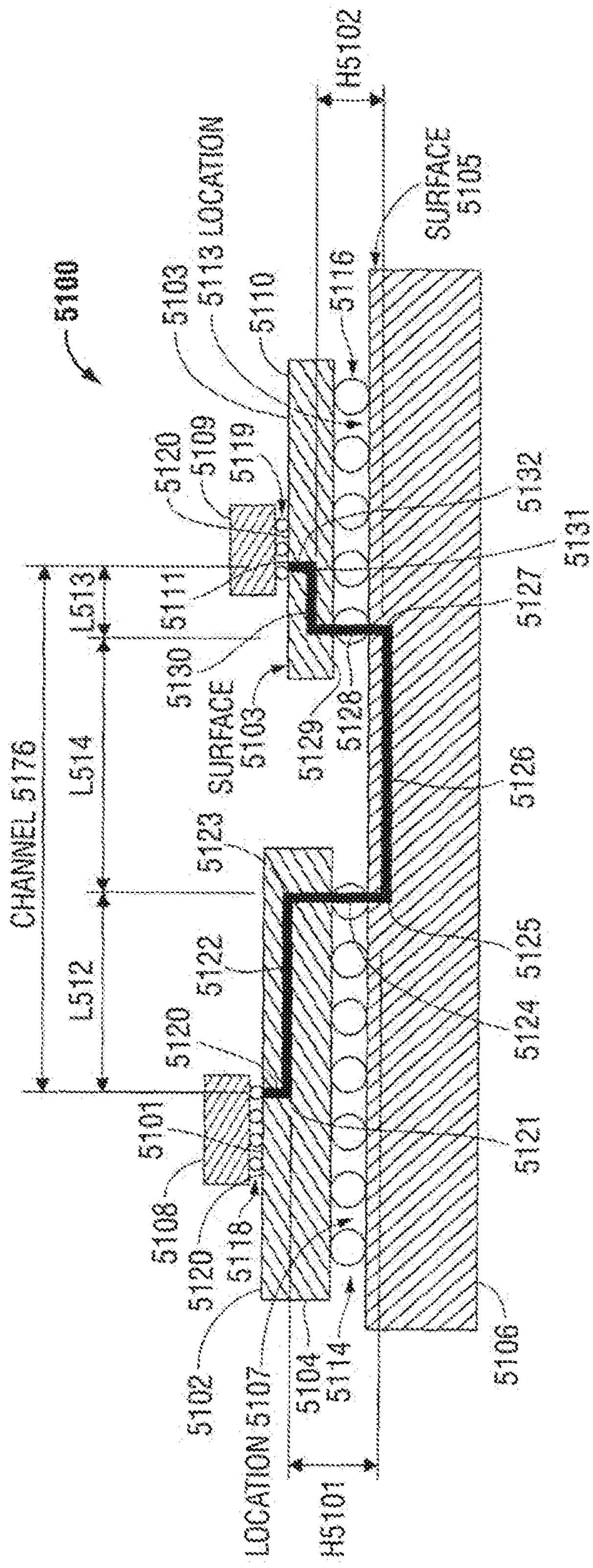
FIG. 48 is schematic cross-sectional side view of a computing system (e.g., computing configuration), including die to die interconnect configurations for improved signal connections and transmission through a data signal channel extending through multiple semiconductor device packages or package devices.

FIG. 48 is schematic cross-sectional side view of a computing system (e.g., computing configuration), including die to die interconnect configurations for improved signal connections and transmission through a data signal channel extending through multiple semiconductor device packages or package devices.

FIG. 48 shows a schematic cross-sectional side view of computing system 5100 (e.g., a system routing signals from a computer processor or chip such as chip 5108 to another device such as chip 5109) including chip 5108 mounted on package device 5104 which is mounted on a first location of package device 5106; and chip 5109 mounted on package device 5110 which is mounted on a second location of package device 5106.

FIG. 48 shows computing system 5100 including die to die interconnect configurations, features and circuitry on chips 5108 and 5109; and on packages 5104, 5106 and 5110 for improved signal connections and transmission through a data signal channel extending through the semiconductor package devices.

In some cases, package device 5106 may be a package device, such a package upon which an IC chip 3008 or 5008 is directly mounted or attached. In some cases, package device 5106 may be a package device upon which an IC package (such as described for device 3010 or 5010, upon which and IC chip 3008 or 5008 is directly mounted or attached) can be directly mounted or attached. In some cases, package device 5106 may be a printed circuit board (PCB) upon which an IC package (such as described for device 3010 or 5010, upon which and IC chip 3008 or 5008 is directly mounted or attached) can be directly mounted or attached.

FIG. 48 shows computing system 5100, such as a system routing signals from a computer processor or chip such as chip 5108 to another device such as chip 5109. System 5100 includes chip 5108 mounted on area 5101 of package device 5104 and connected through channel 5176 (including through package device 5106) to chip 5009 which is mounted on area 5111 of package 5110. In some cases, system 5100 has package device (e.g., patch) 5104 mounted on interposer 5106 at first location 5107. It also shows package device 5110 is mounted on interposer 5106 at second location 5113.

For example, data signal contacts (and optionally isolation contacts) on a bottom surface of chip 5108 may be electrically coupled or physically attached to top surface 5102 of package device 5104 at location 5101 using solder bumps or ball grid array (BGA) 5118. Also, data signal contacts (and optionally isolation contacts) on a bottom surface of chip 5109 may be electrically coupled or physically attached to top surface 5103 of package device 5110 at location 5111 using solder bumps or ball grid array (BGA) 5119.

In some cases, data signal contacts (and optionally isolation contacts) on a bottom surface of package device 5104 may be electrically coupled or physically attached to top surface 5105 of package device 5106 at first location 5107 using solder bumps or ball grid array (BGA) 5114. Also, data signal contacts (and optionally isolation contacts) on a bottom surface of package device 5110 may be electrically coupled or physically attached to top surface 5105 of package device 5106 at second location 5113 using solder bumps or ball grid array (BGA) 5116.

In some cases, instead of using BGA 5116, data signal contacts (and optionally isolation contacts) on a bottom surface of package device 5110 may be electrically coupled or physically attached to top surface 5105 of package device 5106 at second location 5113 using an electro-optical (EO) connector (see FIGS. 26A-C, 28; and 53).

Chip 5108 may have a bottom exposed surface of dielectric, upon or in which are formed (e.g., disposed) data signal contacts (and optionally isolation contacts) (not shown) in one or more rows along a width of chip 5108 as described for chip 5008.

Chip 5109 may have a bottom exposed surface of dielectric, upon or in which are formed (e.g., disposed) data signal contacts (and optionally isolation contacts) (not shown) in one or more rows along a width of chip 5109 as described for chip 5009.

Packages 5104 and 5110 are shown having top surfaces 5102 and 5103 respectively, such as a top exposed surface of dielectric, upon or in which are formed (e.g., disposed) data signal contacts (and optionally isolation contacts) in areas 5101 and 5111 under chips 5108 and 5109, such as described for patterns of contacts 5040 and 5030 in areas of chips 5008 and 5009, respectively.

According to embodiments chip 5108 and chip 5109 may each be an IC chips such as described for chips 5008 and 5009. They may also be capable of being mounted or directly attached onto a package device such as described for chips 5008 and 5009. They may also each include (e.g., on one or more levels above level L2 or L5) active microprocessor circuitry and/or hardware logic (e.g., solid state hardware) such as described for chips 5008 and 5009.

FIG. 48 shows vertical "signal" transmission lines 5120 originating at chip 5108 and extending vertically downward through bumps 5118 and into vertical levels of package 5104. In some cases, lines 5120 may originate at (e.g., include signal and ground contacts on) the bottom surface of chip 5108, extend downward through bumps 5118 (e.g., include height of bumps 5118), extend downward through (e.g., include signal contacts on) a top surface 5102 of package 5104 at location 5101, and extend downward to levels Lj-Ll (with the letter "l" not the number "1") of package 5104 at first horizontal location 5121 of package 5104 (e.g., include vertical signal lines within vertical levels Ltop-L1 of package 5104, such as where level Ltop is the topmost or uppermost level of package 5104 and has an exposed top surface 5102; and level L1 (with the number "1" not the letter "l").

FIG. 48 also shows package device 5104 horizontal "signal" transmission lines 5122 originating at first horizontal location 5121 in levels Lj-Ll of package 5104 and extend horizontally along levels Lj-Ll along length L512 of levels Lj-Ll to second horizontal location 5123 in levels Lj-Ll of package 5104.

FIG. 48 shows vertical "signal" transmission lines 5124 originating in levels Lj-Ll in package device 5104 and extending vertically downward along height H5101 through bumps 5114 and into vertical levels Lj-Ll of package 5104. In some cases, lines 5124 may originate at lines 5122 (e.g., at location 5123), extend downward through a bottom surface (e.g., having transmit signal contacts on) of package 5104, extend downward through bumps 5114 (e.g., include height of bumps 5114), extend downward through (e.g., include signal contacts on) a top surface of package 5106 at location 5107, and extend downward to levels Lj-Ll of package 5106 to first horizontal location 5125 of package 5106 (e.g., include vertical signal lines within vertical levels Ltop-L1 of package 5106, such as where level Ltop is the topmost or uppermost level of package 5106 and has an exposed top surface 5105; and level L1 is level Ltop).

Height H5101 may be between 0.5 and 2.5 mm. In some cases it may be between 1 and 2 mm. In some cases, it can represent a height equal to between 20 percent and 90 percent of the height of two package devices (e.g., the height of package 5104 plus of interposer 5106).

FIG. 48 also shows package device 5106 horizontal "signal" transmission lines 5126 originating at first horizontal location 5125 in levels Lj-Ll of package 5106 and extend horizontally along levels Lj-Ll along length L514 of levels Lj-Ll to second horizontal location 5127 in levels Lj-Ll of package 5106.

FIG. 48 shows vertical "signal" transmission lines 5128 originating in interposer 5106 and extending vertically upward along height H5102 through bumps 5116 and into vertical levels Lj-Ll of package 5110. In some case, lines 5128 may originate at (e.g., from horizontal data and ground signal transmission lines in) levels Lj-Ll at second horizontal location 5127 of interposer 5106, extend upward through bumps 5116 (e.g., include signal and ground contacts on top surface 5105 of interposer 5106 and some of bumps 5116 at location 5113), extend upward through (e.g., include signal and ground contacts on) a bottom surface of package 5110, and extend upward to levels Lj-Ll of package 5110 at first horizontal location 5129 of package 5110 (e.g., include vertical signal and ground lines within vertical levels Lbottom-LV1 of package 5110).

Height H5102 may be between 0.5 and 2.5 mm. In some cases it may be between 1 and 2 mm. In some cases, it can represent a height equal to between 20 percent and 90 percent of the height of two package devices (e.g., the height of package 5110 plus of interposer 5106).

FIG. 48 also shows package device 5110 horizontal "signal" transmission lines 5130 originating at first horizontal location 5129 in levels Lj-Ll of package 5110 and extend horizontally along levels Lj-Ll along length L513 of levels Lj-Ll to second horizontal location 5131 in levels Lj-Ll of package 5110.

Next, FIG. 48 shows vertical "signal" transmission lines 5132 originating in package 5110 and extending vertically upward through bumps 5119 and into chip 5109. In some case, lines 5132 may originate at (e.g., from horizontal data and ground signal transmission lines in) levels Lj-Ll at second horizontal location 5131 of package 5110, extend upward through bumps 5119 (e.g., include signal and ground contacts on top surface 5103 of package 5110 and some of bumps 5119 at location 5111), extend upward through (e.g., include signal and ground contacts on) a bottom surface of chip 5109, and extend upward to and terminate at (e.g., include signal and ground contacts on) a bottom surface of chip 5109. "Signal" lines 5132 may be physically attached and/or electrically connected (e.g., with zero electrical resistance) to "signal" lines 5130 at location 5131 in levels Lj-Ll of package 5110.

The sum of length L512 plus L514 plus L513 may be between 0.5 and 25 mm. In some cases it is between 1.0 and 15 mm. In some cases it is between 0.2 and 10 mm. In some cases it is between 2 and 10 mm. In some cases it is between 2 and 6 mm. In some cases it is between 3 and 5 mm. In some cases it is between 3.5 and 4.5 mm. In some cases it is between 4 and 5 mm. It can be appreciated that length L502 may be an appropriate line or trace length within a package device, that is less than or greater than those mentioned above (e.g., between 50 and 70 mm).

In FIG. 48, chip 5108 may have an chip "on-die" interconnection feature "zone" (e.g., see FIGS. 30-41) and/or inductor structures (e.g., see FIGS. 45-49) between data signal circuits and surface contacts of chip 5108, as is described for "on-die" interconnection feature "zone" 5096 (e.g., see FIGS. 30-41 and 50) and/or inductor structures 5097 (e.g., see FIGS. 45-49 and 50) between data signal circuits 5072 and surface contacts 5040 of chip 5108.

In FIG. 48, chip 5109 may have an chip "on-die" interconnection feature "zone" (e.g., see FIGS. 30-41) and/or inductor structures (e.g., see FIGS. 45-49) between data signal circuits and surface contacts of chip 5109, as is described for "on-die" interconnection feature "zone" 5098 (e.g., see FIGS. 30-41 and 50) and/or inductor structures 5099 (e.g., see FIGS. 45-49 and 50) between data signal circuits 5074 and surface contacts 5030 of chip 5109.

In FIG. 48, package device 5104 may have package device "on-package" first level die bump designs, and ground webbing structures 5120 under chip 5108 and/or 5109 (see FIGS. 1-6), as is described for package device "on-package" first level die bump designs, and ground webbing structures 5020 under chip 5008 and/or 5009 (see FIGS. 1-6 and 50).

In some cases, lines 5120 and 5132 extending from chips 5108 and 5109, downward to levels Lj-Ll of packages 5104 and 5110 at first horizontal locations 5121 and 5131 of the packages may be similar to and have on package bump designs and ground webbing structures 5020 under data receive chip 5009 for each data signal channel 5076 as described for FIG. 47.

In FIG. 48, package device 5104 may have package device "on-package" high speed horizontal data signal transmission lines 5122 between horizontal locations 5121 and 5123 (see FIGS. 7-19), as is described for package device "on-package" high speed horizontal data signal transmission lines 5035 between horizontal locations 5034 and 5036 (see FIGS. 7-19 and 50).

FIG. 48 shows package device 5104 and/or 5106 having package device "on-package" vertical data signal transmission interconnect lines 5124 (see FIGS. 20-29) between vertical locations 5123 and 5125.

In some cases, solder bumps 5114 may be formed on corresponding surface contacts of bottom surface of device 5104 having surface contact zones of surface contact patterns 2005, 2008, 2205, 2208, 2255 and/or 2258 as described for as described for surface contacts 2010, 2020, 2030, and 2040 of package devices 2000, 2001, 2200, 2201, 2400, 2401 and/or 2600 as described for FIGS. 20-29.

In some cases, solder bumps 5114 may be formed on corresponding surface contacts of location 5107 of top surface of device 5106 as described for surface contacts 2010, 2020, 2030, and 2040 of package devices 2000, 2001, 2200, 2201, 2400, 2401 and/or 2600 as described for FIGS. 20-29.

In some cases, location 5107 of top surface of device 5106 may have surface contact zones as described for zones 2002, 2004 and 2007 (or 2009) of package devices (e.g., device 2000, 2001, 2200, 2201, 2400, 2401 and/or 2600) as described for FIGS. 20-29.

In some cases, top level L1 down to level L3 as described for FIGS. 20-29 may exist in location 5107 of top surface of package device 5106.

In some cases, any of the zones of surface contact patterns, surface contact patterns or package devices as described for FIGS. 20-29 may each be "vertically extending grounding structures" vertically extending along or through interconnect levels location 5107 of device 5106 such as described for extending vertically extensions of zones of surface contact patterns, surface contact patterns or package devices as described for FIGS. 20-29.

In some cases, location 5107 of top surface of device 5106 may have conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce crosstalk between the data transfer contacts and vertical "signal" lines or interconnects as described for FIGS. 20-29 may exist in package device 5106.

In some cases, top level L1 down to level 2530 and/or 2580 as described for FIGS. 20-29 may exist in location 5107 of package device 5106.

In FIG. 48, package device 5106 may have package device "on-package" high speed horizontal data signal transmission lines 5126 between horizontal locations 5125 and 5127 (see FIGS. 7-19), as is described for package device "on-package" high speed horizontal data signal transmission lines 5035 between horizontal locations 5034 and 5036 (see FIGS. 7-19 and 50).

FIG. 48 shows package device 5110 and/or 5106 having package device "on-package" vertical data signal transmission interconnect lines 5128 (see FIGS. 20-29) between vertical locations 5127 and 5129.

In some cases, solder bumps 5116 may be formed on corresponding surface contacts of bottom surface of device 5110 having surface contact zones of surface contact patterns 2005, 2008, 2205, 2208, 2255 and/or 2258 as described for as described for surface contacts 2010, 2020, 2030, and

2040 of package devices 2000, 2001, 2200, 2201, 2400, 2401 and/or 2600 as described for FIGS. 20-29.

In some cases, solder bumps 5116 may be formed on corresponding surface contacts of location 5113 of top surface of device 5106 as described for surface contacts 2010, 2020, 2030, and 2040 of package devices 2000, 2001, 2200, 2201, 2400, 2401 and/or 2600 as described for FIGS. 20-29.

In some cases, location 5113 of top surface of device 5106 may have surface contact zones as described for zones 2002, 2004 and 2007 (or 2009) of package devices (e.g., device 2000, 2001, 2200, 2201, 2400, 2401 and/or 2600) as described for FIGS. 20-29.

In some cases, top level L1 down to level L3 as described for FIGS. 20-29 may exist in location 5113 of top surface of package device 5106.

In some cases, any of the zones of surface contact patterns, surface contact patterns or package devices as described for FIGS. 20-29 may each be "vertically extending grounding structures" vertically extending along or through interconnect levels location 5113 of device 5106 such as described for extending vertically extensions of zones of surface contact patterns, surface contact patterns or package devices as described for FIGS. 20-29.

In some cases, location 5113 of top surface of device 5106 may have conductive material ground shielding attachment structures and shadow voiding for data signal contacts of package devices; vertical ground shielding structures and shield fencing of vertical data signal interconnects of package devices; and ground shielding for electro optical module connector data signal contacts and contact pins of package devices which reduce crosstalk between the data transfer contacts and vertical "signal" lines or interconnects as described for FIGS. 20-29 may exist in package device 5106.

In some cases, top level L1 down to level 2530 and/or 2580 as described for FIGS. 20-29 may exist in location 5113 of package device 5106.

In FIG. 48, package device 5110 may have package device "on-package" high speed horizontal data signal transmission lines 5130 between horizontal locations 5129 and 5132 (see FIGS. 7-19), as is described for package device "on-package" high speed horizontal data signal transmission lines 5035 between horizontal locations 5034 and 5036 (see FIGS. 7-19 and 50).

According to embodiments, the on die inductor structures will be on chip 5108 and/or 5109 as described for inductor structures 5097 and 5099 being on either or both data transmit chip 5008 and data receive chip 5009 for each data signal channel 5076.

According to embodiments, the on die interconnection features of zones will be on chip 5108 and/or 5109 as described for zones 5096 and 5098 being on either or both data transmit chip 5008 and data receive chip 5009 for each data signal channel 5076.

According to embodiments, the on package bump designs and ground webbing structures will be on package devices 5104 and/or 5010 under chip 5108 and/or 5109 as described for structures 5020 being on either or both area 5001 and/or on area 5011 of package device 5010 for each data signal channel 5076.

According to embodiments, the high speed horizontal data signal transmission lines may be on package device 5104, 5106 and/or 5110 such as described for lines 5035 of package device 5010.

According to embodiments, vertical data signal transmission interconnect lines may be on package devices 5104, 5110 and/or 5106 such as described for contact zones 2002, 2004 and 2007 (or 2009); surface contact patterns 2005, 2008, 2205, 2208, 2255 and/or 2258; and/or package devices 2000, 2001, 2200, 2201, 2400, 2401 and/or 2600 as described for FIGS. 20-29.

In some cases, determining whether package devices 5104, 5110 and/or 5106 include vertical data signal transmission interconnect lines such as described for contact zones 2002, 2004 and 2007 (or 2009); surface contact patterns 2005, 2008, 2205, 2208, 2255 and/or 2258; and/or package devices 2000, 2001, 2200, 2201, 2400, 2401 and/or 2600 may depend on the amount of package device electrical isolation and cross talk reduction desired between the signal contacts, attachment structures and vertical "signal" interconnects (e.g., lines) of each package device such as described for FIGS. 20-29.

According to embodiments, the on die inductor structures; on die interconnect features of zones; on package bump designs and ground webbing structures; on package high speed horizontal data signal transmission lines; and/or vertical data signal transmission interconnect lines may be on the chip(s) or package device of multiple data signal channels existing between a transmitter circuit of a first chip, extending through one or more package devices, and to a receiver circuit of a second chip, as noted, for each channel 5076 as described for FIG. 47.

FIG. 48 shows system 5100 having data signal channel (e.g., a "signal" transmission channel) 5176, such as data signal channel described for FIGS. 30-44 and 50 (e.g., channel 3076, 3076B and 5076). Channel 5176 may include "signal" transmission lines, vertical routing and horizontal routing through devices through devices 5104 and 5110, as described for channel 5076 through device 5010 for FIG. 47. Channel 5176 may include "signal" transmission lines, vertical routing and horizontal routing through devices through device 5106, such as described for channel 5076 through device 5010 for FIG. 47. Channel 5176 may be a channel that extends between data signal circuits of chips 5108 and 5109 by going through bumps 5118 and 5119; through "signal" transmission lines of devices 5104 and 5110; through bumps 5114 and 5116; and through "signal" transmission lines of device 5106.

FIG. 48 shows system 5100 having "signal" transmission lines 5120, 5122, 5124, 5126, 5128, 5130 and 5132 disposed within levels of package devices 5104, 5106 and 5110 and forming a "connection" connecting data signal solder bumps 5118 and 5119 on top surface contacts on areas 5101 and 5111. This connection may include bumps 5118 and 5119. This connection may be an electrically conductive connection that is part of a single channel 5176 between a single transmit circuit (e.g., circuit 5072) and a corresponding single receive circuit (e.g., circuit 5074) through which it is possible to transmit data signals. This connection may be an electrically conductive connection with zero or less than 30 Ohms of electrical resistance.

The combination of this connection (e.g., lines 5120, 5122, 5124, 5126, 5128, 5130 and 5132 connecting data signal solder bumps 5118 and 5119); the on die inductor structures; on die interconnect features of zones; on package bump designs and ground webbing structures; on package high speed horizontal data signal transmission lines; and/or vertical data signal transmission interconnect lines may form a single channel between a single transmit circuit (e.g., circuit 5072) and a corresponding single receive circuit (e.g., circuit 5074). It can be appreciated that there may be many such channels (e.g., 5 channels are shown in FIGS. 30A-B, but there can be dozens or hundreds).

In some case, this connection plus the on die inductor structures; on die interconnect features of zones; on package bump designs and ground webbing structures; on package high speed horizontal data signal transmission lines; and/or vertical data signal transmission interconnect lines between data transmit and receive circuits may form data signal transmission (and receive) channels (e.g., including through package devices 5104, 5106 and 5110) such as channel 5176. In some cases, these data signal transmission (and receive) channels include all of the on die inductor structures; on die interconnect features of zones; on package bump designs and ground webbing structures; on package high speed horizontal data signal transmission lines; and/or vertical data signal transmission interconnect lines, and other structures between signal transmit circuits (e.g., circuits 5072) and corresponding signal receive circuits (e.g., circuits 5074). In some cases, these data signal channels may also include signal transmit circuits (e.g., circuits 5072) and corresponding signal receive circuits (e.g., circuits 5074).

In some cases the channel length of channel 5176 will be length CH or CH2 as describe for a channel as described for FIGS. 30-41; or a channel length as describe for channel 5076 of FIG. 47 where length L512 plus L513 plus L514 represent length L502; heights H504 plus H5101 represents heights H304; and H505 plus H5102 represent height H305.

Figure 49:
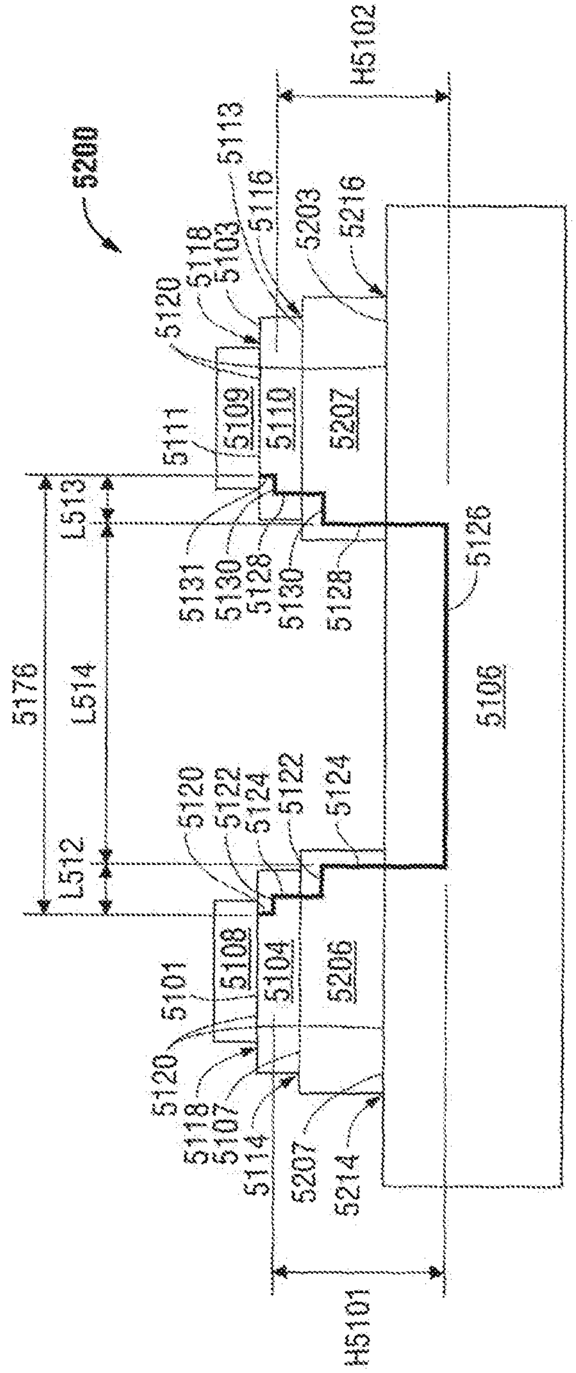
FIG. 49 is schematic cross-sectional side view of a computing system 5200 (e.g., computing configuration), including die to die interconnect configurations for improved signal connections and transmission through a data signal channel extending through various configurations of multiple semiconductor device packages or package devices that may include an electro-optical (EO) connector 5310 (e.g., see FIG. 50) upon which at least one package device may be mounted.

FIG. 49 is schematic cross-sectional side view of a computing system 5200 (e.g., computing configuration), including die to die interconnect configurations for improved signal connections and transmission through a data signal channel extending through various configurations of multiple semiconductor device packages or package devices that may include an electro-optical (EO) connector 5310 (e.g., see FIG. 50) upon which at least one package device may be mounted.

FIG. 49 shows computing system 5200 (e.g., a system routing signals from a computer processor or chip such as chip 5108 to another device such as chip 5109), including die to die interconnect configurations, features and circuitry on chips 5108 and 5109; and on package devices 5104, 5106 and 5110, for improved signal connections and transmission through semiconductor package device 5010.

FIG. 49 shows computing system 5200, having same numbered features (e.g., chips 5108 and 5109; package devices 5104, 5106 and 5110) corresponding or similar to those of FIG. 48, and having the same data signal transmission (and receive) channel (e.g., channel 5176); on die inductor structures (e.g., channel structures 5079 and 5099); on die interconnect features of zones (e.g., zones 5096 and 5098); on package bump designs and ground webbing structures (e.g., structures 5120); on package high speed horizontal data signal transmission lines (e.g., lines 5122, 5126 and 5130); and/or vertical data signal transmission interconnect lines (e.g., lines 5120, 5124, 5128 and 5132), and other structures between signal transmit circuits (e.g., circuits 5072) and corresponding signal receive circuits (e.g., circuits 5074), except that FIG. 49 has package device 5206 between devices 5104 and 5106; and has package device 5207 between devices 5110 and 5106 of FIG. 48 (e.g., BGAs 5114 and 5116 are replaced with devices 5206 and 5207 respectively).

According to some embodiments, system 5200 includes package device 5104 mounted on area 5107 of package device 5206 through connectors 5114, and package device 5206 mounted on first area 5207 of package device 5106 through connectors 5214; and package device 5110 mounted on area 5113 of package device 5207 through connectors 5116, and package device 5207 mounted on second area 5203 of package device 5106 through connectors 5216.

For FIG. 49, channel 5176 is connected from chip 5108 to 5109 through package devices 5104, 5206, 5110, 5207 and 5110.

In some cases, package devices 5206 and 5207 are package devices upon which an IC package (such as described for device 3010 or 5010, upon which and IC chip 3008 or 5008 is directly mounted or attached) can be directly mounted or attached. In some cases, package device 5106 may be a printed circuit board (PCB) upon which an IC package (such as described for device 3010 or 5010, upon which and IC chip 3008 or 5008 is directly mounted or attached) can be directly mounted or attached.

According to embodiments, device 5106 of FIG. 49 may be a PCB and include features having a size (e.g., width and height) according to a design rule for forming a PCB which may be larger than those described for package device 5104 or 5206. Otherwise, other features and technologies described herein for device 5106 may remain the same.

Figure 50:
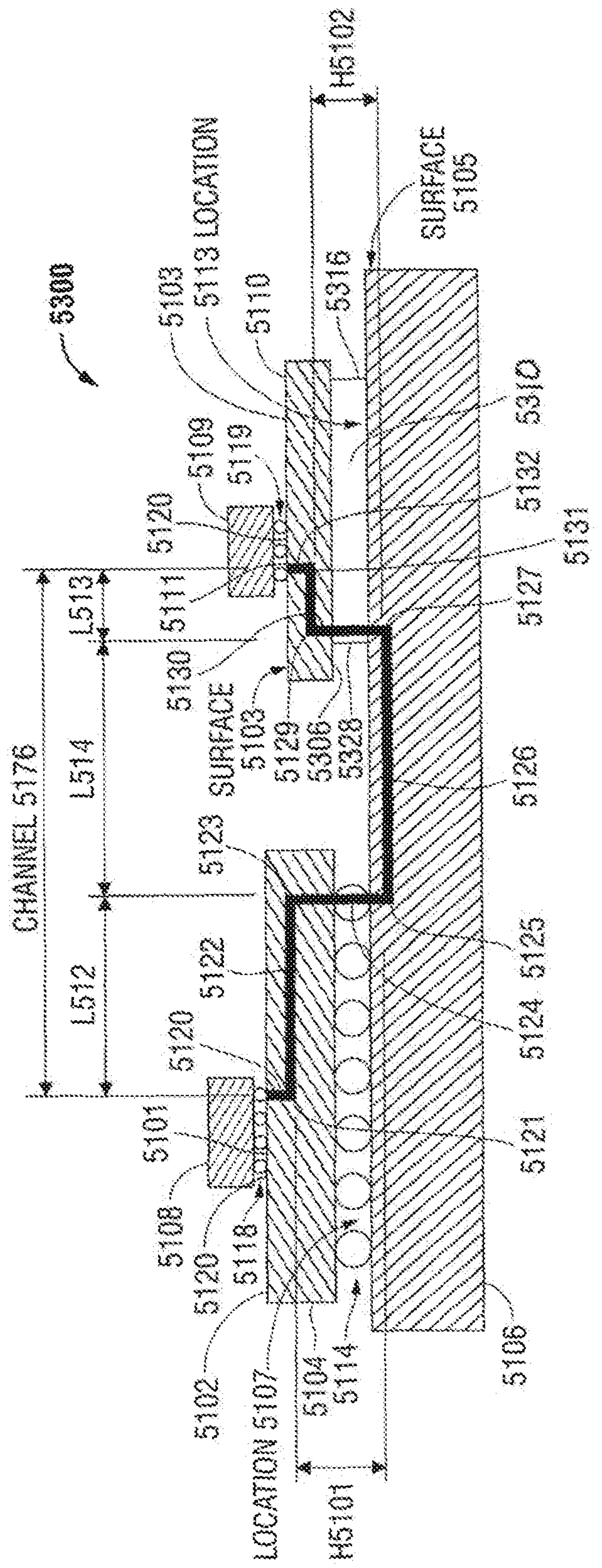
FIG. 50 is schematic cross-sectional side view of a computing system 5300 (e.g., computing configuration), including die to die interconnect configurations for improved signal connections and transmission through a data signal channel extending through multiple semiconductor device packages or package devices and through an electro-optical (EO) connector 5310 upon which at least one package device may be mounted.
Figure 51:
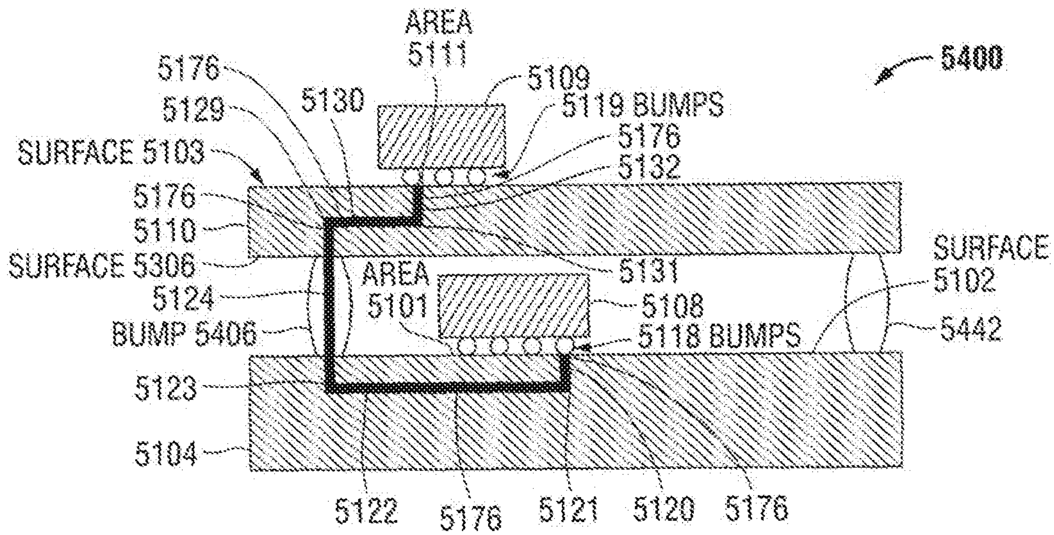
FIG. 51 is schematic cross-sectional side view of a computing system 5400 (e.g., computing configuration), including die to die interconnect configurations for improved signal connections and transmission through a data signal channel extending through two semiconductor device packages in a package-on-package configuration.

In some cases, areas 5107, 5207, 5113 and 5203 represent areas, surfaces, and locations for mounting a package device onto another package device or a PCB, such as using BGAs or an EO connector, such as described for FIGS. 50-51. For example, for FIG. 49, connectors 5114, 5214, 5116 and 5216 may each be either BGAs or an EO connections that mount a package device onto another package device or a PCB, such as described for FIGS. 50-51.

In some cases, connectors 5114, 5214, 5116 and 5216 are all BGAs. Here, system 5200 includes package device 5104 mounted on area 5107 of package device 5206 through BGA connectors 5114, and package device 5206 mounted on first area 5207 of package device 5106 through BGA connectors 5214; and package device 5110 mounted on area 5113 of package device 5207 through BGA connectors 5116, and package device 5207 mounted on second area 5203 of package device 5106 through BGA connectors 5216, such as for mounting a package device onto another package device or a PCB, such as described for FIGS. 50-51.

In some cases, connectors 5114 and 5214 are BGAs, but device 5207 is an EO connector (e.g., connections 5116 and 5216 are EO connections). Here, system 5200 includes package device 5104 mounted on area 5107 of package device 5206 through BGA connectors 5114, and package device 5206 mounted on first area 5207 of package device 5106 through BGA connectors 5214, such as for mounting a package device onto another package device or a PCB, such as described for FIGS. 50-51. However, device 5207 is and EO connector (e.g., an EO connector, or connector 5310 (see FIG. 50) as described for FIGS. 51 and 53) electrically coupled and/or physically attached to (e.g., between) bottom surface 5306 of device 5110 and location 5203 of top surface 5105 of device 5106. In some cases, bottom surface 5306 of device 5110 and location 5203 of top surface 5105 of device 5106 may each be a surface of dielectric, upon or in which are formed (e.g., disposed) the grounding contacts in a pattern, receive signal contacts in a pattern and transmit contacts in a pattern, such as is described for surface of dielectric 2003, upon or in which are formed (e.g., disposed) the grounding contacts 2020 in pattern 2610, receive signal contacts 2030 in pattern 2605 and transmit contacts 2040 in pattern 2605 of FIGS. 26A-C and 28.

In some cases, none of the connectors are BGAs, and both of devices 5206 and 5207 are EO connectors (e.g., connections 5114, 5214, 5116 and 5216 are all EO connections). Here, device 5206 is and EO connector (e.g., an EO connector, or connector 5310 (see FIG. 50) as described for FIGS. 51 and 53) electrically coupled and/or physically attached to (e.g., between) bottom surface of device 5104 and location 5207 of top surface 5105 of device 5106. In some cases, bottom surface of device 5104 and location 5207 of top surface 5105 of device 5106 may each be a surface of dielectric, upon or in which are formed (e.g., disposed) the grounding contacts in a pattern, receive signal contacts in a pattern and transmit contacts in a pattern, such as is described for surface of dielectric 2003, upon or in which are formed (e.g., disposed) the grounding contacts 2020 in pattern 2610, receive signal contacts 2030 in pattern 2605 and transmit contacts 2040 in pattern 2605 of FIGS. 26A-C and 28. Also, here, device 5207 is and EO connector as described above to electrically coupled and/or physically attached to bottom surface 5306 of device 5110 and location 5203 of top surface 5105 of device 5106.

In some cases, for FIG. 49, connector 5310 is oriented upright as shown for connector 2602 in FIG. 26B with its bottom on the top surface of device 5106; and with contact pins 2620, 2630 and 2640 removably attachable to contacts or solder bumps on the bottom surface of device 5110. In other cases, connector 5310 is oriented inverted (e.g., upside down) as compared to how connector 2602 is shown in FIG. 26B, such as where connector 5310 has its bottom on the bottom surface of device 5110; and with contact pins 2620, 2630 and 2640 removably attachable to contacts or solder bumps on the top surface of device 5106.

According to some embodiments, system 5200 may include only one of package devices 5206 and 5207. According to some embodiments, system 5200 includes package device 5104 mounted on area 5107 of package device 5206 through connectors 5114, and package device 5206 mounted on first area 5207 of package device 5106 through connectors 5214; but excludes device 5207, and package device 5110 is directly mounted on second area 5203 of package device 5106 through connectors 5116.

According to some embodiments, system 5200 includes package device 5110 mounted on area 5113 of package device 5207 through connectors 5116, and package device 5207 mounted on second area 5203 of package device 5106 through connectors 5216; but excludes device 5206, and package device 5104 is directly mounted on first area 5207 of package device 5106 through connectors 5114.

In cases where an EO connector is used in place of device 5206 or 5207, the package device "on-package" vertical data signal transmission interconnect lines 5124 or 5128 (see FIGS. 20-29 and 53) between vertical locations of package devices 5104 and 5106, or of 5110 and 5106 of FIG. 49 will be replaced (e.g., not be present) by connector 5310.

According to embodiments, the on die inductor structures will be on chip 5108 and/or 5109 as described for inductor structures 5097 and 5099 being on either or both data transmit chip 5008 and data receive chip 5009 for each data signal channel 5076.

According to embodiments, the on die interconnection features of zones will be on chip 5108 and/or 5109 as described for zones 5096 and 5098 being on either or both data transmit chip 5008 and data receive chip 5009 for each data signal channel 5076.

bump designs and ground webbing structures may be on TX, RX or both

According to embodiments, the on package bump designs and ground webbing structures will be on package devices 5104 and/or 5010 under chip 5108 and/or 5109 as described for structures 5020 being on either or both area 5001 and/or on area 5011 of package device 5010 for each data signal channel 5076.

According to embodiments, the high speed horizontal data signal transmission lines may be on lines 5122, 5126 and 5130 of package device 5104, 5206, 5106, 5207 and/or 5110 such as described for lines 5035 of package device 5010. In some cases, the high speed horizontal data signal transmission lines may be on all horizontal data signal transmission lines 5122, 5126 and 5130 of any existing ones of package devices 5104, 5206, 5106, 5207 and/or 5110 (e.g., where an EO connector does not replace a package device) such as described for lines 5035 of package device 5010.

According to embodiments, vertical data signal transmission interconnect lines may be on lines 5120, 5124, 5128 and 5131 of package devices 5104, 5206, 5106, 5207 and/or 5110 such as described for lines 5120, 5124, 5128 and 5132 of package devices 5104, 5106, and/or 5110 of FIG. 48 (e.g., such as describe for contact zones 2002, 2004 and 2007 (or 2009); surface contact patterns 2005, 2008, 2205, 2208, 2255 and/or 2258; and/or package devices 2000, 2001, 2200, 2201, 2400, 2401 and/or 2600 as described for FIGS. 20-29).

In some cases, the vertical data signal transmission interconnect lines may be on lines 5120, 5124, 5128 and 5132 of any existing ones of package devices 5104, 5206, 5106, 5207 and/or 5110 (e.g., where an EO connector does not replace a package device) such as described for lines 5120, 5124, 5128 and 5131 of package devices 5104, 5106, and/or 5110 of FIG. 48 (e.g., such as describe for contact zones 2002, 2004 and 2007 (or 2009); surface contact patterns 2005, 2008, 2205, 2208, 2255 and/or 2258; and/or package devices 2000, 2001, 2200, 2201, 2400, 2401 and/or 2600 as described for FIGS. 20-29).

In some cases, determining whether package devices 5104, 5206, 5106, 5207 and/or 5110 (e.g., where an EO connector does not replace a package device) will include vertical data signal transmission interconnect lines such as described for contact zones 2002, 2004 and 2007 (or 2009); surface contact patterns 2005, 2008, 2205, 2208, 2255 and/or 2258; and/or package devices 2000, 2001, 2200, 2201, 2400, 2401 and/or 2600 may depend on the amount of package device electrical isolation and cross talk reduction desired between the signal contacts, attachment structures and vertical "signal" interconnects (e.g., lines) of each package device such as described for FIGS. 20-29.

According to embodiments, the on die inductor structures; on die interconnect features of zones; on package bump designs and ground webbing structures; on package high speed horizontal data signal transmission lines; and/or vertical data signal transmission interconnect lines may be on the chip(s) 5108 and/or 5109; and/or package devices 5104, 5206, 5106, 5207 and/or 5110 of multiple data signal channels existing between a transmitter circuit of a first chip, extending through one or more package devices, and to a receiver circuit of a second chip, as noted, for each channel 5076 as described for FIG. 47.

FIG. 49 shows system 5200 having data signal channel (e.g., a "signal" transmission channel) 5176 including lines 5120, 5122, 5124, 5126, 5128, 5130 and 5132, such as data signal channel described for FIGS. 30-44 and 50 (e.g., channel 3076, 3076B and 5076). Channel 5176 may include "signal" transmission lines, vertical routing and horizontal routing through devices through devices 5104 and 5110, as described for channel 5076 through device 5010 for FIG. 47. Channel 5176 may include "signal" transmission lines, vertical routing and horizontal routing through devices through device 5106, such as described for channel 5076 through device 5106 for FIG. 48. Channel 5176 may be a channel that extends between data signal circuits of chips 5108 and 5109 by going through bumps; through "signal" transmission lines of devices 5104, 5206, 5106, 5207 and/or 5110 (e.g., where they exist and are not replaced by an EO connector, and through the EO connector where they are replaced by an EO connector), such as describe for channel 5176 of FIG. 48.

In some cases the channel length of channel 5176 will be length CH or CH2 as describe for a channel as described for FIGS. 30-41; or a channel length as describe for channel 5176 of FIG. 48.

FIG. 50 is schematic cross-sectional side view of a computing system 5300 (e.g., computing configuration), including die to die interconnect configurations for improved signal connections and transmission through a data signal channel extending through multiple semiconductor device packages or package devices and through an electro-optical (EO) connector 5310 upon which at least one package device may be mounted.

FIG. 50 shows computing system 5300, having same numbered features (e.g., chips 5108 and 5109; packages 5104, 5106 and 5110) corresponding or similar to those of FIG. 48, and having the same data signal transmission (and receive) channel (e.g., channel 5176); on die inductor structures (e.g., channel structures 5079 and 5099); on die interconnect features of zones (e.g., zones 5096 and 5098); on package bump designs and ground webbing structures (e.g., structures 5120); on package high speed horizontal data signal transmission lines (e.g., lines 5122, 5126 and 5130); and/or vertical data signal transmission interconnect lines (e.g., lines 5120, 5124, 5128 and 5132), and other structures between signal transmit circuits (e.g., circuits 5072) and corresponding signal receive circuits (e.g., circuits 5074), except that FIG. 50 has electro-optical (EO) connector 5310 in place of BGA 5116 of FIG. 48 (e.g., BGA 5116 is replaced with connector 5310).

Figure 52:
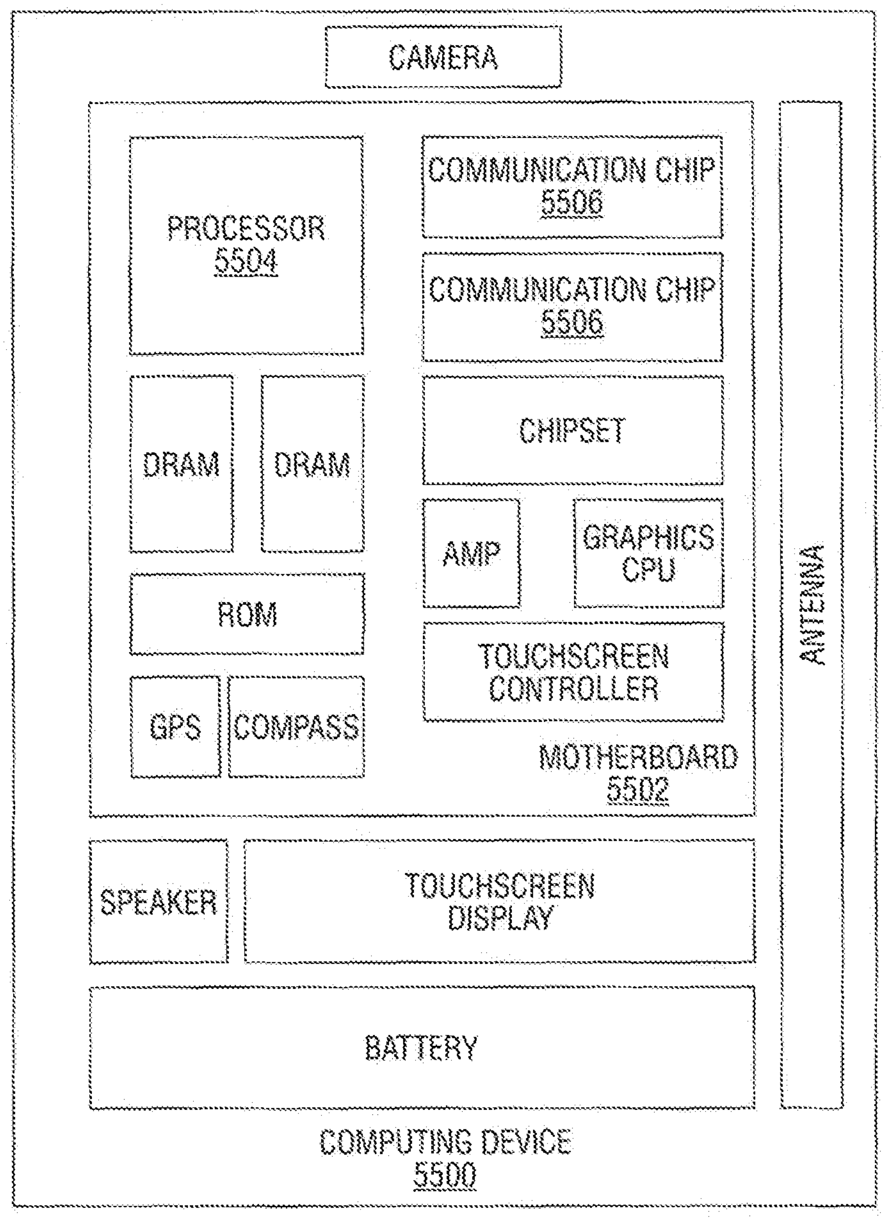
FIG. 52 illustrates a computing device in accordance with one implementation.

In some embodiments, another connector such as typical central processing unit (CPU) or IC chip package connector and socket can be used instead of EO connector 5310. In these embodiments, connector 5310 will be replaced (e.g., not present) by instead of EO connector 5310 (which will exist where connector 5310 is shown in FIGS. 52-53).

In some cases, instead of using BGA 5116 of FIG. 48, data signal contacts (and optionally isolation contacts) on a bottom surface of package device 5110 may be electrically coupled or physically attached to top surface 5105 of package device 5106 at second location 5113 using an electro-optical (EO) connector (see FIGS. 26A-C, 28; and 51). In this case, electro-optical (EO) connector 5310 (e.g., in some cases a releasably detachable "socket device" upon which package device 5110 or 5106 may be removably attached, without damage to the package devices 5110 or 5106), such as is described for connector 2602 of FIGS. 26A-C and 28, is used in place of the vertical "signal" transmission lines 5128 routing between package 5110 and interposer 5106. All other features of FIG. 50 may be similar to those described for FIG. 48.

FIG. 50 shows a schematic three dimensional cross-sectional perspective view of an electro-optical (EO) connector 5310 upon which at least one package device 5110 may be mounted (e.g., electrically coupled and/or physically attached to a top surface of), such as is described for connector 2602 of FIGS. 26A-C and 28. In some cases, an integrated circuit (IC) chip (e.g., "die") or electro-optical (EO) module or device (e.g., EO module 5109 of FIGS. 51 and 53) may be mounted (e.g., physically attached to a top surface of) the package device (e.g., package 5110 of FIGS. 51 and 53) that is mounted on connector 5310, such as is described for mounting EO module 2808 to a top surface of package 2810 of FIG. 28 that is mounted on connector 2602 (e.g., see FIGS. 26A-C and 28). In some cases, connector 5310 may be mounted on (e.g., electrically coupled and/or physically attached to a top surface of) another package device (e.g., interposer 5106 of FIGS. 51 and 53), such as is described for connector 2602 being mounted on interposer 2706 (e.g., see FIGS. 26A-C and 28).

FIG. 50 shows connector 5310 electrically coupled and/or physically attached to (e.g., between) bottom surface 5306 of device 5110 and location 5113 of top surface 5105 of device 5106. In some cases, bottom surface 5306 of device 5110 and location 5113 of top surface 5105 of device 5106 may each be a surface of dielectric, upon or in which are formed (e.g., disposed) the grounding contacts in a pattern, receive signal contacts in a pattern and transmit contacts in a pattern, such as is described for surface of dielectric 2003, upon or in which are formed (e.g., disposed) the grounding contacts 2020 in pattern 2610, receive signal contacts 2030 in pattern 2605 and transmit contacts 2040 in pattern 2605 of FIGS. 26A-C and 28.

In some cases, connector 5310 is oriented upright as shown for connector 2602 in FIG. 26B with its bottom on the top surface of device 5106; and with contact pins 2620, 2630 and 2640 removably attachable to contacts or solder bumps on the bottom surface of device 5110. In other cases, connector 5310 is oriented inverted (e.g., upside down) as compared to how connector 2602 is shown in FIG. 26B, such as where connector 5310 has its bottom on the bottom surface of device 5110; and with contact pins 2620, 2630 and 2640 removably attachable to contacts or solder bumps on the top surface of device 5106.

In this case, the package device "on-package" vertical data signal transmission interconnect lines 5128 (see FIGS. 20-29) between vertical locations 5127 and 5129 of package device 5110 and/or 5106 of FIG. 48 will be replaced (e.g., not be present) by connector 5310.

FIG. 51 is schematic cross-sectional side view of a computing system 5400 (e.g., computing configuration), including die to die interconnect configurations for improved signal connections and transmission through a data signal channel extending through two semiconductor device packages in a package-on-package configuration.

FIG. 51 shows system 5400 which based on an embodiment of FIG. 48 where package devices 5104 and 5110 are stacked on each other in a vertical direction and physically attached using large solder bumps 5406 and 5442. In this case, "signal" transmission lines 5122 and 5130 are electrically coupled or physically attached using "signal" transmission lines 5124 which is disposed in bump 5406. In some cases, it may be said that package device 5106 is replaced by bump 5406. In some cases, the length of the channel is the same as that for channel 5176 minus length L514 of lines 5126 and minus height H5102 of lines 5128.

FIG. 51 shows computing system 5400 (e.g., a system routing signals from a computer processor or chip such as chip 5108 to another device such as chip 5109), including die to die interconnect configurations, features and circuitry on chips 5108 and 5109; and on package devices 5104 and 5110, for improved signal connections and transmission through semiconductor package devices 5104 and 5010.

FIG. 51 shows computing system 5400, having same numbered features (e.g., chips 5108 and 5109; package devices 5104 and 5110) corresponding or similar to those of FIG. 48, and having the same data signal transmission (and receive) channel (e.g., channel 5176); on die inductor structures (e.g., channel structures 5079 and 5099); on die interconnect features of zones (e.g., zones 5096 and 5098); on package bump designs and ground webbing structures (e.g., structures 5120); on package high speed horizontal data signal transmission lines (e.g., lines 5122 and 5130); and/or vertical data signal transmission interconnect lines (e.g., lines 5120, 5124 and 5132), and other structures between signal transmit circuits (e.g., circuits 5072) and corresponding signal receive circuits (e.g., circuits 5074), except that FIG. 51 (1) has conductor material solder bump 5406 including lines 5124. Bump 5406 (e.g., lines 5124) extend between and electrically couple lines 5122 at horizontal location 5123 to lines 5130 at horizontal location 51291; and (2) excludes package device 5206 of FIG. 48 (e.g., device 5106 is replaced with bump 5406). In some cases, vertical signaling line 5124 between locations 5123 and 5129 may include vertical data signal transmission interconnect lines as described for lines 5124 of FIG. 48.

In some cases, FIG. 51 describes an embodiment where chips 5108 and 5109 are each mounted on a separate package devices 5104 and 5110 and the package devices are mounted onto each other in a package on package configuration. In this case, chip 5108 is mounted on package device 5104; chip 5109 is mounted on package device 5010 as described for FIG. 48.

In some cases, bottom surface 5306 of device 5110 is physically attached to bump 5406 to top surface 5102 of device 5104. In some cases, data signal contacts on surface 5306 are electrically coupled through lines 5124 to data signal contacts on surface 5102, such as described for FIGS. 50-53.

In some cases where bump 5406 is used in place of device 5106, the package device "on-package" vertical data signal transmission interconnect lines 5124 (see FIGS. 20-29 and 53) between vertical locations of package devices 5123 and 5129 of FIG. 51 may be replaced (e.g., not be present) by non vertical data signal transmission interconnect lines.

In other case, where bump 5406 is used in place of device 5106, the package device "on-package" vertical data signal transmission interconnect lines 5124 (see FIGS. 20-29 and 53) do exist between vertical locations of package devices 5123 and 5129 of FIG. 51.

According to embodiments, the on die inductor structures will be on chip 5108 and/or 5109 as described for inductor structures 5097 and 5099 being on either or both data transmit chip 5008 and data receive chip 5009 for each data signal channel 5076.

According to embodiments, the on die interconnection features of zones will be on chip 5108 and/or 5109 as described for zones 5096 and 5098 being on either or both data transmit chip 5008 and data receive chip 5009 for each data signal channel 5076.

According to embodiments, the on package bump designs and ground webbing structures will be on package devices 5104 and/or 5010 under chip 5108 and/or 5109 as described for structures 5020 being on either or both area 5001 and/or on area 5011 of package device 5010 for each data signal channel 5076.

According to embodiments, the high speed horizontal data signal transmission lines may be on lines 5122 and 5130 of package devices 5104 and/or 5110 such as described for lines 5035 of package device 5010. In some cases, the high speed horizontal data signal transmission lines may be on all horizontal data signal transmission lines 5122 and 5130 such as described for lines 5035 of package device 5010.

According to embodiments, vertical data signal transmission interconnect lines may be on lines 5120, 5124 and/or 5132 of package devices 5104 and/or 5110 such as described for lines 5120, 5124 and 5132 of package devices 5104, 5106, and/or 5110 of FIG. 48 (e.g., such as describe for contact zones 2002, 2004 and 2007 (or 2009); surface contact patterns 2005, 2008, 2205, 2208, 2255 and/or 2258; and/or package devices 2000, 2001, 2200, 2201, 2400, 2401 and/or 2600 as described for FIGS. 20-29).

In some cases, determining whether package devices 5104 and/or 5110 will include vertical data signal transmission interconnect lines such as described for contact zones 2002, 2004 and 2007 (or 2009); surface contact patterns 2005, 2008, 2205, 2208, 2255 and/or 2258; and/or package devices 2000, 2001, 2200, 2201, 2400, 2401 and/or 2600 may depend on the amount of package device electrical isolation and cross talk reduction desired between the signal contacts, attachment structures and vertical "signal" interconnects (e.g., lines) of each package device such as described for FIGS. 20-29.

According to embodiments, the on die inductor structures; on die interconnect features of zones; on package bump designs and ground webbing structures; on package high speed horizontal data signal transmission lines; and/or vertical data signal transmission interconnect lines may be on the chip(s) 5108 and/or 5109; and/or package devices 5104 and/or 5110 of multiple data signal channels existing between a transmitter circuit of a first chip, extending through one or more package devices, and to a receiver circuit of a second chip, as noted, for each channel 5076 as described for FIG. 47.

FIG. 51 shows system 5400 having data signal channel (e.g., a "signal" transmission channel) 5176 including lines 5120, 5122, 5124, 5130 and 5132, such as data signal channel described for FIGS. 30-44 and 51 (e.g., channel 3076, 3076B and 5076). Channel 5176 may include "signal" transmission lines, vertical routing and horizontal routing through devices through devices 5104 and 5110, as described for channel 5076 through device 5010 for FIG. 48. Channel 5176 may include "signal" transmission lines, vertical routing and horizontal routing through devices through device 5106, such as described for channel 5076 through device 5106 for FIG. 48. Channel 5176 may be a channel that extends between data signal circuits of chips 5108 and 5109 by going through bumps; through "signal" transmission lines of devices 5104, bump 5406 and device 5110, such as describe for channel 5176 of FIG. 48.

In some cases the channel length of channel 5176 will be length CH or CH2 as describe for a channel as described for FIGS. 30-41; or a channel length as describe for channel 5176 of FIG. 48.

In some cases, systems 5100-5400 are or include a "single ended" data signal channel or bus (e.g., for single ended connections and transmission through semiconductor device packages) originating at circuit 5072 at chip 5018 (or 5108), extending through one or more packages on data signal channels; and to circuit 5074 at chip 5019 (or 5109).

Data signal circuits 5072 and 5074 may be or include a data signal circuits, frequencies of data, speed of data, and the like (e.g., a transmitter and receiver) of a data signal channel through a package and to another device or chip as described for circuits 3072 and 3074 herein (e.g., see FIGS. 30-41).

In some cases, the use of "level" describes a "layer" of material (e.g., dielectric and/or conductive material) of a chip as known. In some cases, the use of a top, bottom, and/or last silicon metal "level" describes a top, bottom, and/or last silicon metal "layer" of material (e.g., dielectric and/or conductive material) of a chip as known.

FIGS. 50-54 show chips having various die to die channel interconnect configurations. In some cases, only dielectric material (in some cases shown by blank areas of figures not having labeled or named features) fills in any space between (e.g., above, below, and beside such as in the length, width and height directions) the die to die channel interconnect configurations. In some cases, dielectric material and various active and passive circuitry; traces; interconnects and/or other structure know to be on an IC chip fill in any space between, but do not interfere with the electrical function of die to die channel interconnect configurations. In some cases, filling in the space between the interconnect features includes existing in any space where those features do not exist, and are not physically attached to (e.g., are not touching) each other. In some cases, filling in the space between the interconnect features includes separating each and all of those features except where they are coupled or physically attached to each other.

In some cases, the use of "approximately" describes exactly that number. In some cases, the use of "approximately" describes within 10 percent above and below that number. In some cases, the use of "approximately" describes within 5 percent above and below that number. In some cases, the use of "approximately" describes within 2 percent above and below that number.

In some cases, the die to die channel interconnect configurations may increase in the stability and cleanliness of high frequency transmit and receive data signals transmitted between the data signal circuits of two chips communicating though a package device upon which they are mounted (e.g., as compared to a data signal transmitting and/or receiving chip without the on-die inductor structures). Such an increased frequency may include data signals having a frequency of between 7 and 25 gigatransfers per second (GT/s). In some cases, GT/s may refer to a number of operations (e.g., transmission of digital data such as the data signal herein) transferring data that occur in each second in some given data transfer channel such as a channel provided by the on-die inductor structures; or may refer to a sample rate, i.e. the number of data samples captured per second, each sample normally occurring at the clock edge. 1 GT/s is 109 or one billion transfers per second. In some cases, the on-die interconnection features improves (e.g., reduce) crosstalk (e.g., as compared to a data signal transmitting and/or receiving chip without the on-die interconnection features) from very low frequency transfer such as from 50 mega hertz (MHz) to a GHz transfer level, such as greater than 40 GHz (or up to between 40 and 50 GHz).

In some cases, the die to die channel interconnect configurations are formed using processes or processing as know in the industry for forming traces, interconnects, via contact and surface contacts of an IC chip or die. In some cases, forming them includes using masking and etching of a silicon wafer. In some cases, the masking includes masking with a solder resist and etching dielectric and/or conductor material.

In some cases, forming them includes using chemical vapor deposition (CVD); atomic layer deposition (ALD); growing dielectric material such as from or on a surface having a pattern of dielectric material and conductor material. In some cases, forming them includes patterning a mask using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form openings where the features will exists. Depending on the mask type, the exposed or unexposed areas are removed. In some cases, the mask goes through a thermal cure of some type after the openings (e.g., pattern) are defined. In some cases, the mask may be formed by a process known to form such a mask of a chip, or device formed using IC chip processing.

In some cases, embodiments of processes for forming die to die channel interconnect configurations provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC). In some cases, embodiments of such processes and devices provide the demanded lower cost high frequency data transfer interconnects solution that is needed across the above segments. These benefits may be due to the addition of die to die channel interconnect configurations which increase performance and speed of the data transfer.

FIG. 52 illustrates a computing device in accordance with one implementation. FIG. 52 illustrates computing device 5500 in accordance with one implementation. Computing device 5500 houses board 5502. Board 5502 may include a number of components, including but not limited to processor 5504 and at least one communication chip 5506. Processor 5504 is physically and electrically coupled to board 5502. In some implementations at least one communication chip 5506 is also physically and electrically coupled to board 5502. In further implementations, communication chip 5506 is part of processor 5504.

Depending on its applications, computing device 5500 may include other components that may or may not be physically and electrically coupled to board 5502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 5506 enables wireless communications for the transfer of data to and from computing device 5500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 5506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 5500 may include a plurality of communication chips 5506. For instance, first communication chip 5506 may be dedicated to shorter range wireless communications such as Wi-Fi and Bluetooth and second communication chip 5506 may be dedicated to longer range wireless communications such as GPS, EDGE, GPRS, CDMA, WiMAX, LTE, Ev-DO, and others.

Processor 5504 of computing device 5500 includes an integrated circuit die packaged within processor 5504. In some implementations, the integrated circuit die of the processor includes one or more devices, such as transistors or metal interconnects. In some embodiments, the package of the integrated circuit die or processor 5504 includes embodiments of processes for forming die to die channel interconnect configurations or embodiments of die to die channel interconnect configurations as described herein. The term "processor" may refer to any device or portion of a device that processes electronic data from registers and/or memory to transform that electronic data into other electronic data that may be stored in registers and/or memory.

Communication chip 5506 also includes an integrated circuit die packaged within communication chip 5506. In accordance with another implementation, the integrated circuit die of the communication chip includes one or more devices, such as transistors or metal interconnects. In some embodiments, the package of the integrated circuit die or chip 5506 includes embodiments of processes for forming die to die channel interconnect configurations or embodiments of die to die channel interconnect configurations as described herein.

In further implementations, another component housed within computing device 5500 may contain an integrated circuit die that includes one or more devices, such as transistors or metal interconnects. In some embodiments, the package of the other integrated circuit die or chip includes embodiments of processes for forming die to die channel interconnect configurations or embodiments of die to die channel interconnect configurations as described herein.

In various implementations, computing device 5500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 5500 may be any other electronic device that processes data.

EXAMPLES

The following examples pertain to embodiments.

Example 1 is a method of computing a system including die to die interconnect configurations for improved signal connections and transmission through a data signal channel extending through a semiconductor device package, the system comprising: a first integrated circuit (IC) chip mounted on a first area of a package device; a second integrated circuit (IC) chip mounted on a second area of the package device; a data signal channel from the first IC chip, through the package device, and to the second IC chip; wherein the channel includes one of: (1) on-die induction structures within one of the first or second IC chip; (2) on-die interconnect features within one of the first or second IC chip; or (3) on-package first level die bump designs and ground webbing structures in an area of the package device below one of the first or second IC chip.

In Example 2, the subject matter of Example 1 can optionally include wherein the channel further comprises: first solder bumps physically attaching the first chip to the package device at the first location; and second solder bumps physically attaching the second chip to the package device at the second location.

In Example 3, the subject matter of Example 1 can optionally include wherein the system the on-die induction structures include two inductors on either side of an electrostatic discharge (ESD) circuit to reduce parasitic inductance in the channel portion between a data signal transmit output contact of a data signal circuit and a data signal surface contact of the first or second chip.

In Example 4, the subject matter of Example 1 can optionally include wherein the on-die interconnect features include data signal leadway (LDW) routing traces between a data signal transmit output circuit and a data signal surface contact of the first or second chip.

In Example 5, the subject matter of Example 1 can optionally include wherein the on-package first level die bump designs and ground webbing structures include surface contact zones or patterns of data signal contacts, ground contacts and power contacts; and ground webbing in one or more levels below a surface of the package device.

In Example 6, the subject matter of Example 1 can optionally include wherein the (4) high speed horizontal data signal transmission lines in levels of the package device between vertical data signal transmission lines of the package device.

In Example 7, the subject matter of Example 6 can optionally include wherein the high speed horizontal data signal transmission lines include horizontal isolation signal transmission lines or horizontal isolation signal planes horizontally adjacent to and between the high speed horizontal data signal transmission lines in levels of the package device.

Example 8 is a computing system including die to die interconnect configurations for improved signal connections and transmission through a data signal channel extending through multiple semiconductor device packages, the system comprising: a first integrated circuit (IC) chip mounted on a first area of a first package device; a second integrated circuit (IC) chip mounted on a second area of a second package device; the first package device mounted on a first area of a third package device, and the second package device mounted on a second area of the third package device; a data signal channel from the first IC chip, through the first second and third package devices, and to the second IC chip; wherein the channel includes one of: (1) on-die induction structures within one of the first or second IC chip; (2) on-die interconnect features within one of the first or second IC chip; (3) on-package first level die bump designs and ground webbing structures in an area of the first or second package devices below one of the first or second IC chip; (4) high speed horizontal data signal transmission lines in levels of the first, second or third package devices between vertical data signal transmission lines of the first or second package device or; (5) high speed vertical data signal transmission interconnects through levels of the third package device in an area of the third package device below one of the first or second package device.

In Example 9, the subject matter of Example 8 can optionally include wherein the channel further comprises: first solder bumps physically attaching the first chip to the package device at the first location; and second solder bumps physically attaching the second chip to the package device at the second location.

In Example 10, the subject matter of Example 8 can optionally include wherein the on-die induction structures include two inductors on either side of an electrostatic discharge (ESD) circuit to reduce parasitic inductance in the channel portion between a data signal transmit output contact of a data signal circuit and a data signal surface contact of the first or second chip.

In Example 11, the subject matter of Example 8 can optionally include wherein the on-die interconnect features include data signal leadway (LDW) routing traces between a data signal transmit output circuit and a data signal surface contact of the first or second chip.

In Example 12, the subject matter of Example 8 can optionally include wherein the on-package first level die bump designs and ground webbing structures include surface contact zones or patterns of data signal contacts, ground contacts and power contacts; and ground webbing in one or more levels below a surface of the first or second package device.

In Example 13, the subject matter of Example 8 can optionally include wherein the high speed horizontal data signal transmission lines include horizontal isolation signal transmission lines or horizontal isolation signal planes horizontally adjacent to and between the high speed horizontal data signal transmission lines in levels of the first or second package device.

In Example 14, the subject matter of Example 8 can optionally include wherein the high speed vertical data signal transmission interconnects include contact zones, contact surface contact patterns, or vertical isolation signal transmission lines vertically adjacent to and between the high speed vertical data signal transmission lines through levels of the third package device.

In Example 15, the subject matter of Example 1 can optionally include wherein the EO connector include a plurality removably detachable connectors between a pattern of data signal surface contacts of the first package device and a matching pattern of data signal surface contacts of the third package device.

In Example 16, the subject matter of Example 8 can optionally include wherein the third package device comprises a printed circuit board (PCB) and further comprising: a fourth package device mounted on the first area of a third package device between the first package device and the third package device, and a fifth package device mounted on the second area of a third package device between the second package device and the third package device.

In Example 17, the subject matter of Example 16 can optionally include wherein one of the fourth and fifth package device comprise (6) an electro-optical (EO) connector physically attaching one of the fourth and fifth package device between one of the first and second package device and the third package device.

Example 18 is a computing system including die to die interconnect configurations for improved signal connections and transmission through a data signal channel extending through two semiconductor device packages in a package-on-package configuration, the system comprising: a first integrated circuit (IC) chip mounted on a first area of a first package device; a second integrated circuit (IC) chip mounted on a second area of a second package device; the second package device mounted on a first area of the first package device through a solder bump connection; a data signal channel from the first IC chip, through the first and second package devices and through the solder bump connection, and to the second IC chip; wherein the channel includes one of: (1) on-die induction structures within one of the first or second IC chip; (2) on-die interconnect features within one of the first or second IC chip; (3) on-package first level die bump designs and ground webbing structures in an area of the first or second package devices below one of the first or second IC chip; or (4) high speed horizontal data signal transmission lines in levels of the first or second package devices between vertical data signal transmission lines of the first or second package device.

In Example 19, the subject matter of Example 18 can optionally include wherein the on-die induction structures include two inductors on either side of an electrostatic discharge (ESD) circuit to reduce parasitic inductance in the channel portion between a data signal transmit output contact of a data signal circuit and a data signal surface contact of the first or second chip.

In Example 20, the subject matter of Example 18 can optionally include wherein the on-die interconnect features include data signal leadway (LDW) routing traces between a data signal transmit output circuit and a data signal surface contact of the first or second chip.

In Example 21, the subject matter of Example 18 can optionally include wherein the on-package first level die bump designs and ground webbing structures include surface contact zones or patterns of data signal contacts, ground contacts and power contacts; and ground webbing in one or more levels below a surface of the first or second package device.

In Example 22, the subject matter of Example 18 can optionally include wherein the high speed horizontal data signal transmission lines include horizontal isolation signal transmission lines or horizontal isolation signal planes horizontally adjacent to and between the high speed horizontal data signal transmission lines in levels of the first or second package device.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although some embodiments described above show only die to die channel interconnect configurations for two connected chips, those descriptions can apply to forming or having those same die to die channel interconnect configurations where a first chips is communicating with a second and a third chip through one or more package devices using die to die channel interconnect configurations. The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:

1. A computing system including die to die interconnect configurations for improved signal connections and transmission through a data signal channel extending through a semiconductor device package, the system comprising:

a first integrated circuit (IC) chip mounted on a first area of a package device;

a second integrated circuit (IC) chip mounted on a second area of the package device;

a data signal channel from the first IC chip, through the package device, and to the second IC chip;

wherein the data signal channel includes on-package first level die bump designs and ground webbing structures in an area of the package device below one of the first or second IC chip, wherein each of the ground webbing structures comprises a layer of solid conductor material extending between dielectric portions surrounding contacts, wherein the layer of solid conductor material has a first width between laterally adjacent ones of the contacts, a second width between diagonally adjacent ones of the contacts, and a third width between vertically adjacent ones of the contacts, and wherein the third width is greater than the first width and is greater than the second width.

2. The system of claim 1, wherein the data signal channel further comprises:

first solder bumps physically attaching the first chip to the package device at the first area; and second solder bumps physically attaching the second chip to the package device at the second area.

3. The system of claim 1, further comprising on-die induction structures including two inductors on either side of an electrostatic discharge (ESD) circuit to reduce parasitic inductance in the channel portion between a data signal transmit output contact of a data signal circuit and a data signal surface contact of the first or second chip.

4. The system of claim 1, further comprising on-die interconnect features including data signal leadway (LDW) routing traces between a data signal transmit output circuit and a data signal surface contact of the first or second chip.

5. The system of claim 1, wherein the on-package first level die bump designs and ground webbing structures include surface contact zones or patterns of data signal contacts, ground contacts and power contacts; and ground webbing in one or more levels below a surface of the package device.

6. The system of claim 1, further comprising:

high speed horizontal data signal transmission lines in levels of the package device between vertical data signal transmission lines of the package device.

7. The system of claim 6, wherein the high speed horizontal data signal transmission lines include horizontal isolation signal transmission lines or horizontal isolation signal planes horizontally adjacent to and between the high speed horizontal data signal transmission lines in levels of the package device.

8. A computing system including die to die interconnect configurations for improved signal connections and transmission through a data signal channel extending through multiple semiconductor device packages, the system comprising:

a first integrated circuit (IC) chip mounted on a first area of a first package device;

a second integrated circuit (IC) chip mounted on a second area of a second package device;

the first package device mounted on a first area of a third package device, and the second package device mounted on a second area of the third package device;

a data signal channel from the first IC chip, through the first second and third package devices, and to the second IC chip;

wherein the data signal channel includes on-package first level die bump designs and ground webbing structures in an area of the first or second package devices below one of the first or second IC chip, wherein each of the ground webbing structures comprises a layer of solid conductor material extending between dielectric portions surrounding contacts, wherein the layer of solid conductor material has a first width between laterally adjacent ones of the contacts, a second width between diagonally adjacent ones of the contacts, and a third width between vertically adjacent ones of the contacts, and wherein the third width is greater than the first width and is greater than the second width.

9. The system of claim 8, wherein the data signal channel further comprises:

first solder bumps physically attaching the first chip to the package device at the first area; and second solder bumps physically attaching the second chip to the package device at the second area.

10. The system of claim 8, further comprising on-die induction structures including two inductors on either side of an electrostatic discharge (ESD) circuit to reduce parasitic inductance in the channel portion between a data signal transmit output contact of a data signal circuit and a data signal surface contact of the first or second chip.

11. The system of claim 8, further comprising on-die interconnect features including data signal leadway (LDW) routing traces between a data signal transmit output circuit and a data signal surface contact of the first or second chip.

12. The system of claim 8, wherein the on-package first level die bump designs and ground webbing structures include surface contact zones or patterns of data signal contacts, ground contacts and power contacts; and ground webbing in one or more levels below a surface of the first or second package device.

13. The system of claim 8, further comprising high speed horizontal data signal transmission lines including horizontal isolation signal transmission lines or horizontal isolation signal planes horizontally adjacent to and between the high speed horizontal data signal transmission lines in levels of the first or second package device.

14. The system of claim 8, further comprising high speed vertical data signal transmission interconnects including contact zones, contact surface contact patterns, or vertical isolation signal transmission lines vertically adjacent to and between the high speed vertical data signal transmission lines through levels of the third package device.

15. The system of claim 8, further comprising EO connector including a plurality removably detachable connectors between a pattern of data signal surface contacts of the first package device and a matching pattern of data signal surface contacts of the third package device.

16. The system of claim 8, wherein the third package device comprises a printed circuit board (PCB) and further comprising:

a fourth package device mounted on the first area of a third package device between the first package device and the third package device, and a fifth package device mounted on the second area of a third package device between the second package device and the third package device.

17. The system of claim 16, wherein one of the fourth and fifth package device comprise an electro-optical (EO) connector physically attaching one of the fourth and fifth package device between one of the first and second package device and the third package device.

18. A computing system including die to die interconnect configurations for improved signal connections and transmission through a data signal channel extending through two semiconductor device packages in a package-on-package configuration, the system comprising:

a first integrated circuit (IC) chip mounted on a first area of a first package device;

a second integrated circuit (IC) chip mounted on a second area of a second package device;

the second package device mounted on a first area of the first package device through a solder bump connection;

a data signal channel from the first IC chip, through the first and second package devices and through the solder bump connection, and to the second IC chip;

wherein the data signal channel includes on-package first level die bump designs and ground webbing structures in an area of the first or second package devices below one of the first or second IC chip, wherein each of the ground webbing structures comprises a layer of solid conductor material extending between dielectric portions surrounding contacts, wherein the layer of solid conductor material has a first width between laterally adjacent ones of the contacts, a second width between diagonally adjacent ones of the contacts, and a third width between vertically adjacent ones of the contacts, and wherein the third width is greater than the first width and is greater than the second width.

19. The system of claim 18, further comprising on-die induction structures including two inductors on either side of an electrostatic discharge (ESD) circuit to reduce parasitic inductance in the data signal channel portion between a data signal transmit output contact of a data signal circuit and a data signal surface contact of the first or second chip.

20. The system of claim 18, further comprising on-die interconnect features including data signal leadway (LDW) routing traces between a data signal transmit output circuit and a data signal surface contact of the first or second chip.

21. The system of claim 18, wherein the on-package first level die bump designs and ground webbing structures include surface contact zones or patterns of data signal contacts, ground contacts and power contacts; and ground webbing in one or more levels below a surface of the first or second package device.

22. The system of claim 18, further comprising high speed horizontal data signal transmission lines including horizontal isolation signal transmission lines or horizontal isolation signal planes horizontally adjacent to and between the high speed horizontal data signal transmission lines in levels of the first or second package device.

* * * * *